US012284905B2

(12) United States Patent
Park et al.

(10) Patent No.: US 12,284,905 B2
(45) Date of Patent: Apr. 22, 2025

(54) LIGHT EMITTING DEVICE

(71) Applicant: Samsung Display Co., Ltd., Yongin-si (KR)

(72) Inventors: Junha Park, Gwacheon-si (KR); Taeil Kim, Hwaseong-si (KR); Sun Young Pak, Suwon-si (KR); Jang Yeol Baek, Yongin-si (KR); Kyoung Sunwoo, Hwaseong-si (KR); Mun-Ki Sim, Seoul (KR); Chanseok Oh, Seoul (KR); Minjung Jung, Siheung-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 791 days.

(21) Appl. No.: 17/449,220

(22) Filed: Sep. 28, 2021

(65) Prior Publication Data

US 2022/0115595 A1 Apr. 14, 2022

(30) Foreign Application Priority Data

Oct. 6, 2020 (KR) ........................ 10-2020-0128803
Sep. 7, 2021 (KR) ........................ 10-2021-0119307

(51) Int. Cl.

*H10K 85/30* (2023.01)
*C07F 5/02* (2006.01)
(Continued)

(52) U.S. Cl.

CPC ........... *H10K 85/322* (2023.02); *C07F 5/027* (2013.01); *C09K 11/06* (2013.01);
(Continued)

(58) Field of Classification Search

CPC ............. H10K 85/322; H10K 2101/20; H10K 2101/10; H10K 85/658; H10K 85/657;
(Continued)

(56) References Cited

U.S. PATENT DOCUMENTS 5,645,948 A 7/1997 Shi et al.
7,700,201 B2 4/2010 Seo et al.
(Continued)

FOREIGN PATENT DOCUMENTS

EP 3109253 A1 12/2016
JP 4060669 B2 3/2008
(Continued)

OTHER PUBLICATIONS

Kondo, et al., "Narrowband Deep-Blue Organic Light-Emitting Diode Featuring an Organoboron-Based Emitter", Nature Photonics, Jul. 15, 2019, , vol. 13, pp. 678-682.
(Continued)

*Primary Examiner* — Jenna N Chandhok
(74) *Attorney, Agent, or Firm* — Lewis Roca Rothgerber Christie LLP

(57) ABSTRACT

Provided is a light emitting device including a first electrode, a second electrode, and an emission layer between the first
(Continued)

electrode and the second electrode, and the emission layer may include a condensed cyclic compound represented by Formula 1 below, thereby exhibiting high luminous efficiency and improved service life characteristics.

Formula 1

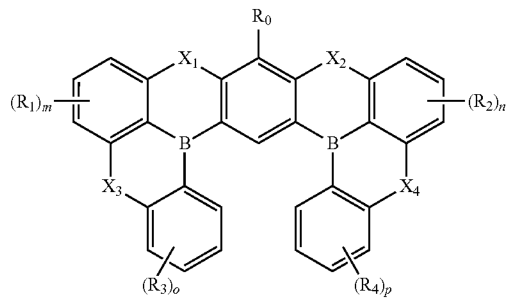

20 Claims, 6 Drawing Sheets

(51) Int. Cl.
*C09K 11/06* (2006.01)
*H10K 50/11* (2023.01)
*H10K 101/10* (2023.01)

(52) U.S. Cl.
CPC ...... *C09K 2211/1018* (2013.01); *H10K 50/11* (2023.02); *H10K 2101/10* (2023.02)

(58) Field of Classification Search
CPC .... C07F 5/027; C07F 5/02; C09K 2211/1085; C09K 2211/1018; C09K 2211/1014
See application file for complete search history.

(56) References Cited

U.S. PATENT DOCUMENTS

| | | | |
|---|---|---|---|
| 9,818,985 | B2 | 11/2017 | Cho et al. |
| 10,374,166 | B2 | 8/2019 | Hatakeyama et al. |
| 2004/0053069 | A1 | 3/2004 | Sotoyama et al. |
| 2005/0287393 | A1 | 12/2005 | Lee et al. |
| 2019/0115538 | A1 | 4/2019 | Lim et al. |
| 2019/0119312 | A1 | 4/2019 | Chen et al. |
| 2020/0020859 | A1 | 1/2020 | Hatakeyama et al. |
| 2020/0044159 | A1 | 2/2020 | Yamatani |
| 2020/0058885 | A1 | 2/2020 | Hong et al. |
| 2020/0119289 | A1 | 4/2020 | Lin et al. |
| 2020/0144503 | A1 | 5/2020 | Hayano |
| 2020/0144513 | A1 | 5/2020 | Hatakeyama et al. |
| 2020/0176679 | A1 | 6/2020 | Jeong et al. |
| 2020/0190115 | A1 | 6/2020 | Hatakeyama et al. |
| 2020/0283463 | A1 | 9/2020 | Lee et al. |
| 2021/0277026 | A1 | 9/2021 | Geum et al. |
| 2022/0112221 | A1* | 4/2022 | Lee .......................... C07F 5/02 |
| 2022/0407021 | A1* | 12/2022 | Shin .................... H10K 85/654 |

FOREIGN PATENT DOCUMENTS

| | | | |
|---|---|---|---|
| JP | 2019119680 | A | 7/2019 |
| KR | 10-0525408 | B1 | 11/2005 |
| KR | 10-2016-0119683 | A | 10/2016 |
| KR | 10-2016-0125583 | A | 11/2016 |
| KR | 10-2016-0139101 | A | 12/2016 |
| KR | 101876763 | B1 | 7/2018 |
| KR | 10-2018-0122298 | A | 11/2018 |
| KR | 10-1955648 | B1 | 3/2019 |
| KR | 10-2019-0042791 | A | 4/2019 |
| KR | 10-2019-0096944 | A | 8/2019 |
| KR | 10-2019-0129509 | A | 11/2019 |
| KR | 10-2058028 | B1 | 12/2019 |
| KR | 10-2020-0004248 | A | 1/2020 |
| KR | 10-2020-0006965 | A | 1/2020 |
| KR | 10-2020-0011383 | A | 2/2020 |
| KR | 10-2020-0014451 | A | 2/2020 |
| KR | 10-2020-0052513 | A | 5/2020 |
| KR | 10-2020-0107848 | A | 9/2020 |
| KR | 10-2020-0108147 | A | 9/2020 |
| WO | WO 2018/212169 | A1 | 11/2018 |
| WO | 2020/040298 | A1 | 2/2020 |

OTHER PUBLICATIONS

Office Action for U.S. Appl. No. 17/223,937 dated Oct. 25, 2023, 19 pages.

Pershin, et al., "Highly Emissive Excitons with Reduced Exchange Energy In Thermally Activated Delayed Fluorescent Molecules", Nature Communications, Feb. 5, 2019, vol. 10, No. 597, 5 pages.

* cited by examiner

LIGHT EMITTING DEVICE

CROSS-REFERENCE TO RELATED APPLICATION

This application claims priority to and the benefit of Korean Patent Application No. 10-2020-0128803, filed on Oct. 6, 2020, and Korean Patent Application No. 10-2021-0119307, filed on Sep. 7, 2021, the entire contents of which are hereby incorporated by reference.

BACKGROUND

1. Field

Embodiments of the present disclosure herein relate to a light emitting device, and, for example, to a light emitting device including a novel condensed cyclic compound.

2. Description of the Related Art

Recently, the development of an organic electroluminescence display as an image display apparatus is being actively conducted. The organic electroluminescence display includes a so-called self-luminescent light emitting device in which holes and electrons injected from a first electrode and a second electrode recombine in an emission layer, and thus a luminescent material of the emission layer emits light to implement display.

In the application of a light emitting device to a display apparatus, there is a demand for a light emitting device having low driving voltage, high luminous efficiency, and a long service life, and development of materials for a light emitting device capable of stably attaining such characteristics is continuously being conducted.

In recent years, particularly in order to implement a highly efficient light emitting device, technologies pertaining to phosphorescence emission using triplet state energy or delayed fluorescence using triplet-triplet annihilation (TTA) in which singlet excitons are generated by collision of triplet excitons are being developed, and thermally activated delayed fluorescence (TADF) materials using delayed fluorescence phenomenon are being developed.

SUMMARY

Embodiments of the present disclosure provide a light emitting device exhibiting excellent luminous efficiency and long service life characteristics.

An embodiment of the present disclosure provides a light emitting device including: a first electrode; a second electrode on the first electrode; and an emission layer which is between the first electrode and the second electrode and includes a condensed cyclic compound represented by Formula 1 below, wherein the first electrode and the second electrode each independently include at least one selected from among Ag, Mg, Cu, Al, Pt, Pd, Au, Ni, Nd, Ir, Cr, Li, Ca, LiF/Ca, LiF/Al, Mo, Ti, W, In, Sn, Zn, a compound of two or more thereof, a mixture of two or more thereof, and an oxide thereof.

Formula 1

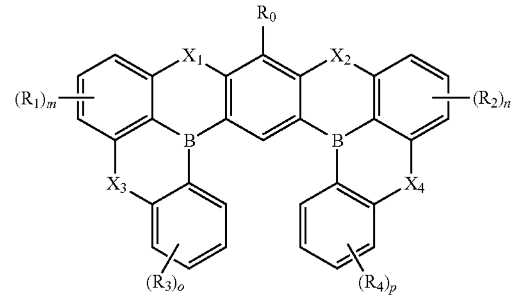

In Formula 1 above, $X_1$ to $X_4$ are each independently O, S, $CR_5R_6$, or $NR_7$, m and n are each independently an integer of 0 to 3, and o and p are each independently an integer of 0 to 4. $R_0$ to $R_7$ are each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 10 carbon atoms, a substituted or unsubstituted aryl group having 6 to 30 ring-forming carbon atoms, or a substituted or unsubstituted heterocycle having 2 to 30 ring-forming carbon atoms, and at least one selected from among $R_1$ to $R_7$ includes a substituent represented by Formula 2 or Formula 3 below:

Formula 2

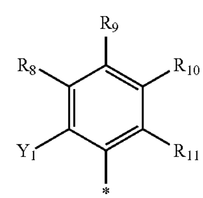

Formula 3

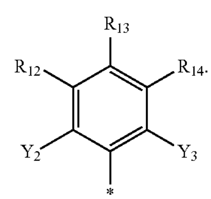

In Formula 2 and Formula 3 above, $Y_1$ to $Y_3$ are each independently a substituted or unsubstituted aryl group having 6 to 30 ring-forming carbon atoms, a substituted or unsubstituted amine group, or a substituted or unsubstituted heterocycle having 2 to 30 ring-forming carbon atoms, and $R_8$ to $R_{14}$ are each independently a hydrogen atom, a deuterium atom, a halogen atom, a cyano group, a nitro group, a substituted or unsubstituted silyl group, or a substituted or unsubstituted alkyl group having 1 to 10 carbon atoms.

In an embodiment, Formula 1 above may be represented by any one selected from among Formula 1-1 to Formula 1-6 below:

Formula 1-1

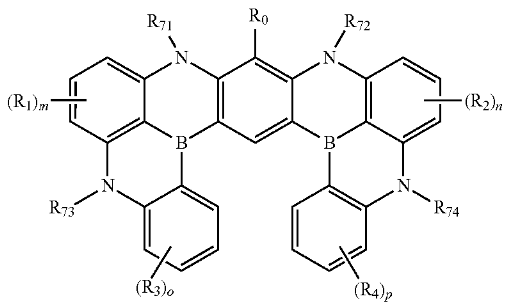

Formula 1-2

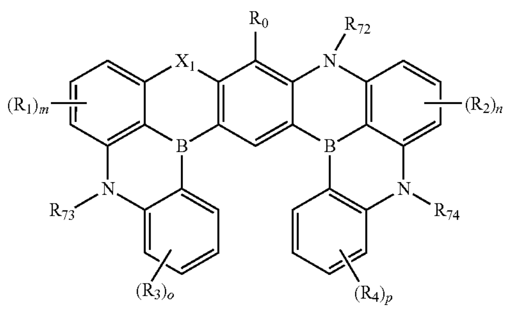

Formula 1-3

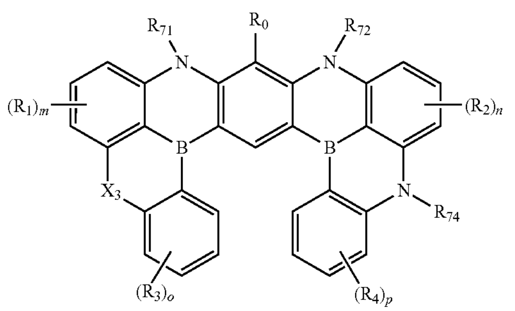

Formula 1-4

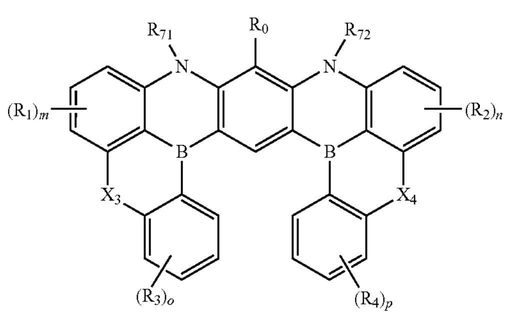

Formula 1-5

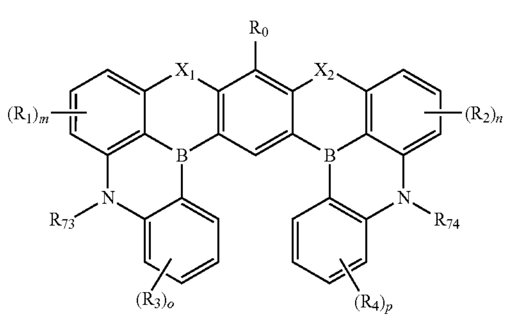

-continued

Formula 1-6

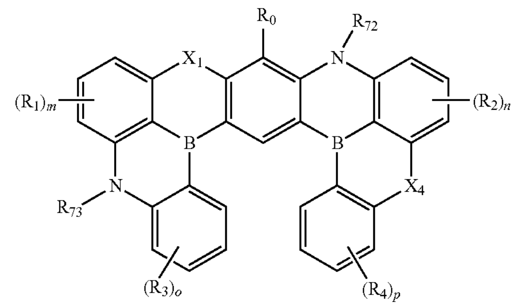

In Formula 1-1 to Formula 1-6 above, $R_{71}$ to $R_{74}$ each independently correspond to $R_7$ defined in Formula 1 above, $X_1$ to $X_4$, $R_0$ to $R_4$, and m to p are the same as defined as described with respect to Formula 1 above.

At least two selected from among $X_1$ to $X_4$ are $NR_7$, the others are each independently O, S, or $CR_5R_6$, and $R_5$ to $R_7$ are the same as defined with respect to Formula 1 above.

In an embodiment, Formula 2 above may be represented by Formula 2-1 below:

Formula 2-1

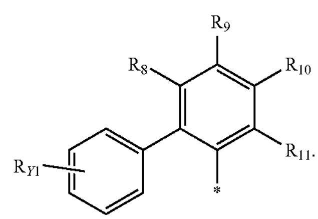

In Formula 2-1 above, $R_{Y1}$ is a hydrogen atom, a deuterium atom, a halogen atom, a cyano group, a nitro group, a substituted or unsubstituted silyl group, or a substituted or unsubstituted alkyl group having 1 to 10 carbon atoms, and $R_8$ to $R_{11}$ are the same as defined with respect to Formula 2 above.

In an embodiment, Formula 3 above may be represented by Formula 3-1 below:

Formula 3-1

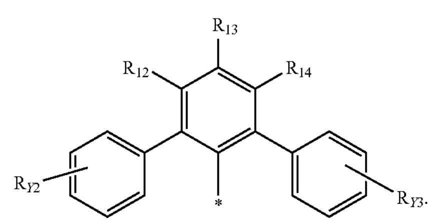

In Formula 3-1 above, $R_{Y2}$ and $R_{Y3}$ are each independently a hydrogen atom, a deuterium atom, a halogen atom, a cyano group, a nitro group, a substituted or unsubstituted silyl group, or a substituted or unsubstituted alkyl group having 1 to 10 carbon atoms, and $R_{12}$ to $R_{14}$ are the same as defined with respect to Formula 3 above.

In an embodiment, $Y_1$ to $Y_3$ may be each independently an unsubstituted phenyl group, or a phenyl group substituted with an alkyl group having 1 to 10 carbon atoms.

In an embodiment, at least one selected from among $R_1$ to $R_7$ may include any one selected from among S-1 to S-3 below:

S-1

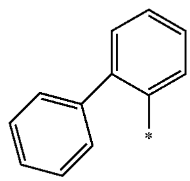

S-2

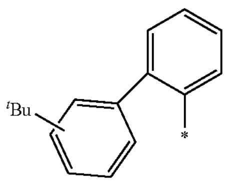

S-3

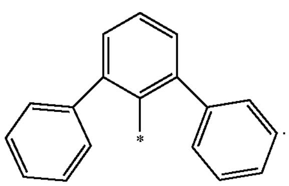

In an embodiment, m and n may be 1, $R_1$ and $R_2$ may be each independently $NR_aR_b$, at least one of $R_a$, $R_b$, or $R_7$ may be represented by Formula 2 or Formula 3 above, and the rest may be a substituted or unsubstituted aryl group having 6 to 30 ring-forming carbon atoms.

In an embodiment, m and n may be 1, and $R_1$ and $R_2$ may be represented by any one selected from among AM-1 to AM-11 below:

AM-1

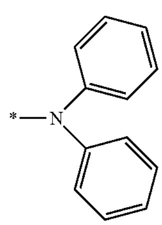

AM-2

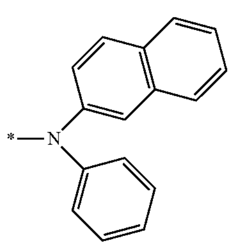

-continued

AM-3

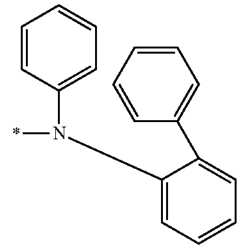

AM-4

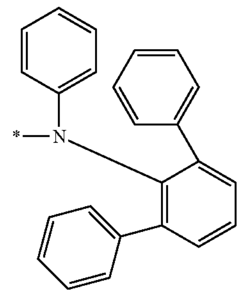

AM-5

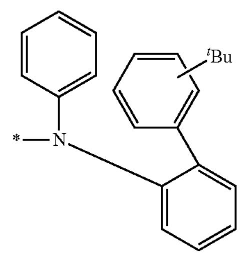

AM-6

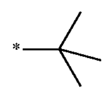

AM-7

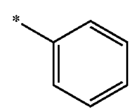

AM-8

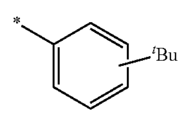

AM-9

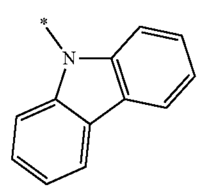

AM-10

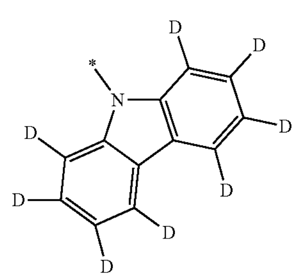

-continued

AM-11

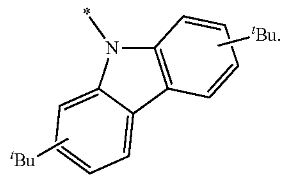

In an embodiment, the light emitting device may further include a capping layer on the second electrode, wherein the capping layer may have a refractive index of about 1.6 or more.

In an embodiment, the emission layer may be a delayed fluorescence emission layer including a host and a dopant, and the dopant may include the condensed cyclic compound.

In an embodiment, the emission layer may emit blue light having a center wavelength of about 450 nm to about 470 nm.

In an embodiment of the present disclosure, a light emitting device includes: a first electrode; a second electrode on the first electrode; and an emission layer which is between the first electrode and the second electrode and includes a condensed cyclic compound represented by Formula A below; and a capping layer which is on the second electrode and has a refractive index of about 1.6 or more.
Formula A Formula A

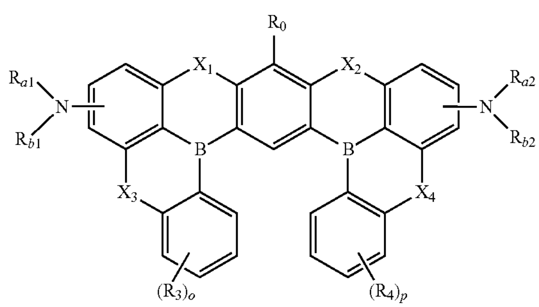

In Formula A above, $X_1$ to $X_4$ are each independently O, S, $CR_5R_6$, or $NR_7$, and o and p are each independently an integer of 0 to 4. $R_{a1}$, $R_{b1}$, $R_{a2}$, and $R_{b2}$ are each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 10 carbon atoms, a substituted or unsubstituted aryl group having 6 to 30 ring-forming carbon atoms, or a substituted or unsubstituted heterocycle having 2 to 30 ring-forming carbon atoms, or $R_{a1}$ and $R_{b1}$ are bonded to each other to form a ring, or $R_{a2}$ and $R_{b2}$ combine with each other to form a ring. $R_0$, and $R_3$ to $R_7$ are each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 10 carbon atoms, a substituted or unsubstituted aryl group having 6 to 30 ring-forming carbon atoms, or a substituted or unsubstituted heterocycle having 2 to 30 ring-forming carbon atoms, and at least one of $R_{a1}$, $R_{b1}$, $R_{a2}$, $R_{b2}$, or $R_7$ includes a substituent represented by Formula 2 or Formula 3 below:

Formula 2

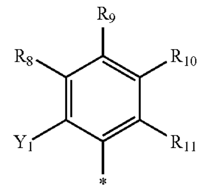

Formula 3

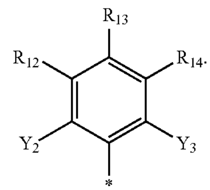

In Formula 2 and Formula 3 above, $Y_1$ to $Y_3$ are each independently a substituted or unsubstituted aryl group having 6 to 30 ring-forming carbon atoms, a substituted or unsubstituted amine group, or a substituted or unsubstituted heterocycle having 2 to 30 ring-forming carbon atoms, and $R_8$ to $R_{14}$ are each independently a hydrogen atom, a deuterium atom, a halogen atom, a cyano group, a nitro group, a substituted or unsubstituted silyl group, or a substituted or unsubstituted alkyl group having 1 to 10 carbon atoms.

In an embodiment, Formula A above may be represented by any one selected from among Formula A-1 to Formula A-6 below:

Formula A-1

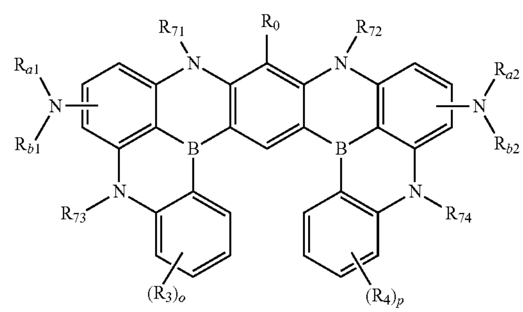

Formula A-2

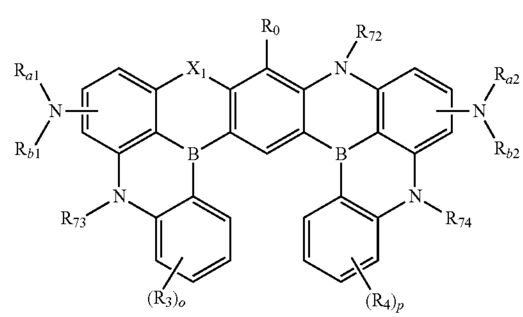

-continued

Formula A-3

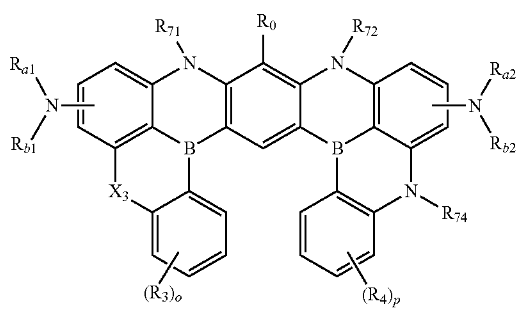

Formula A-4

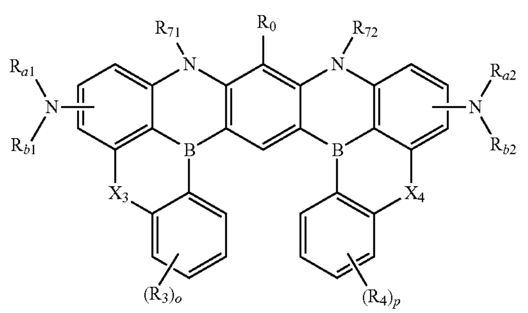

Formula A-5

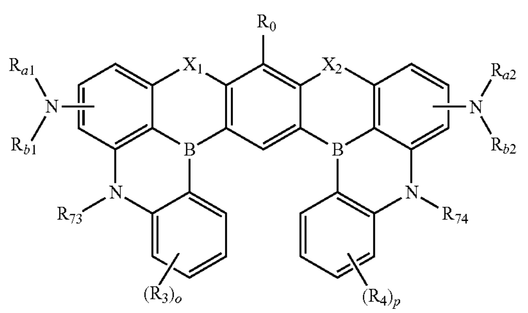

Formula A-6

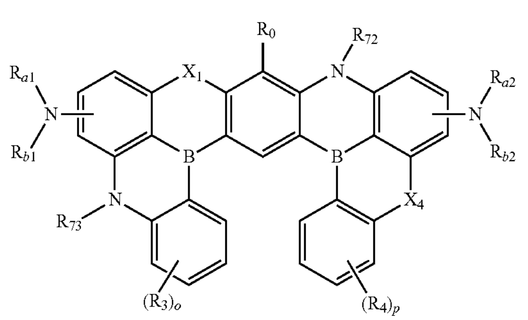

In Formula A-1 to Formula A-6 above, $R_{71}$ to $R_{74}$ each independently correspond to $R_7$ defined in Formula A, $X_1$ to $X_4$, $R_0$, $R_{a1}$, $R_{b1}$, $R_{a2}$, $R_{b2}$, $R_3$, $R_4$, o, and p are the same as defined with respect to Formula A above.

At least two selected from among $X_1$ to $X_4$ are $NR_7$, the others are each independently O, S, or $CR_5R_6$, and $R_5$ to $R_7$ are the same as defined with respect to Formula A above.

In an embodiment, Formula 2 above may be represented by Formula 2-1 below:

Formula 2-1

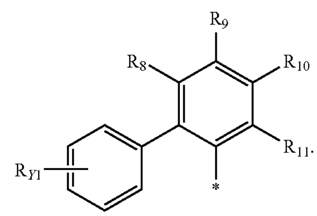

In Formula 2-1 above, $R_{Y1}$ is a hydrogen atom, a deuterium atom, a halogen atom, a cyano group, a nitro group, a substituted or unsubstituted silyl group, or a substituted or unsubstituted alkyl group having 1 to 10 carbon atoms, and $R_8$ to $R_{11}$ are the same as defined with respect to Formula 2 above.

In an embodiment, Formula 3 above may be represented by Formula 3-1 below:

Formula 3-1

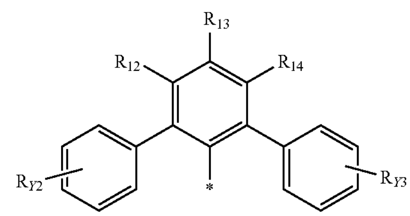

In Formula 3-1 above, $R_{Y2}$ and $R_{Y3}$ are each independently a hydrogen atom, a deuterium atom, a halogen atom, a cyano group, a nitro group, a substituted or unsubstituted silyl group, or a substituted or unsubstituted alkyl group having 1 to 10 carbon atoms, and $R_{12}$ to $R_{14}$ are the same as defined with respect to Formula 3 above.

In an embodiment, $Y_1$ to $Y_3$ may be each independently an unsubstituted phenyl group, or a phenyl group substituted with an alkyl group having 1 to 10 carbon atoms.

BRIEF DESCRIPTION OF THE DRAWINGS

The accompanying drawings are included to provide a further understanding of the subject matter of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
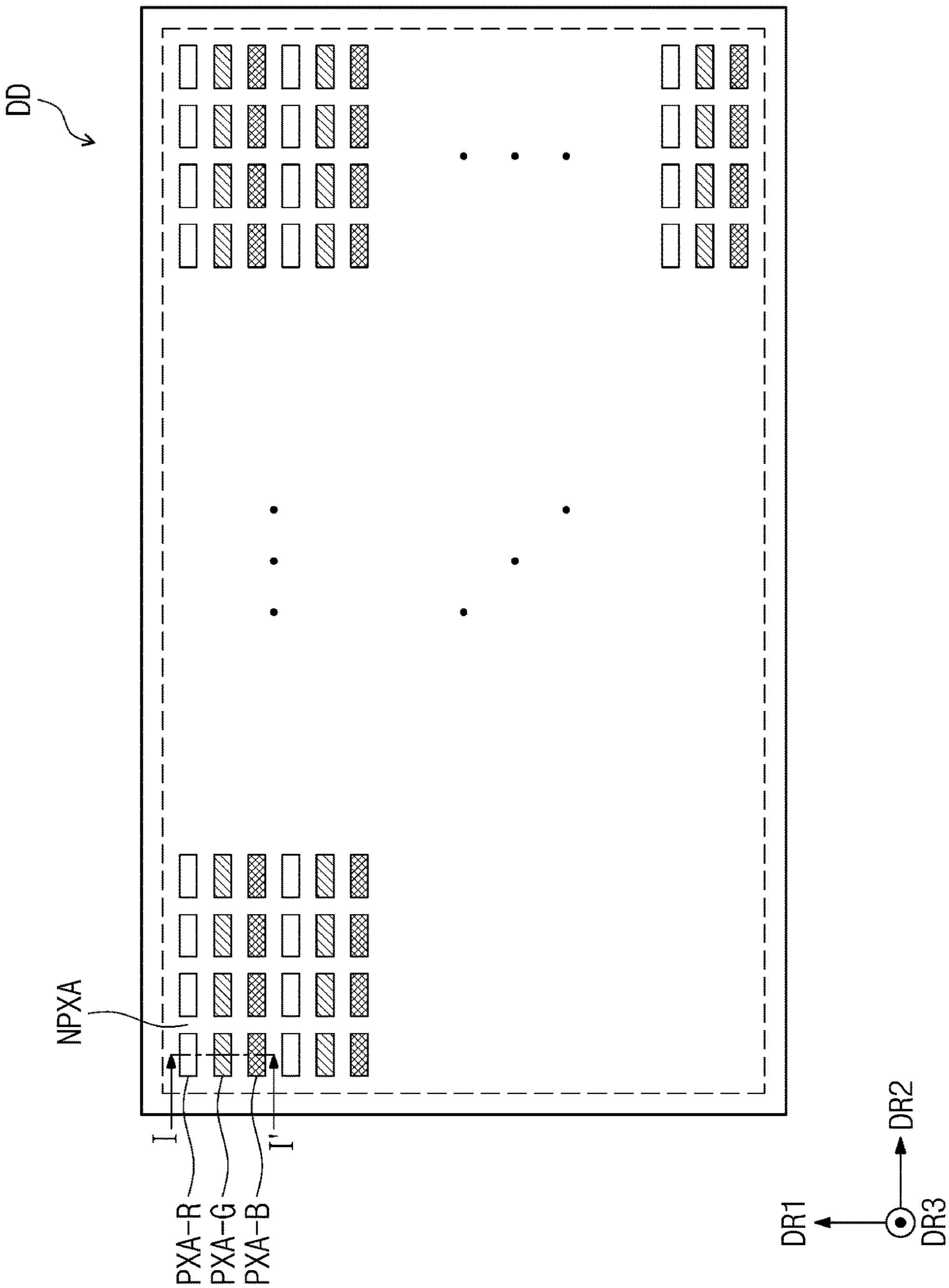
FIG. 1 is a plan view illustrating a display apparatus according to an embodiment of the present disclosure.

The subject matter of the present disclosure may be modified in many alternate forms, and thus, example embodiments will be shown in the drawings and described in more detail in the detailed description. It should be understood, however, that it is not intended to limit the present disclosure to the particular forms disclosed, but rather, is intended to cover all modifications, equivalents, and alternatives falling within the spirit and scope of the present disclosure.

When explaining each of the drawings, like reference numbers are used for referring to like elements. In the accompanying drawings, the dimensions of each structure may be exaggeratingly illustrated for clarity of the present disclosure. It will be understood that, although the terms “first,” “second,” etc. may be used herein to describe various elements, these elements should not be limited by these terms. These terms are only used to distinguish one element from another. For example, a first element may be referred to as a second element, and, similarly, the second element may be referred to as the first element, without departing from the scope of the present disclosure. The terms of a singular form may include plural forms unless the context clearly indicates otherwise.

In the present application, it will be understood that the another of “comprise” or “have” specifies the presence of a feature, a fixed number, a step, a process, an element, a component, or a combination thereof disclosed in the specification, but does not exclude the possibility of presence or addition of one or more other features, fixed numbers, steps, processes, elements, components, or combination thereof.

In the present application, when a layer, a film, a region, or a plate is referred to as being “above” or “in an upper portion” another layer, film, region, or plate, it can be not only directly on the layer, film, region, or plate, but intervening layers, films, regions, or plates may also be present. On the contrary to this, when a layer, a film, a region, or a plate is referred to as being “below,” “in a lower portion of” another layer, film, region, or plate, it can be not only directly under the layer, film, region, or plate, but intervening layers, films, regions, or plates may also be present. In addition, it will be understood that when a layer, a film, a region, or a plate is referred to as being “on” another layer, film, region, or plate, it can be not only on the layer, film, region, or plate, but also under the layer, film, region, or plate.

In the specification, the term “substituted or unsubstituted” may mean substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. In addition, each of the substituents described above may be substituted or unsubstituted. For example, a biphenyl group may be interpreted as an aryl group or a phenyl group substituted with a phenyl group.

In the specification, the phrase “bonded to an adjacent group to form a ring” may indicate that one is bonded to an adjacent group to form a substituted or unsubstituted hydrocarbon ring, or a substituted or unsubstituted heterocycle. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may be monocyclic or polycyclic. In addition, the rings formed by being bonded to each other may be connected to another ring to form a spiro structure.

In the specification, the term “an adjacent group” may mean a substituent substituted at an atom which is directly connected to an atom substituted with a corresponding substituent, another substituent substituted at an atom which is substituted with a corresponding substituent, or a substituent sterically positioned at the nearest position to a corresponding substituent. For example, two methyl groups in 1,2-dimethylbenzene may be interpreted as “adjacent groups” to each other and two ethyl groups in 1,1-diethylcyclopentane may be interpreted as “adjacent groups” to each other. In addition, two methyl groups in 4,5-dimethylphenanthrene may be interpreted as “adjacent groups” to each other.

In the specification, examples of the halogen atom may include a fluorine atom, a chlorine atom, a bromine atom, or an iodine atom.

In the specification, the alkyl group may be a linear, branched or cyclic type (e.g., a linear alkyl group, a branched alkyl group, or a cyclic alkyl group). The number of carbon atoms in the alkyl group is 1 to 50, 1 to 30, 1 to 20, 1 to 10, or 1 to 6. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but embodiments of the present disclosure are not limited thereto.

As used herein, the term “hydrocarbon ring group” means any functional group or substituent derived from an aliphatic hydrocarbon ring. The hydrocarbon ring group may be a saturated hydrocarbon ring group having 5 to 20 ring-forming carbon atoms.

As used herein, the term "aryl group" means any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but embodiments of the present disclosure are not limited thereto.

In the specification, the fluorenyl group may be substituted, and two substituents may be combined with each other to form a spiro structure. Examples of cases where the fluorenyl group is substituted are as follows. However, embodiments of the present disclosure are not limited thereto.

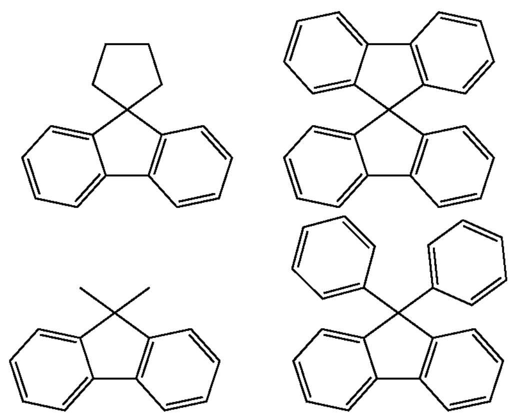

As used herein, the term "heterocyclic group" means any functional group or substituent derived from a ring including at least one of B, O, N, P, Si, or Se as a heteroatom. The heterocyclic group includes an aliphatic heterocyclic group and an aromatic heterocyclic group. The aromatic heterocyclic group may be a heteroaryl group. The aliphatic heterocycle and the aromatic heterocycle may be monocyclic or polycyclic.

In the specification, the heterocyclic group may include at least one of B, O, N, P, Si or S as a heteroatom. If the heterocyclic group includes two or more heteroatoms, the two or more heteroatoms may be the same or different. The heterocyclic group may be a monocyclic heterocyclic group or a polycyclic heterocyclic group and has the concept including a heteroaryl group. The ring-forming carbon number of the heterocyclic group may be 2 to 30, 2 to 20, or 2 to 10.

In the specification, the aliphatic heterocyclic group may include one or more among B, O, N, P, Si, and S as a heteroatom. The number of ring-forming carbon atoms of the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., but embodiments of the present disclosure are not limited thereto.

As used herein, the term "heteroaryl group" may include at least one of B, O, N, P, Si, or S as a heteroatom. When the heteroaryl group contains two or more heteroatoms, the two or more heteroatoms may be the same as or different from each other. The heteroaryl group may be a monocyclic heteroaryl group or polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazolyl group, a thiadiazole group, a phenothiazine group, a dibenzosilole group, a dibenzofuran group, etc., but embodiments of the present disclosure are not limited thereto.

In the specification, the above description with respect to the aryl group may be applied to an arylene group except that the arylene group is a divalent group. The explanation on the aforementioned heteroaryl group may be applied to the heteroarylene group except that the heteroarylene group is a divalent group.

In the specification, the term "silyl group" includes an alkylsilyl group and/or an arylsilyl group. Examples of the silyl group may include trimethylsilyl, triethylsilyl, t-butyldimethylsilyl , vinyldimethylsilyl, propyldimethylsilyl, triphenylsilyl, diphenylsilyl, phenylsilyl, etc. However, embodiments of the present disclosure are not limited thereto.

In the specification, the number of carbon atoms in an amino group is not specifically limited, but may be 1 to 30. The amino group may include an alkyl amino group, an aryl amino group, or a heteroaryl amino group. Examples of the amino group include a methylamino group, a dimethylamino group, a phenylamino group, a diphenylamino group, a naphthylamino group, a 9-methyl-anthracenylamino group, etc., but are not limited thereto.

In the specification, the number of ring-forming carbon atoms in a carbonyl group may be 1 to 40, 1 to 30, or 1 to 20. For example, the carbonyl group may have the following structures, but embodiments of the present disclosure are not limited thereto.

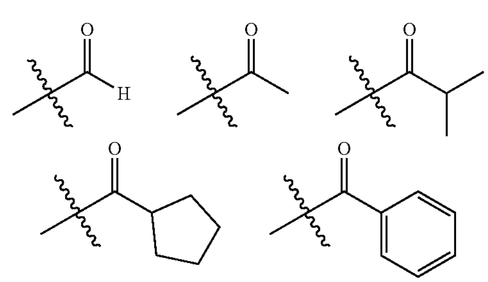

In the specification, the number of carbon atoms in a sulfinyl group and a sulfonyl group is not particularly limited, but may be 1 to 30. The sulfinyl group may include an alkyl sulfinyl group and/or an aryl sulfinyl group. The sulfonyl group may include an alkyl sulfonyl group and/or an aryl sulfonyl group.

In the specification, a thiol group may include an alkylthio group and/or an arylthio group. The thiol group may mean that a sulfur atom is bonded to the alkyl group or the aryl group as defined above. Examples of the thiol group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, but embodiments of the present disclosure are not limited thereto.

As used herein, the term "oxy group" may mean that an oxygen atom is bonded to the alkyl group or the aryl group as defined above. The oxy group may include an alkoxy group and an aryl oxy group. The alkoxy group may be a linear chain, a branched chain or a ring chain. The number of carbon atoms in the alkoxy group is not specifically limited, but may be, for example, 1 to 20 or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc., without limitation.

As used herein, the term "boron group" may mean that a boron atom is bonded to the alkyl group or the aryl group as defined above. The boron group includes an alkyl boron group and/or an aryl boron group. Examples of the boron group may include a trimethylboron group, a triethylboron group, a t-butyldimethylboron group, a triphenylboron group, a diphenylboron group, a phenylboron group, etc., but embodiments of the present disclosure are not limited thereto.

In the specification, an alkenyl group may be linear or branched. The number of carbon atoms in the alkenyl group is not specifically limited, but is 2 to 30, 2 to 20, or 2 to 10. Examples of the alkenyl group include a vinyl group, a 1-butenyl group, a 1-pentenyl group, a 1,3-butadienyl aryl group, a styrenyl group, a styryl vinyl group, etc., but embodiments of the present disclosure are not limited thereto.

In the specification, the number of carbon atoms in an amine group is not specifically limited, but may be 1 to 30. The amine group may include an alkyl amine group and an aryl amine group. Examples of the amine group include a methylamine group, a dimethylamine group, a phenylamine group, a diphenylamine group, a naphthylamine group, a 9-methyl-anthracenylamine group, etc., but embodiments of the present disclosure are not limited thereto.

In the specification, the alkyl group among an alkylthio group, an alkylsulfoxy group, an alkylaryl group, an alkylamino group, an alkyl boron group, an alkyl silyl group, and an alkyl amine group is the same as the examples of the alkyl group described above.

In the specification, the aryl group among an aryloxy group, an arylthio group, an arylsulfoxy group, an arylamino group, an arylboron group, an arylsilyl group, an arylamine group is the same as the examples of the aryl group described above.

A direct linkage herein may mean a single bond (e.g., a single covalent bond).

As used herein,

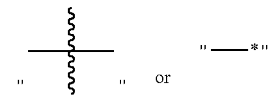

herein means a position to be connected.

Hereinafter, embodiments of the present disclosure will be described with reference to the accompanying drawings.

Figure 2:
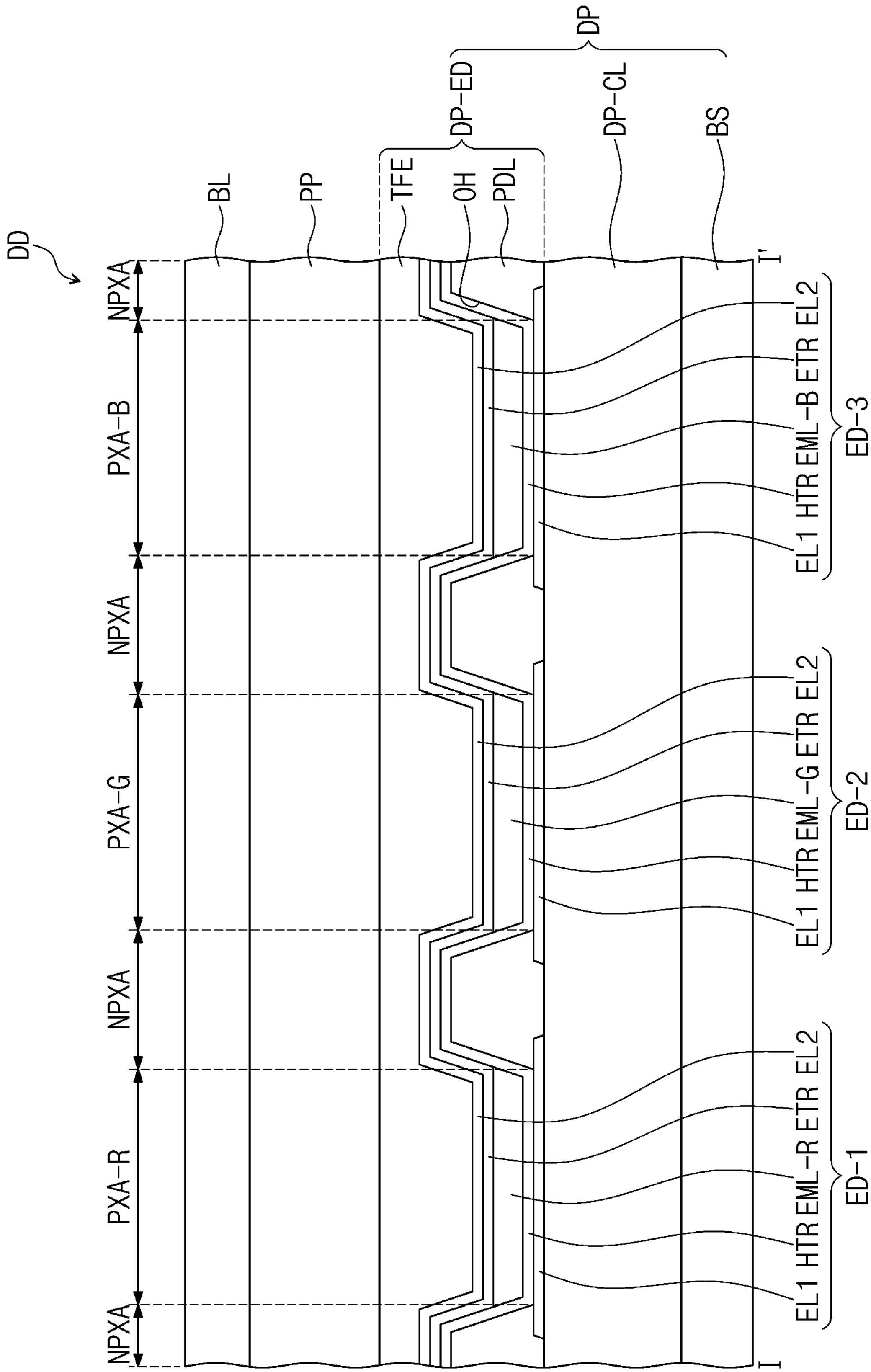
FIG. 2 is a cross-sectional view of a display apparatus according to an embodiment of the present disclosure.

FIG. 1 is a plan view illustrating an embodiment of a display apparatus DD. FIG. 2 is a cross-sectional view of the display apparatus DD of the embodiment. FIG. 2 is a cross-sectional view illustrating a part taken along line I-I' of FIG. 1.

The display apparatus DD may include a display panel DP and an optical layer PP on the display panel DP. The display panel DP includes light emitting devices ED-1, ED-2, and ED-3. The display apparatus DD may include a plurality of light emitting devices ED-1, ED-2, and ED-3. The optical layer PP may be on the display panel DP and control reflected light in the display panel DP due to external light. The optical layer PP may include, for example, a polarization layer and/or a color filter layer. In one or more embodiments, unlike the view illustrated in the drawing, the optical layer PP may be omitted from the display apparatus DD of an embodiment.

A base substrate BL may be on the optical layer PP. The base substrate BL may be a member which provides a base surface on which the optical layer PP is located. The base substrate BL may be a glass substrate, a metal substrate, a plastic substrate, etc. However, embodiments of the present disclosure are not limited thereto, and the base substrate BL may be an inorganic layer, an organic layer, or a composite material layer (e.g., a composite material layer including an inorganic material and an organic material). In addition, unlike shown, in an embodiment, the base substrate BL may be omitted.

The display apparatus DD according to an embodiment may further include a filling layer. The filling layer may be between a display device layer DP-ED and the base substrate BL. The filling layer may be an organic material layer. The filling layer may include at least one of an acrylic-based resin, a silicone-based resin, and/or an epoxy-based resin.

The display panel DP may include a base layer BS, a circuit layer DP-CL provided on the base layer BS, and a display device layer DP-ED. The display device layer DP-ED may include a pixel defining film PDL, the light emitting devices ED-1, ED-2, and ED-3 between portions of the pixel defining film PDL, and an encapsulation layer TFE on the light emitting devices ED-1, ED-2, and ED-3.

The base layer BS may be a member which provides a base surface on which the display device layer DP-ED is located. The base layer BS may be a glass substrate, a metal substrate, a plastic substrate, etc. However, embodiments of the present disclosure are not limited thereto, and the base layer BS may be an inorganic layer, an organic layer, or a composite material layer (e.g., a composite material layer including an inorganic material and an organic material).

In an embodiment, the circuit layer DP-CL is on the base layer BS, and the circuit layer DP-CL may include a plurality of transistors. Each of the transistors may include a control electrode, an input electrode, and an output electrode. For example, the circuit layer DP-CL may include a switching transistor and a driving transistor in order to drive the light emitting devices ED-1, ED-2, and ED-3 of the display device layer DP-ED.

Each of the light emitting devices ED-1, ED-2, and ED-3 may have a structure of a light emitting device ED of an embodiment according to FIGS. 3 to 6, which will be further described herein below. Each of the light emitting devices ED-1, ED-2 and ED-3 may include a first electrode EL1, a hole transport region HTR, emission layers EML-R, EML-G and/or EML-B (e.g., one selected from emission layer EML-R, emission layer EML-G, and emission layer EML-B), an electron transport region ETR, and a second electrode EL2.

FIG. 2 illustrates an embodiment in which the emission layers EML-R, EML-G, and EML-B of the light emitting devices ED-1, ED-2, and ED-3 in the openings OH defined in the pixel defining film PDL, and the hole transport region HTR, the electron transport region ETR, and the second electrode EL2 are provided as a common layer in the entire light emitting devices ED-1, ED-2, and ED-3. However, embodiments of the present disclosure are not limited thereto, and unlike the feature illustrated in FIG. 2, the hole transport region HTR and the electron transport region ETR in an embodiment may be provided by being patterned inside the opening hole OH defined in the pixel defining film PDL. For example, the hole transport region HTR, the emission layers EML-R, EML-G, and EML-B, and the electron transport region ETR in an embodiment may be provided by being patterned utilizing an inkjet printing method.

The encapsulation layer TFE may cover the light emitting devices ED-1, ED-2 and ED-3. The encapsulation layer TFE may seal the display device layer DP-ED. The encapsulation layer TFE may be a thin film encapsulation layer. The encapsulation layer TFE may be formed by laminating one layer or a plurality of layers. The encapsulation layer TFE may include at least one insulation layer. The encapsulation layer TFE according to an embodiment may include at least one inorganic film (hereinafter, an encapsulation-inorganic film). The encapsulation layer TFE according to an embodiment may also include at least one organic film (hereinafter, an encapsulation-organic film) and at least one encapsulation-inorganic film.

The encapsulation-inorganic film protects the display device layer DP-ED from moisture/oxygen, and the encapsulation-organic film protects the display device layer DP-ED from foreign substances such as dust particles. The encapsulation-inorganic film may include silicon nitride, silicon oxynitride, silicon oxide, titanium oxide, aluminum oxide, and/or the like, but embodiments of the present disclosure are not particularly limited thereto. The encapsulation-organic film may include an acrylic-based compound, an epoxy-based compound, and/or the like. The encapsulation-organic film may include a photopolymerizable organic material, but embodiments of the present disclosure are not particularly limited thereto.

The encapsulation layer TFE may be on the second electrode EL2 and may fill the opening hole OH.

Referring to FIGS. 1 and 2, the display apparatus DD may include a non-light emitting region NPXA and light emitting regions PXA-R, PXA-G and PXA-B. The light emitting regions PXA-R, PXA-G and PXA-B each may be a region which emits light generated from the light emitting devices ED-1, ED-2 and ED-3, respectively. The light emitting regions PXA-R, PXA-G, and PXA-B may be spaced apart from each other in a plane.

Each of the light emitting regions PXA-R, PXA-G, and PXA-B may be a region divided by pixel defining film PDL. The non-light emitting regions NPXA may be regions between the adjacent light emitting regions PXA-R, PXA-G, and PXA-B, which correspond to portions of the pixel defining film PDL. In one or more embodiments, each of the light emitting regions PXA-R, PXA-G, and PXA-B may correspond to a pixel. The pixel defining film PDL may separate the light emitting devices ED-1, ED-2, and ED-3. The emission layers EML-R, EML-G and EML-B of the light emitting devices ED-1, ED-2 and ED-3 may be in openings OH defined by the pixel defining film PDL and separated from each other.

The light emitting regions PXA-R, PXA-G and PXA-B may be divided into a plurality of groups according to the color of light generated from the plurality of light emitting devices ED-1, ED-2 and ED-3. In the display apparatus DD of an embodiment shown in FIGS. 1 and 2, three light emitting regions PXA-R, PXA-G, and PXA-B which emit red light, green light, and blue light, respectively are illustrated as examples. For example, the display apparatus DD of an embodiment may include the red light emitting region PXA-R, the green light emitting region PXA-G, and the blue light emitting region PXA-B which are different.

In the display apparatus DD according to an embodiment, the plurality of light emitting devices ED-1, ED-2 and ED-3 may emit light in different wavelength regions. For example, in an embodiment, the display apparatus DD may include the first light emitting device ED-1 that emits red light, the second light emitting device ED-2 that emits green light, and the third light emitting device ED-3 that emits blue light. In one or more embodiments, the red light emitting region PXA-R, the green light emitting region PXA-G, and the blue light emitting region PXA-B of the display apparatus DD may correspond to the first light emitting device ED-1, the second light emitting device ED-2, and the third light emitting device ED-3, respectively.

However, embodiments of the present disclosure are not limited thereto, and the first to the third light emitting devices ED-1, ED-2, and ED-3 may emit light in the same wavelength range or at least one light emitting device may emit light in a wavelength range different from the others. For example, the first to third light emitting devices ED-1, ED-2, and ED-3 may all emit blue light.

The light emitting regions PXA-R, PXA-G, and PXA-B in the display apparatus DD according to an embodiment may be arranged in a stripe form. Referring to FIG. 1, the plurality of red light emitting regions PXA-R, the plurality of green light emitting regions PXA-G, and the plurality of blue light emitting regions PXA-B each may be arranged along a second directional axis DR2. In addition, the red light emitting region PXA-R, the green light emitting region PXA-G, and the blue light emitting region PXA-B may be alternately arranged in this order along a first directional axis DR1.

FIGS. 1 and 2 illustrate that all the light emitting regions PXA-R, PXA-G, and PXA-B have similar area, but embodiments of the present disclosure are not limited thereto, and the light emitting regions PXA-R, PXA-G, and PXA-B may have different areas from each other according to a wavelength range of the emitted light. In one or more embodiments, the areas of the light emitting regions PXA-R, PXA-G, and PXA-B may be areas, when viewed in a plane, defined by the first directional axis DR1 and the second directional axis DR2.

The arrangement form of the light emitting regions PXA-R, PXA-G, and PXA-B is not limited to the feature illustrated in FIG. 1, and the order in which the red light emitting region PXA-R, the green light emitting region PXA-G, and the blue light emitting region PXA-B are arranged may be variously combined and provided according to characteristics of a display quality required or utilized in the display apparatus DD. For example, the arrangement form of the light emitting regions PXA-R, PXA-G, and PXA-B may be a PENTILE® arrangement form (e.g., an RGBG matrix, RGBG structure, or RGBG matrix structure) or a diamond arrangement form, but the present disclosure is not limited thereto. PENTILE® is a duly registered trademark of Samsung Display Co., Ltd.

In addition, the areas of the light emitting regions PXA-R, PXA-G, and PXA-B may be different from each other. For example, in an embodiment, the area of the green light emitting region PXA-G may be smaller than that of the blue light emitting region PXA-B, but embodiments of the present disclosure are not limited thereto.

Hereinafter, FIGS. 3 to 6 are cross-sectional views schematically illustrating light emitting devices according to an embodiment. The light emitting devices ED according to embodiments each may include a first electrode EL1, a second electrode EL2 facing the first electrode EL1, and at least one functional layer between the first electrode EL1 and the second electrode EL2. The at least one functional layer may include a hole transport region HTR, an emission layer EML, and an electron transport region ETR that are sequentially stacked. For example, each of the light emitting devices ED of embodiments may include the first electrode EL1, the hole transport region HTR, the emission layer EML, the electron transport region ETR, and the second electrode EL2 that are sequentially stacked.

Figure 3:
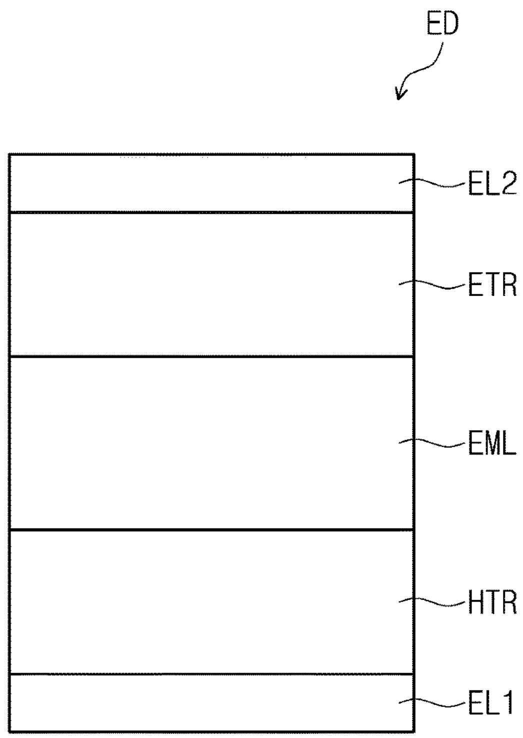
FIG. 3 is a cross-sectional view schematically illustrating a light emitting device according to an embodiment of the present disclosure.
Figure 4:
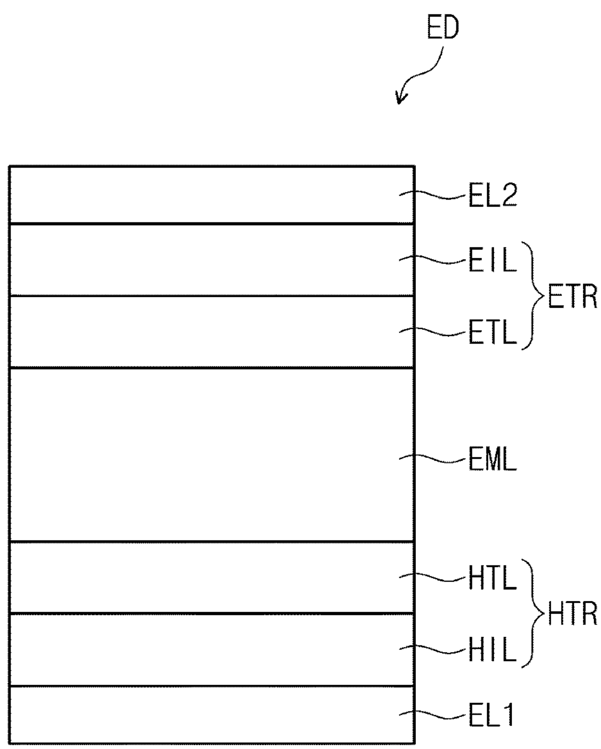
FIG. 4 is a cross-sectional view schematically illustrating a light emitting device according to an embodiment of the present disclosure.
Figure 5:
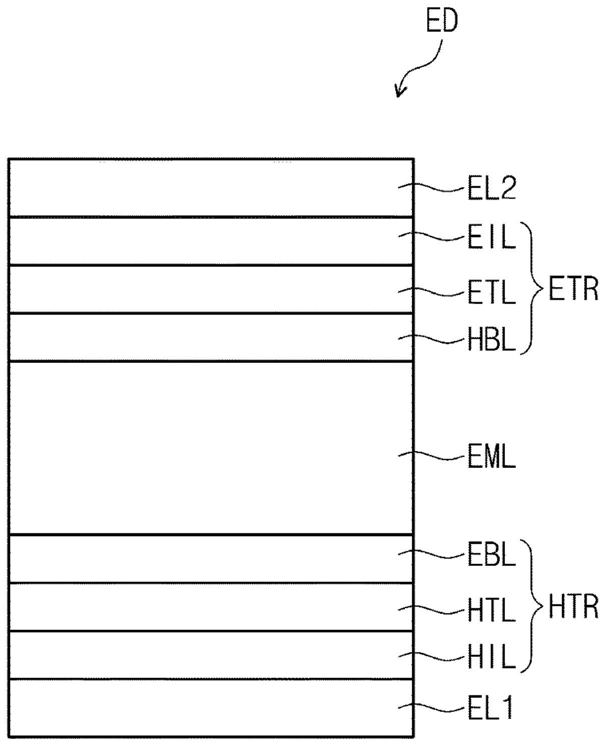
FIG. 5 is a cross-sectional view schematically illustrating a light emitting device according to an embodiment of the present disclosure.
Figure 6:
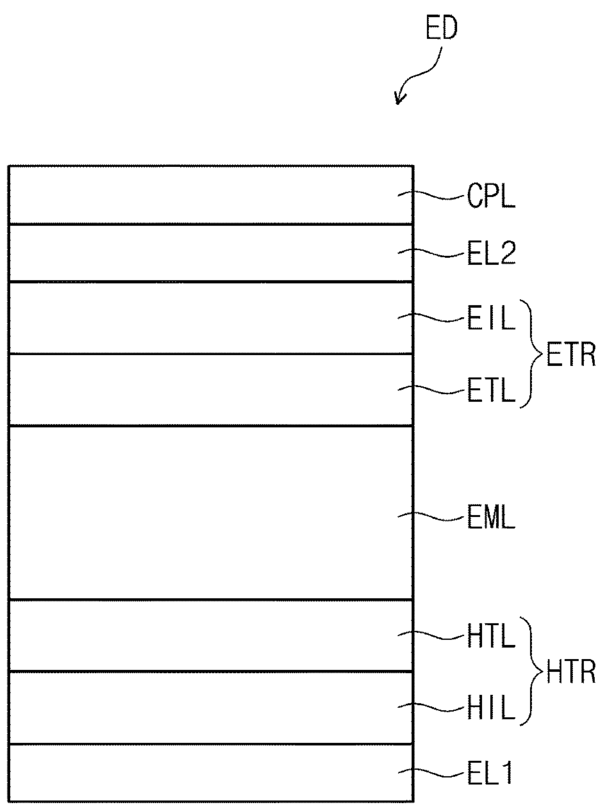
FIG. 6 is a cross-sectional view schematically illustrating a light emitting device according to an embodiment of the present disclosure.

Compared to FIG. 3, FIG. 4 illustrates a cross-sectional view of a light emitting device ED of an embodiment, in which a hole transport region HTR includes a hole injection layer HIL and a hole transport layer HTL, and an electron transport region ETR includes an electron injection layer EIL and an electron transport layer ETL. In addition, compared to FIG. 3, FIG. 5 illustrates a cross-sectional view of a light emitting device ED of an embodiment, in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. Compared to FIG. 4, FIG. 6 illustrates a cross-sectional view of a light emitting device ED of an embodiment including a capping layer CPL on a second electrode EL2.

The light emitting device ED of an embodiment may include a condensed cyclic compound of an embodiment, which will be further described below, in the emission layer EML. However, embodiments of the present disclosure are not limited thereto, and the light emitting device ED of an embodiment may include a condensed cyclic compound according to an embodiment, which will be further described below, in the hole transport region HTR or the electron transport region ETR which is one of the plurality of functional layers between the first electrode EU and the second electrode EL2, as well as in the emission layer EML.

In the light emitting device ED according to an embodiment, the first electrode EL1 has conductivity (e.g., electrical conductivity). The first electrode EL1 may be formed of a metal material, a metal alloy, and/or a conductive compound. The first electrode EL1 may be an anode or a cathode. However, embodiments of the present disclosure are not limited thereto. In addition, the first electrode EL1 may be a pixel electrode. The first electrode EL1 may be a transmissive electrode, a transflective electrode, or a reflective electrode. The first electrode EL1 may include any one selected from among Ag, Mg, Cu, Al, Pt, Pd, Au, Ni, Nd, Ir, Cr, Li, Ca, LiF/Ca, LiF/Al, Mo, Ti, W, In, Sn, Zn, a compound of two or more thereof, a mixture of two or more thereof, or an oxide thereof.

When the first electrode EL1 is the transmissive electrode, the first electrode EL1 may include a transparent metal oxide such as indium tin oxide (ITO), indium zinc oxide (IZO), zinc oxide (ZnO), and/or indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, a compound thereof, or a mixture thereof (e.g., a mixture of Ag and Mg). In one or more embodiments, the first electrode EL1 may have a multilayer structure including a reflective film or a transflective film formed of the above-described materials, and a transparent conductive film formed of ITO, IZO, ZnO, ITZO, etc. For example, the first electrode EL1 may have a three-layer structure of ITO/Ag/ITO, but embodiments of the present disclosure are not limited thereto. In addition, embodiments of the present disclosure are not limited thereto, and the first electrode EL1 may include the above-described metal materials, combinations of at least two metal materials of the above-described metal materials, oxides of the above-described metal materials, and/or the like. The thickness of the first electrode EL1 may be from about 700 Å to about 10,000 Å. For example, the thickness of the first electrode EL1 may be from about 1,000 Å to about 3,000 Å.

The hole transport region HTR is provided on the first electrode EL1. The hole transport region HTR may include at least one of a hole injection layer HIL, a hole transport layer HTL, a buffer layer or an emission-auxiliary layer, and/or an electron blocking layer EBL. The thickness of the hole transport region HTR may be, for example, from about 50 Å to about 15,000 Å.

The hole transport region HTR may have a single layer formed of a single material, a single layer formed of a plurality of different materials, or a multilayer structure including a plurality of layers formed of a plurality of different materials.

For example, the hole transport region HTR may have a single layer structure of the hole injection layer HIL or the hole transport layer HTL, and may have a single layer structure formed of a hole injection material and a hole transport material. In addition, the hole transport region HTR may have a single layer structure formed of a plurality of different materials, or a structure in which a hole injection layer HIL/hole transport layer HTL, a hole injection layer HIL/hole transport layer HTL/buffer layer, a hole injection layer HIL/buffer layer, a hole transport layer HTL/buffer layer, or a hole injection layer HIL/hole transport layer HTL/electron blocking layer EBL are stacked in order from the first electrode EL1, but embodiments of the present disclosure are not limited thereto.

The hole transport region HTR may be formed using various suitable methods such as a vacuum deposition method, a spin coating method, a cast method, a Langmuir-Blodgett (LB) method, an inkjet printing method, a laser printing method, and/or a laser induced thermal imaging (LITI) method.

The hole transport region HTR may include a compound represented by Formula H-1 below:

Formula H-1

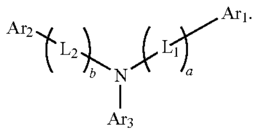

In Formula H-1 above, $L_1$ and $L_2$ may be each independently a direct linkage, a substituted or unsubstituted arylene group having 6 to 30 ring-forming carbon atoms, or a substituted or unsubstituted heteroarylene group having 2 to 30 ring-forming carbon atoms. a and b may be each independently an integer of 0 to 10. In one or more embodiments, when a or b is an integer of 2 or greater, a plurality of $L_1$'s and $L_2$'s may be each independently a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may be each independently a substituted or unsubstituted aryl group having 6 to 30 ring-forming carbon atoms, or a substituted or unsubstituted heteroaryl group having 2 to 30 ring-forming carbon atoms. In addition, in Formula H-1, $Ar_3$ may be a substituted or unsubstituted aryl group having 6 to 30 ring-forming carbon atoms.

The compound represented by Formula H-1 above may be a monoamine compound. In one or more embodiments, the compound represented by Formula H-1 above may be a diamine compound in which at least one selected from among $Ar_1$ to $Ar_3$ includes the amine group as a substituent. In addition, the compound represented by Formula H-1 above may be a carbazole-based compound including a substituted or unsubstituted carbazole group in at least one of $Ar_1$ or $Ar_2$, or a fluorene-based compound including a substituted or unsubstituted fluorene group in at least one of $Ar_1$ or $Ar_2$.

The compound represented by Formula H-1 may be represented by any one selected from among the compounds of Compound Group H below. However, the compounds listed in Compound Group H below are examples, and the compounds represented by Formula H-1 are not limited to those represented by Compound Group H below:

Compound Group H

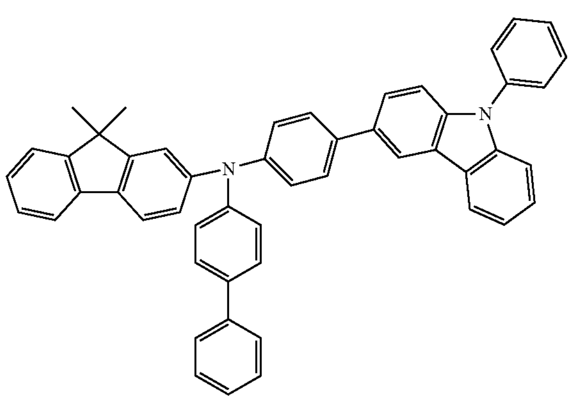

-continued

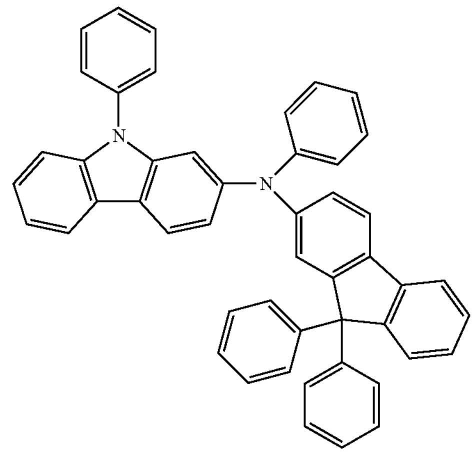

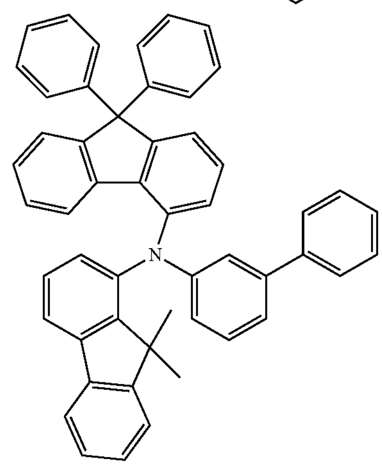

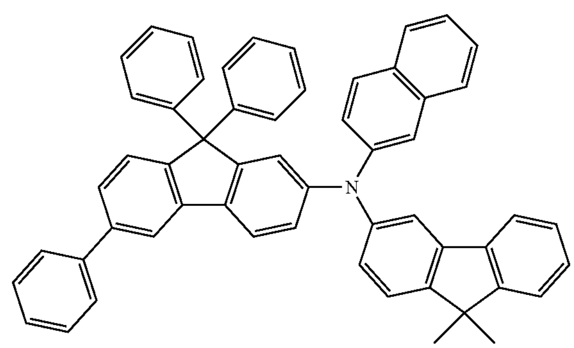

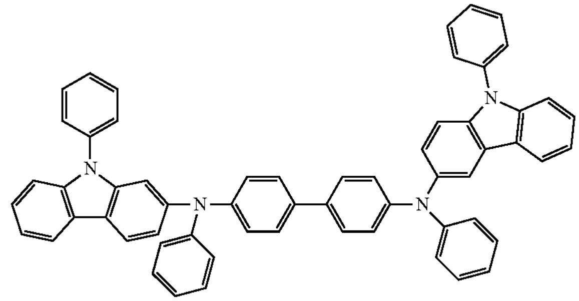

-continued
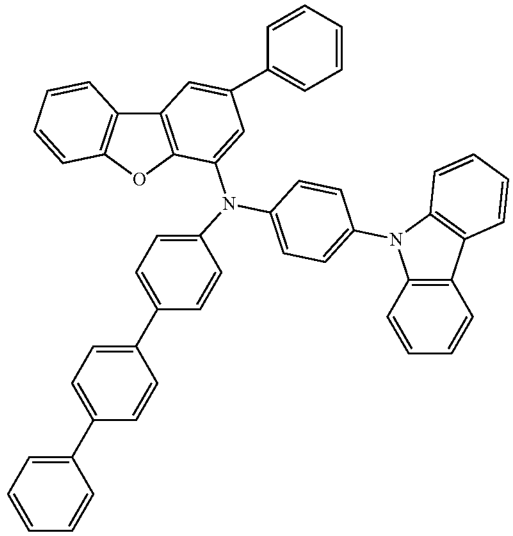
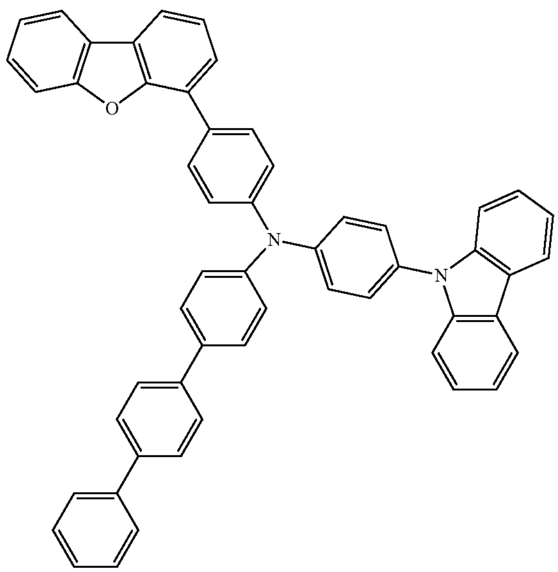
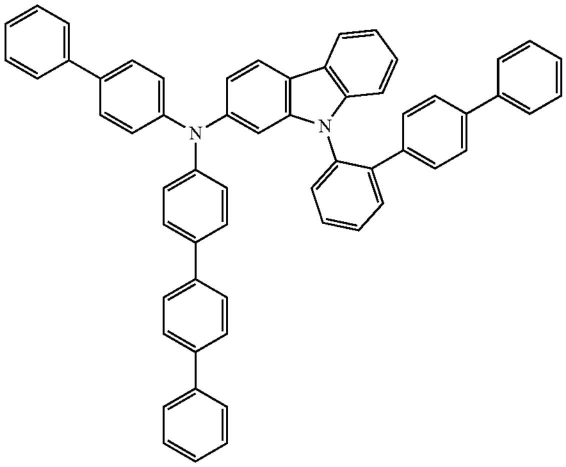
-continued
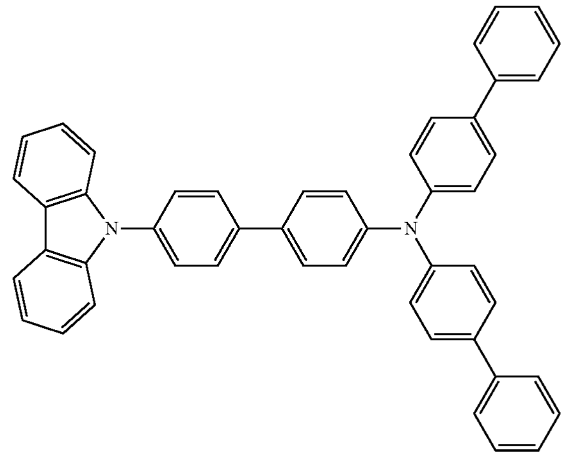
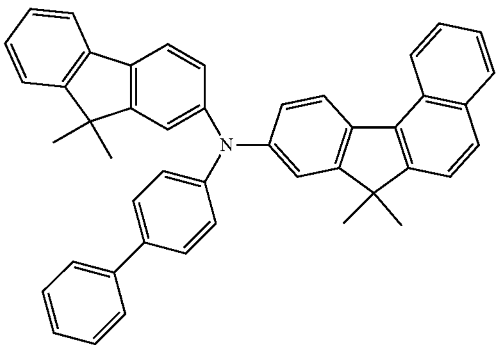
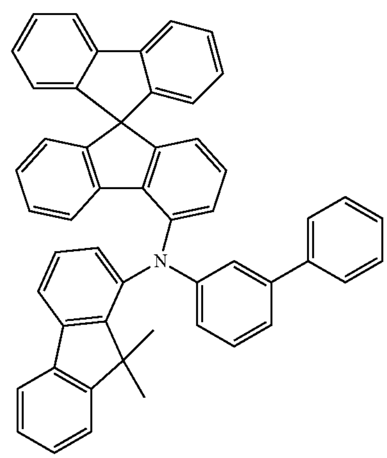
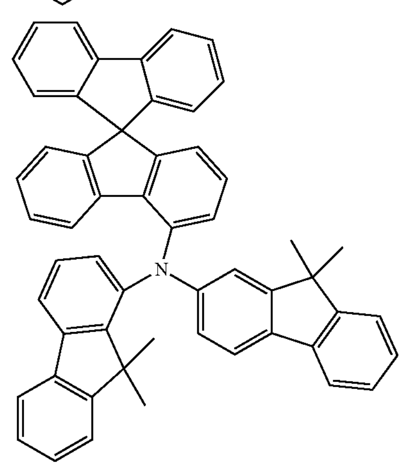

-continued

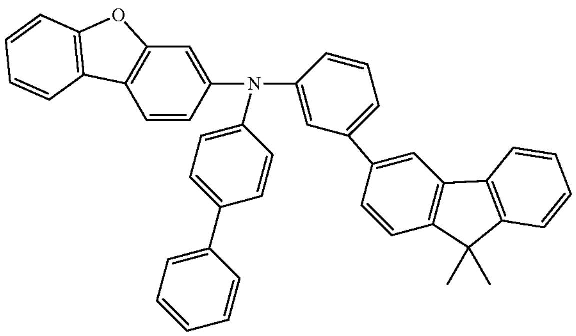

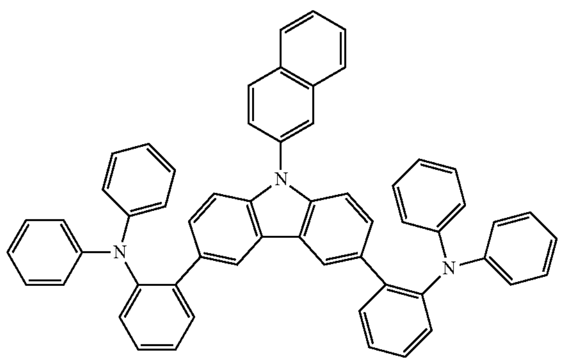

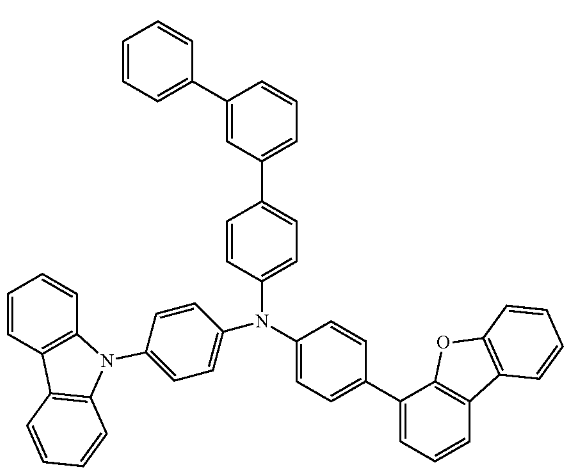

-continued

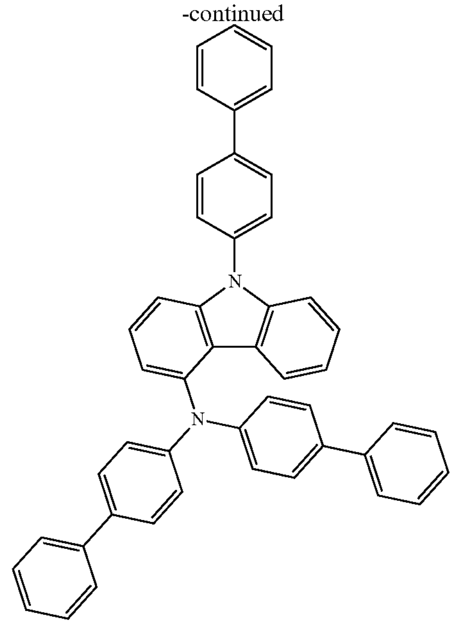

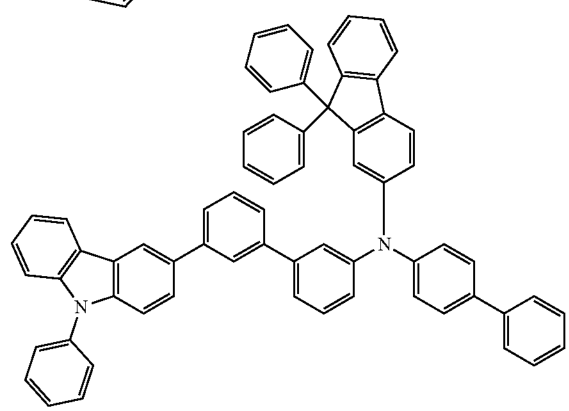

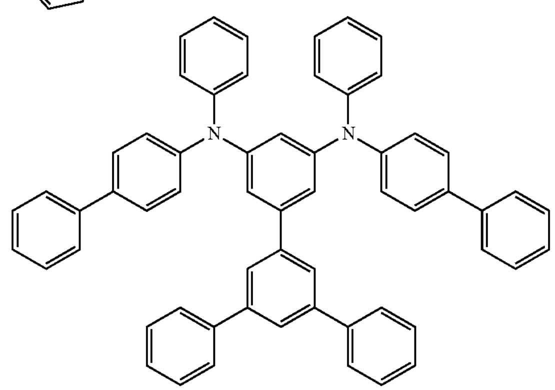

The hole transport region HTR may include a phthalocyanine compound such as copper phthalocyanine; $N^1$,$N^{1'}$-([1,1'-biphenyl]-4,4'-diyl)bis($N^1$-phenyl-$N^4$,$N^4$-di-m-tolyl-benzene-1,4-diamine) (DNTPD), 4,4',4"-[tris(3-methylphenyl)phenylamino] triphenylamine (m-MTDATA), 4,4'4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-I-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], dipyrazino[2,3-f: 2',3'-h]quinoxaline-2,3,6,7,10,11-hexacarbonitrile (HATCN), etc.

The hole transport region HTR may include carbazole derivatives such as N-phenyl carbazole and polyvinyl carbazole, fluorene derivatives, N,N'-bis(3-methylphenyl)-N,N'-diphenyl-[1,1-biphenyl]-4,4'-diamine (TPD), triphenylamine derivatives such as 4,4',4"-tris(N-carbazolyl)triphenylamine (TCTA), N,N'-di(naphthalene-I-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-bis(N-carbazolyl)benzene (mCP), etc.

In addition, the hole transport region HTR may include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the above-described compound of the hole transport region in at least one of a hole injection layer HIL, a hole transport layer HTL, and/or an electron blocking layer EBL.

The thickness of the hole transport region HTR may be from about 100 Å to about 10,000 Å, for example, from about 100 Å to about 5,000 Å. When the hole transport region HTR includes the hole injection layer HIL, the hole injection layer HIL may have, for example, a thickness of about 30 Å to about 1,000 Å. When the hole transport region HTR includes the hole transport layer HTL, the hole transport layer HTL may have a thickness of about 30 Å to about 1,000 Å. For example, when the hole transport region HTR includes the electron blocking layer EBL, the electron blocking layer EBL may have a thickness of about 10 Å to about 1,000 Å. If the thicknesses of the hole transport region HTR, the hole injection layer HIL, the hole transport layer HTL and the electron blocking layer EBL satisfy the above-described ranges, suitable or satisfactory hole transport characteristics may be achieved without a substantial increase in a driving voltage.

The hole transport region HTR may further include a charge generating material in addition to the above-described materials to increase conductivity (e.g., electrical conductivity). The charge generating material may be dispersed uniformly or non-uniformly in the hole transport region HTR. The charge generating material may include, for example, a p-dopant. The p-dopant may include at least one of a halogenated metal compound, a quinone derivative, a metal oxide, and/or a cyano group-containing compound, but embodiments of the present disclosure are not limited thereto. For example, the p-dopant may include metal halides such as CuI and/or RbI, quinone derivatives such as tetracyanoquinodimethane (TCNQ) and/or 2,3,5,6-tetrafluoro-7,7,8,8-tetracyanoquinodimethane (F4-TCNQ), metal oxides such as tungsten oxide and/or molybdenum oxide, dipyrazino[2,3-f: 2',3'-h] quinoxaline-2,3,6,7,10,11-hexacarbonitrile (HATCN), 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9), etc., but embodiments of the present disclosure are not limited thereto.

As described above, the hole transport region HTR may further include at least one of the buffer layer or the electron blocking layer EBL in addition to the hole injection layer HIL and the hole transport layer HTL. The buffer layer may compensate a resonance distance according to the wavelength of light emitted from the emission layer EML and may thus increase light emission efficiency. Materials which may be included in the hole transport region HTR may be used as materials to be included in the buffer layer. The electron blocking layer EBL is a layer that serves to prevent or reduce injection of electrons from the electron transport region ETR to the hole transport region HTR.

The emission layer EML is provided on the hole transport region HTR. The emission layer EML may have a thickness of, for example, about 100 Å to about 1,000 Å or about 100 Å to about 300 Å. The emission layer EML may have a single layer formed of a single material, a single layer formed of a plurality of different materials, or a multilayer structure having a plurality of layers formed of a plurality of different materials.

The light emitting device ED of an embodiment may include a condensed cyclic compound according to an embodiment. The condensed cyclic compound of an embodiment may be represented by Formula 1 below:

Formula 1

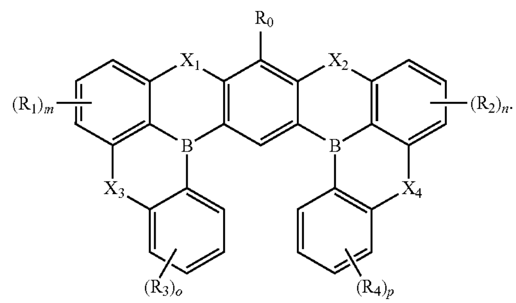

In Formula 1, $X_1$ to $X_4$ are each independently O, S, $CR_5R_6$, or $NR_7$. For example, in an embodiment, at least two selected from among $X_1$ to $X_4$ may be $NR_7$, and the rest may be each independently O, S, or $CR_5R_6$. For example, at least two selected from among $X_1$ to $X_4$ may be $NR_7$, and the rest may all be O, at least two selected from among $X_1$ to $X_4$ may be $NR_7$, and the rest may all be S, or at least two selected from among $X_1$ to $X_4$ may be $NR_7$, and the rest may be selected from among O and S. For example, in the condensed cyclic compound of an embodiment, at least two selected from among $X_1$ to $X_4$ may be $NR_7$, and the rest may be each independently O or S.

In Formula 1, m and n may be each independently an integer of 0 to 3, and o and p may be each independently an integer of 0 to 4. When m is an integer of 2 or greater, a plurality of $R_1$'s may all be the same or at least one may be different from the rest. In one or more embodiments, when n, o, p each are an integer of 2 or greater, each of a plurality of $R_2$'s, $R_3$'s, and $R_4$'s may all be the same or at least one may be different from the rest of the $R_2$'s, $R_3$'s, and $R_4$'s.

In the condensed cyclic compound of an embodiment, m and n may be 1, and o and p may be 0. However, embodiments of the present disclosure are not limited thereto.

In the condensed cyclic compound represented by Formula 1, $R_0$ to $R_7$ may be each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 10 carbon atoms, a substituted or unsubstituted aryl group having 6 to 30 ring-forming carbon atoms, or a substituted or unsubstituted heterocycle having 2 to 30 ring-forming carbon atoms. In addition, at least one selected from among $R_1$ to $R_7$ may include a substituent represented by Formula 2 or Formula 3 below. For example, in an embodiment, at least one selected from among $R_1$ to $R_7$ may be a substituent represented by Formula 2 or Formula 3 below, or may include the substituent represented by Formula 2 or Formula 3 below as a part of the substituent such as $R_1$ to $R_7$.

Formula 2

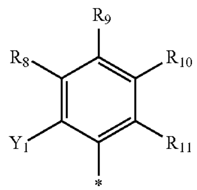

Formula 3

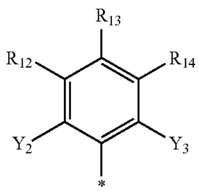

In Formula 2 and Formula 3 above, "—*" may be a part bonded to the condensed cyclic ring, or may be a part bonded to the part of the substituent such as $R_1$ to $R_7$. For example, when $R_7$ includes the substituent represented by Formula 2 or Formula 3, "—*" part may be a part bonded to a nitrogen atom (N) in $NR_7$.

In Formula 2 and Formula 3 above, $Y_1$ to $Y_3$ may be each independently a substituted or unsubstituted aryl group having 6 to 30 ring-forming carbon atoms, or a substituted or unsubstituted heterocycle having 2 to 30 ring-forming carbon atoms, and $R_8$ to $R_{14}$ may be each independently a hydrogen atom, a deuterium atom, a halogen atom, a cyano group, a nitro group, a substituted or unsubstituted silyl group, or a substituted or unsubstituted alkyl group having 1 to 10 carbon atoms.

For example, in Formula 2 and Formula 3, $Y_1$ to $Y_3$ may be each independently an unsubstituted aryl group having 6 to 30 ring-forming carbon atoms, or an aryl group having 6 to 30 ring-forming carbon atoms at which a linear or branched alkyl group having 1 to 10 carbon atoms is substituted. For example, $Y_1$ to $Y_3$ may be each independently an unsubstituted phenyl group, or a phenyl group substituted with a linear or branched alkyl group having 1 to 10 carbon atoms. In addition, in Formula 2 and Formula 3, $R_8$ to $R_{14}$ may all be hydrogen atoms. However, embodiments of the present disclosure are not limited thereto.

Formula 2 may be represented by Formula 2-1 below:

Formula 2-1

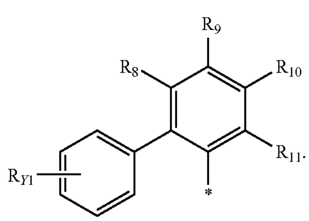

In Formula 2-1 above, $R_{Y1}$ may be a hydrogen atom, a deuterium atom, a halogen atom, a cyano group, a nitro group, a substituted or unsubstituted silyl group, or a substituted or unsubstituted alkyl group having 1 to 10 carbon atoms. $R_8$ to $R_{11}$ may be the same as those described with respect to Formula 2 as described above.

Formula 3 may be represented by Formula 3-1 below:

Formula 3-1

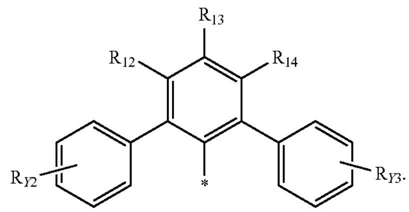

In Formula 3-1 above, $R_{Y2}$ and $R_{Y3}$ may be each independently a hydrogen atom, a deuterium atom, a halogen atom, a cyano group, a nitro group, a substituted or unsubstituted silyl group, or a substituted or unsubstituted alkyl group having 1 to 10 carbon atoms. $R_{12}$ to $R_{14}$ may be the same as those described with respect to Formula 3 as described above.

According to the condensed cyclic compound of an embodiment, for example, at least one selected from among $R_1$ to $R_7$ may include a substituent represented by any one selected from among S-1 to S-3 below:

S-1

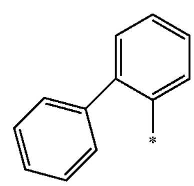

S-2

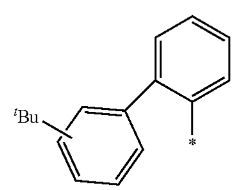

S-3

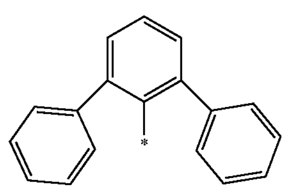

However, embodiments of the present disclosure are not limited thereto.

In the condensed cyclic compound represented by Formula 1 of an embodiment, m and n may be 1, and $R_1$ and $R_2$ may be each independently $NR_aR_b$. In one or more embodiments, at least one of $R_a$, $R_b$, or $R_7$ may be represented by Formula 2 or Formula 3 above, and the rest may be a substituted or unsubstituted aryl group having 6 to 30 ring-forming carbon atoms. For example, at least one of $R_a$, $R_b$, or $R_7$ may include a substituent represented by any one selected from among S-1 to S-3 as described above.

In the condensed cyclic compound represented by Formula 1 of an embodiment, m and n may be 1, and $R_1$ and $R_2$ may be each independently represented by any one selected from among AM-1 to AM-11 below. However, embodiments of the present disclosure are not limited thereto. In AM-1 to AM-11 below, tBu is a tert-butyl group, and "D" is a deuterium atom.

AM-1

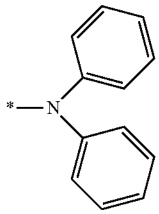

AM-2

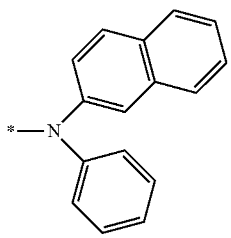

AM-3

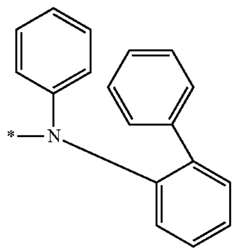

AM-4

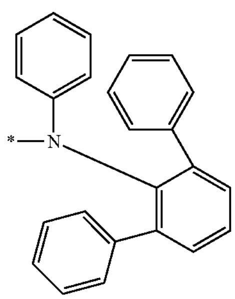

AM-5

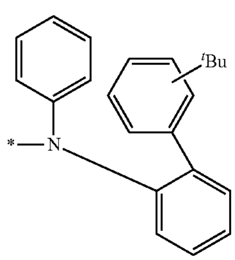

AM-6

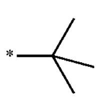

AM-7

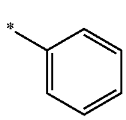

-continued

AM-8

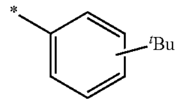

AM-9

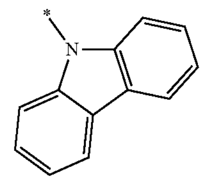

AM-10

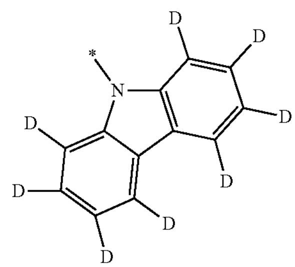

AM-11

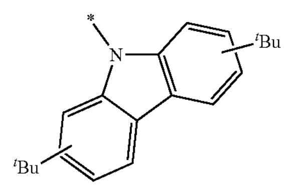

The compound represented by Formula 1 of an embodiment may be represented by any one selected from among Formula 1-1 to Formula 1-6 below. Formula 1-1 to Formula 1-6 illustrate example combinations of ring-forming atoms of di-boron-based condensed cycles in the condensed cyclic compounds of embodiments.

Formula 1-1

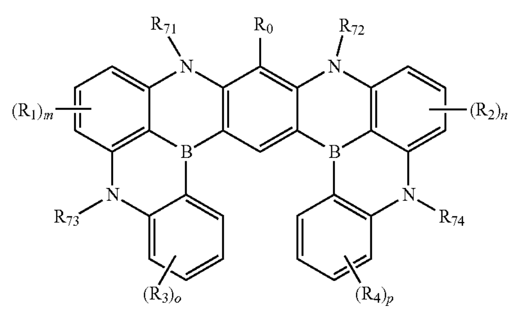

Formula 1-2

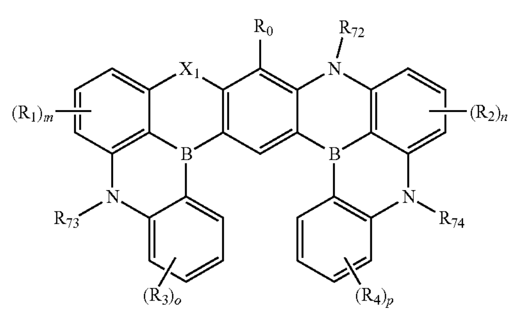

-continued

Formula 1-3

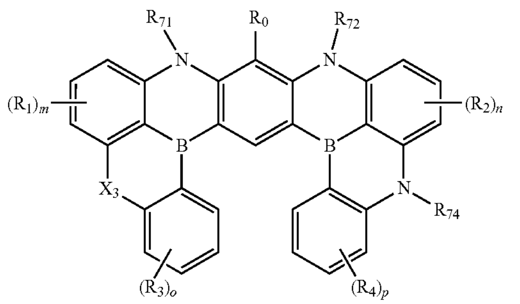

Formula 1-4

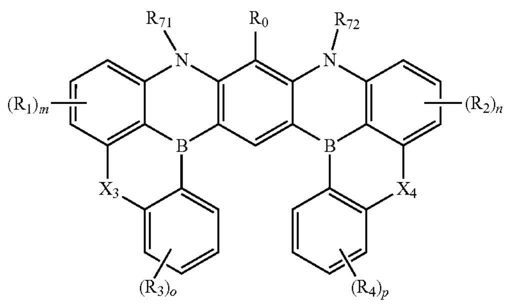

Formula 1-5

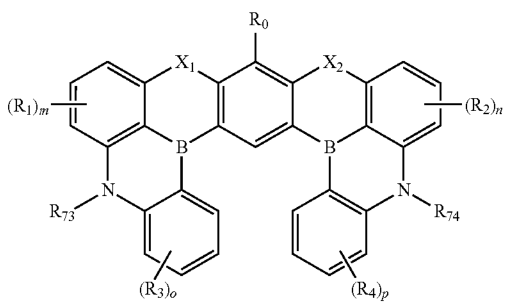

Formula 1-6

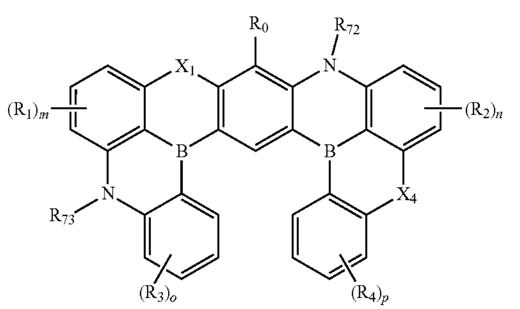

In Formulas 1-1 to 1-6, $R_{71}$ to $R_{74}$ each independently correspond to $R_7$ defined in Formula 1 above. In addition, in Formula 1-1 to Formula 1-6 above, $X_1$ to $X_4$, $R_0$ to $R_4$, and m to p may be the same as those described with respect to Formulae 1 to 3 as described above.

In one or more embodiments, the condensed cyclic compound may be represented by Formula A below:

Formula A

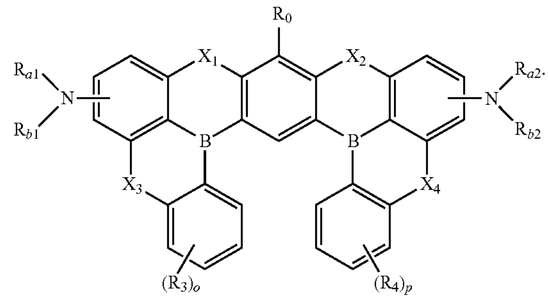

In Formula A above, $X_1$ to $X_4$ may be each independently O, S, $CR_5R_6$, or $NR_7$, and o and p may be each independently an integer of 0 to 4. In addition, $R_0$, and $R_3$ to $R_7$ are each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 10 carbon atoms, a substituted or unsubstituted aryl group having 6 to 30 ring-forming carbon atoms, or a substituted or unsubstituted heterocycle having 2 to 30 ring-forming carbon atoms. $R_{a1}$, $R_{b1}$, $R_{a2}$, and $R_{b2}$ are each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 10 carbon atoms, a substituted or unsubstituted aryl group having 6 to 30 ring-forming carbon atoms, or a substituted or unsubstituted heterocycle having 2 to 30 ring-forming carbon atoms, or $R_{a1}$ and $R_{b1}$ are bonded to each other to form a ring, or $R_{a2}$ and $R_{b2}$ combine with each other to form a ring. And at least one of $R_{a1}$, $R_{b1}$, $R_{a2}$, $R_{b2}$, or $R_7$ includes a substituent represented by Formula 2 or Formula 3 below:

Formula 2

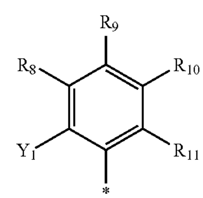

Formula 3

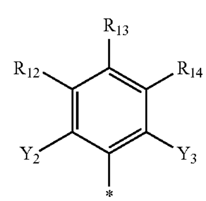

In Formula 2 and Formula 3 above, $Y_1$ to $Y_3$ are each independently a substituted or unsubstituted aryl group having 6 to 30 ring-forming carbon atoms, a substituted or unsubstituted amine group, or a substituted or unsubstituted heterocycle having 2 to 30 ring-forming carbon atoms, and $R_8$ to $R_{14}$ are each independently a hydrogen atom, a deuterium atom, a halogen atom, a cyano group, a nitro group, a substituted or unsubstituted silyl group, or a substituted or unsubstituted alkyl group having 1 to 10 carbon atoms. In one or more embodiments, the substituents of Formula 2 and Formula 3 may be the same as those described with respect to the condensed cyclic compound represented by Formula 1.

In the condensed cyclic compound of one embodiment represented by Formula A, $R_{a1}$ and $R_{b1}$ may combine with each other to form a substituted or unsubstituted carbazole ring. In addition, $R_{a2}$ and $R_{b2}$ may combine with each other to form a substituted or unsubstituted carbazole ring. The condensed cyclic compound represented by Formula A may include at least one of a carbazole ring formed by bonding $R_{a1}$ and $R_{b1}$ to each other, and a carbazole ring formed by bonding $R_{a2}$ and $R_{b2}$ to each other.

In the compound represented by Formula A of an embodiment, at least two selected from among $X_1$ to $X_4$ may be $NR_7$, and the rest may be each independently O, S, or $CR_5R_6$. For example, the compound represented by Formula A of an embodiment may be represented by any one selected from among Formula A-1 to Formula A-6 below. However, embodiments of the present disclosure are not limited thereto.

Formula A-1

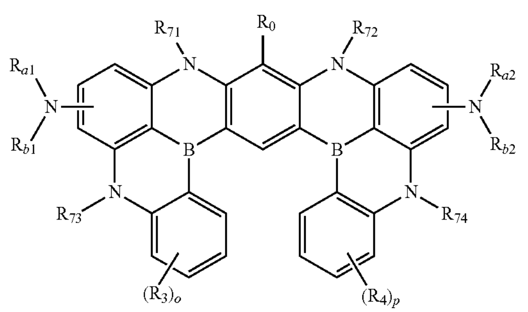

Formula A-2

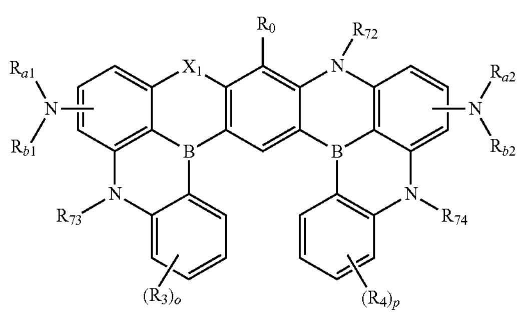

Formula A-3

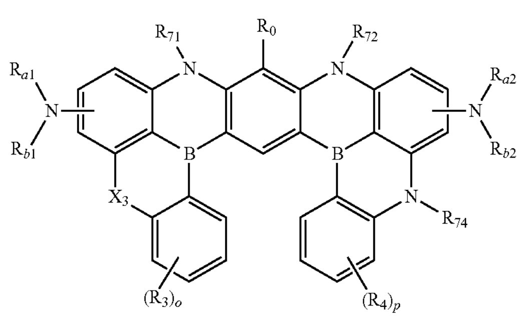

-continued

Formula A-4

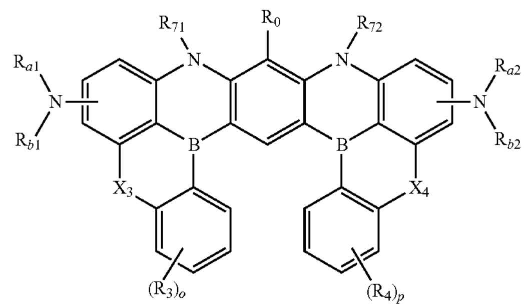

Formula A-5

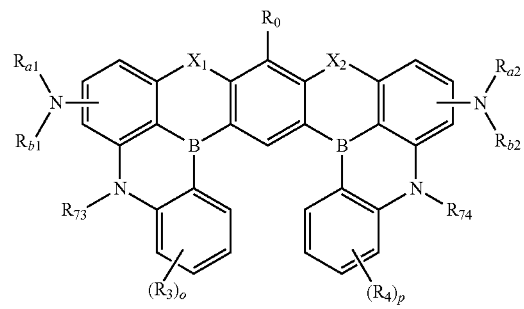

Formula A-6

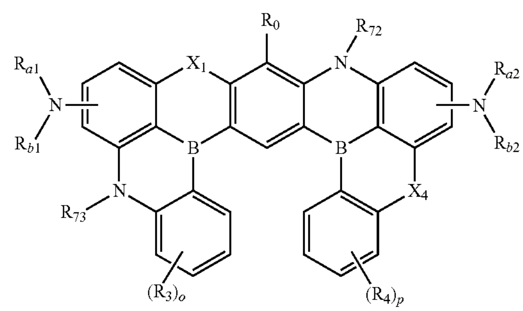

In Formulas A-1 to A-6, $R_{71}$ to $R_{74}$ each independently correspond to $R_7$ defined in Formula A. In addition, in Formula A-1 to Formula A-6 above, $X_1$ to $X_4$, $R_0$, $R_{a1}$, $R_{b1}$, $R_{a2}$, $R_{b2}$, $R_3$, $R_4$, o, and p may be the same as those defined with respect to Formula A as described above.

For example, the condensed cyclic compound represented by Formula A of an embodiment may be represented by Formula A-a below. However, embodiments of the present disclosure are not limited thereto.

Formula A-a

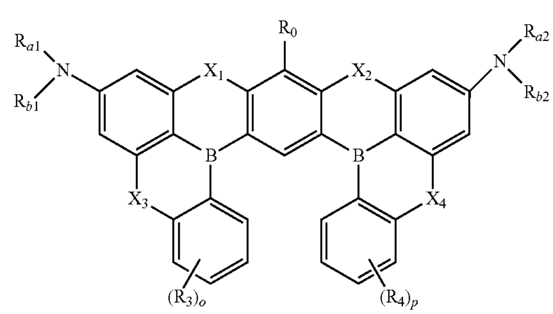

In Formula A-a above, $X_1$ to $X_4$, $R_0$, $R_{a1}$, $R_{b1}$, $R_{a2}$, $R_{b2}$, $R_3$, $R_4$, o, and p may be the same as those defined with respect to Formula A as described above.

The condensed cyclic compound represented by Formula 1 or Formula A of an embodiment may be represented by any one selected from among the compounds of Compound Group 1 below. The light emitting device ED may include at least one selected from among the condensed cyclic compounds of Compound Group 1 below in the emission layer EML.

Compound Group 1

1

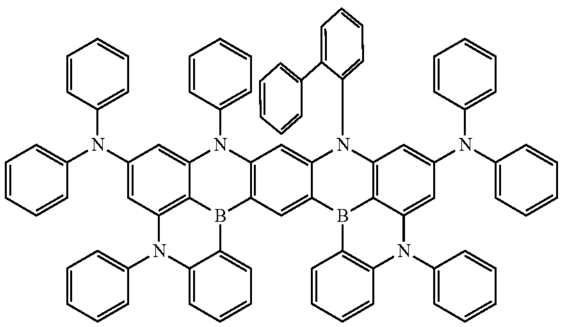

2

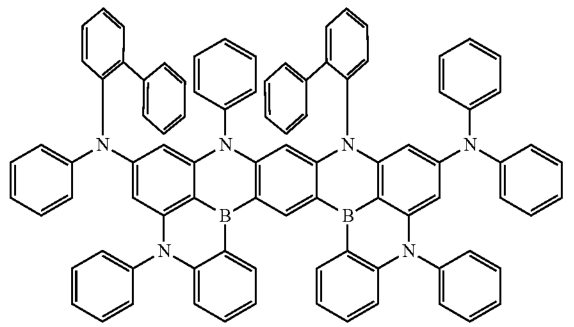

3

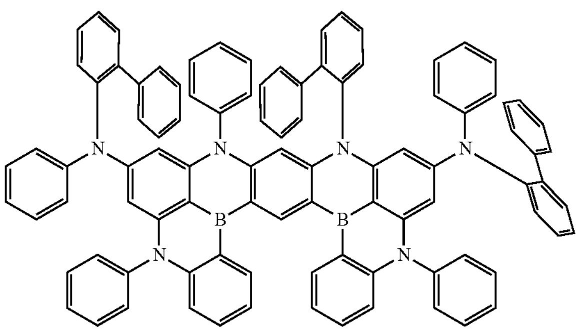

4

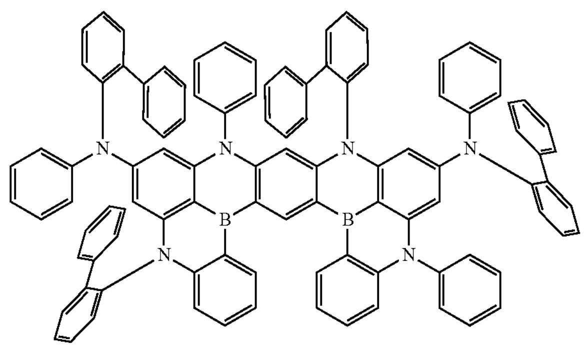

5

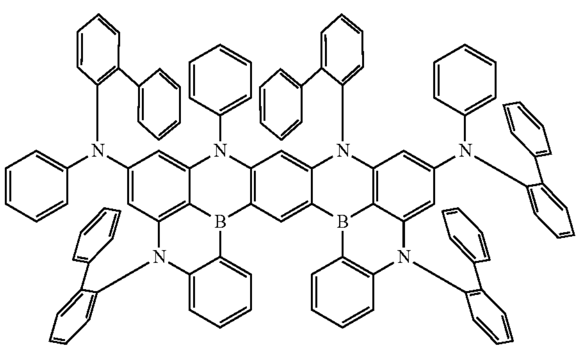

6

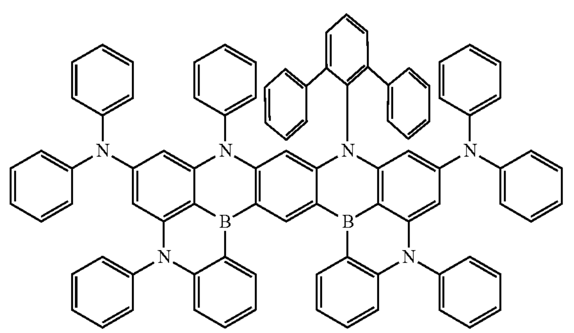

7

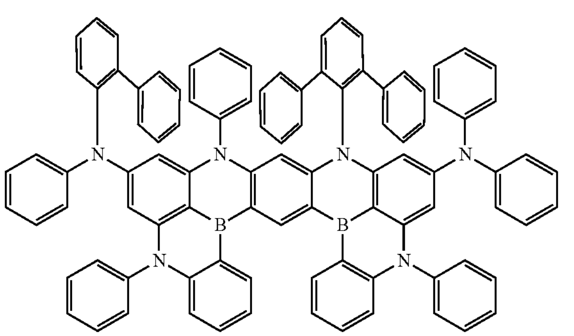

8

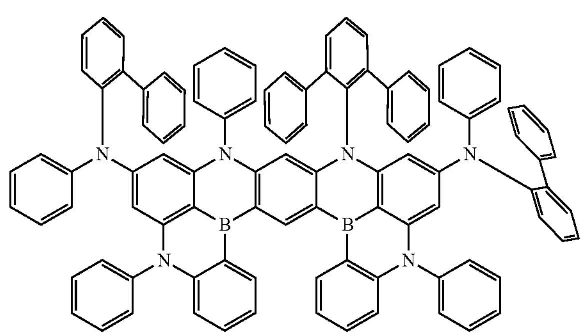

-continued
9
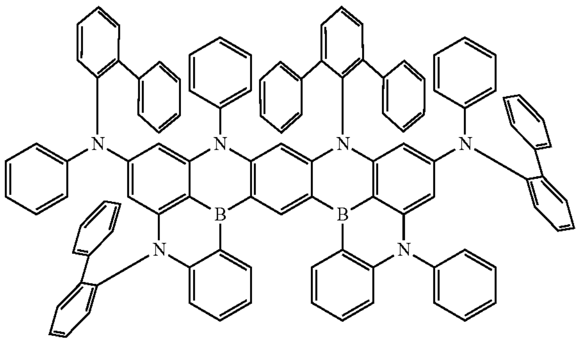
10
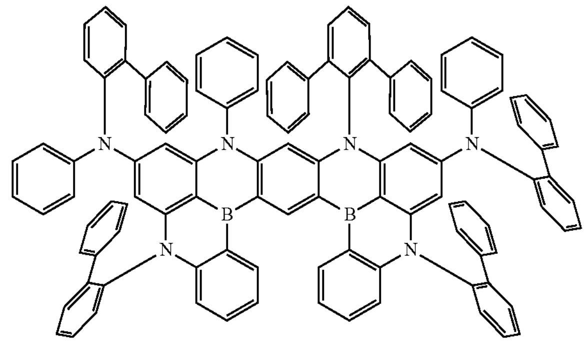
11
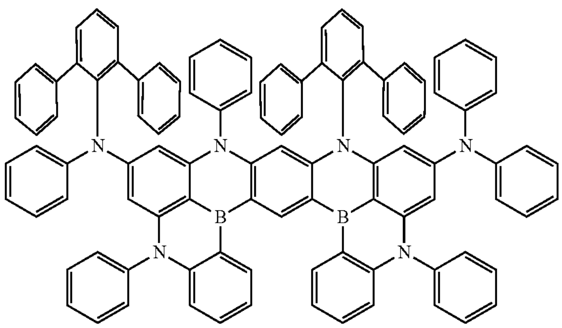
12
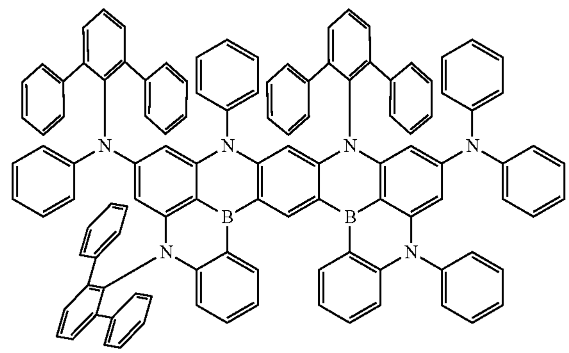
13
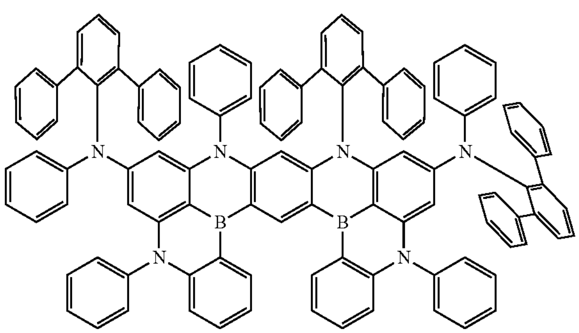
14
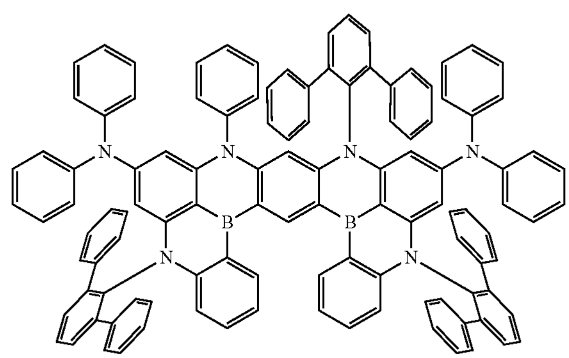
15
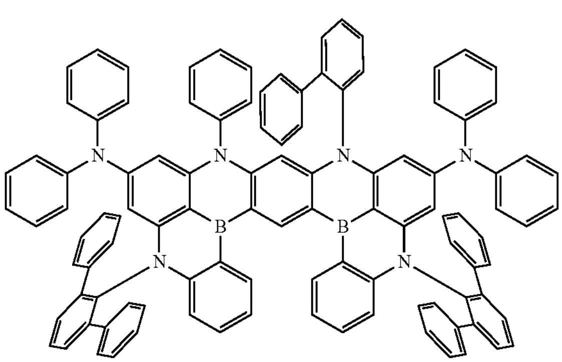
16
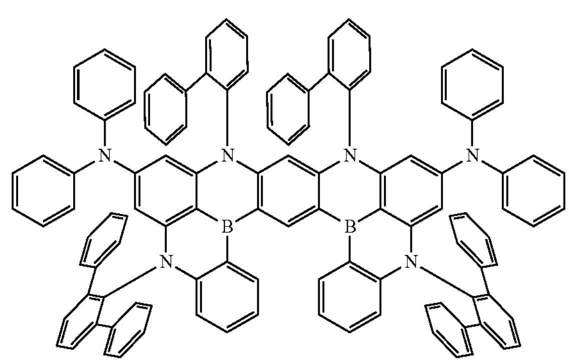

-continued
17
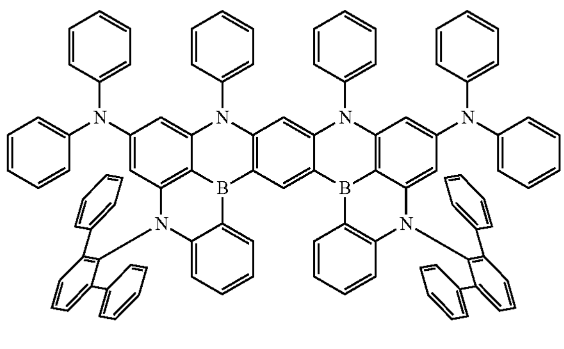
18
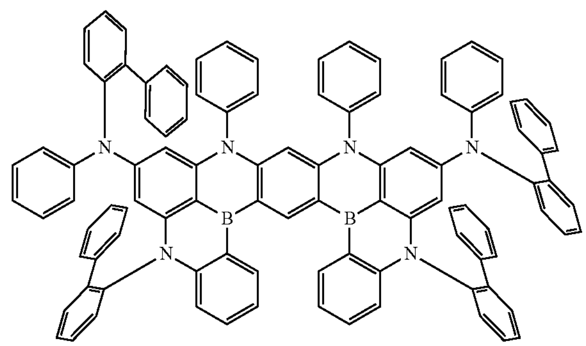
19
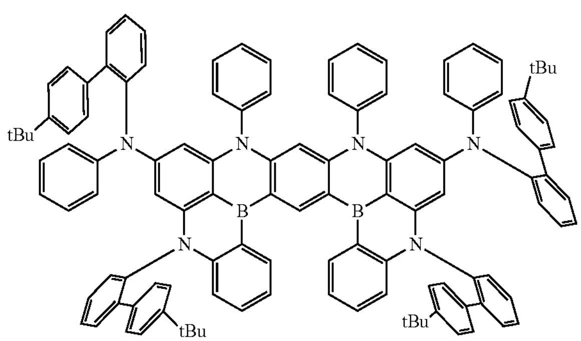
20
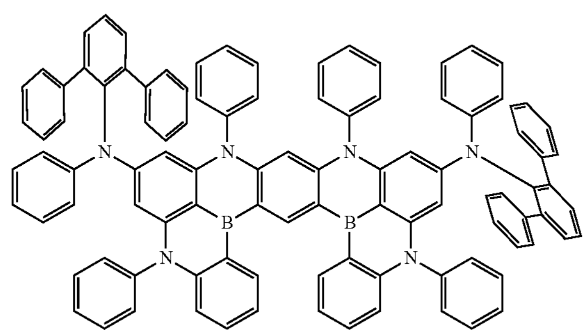
21
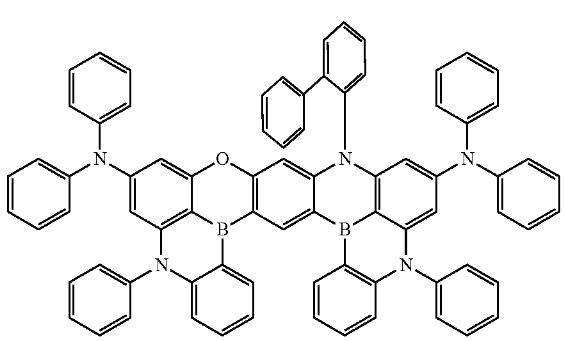
22
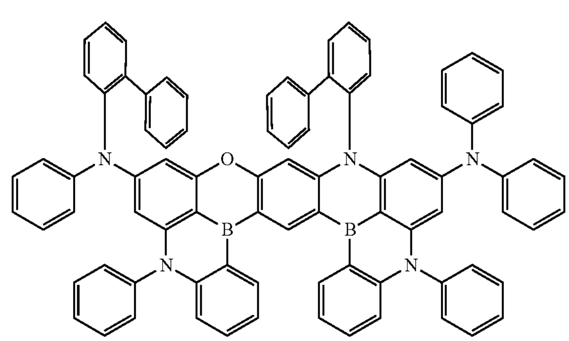
23
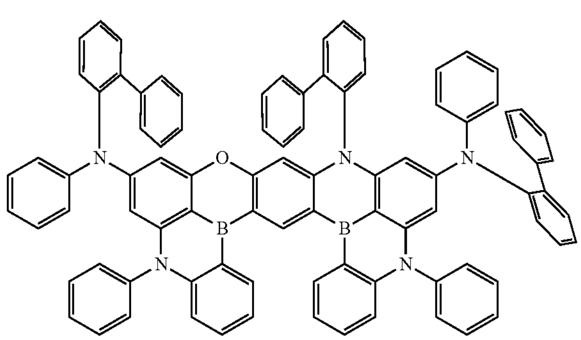
24
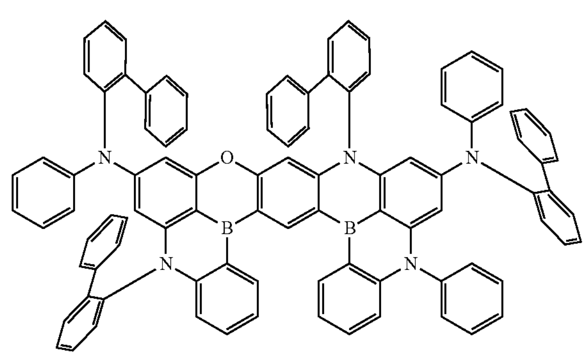

-continued
25
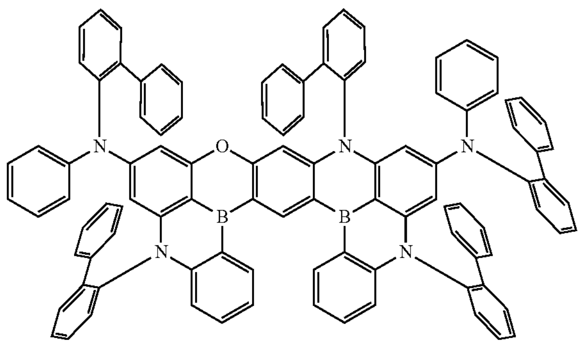
26
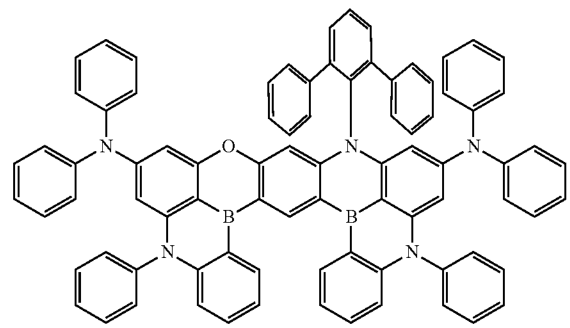
27
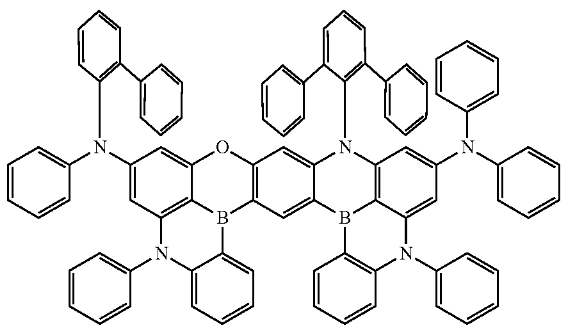
28
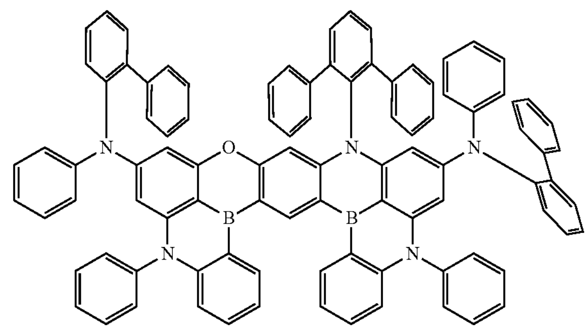
29
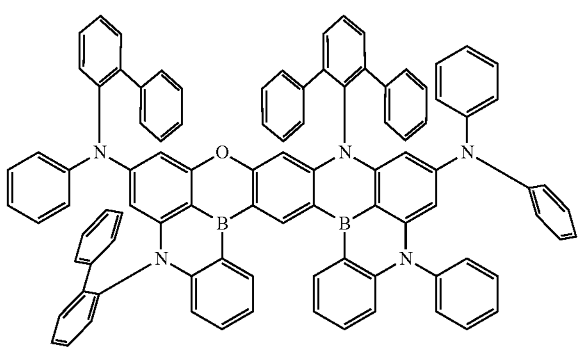
30
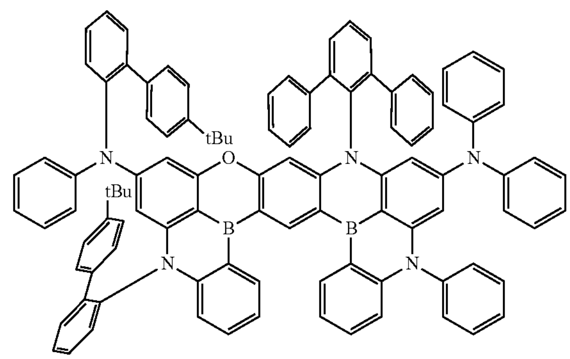
31
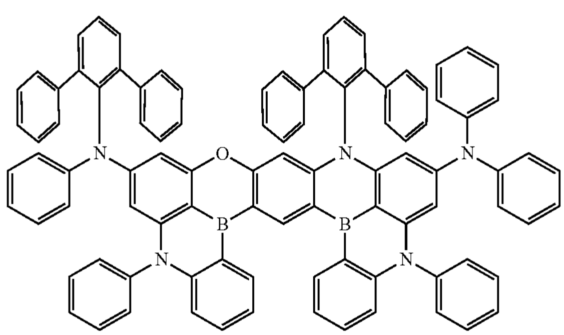
32
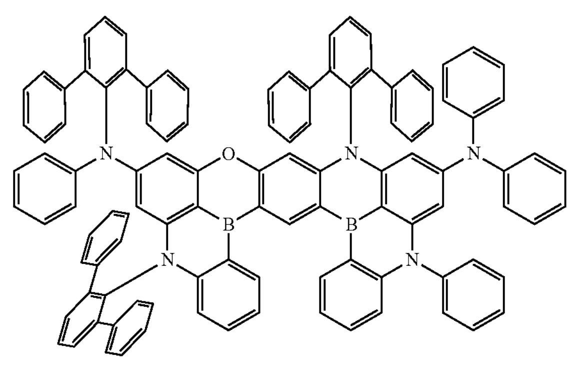

-continued
33
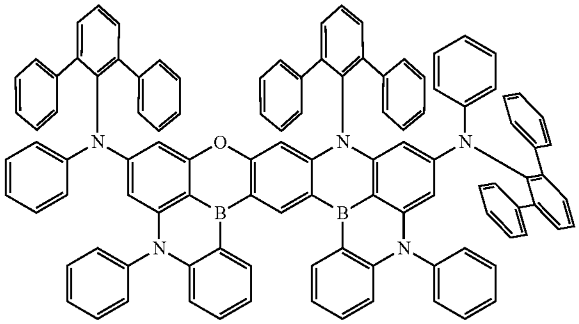
34
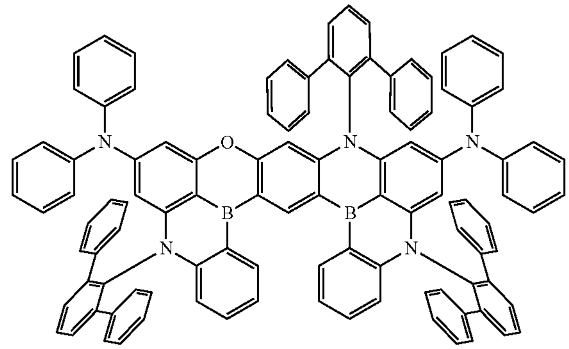
35
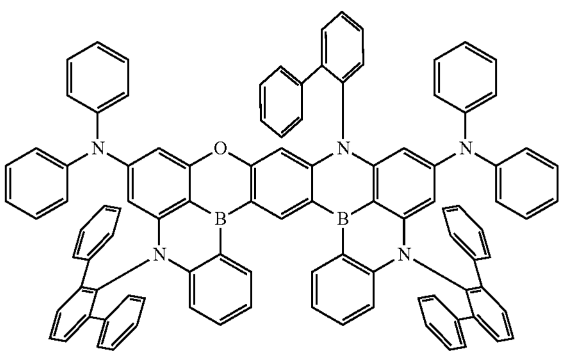
36
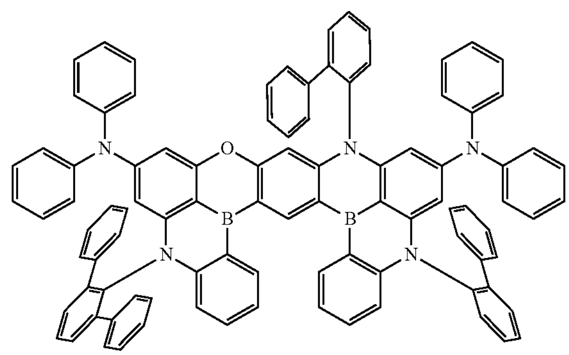
37
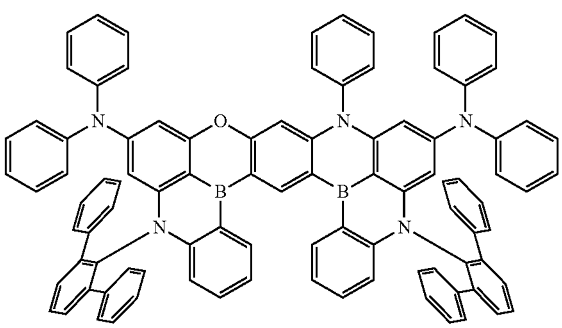
38
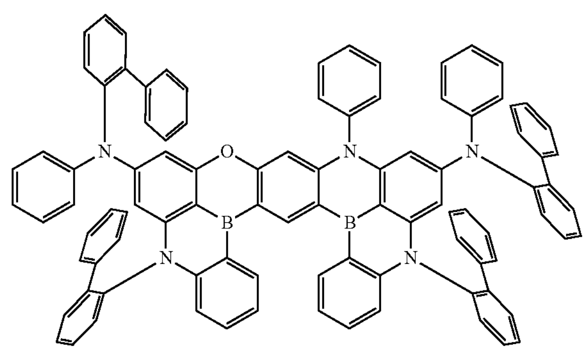
39
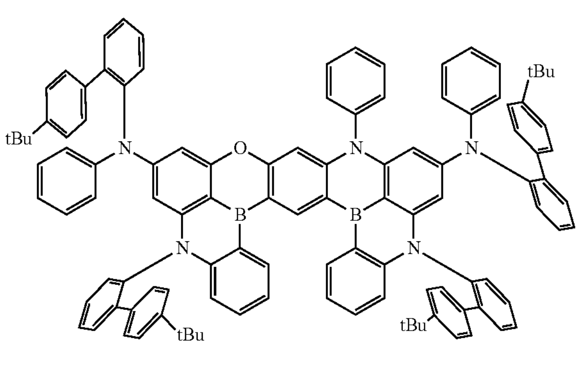
40
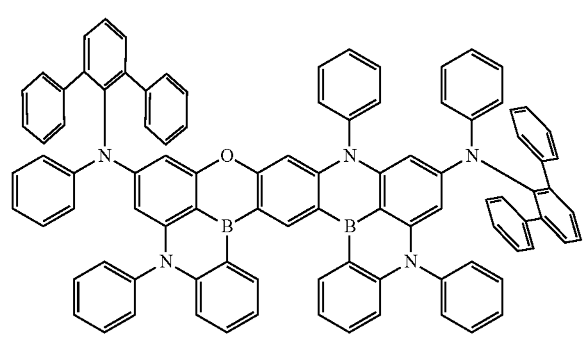

-continued
41
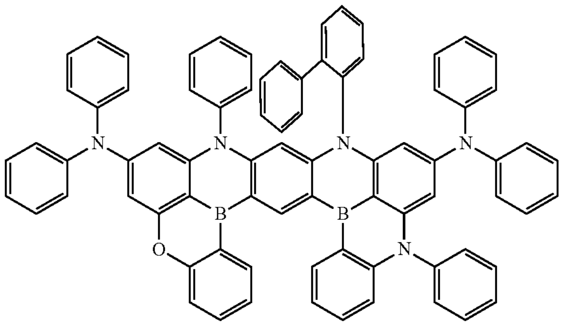
42
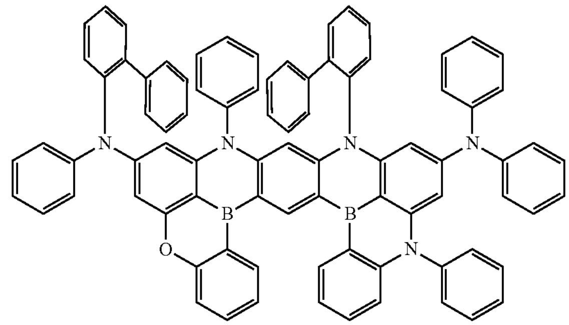
43
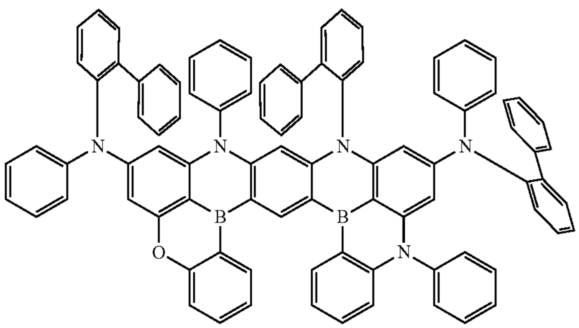
44
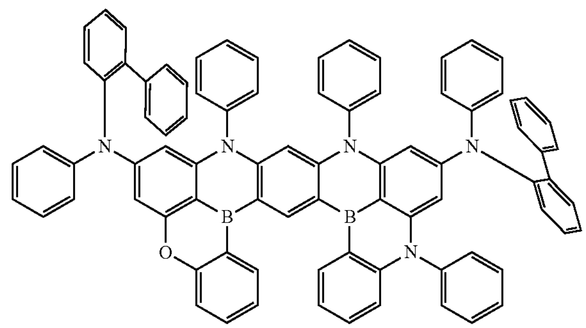
45
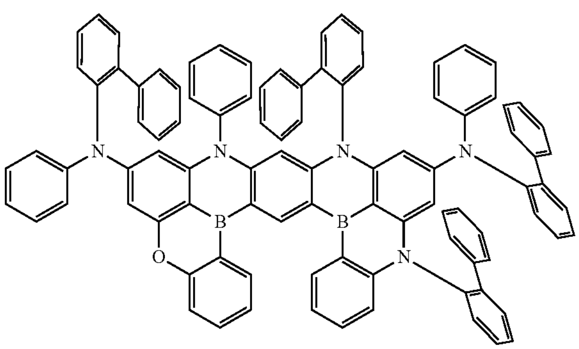
46
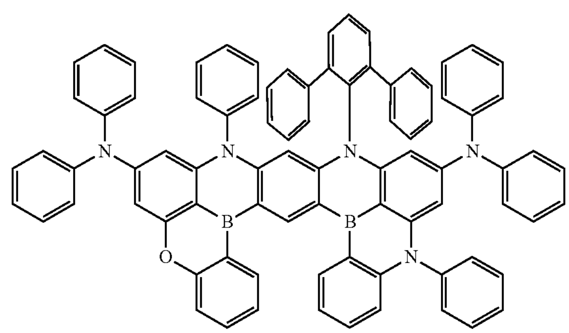
47
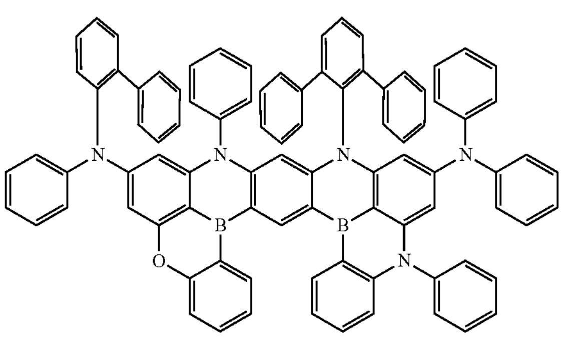
48
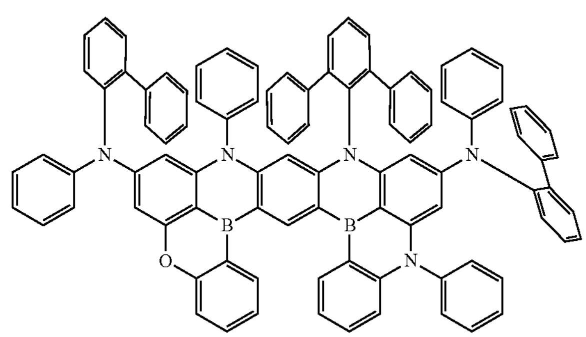

-continued
49
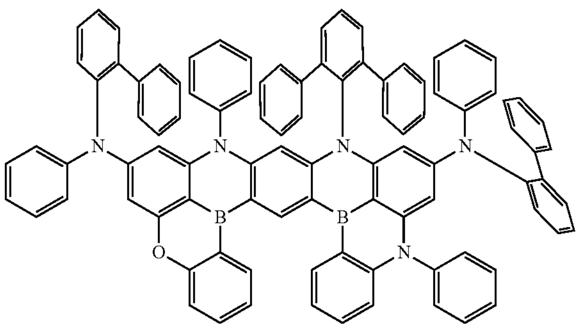
50
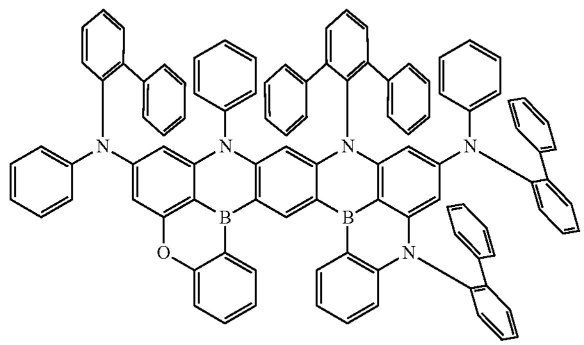
51
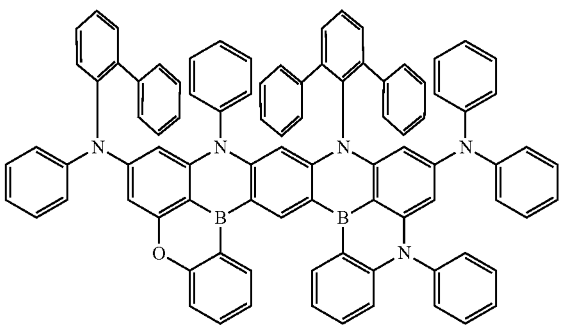
52
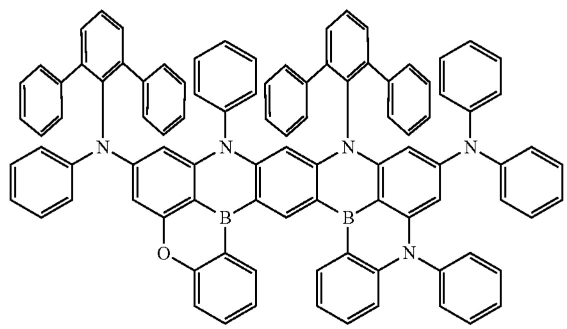
53
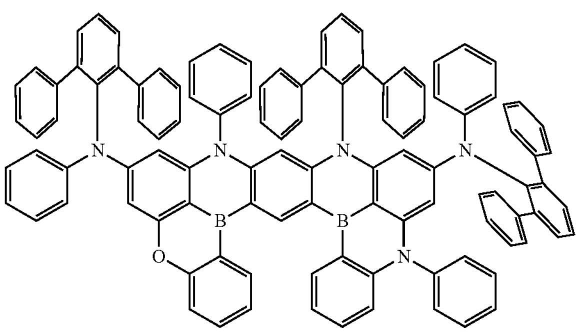
54
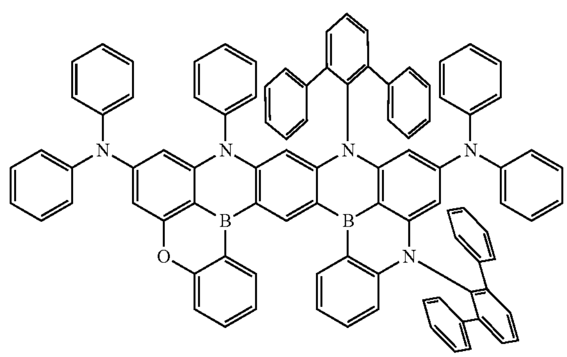
55
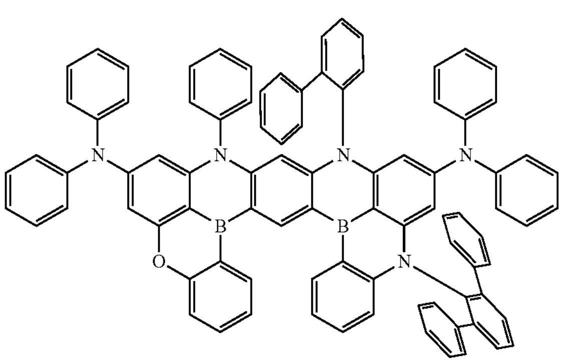
56
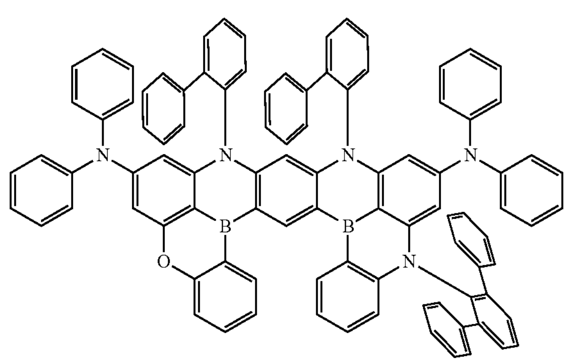

-continued
57
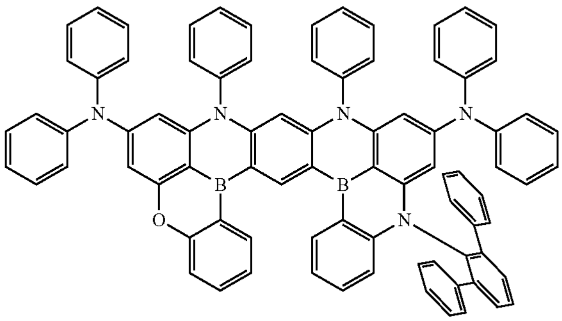
58
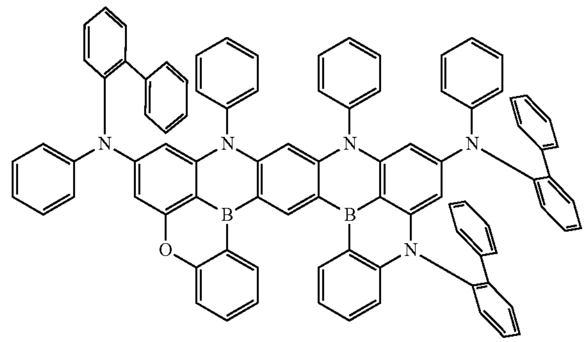
59
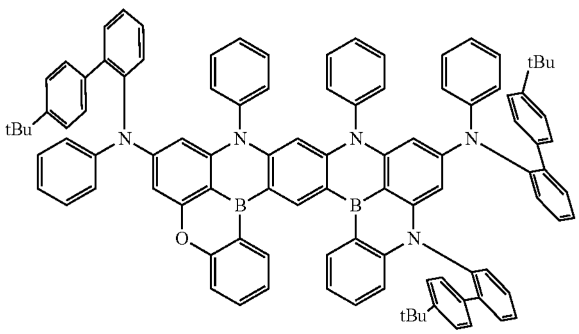
60
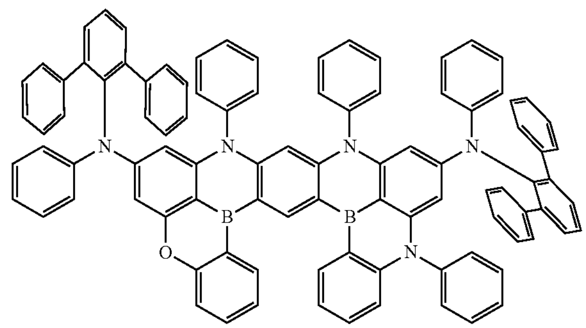
61
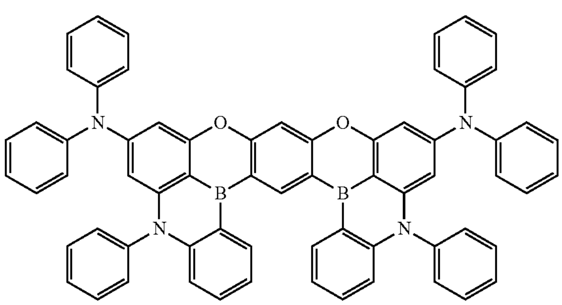
62
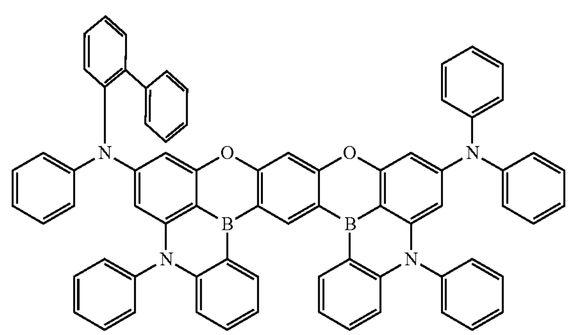
63
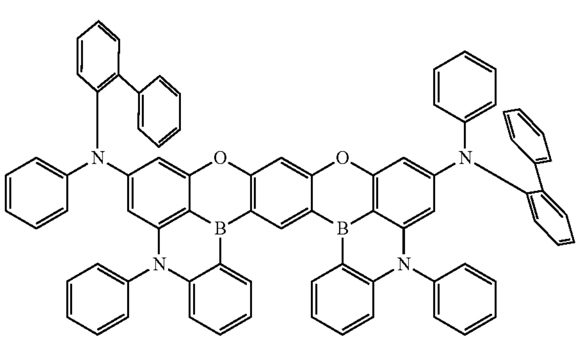
64
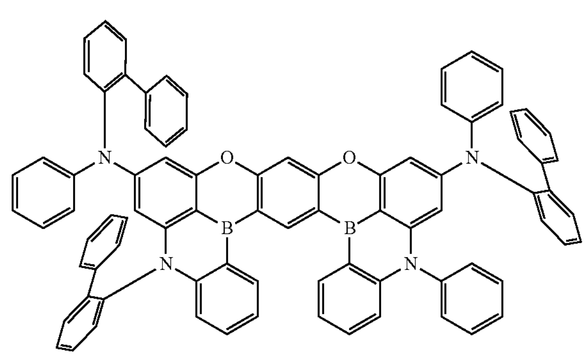

-continued
65
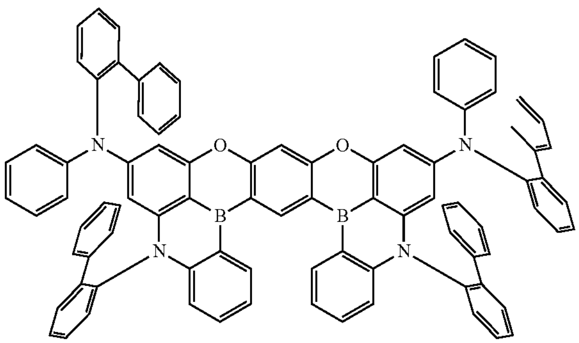
66
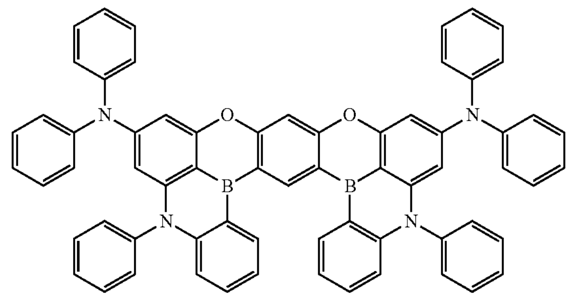
67
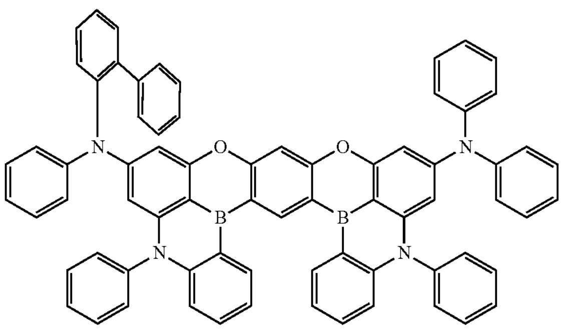
68
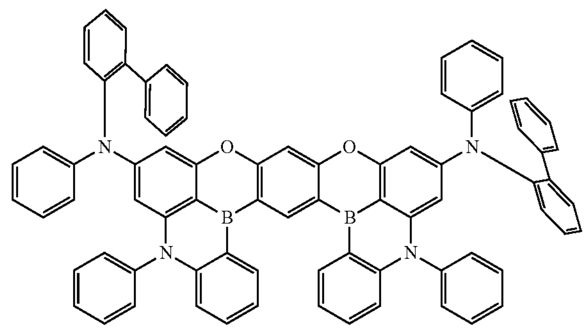
69
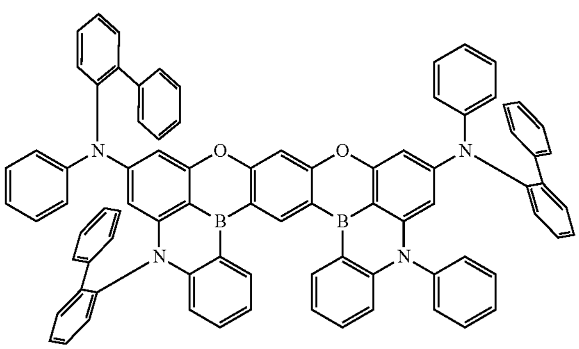
70
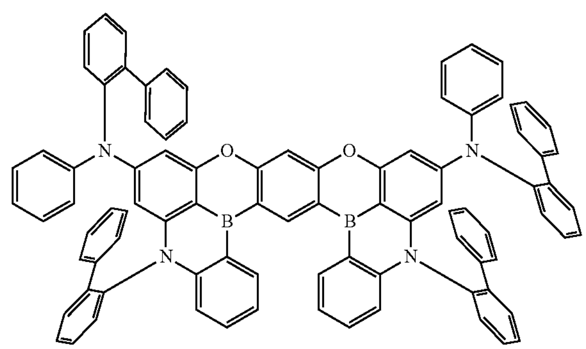
71
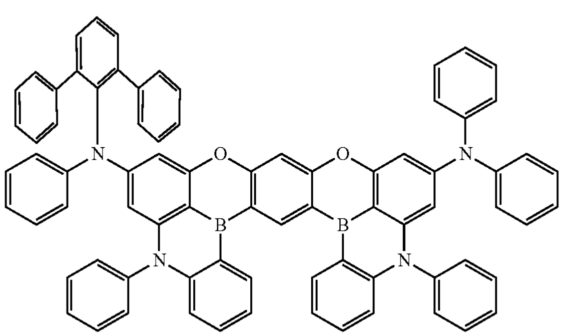
72
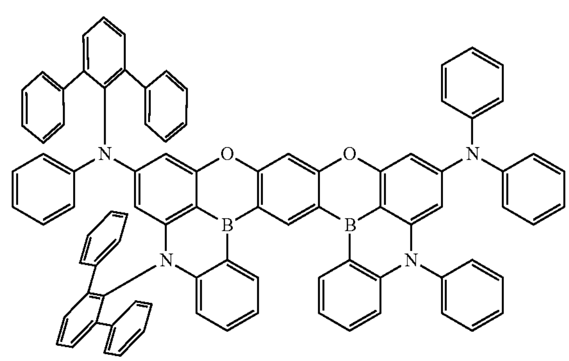

-continued
73
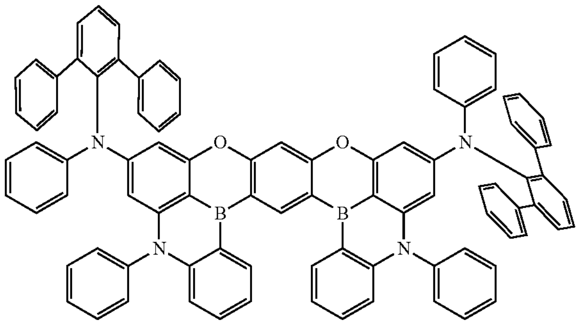
74
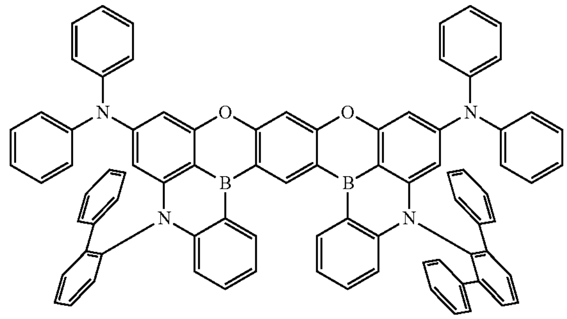
75
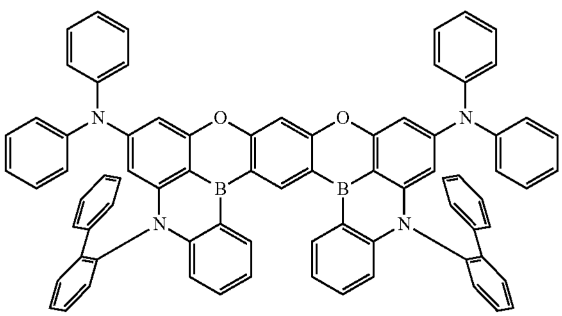
76
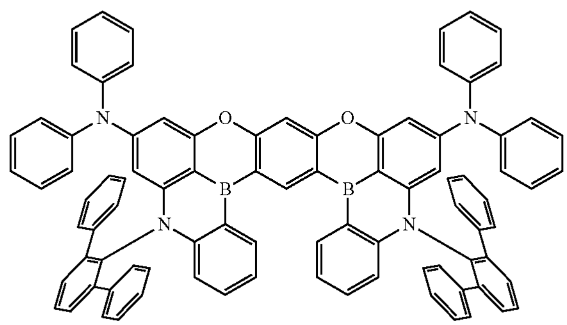
77
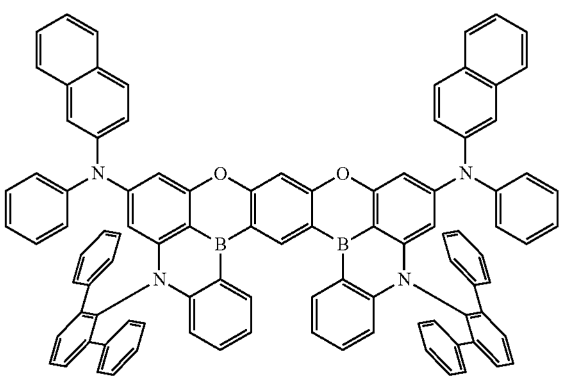
78
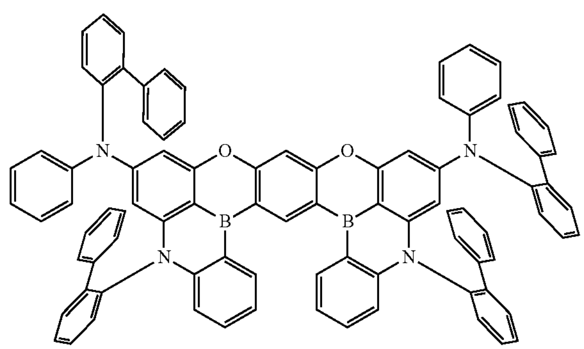
79
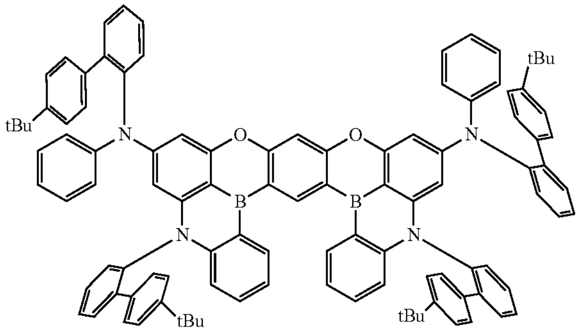
80
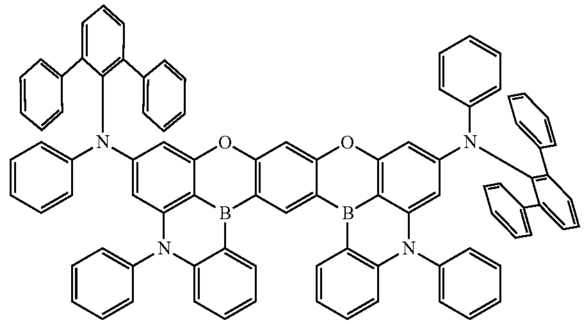

-continued
81
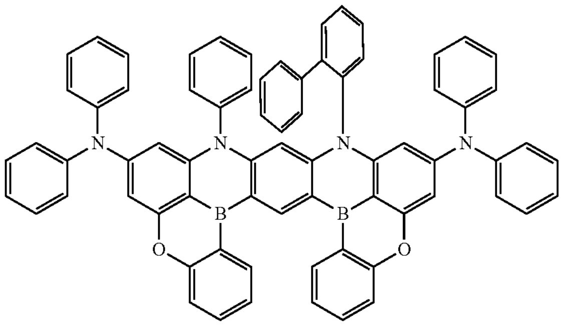
82
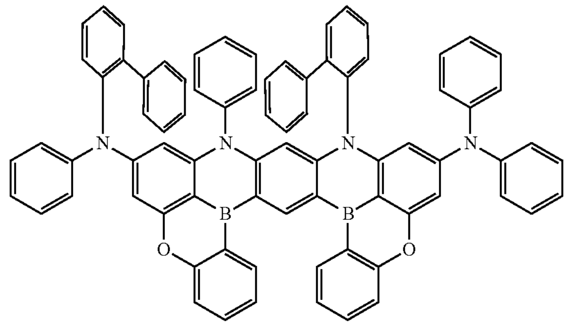
83
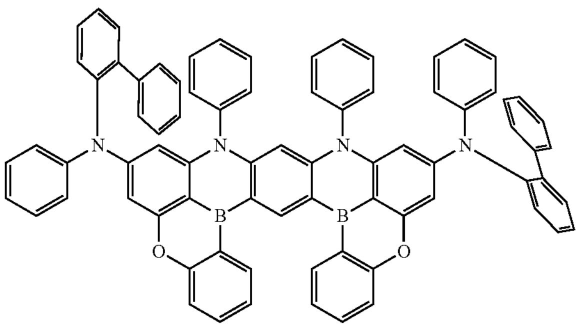
84
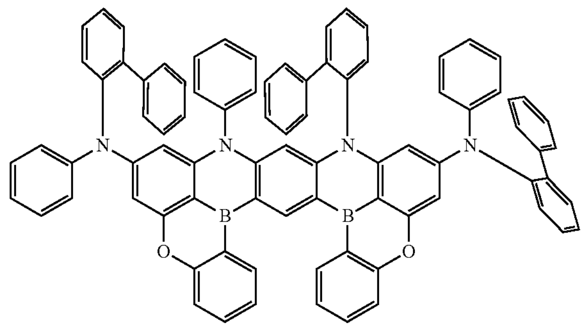
85
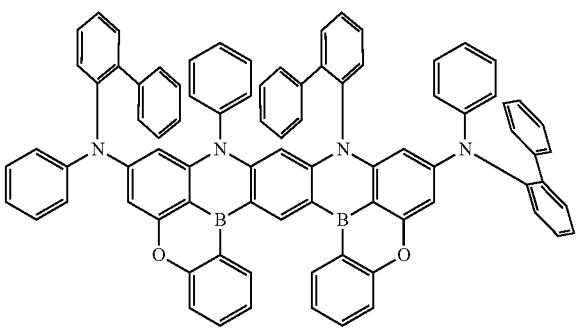
86
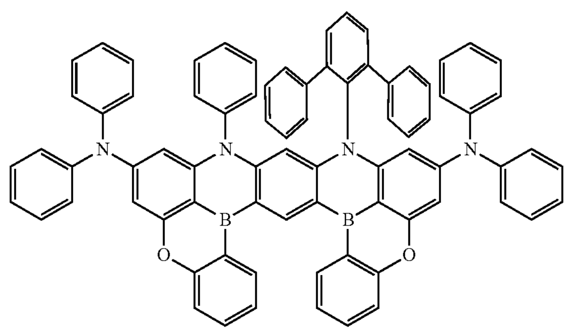
87
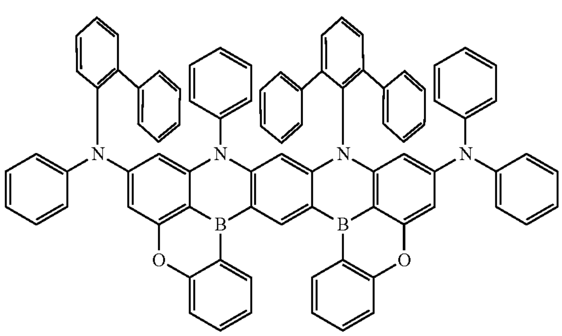
88
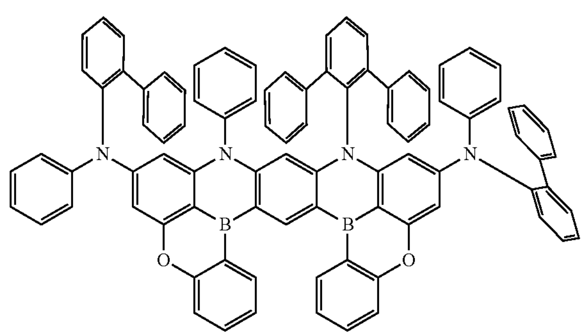

-continued
89
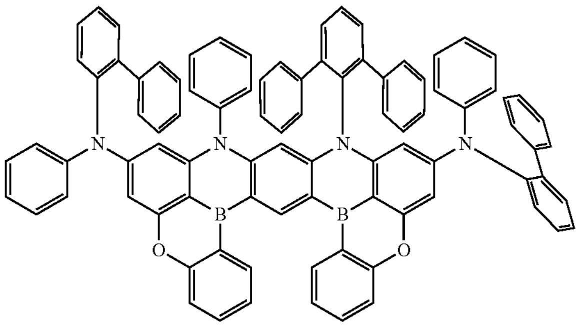
90
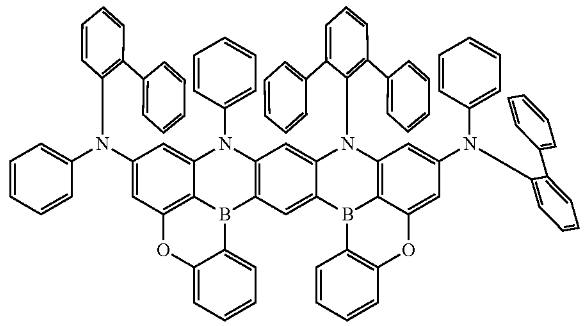
91
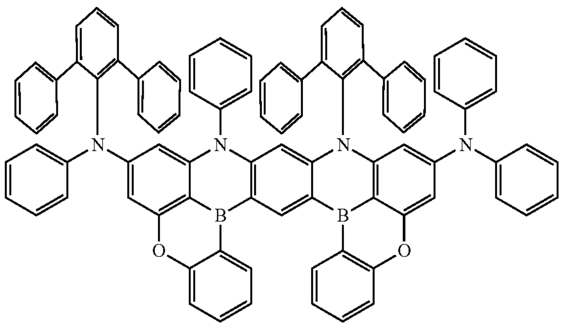
92
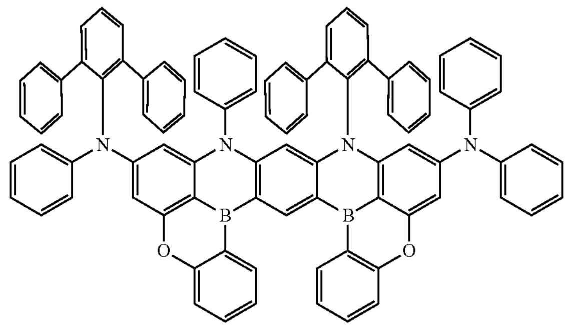
93
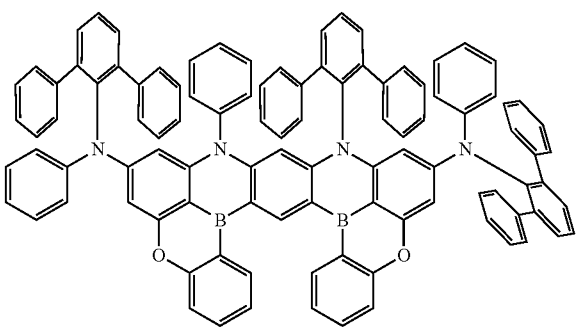
94
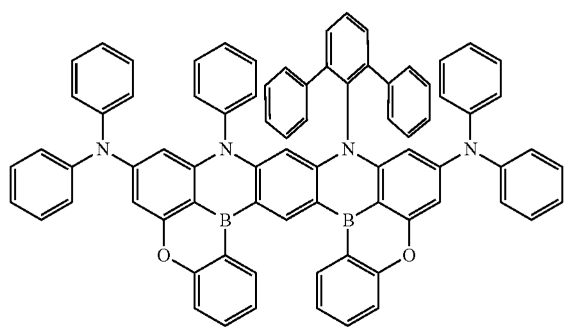
95
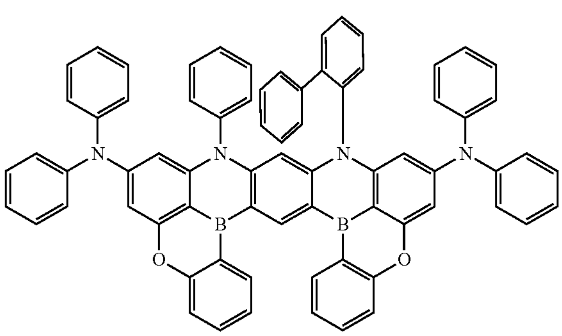
96
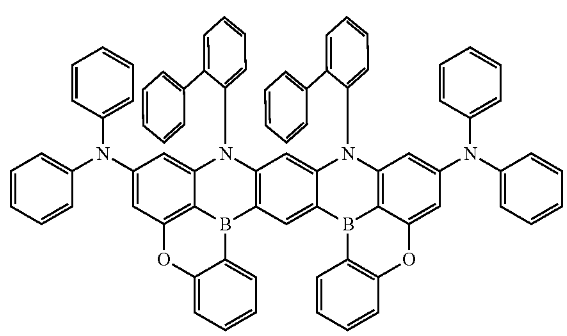

-continued
97
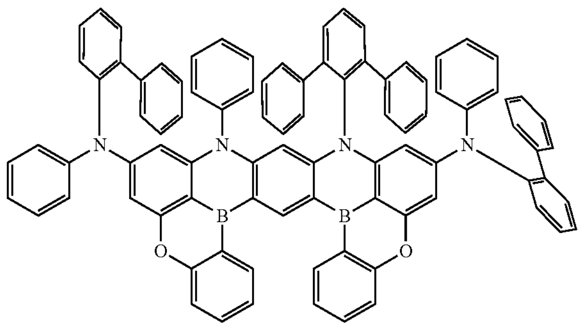
98
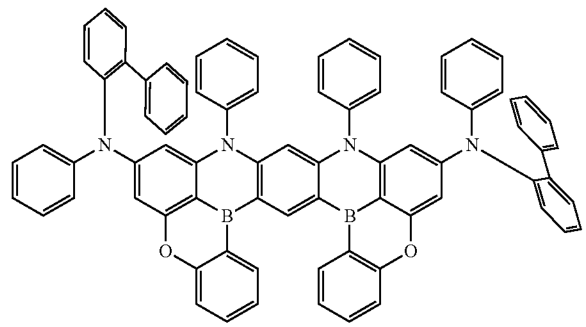
99
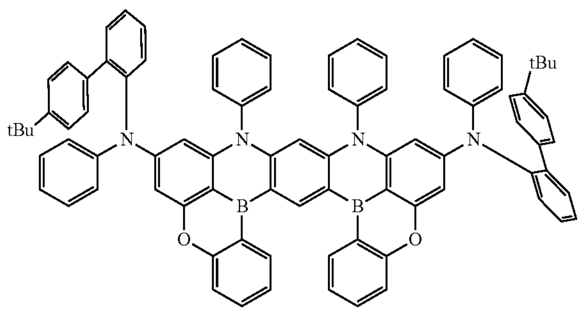
100
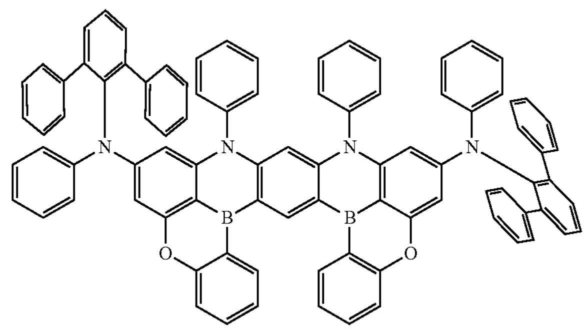
101
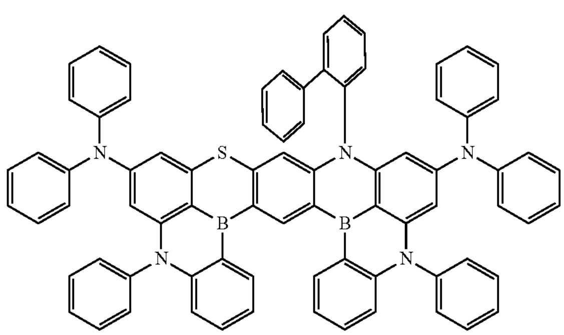
102
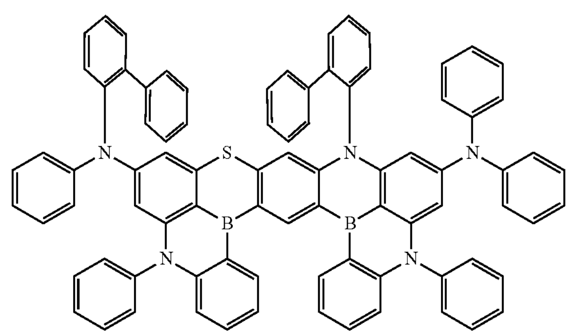
103
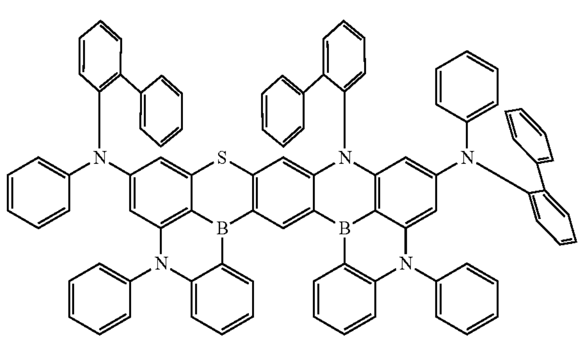
104
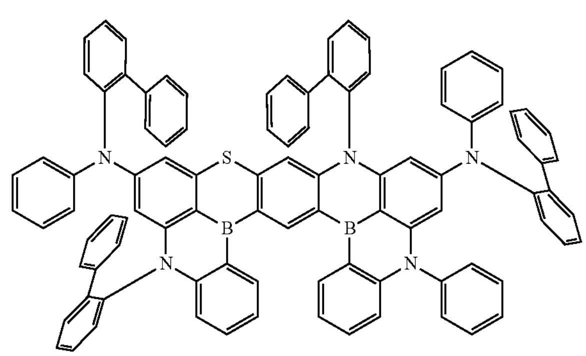

-continued
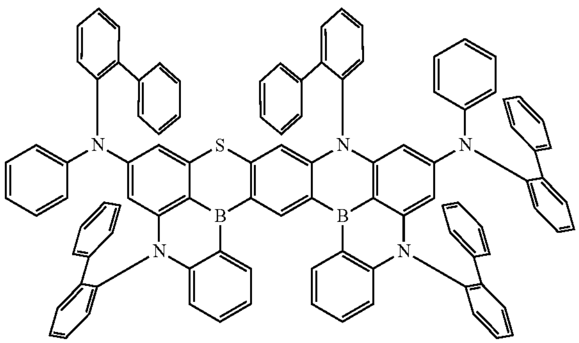
105
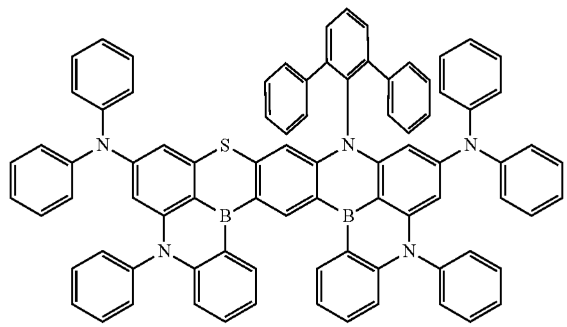
106
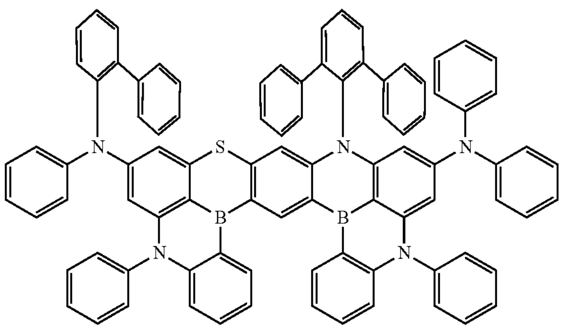
107
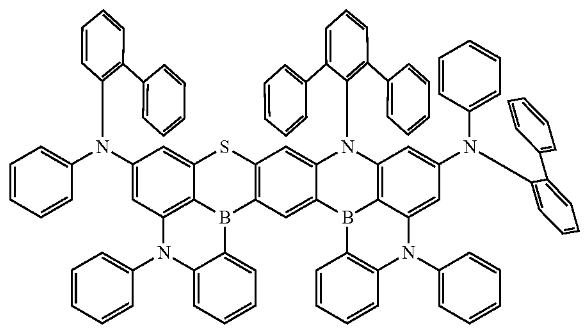
108
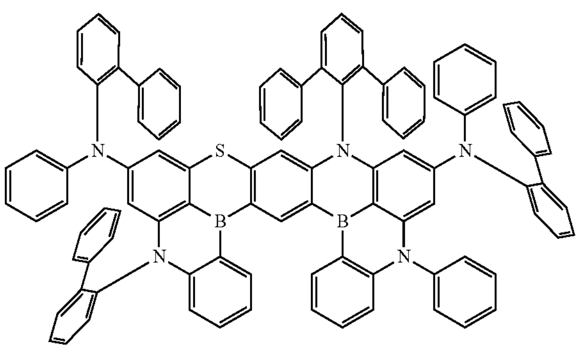
109
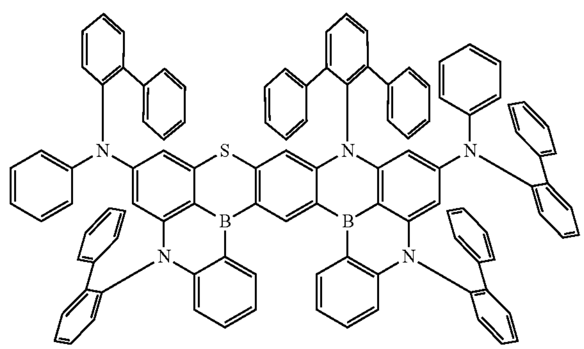
110
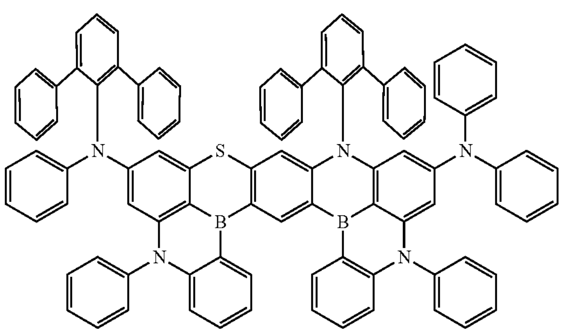
111
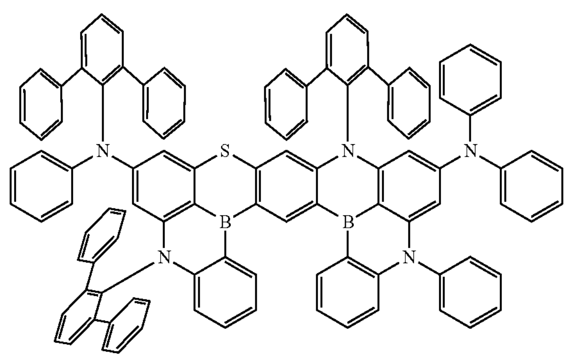
112

-continued
113
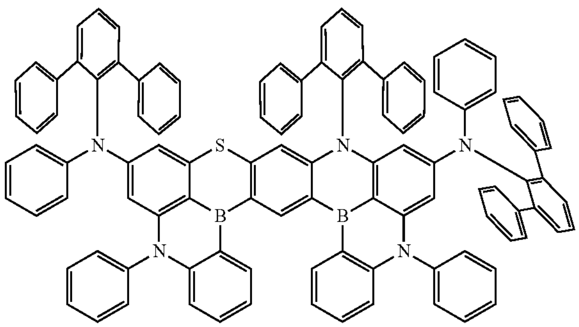
114
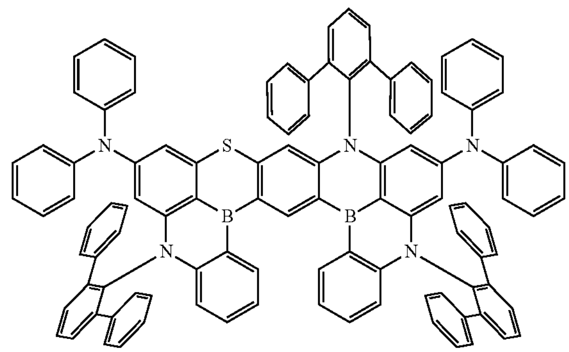
115
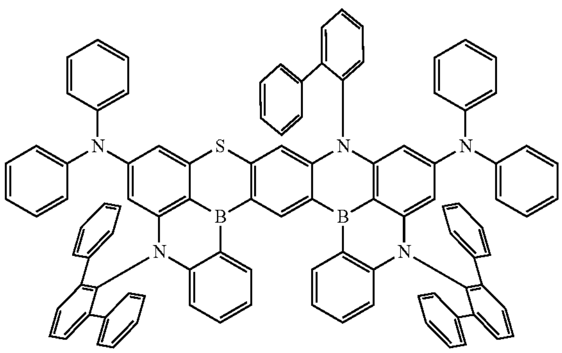
116
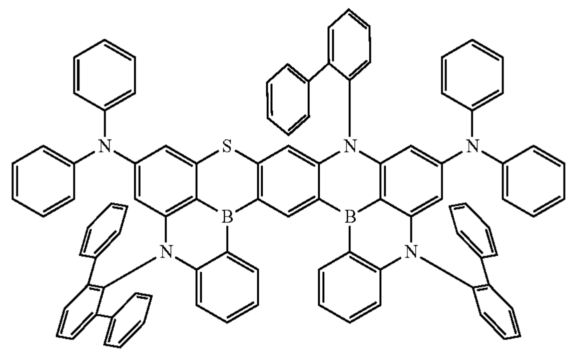
117
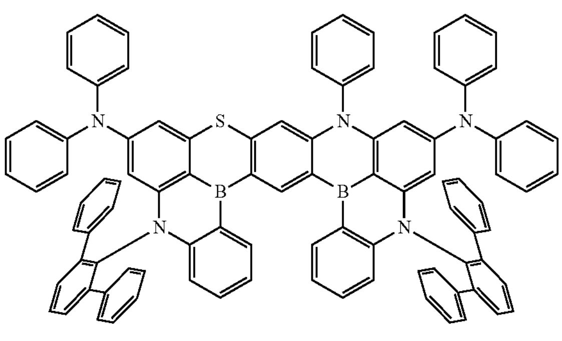
118
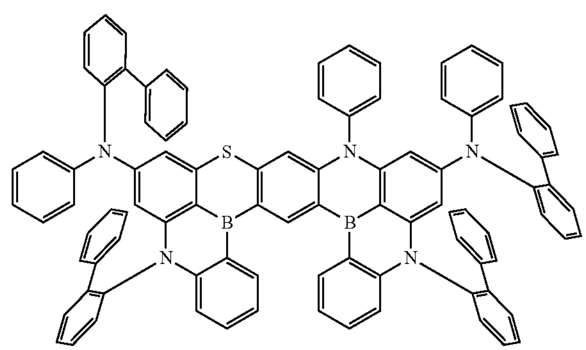
119
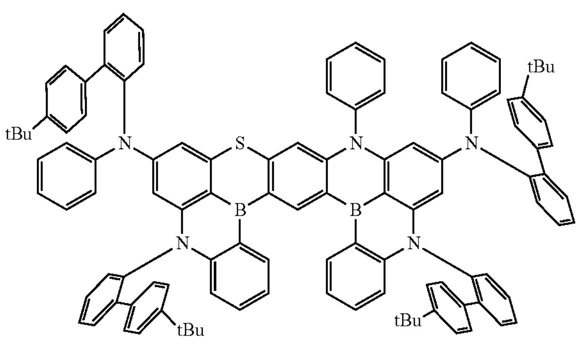
120
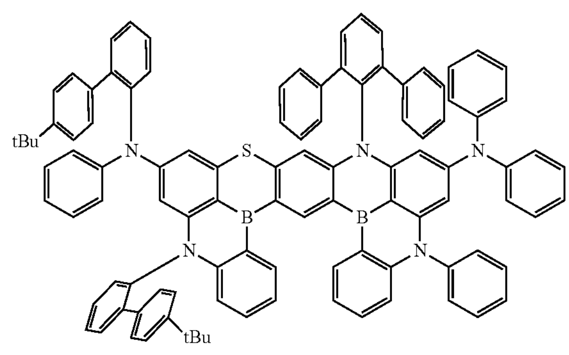

-continued
121
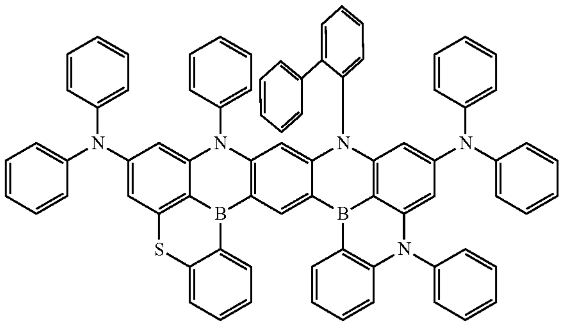
122
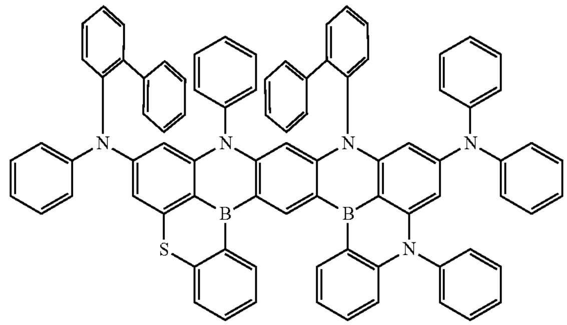
123
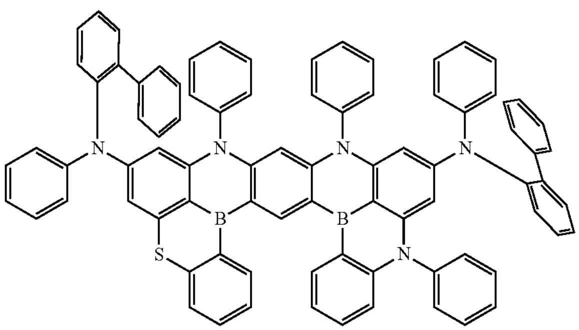
124
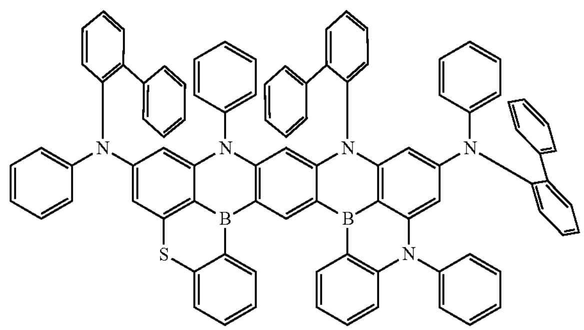
125
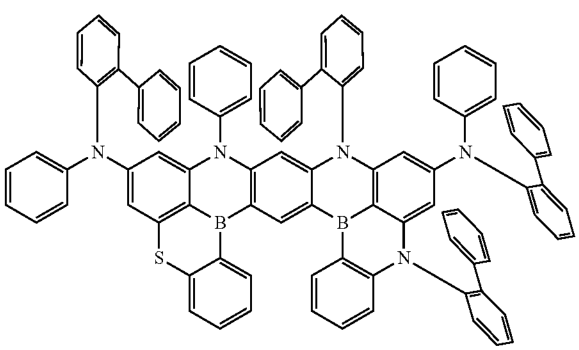
126
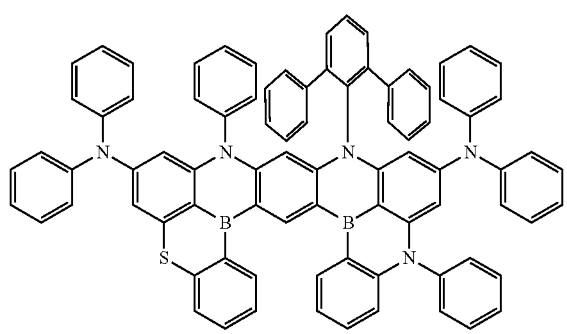
127
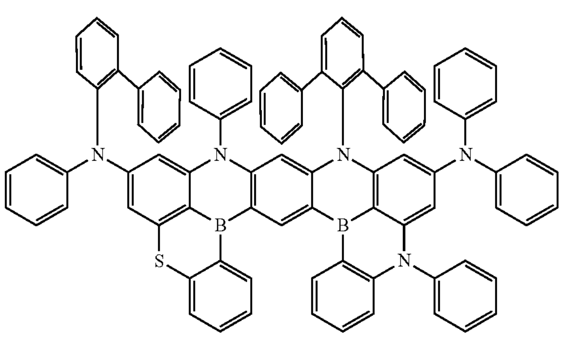
128
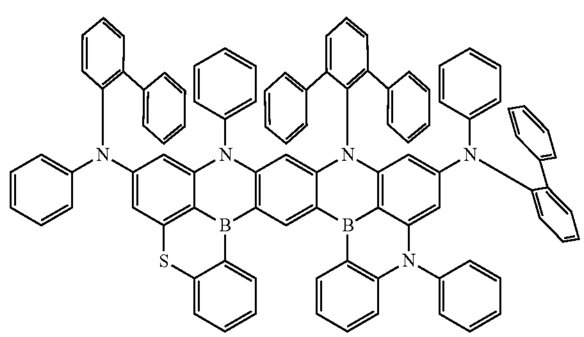

-continued
129
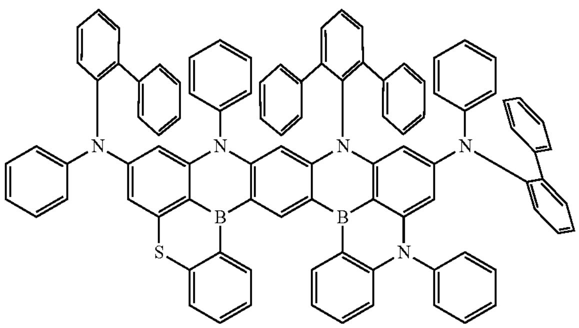
130
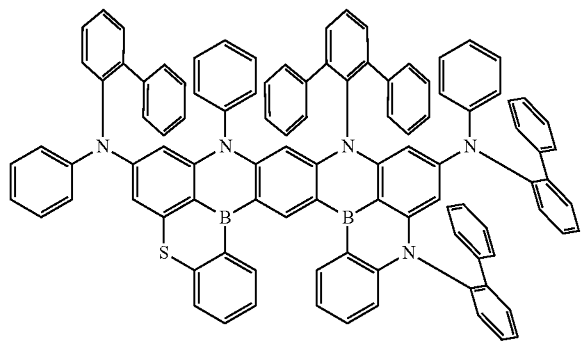
131
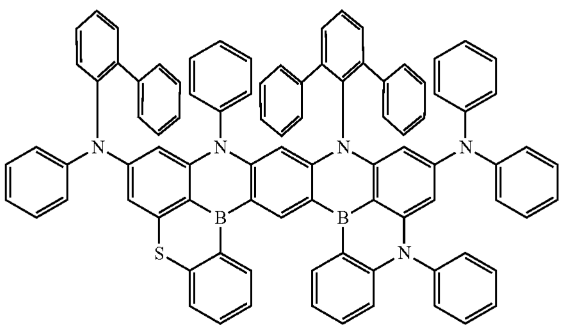
132
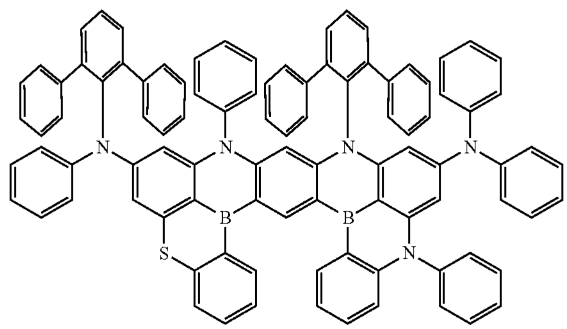
133
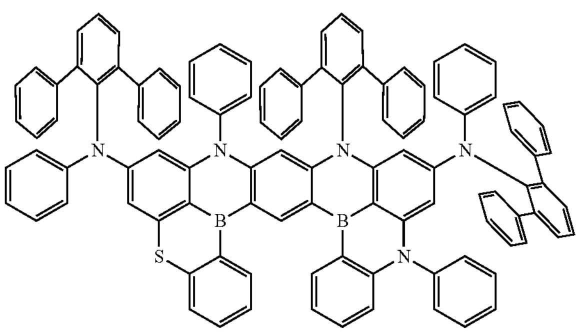
134
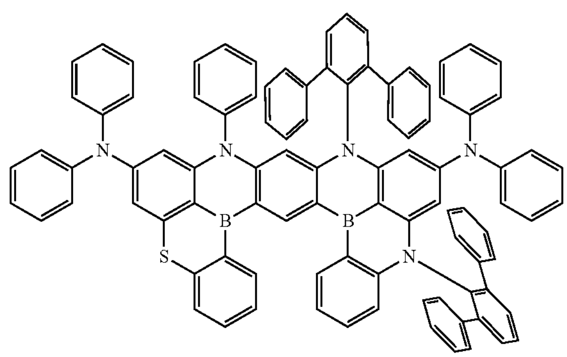
135
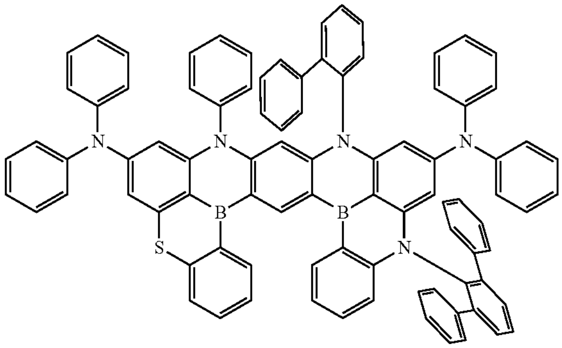
136
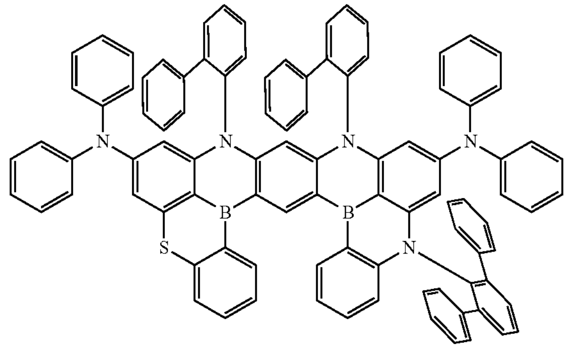

-continued
137
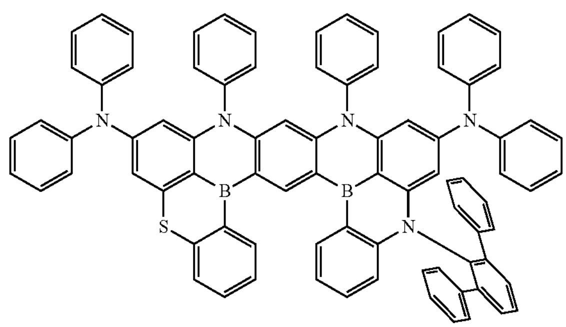
138
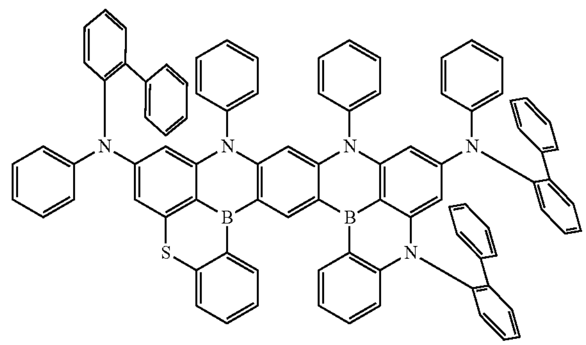
139
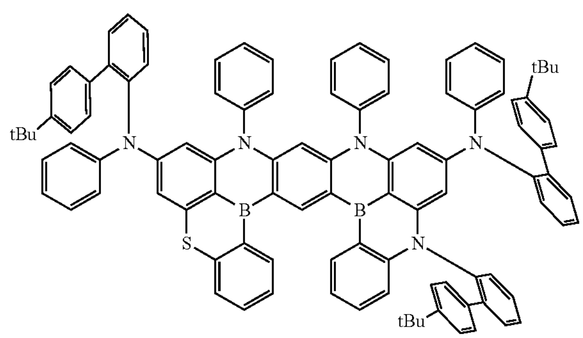
140
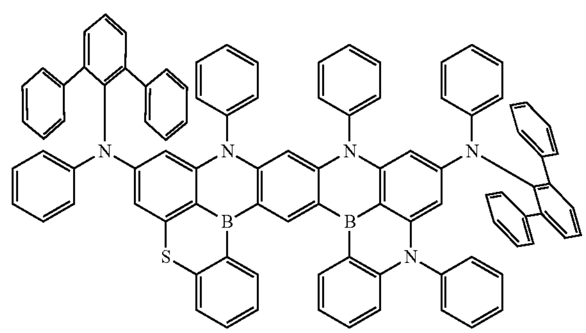
141
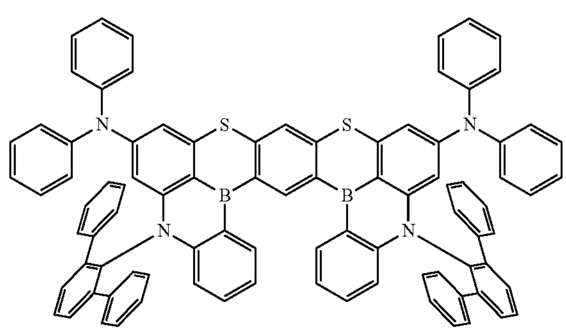
142
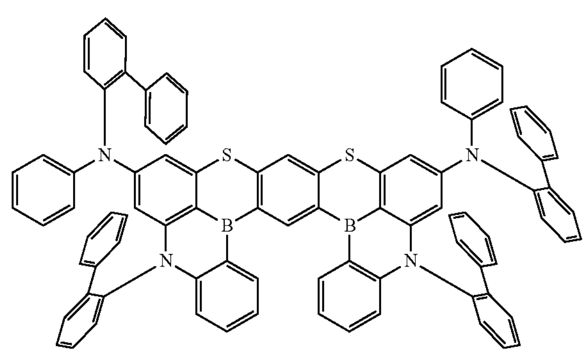
143
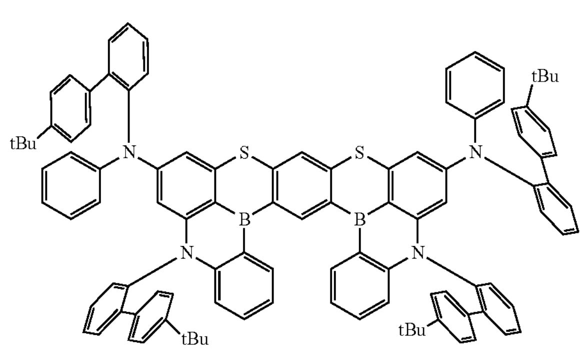
144
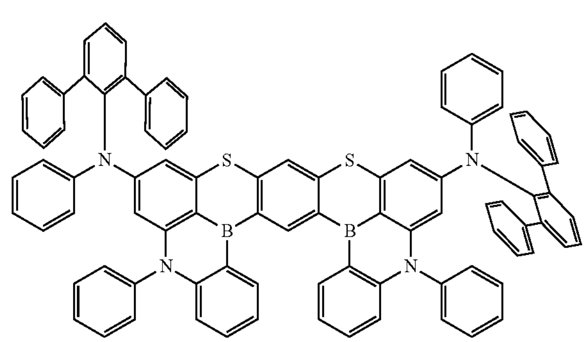

-continued
145
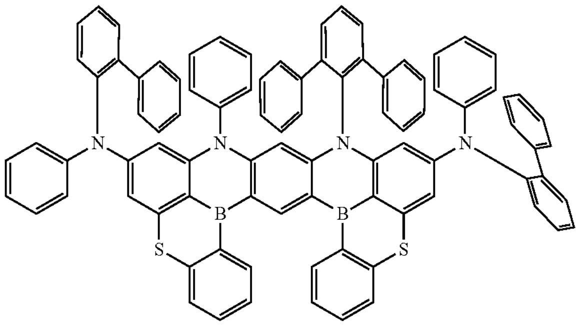
146
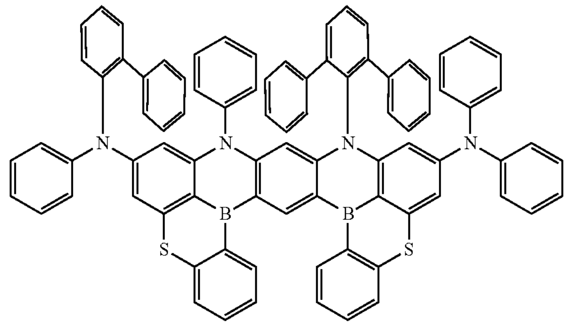
147
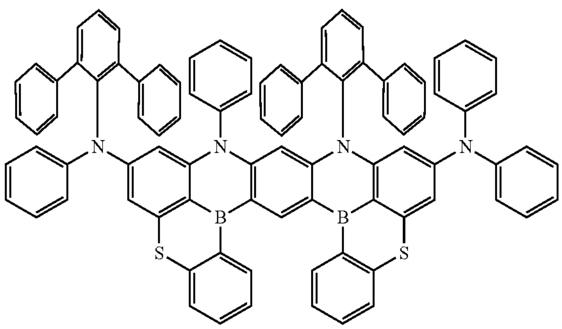
148
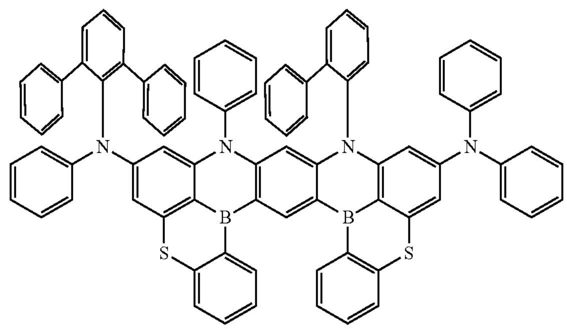
149
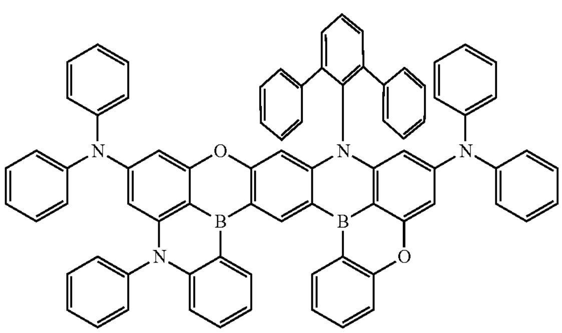
150
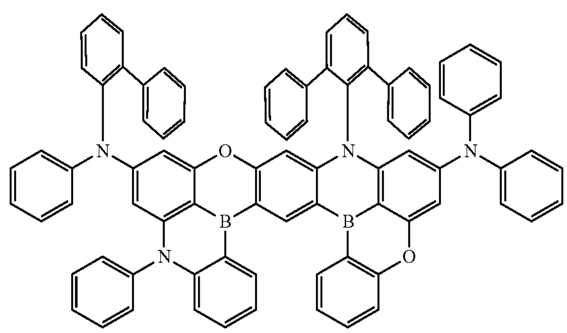
151
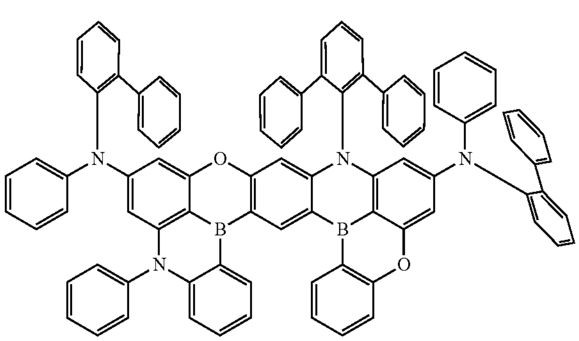
152
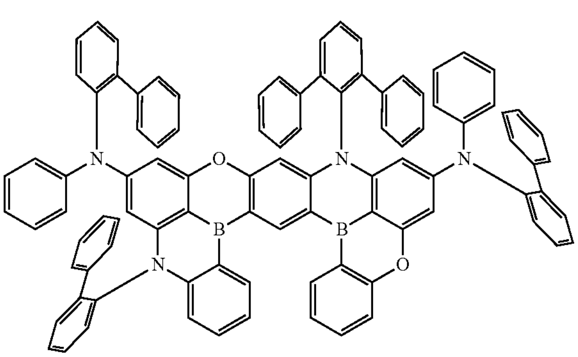

-continued
153
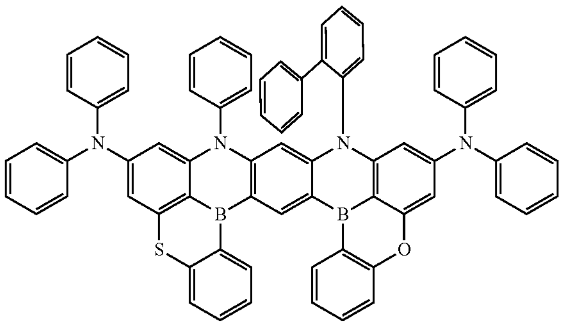
154
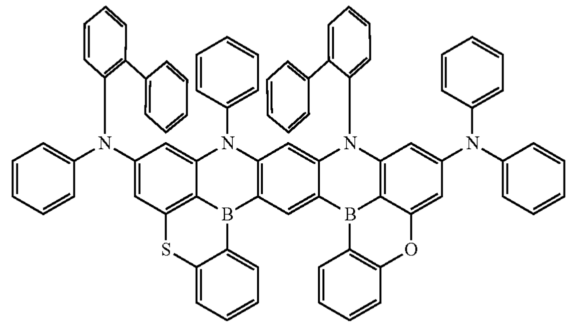
155
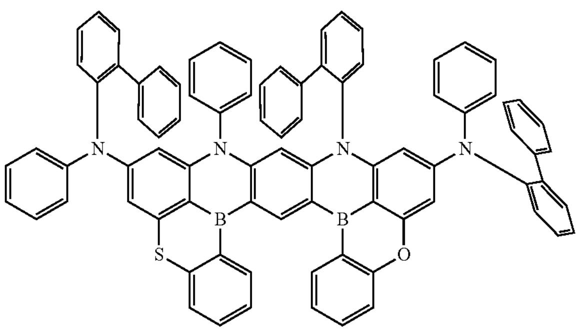
156
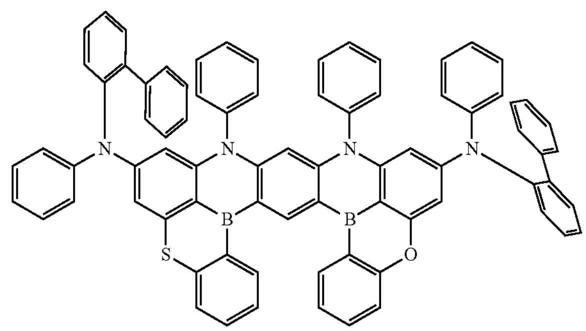
157
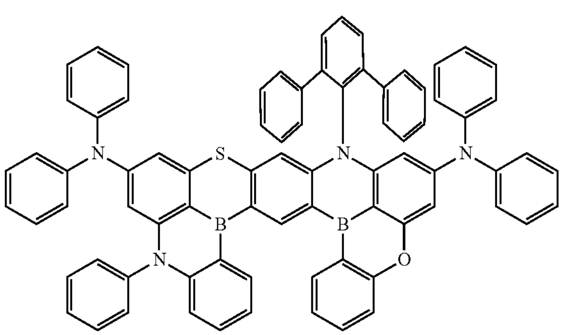
158
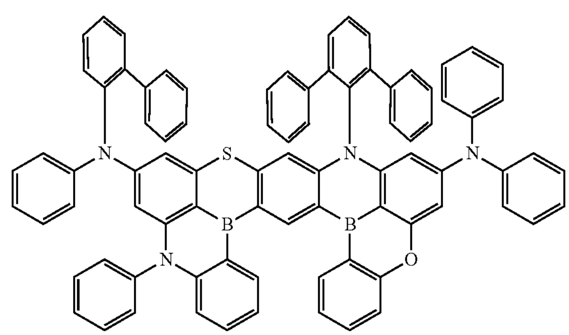
159
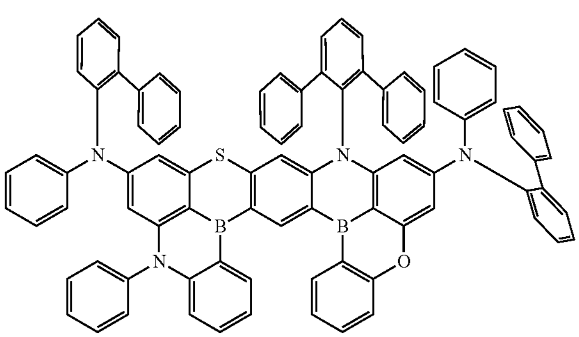
160
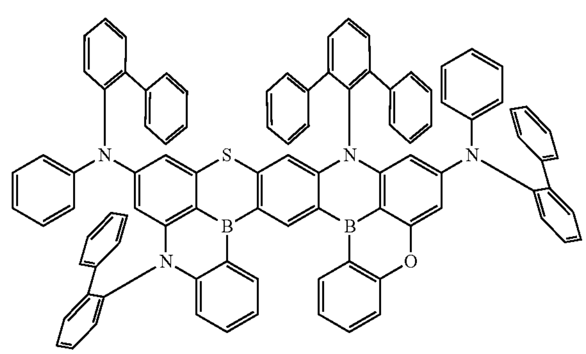

-continued
161
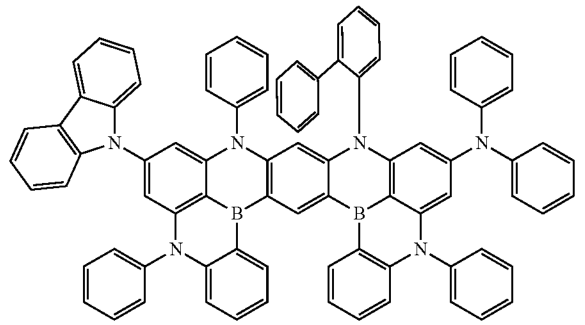
162
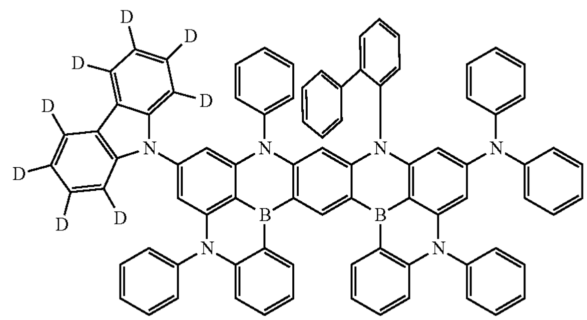
163
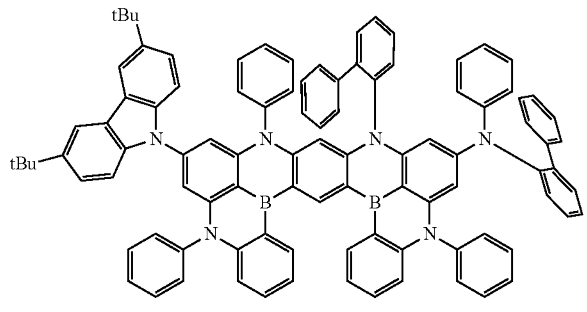
164
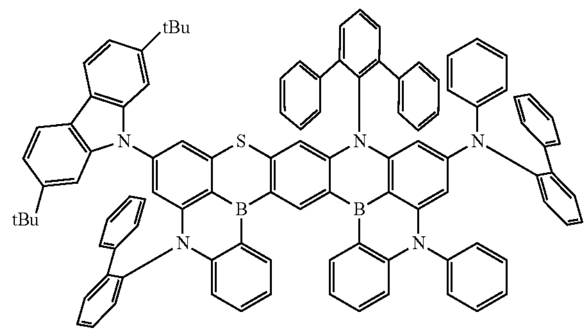
165
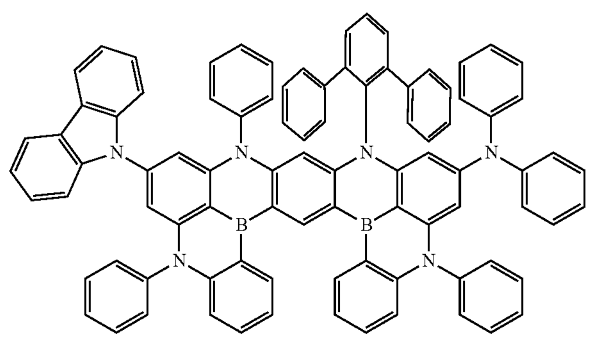
166
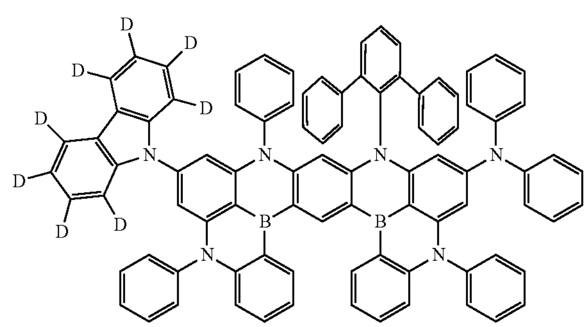
167
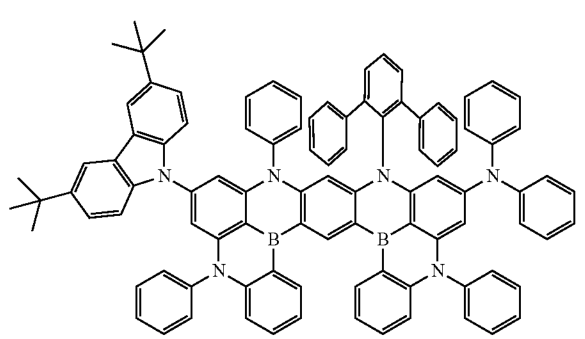
168
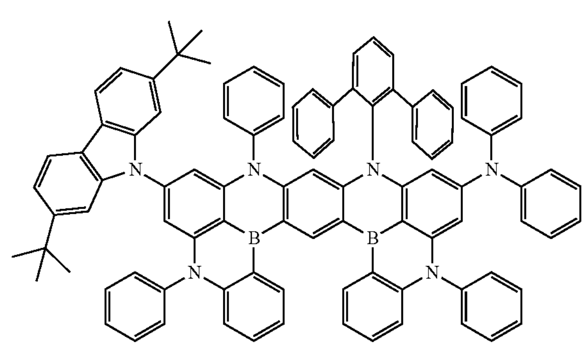

-continued
169
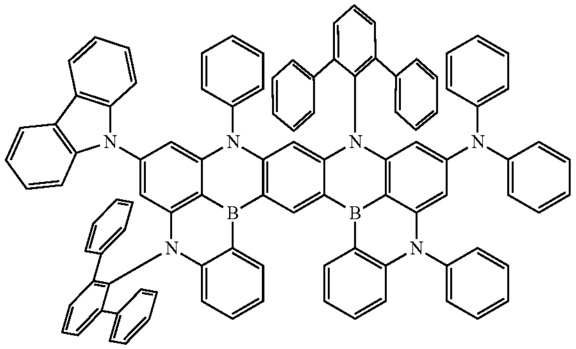
170
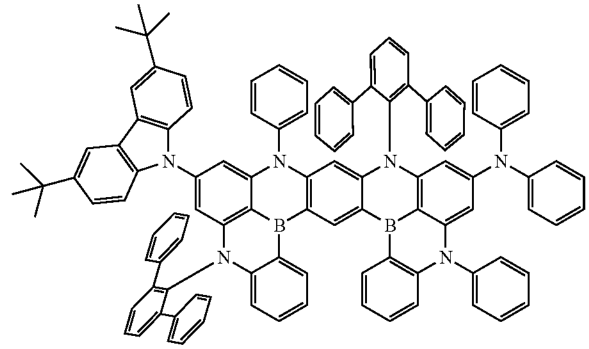
171
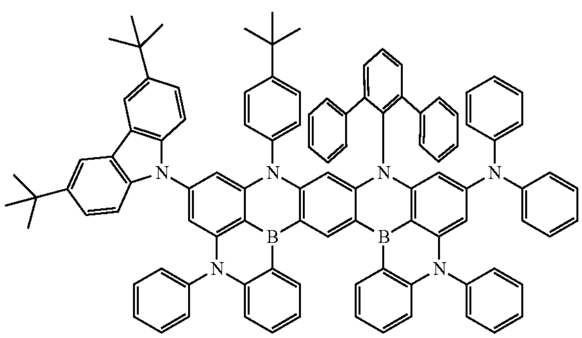
172
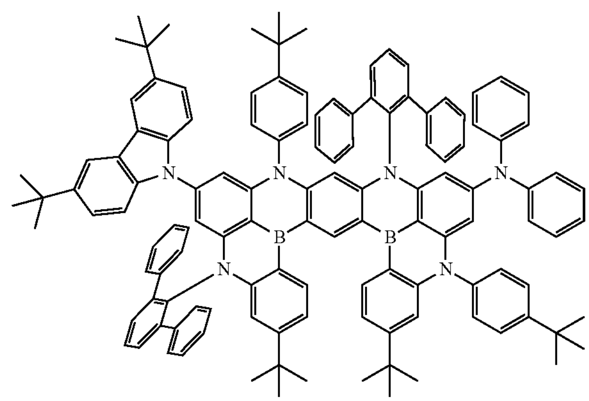
173
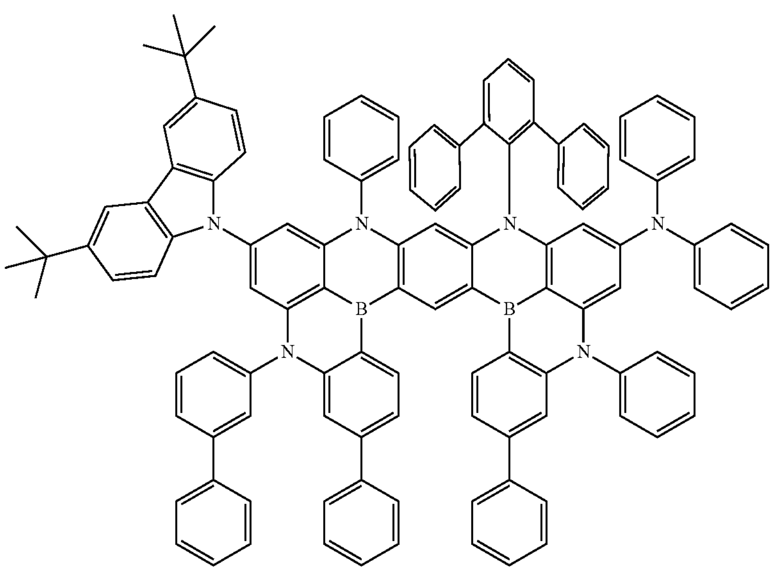

-continued
174
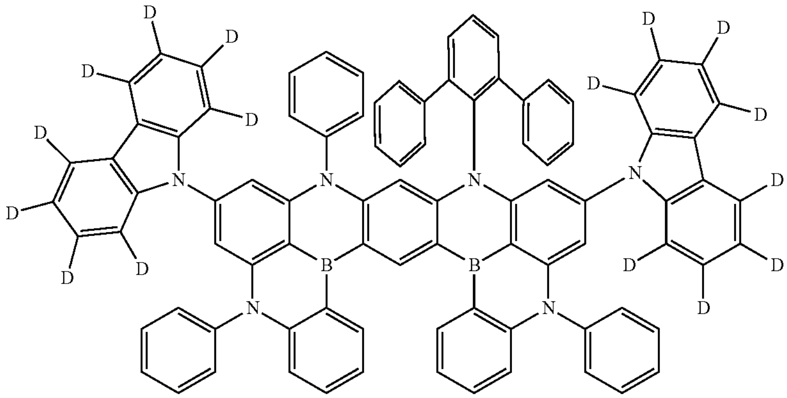
175
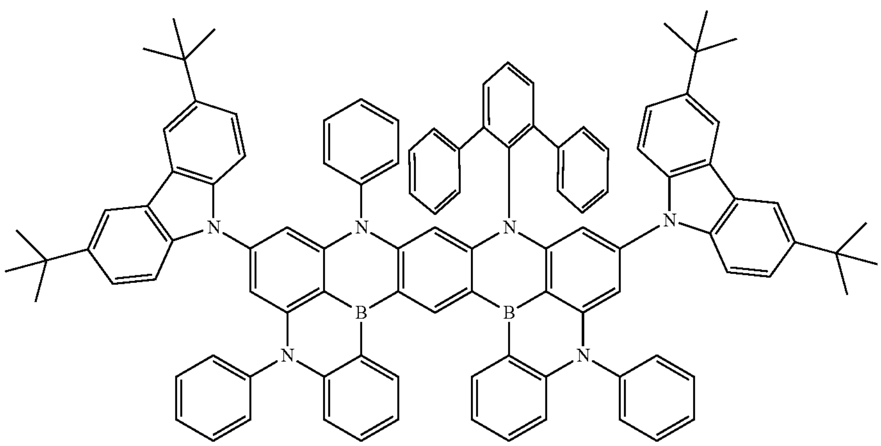
176
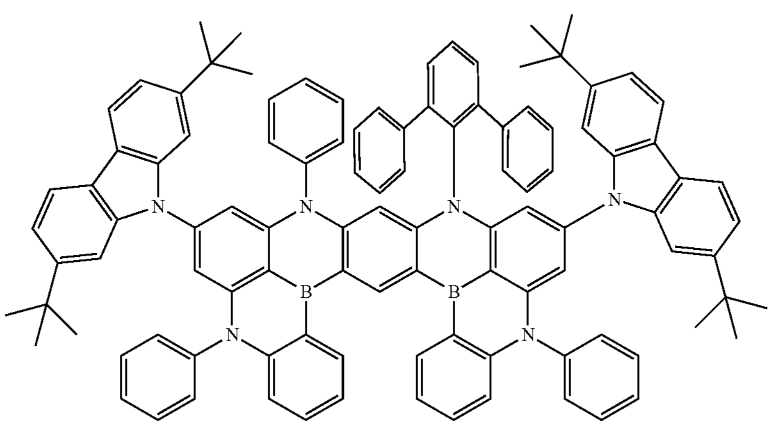

-continued
177
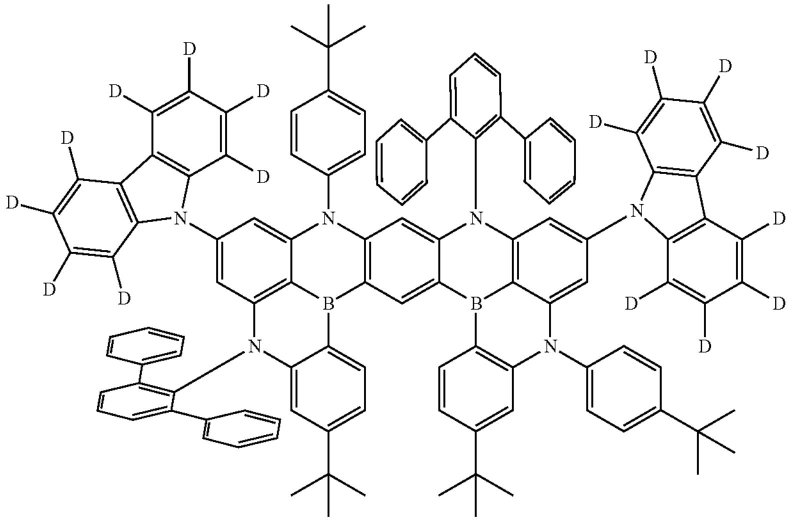
178
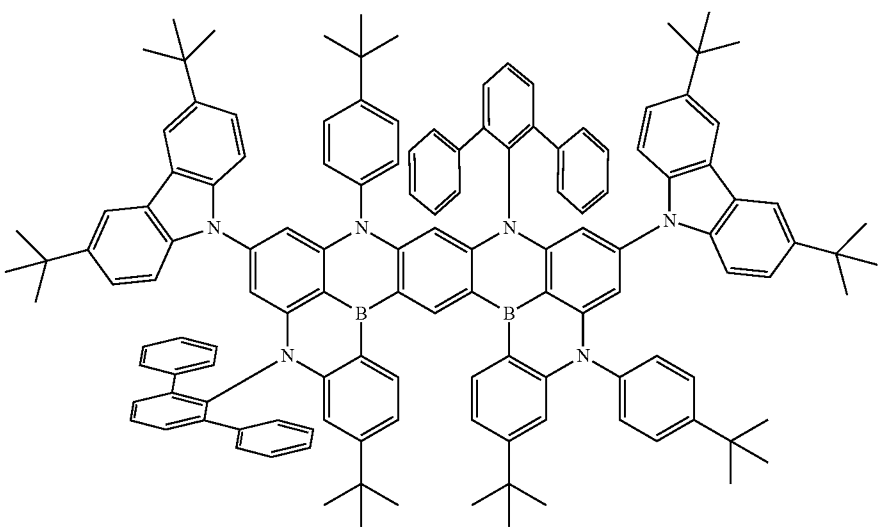
179
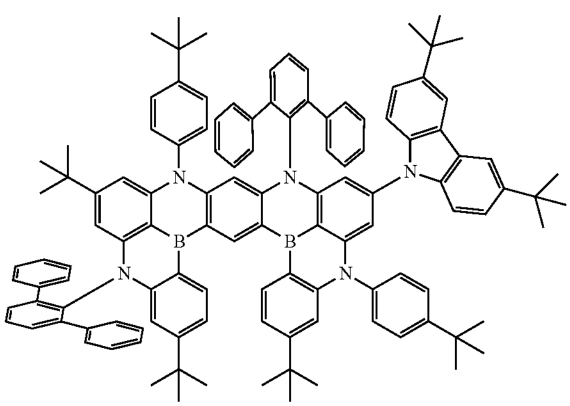
180
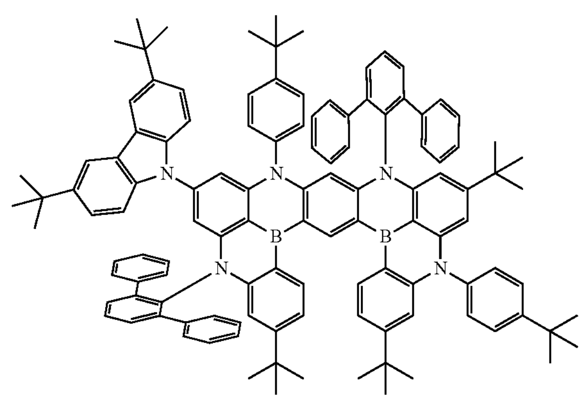

-continued
181
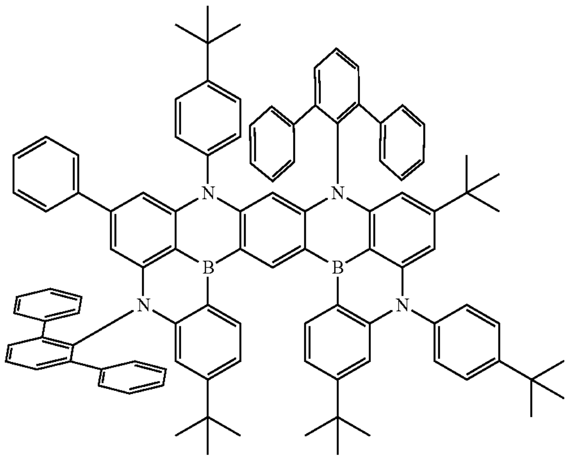
182
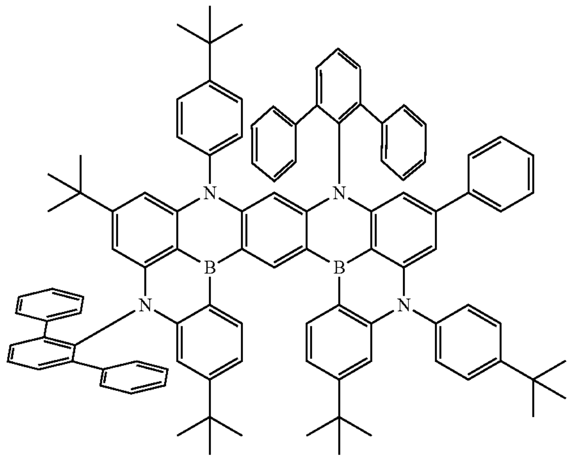
183
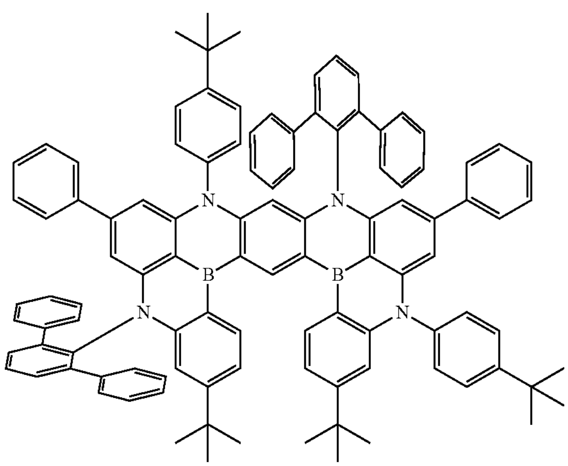
184
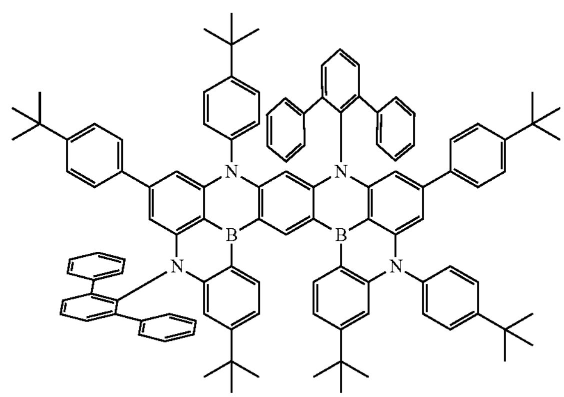
185
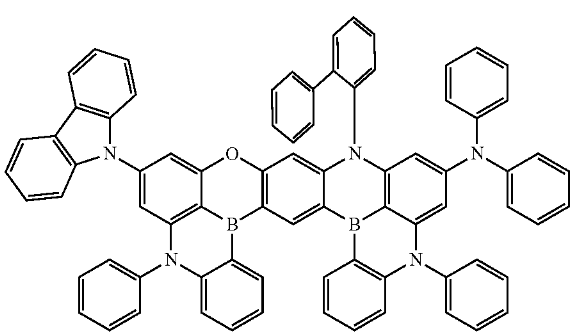
186
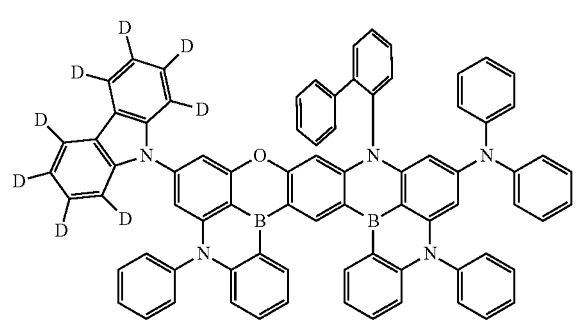

-continued
187
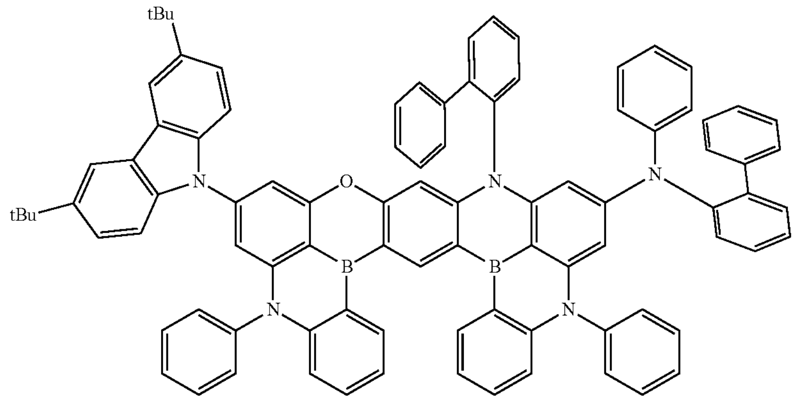
188
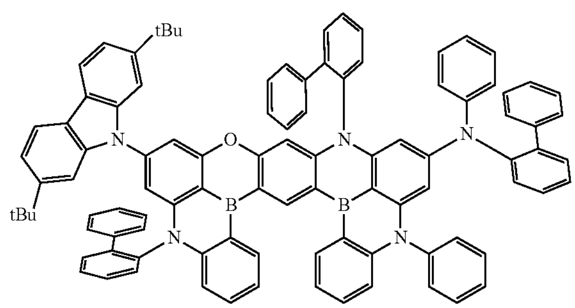
189
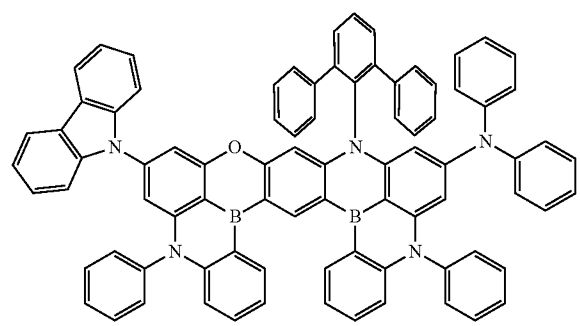
190
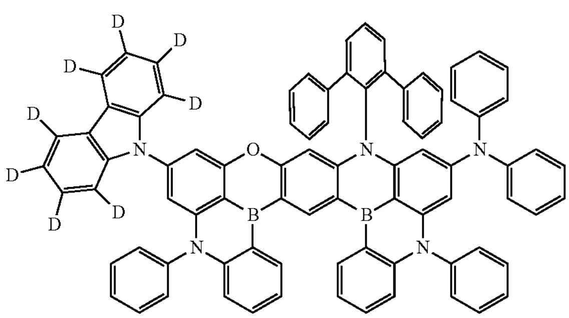
191
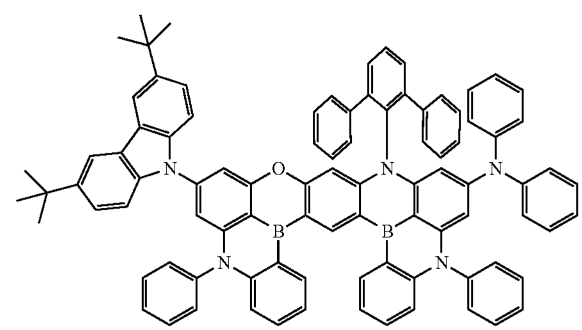
192
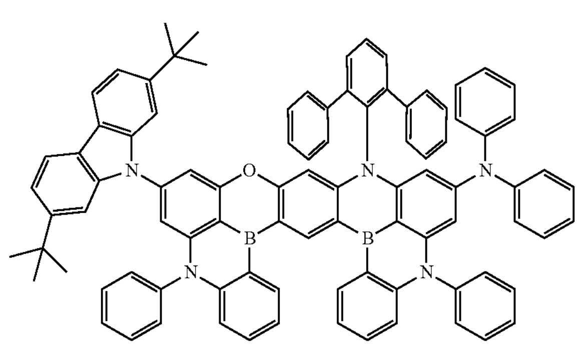
193
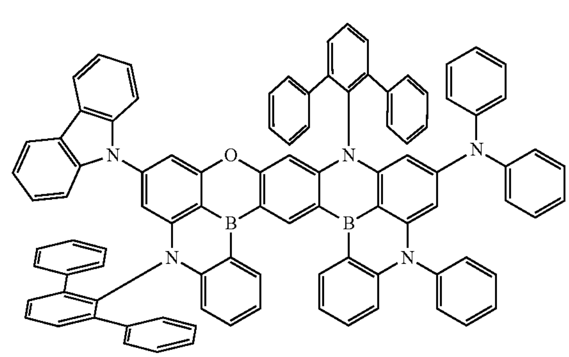

-continued
194
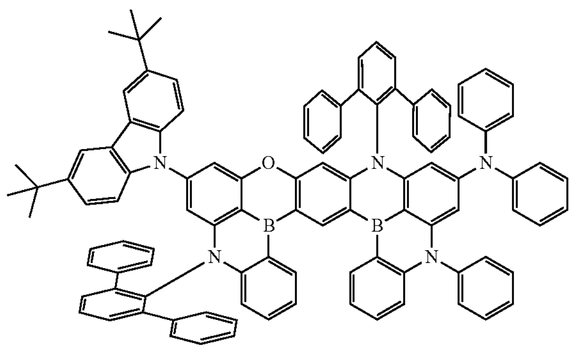
195
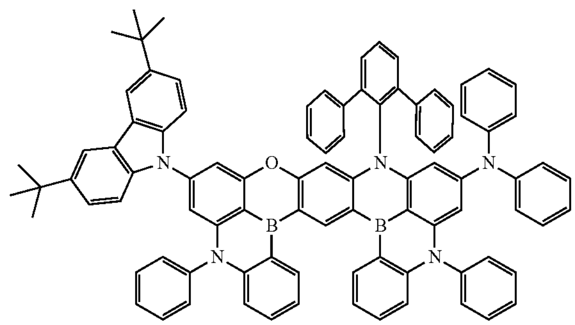
196
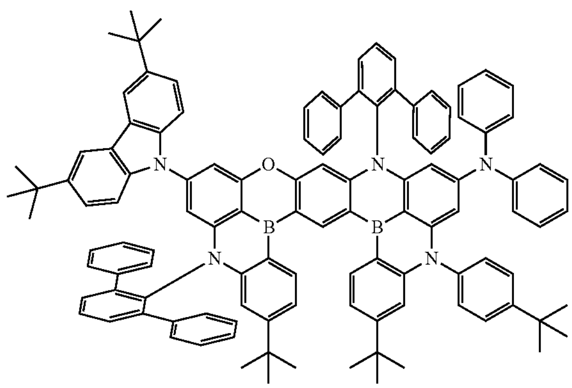
197
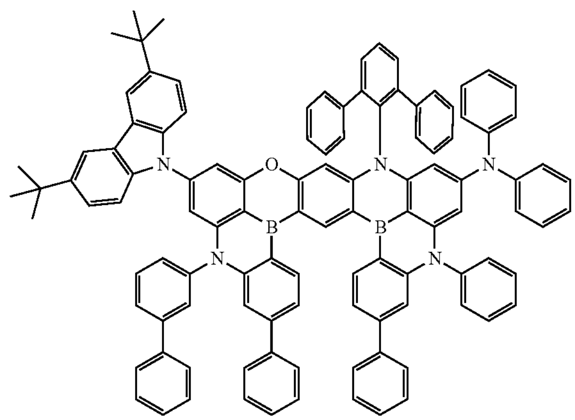
198
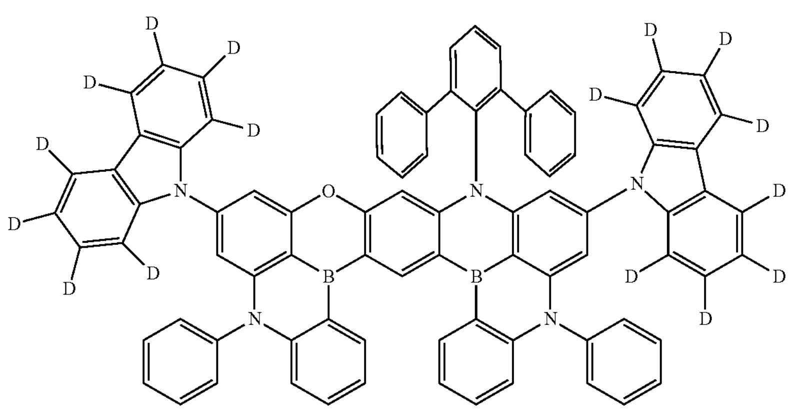
199
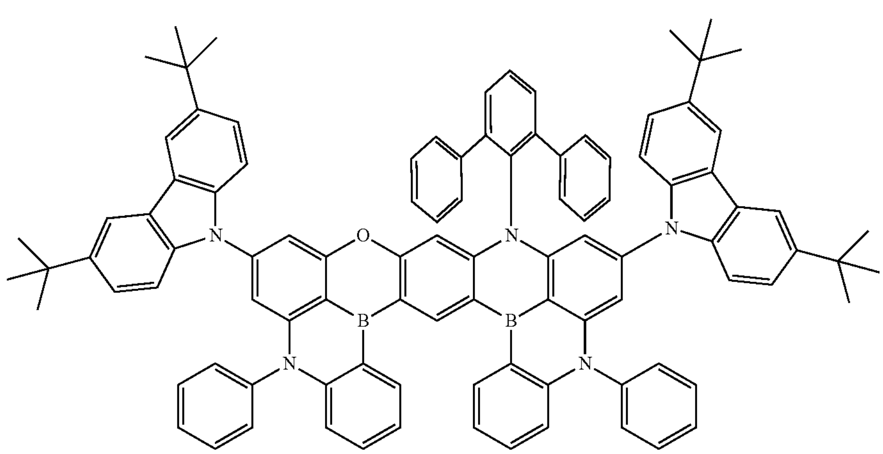

-continued
200
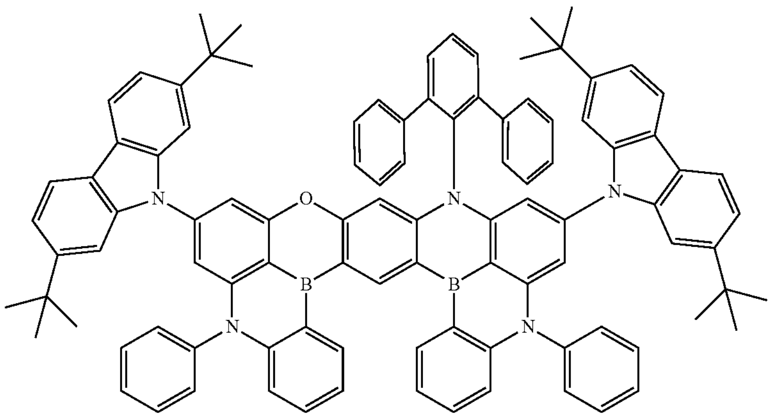
201
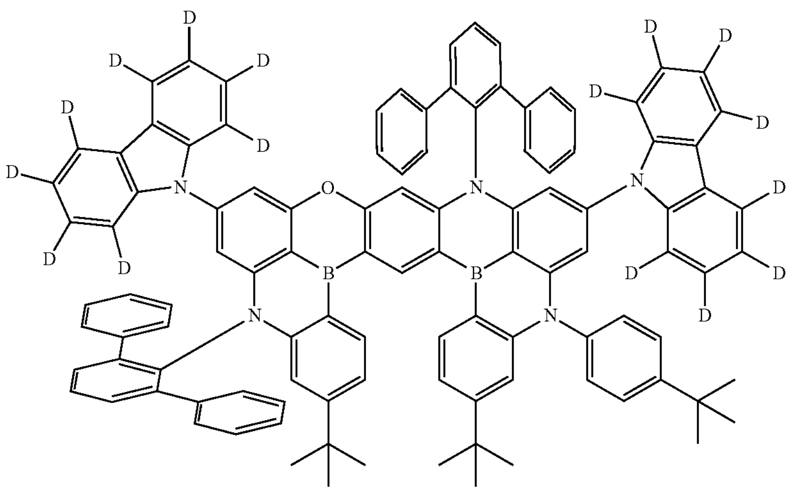
202
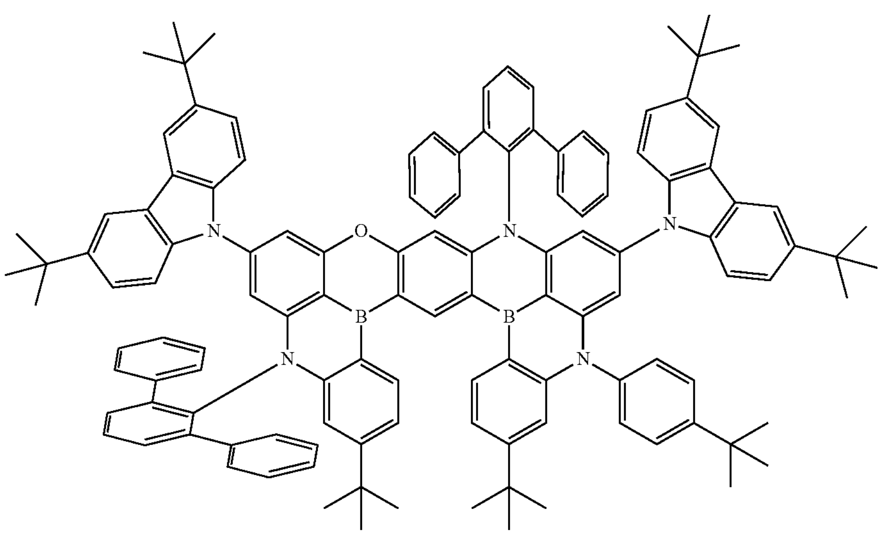

-continued
203
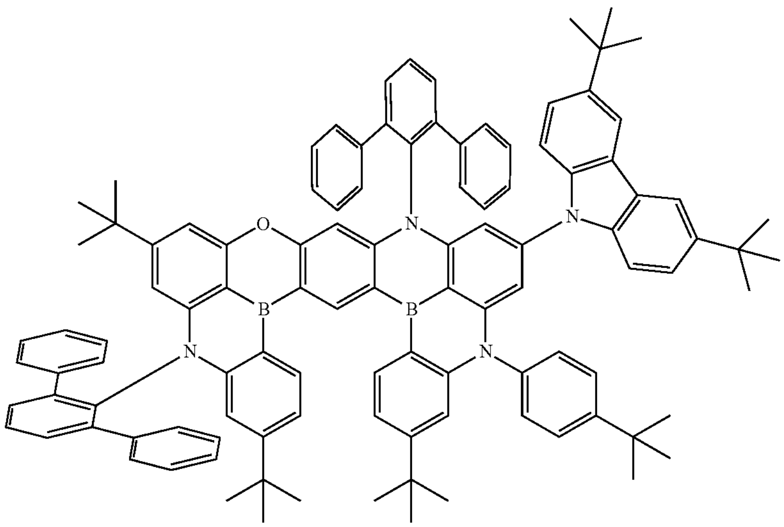
204
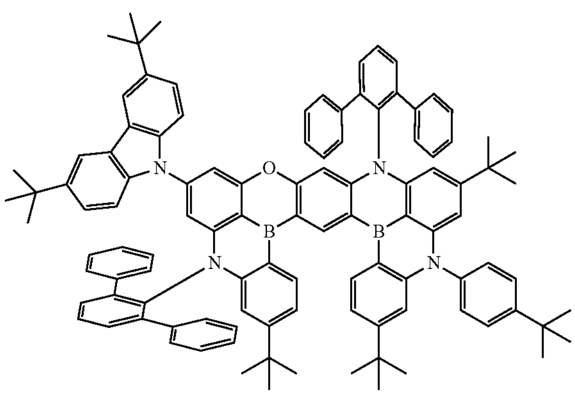
205
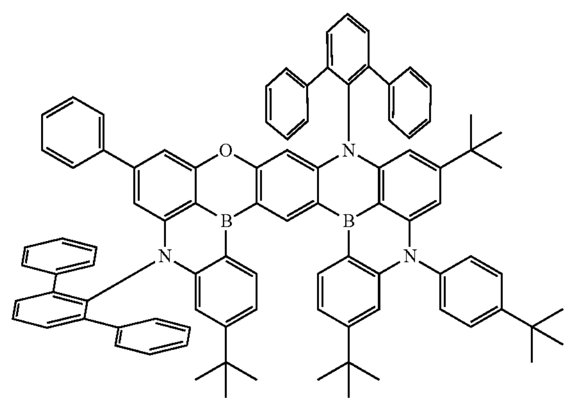
206
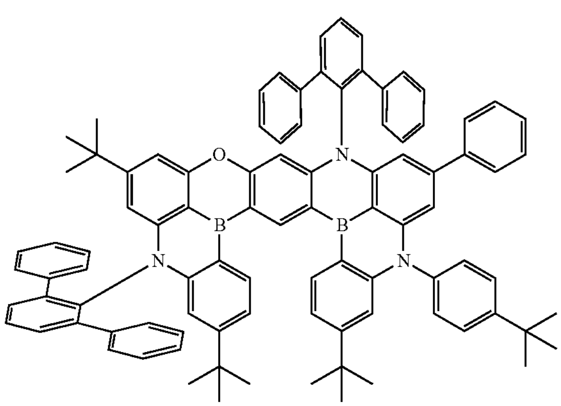
207
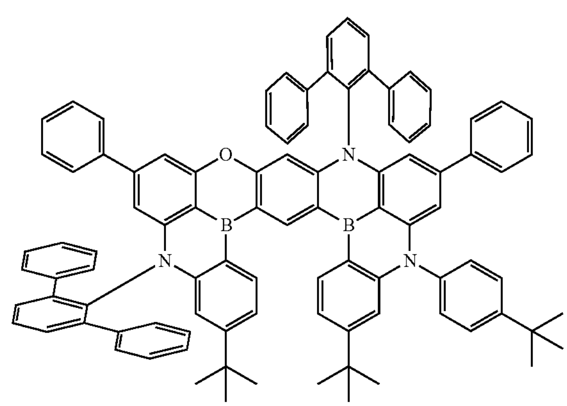

-continued
208
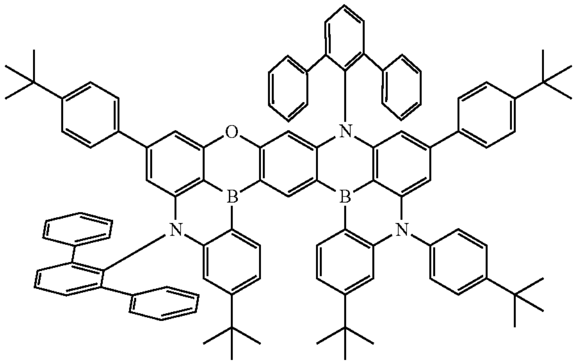
209
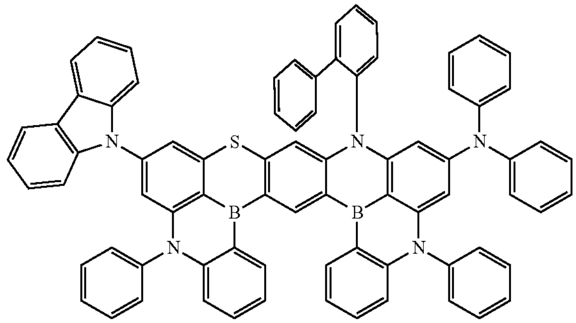
210
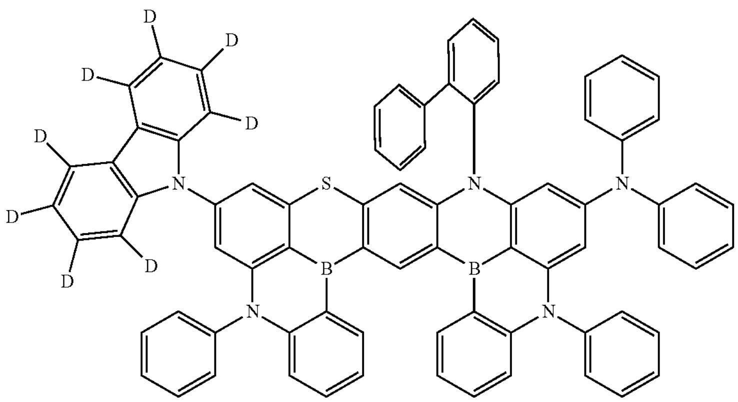
211
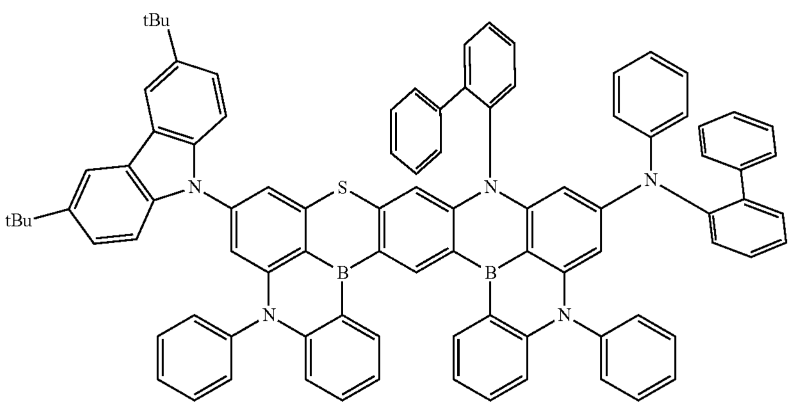
212
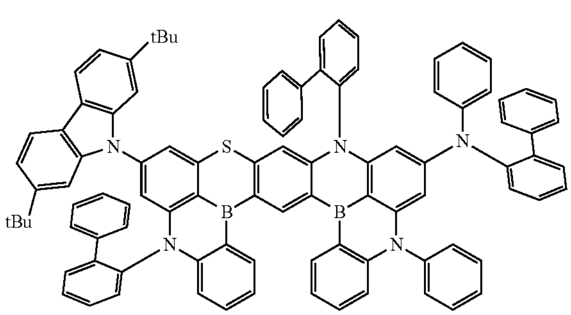
213
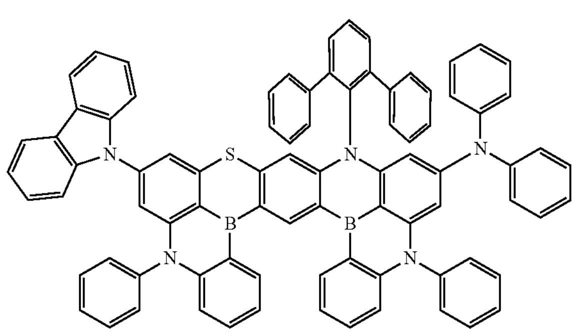

-continued
214
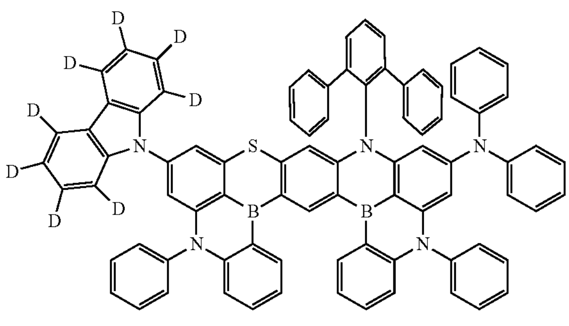
215
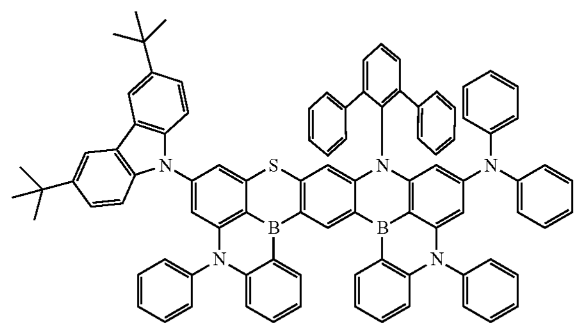
216
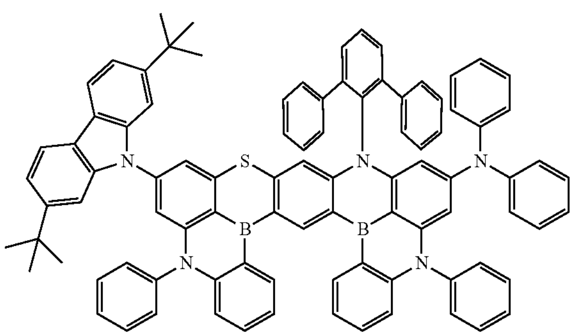
217
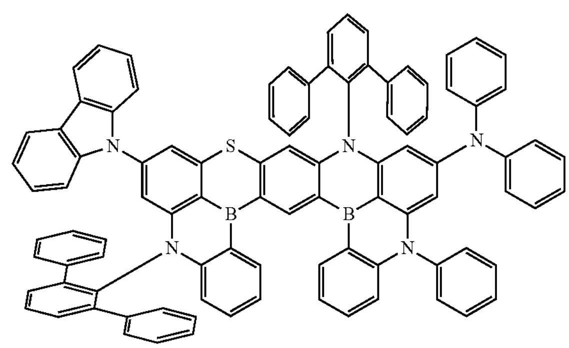
218
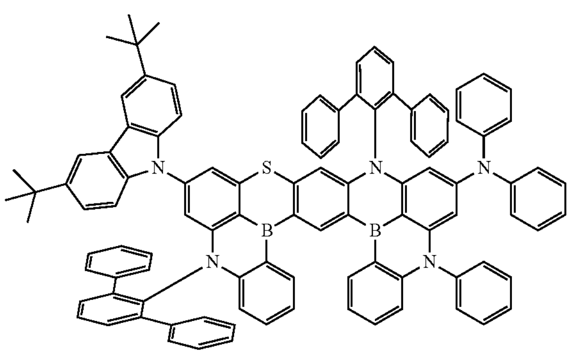
219
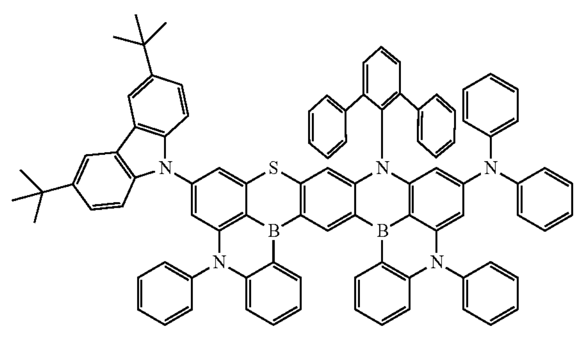
220
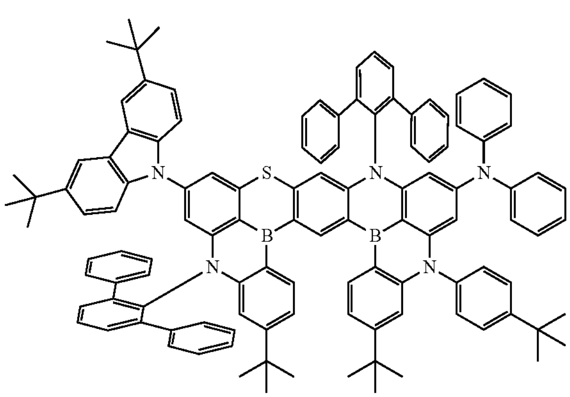
221
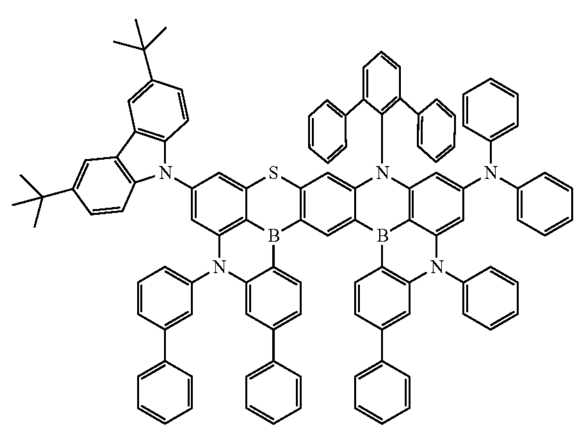

-continued
222
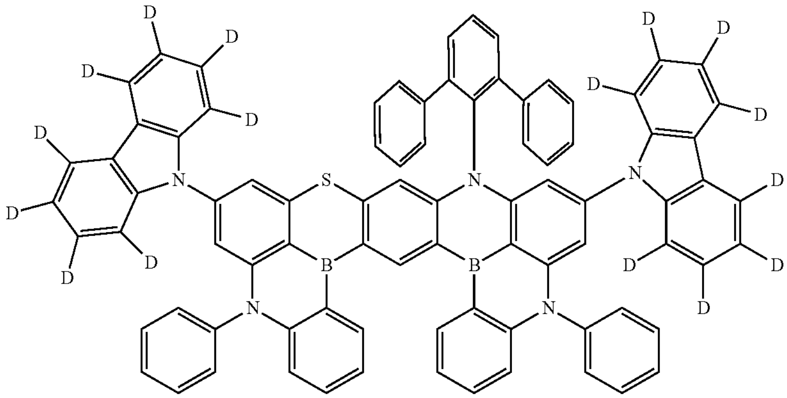
223
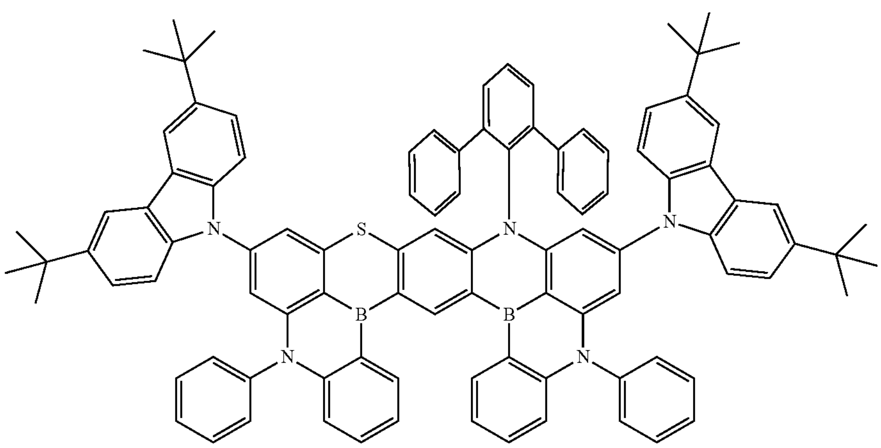
224
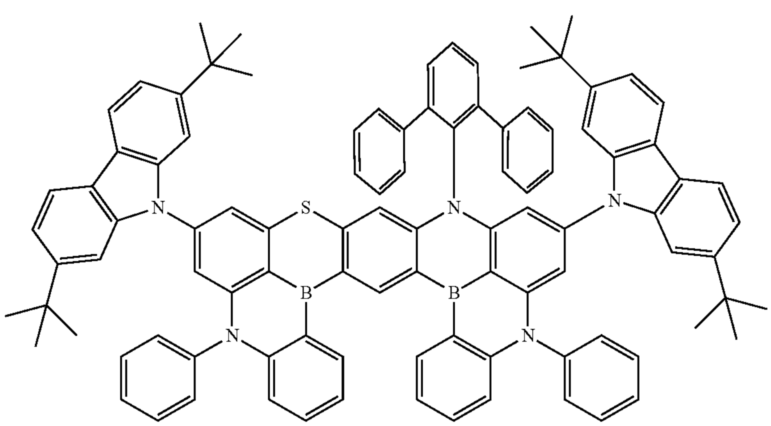

-continued
225
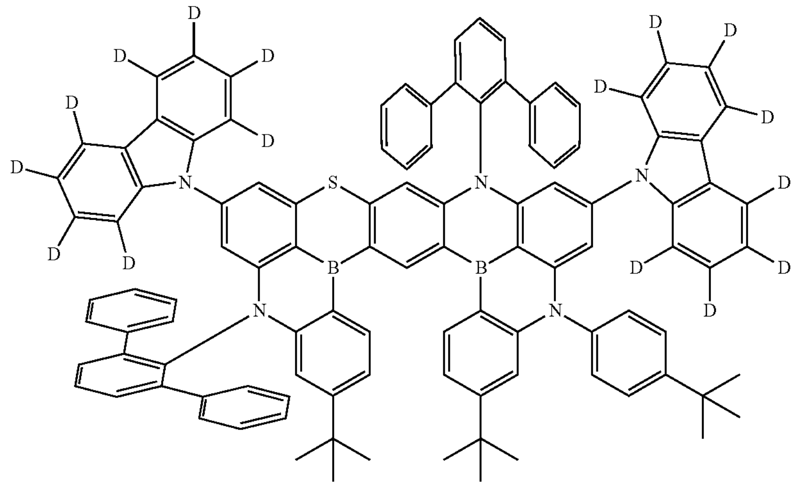
226
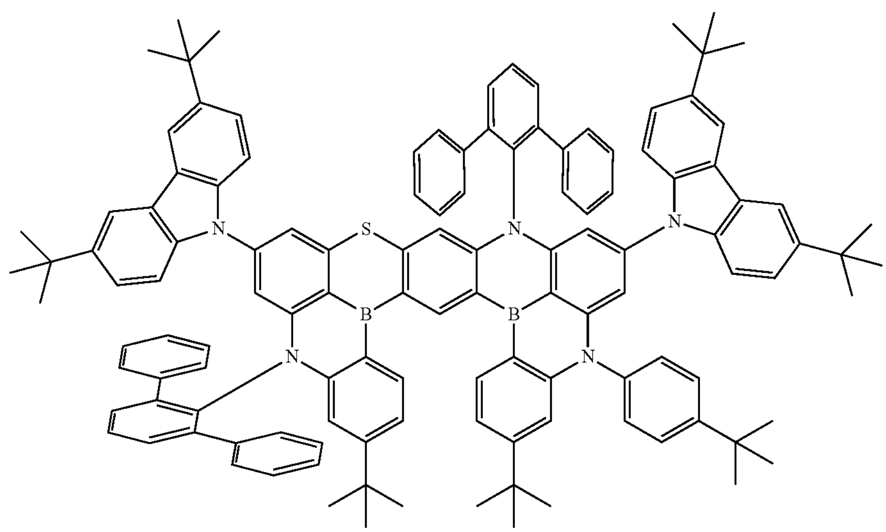
227
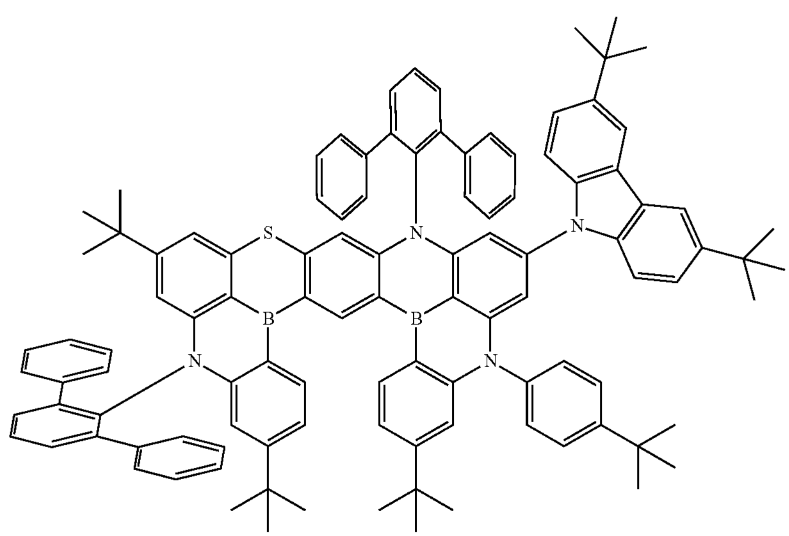

-continued
228
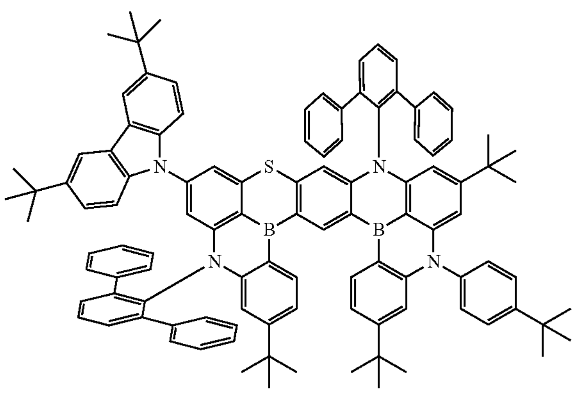
229
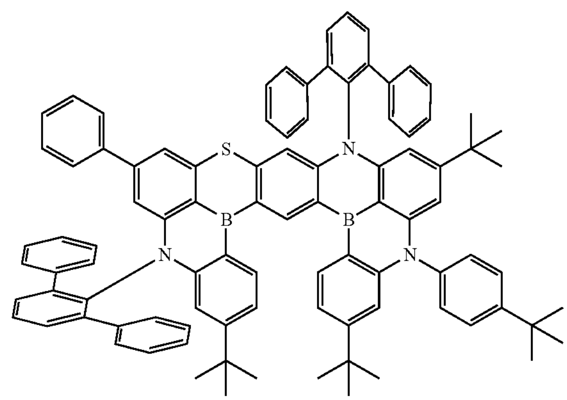
230
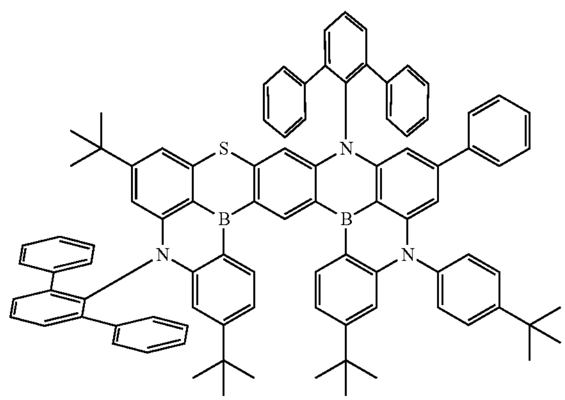
231
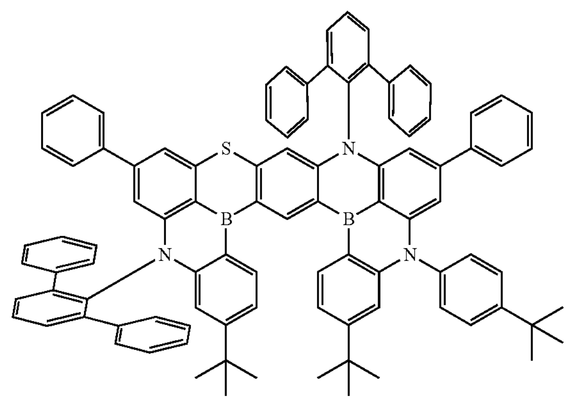
232
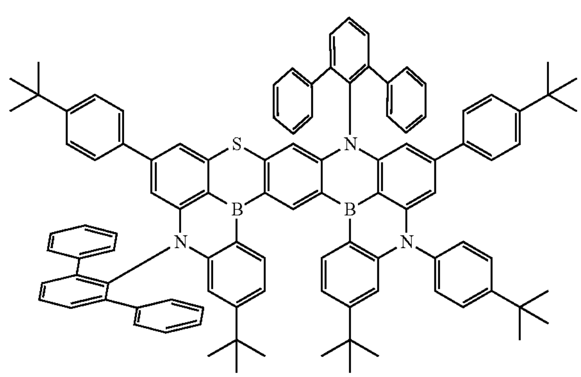
233
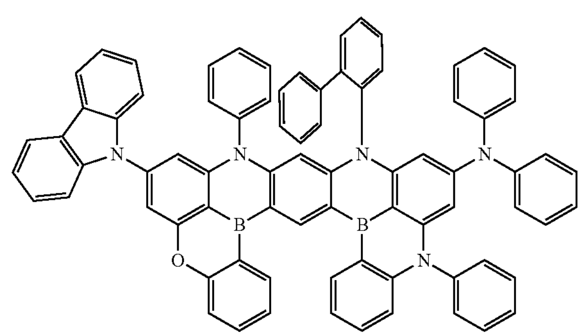
234
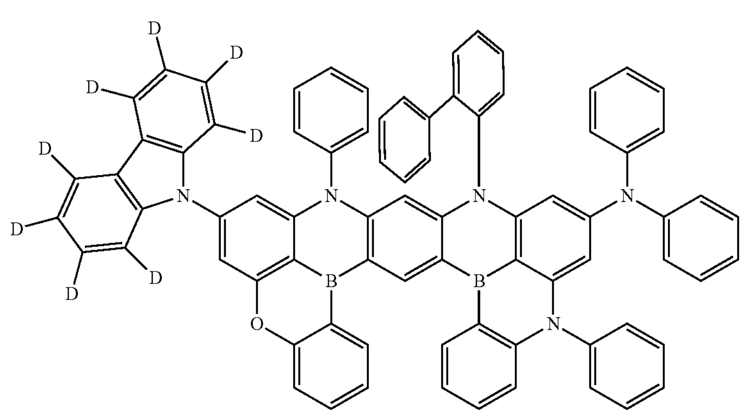

-continued
235
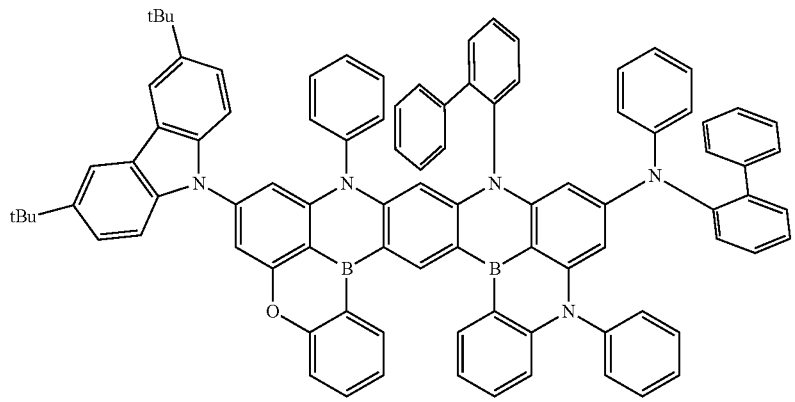
236
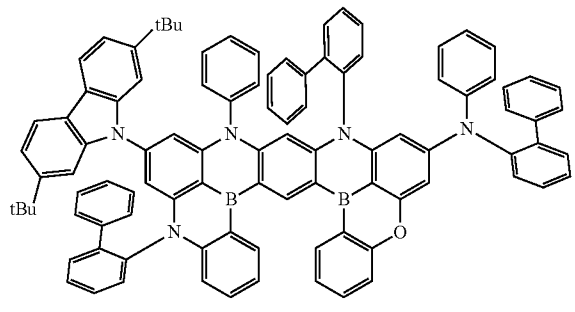
237
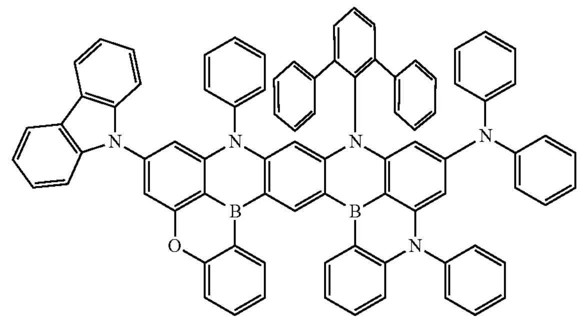
238
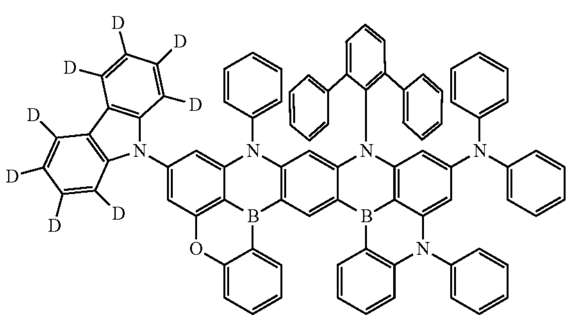
239
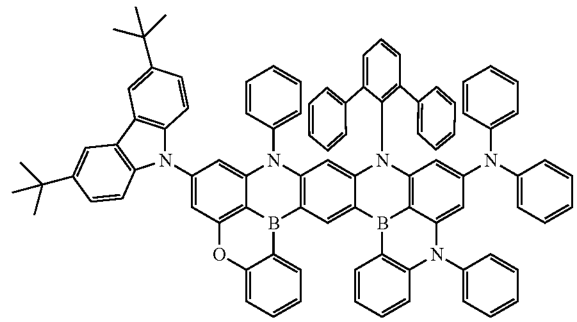
240
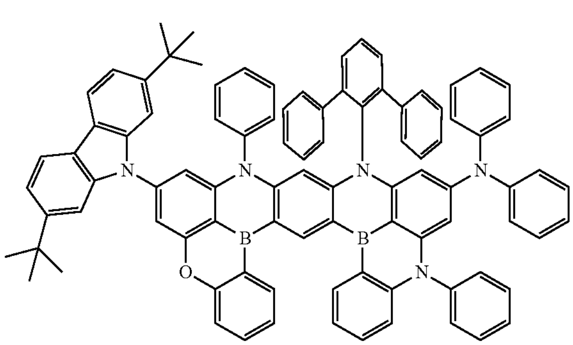
241
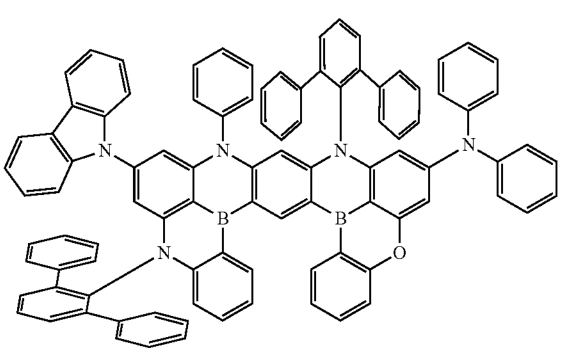

-continued
242
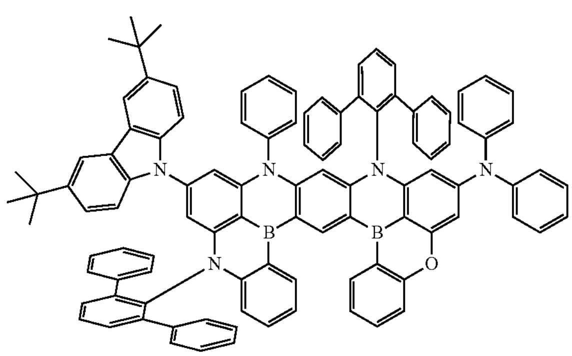
243
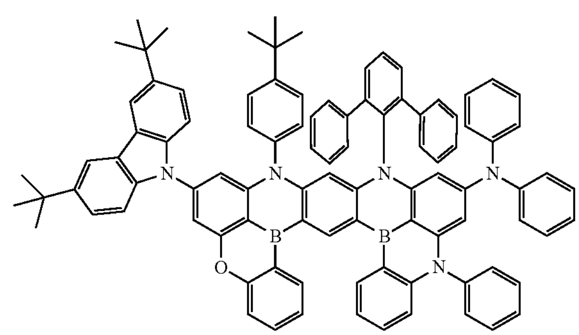
244
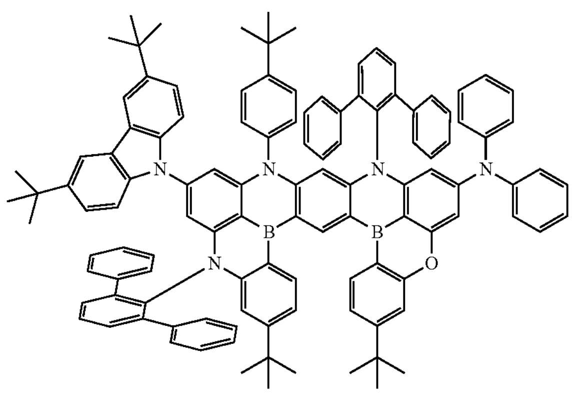
245
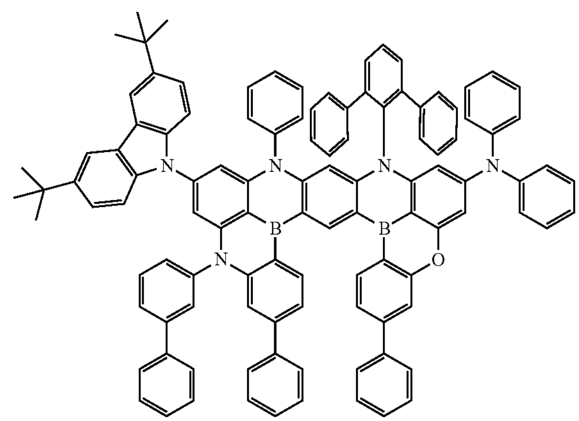
246
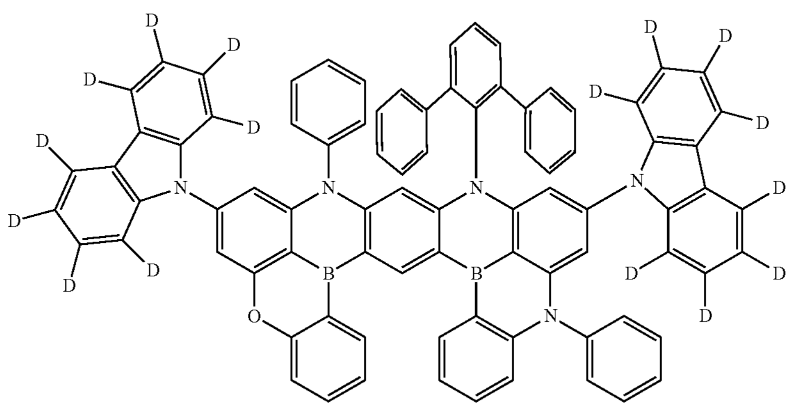
247
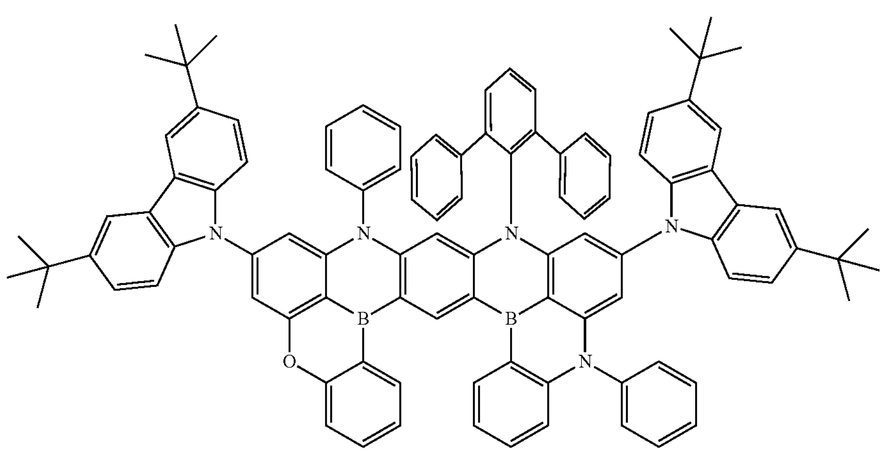

-continued
248
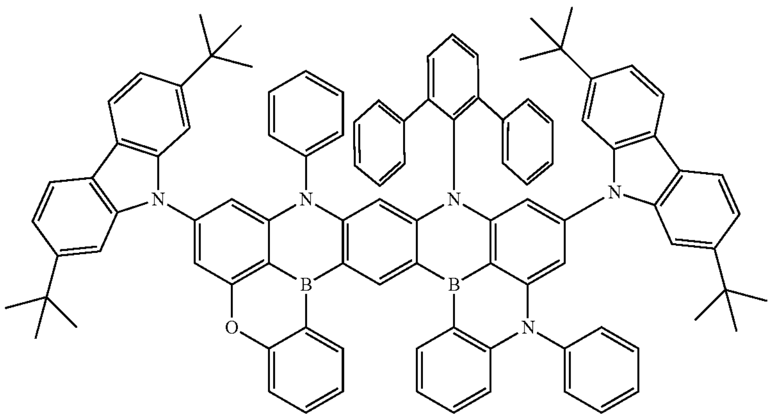
249
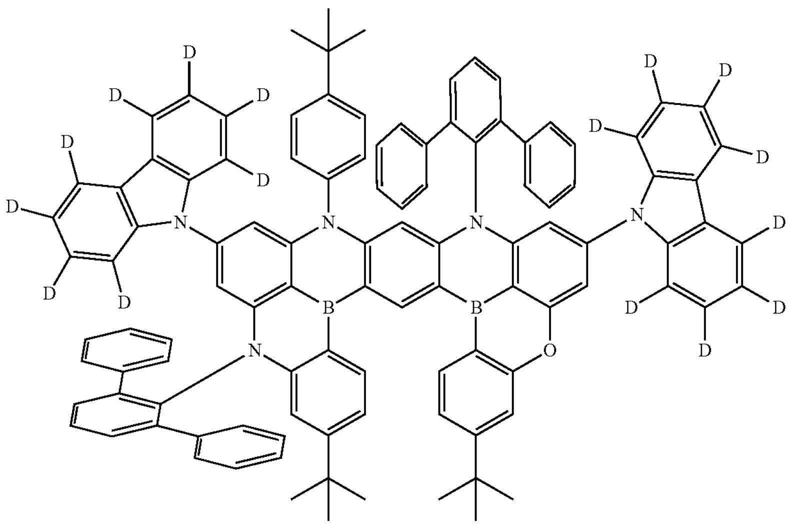
250
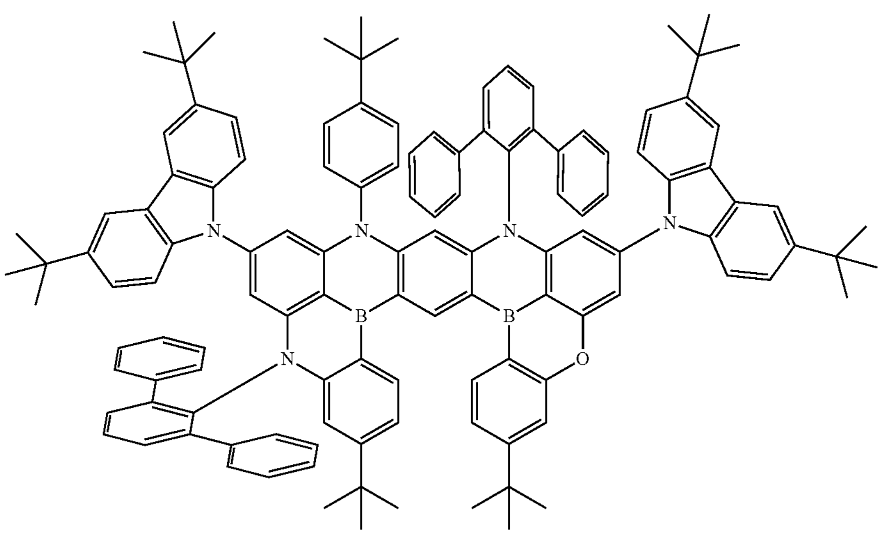

-continued
251
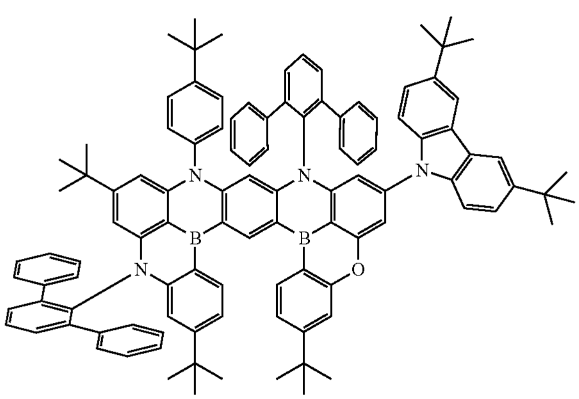
252
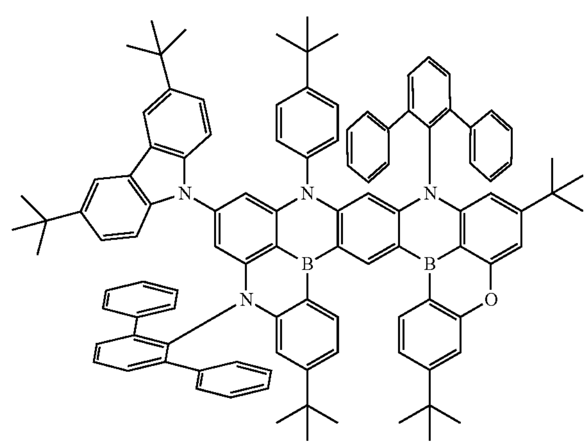
253
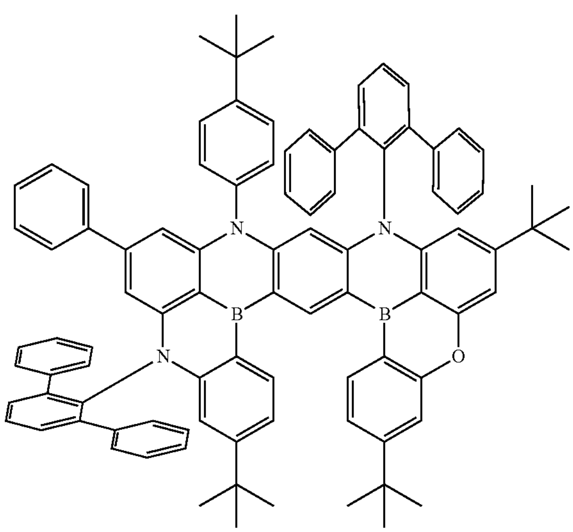
254
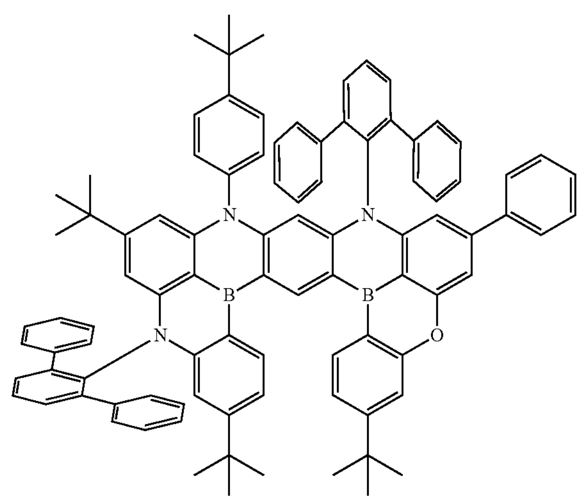
255
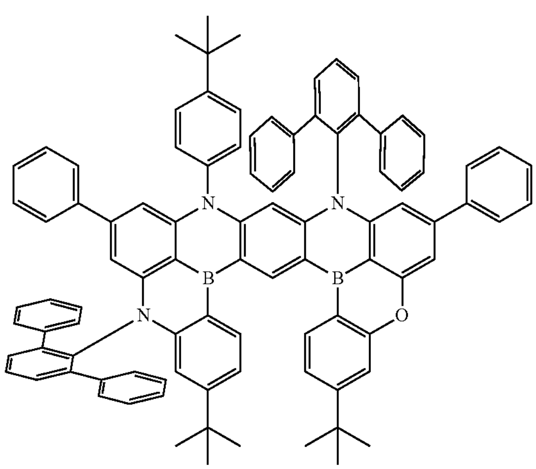
256
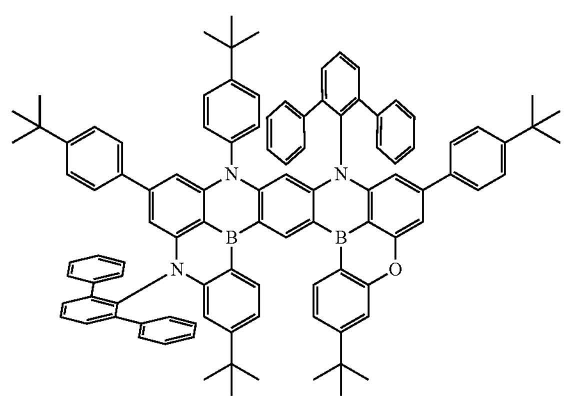

-continued
257
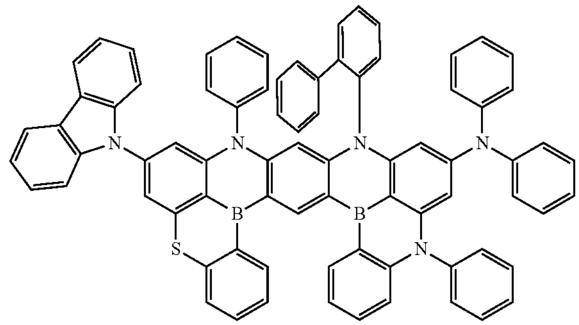
258
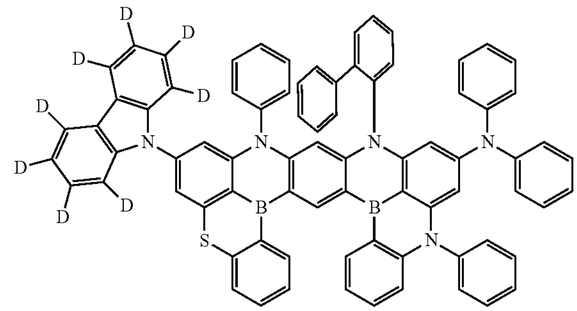
259
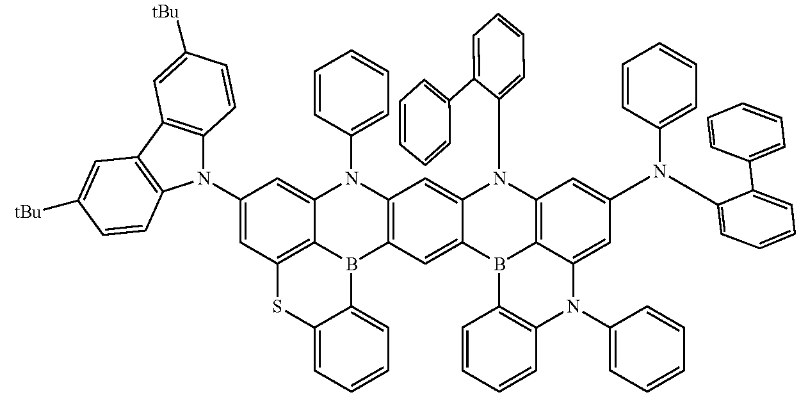
260
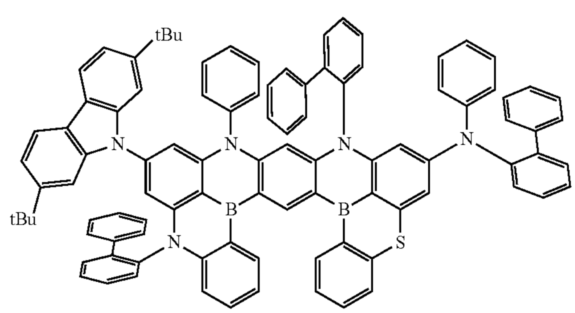
261
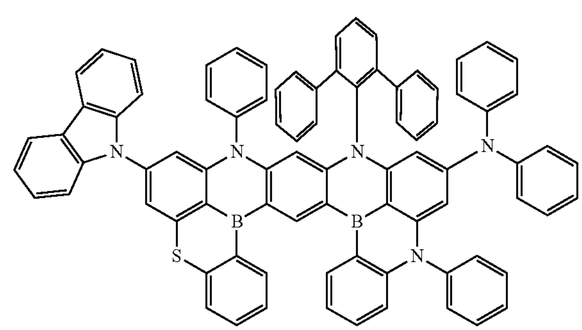
262
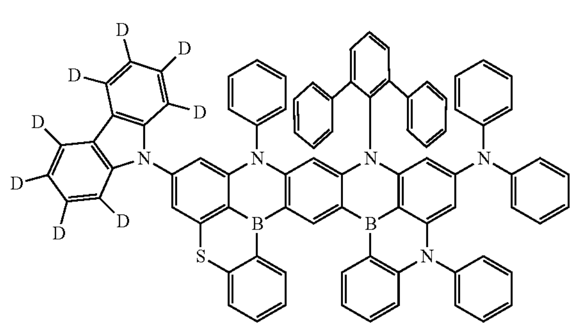
263
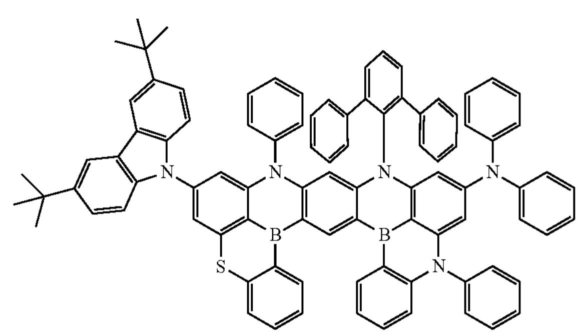

-continued
264
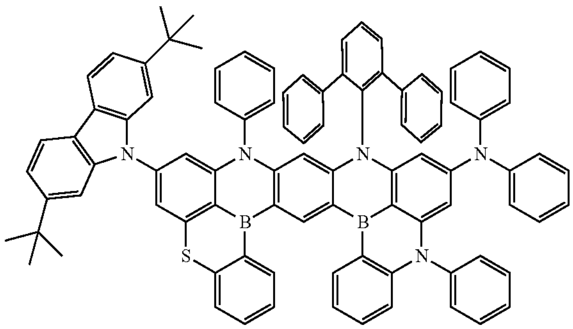
265
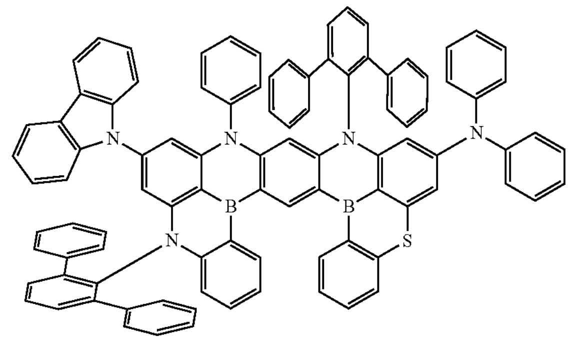
266
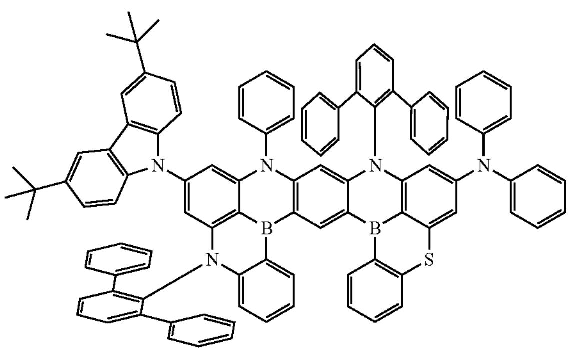
267
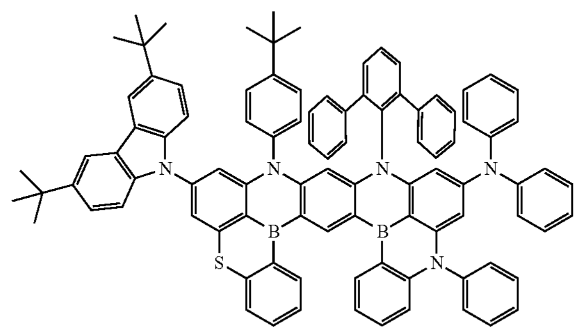
268
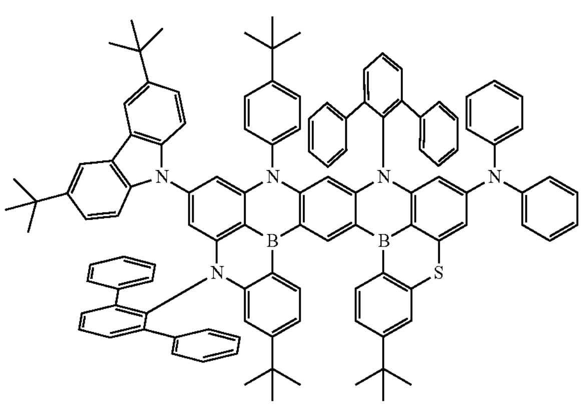
269
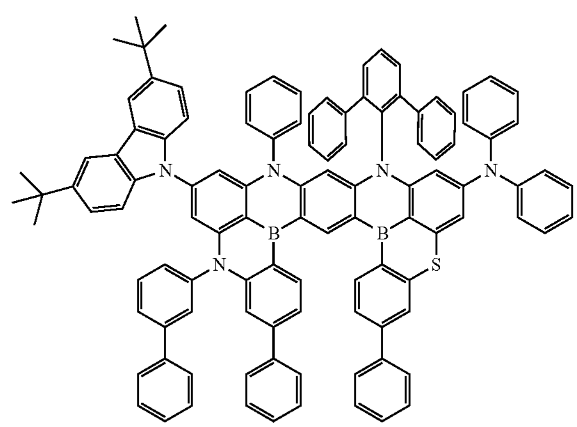
270
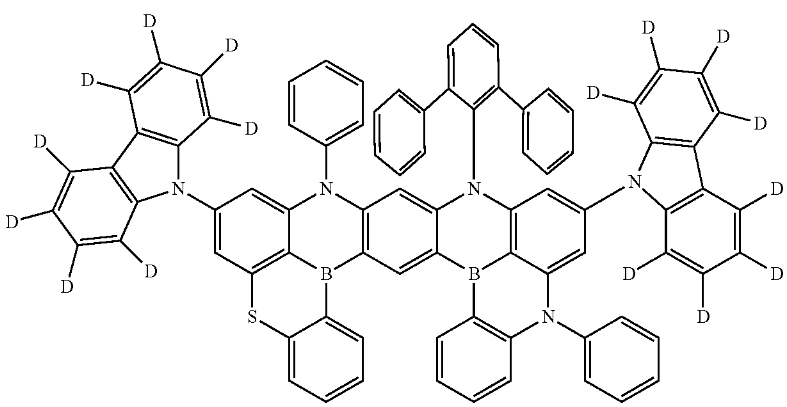

-continued
271
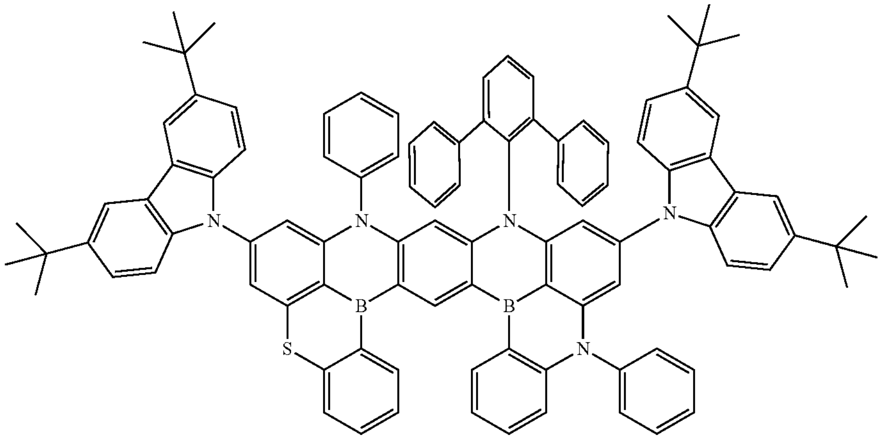
272
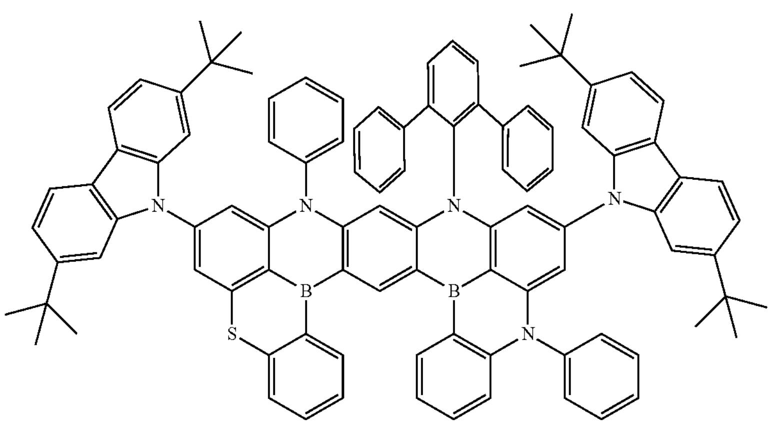
273
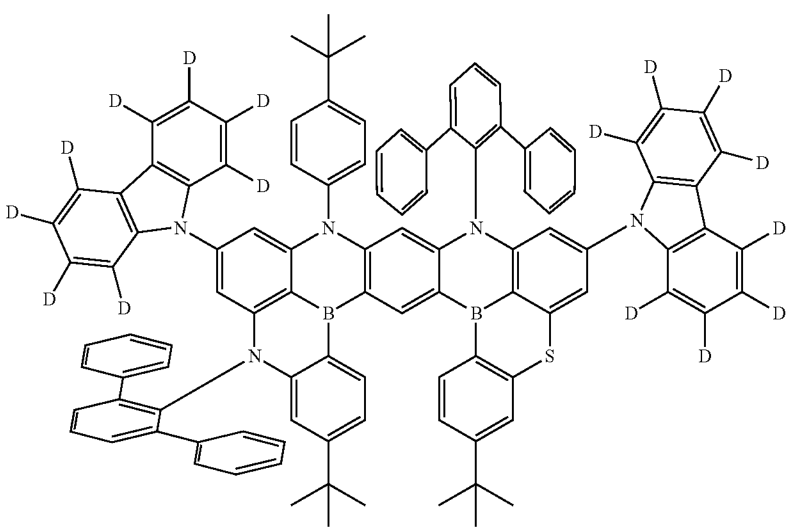

-continued
274
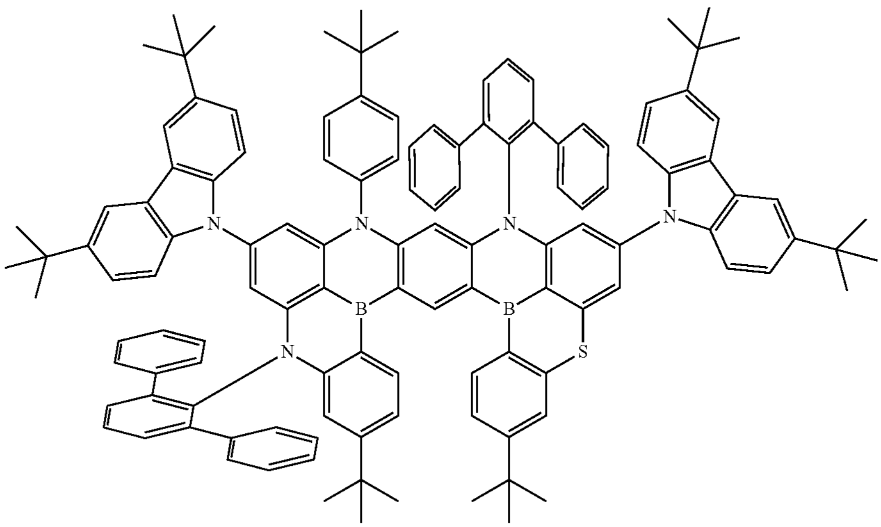
275
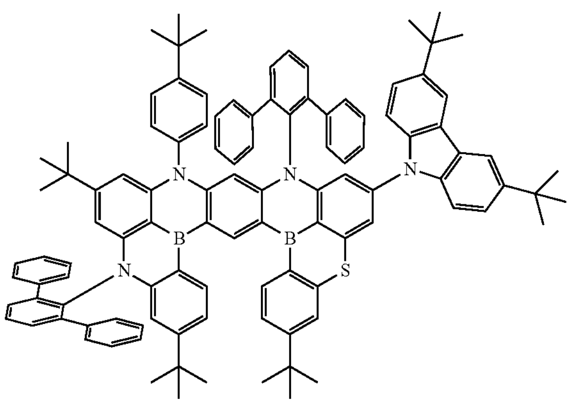
276
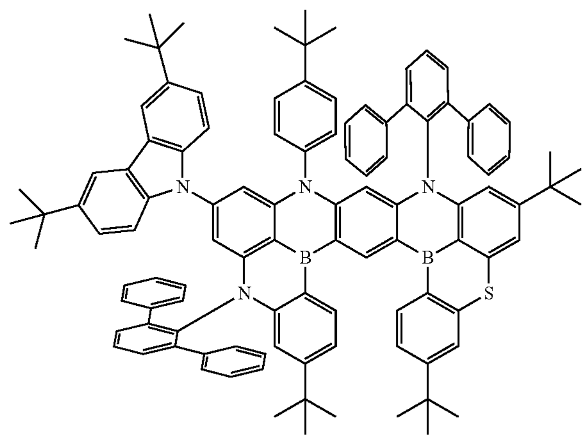
277
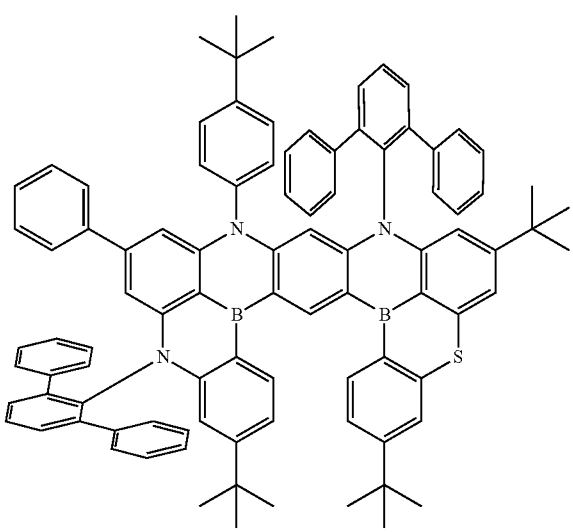
278
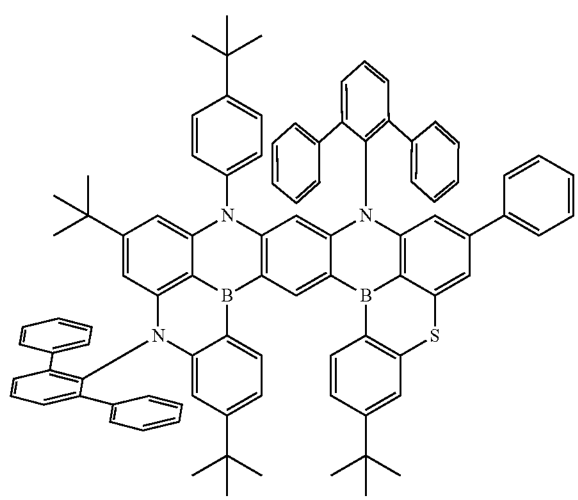

-continued
279
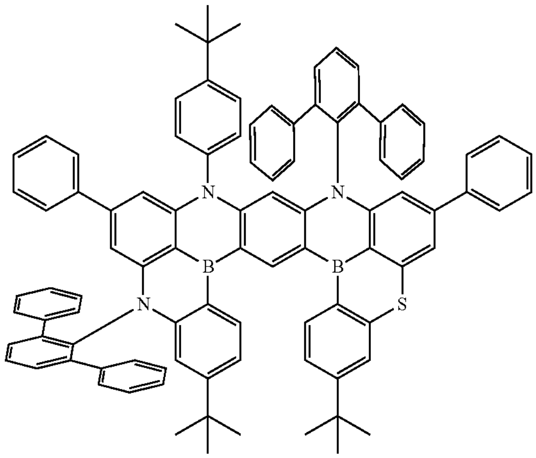
280
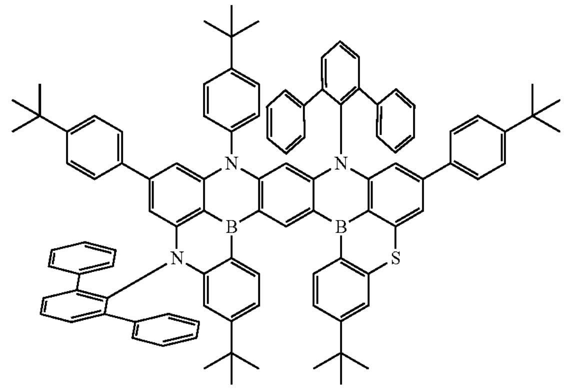
281
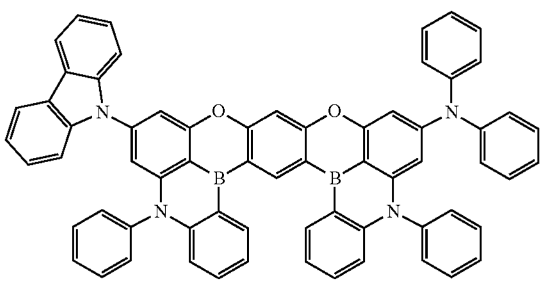
282
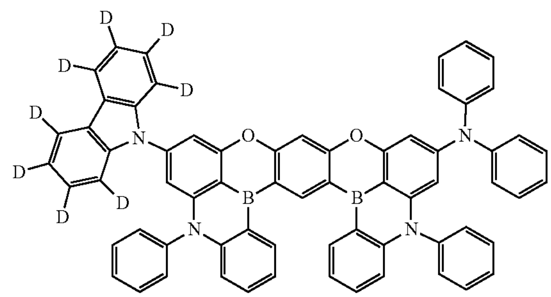
283
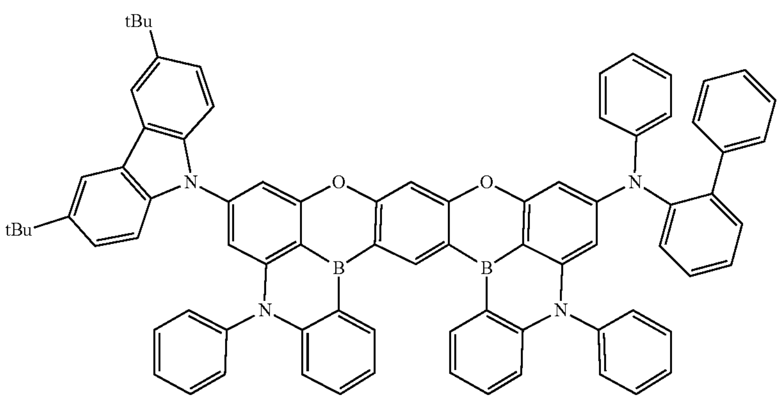
284
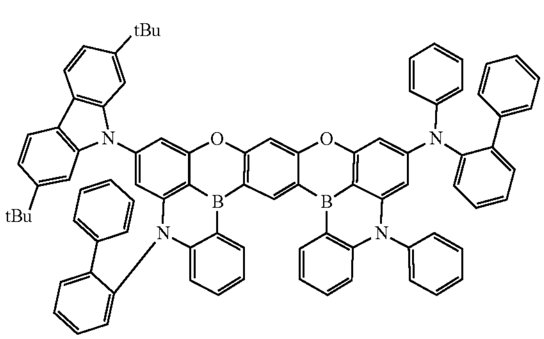
285
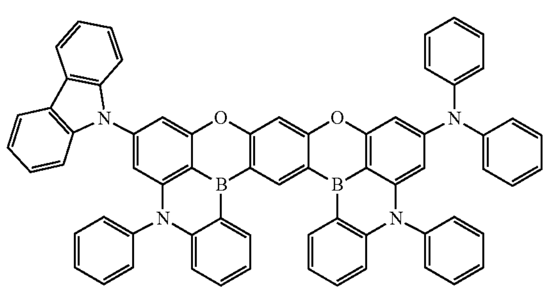

-continued
286
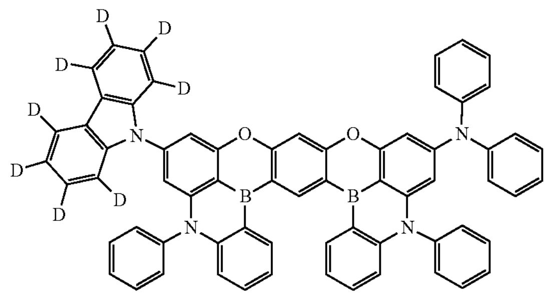
287
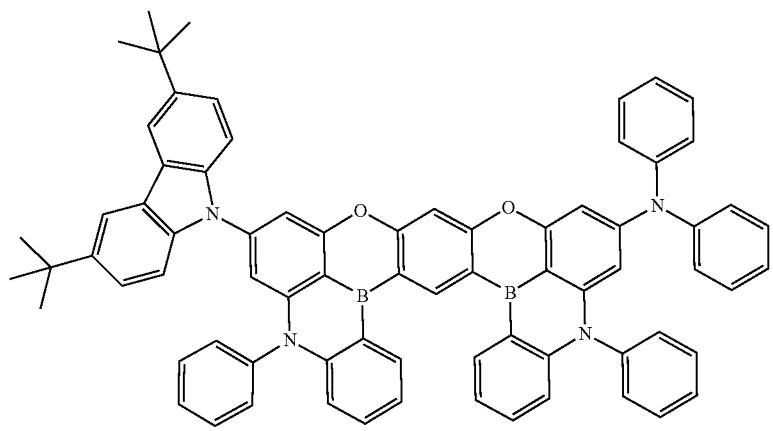
288
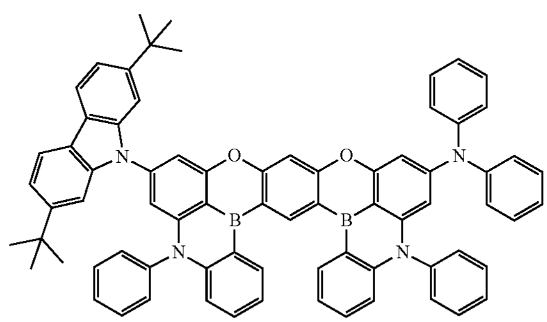
289
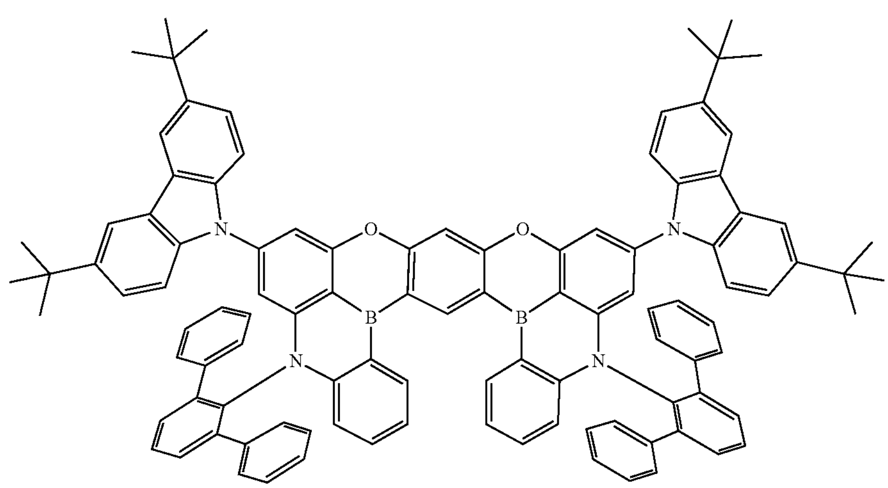

-continued
290
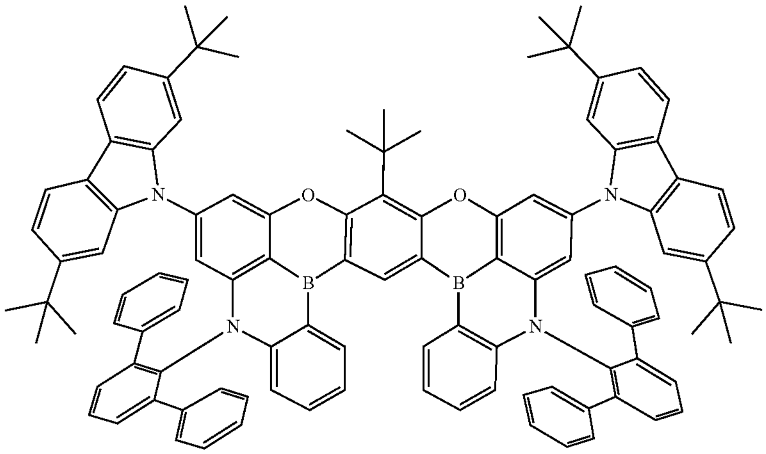
291
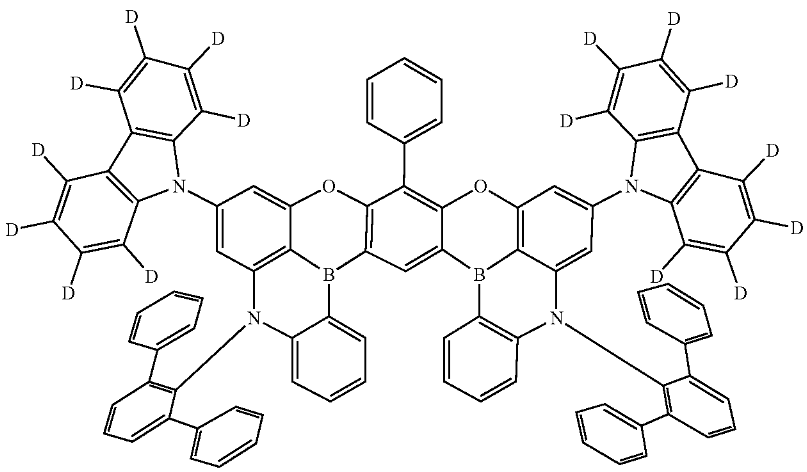
292
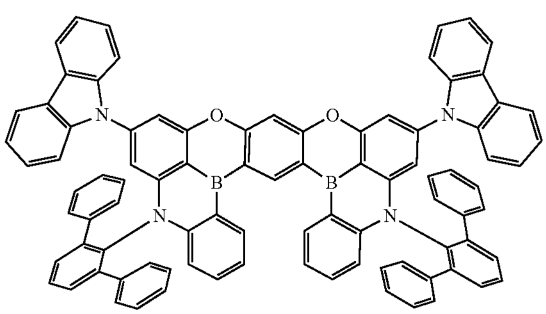

-continued
293
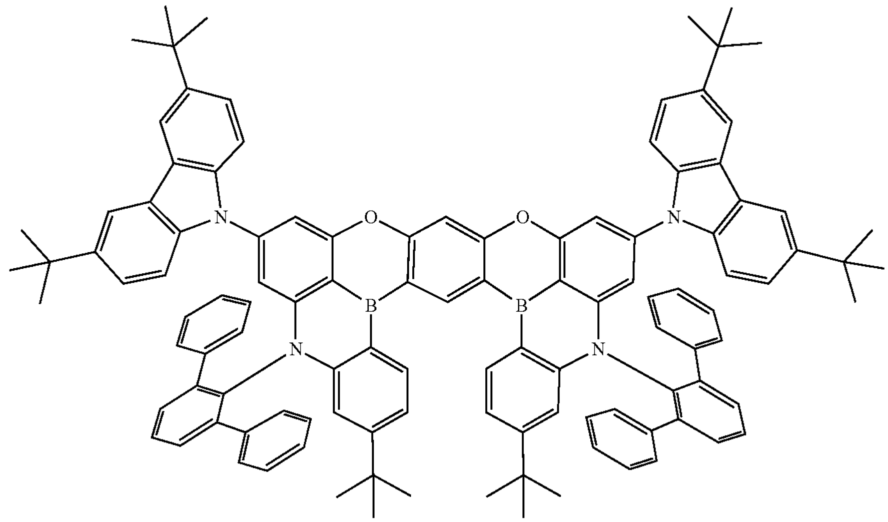
294
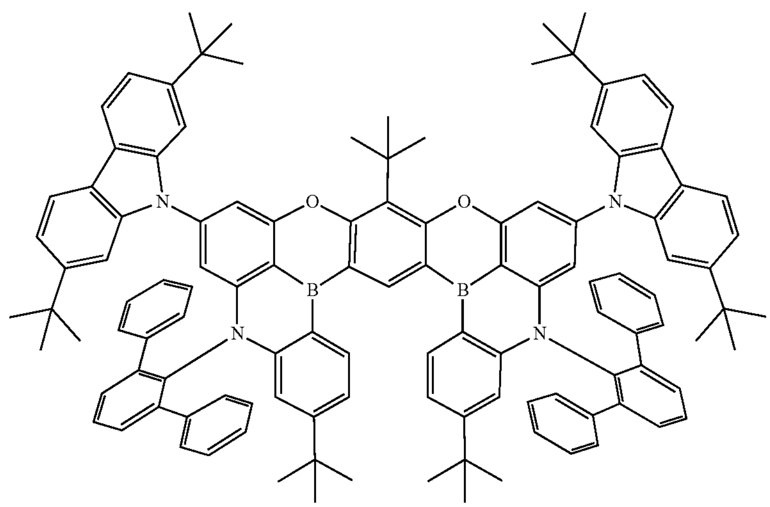
295
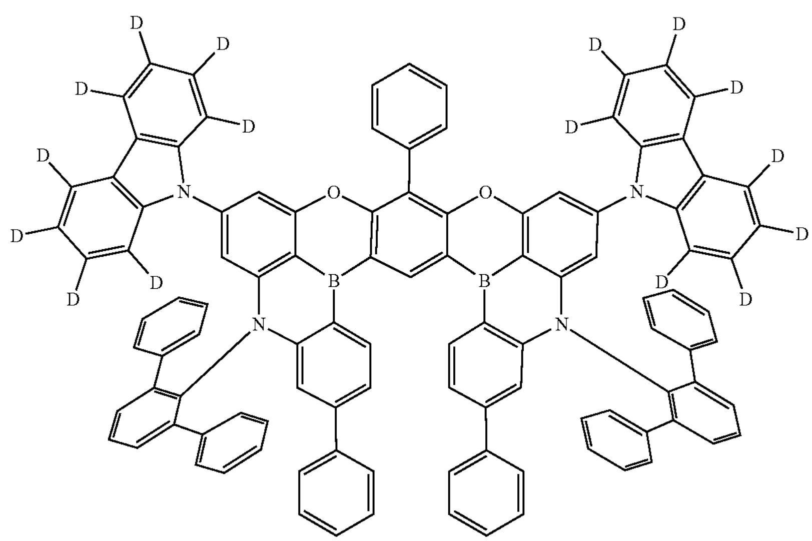

-continued
296
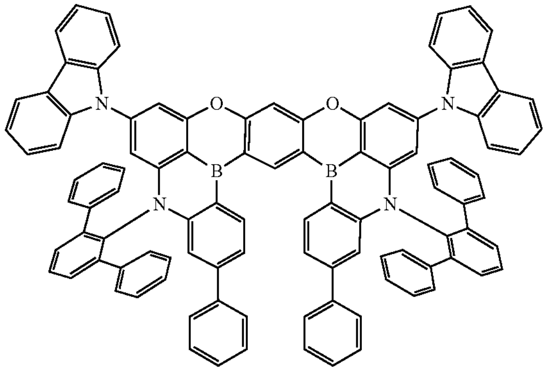
297
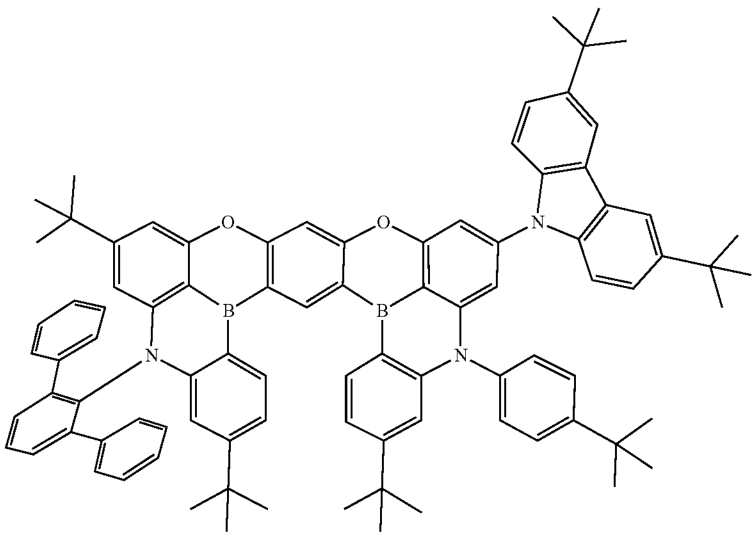
298
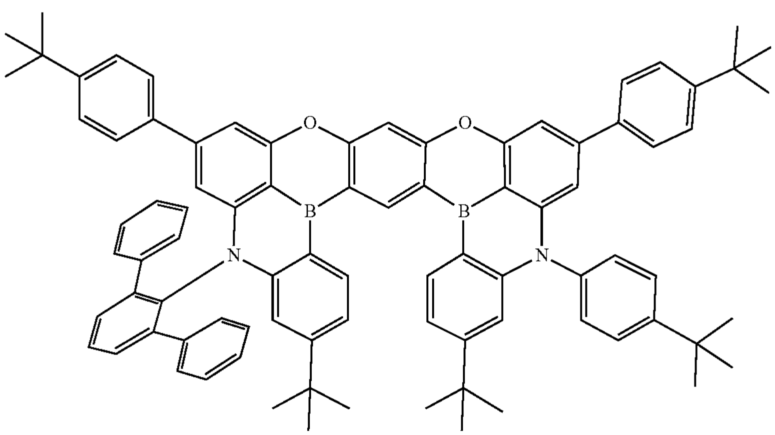
299
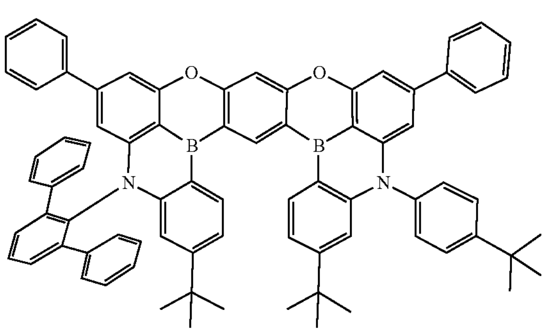
300
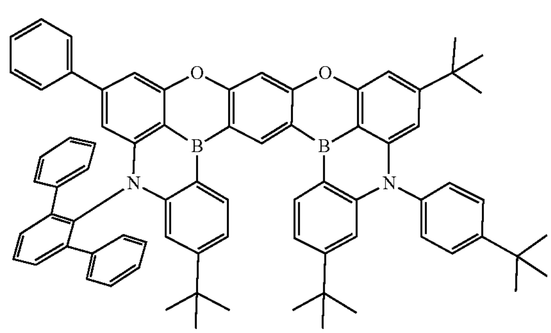

-continued
301
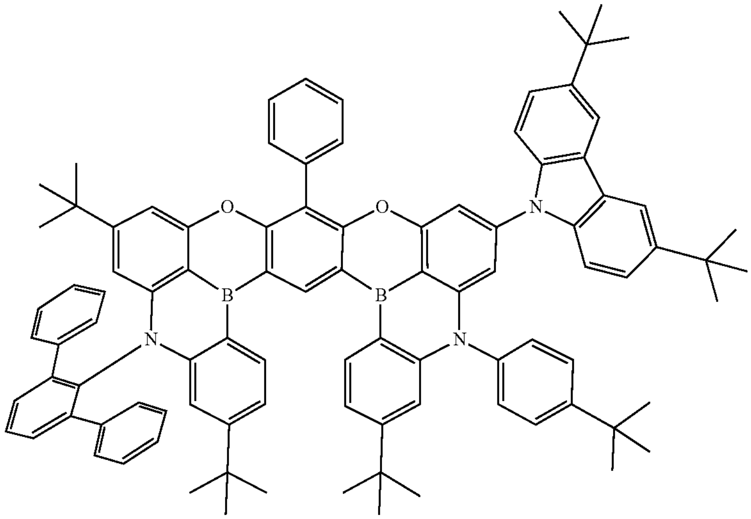
302
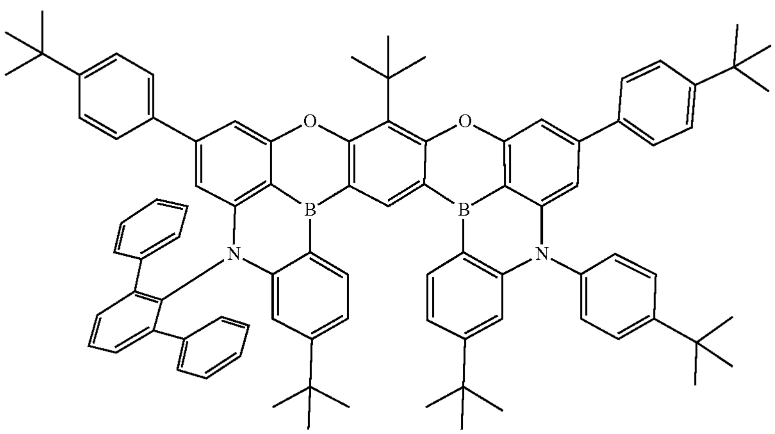
303
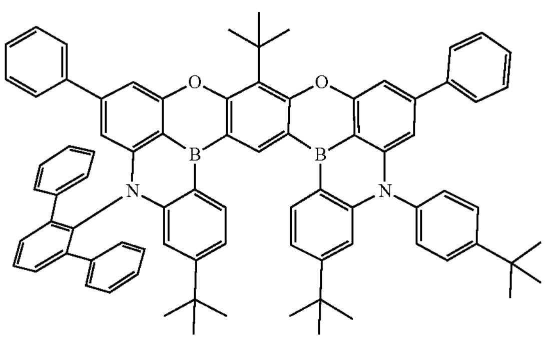
304
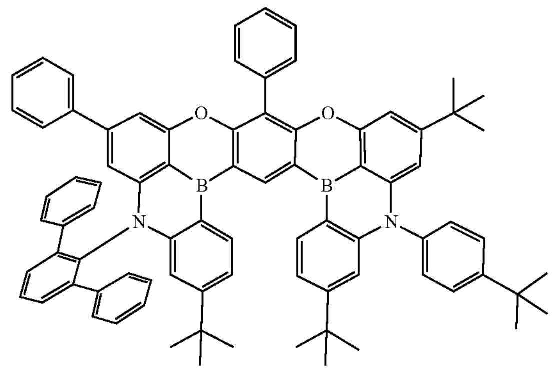
305
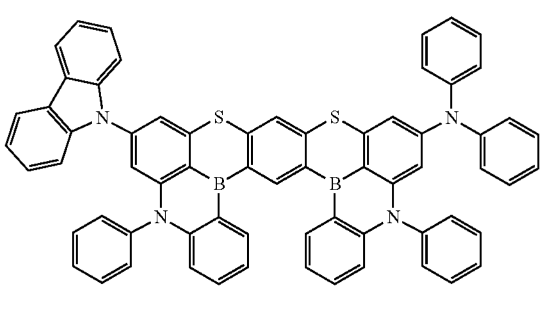
306
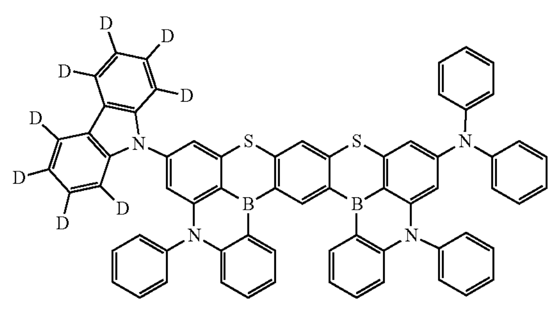

-continued
307
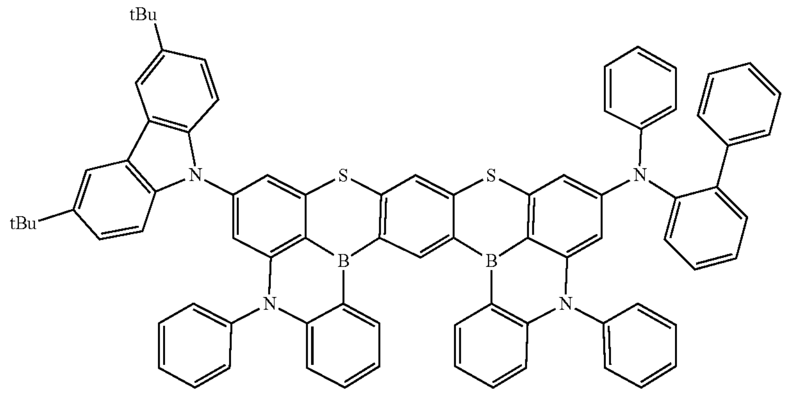
308
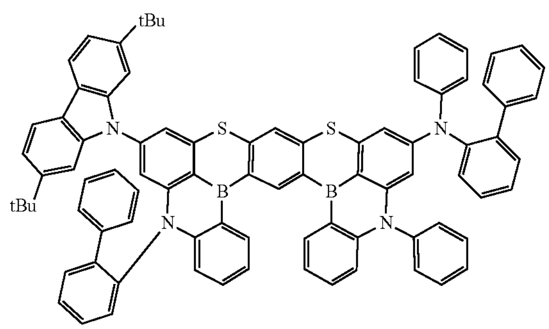
309
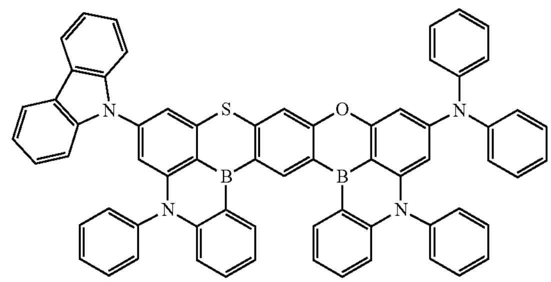
310
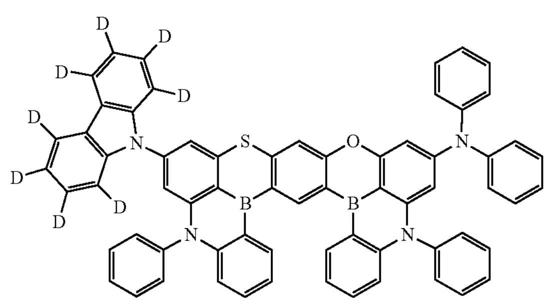
311
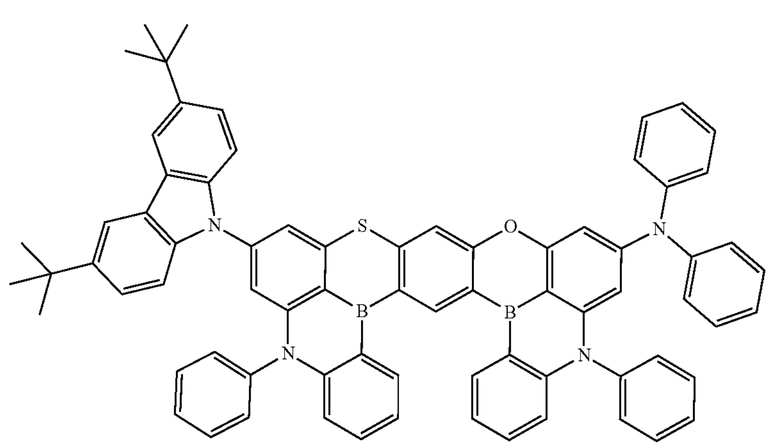

-continued
312
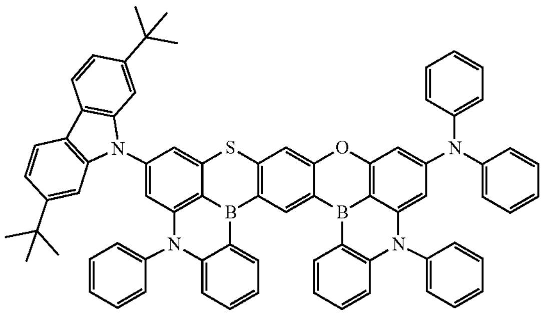
313
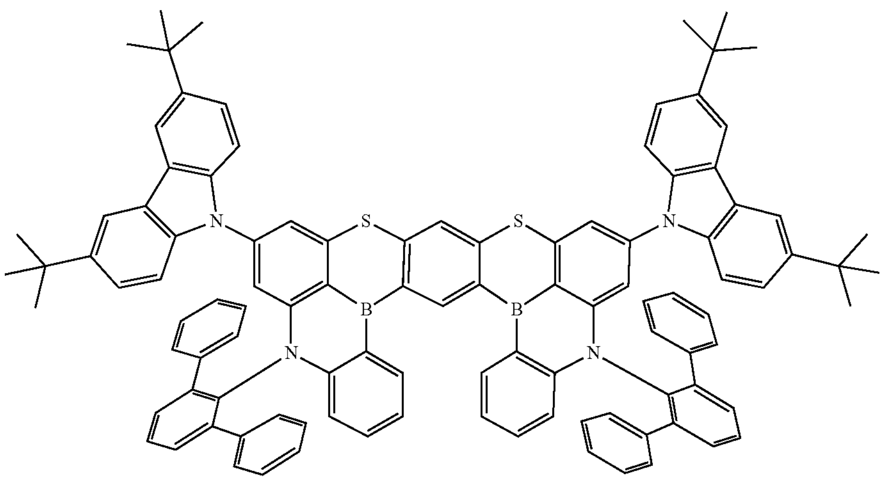
314
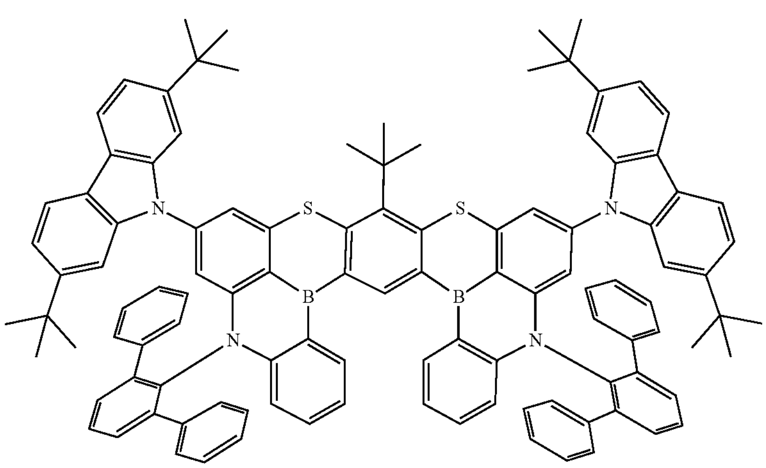

-continued
315
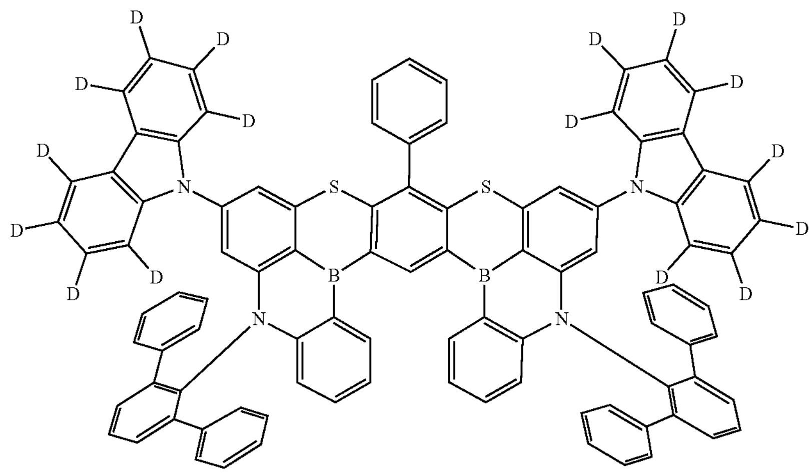
316
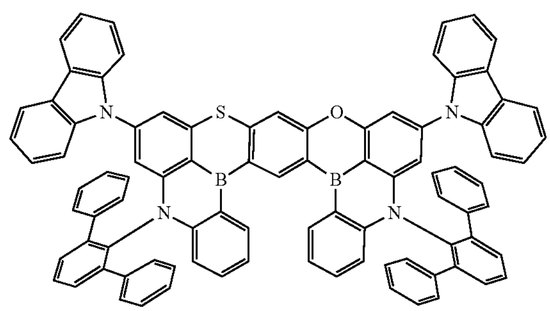
317
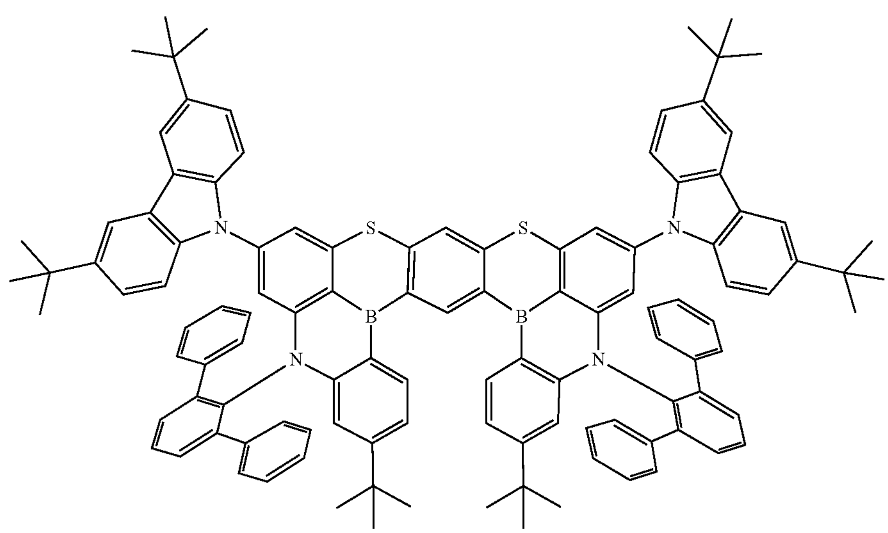

-continued
318
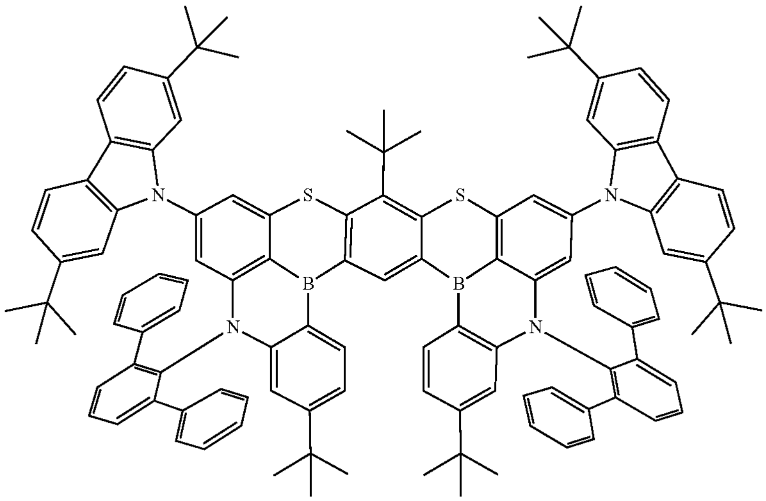
319
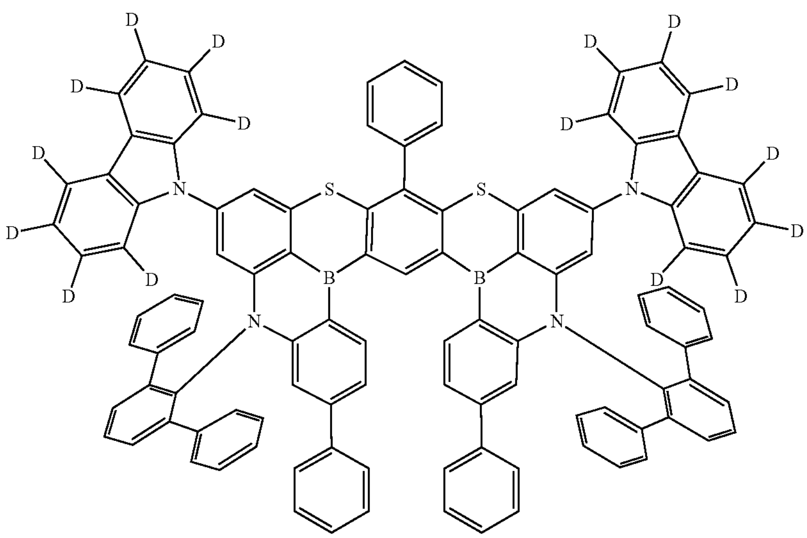
320
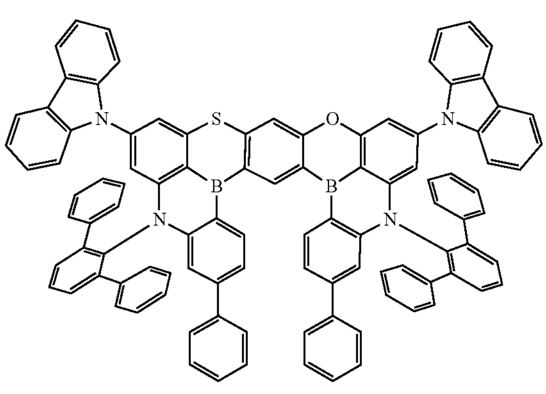

-continued
321
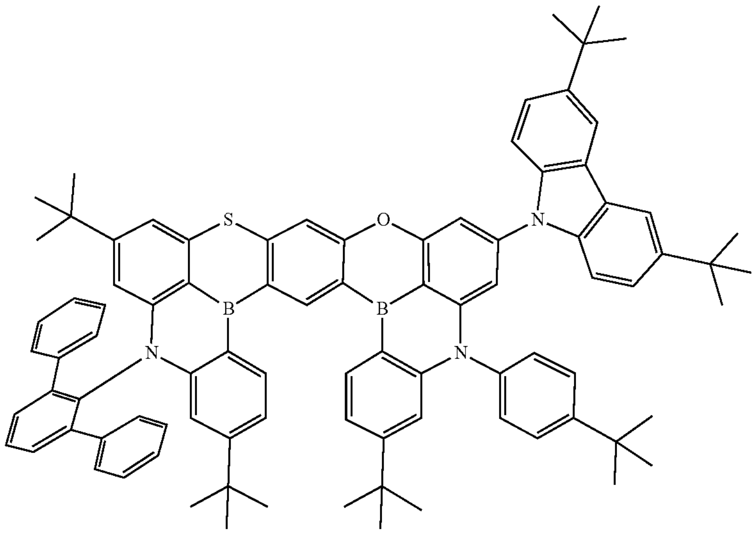
322
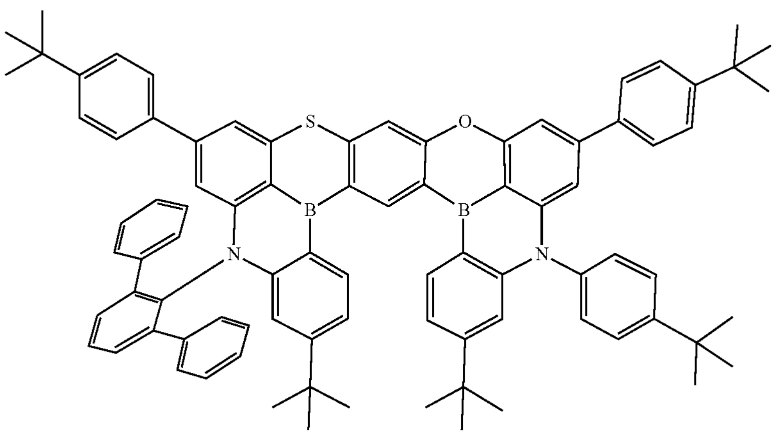
323
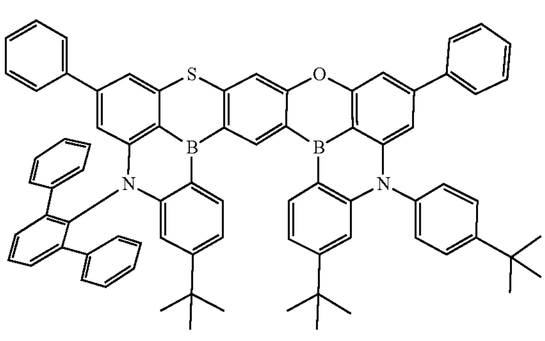
324
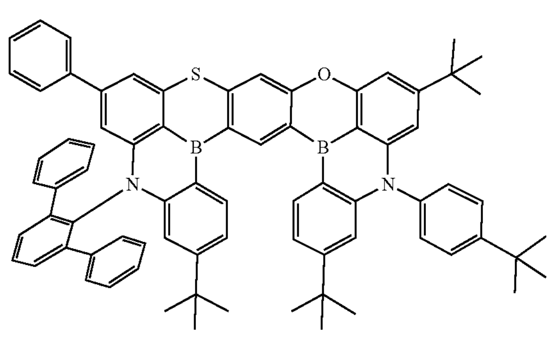

-continued
325
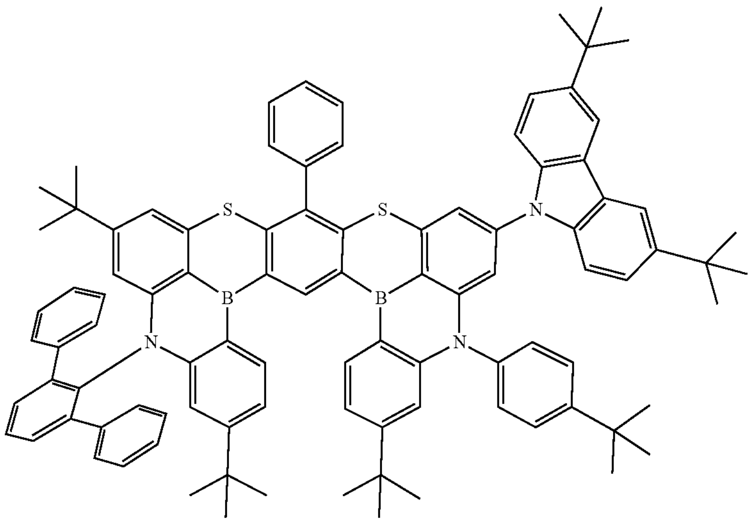
326
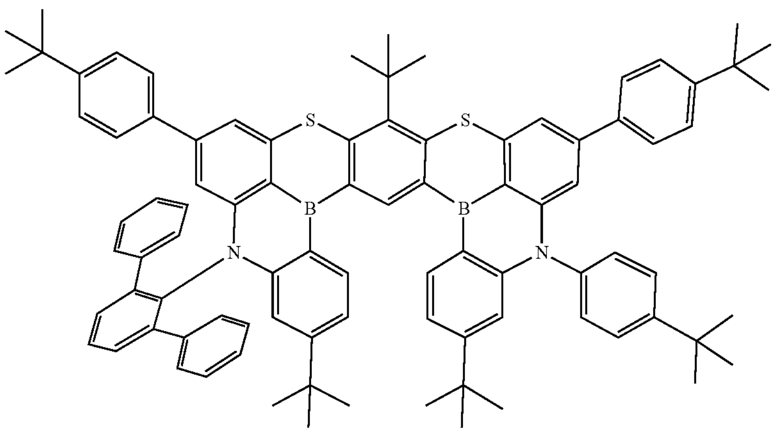
327
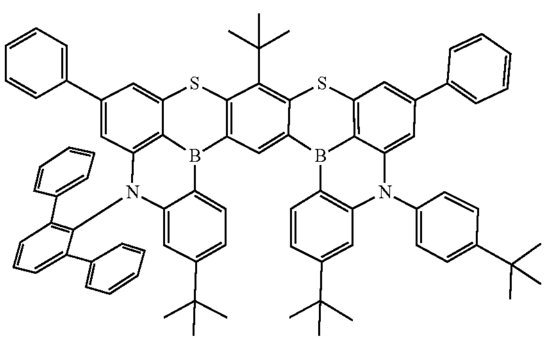
328
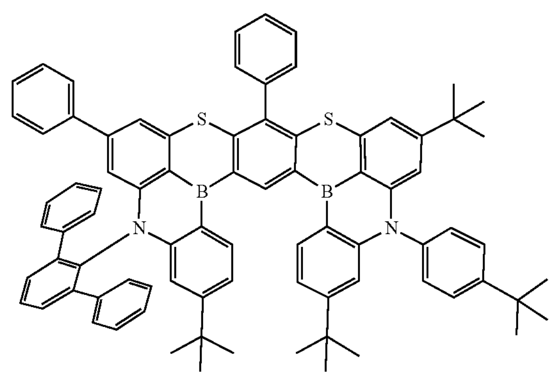
329
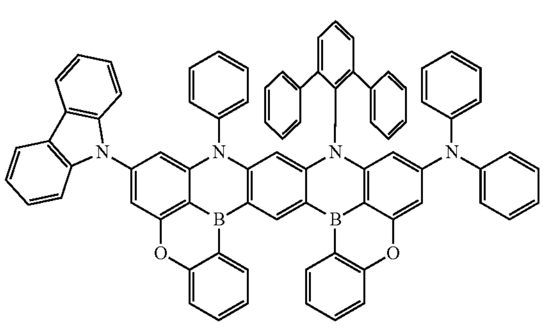
330
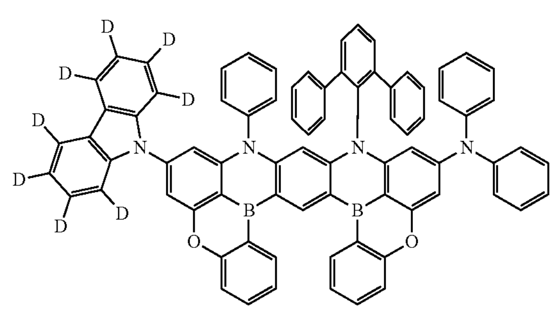

-continued
331
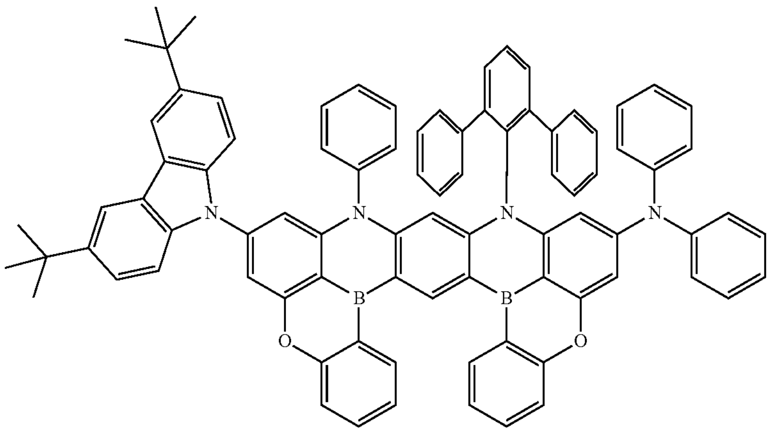
332
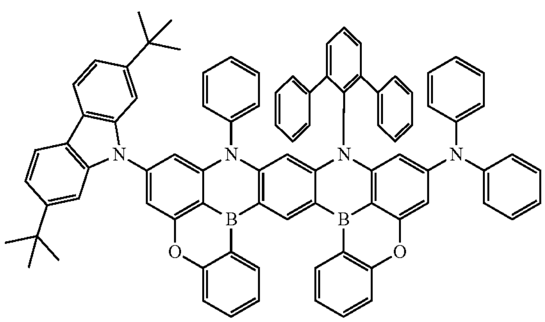
333
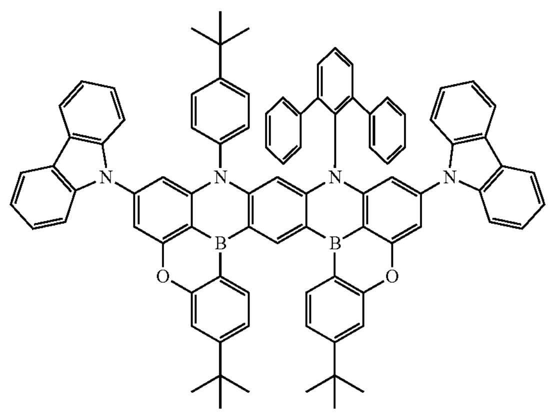
334
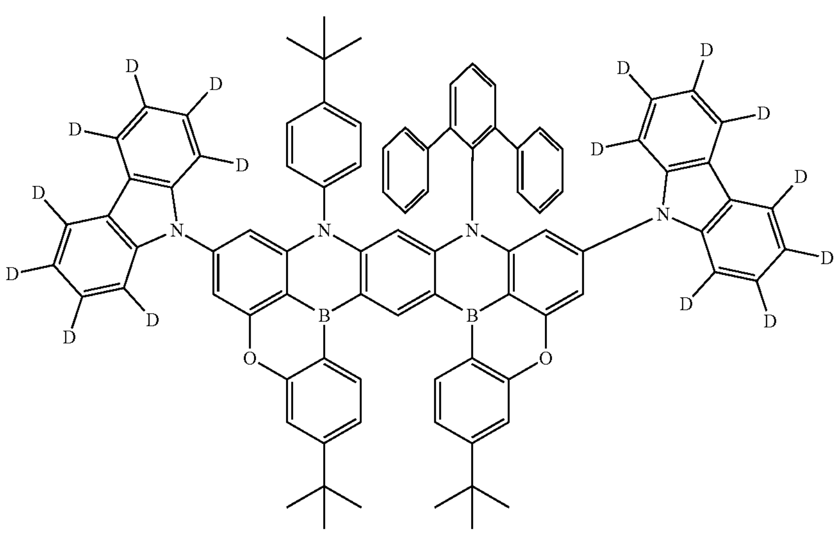

-continued
335
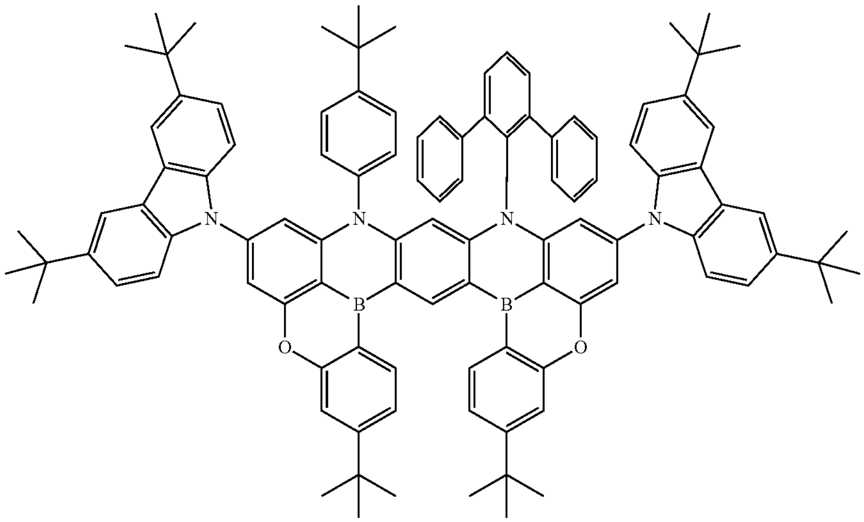
336
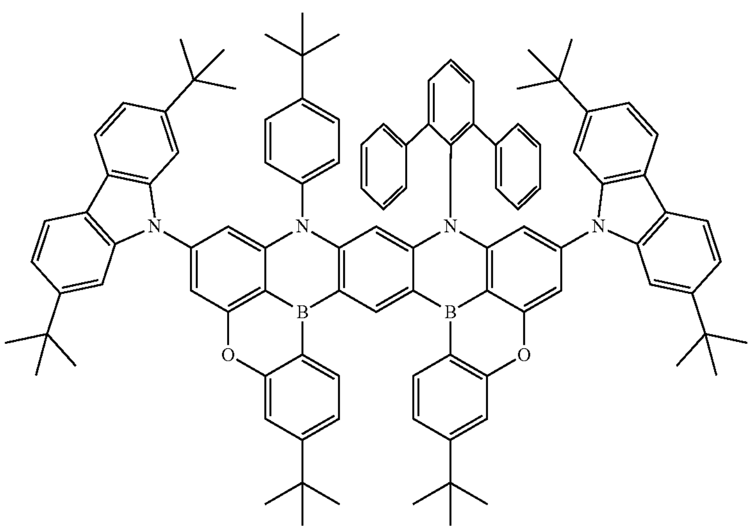
337
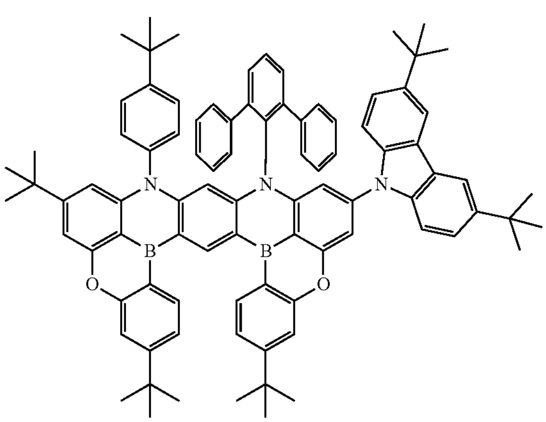
338
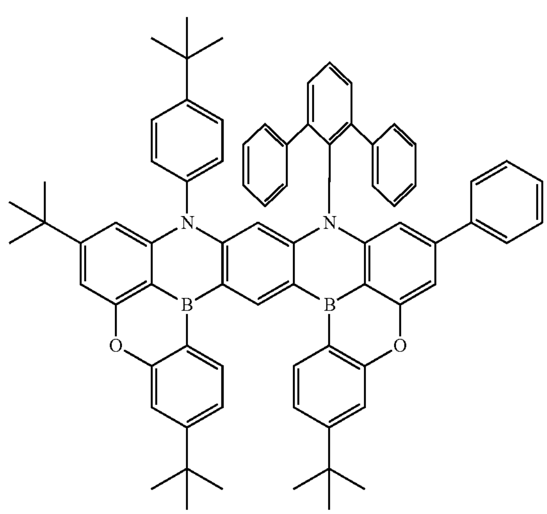

-continued
339
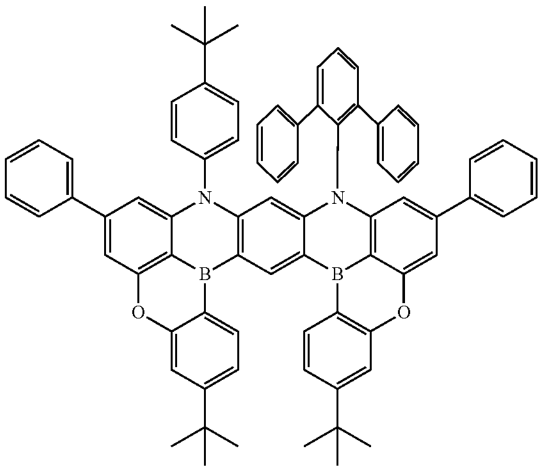
340
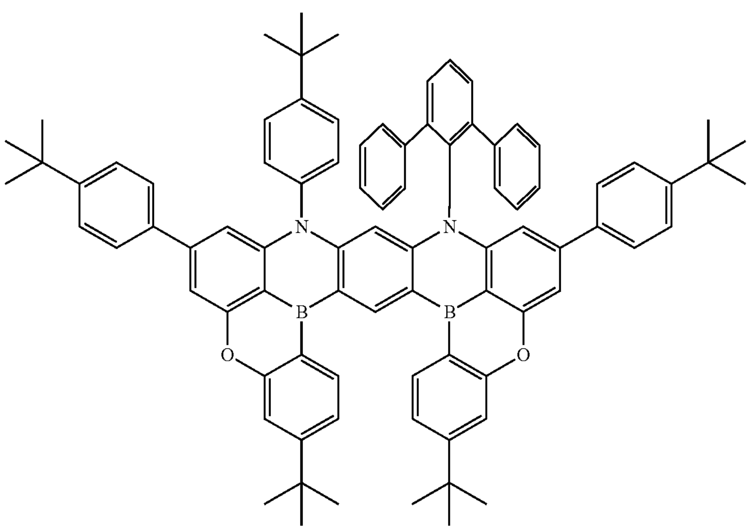
341
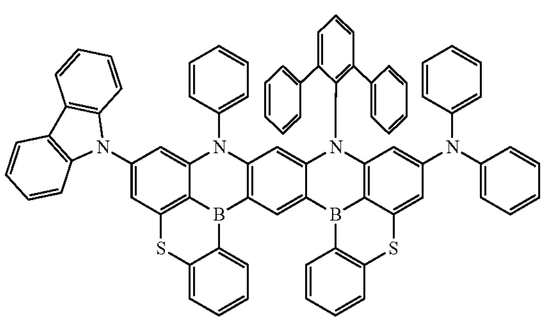
342
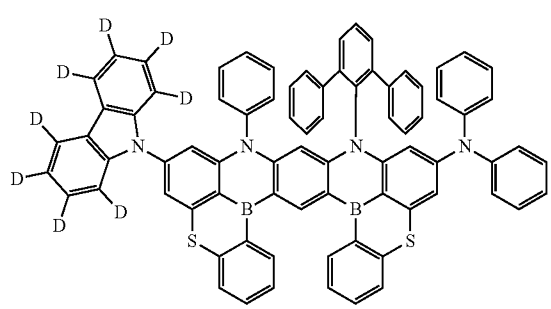

-continued
343
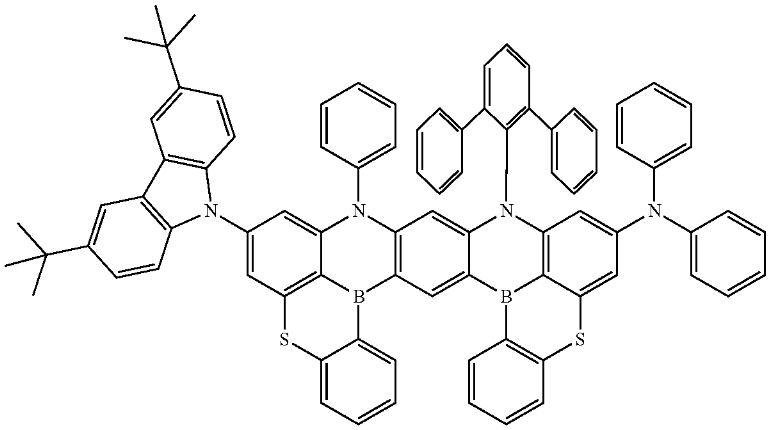
344
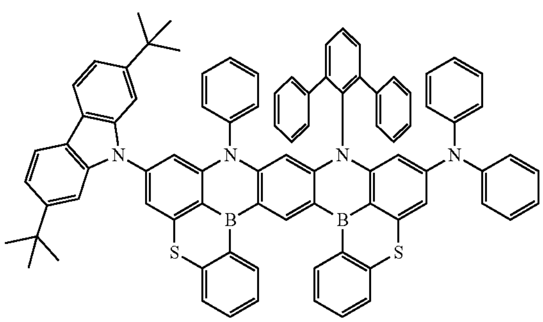
345
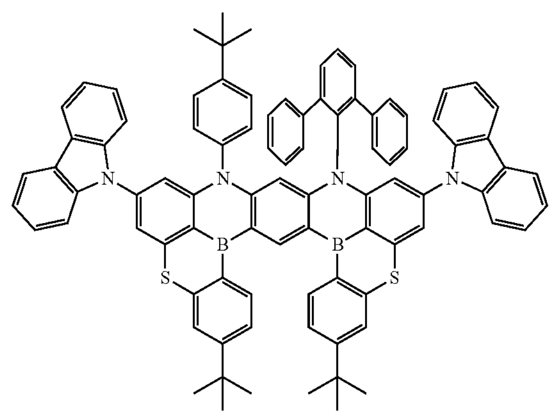
346
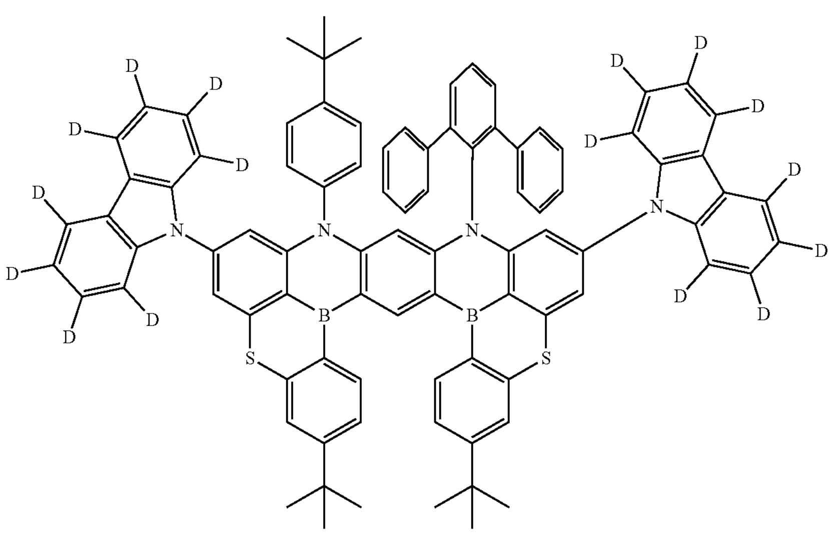

-continued
347
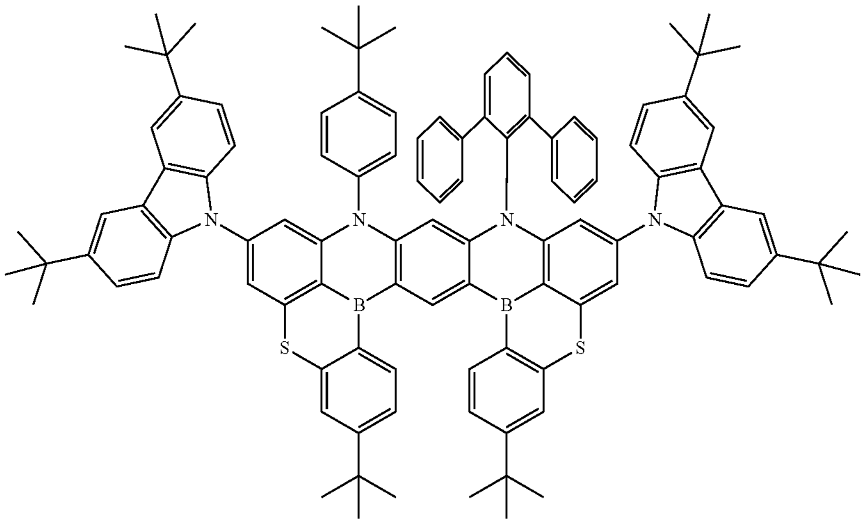
348
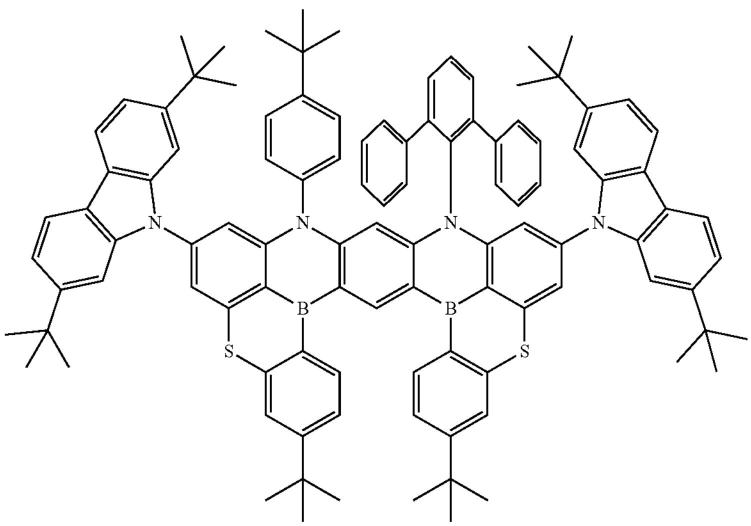
349
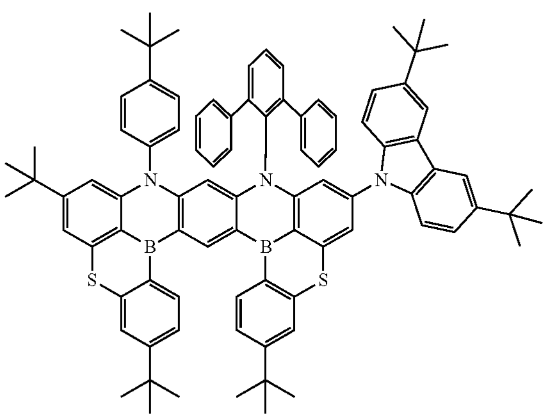
350
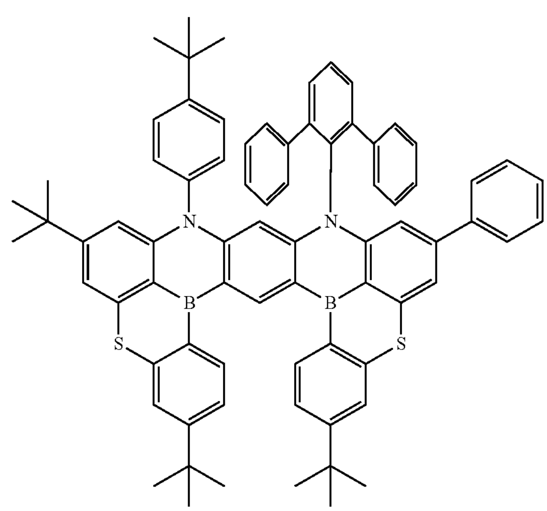

-continued

351

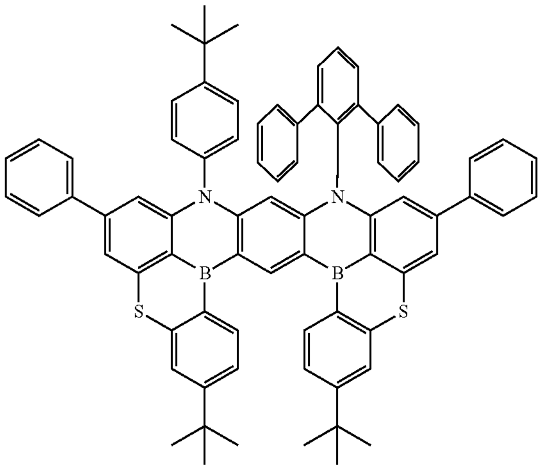

352

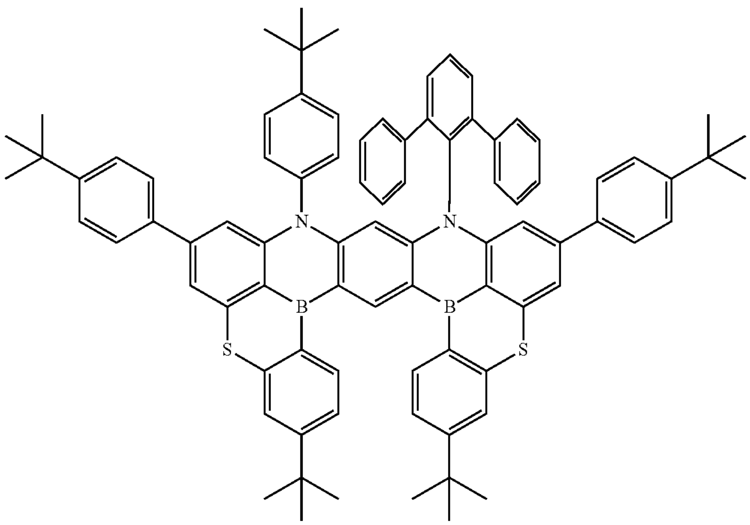

The condensed cyclic compound represented by Formula 1 or Formula A of an embodiment may be used as a fluorescence emitting material or a thermally activated delayed fluorescence (TADF) material. For example, the condensed cyclic compound of an embodiment may be used as a fluorescent dopant material or a TADF dopant material that emits blue light. The condensed cyclic compound of an embodiment may be a luminescent material having a luminescence center wavelength ($A_{max}$) in a wavelength region of about 490 nm or less. For example, the condensed cyclic compound represented by Formula 1 or Formula A of an embodiment may be a luminescent material having a luminescence center wavelength in a wavelength region of about 450 nm to about 470 nm. In one or more embodiments, the condensed cyclic compound of an embodiment may be a blue thermally activated delayed fluorescent dopant. However, embodiments of the present disclosure are not limited thereto.

In each light emitting device ED of embodiments illustrated in FIGS. 3 to 6, the emission layer EML may include a host and a dopant, and the emission layer EML may include, as the dopant, the condensed cyclic compound of an embodiment as described above.

The condensed cyclic compound represented by Formula 1 or Formula A of an embodiment may include a di-boron-based condensed cyclic core, and may protect a boron atom (B) by including at least one bulky substituent. In addition, the condensed cyclic compound of an embodiment may include at least one bulky substituent to suppress or reduce energy transfer between heterogeneous molecules, thereby exhibiting high material stability. Therefore, the light emitting device ED of an embodiment including the condensed cyclic compound of an embodiment in the emission layer EML may exhibit improved service life characteristics. In addition, the light emitting device ED of an embodiment including the condensed cyclic compound represented by Formula 1 or Formula A of an embodiment in the emission layer EML may emit delayed fluorescence. The light emitting device ED of an embodiment may emit TADF, and the light emitting device ED may exhibit high efficiency characteristics.

The light emitting device ED of an embodiment may further include emission layer materials below in addition to the condensed cyclic compound of an embodiment as described above. In the light emitting device ED of an embodiment, the emission layer EML may include anthracene derivatives, pyrene derivatives, fluoranthene derivatives, chrysene derivatives, dehydrobenzanthracene derivatives, and/or triphenylene derivatives. For example, the emission layer EML may include anthracene derivatives and/or pyrene derivatives.

In each light emitting device ED of embodiments illustrated in FIGS. 3 to 6, the emission layer EML may include a host and a dopant, and the emission layer EML may include a compound represented by Formula E-1 below. The compound represented by Formula E-1 below may be used as a fluorescence host material.

Formula E-1

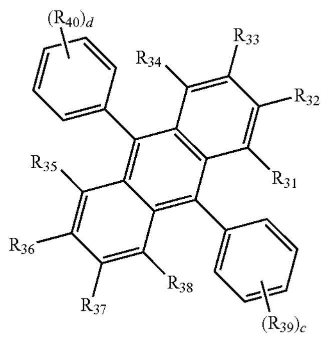

In Formula E-1, $R_{31}$ to $R_{40}$ may be each independently a hydrogen atom, a deuterium atom, a halogen atom, a substituted or unsubstituted silyl group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In one or more embodiments, $R_{31}$ to $R_{40}$ may be bonded to an adjacent group to form a saturated hydrocarbon ring or an unsaturated hydrocarbon ring.

In Formula E-1, c and d may be each independently an integer of 0 to 5.

Formula E-1 may be represented by any one selected from among Compound E1 to Compound E19 below:

E1

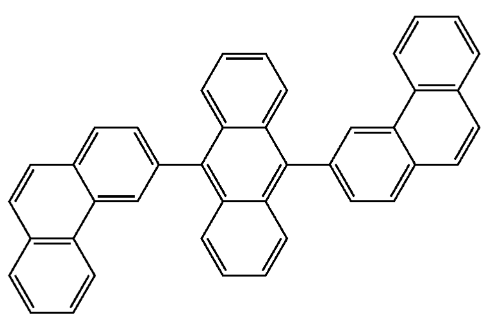

E2

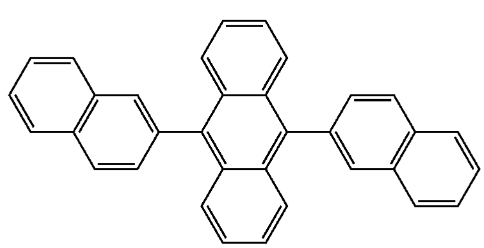

-continued

E3

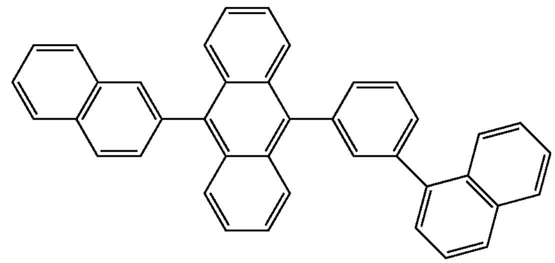

E4

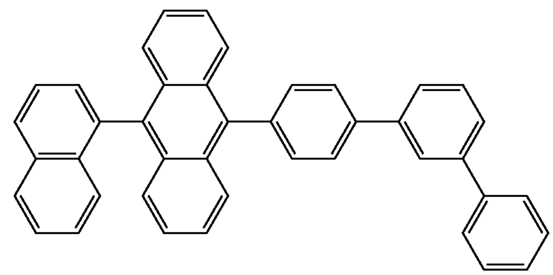

E5

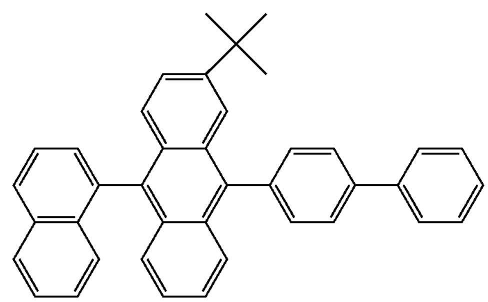

E6

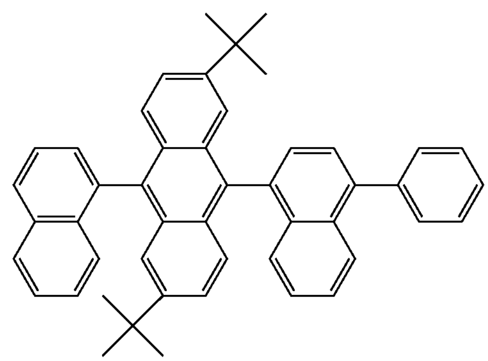

E7

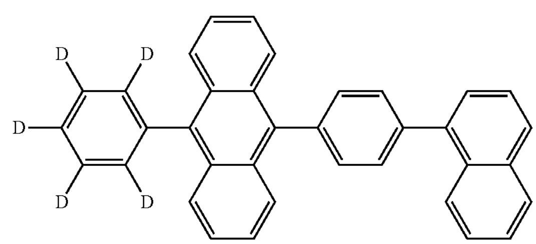

-continued
E8
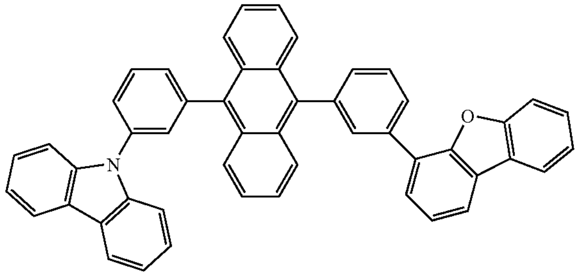
E9
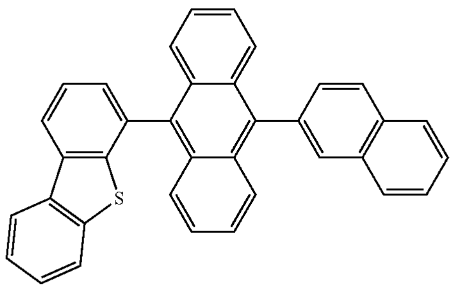
E10
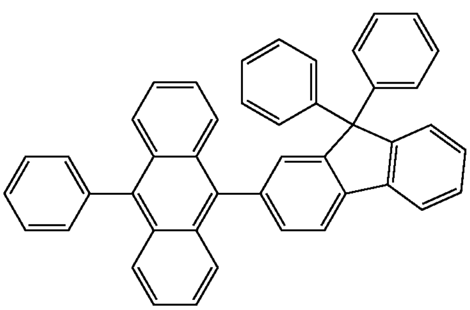
E11
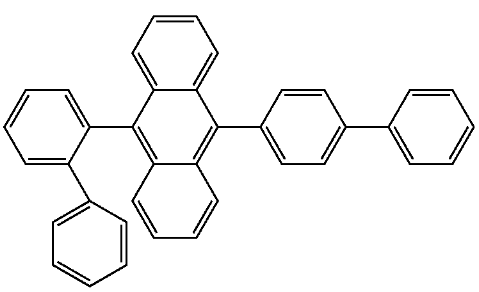
E12
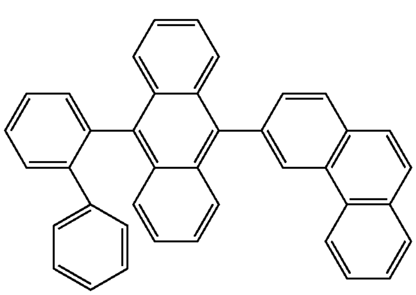
-continued
E13
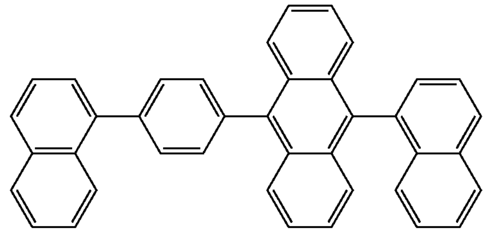
E14
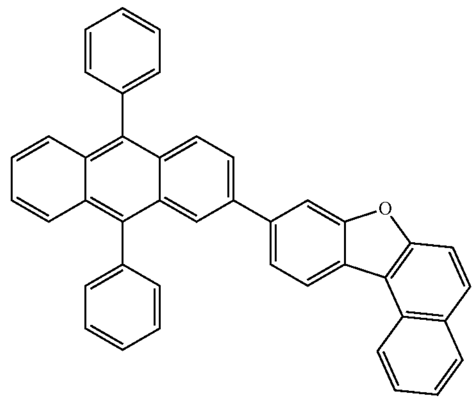
E15
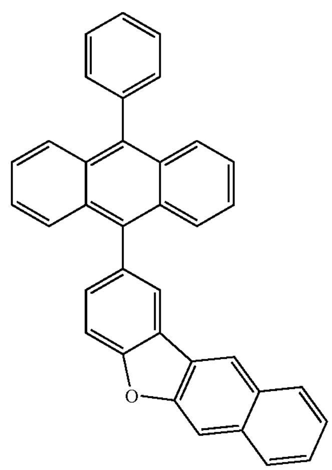
E16
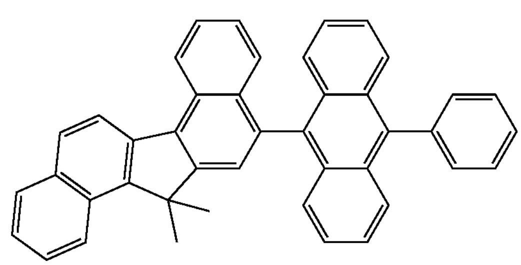

-continued

E17

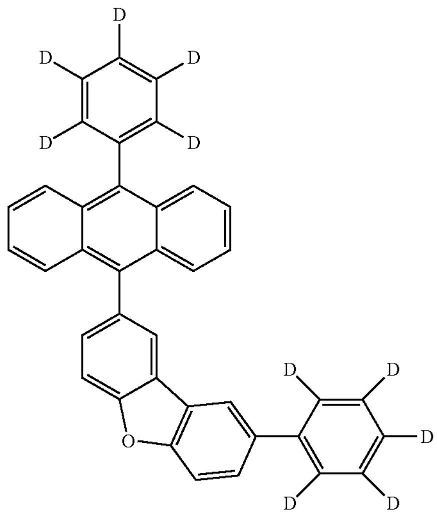

E18

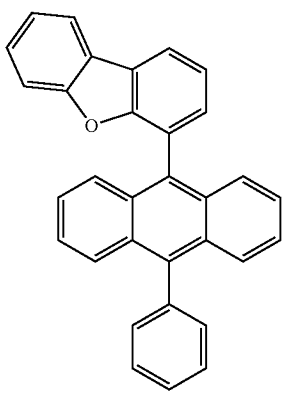

E19

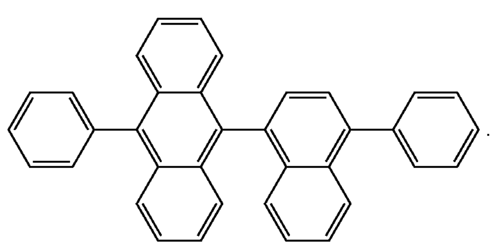

In an embodiment, the emission layer EML may include a compound represented by Formula E-2a or Formula E-2b below. The compound represented by Formula E-2a or Formula E-2b below may be used as a phosphorescence host material.

Formula E-2a

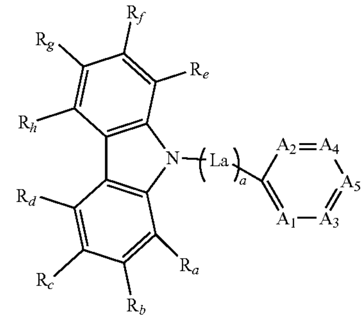

In Formula E-2a, and a may be an integer of 0 to 10, $L_a$ may be a direct linkage, a substituted or unsubstituted arylene group having 6 to 30 ring-forming carbon atoms, or a substituted or unsubstituted heteroarylene group having 2 to 30 ring-forming carbon atoms. In one or more embodiments, when a is an integer of 2 or greater, a plurality of $L_a$'s may be each independently a substituted or unsubstituted arylene group having 6 to 30 ring-forming carbon atoms, or a substituted or unsubstituted heteroarylene group having 2 to 30 ring-forming carbon atoms.

In addition, in Formula E-2a, $A_1$ to $A_5$ may be each independently N or $CR_i$. $R_a$ to $R_i$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. $R_a$ to $R_i$ may be bonded to an adjacent group to form a hydrocarbon ring or a heterocycle containing N, O, S, etc. as a ring-forming atom.

In one or more embodiments of Formula E-2a, two or three selected from among $A_1$ to $A_5$ may be N, and the rest may be $CR_i$.

Formula E-2b $$(\mathrm{Cbz1}) - (L_b)_b - (\mathrm{Cbz2})$$

In Formula E-2b, Cbz1 and Cbz2 may be each independently an unsubstituted carbazole group, or a carbazole group substituted with an aryl group having 6 to 30 ring-forming carbon atoms. $L_b$ is a direct linkage, a substituted or unsubstituted arylene group having 6 to 30 ring-forming carbon atoms, or a substituted or unsubstituted heteroarylene group having 2 to 30 ring-forming carbon atoms. In one or more embodiments, b is an integer of 0 to 10, and when b is an integer of 2 or more, a plurality of $L_b$'s may be each independently a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be represented by any one selected from among the compounds of Compound Group E-2 below. However, the compounds listed in Compound Group E-2 below are examples, the compound represented by Formula E-2a or Formula E-2b is not limited to those represented by Compound Group E-2 below.
Compound Group E-2
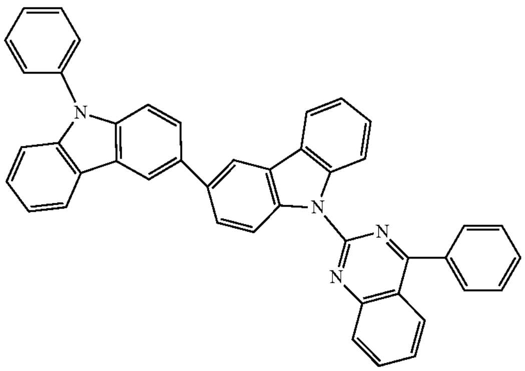
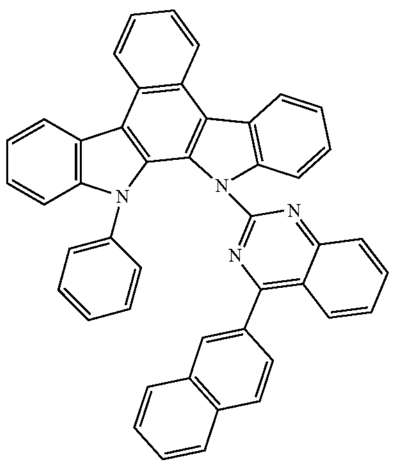
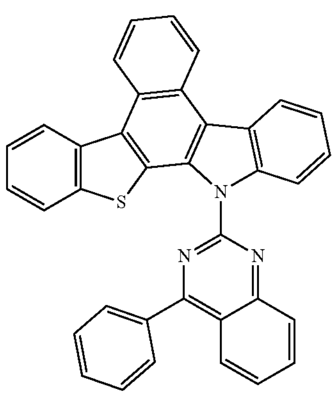
-continued
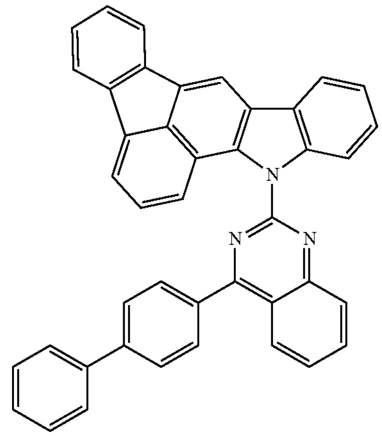
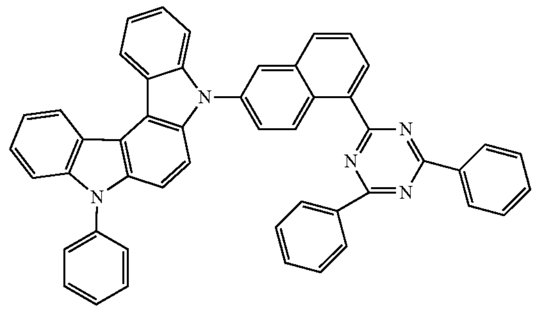
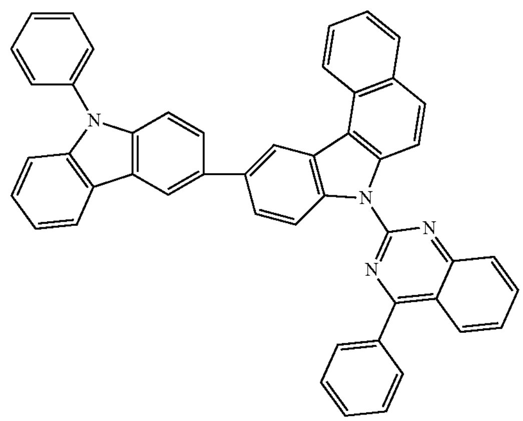
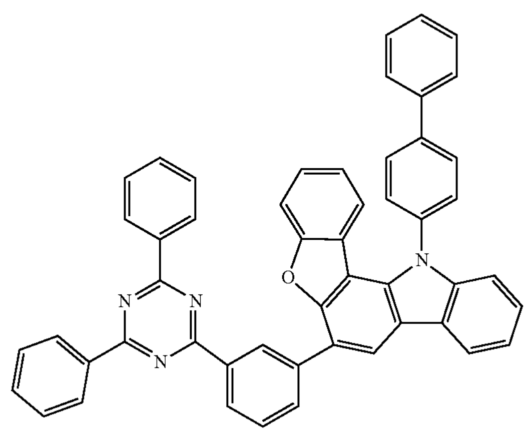

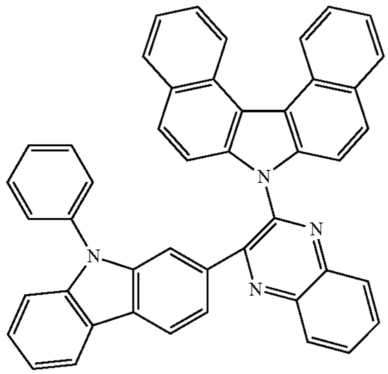
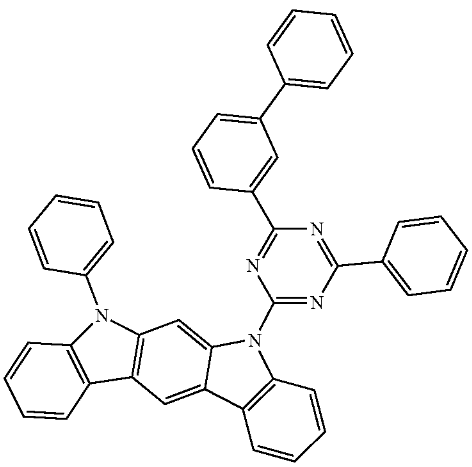
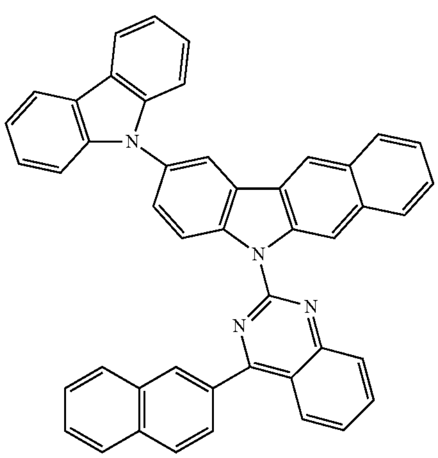
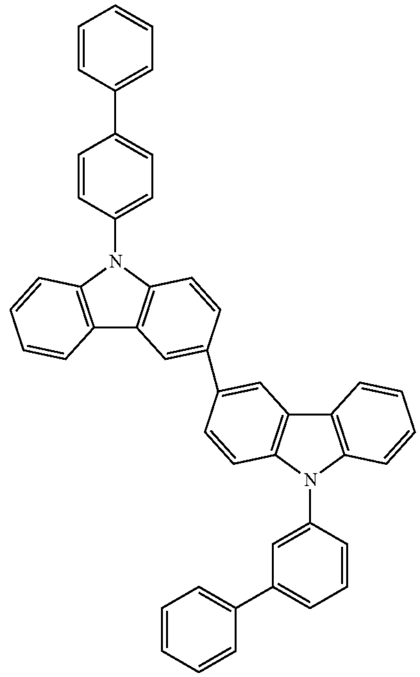
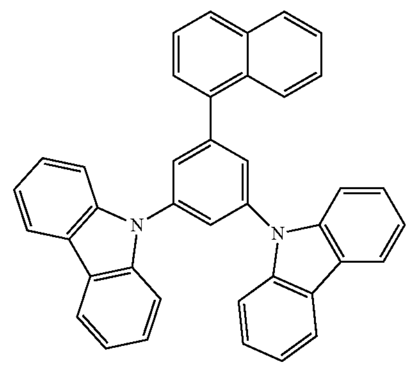
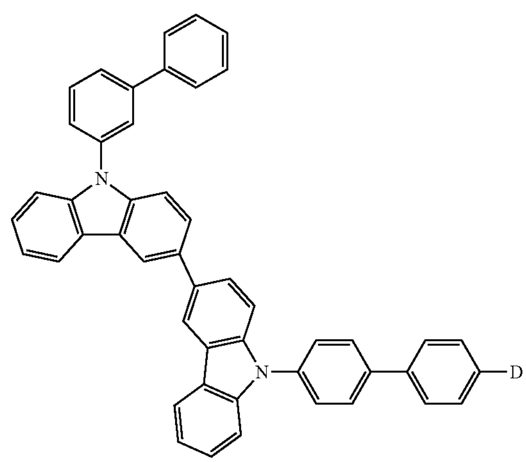
D

-continued
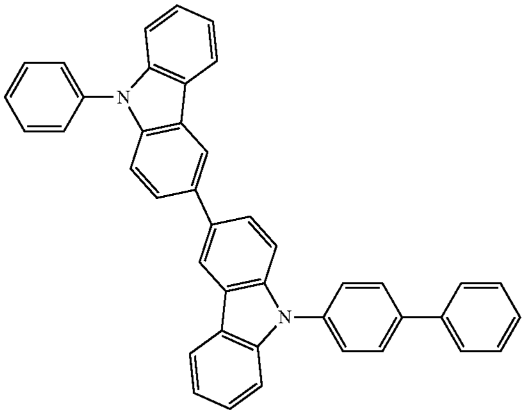
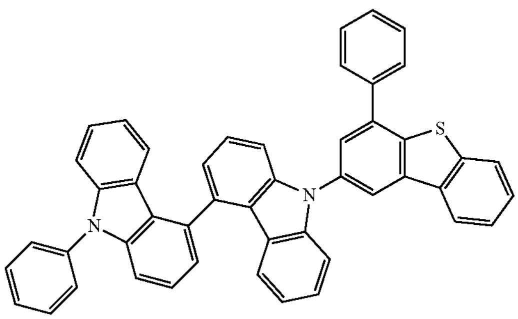
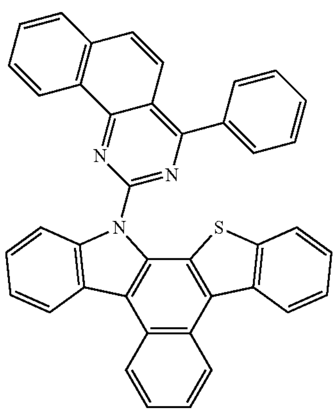
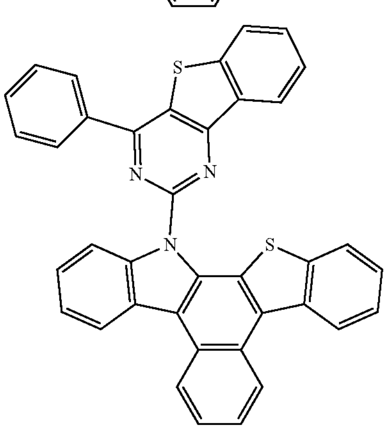
-continued
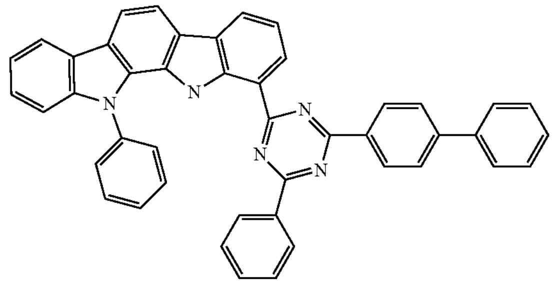
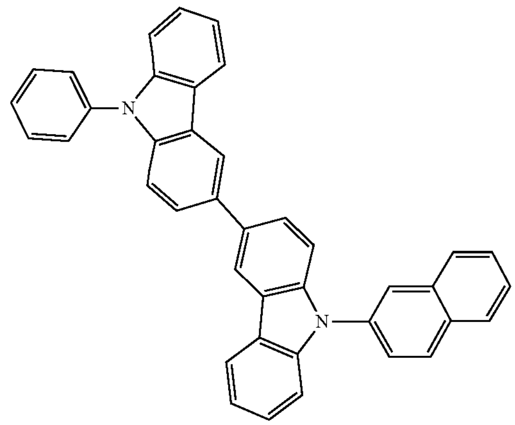
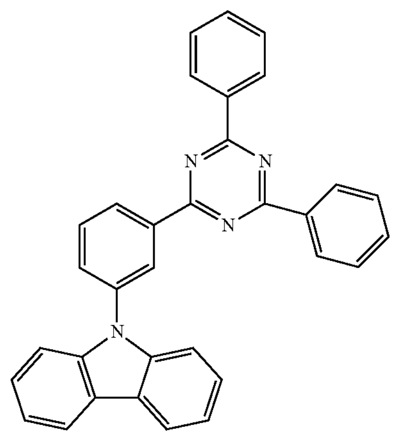
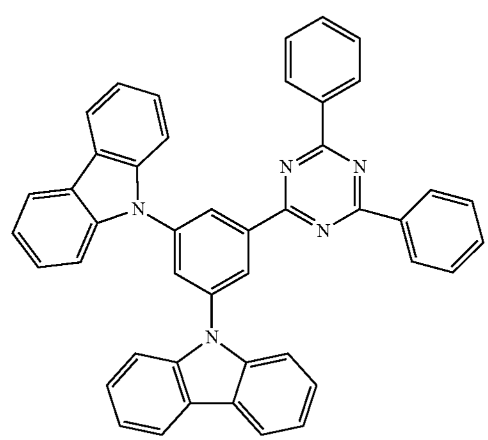

-continued

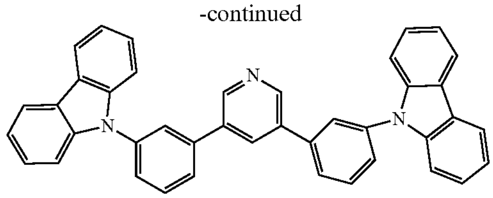

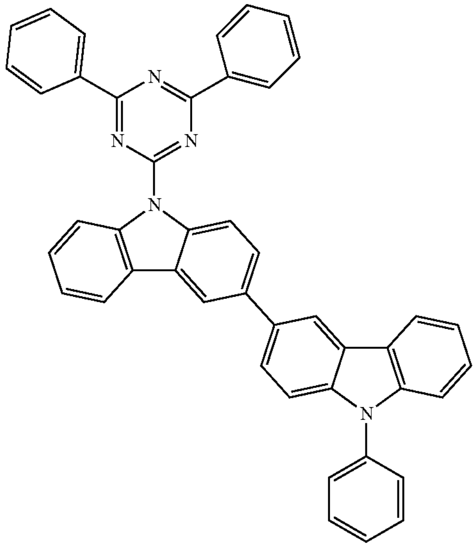

The emission layer EML may further include a general material used in the art as a host material. For example, the emission layer EML may include, as a host material, at least one of bis[2-(diphenylphosphino)phenyl] ether oxide (DPEPO), 4,4'-bis(N-carbazolyl)-1,1'-biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), and/or 1,3,5-tris(1-phenyl-1H-benzo[d]imidazole-2-yl)benzene (TPBi). However, embodiments of the present disclosure are not limited thereto, and for example, tris(8-hydroxyquinolino)aluminum ($Alq_3$), 9,10-di(naphthalene-2-yl)anthracene (ADN), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenylcyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), etc. may be used as a host material.

The emission layer EML may include a compound represented by Formula M-a and/or Formula M-b below. The compound represented by Formula M-a and/or Formula M-b below may be used as a phosphorescence dopant material.

Formula M-a

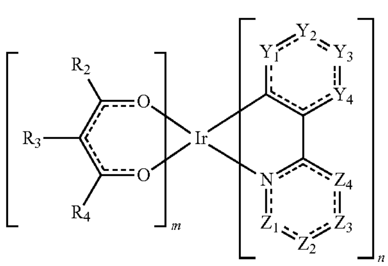

In Formula M-a above, $Y_1$ to $Y_4$ and $Z_1$ to $Z_4$ may be each independently $CR_1$ or N, $R_1$ to $R_4$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In Formula M-a, m is 0 or 1, and n is 2 or 3. In Formula M-a, when m is 0, n is 3, and when m is 1, n is 2.

The compound represented by Formula M-a may be used as a red phosphorescence dopant or a green phosphorescence dopant.

The compound represented by Formula M-a may be represented by any one selected from among Compound M-a1 to Compound M-a19 below. However, Compounds M-a1 to M-a19 below are examples, and the compound represented by Formula M-a is not limited to those represented by Compounds M-a1 to M-a19 below.

M-a1

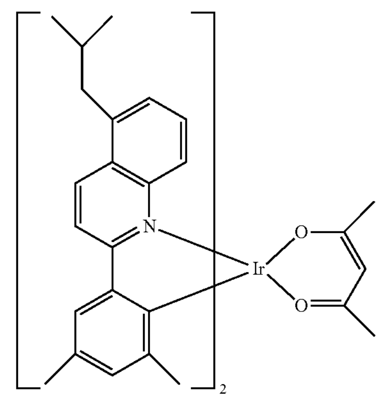

M-a2

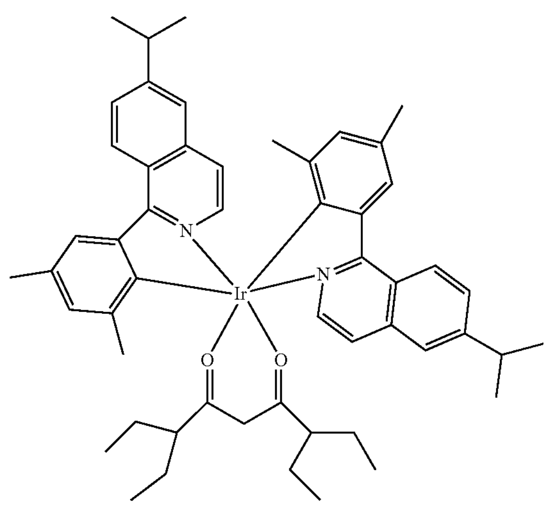

-continued
M-a3
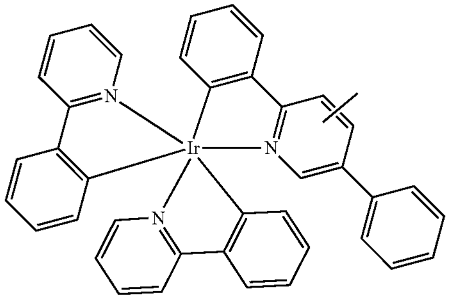
M-a4
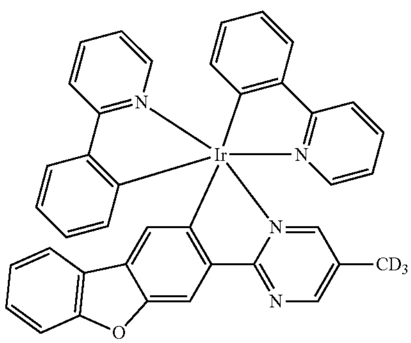
M-a5
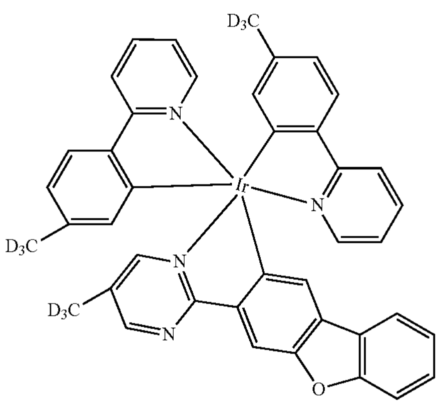
M-a6
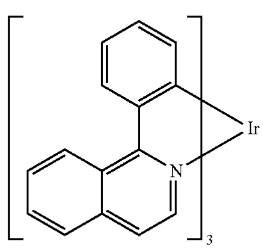
M-a7
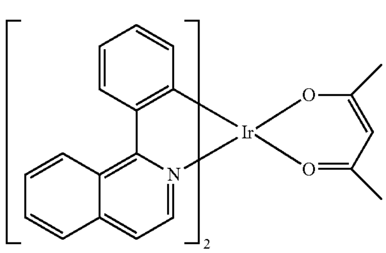
-continued
M-a8
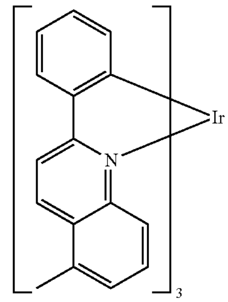
M-a9
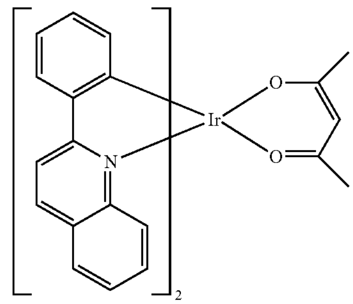
M-a10
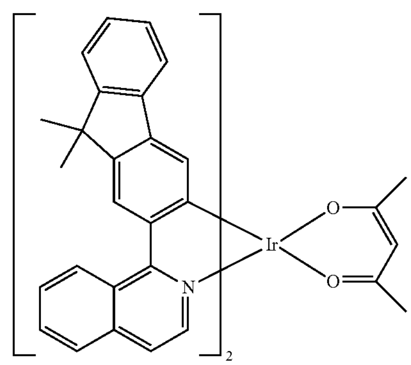
M-a11
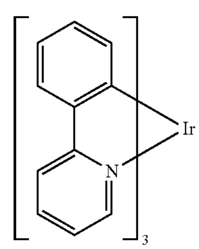
M-a12
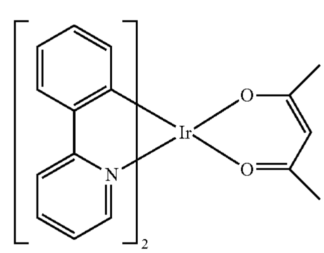

-continued

M-a13

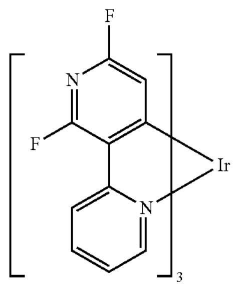

M-a14

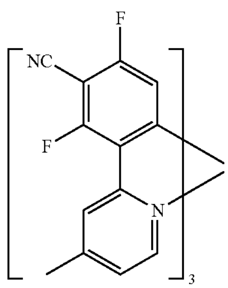

M-a15

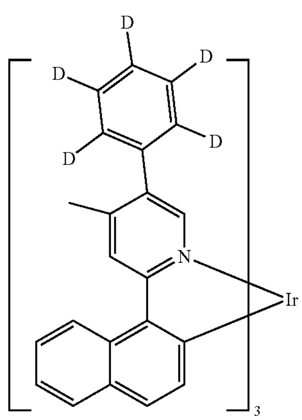

M-a16

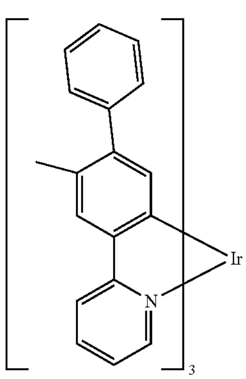

-continued

M-a17

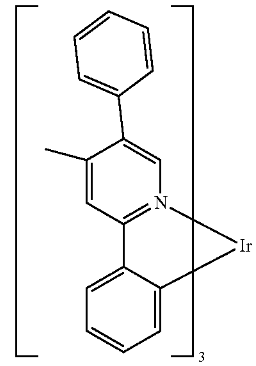

M-a18

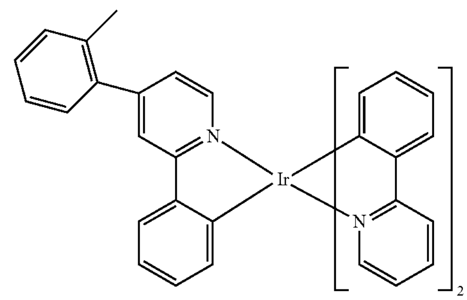

M-a19

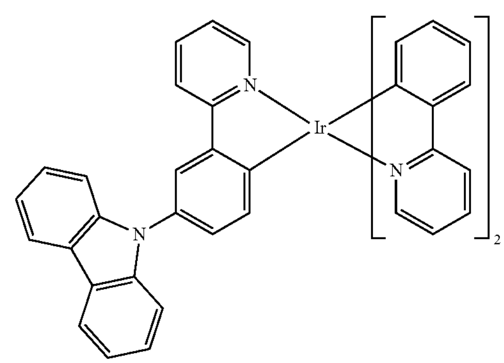

Compound M-a1 and Compound M-a2 may be used as a red dopant material, and Compound M-a3 to Compound M-a5 may be used as a green dopant material.

Formula M-b

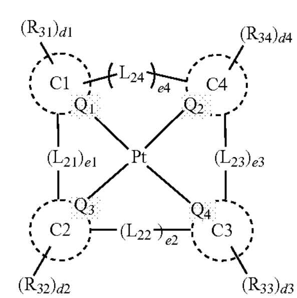

In Formula M-b, $Q_1$ to $Q_4$ are each independently C or N, and $C_1$ to $C_4$ are each independently a substituted or unsubstituted hydrocarbon ring having 5 to 30 ring-forming carbon atoms, or a substituted or unsubstituted heterocycle having 2 to 30 ring-forming carbon atoms. $L_{21}$ to $L_{24}$ are each independently a direct linkage,

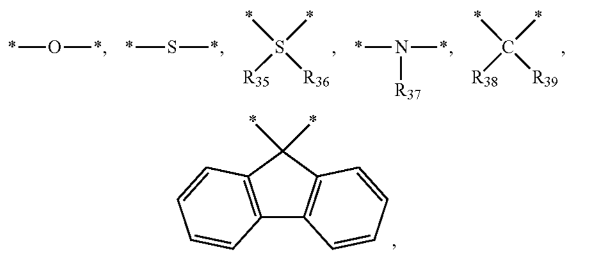

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and e1 to e4 are each independently 0 or 1. $R_{31}$ to $R_{39}$ are each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, and d1 to d4 are each independently an integer of 0 to 4.

The compound represented by Formula M-b may be used as a blue phosphorescence dopant or a green phosphorescence dopant.

The compound represented by Formula M-b may be represented by any one selected from among the compounds below. However, the compounds below are examples, and the compound represented by Formula M-b is not limited to those represented by the compounds below.

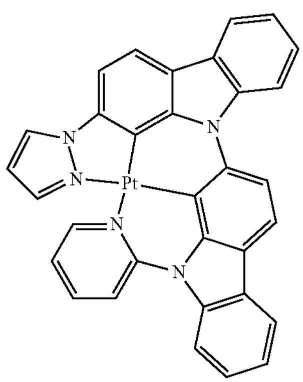

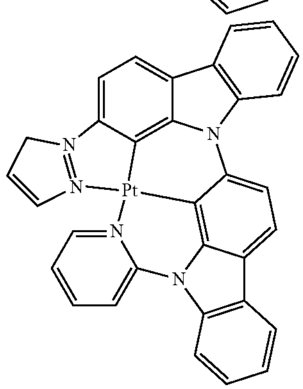

-continued

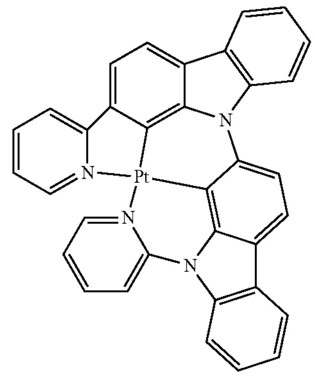

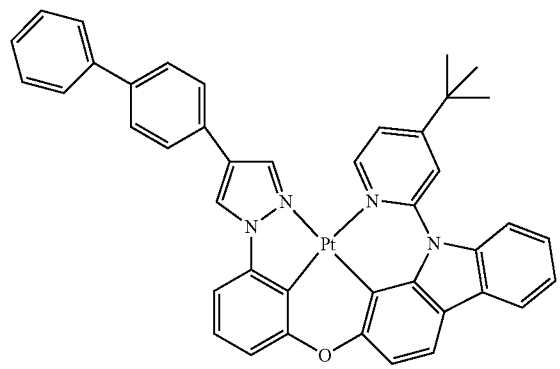

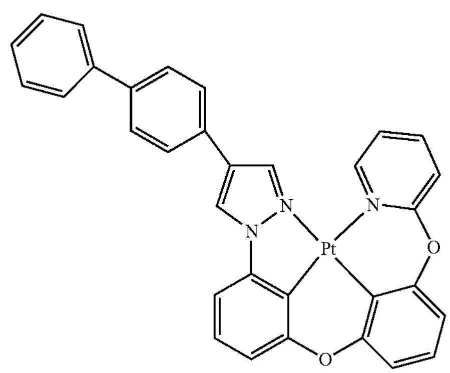

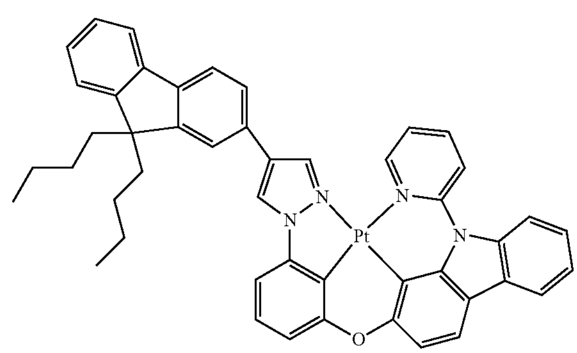

-continued

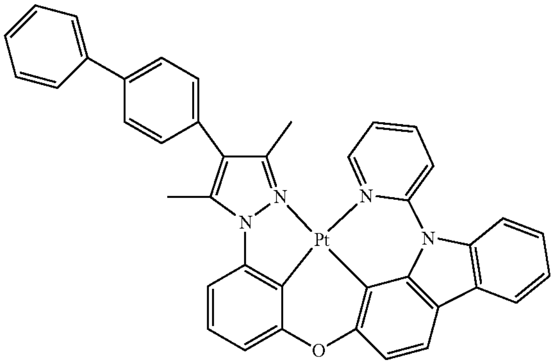

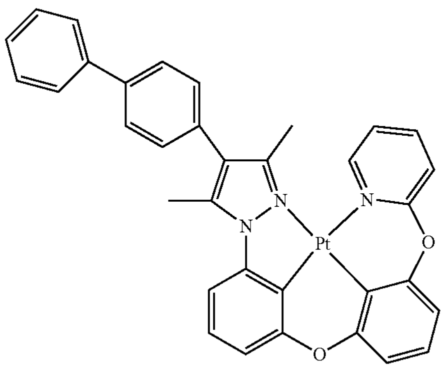

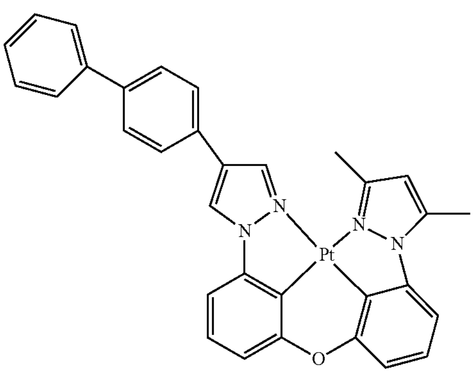

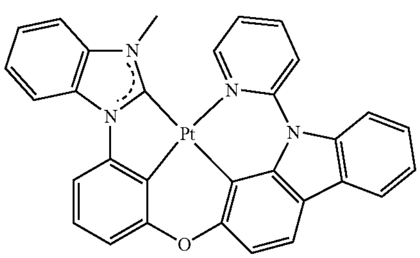

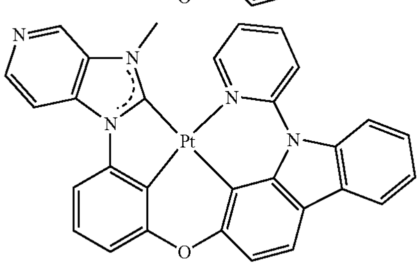

-continued

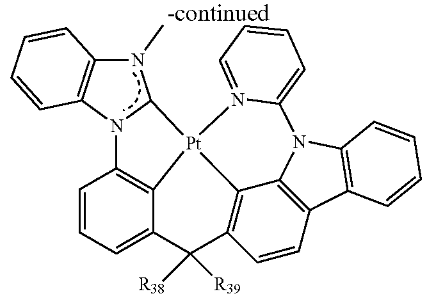

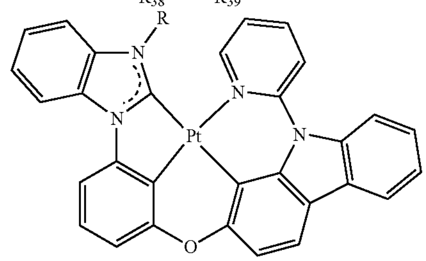

In the compounds directly above, R, $R_{38}$, and $R_{39}$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The emission layer EML may include a compound represented by any one selected from among Formula F-a to Formula F-c below. The compound represented by Formula F-a or Formula F-c below may be used as a fluorescence dopant material.

Formula F-a

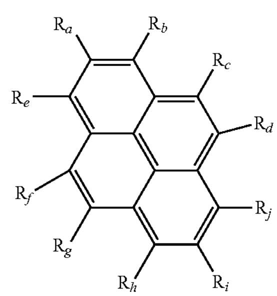

In Formula F-a, two selected from among $R_a$ to $R_j$ may be each independently substituted with *—$NAr_1Ar_2$. The others, which are not substituted with *—$NAr_1Ar_2$, among $R_a$ to $R_j$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In *—$NAr_1Ar_2$, $Ar_1$ and $Ar_2$ may be each independently a substituted or unsubstituted aryl group having 6 to 30 ring-forming carbon atoms, or a substituted or unsubstituted heteroaryl group having 2 to 30 ring-forming carbon atoms. For example, at least one of $Ar_1$ or $Ar_2$ may be a heteroaryl group containing O or S as a ring-forming atom.

Formula F-b

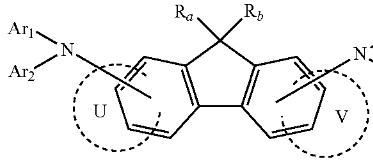

In Formula F-b, $R_a$ and $R_b$ may be each independently a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In Formula F-b, U and V may be each independently a substituted or unsubstituted hydrocarbon ring having 5 to 30 ring-forming carbon atoms, or a substituted or unsubstituted heterocycle having 2 to 30 ring-forming carbon atoms.

In Formula F-b, the number of rings represented by U and V may be each independently 0 or 1. For example, in Formula F-b, when the number of U or V is 1, it means that one ring forms a condensed ring at a part described as U or V, and when the number of U or V is 0, a ring described as U or V is not present. In one or more embodiments, when the number of U is 0 and the number of V is 1, or when the number of U is 1 and the number of V is 0, the condensed ring having a fluorene core of Formula F-b may be a four-ring cyclic compound. In addition, when each number of U and V is 0, the condensed ring of Formula F-b may be a three-ring cyclic compound. In addition, when each number of U and V is 1, the condensed ring having a fluorene core of Formula F-b may be a five-ring cyclic compound.

Formula F-c

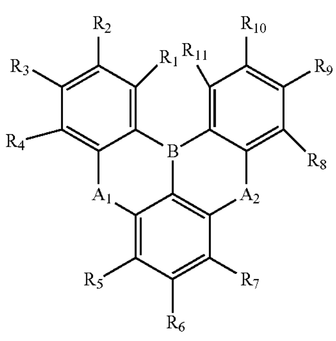

In Formula F-c, $A_1$ and $A_2$ may be each independently O, S, Se, or $NR_m$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $R_1$ to $R_{11}$ are each independently a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring.

In Formula F-c, $A_1$ and $A_2$ may be each independently bonded to substituents of an adjacent ring to form a condensed ring. For example, when $A_1$ and $A_2$ are each independently $NR_m$, $A_1$ may be bonded to $R_4$ or $R_5$ to form a ring. In addition, $A_2$ may be bonded to $R_7$ or $R_8$ to form a ring.

In an embodiment, the emission layer EML may include, as a generally available dopant material, styryl derivatives (e.g., 1,4-bis[2-(3-N-ethylcarbazoryl)vinyl]benzene (BCzVB), 4-(di-p-tolylamino)-4'-[(di-p-tolylamino)styryl]stilbene (DPAVB), and/or N-(4-((E)-2-(6-((E)-4-(diphenylamino)styryl)naphthalen-2-yl)vinyl)phenyl)-N-phenylbenzenamine (N-BDAVBi), 4,4'-bis[2-(4-(N,N-diphenylamino)phenyl)vinyl]biphenyl(DPAVBi), perylene and/or derivatives thereof (e.g., 2,5,8,11-tetra-t-butylperylene (TBP)), pyrene and/or derivatives thereof (e.g., 1,1-dipyrene, 1,4-dipyrenylbenzene, 1,4-bis(N,N-diphenylamino)pyrene), etc.

The emission layer EML may include any suitable phosphorescence dopant material used in the art. For example, a metal complex including iridium (Ir), platinum (Pt), osmium (Os), aurum (Au), titanium (Ti), zirconium (Zr), hafnium (Hf), europium (Eu), terbium (Tb), or thulium (Tm) may be used as a phosphorescence dopant. For example, iridium(III) bis(4,6-difluorophenylpyridinato-N,C2')picolinate (Flrpic), bis(2,4-difluorophenylpyridinato)-tetrakis(1-pyrazolyl)borate iridium(III) (Fir6), and/or platinum octaethyl porphyrin (PtOEP) may be used as a phosphorescence dopant. However, embodiments of the present disclosure are not limited thereto.

The emission layer EML may include a quantum dot material. The core of the quantum dot may be selected from among a Group II-VI compound, a Group III-VI compound, a Group compound, a Group III-V compound, a Group III-II-V compound, a Group IV-VI compound, a Group IV element, a Group IV compound, and a combination thereof.

A Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$ and/or $In_2Se_3$, a ternary compound such as $InGaS_3$ and/or $InGaSe_3$, or any combination thereof.

A Group compound may be selected from a ternary compound selected from the group consisting of AgInS, $AgInS_2$, CuInS, $CuInS_2$, $AgGaS_2$, $CuGaS_2$ $CuGaO_2$, $AgGaO_2$, $AgAlO_2$, and a mixture thereof, and/or a quaternary compound such as $AgInGaS_2$ and/or $CuInGaS_2$.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. In one or more embodiments, the Group III-V compound may further include a Group II metal. For example, InZnP, etc. may be selected as a Group III-II-V compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

In one or more embodiments, a binary compound, a ternary compound, and/or a quaternary compound may be present in particles in a uniform (e.g., substantially uniform) concentration distribution, or may be present in the same particle in a partially different concentration distribution. In addition, the quantum dot may have a core/shell structure in which one quantum dot surrounds another quantum dot. An interface between the core and the shell may have a concentration gradient in which the concentration of an element present in the shell becomes lower (e.g., decreases) along a direction toward the center of the core.

In some embodiments, a quantum dot may have the above-described core-shell structure including a core having nanocrystals and a shell surrounding the core. The shell of the quantum dot may serve as a protection layer to prevent or reduce chemical deformation of the core so as to maintain semiconductor properties, and/or a charging layer to impart electrophoresis properties to the quantum dot. The shell may be a single layer or a multilayer. An interface between the core and the shell may have a concentration gradient in which the concentration of an element present in the shell becomes lower (e.g., decreases) along a direction towards the center of the core. An example of the shell of the quantum dot may include a metal and/or non-metal oxide, a semiconductor compound, or a combination thereof.

For example, the metal and/or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO, and/or a ternary compound such as $MgAl_2O_4$, $CoFe_2O_4$, $NiFe_2O_4$, and/or $CoMn_2O_4$, but the present disclosure is not limited thereto.

Also, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments of the present disclosure are not limited thereto.

The quantum dot may have a full width of half maximum (FWHM) of a light emission wavelength spectrum of about 45 nm or less, about 40 nm or less, and, for example, about 30 nm or less, and color purity and/or color reproducibility may be improved in the above range. In addition, light emitted through such a quantum dot is emitted in all directions, and thus a wide viewing angle may be improved.

In addition, although the form of a quantum dot is not particularly limited as long as it is a form generally used in the art, for example, a quantum dot in the form of spherical, pyramidal, multi-arm, and/or cubic nanoparticles, nanotubes, nanowires, nanofibers, nanoparticles, etc. may be used.

The quantum dot may control the color of emitted light according to the particle size thereof. Accordingly, the quantum dot may have various suitable light emission colors such as blue, red, or green.

In each light emitting device ED of embodiments illustrated in FIGS. 3 to 6, the electron transport region ETR is provided on the emission layer EML. The electron transport region ETR may include at least one of the hole blocking layer HBL, the electron transport layer ETL, and/or the electron injection layer EIL, but embodiments of the present disclosure are not limited thereto.

The electron transport region ETR may have a single layer formed of a single material, a single layer formed of a plurality of different materials, or a multilayer structure including a plurality of layers formed of a plurality of different materials.

For example, the electron transport region ETR may have a single layer structure of the electron injection layer EIL or the electron transport layer ETL, and may have a single layer structure formed of an electron injection material and an electron transport material. In addition, the electron transport region ETR may have a single layer structure formed of a plurality of different materials, or may have a structure in which an electron transport layer ETL/electron injection layer EIL, a hole blocking layer HBL/electron transport layer ETL/electron injection layer EIL, an electron transport layer ETL/buffer layer/electron injection layer EIL are stacked in order from the emission layer EML, but embodiments of the present disclosure are not limited thereto. The thickness of the electron transport region ETR may be, for example, from about 1,000 Å to about 1,500 Å.

The electron transport region ETR may be formed by using various suitable methods such as a vacuum deposition method, a spin coating method, a cast method, a Langmuir-Blodgett (LB) method, an inkjet printing method, a laser printing method, a laser induced thermal imaging (LITI) method, etc.

The electron transport region ETR may include a compound represented by Formula ET-1 below:

Formula ET-1

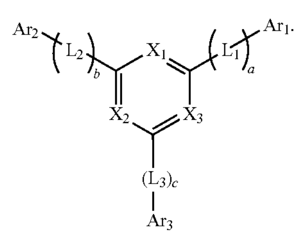

In Formula ET-1, at least one selected from among $X_1$ to $X_3$ is N, and the rest are $CR_a$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $Ar_1$ to $Ar_a$ may be each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may be each independently an integer of 0 to 10. In Formula ET-1, $L_1$ to $L_3$ may be each independently a direct linkage, a substituted or unsubstituted arylene group having 6 to 30 ring-forming carbon atoms, or a substituted or unsubstituted heteroarylene group having 2 to 30 ring-forming carbon atoms. In one or more embodiments, when a to c are an integer of 2 or greater, $L_1$ to $L_3$ may be each independently a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, embodiments of the present disclosure are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl) phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate ($Bebq_2$), 9,10-di(naphthalene-2-yl)anthracene (ADN), 1,3-bis[3,5-di(pyridin-3-yl)phenyl]benzene (BmPyPhB), diphenyl(4-(triphenylsilyl)phenyl)phosphine oxide (TSPO1), or a mixture thereof.

In addition, the electron transport regions ETR may include a metal halide such as LiF, NaCl, CsF, RbCl, RbI, CuI, and/or KI, a lanthanide metal such as Yb, and/or a co-deposited material of the metal halide and the lanthanide metal. For example, the electron transport region ETR may include KI:Yb, RbI:Yb, etc. as a co-deposited material. In one or more embodiments, the electron transport region ETR may be formed using a metal oxide such as $Li_2O$ and/or BaO, and/or 8-hydroxyl-lithium quinolate (Liq), etc., but embodiments of the present disclosure are not limited thereto. The electron transport region ETR may also be formed of a mixture material of an electron transport material and an insulating organometallic salt. The organometallic salt may be a material having an energy band gap of about 4 eV or more. For example, the organometallic salt may include, for example, metal acetates, metal benzoates, metal acetoacetates, metal acetylacetonates, and/or metal stearates.

The electron transport region ETR may further include at least one of 2,9-dimethyl-4,7-diphenyl-1,10-phenanthroline (BCP), and/or 4,7-diphenyl-1,10-phenanthroline (Bphen) in addition to the above-described materials, but embodiments of the present disclosure are not limited thereto.

The electron transport region ETR may include the above-described compounds of the hole transport region in at least one of the electron injection layer EIL, the electron transport layer ETL, and/or the hole blocking layer HBL.

When the electron transport region ETR includes the electron transport layer ETL, the electron transport layer ETL may have a thickness of about 100 Å to about 1,000 Å, for example, about 150 Å to about 500 Å. If the thickness of the electron transport layer ETL satisfies the above-described range, suitable or satisfactory electron transport characteristics may be obtained without a substantial increase in driving voltage. When the electron transport region ETR includes the electron injection layer EIL, the electron injection layer EIL may have a thickness of about 1 Å to about 100 Å, for example, about 3 Å to about 90 Å. If the thickness of the electron injection layer EIL satisfies the above-described range, suitable or satisfactory electron injection characteristics may be obtained without a substantial increase in driving voltage.

The second electrode EL2 is provided on the electron transport region ETR. The second electrode EL2 may be a common electrode. The second electrode EL2 may be a cathode or an anode, but embodiments of the present disclosure are not limited thereto. For example, when the first electrode EL1 is an anode, the second electrode EL2 may be a cathode, and when the first electrode EL1 is a cathode, the second electrode EL2 may be an anode. The second electrode EL2 may include at least one selected from among Ag, Mg, Cu, Al, Pt, Pd, Au, Ni, Nd, Ir, Cr, Li, Ca, LiF/Ca, LiF/Al, Mo, Ti, W, In, Sn, Zn, a compound of two or more thereof, a mixture of two or more thereof, and/or an oxide thereof.

The second electrode EL2 may be a transmissive electrode, a transflective electrode, or a reflective electrode. When the second electrode EL2 is the transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, a compound thereof, or a mixture thereof (e.g., AgMg, AgYb, and/or MgYb). In one or more embodiments, the second electrode EL2 may have a multilayer structure including a reflective film or a transflective film formed of the above-described materials, and a transparent conductive film formed of ITO, IZO, ZnO, ITZO, etc. For example, the second electrode EL2 may include the above-described metal materials, combinations of at least two metal materials of the above-described metal materials, oxides of the above-described metal materials, and/or the like.

In one or more embodiments, the second electrode EL2 may be coupled with an auxiliary electrode. If the second electrode EL2 is coupled with the auxiliary electrode, the resistance of the second electrode EL2 may be decreased.

The capping layer CPL may further be on the second electrode EL2 of the light emitting device ED of an embodiment. The capping layer CPL may include a multilayer or a single layer.

In an embodiment, the capping layer CPL may be an organic layer and/or an inorganic layer. For example, when the capping layer CPL includes an inorganic material, the inorganic material may include an alkaline metal compound such as LiF, an alkaline earth metal compound such as $MgF_2$, SiON, $SiN_x$, $SiO_y$, etc.

For example, when the capping layer CPL includes an organic material, the organic material may include a-NPD, NPB, TPD, m-MTDATA, $Alq_3$, CuPc, N4,N4,N4',N4'-tetra (biphenyl-4-yl)biphenyl-4,4'-diamine (TPD15), 4,4',4"-tris (carbazol sol-9-yl)triphenylamine (TCTA), etc., and/or an epoxy resin, and/or acrylate such as methacrylate. However, embodiments of the present disclosure are not limited thereto, and the capping layer CPL may include at least one selected from among Compounds P1 to P5 below:

P1

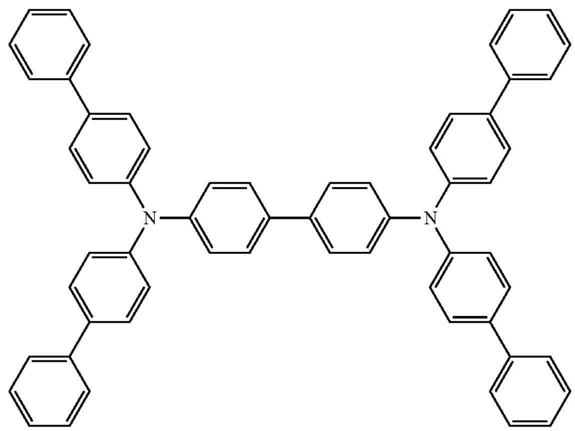

P2

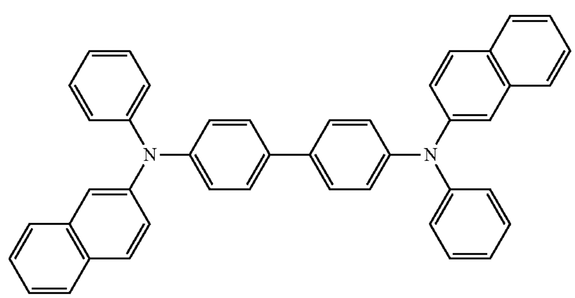

P3

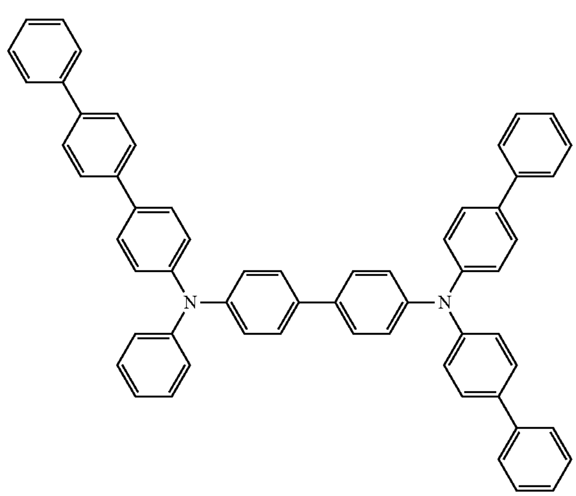

P4

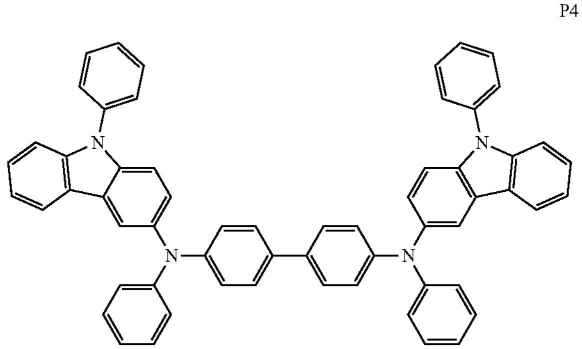

-continued

P5

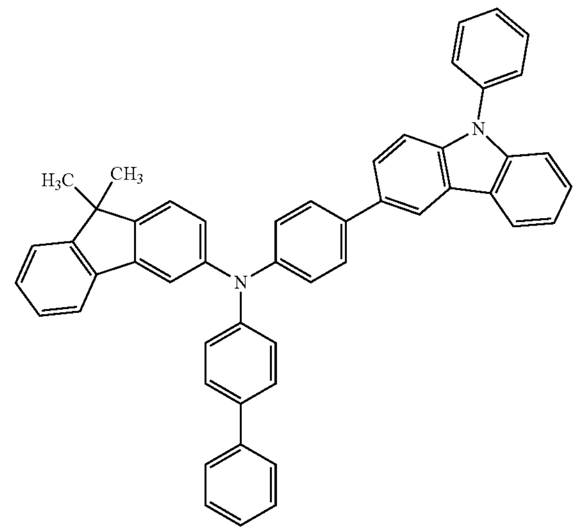

In one or more embodiments, the refractive index of the capping layer CPL may be about 1.6 or more. For example, the refractive index of the capping layer CPL may be about 1.6 or more with respect to light in a wavelength range of about 550 nm to about 660 nm.

Figure 7:
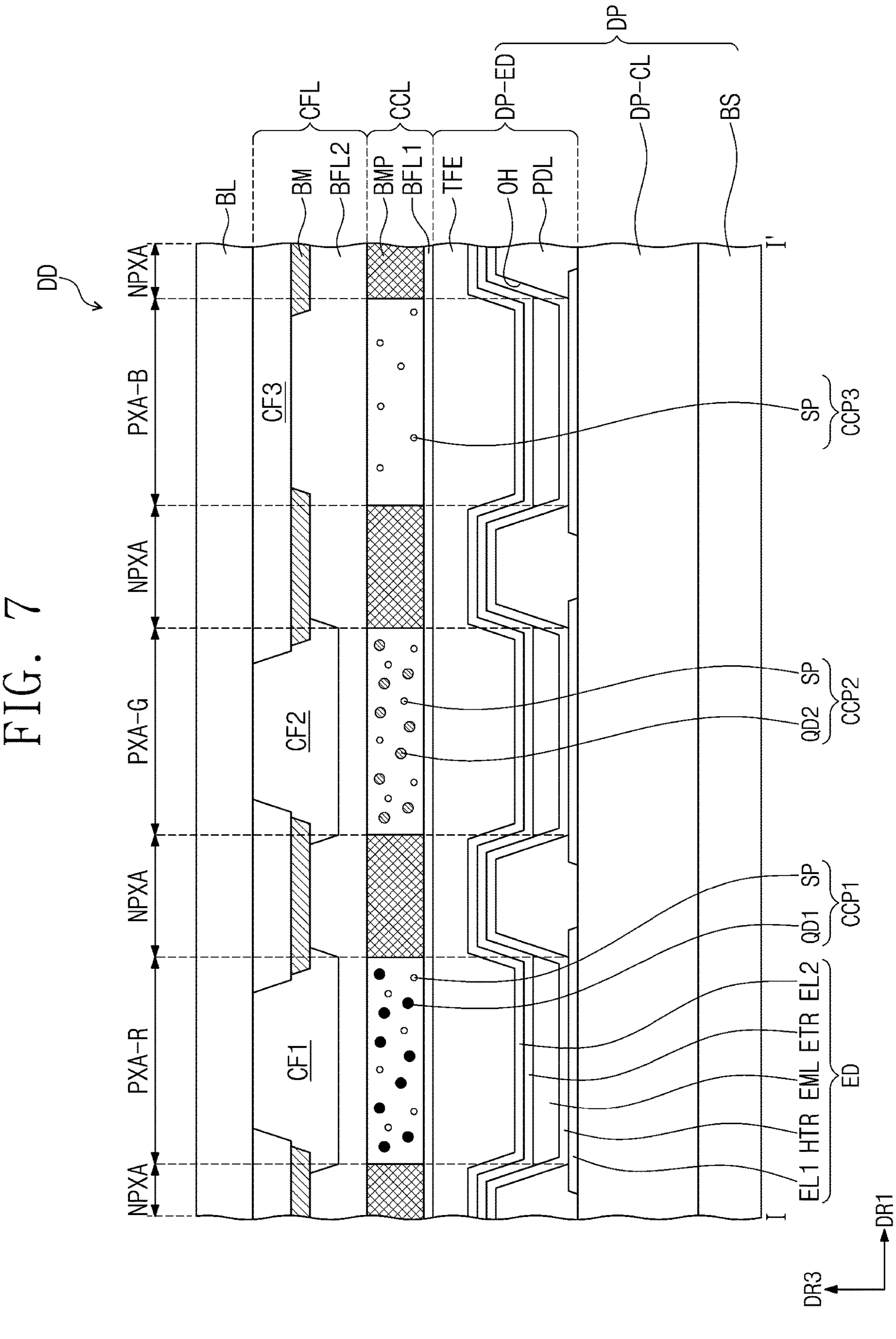
FIG. 7 is a cross-sectional view of a display apparatus according to an embodiment of the present disclosure.
Figure 8:
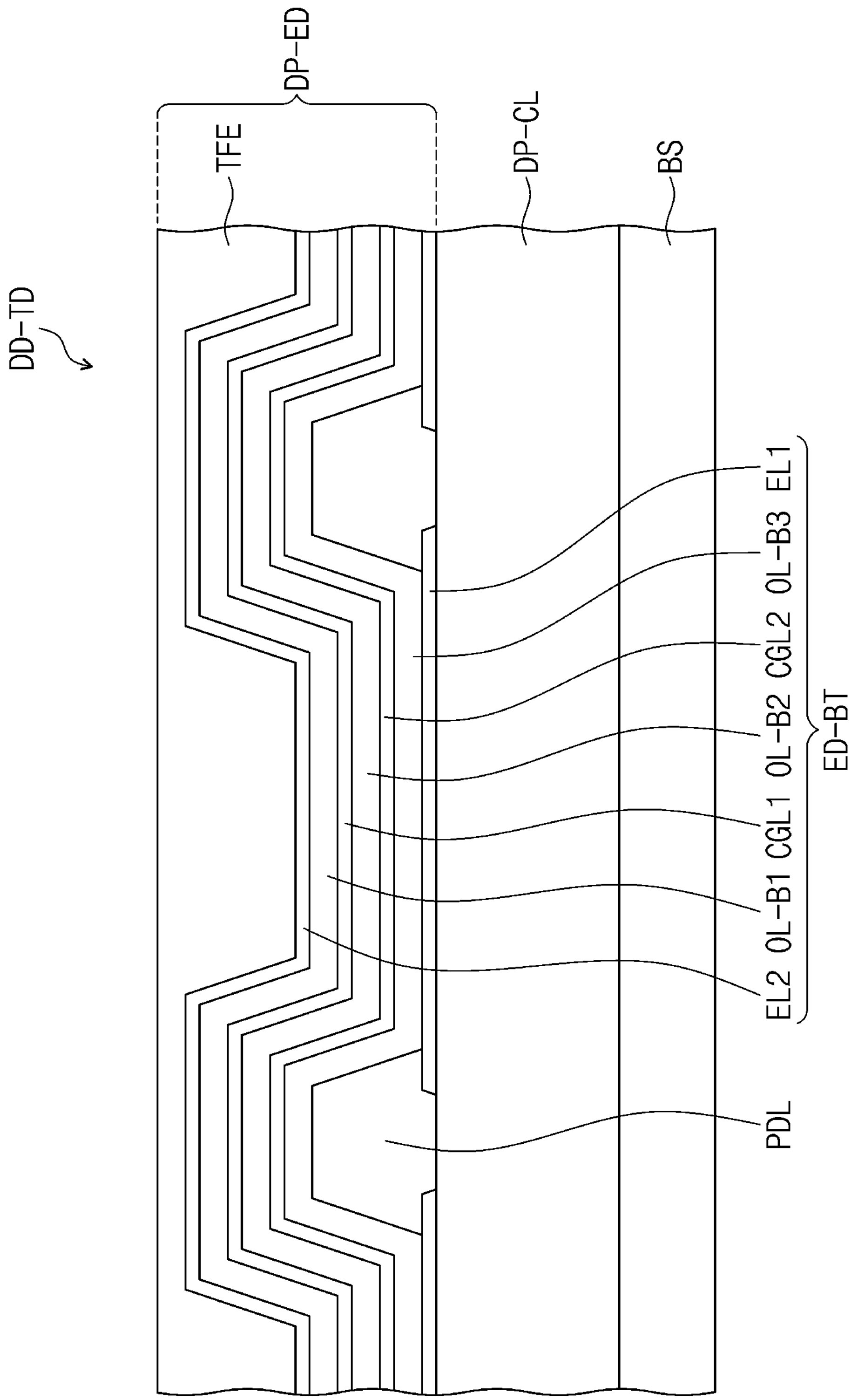
FIG. 8 is a cross-sectional view of a display apparatus according to an embodiment of the presented disclosure.

FIGS. 7 and 8 each are a cross-sectional view of a display apparatus according to an embodiment. Hereinafter, in describing the display apparatus of an embodiment with reference to FIGS. 7 and 8, the duplicated features which have been described with respect to FIGS. 1 to 6 are not described again, but their differences will be mainly described.

Referring to FIG. 7, the display apparatus DD according to an embodiment may include a display panel DP including a display device layer DP-ED, a light control layer CCL on the display panel DP, and a color filter layer CFL.

In an embodiment illustrated in FIG. 7, the display panel DP may include a base layer BS, a circuit layer DP-CL provided on the base layer BS, and the display device layer DP-ED, and the display device layer DP-ED may include a light emitting device ED.

The light emitting device ED may include a first electrode EL1, a hole transport region HTR on the first electrode EL1, an emission layer EML on the hole transport region HTR, an electron transport region ETR on the emission layer EML, and a second electrode EL2 on the electron transport region ETR. In one or more embodiments, the structures of the light emitting devices of FIGS. 4 to 6 as described above may be equally applied to the structure of the light emitting device ED shown in FIG. 7.

Referring to FIG. 7, the emission layer EML may be in an opening OH defined in a pixel defining film PDL. For example, the emission layer EML which is divided by the pixel defining film PDL and provided corresponding to each light emitting regions PXA-R, PXA-G, and PXA-B may emit light in the same wavelength range. In the display apparatus DD of an embodiment, the emission layer EML may emit blue light. In one or more embodiments, the emission layer EML may be provided as a common layer in the entire light emitting regions PXA-R, PXA-G, and PXA-B.

At least one selected from among the emission layers EML provided corresponding to light emitting regions PXA- R, PXA-G, and PXA-B may include the condensed cyclic compound represented by Formula 1 or Formula A of an embodiment as described above. At least one selected from among the emission layers EML provided corresponding to light emitting regions PXA-R, PXA-G, and PXA-B may include the condensed cyclic compound represented by Formula 1 or Formula A of an embodiment as described above, and the rest emission layers EML may include additional fluorescence emitting materials, phosphorescence emitting materials, or quantum dots as described above. However, embodiments of the present disclosure are not limited thereto.

The light control layer CCL may be on the display panel DP. The light control layer CCL may include a light conversion body. The light conversion body may be a quantum dot, a phosphor, and/or the like. The light conversion body may emit light by converting the wavelength of light provided to the light conversion body to light having a different wavelength. For example, the light control layer CCL may include a layer containing the quantum dot and/or a layer containing the phosphor.

The light control layer CCL may include a plurality of light control units CCP1, CCP2 and CCP3. The light control units CCP1, CCP2, and CCP3 may be spaced apart from one another.

Referring to FIG. 7, divided patterns BMP may be between respective ones of the light control units CCP1, CCP2 and CCP3 which are spaced apart from each other, but embodiments of the present disclosure are not limited thereto. FIG. 7 illustrates that the divided patterns BMP do not overlap the light control units CCP1, CCP2 and CCP3, but at least a portion of the edges of the light control units CCP1, CCP2 and CCP3 may overlap the divided patterns BMP.

The light control layer CCL may include a first light control unit CCP1 containing a first quantum dot QD1 which converts a first color light provided from the light emitting device ED into a second color light, a second light control unit CCP2 containing a second quantum dot QD2 which converts the first color light into a third color light, and a third light control unit CCP3 which transmits the first color light.

In an embodiment, the first light control unit CCP1 may provide the second color light as red light, and the second light control unit CCP2 may provide the third color light as green light. The third light control unit CCP3 may provide the first color light by transmitting blue light provided from the light-emitting element ED. For example, the first quantum dot QD1 may be a red quantum dot, and the second quantum dot QD2 may be a green quantum dot. The same as described above may be applied with respect to the quantum dots QD1 and QD2.

In addition, the light control layer CCL may further include a scatterer SP. The first light control unit CCP1 may include the first quantum dot QD1 and the scatterer SP, the second light control unit CCP2 may include the second quantum dot QD2 and the scatterer SP, and the third light control unit CCP3 may not include any quantum dot but includes the scatterer SP.

The scatterer SP may include inorganic particles. For example, the scatterer SP may include at least one of $TiO_2$, ZnO, $Al_2O_3$, $SiO_2$, and/or hollow silica. The scatterer SP may include any one of $TiO_2$, ZnO, $Al_2O_3$, $SiO_2$, and/or hollow silica, and/or may include a mixture of at least two materials selected from among $TiO_2$, ZnO, $Al_2O_3$, $SiO_2$, and hollow silica.

The first light control unit CCP1, the second light control unit CCP2, and the third light control unit CCP3 each may include base resins BR1, BR2, and/or BR3 in which the quantum dots QD1 and/or QD2 and/or the scatterer SP are dispersed. In an embodiment, the first light control unit CCP1 may include the first quantum dot QD1 and the scatterer SP dispersed in a first base resin BR1, the second light control unit CCP2 may include the second quantum dot QD2 and the scatterer SP dispersed in a second base resin BR2, and the third light control unit CCP3 may include the scatterer SP dispersed in a third base resin BR3. The base resins BR1, BR2, and BR3 are media in which the quantum dots QD1 and/or QD2 and/or the scatterer SP are dispersed, and may be formed of various suitable resin compositions, which may be generally referred to as a binder. For example, the base resins BR1, BR2, and BR3 may include acrylic-based resins, urethane-based resins, silicone-based resins, epoxy-based resins, etc. The base resins BR1, BR2, and BR3 may be transparent resins. In an embodiment, the first base resin BR1, the second base resin BR2, and the third base resin BR3 each may be the same as or different from each other.

The light control layer CCL may include a barrier layer BFL1. The barrier layer BFL1 may serve to prevent or reduce penetration of moisture and/or oxygen (which may be referred to herein as 'moisture/oxygen'). The barrier layer BFL1 may be on the light control units CCP1, CCP2, and CCP3 to block or reduce exposure of the light control units CCP1, CCP2 and CCP3 to moisture/oxygen. In one or more embodiments, the barrier layer BFL1 may cover the light control units CCP1, CCP2, and CCP3. In addition, the barrier layer BFL1 may be provided between the light control units CCP1, CCP2, and CCP3 and the color filter layer CFL.

The barrier layers BFL1 and BFL2 may include at least one inorganic layer. In one or more embodiments, the barrier layers BFL1 and BFL2 may include an inorganic material. For example, the barrier layers BFL1 and BFL2 may include a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon oxynitride, a metal thin film which secures a transmittance, etc. In one or more embodiments, the barrier layers BFL1 and BFL2 may further include an organic film. The barrier layers BFL1 and BFL2 may be formed of a single layer or a plurality of layers.

In the display apparatus DD of an embodiment, the color filter layer CFL may be on the light control layer CCL. For example, the color filter layer CFL may be directly on the light control layer CCL. In one or more embodiments, the barrier layer BFL2 may be omitted.

The color filter layer CFL may include a light shielding unit BM and filters CF-B, CF-G, and CF-R. The color filter layer CFL may include a first filter CF1 to transmit the second color light, a second filter CF2 to transmit the third color light, and a third filter CF3 to transmit the first color light. For example, the first filter CF1 may be a red filter, the second filter CF2 may be a green filter, and the third filter CF3 may be a blue filter. The filters CF1, CF2, and CF3 each may include a polymeric photosensitive resin, a pigment, and/or dye. The first filter CF1 may include a red pigment and/or dye, the second filter CF2 may include a green pigment and/or dye, and the third filter CF3 may include a blue pigment and/or dye. Embodiments of the present disclosure, however, are not limited thereto, and the third filter CF3 may not include a pigment or dye. The third filter CF3 may include a polymeric photosensitive resin and may not include a pigment or dye. The third filter CF3 may be transparent. The third filter CF3 may be formed of a transparent photosensitive resin.

Furthermore, in an embodiment, the first filter CF1 and the second filter CF2 may be a yellow filter. The first filter CF1 and the second filter CF2 may not be separated but be provided as one filter.

The light shielding unit BM may be a black matrix. The light shielding unit BM may include an organic light shielding material and/or an inorganic light shielding material containing a black pigment and/or dye. The light shielding unit BM may prevent or reduce light leakage, and may separate boundaries between the adjacent filters CF1, CF2, and CF3. In addition, in an embodiment, the light shielding unit BM may be formed of a blue filter.

The first to third filters CF1, CF2, and CF3 may correspond to the red light emitting region PXA-R, the green light emitting region PXA-G, and the blue light emitting region PXA-B, respectively.

A base substrate BL may be on the color filter layer CFL. The base substrate BL may be a member which provides a base surface in which the color filter layer CFL, the light control layer CCL, and the like are located. The base substrate BL may be a glass substrate, a metal substrate, a plastic substrate, etc. However, embodiments of the present disclosure are not limited thereto, and the base substrate BL may be an inorganic layer, an organic layer, or a composite material layer (e.g., a composite material layer including an inorganic material and an organic material). In an embodiment, the base substrate BL may be omitted.

FIG. 8 is a cross-sectional view illustrating a part of a display apparatus according to an embodiment. FIG. 8 illustrates a cross-sectional view of a part corresponding to the display panel DP of FIG. 7. In the display apparatus DD-TD of an embodiment, the light emitting device ED-BT may include a plurality of light emitting structures OL-B1, OL-B2, and OL-B3. The light emitting device ED-BT may include a first electrode EL1 and a second electrode EL2 which face each other, and the plurality of light emitting structures OL-B1, OL-B2, and OL-B3 sequentially stacked in the thickness direction between the first electrode EL1 and the second electrode EL2. The light emitting structures OL-B1, OL-B2, and OL-B3 each may include an emission layer EML (FIG. 7) and a hole transport region HTR and an electron transport region ETR having the emission layer EML (FIG. 7) therebetween.

In one or more embodiments, the light emitting device ED-BT included in the display apparatus DD-TD of an embodiment may be a light emitting device having a tandem structure and including a plurality of emission layers.

In an embodiment illustrated in FIG. 8, each light emitted from each of the light emitting structures OL-B1, OL-B2, and OL-B3 may be blue light. However, embodiments of the present disclosure are not limited thereto, and the light emitted from each of the light emitting structures OL-B1, OL-B2, and OL-B3 may be in a wavelength range different from each other. For example, the light emitting device ED-BT including the plurality of light emitting structures OL-B1, OL-B2, and OL-B3 which emit light in a wavelength range different from each other may emit white light.

A charge generation layer CGL1 and CGL2 may be between the neighboring light emitting structures OL-B1, OL-B2, and OL-B3. For example, a charge generation layer CGL1 may be between the light emitting structure OL-B1 and the light emitting structure OL-B2, and a charge generation layer CGL2 may be between the light emitting structure OL-B2 and the light emitting structure OL-B3. The charge generation layer may include a p-type charge generation layer and/or an n-type charge generation layer.

At least one of the light emitting structures OL-B1, OL-B2, and/or OL-B3 included in the display apparatus DD-TD of an embodiment may contain the above-described condensed cyclic compound of an embodiment.

The light emitting device ED according to an embodiment of the present disclosure may include the above-described condensed cyclic compound of an embodiment in at least one emission layer EML between the first electrode EL1 and the second electrode EL2, thereby exhibiting improved luminous efficiency and service life characteristics.

The above-described condensed cyclic compound of an embodiment may include at least one bulky substituent structure including an o-biphenyl structure, and thus, have excellent durability and heat resistance, thereby exhibiting improved service life characteristics. In addition, the condensed cyclic compound of an embodiment may be used as a delayed fluorescence emitting material, thereby contributing to high efficiency characteristics of the light emitting device.

Hereinafter, with reference to Examples and Comparative Examples, a condensed cyclic compound according to an embodiment of the present disclosure and a light emitting device of an embodiment of the present disclosure will be described in more detail. In addition, Examples shown below are illustrated only for the understanding of the present disclosure, and the scope of the present disclosure is not limited thereto.

EXAMPLES

1. Synthesis of Condensed Cyclic Compound

First, a synthetic method of a condensed cyclic compound according to the present embodiment will be described in more detail by illustrating the synthetic method of Compounds 6, 26, 30, 48, 76, and 120 of Compound Group 1. In addition, in the following descriptions, a synthetic method of the condensed cyclic compound is provided as an example, but the synthetic method according to an embodiment of the present disclosure is not limited to the following examples.

Synthesis of Compound 6

Condensed Cyclic Compound 6 according to an example may be synthesized by, for example, the steps shown in Reaction Scheme 1 below:

Reaction Scheme 1

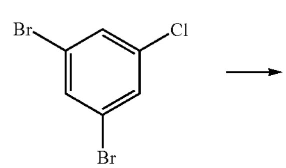

-continued

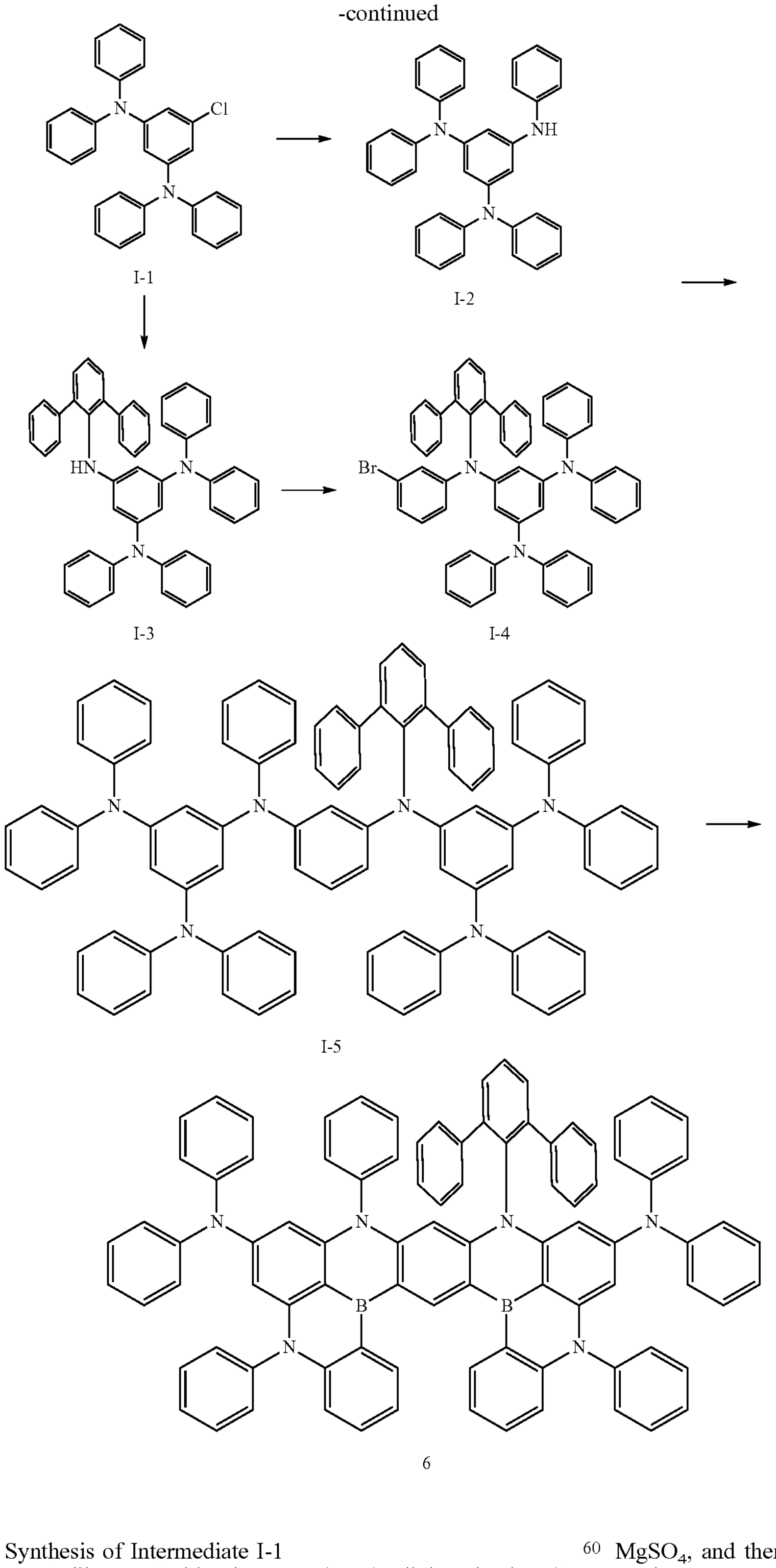

Synthesis of Intermediate I-1

1,3-dibromo-5-chlorobenzene (1 eq), diphenylamine (2 eq), $Pd_2(dba)_3$ (0.05 eq), tri-tert-butylphosphine (0.1 eq), and sodium tert-butoxide (1.5 eq) were dissolved in toluene and then stirred at about 80° C. for about 12 hours. After cooling, the resultant mixture was washed three times with ethyl acetate and water, and then separated to obtain an organic layer. The obtained organic layer was dried over $MgSO_4$, and then dried at reduced pressure. The resultant product was purified by column chromatography using a mixed solvent of methylene chloride (MC) and n-hexane to obtain Intermediate I-1. (yield: 55%)

Synthesis of Intermediate I-2

Intermediate I-1 (1 eq), aniline (1 eq), $Pd_2(dba)_3$ (0.05 eq), tri-tert-butylphosphine (0.1 eq), and sodium tert-butoxide (3 eq) were dissolved in toluene and then stirred at about 110°

C. for about 12 hours. After cooling, the resultant mixture was washed three times with ethyl acetate and water, and then separated to obtain an organic layer. The obtained organic layer was dried over $MgSO_4$, and then dried at reduced pressure. The resultant product was purified by column chromatography using a mixed solvent of MC and n-hexane to obtain Intermediate I-2. (yield: 63%)

Synthesis of Intermediate I-3

Intermediate I-1 (1 eq), [1,1':3',1"-terphenyl]-2'-amine (1 eq), $Pd_2(dba)_3$ (0.05 eq), tri-tert-butylphosphine (0.1 eq), and sodium tert-butoxide (3 eq) were dissolved in toluene and then stirred at about 110° C. for about 3 hours. After cooling, the resultant mixture was washed three times with ethyl acetate and water, and then separated to obtain an organic layer. The obtained organic layer was dried with $MgSO_4$, and then dried at reduced pressure. The resultant product was purified by column chromatography using a mixed solvent of MC and n-hexane to obtain Intermediate I-3. (yield: 72%)

Synthesis of Intermediate I-4

Intermediate I-3 (1 eq), 1-bromo-3-iodobenzene (1 eq), $Pd_2(dba)_3$ (0.05 eq), tri-tert-butylphosphine (0.1 eq), and sodium tert-butoxide (3 eq) were dissolved in toluene and then stirred at about 110° C. for about 36 hours. After cooling, the resultant mixture was washed three times with ethyl acetate and water, and then separated to obtain an organic layer. The obtained organic layer was dried with $MgSO_4$, and then dried at reduced pressure. The resultant product was purified by column chromatography using a mixed solvent of MC and n-hexane to obtain Intermediate I-4. (yield: 42%)

Synthesis of Intermediate I-5

Intermediate I-2 (1 eq), Intermediate I-4 (1 eq), $Pd_2(dba)_3$ (0.05 eq), tri-tert-butylphosphine (0.1 eq), and sodium tert-butoxide (3 eq) were dissolved in toluene and then stirred at about 110° C. for about 12 hours. After cooling, the resultant mixture was washed three times with ethyl acetate and water, and then separated to obtain an organic layer. The obtained organic layer was dried over $MgSO_4$, and then dried at reduced pressure. The resultant product was purified by column chromatography using a mixed solvent of MC and n-hexane to obtain Intermediate I-5. (yield: 75%)

Synthesis of Compound 6

Intermediate I-5 (1 eq) was dissolved in o-dichlorobenezene, the mixture was then cooled to about 0° C., and then $BBr_3$ (3 eq) was slowly injected thereto under a nitrogen atmosphere. After the injection was completed, the temperature was elevated to about 160° C., and the resultant mixture was stirred for about 24 hours. After cooling, the reaction was quenched by dropping triethylamine slowly in the flask containing the reactant, and then ethyl alcohol was added to the resultant mixture and the resultant product was extracted. The extracted product was filtered to obtain a solid. The obtained solid was purified by column chromatography using a mixed solvent of MC and n-hexane, and then was subjected to recrystallization using toluene and acetone to obtain Compound 6. (yield: 10%)

The produced compound was identified through MS/FAB. [$C_{90}H_{62}B_2N_6$ cal. 1248.52, found 1248.52]

Synthesis of Compound 26

Condensed Cyclic Compound 26 according to an example may be synthesized by, for example, the steps shown in Reaction Scheme 2 below:

Reaction Scheme 2

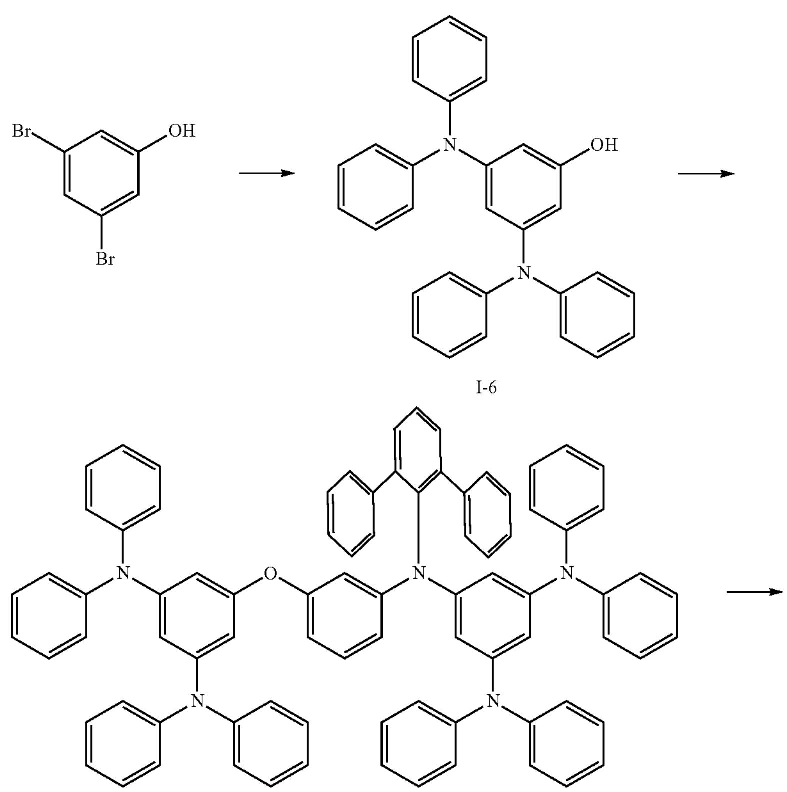

-continued

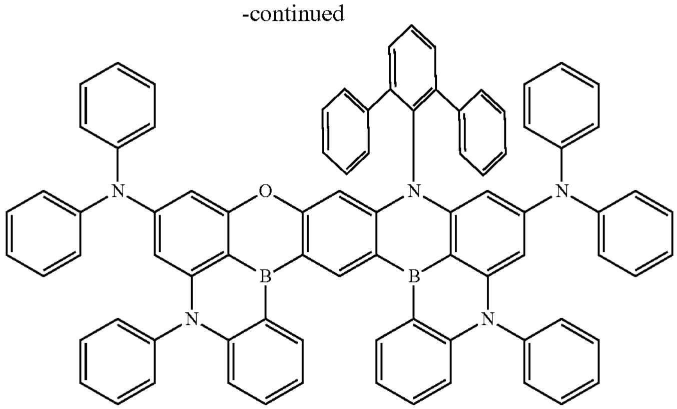

26

Synthesis of Intermediate I-6

3,5-dibromophenol (1 eq), diphenylamine (2 eq), $Pd_2(dba)_3$ (0.05 eq), tri-tert-butylphosphine (0.1 eq), and sodium tert-butoxide (1.5 eq) were dissolved in toluene and then stirred at about 80° C. for about 12 hours. After cooling, the resultant mixture was washed three times with ethyl acetate and water, and then separated to obtain an organic layer. The obtained organic layer was dried over $MgSO_4$, and then dried at reduced pressure. The resultant product was purified by column chromatography using a mixed solvent of MC and n-hexane to obtain Intermediate I-6. (yield: 52%)

Synthesis of Intermediate I-7

Intermediate I-6 (1 eq), Intermediate I-4 (2 eq), CuI (0.1 eq), and $K_2CO_3$ (3 eq) were dissolved in DMF and then stirred at about 150° C. for about 24 hours. After cooling, the resultant mixture was poured into water, precipitated, and then filtered to obtain a solid. The obtained solid was washed three times with ethyl acetate and water, and then separated to obtain an organic layer. The obtained organic layer was dried over $MgSO_4$, and then dried at reduced pressure. The resultant product was purified by column chromatography using a mixed solvent of MC and n-hexane to obtain Intermediate I-7. (yield: 47%)

Synthesis of Compound 26

Intermediate I-7 (1 eq) was dissolved in o-dichlorobenezene, the mixture was then cooled to about 0° C., and then $BBr_3$ (3 eq) was slowly injected thereto under a nitrogen atmosphere. After the injection was completed, the temperature was elevated to about 160° C., and the resultant mixture was stirred for about 24 hours. After cooling, the resultant mixture was quenched by dropping triethylamine slowly in the flask containing the resultant mixture, and then ethyl alcohol was added to the resultant mixture and the resultant product was extracted. The extracted product was filtered to obtain a solid. The obtained solid was purified by column chromatography using a mixed solvent of MC and n-hexane, and then was subjected to recrystallization using toluene and acetone to obtain Compound 26. (yield: 5%)

The produced compound was identified through MS/FAB. [$C_{84}H_{57}B_2N_5O$ cal. 1173.47, found 1173.48]

Synthesis of Compound 30

Condensed Cyclic Compound 30 according to an example may be synthesized by, for example, the steps shown in Reaction Scheme 3 below:

Reaction Scheme 3

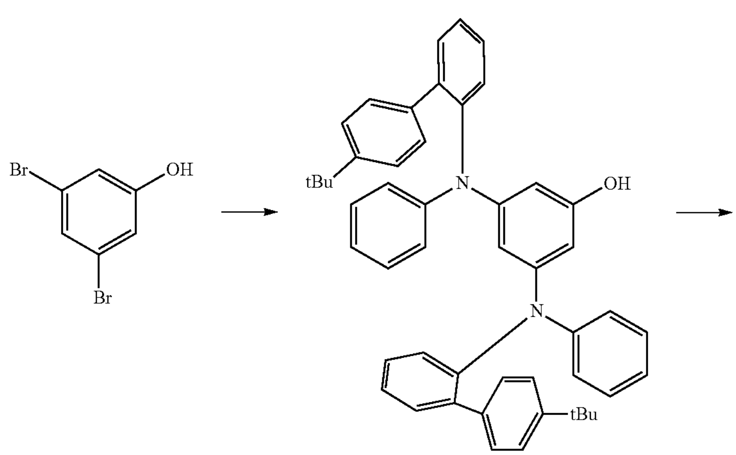

I-22

-continued

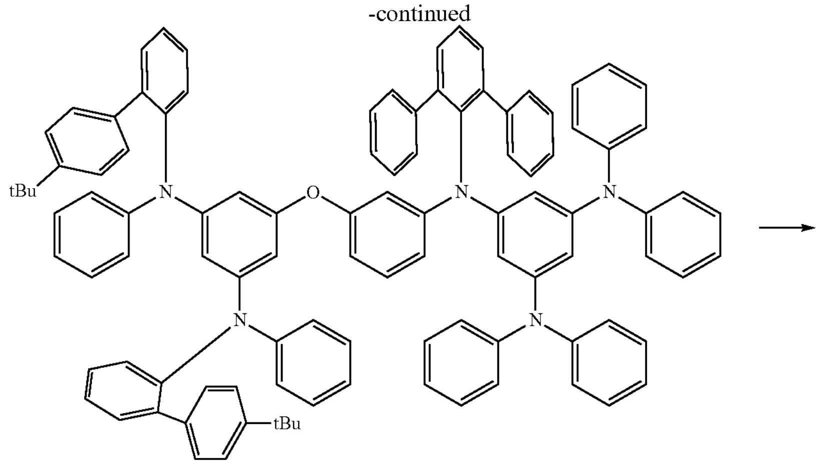

I-23

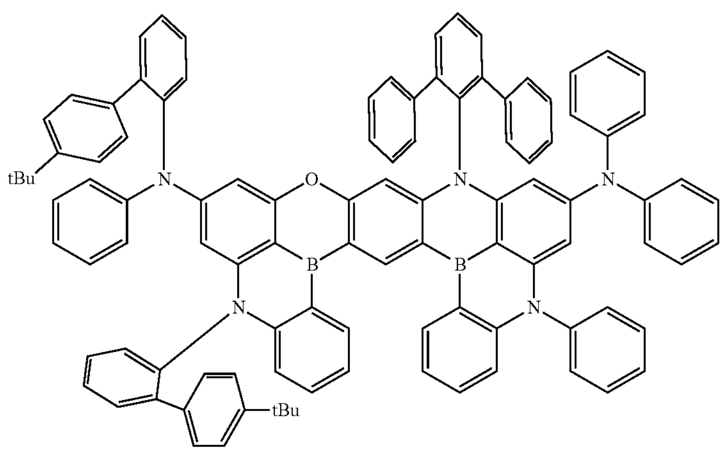

30

Synthesis of Intermediate I-22

3,5-dibromophenol (1 eq), 4'-(tert-butyl)-N-phenyl-[1,1'-biphenyl]-2-amine (2eq), $Pd_2(dba)_3$ (0.05 eq), tri-tert-butylphosphine (0.1 eq), and sodium tert-butoxide (1.5 eq) were dissolved in toluene and then stirred at about 80° C. for about 12 hours. After cooling, the resultant mixture was washed three times with ethyl acetate and water, and then separated to obtain an organic layer. The obtained organic layer was dried over $MgSO_4$, and then dried at reduced pressure. The resultant product was purified by column chromatography using a mixed solvent of MC and n-hexane to obtain Intermediate I-22. (yield: 60%)

Synthesis of Intermediate I-23

Intermediate I-22 (1 eq), Intermediate I-4 (2 eq), CuI (0.1 eq), and $K_2CO_3$ (3 eq) were dissolved in DMF and then stirred at about 150° C. for about 24 hours. After cooling, the resultant mixture was poured into water, precipitated, and then filtered to obtain a solid. The obtained solid was washed three times with ethyl acetate and water, and then separated to obtain an organic layer. The obtained organic layer was dried over $MgSO_4$, and then dried at reduced pressure. The resultant product was purified by column chromatography using a mixed solvent of MC and n-hexane to obtain Intermediate I-23. (yield: 52%)

Synthesis of Compound 30

Intermediate I-23 (1 eq) was dissolved in o-dichlorobenezene, the mixture was then cooled to about 0° C., and then $BBr_3$ (3 eq) was slowly injected thereto under a nitrogen atmosphere. After the injection was completed, the temperature was elevated to about 160° C., and the resultant mixture was stirred for about 24 hours. After cooling, the resultant mixture was quenched by dropping triethylamine slowly in the flask containing the resultant mixture, and then ethyl alcohol was added to the resultant mixture and the resultant product was extracted. The extracted product was filtered to obtain a solid. The obtained solid was purified by column chromatography using a mixed solvent of MC and n-hexane, and then was subjected to recrystallization using toluene and acetone to obtain Compound 30. (yield: 6%) The produced compound was identified through MS/FAB. [$C_{104}H_{81}B_2N_5O$ cal. 1437.66, found 1437.66]

Synthesis of Compound 48

Condensed Cyclic Compound 48 according to an example may be synthesized by, for example, the steps shown in Reaction Scheme 4 below:

Reaction Scheme 4
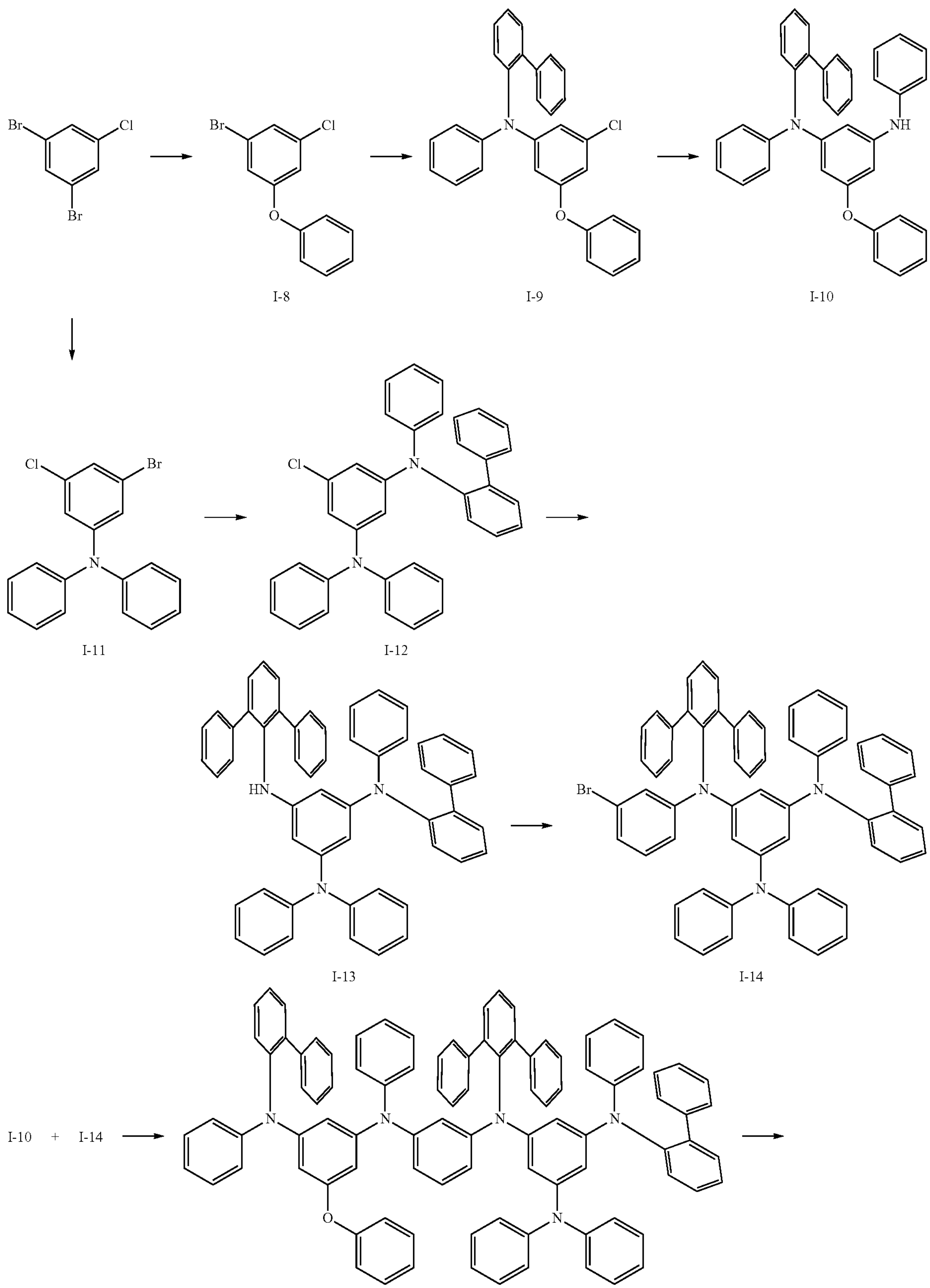
I-8 I-9 I-10
I-11 I-12
I-13 I-14
I-15

-continued

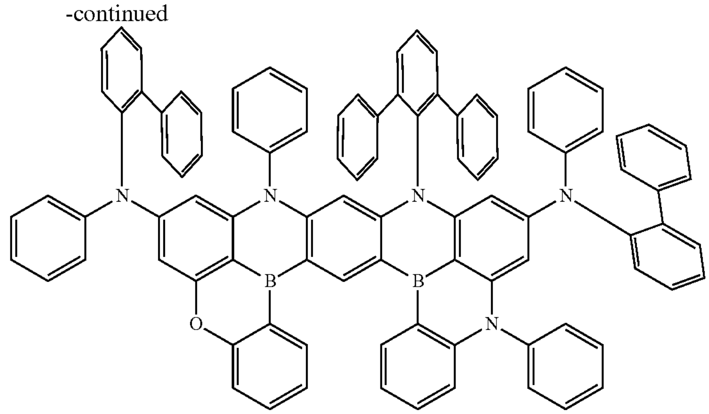

48

Synthesis of Intermediate I-8

1,3-dibromo-5-chlorobenzene (1 eq), phenol (1 eq), CuI (0.1 eq), and $K_2CO_3$ (3 eq) were dissolved in DMF and then stirred at about 150° C. for about 24 hours. After cooling, the resultant mixture was poured into water, precipitated, and then filtered to obtain a solid. The obtained solid was washed three times with ethyl acetate and water, and then separated to obtain an organic layer. The obtained organic layer was dried over $MgSO_4$, and then dried at reduced pressure. The resultant product was purified by column chromatography using a mixed solvent of MC and n-hexane to obtain Intermediate I-8. (yield: 62%)

Synthesis of Intermediate I-9

Intermediate I-8 (1 eq), N-phenyl-[1,1'-biphenyl]-2-amine (1 eq), $Pd_2(dba)_3$ (0.05 eq), tri-tert-butylphosphine (0.1 eq), and sodium tert-butoxide (1.5 eq) were dissolved in toluene and then stirred at about 80° C. for about 12 hours. After cooling, the resultant mixture was washed three times with ethyl acetate and water, and then separated to obtain an organic layer. The obtained organic layer was dried over $MgSO_4$, and then dried at reduced pressure. The resultant product was purified by column chromatography using a mixed solvent of MC and n-hexane to obtain Intermediate I-9. (yield: 60%)

Synthesis of Intermediate I-10

Intermediate I-9 (1 eq), aniline (1 eq), $Pd_2(dba)_3$ (0.05 eq), tri-tert-butylphosphine (0.1 eq), and sodium tert-butoxide (1.5 eq) were dissolved in toluene and then stirred at about 110° C. for about 3 hours. After cooling, the resultant mixture was washed three times with ethyl acetate and water, and then separated to obtain an organic layer. The obtained organic layer was dried over $MgSO_4$, and then dried at reduced pressure. The resultant product was purified by column chromatography using a mixed solvent of MC and n-hexane to obtain Intermediate I-10. (yield: 85%)

Synthesis of Intermediate I-11

1,3-dibromo-5-chlorobenzene (1 eq), diphenylamine (1 eq), $Pd_2(dba)_3$ (0.05 eq), tri-tert-butylphosphine (0.1 eq), and sodium tert-butoxide (1.5 eq) were dissolved in toluene and then stirred at about 80° C. for about 12 hours. After cooling, the resultant mixture was washed three times with ethyl acetate and water, and then separated to obtain an organic layer. The obtained organic layer was dried over $MgSO_4$, and then dried at reduced pressure. The resultant product was purified by column chromatography using a mixed solvent of MC and n-hexane to obtain Intermediate I-11. (yield: 58%)

Synthesis of Intermediate I-12

Intermediate I-11 (1 eq), N-phenyl-[1,1'-biphenyl]-2-amine (1 eq), $Pd_2(dba)_3$ (0.05 eq), tri-tert-butylphosphine (0.1 eq), and sodium tert-butoxide (1.5 eq) were dissolved in toluene and then stirred at about 80° C. for about 12 hours. After cooling, the resultant mixture was washed three times with ethyl acetate and water, and then separated to obtain an organic layer. The obtained organic layer was dried over $MgSO_4$, and then dried at reduced pressure. The resultant product was purified by column chromatography using a mixed solvent of MC and n-hexane to obtain Intermediate I-12. (yield: 69%)

Synthesis of Intermediate I-13

Intermediate I-12 (1 eq), [1,1':3',1"-terphenyl]-2'-amine (1 eq), $Pd_2(dba)_3$ (0.05 eq), tri-tert-butylphosphine (0.1 eq), and sodium tert-butoxide (3 eq) were dissolved in toluene and then stirred at about 110° C. for about 3 hours. After cooling, the resultant mixture was washed three times with ethyl acetate and water, and then separated to obtain an organic layer. The obtained organic layer was dried with $MgSO_4$, and then dried at reduced pressure. The resultant product was purified by column chromatography using a mixed solvent of MC and n-hexane to obtain Intermediate I-13. (yield: 70%)

Synthesis of Intermediate I-14

Intermediate I-13 (1 eq), 1-bromo-3-iodobenzene (1 eq), $Pd_2(dba)_3$ (0.05 eq), tri-tert-butylphosphine (0.1 eq), and sodium tert-butoxide (3 eq) were dissolved in toluene and then stirred at about 110° C. for about 36 hours. After cooling, the resultant mixture was washed three times with ethyl acetate and water, and then separated to obtain an organic layer. The obtained organic layer was dried over $MgSO_4$, and then dried at reduced pressure. The resultant product was purified by column chromatography using a mixed solvent of MC and n-hexane to obtain Intermediate I-14. (yield: 40%)

Synthesis of Intermediate I-15

Intermediate I-10 (1 eq), Intermediate I-14 (1 eq), $Pd_2(dba)_3$ (0.05 eq), tri-tert-butylphosphine (0.1 eq), and sodium tert-butoxide (3 eq) were dissolved in toluene and then stirred at about 110° C. for about 12 hours. After cooling, the resultant mixture was washed three times with ethyl acetate and water, and then separated to obtain an organic layer. The obtained organic layer was dried over $MgSO_4$, and then dried at reduced pressure. The resultant product was purified by column chromatography using a mixed solvent of MC and n-hexane to obtain Intermediate I-15. (yield: 72%)

Synthesis of Compound 48

Intermediate I-15 (1 eq) was dissolved in o-dichlorobenezene, the resultant mixture was then cooled to about 0° C., and then $BBr_3$ (3 eq) was slowly injected thereto under a nitrogen atmosphere. After the injection was completed, the temperature was elevated to about 160° C., and the resultant mixture was stirred for about 24 hours. After cooling, the reaction was quenched by dropping triethylamine slowly in the flask containing the resultant mixture, and then ethyl alcohol was added to the resultant mixture and the resultant product was extracted. The extracted product was filtered to obtain a solid. The obtained solid was purified by column chromatography using a mixed solvent of MC and n-hexane, and then was subjected to recrystallization using toluene and acetone to obtain Compound 48. (yield: 4%)

The produced compound was identified through MS/FAB. [$C_{96}H_{65}B_2N_5O$ cal. 1325.54, found 1325.55]

Synthesis of Compound 76

Condensed Cyclic Compound 76 according to an example may be synthesized by, for example, the steps shown in Reaction Scheme 5 below:

Reaction Scheme 5

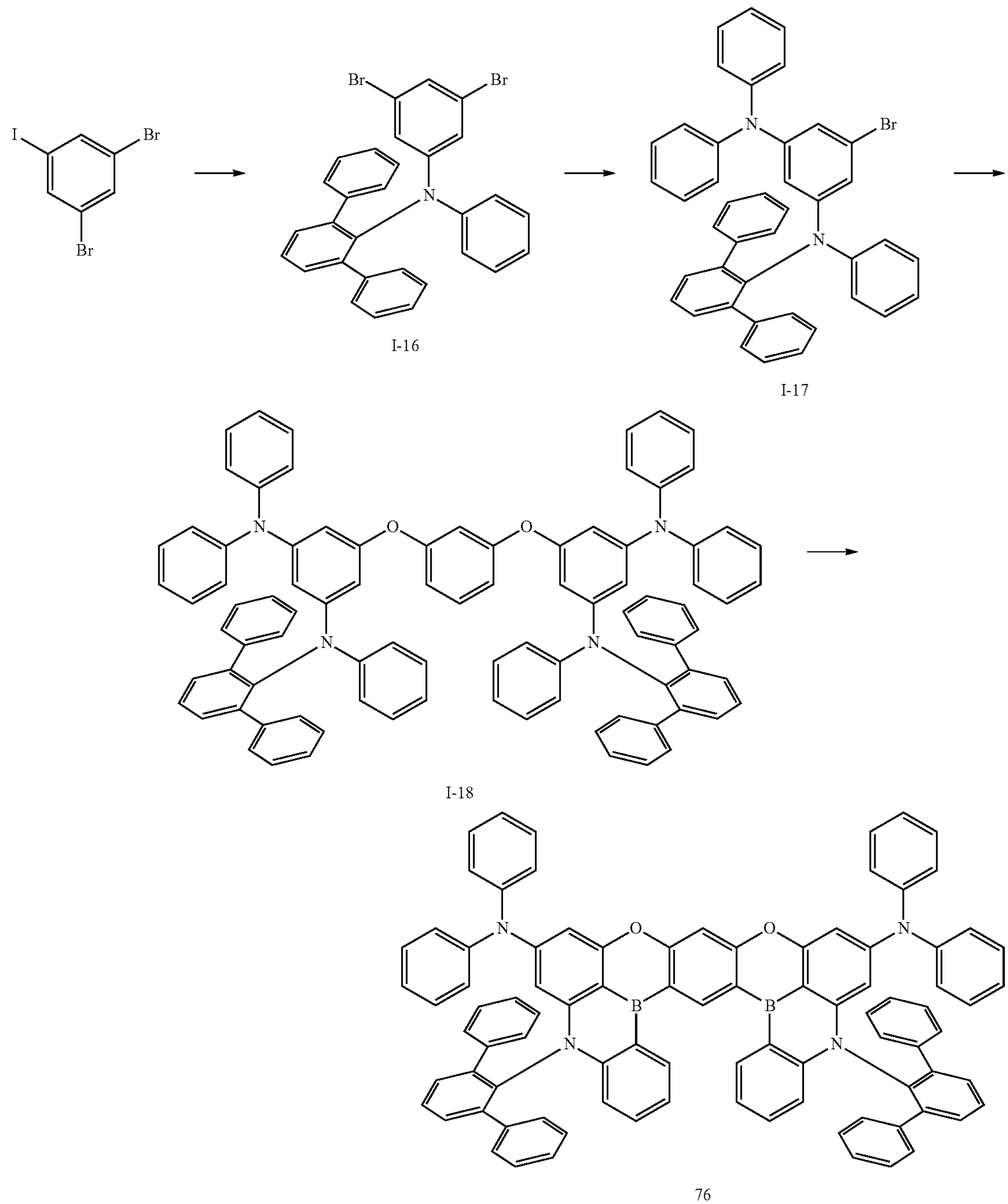

I-16

I-17

I-18

76

Synthesis of Intermediate I-16

1,3-dibromo-5-iodobenzene (1 eq), N-phenyl-[1,1':3',1"-terphenyl]-2'-amine (1 eq), $Pd_2(dba)_3$ (0.01 eq), tri-tert-butylphosphine (0.2 eq), and sodium tert-butoxide (3 eq) were dissolved in o-xylene and then stirred at about 160° C. for about 18 hours. After cooling, the resultant mixture was washed three times with ethyl acetate and water, and then separated to obtain an organic layer. The obtained organic layer was dried over $MgSO_4$, and then dried at reduced pressure. The resultant product was purified by column chromatography using a mixed solvent of MC and n-hexane to obtain Intermediate I-16. (yield: 25%)

Synthesis of Intermediate I-17

Intermediate I-16 (1 eq), diphenylamine (1 eq), $Pd_2(dba)_3$ (0.05 eq), tri-tert-butylphosphine (0.1 eq), and sodium tert-butoxide (3 eq) were dissolved in toluene and then stirred at about 80° C. for about 12 hours. After cooling, the resultant mixture was washed three times with ethyl acetate and water, and then separated to obtain an organic layer. The obtained organic layer was dried over $MgSO_4$, and then dried at reduced pressure. The resultant product was purified by column chromatography using a mixed solvent of MC and n-hexane to obtain Intermediate I-17. (yield: 60%)

Synthesis of Intermediate I-18

Intermediate I-17 (2 eq), resorcinol (1 eq), CuI (0.1 eq), and $K_2CO_3$ (3 eq) were dissolved in DMF and then stirred at about 150° C. for about 24 hours. After cooling, the resultant mixture was poured into water, precipitated, and then filtered to obtain a solid. The obtained solid was washed three times with ethyl acetate and water, and then separated to obtain an organic layer. The obtained organic layer was dried over $MgSO_4$, and then dried at reduced pressure. The resultant product was purified by column chromatography using a mixed solvent of MC and n-hexane to obtain Intermediate I-18. (yield: 46%)

Synthesis of Compound 76

Intermediate I-18 (1 eq) was dissolved in o-dichlorobenezene, the mixture was then cooled to about 0° C., and then $BBr_3$ (3 eq) was slowly injected thereto under a nitrogen atmosphere. After the injection was completed, the temperature was elevated to about 180° C., and the resultant mixture was stirred for about 24 hours. After cooling, the reaction was quenched by dropping triethylamine slowly in the flask containing the resultant mixture, and then ethyl alcohol was added to the resultant mixture and the resultant product was extracted. The extracted product was filtered to obtain a solid. The obtained solid was purified by column chromatography using a mixed solvent of MC and n-hexane, and then was subjected to recrystallization using toluene and acetone to obtain Compound 76. (yield: 2%)

The produced compound was identified through MS/FAB. [$C_{90}H_{60}B_2N_4O_2$ cal. 1250.49, found 1250.50]

Synthesis of Compound 120

Condensed Cyclic Compound 120 according to an example may be synthesized by, for example, the steps shown in Reaction Scheme 6 below:

Reaction Scheme 6

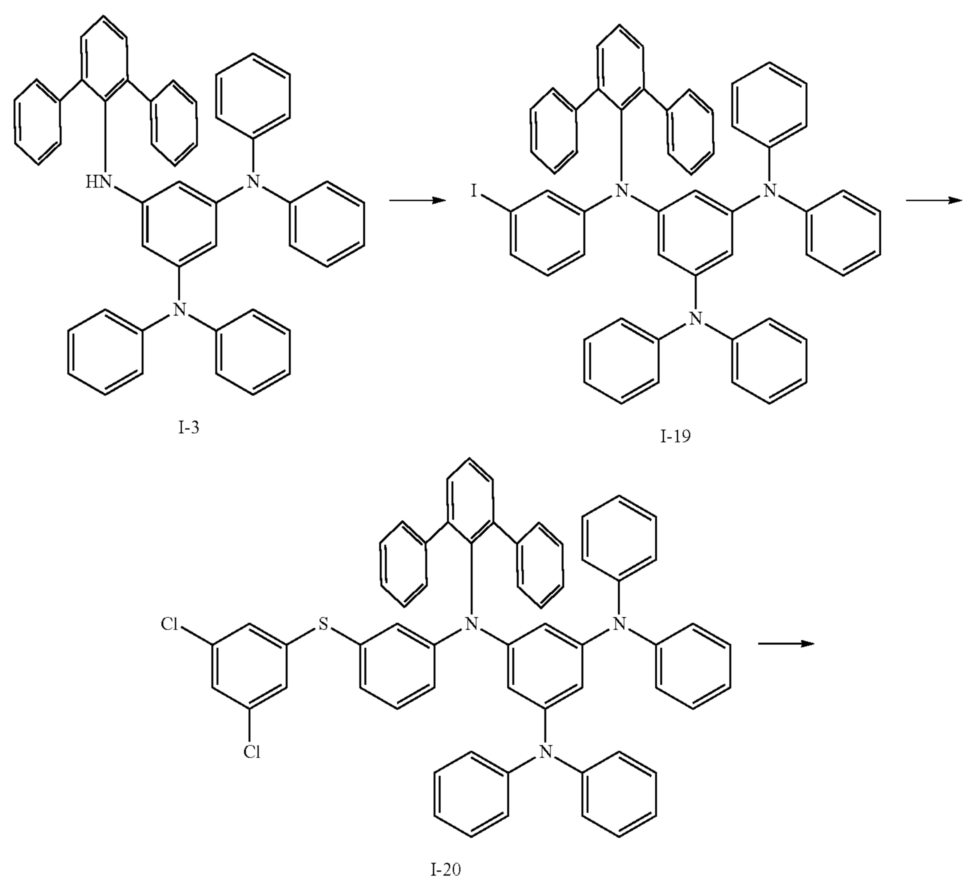

-continued

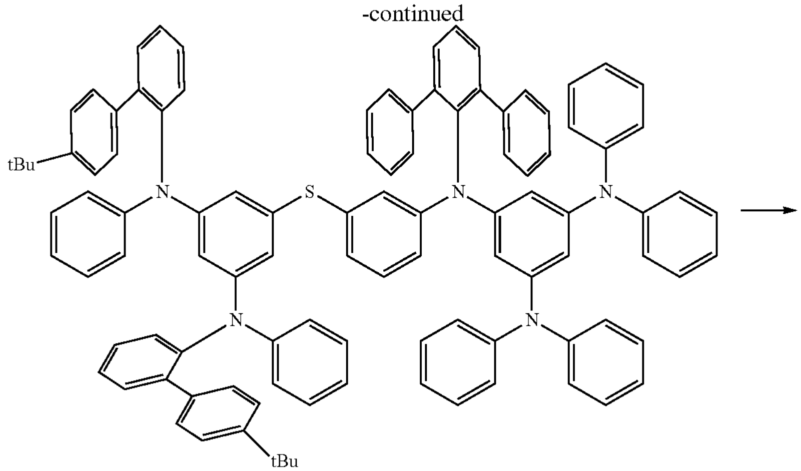

I-21

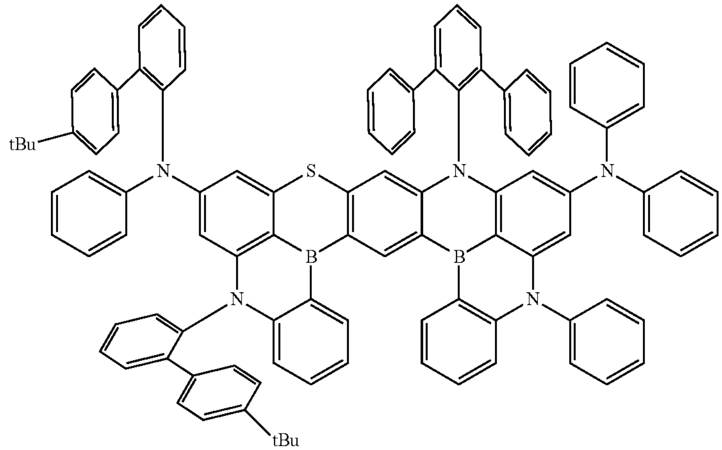

120

Synthesis of Intermediate I-19

Intermediate I-3 (1 eq), Intermediate I-4 (1 eq), $Pd_2(dba)_3$ (0.05 eq), tri-tert-butylphosphine (0.1 eq), and sodium tert-butoxide (3 eq) were dissolved in toluene and then stirred at about 110° C. for about 36 hours. After cooling, the resultant mixture was washed three times with ethyl acetate and water, and then separated to obtain an organic layer. The obtained organic layer was dried over $MgSO_4$, and then dried at reduced pressure. The resultant product was purified by column chromatography using a mixed solvent of MC and n-hexane to obtain Intermediate I-19. (yield: 50%)

Synthesis of Intermediate I-20

Intermediate I-19 (1 eq), 3,5-dichlorobenzenethiol (1 eq), CuI (0.1 eq), and $K_2CO_3$ (3 eq) were dissolved in DMF and then stirred at about 150° C. for about 24 hours. After cooling, the resultant mixture was poured into water, precipitated, and then filtered to obtain a solid. The obtained solid was washed three times with ethyl acetate and water, and then separated to obtain an organic layer. The obtained organic layer was dried over $MgSO_4$, and then dried at reduced pressure. The resultant product was purified by column chromatography using a mixed solvent of MC and n-hexane to obtain Intermediate I-20. (yield: 47%)

Synthesis of Intermediate I-21

Intermediate I-20 (1 eq), 4'-(tert-butyl)benzene-N-phenyl-[1,1'-biphenyl]-2-amine (2 eq), $Pd_2(dba)_3$ (0.05 eq), tri-tert-butylphosphine (0.1 eq), and sodium tert-butoxide (3 eq) were dissolved in toluene and then stirred at about 110° C. for about 12 hours. After cooling, the resultant mixture was washed three times with ethyl acetate and water, and then separated to obtain an organic layer. The obtained organic layer was dried over $MgSO_4$, and then dried at reduced pressure. The resultant product was purified by column chromatography using a mixed solvent of MC and n-hexane to obtain Intermediate I-21. (yield: 50%)

Synthesis of Compound 120

Intermediate I-21 (1 eq) was dissolved in o-dichlorobenezene, the resultant mixture was then cooled to about 0° C., and then $BBr_3$ (3 eq) was slowly injected thereto under a nitrogen atmosphere. After the injection was completed, the temperature was elevated to about 160° C., and the resultant mixture was stirred for about 24 hours. After cooling, the reaction was quenched by dropping triethylamine slowly in the flask containing the resultant mixture, and then ethyl alcohol was added to the resultant mixture and the resultant product extracted. The extracted product was filtered to obtain a solid. The obtained solid was purified by column chromatography using a mixed solvent of MC and n-hexane, and then was subjected to recrystallization using toluene and acetone to obtain Compound 120. (yield: 5%)

The produced compound was identified through MS/FAB. [$C_{104}H_{81}B_2N_5S$ cal. 1453.64, found 1453.64]

2. Manufacture and Evaluation of Light Emitting Device

Manufacture of Light Emitting Device

The light emitting device of an embodiment including the condensed compound of an example in an emission layer was manufactured as follows. The condensed cyclic compounds of Compound 6, Compound 26, Compound 30, Compound 48, Compound 76, and Compound 120 as described above were used respectively as a dopant of the emission layer to manufacture the light emitting devices of Examples 1 to 5.

Comparative Example Compounds C1 to C3 below were used respectively as hole transport layer materials to manufacture the light emitting devices of Comparative Examples 1 to 3, respectively.

Example Compounds and Comparative Example Compounds used to manufacture the devices are shown below:

Example Compounds

6

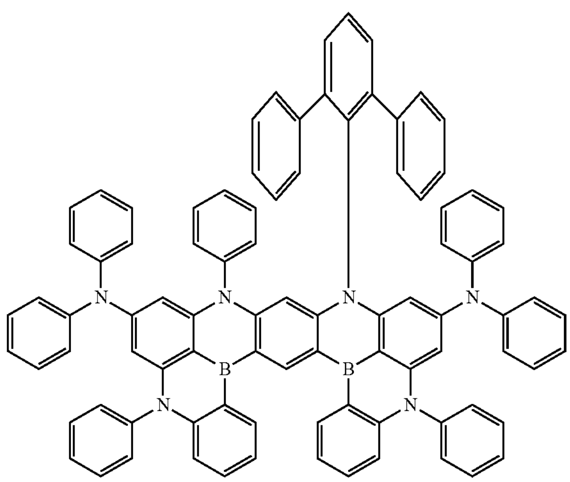

26

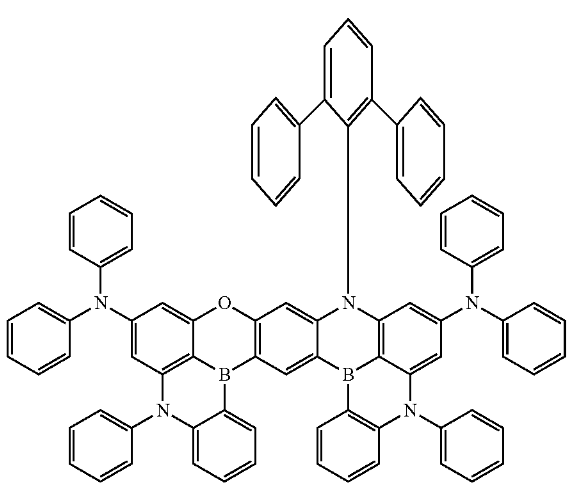

-continued

30

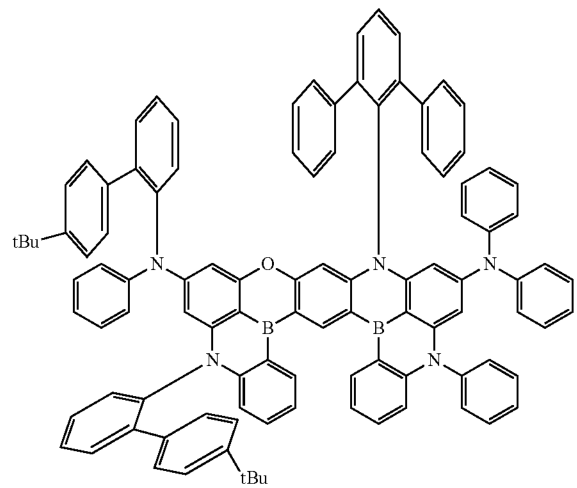

48

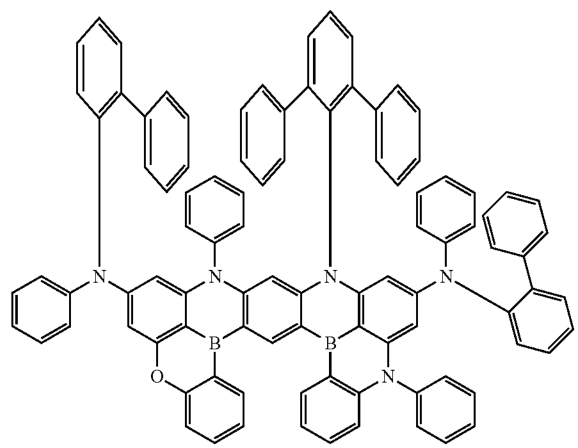

76

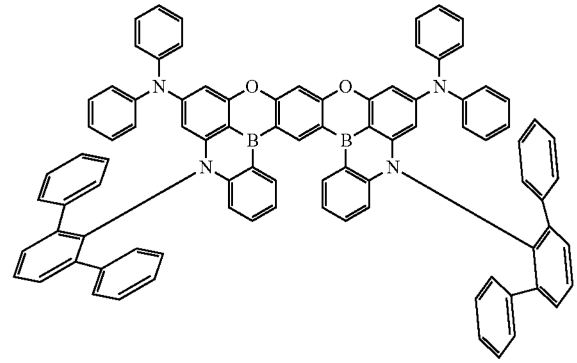

-continued
120
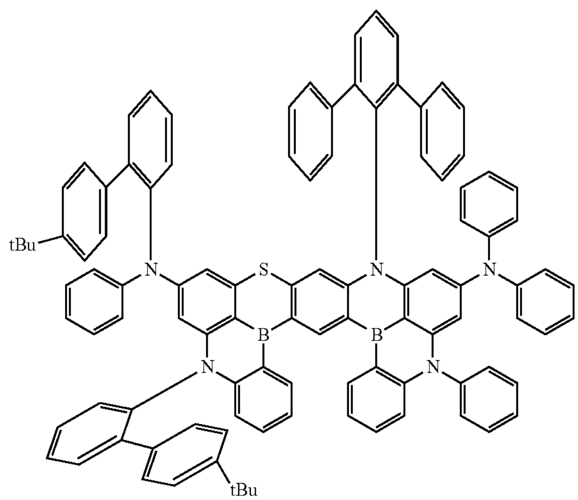
Comparative Example Compounds
C1
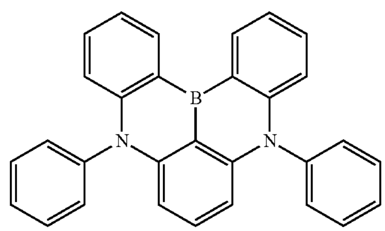
C2
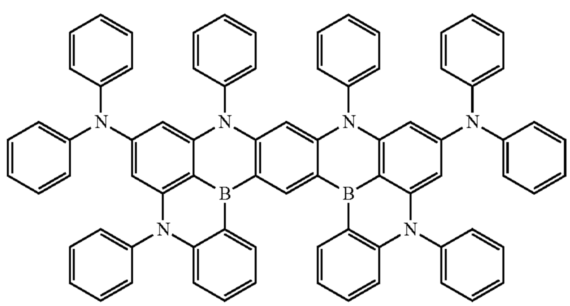
C3
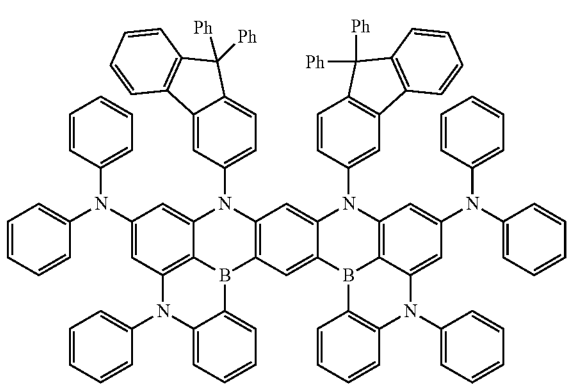
Other Compounds Used to Manufacture Devices
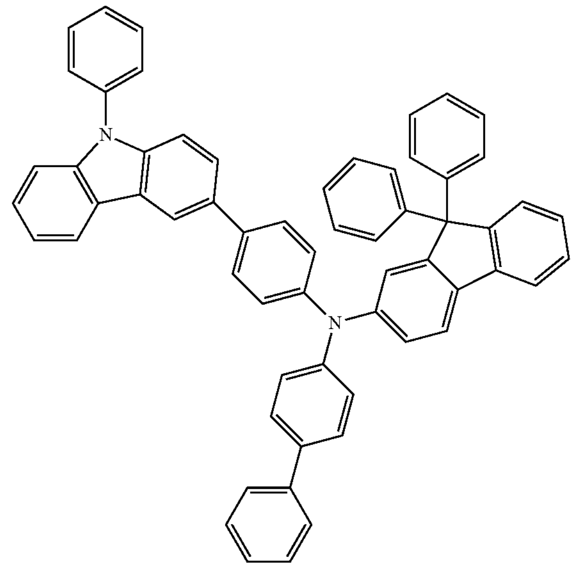
HT6
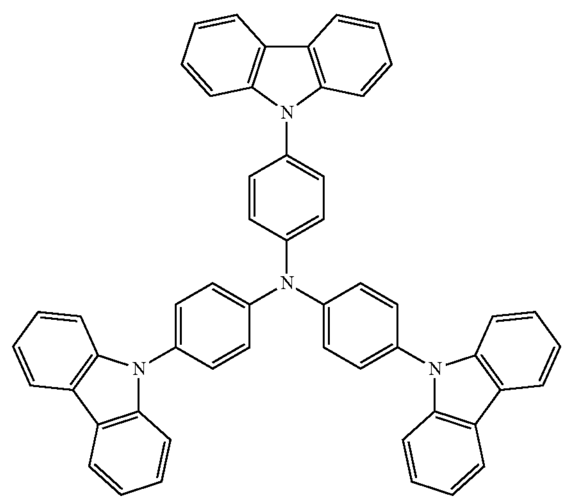
TCTA
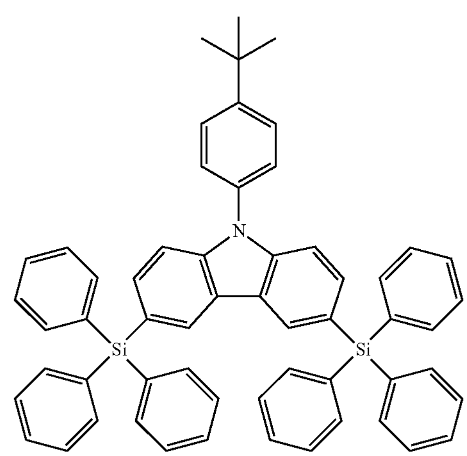
CzSi -continued

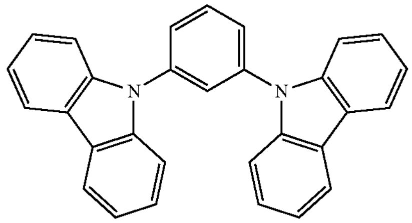

mCP

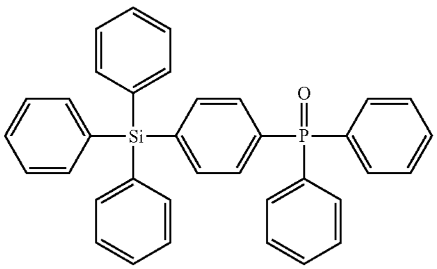

TSPO1

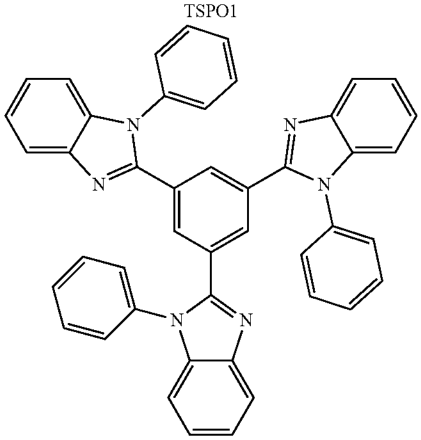

TPBi

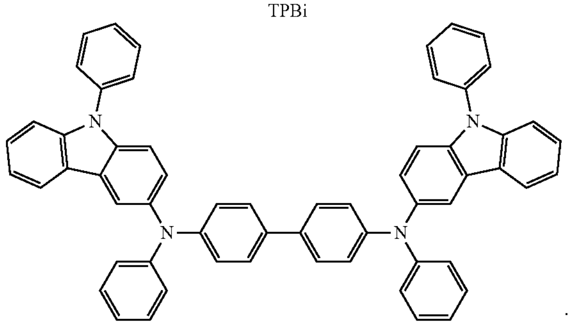

P4

A glass substrate on which ITO had been patterned was washed, HT6 was deposited to form a 300 Å-thick hole injection layer, and then TCTA was deposited to form a 200 Å-thick hole transport layer. CzSi was deposited in vacuum on the hole transport layer to form a 100 Å-thick emission-auxiliary layer.

Thereafter, mCP and Example Compounds or mCP and Comparative Example Compounds were co-deposited at a weight ratio of about 99:1 to form a 200 A-thick emission layer.

Then, TSP01 was deposited to form a 200 Å-thick electron transport layer, TPBi was deposited to form a 300 Å-thick buffer layer, and then LiF was deposited to form a 10 Å-thick electron injection layer.

Then, Al was provided to form a 3000 Å-thick second electrode. P4 was deposited in vacuum on the upper portion of the second electrode to form a 700 Å-thick capping layer.

Evaluation of Light Emitting Device Characteristics

Evaluation results of the light emitting devices of Examples 1 to 6 and Comparative Examples 1 to 3 are listed in Table 1. Driving voltage, luminous efficiency, and a device service life ratio of the manufactured light emitting devices are listed in comparison in Table 1. The evaluation results of the characteristics for Examples and Comparative Examples listed in Table 1 show the driving voltage and luminous efficiency values at a current density of 10 mA/cm$^2$. Also, the device service life ratio shows, as a relative numerical value in comparison with Comparative Example 1, the deterioration time from an initial luminance to 50% luminance when the device was continuously operated at a current density of 10 mA/cm$^2$.

It was confirmed that the manufactured devices all show blue emission colors.

Current densities, driving voltages and luminous efficiencies of the light emitting devices of Examples and Comparative Examples were measured in a dark room by using 2400 Series Source Meter from Keithley Instruments, Inc., CS-200, Color and Luminance Meter from Konica Minolta, Inc., and PC Program LabVIEW 2.0 for the measurement from Japan National Instrument, Inc.

TABLE 1

| Device Manufacture examples | Emission layer materials | Driving voltage (V) | Luminous efficiency (cd/A) | Relative device service life ratio |
|---|---|---|---|---|
| Example 1 | Example Compound 6 | 4.2 | 27.3 | 1.45 |
| Example 2 | Example Compound 26 | 4.3 | 26.7 | 1.42 |
| Example 3 | Example Compound 30 | 4.2 | 27.3 | 1.52 |
| Example 4 | Example Compound 48 | 4.3 | 26.5 | 1.38 |
| Example 5 | Example Compound 76 | 4.5 | 23.2 | 1.27 |
| Example 6 | Example Compound 120 | 4.2 | 28.5 | 1.50 |
| Comparative Example 1 | Comparative Example Compound C1 | 5.5 | 15.7 | 1.00 |
| Comparative Example 2 | Comparative Example Compound C2 | 4.5 | 21.0 | 1.22 |
| Comparative Example 3 | Comparative Example Compound C3 | 4.6 | 19.5 | 0.75 |

Referring to the results of Table 1, it can be seen that Examples of the light emitting devices using the condensed cyclic compounds according to examples of the present disclosure as dopant materials exhibit low driving voltage, excellent device efficiency, and improved device service life characteristics.

That is, referring to Table 1, it can be seen that the devices of Examples 1 to 6 exhibit low voltage, long service life, and high efficiency characteristics compared to those of Comparative Examples 1 to 3.

Example Compounds include at least one bulky substituent to shield a boron atom from being exposed to a charge, and thus, the stability of the condensed cyclic compound increases, thereby improving service life characteristics of the devices. In addition, it can be confirmed that energy transfer between molecules is suppressed due to a stable molecular structure, thereby exhibiting low driving voltage and high luminous efficiency characteristics.

Thus, Examples 1 to 6 show results of improving both the luminous efficiency and the light emitting service life compared to Comparative Examples 1 to 3. For example, the device efficiency and the device service life of the light emitting devices of examples may be improved concurrently (e.g., simultaneously) by using the condensed cyclic compounds of examples having a structure which includes at least one substituent with an o-biphenyl derivative structure in a di-boron-based condensed cyclic ring containing two boron atoms.

The condensed cyclic compounds according to examples may include at least one substituent with an o-biphenyl derivative structure to thus have high charge stability, thereby contributing long service life and high efficiency characteristics of the light emitting devices. In addition, the light emitting devices according to examples may include the condensed cyclic compound of examples, thereby exhibiting long service life and high efficiency characteristics concurrently (e.g., simultaneously).

The light emitting device of an embodiment may include the condensed cyclic compound of an embodiment, thereby exhibiting high efficiency and long service life characteristics.

Although the subject matter of the present disclosure has been described with reference to example embodiments of the present disclosure, it will be understood that the present disclosure should not be limited to these example embodiments but various changes and modifications can be made by those skilled in the art without departing from the spirit and scope of the present disclosure.

Accordingly, the technical scope of the present disclosure is not intended to be limited to the contents set forth in the detailed description of the specification, but is intended to be defined by the appended claims, and equivalents thereof.

What is claimed is:

1. A light emitting device comprising:

a first electrode;

a second electrode on the first electrode; and an emission layer which is between the first electrode and the second electrode and comprises a condensed cyclic compound represented by Formula 1 below, wherein the first electrode and the second electrode each independently comprises any one selected from among Ag, Mg, Cu, Al, Pt, Pd, Au, Ni, Nd, Ir, Cr, Li, Ca, LiF/Ca, LiF/AI, Mo, Ti, W, In, Sn, Zn, a compound of two or more thereof, a mixture of two or more thereof, and an oxide thereof:

Formula 1

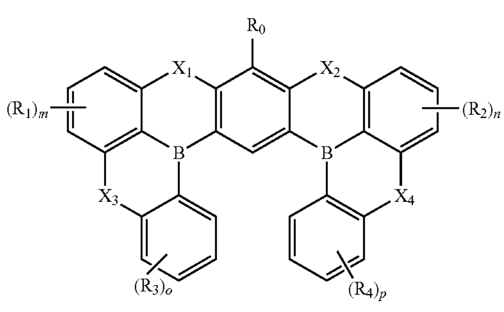

wherein, in Formula 1, $X_1$ to $X_4$ are each independently O, S, $CR_5R_6$, or $NR_7$, m and n are each independently an integer of 0 to 3, and p are each independently an integer of 0 to 4, $R_0$ to $R_7$ are each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 10 carbon atoms, a substituted or unsubstituted aryl group having 6 to 30 ring-forming carbon atoms, or a substituted or unsubstituted heterocycle having 2 to 30 ring-forming carbon atoms, and at least one selected from among $R_1$ to $R_7$ comprises a substituent represented by Formula 2 or Formula 3 below:

Formula 2

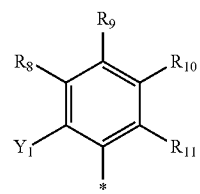

Formula 3

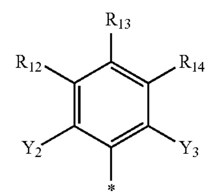

wherein, in Formula 2 and Formula 3, $Y_1$ to $Y_3$ are each independently a substituted or unsubstituted aryl group having 6 to 30 ring-forming carbon atoms, a substituted or unsubstituted amine group, or a substituted or unsubstituted heterocycle having 2 to 30 ring-forming carbon atoms, and $R_8$ to $R_{14}$ are independently a hydrogen atom, a deuterium atom, a halogen atom, a cyano group, a nitro group, a substituted or a unsubstituted silyl group, or a substituted or unsubstituted alkyl group having 1 to 10 carbons atoms "*"indicates a bonding point to another atom in the $R_1$ to $R_7$ group or the condensed cyclic compound represented by Formula 1.

2. The light emitting device of claim 1, wherein Formula 1 above is represented by any one selected from among Formula 1-1 to Formula 1-6 below:

Formula 1-1

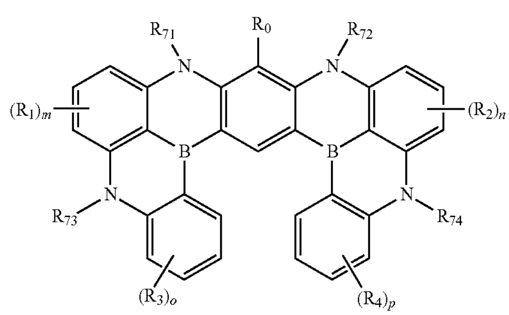

-continued

Formula 1-2

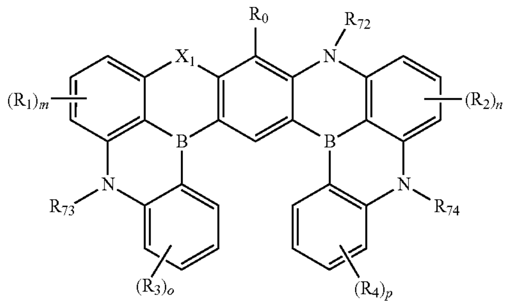

Formula 1-3

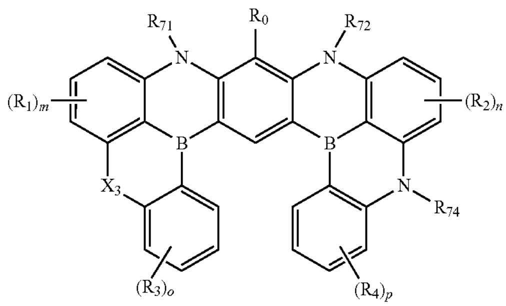

Formula 1-4

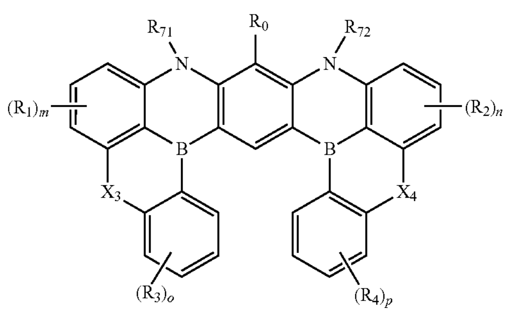

Formula 1-5

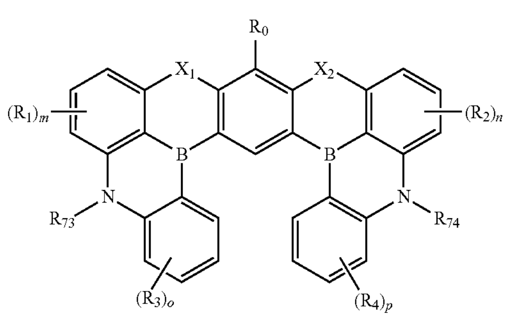

-continued

Formula 1-6

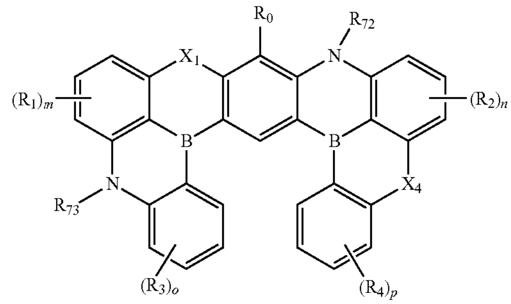

wherein, in Formula 1-1 to Formula 1-6 above, $R_{71}$ to $R_{74}$ each independently correspond to $R_7$ defined in Formula 1 above, $X_1$ to $X_4$, $R_0$ to $R_4$, and m to p are the same as defined with respect to Formula 1.

3. The light emitting device of claim 1, wherein at least two selected from among $X_1$ to $X_4$ are $NR_7$, and the rest are each independently O, S, or $CR_5R_6$, and $R_5$ to $R_7$ are the same as defined with respect to Formula 1.

4. The light emitting device of claim 1, wherein Formula 2 above is represented by Formula 2-1 below:

Formula 2-1

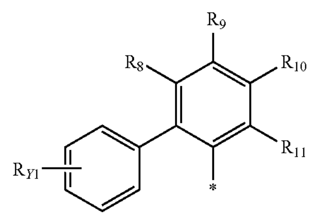

wherein, in Formula 2-1 above, $R_{Y1}$ is a hydrogen atom, a deuterium atom, a halogen atom, a cyano group, a nitro group, a substituted or unsubstituted silyl group, or a substituted or unsubstituted alkyl group having 1 to 10 carbon atoms, and $R_8$ to $R_{11}$ are the same as defined with respect to Formula 2.

5. The light emitting device of claim 1, wherein Formula 3 is represented by Formula 3-1 below:

Formula 3-1

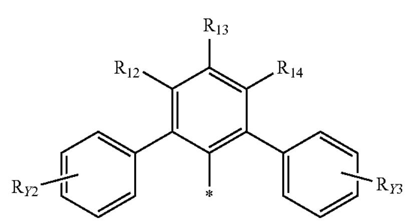

wherein, in Formula 3-1, $R_{Y2}$ and $R_{Y3}$ are each independently a hydrogen atom, a deuterium atom, a halogen atom, a cyano group, a nitro group, a substituted or unsubstituted silyl group, or a substituted or unsubstituted alkyl group having 1 to 10 carbon atoms, and $R_{12}$ to $R_{14}$ are the same as defined with respect to Formula 3.

6. The light emitting device of claim 1, wherein Y1 to Y3 are each independently an unsubstituted phenyl group, or a phenyl group substituted with an alkyl group having 1 to 10 carbon atoms.

7. The light emitting device of claim 1, wherein at least one selected from among $R_1$ to $R_7$ comprises any one selected from among S-1 to S-3 below:

S-1

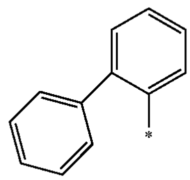

S-2

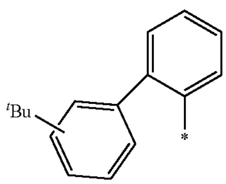

S-3

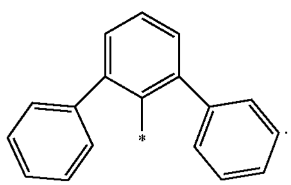

8. The light emitting device of claim 1, wherein m and n are 1, $R_1$ and $R_2$ are each independently $NR_aR_b$, and at least one selected from among $R_a$, $R_b$, and $R_7$ is represented by Formula 2 or Formula 3, and the rest are substituted or unsubstituted aryl groups having 6 to 30 ring-forming carbon atoms.

9. The light emitting device of claim 1, wherein m and n are 1, and $R_1$ and $R_2$ are represented by any one selected from among AM-1 to AM-11 below:

AM-1

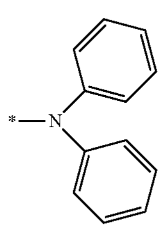

AM-2

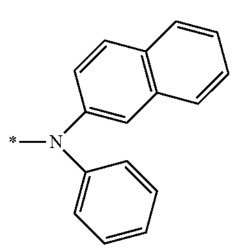

-continued

AM-3

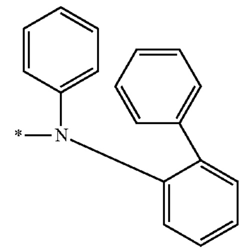

AM-4

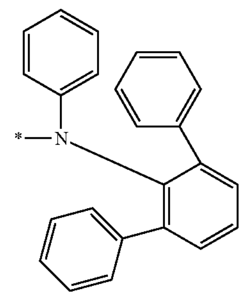

AM-5

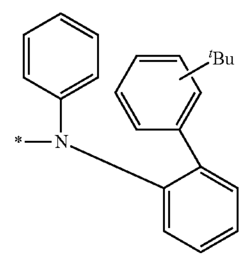

AM-6

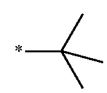

AM-7

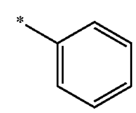

AM-8

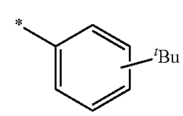

AM-9

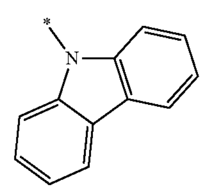

AM-10

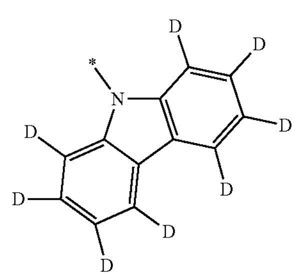

-continued

AM-11

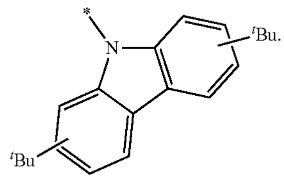

10. The light emitting device of claim 1, further comprising a capping layer on the second electrode, wherein the capping layer has a refractive index of about 1.6 or more.

11. The light emitting device of claim 1, wherein the emission layer is a delayed fluorescence emission layer containing a host and a dopant, and the dopant comprises the condensed cyclic compound.

12. The light emitting device of claim 1, wherein the emission layer emits blue light having a center wavelength of about 450 nm to about 470 nm.

13. The light emitting device of claim 1, wherein the emission layer comprises at least one selected from among the condensed cyclic compounds of Compound Group 1 below:

Compound Group 1

1

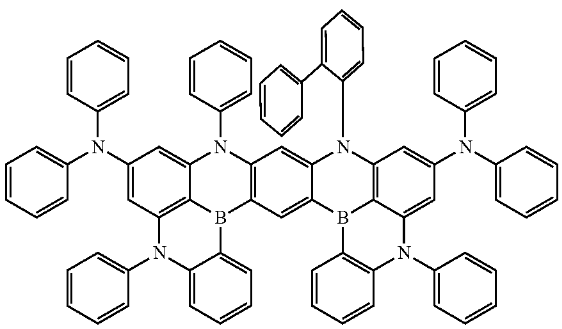

2

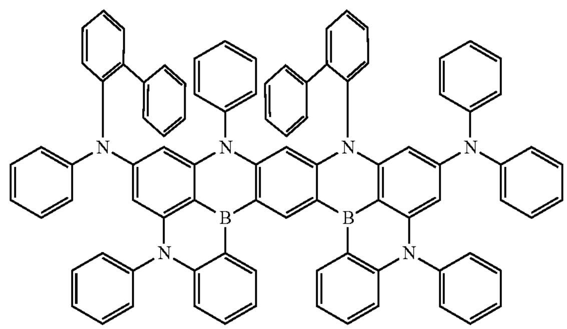

3

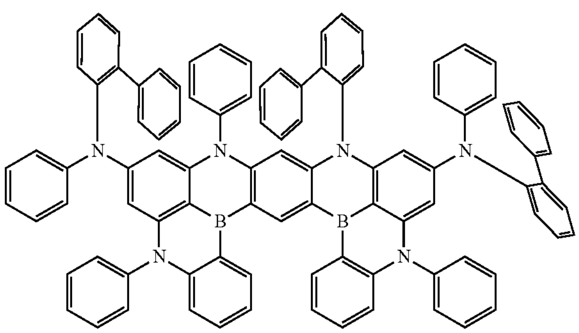

4

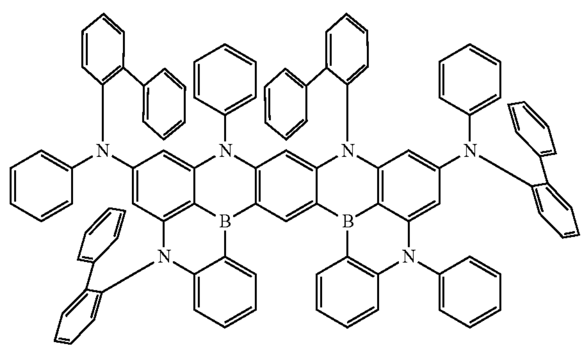

5

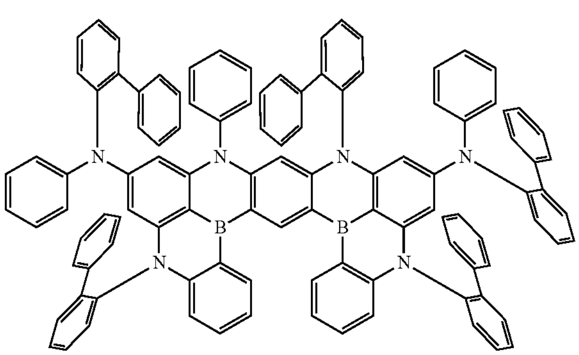

6

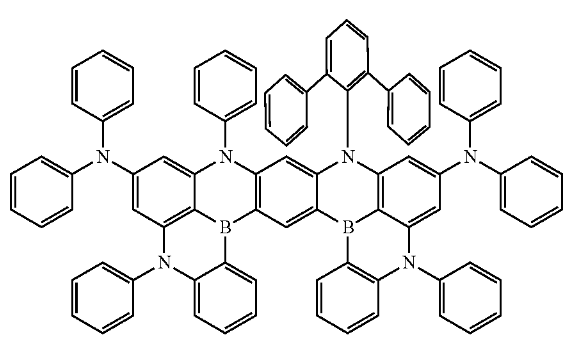

-continued
7
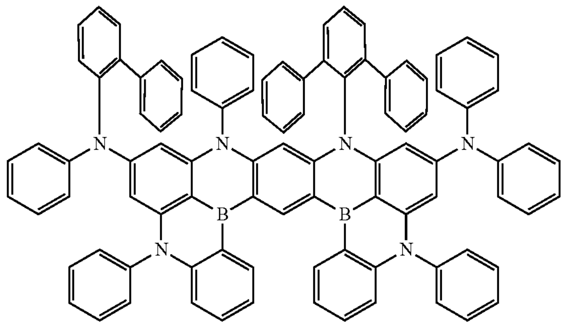
8
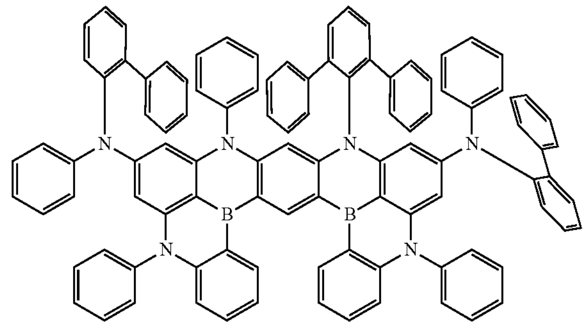
9
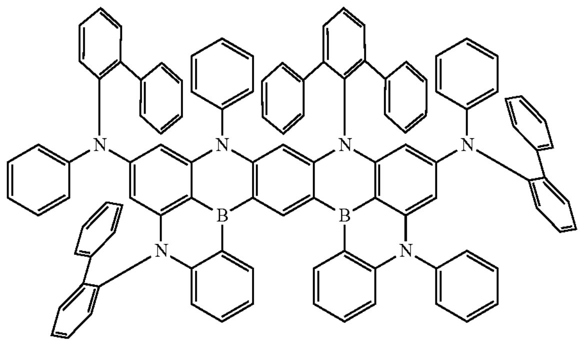
10
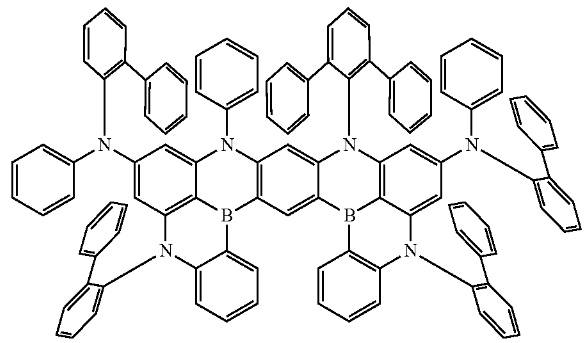
11
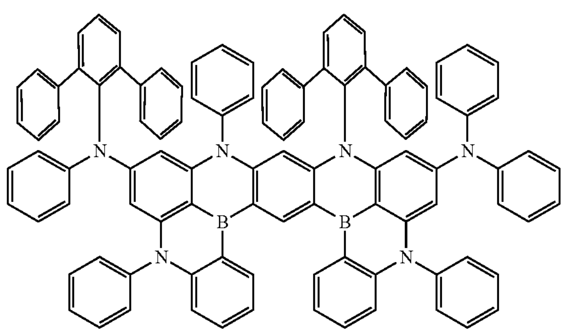
12
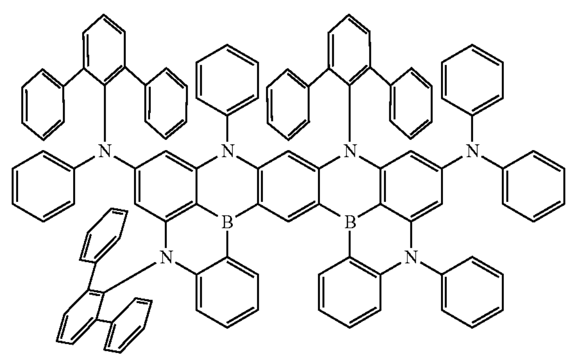
13
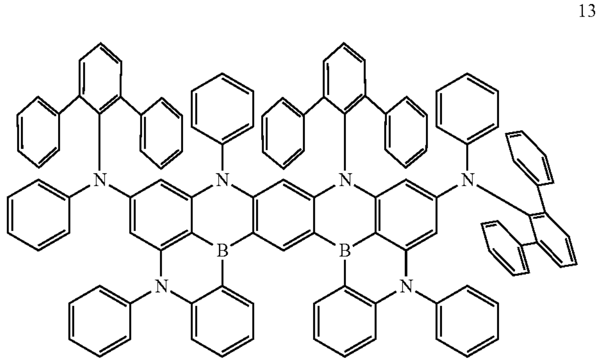
14
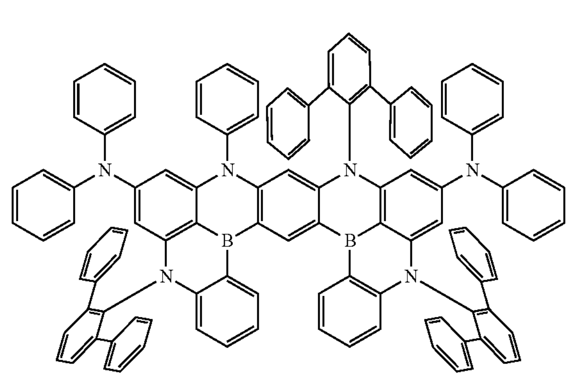

-continued
15
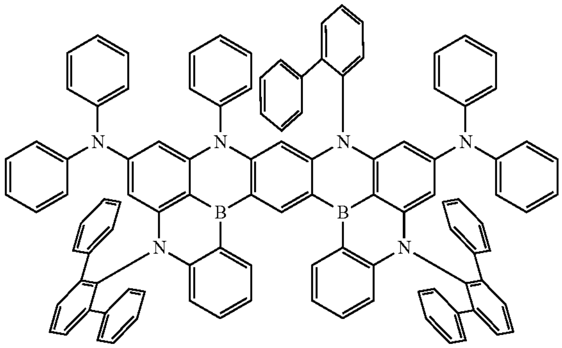
16
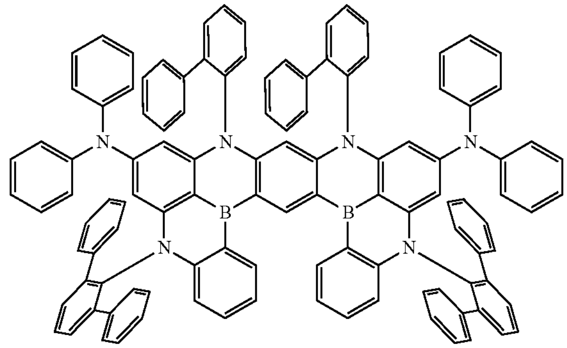
17
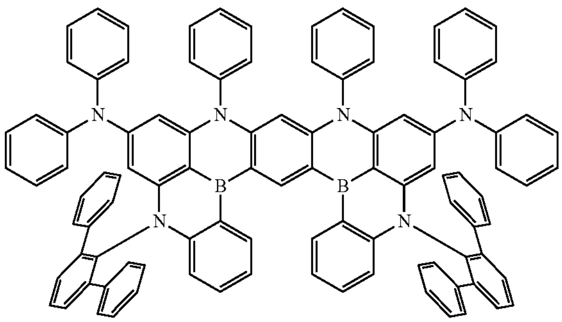
18
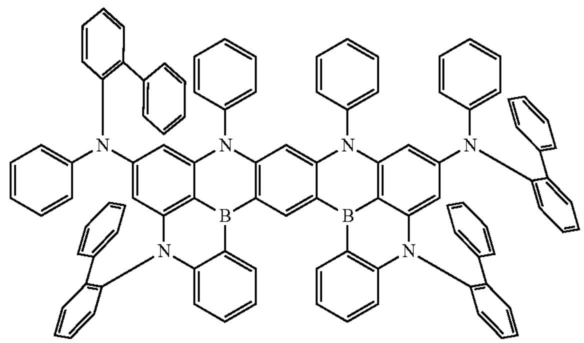
19
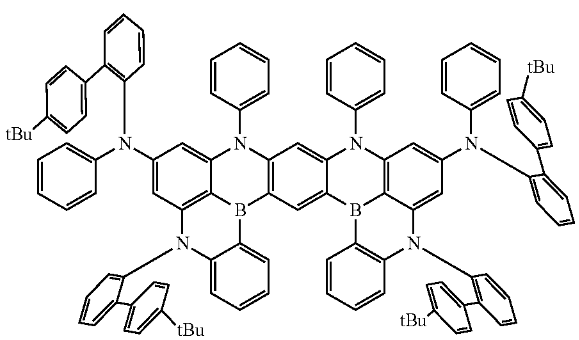
20
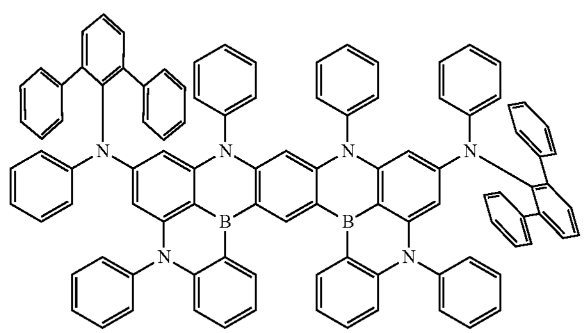
21
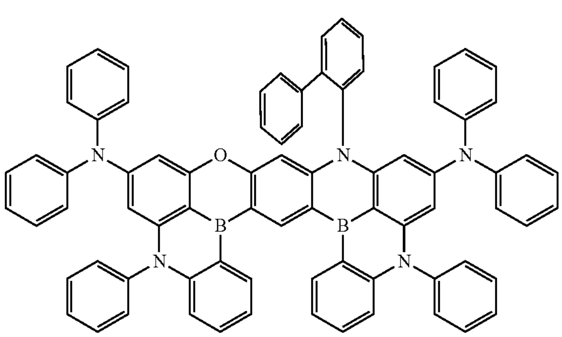
22
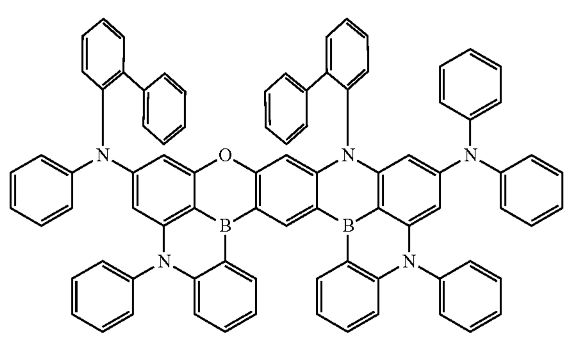

-continued
23
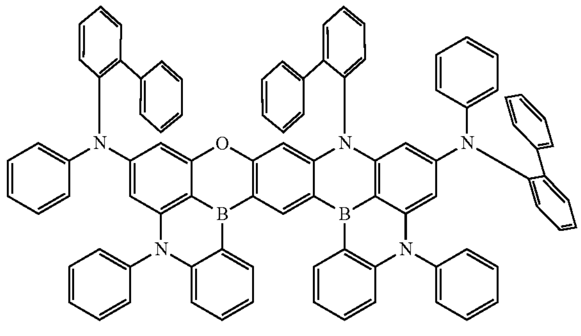
24
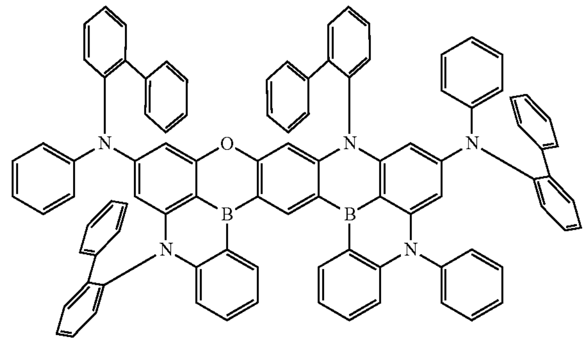
25
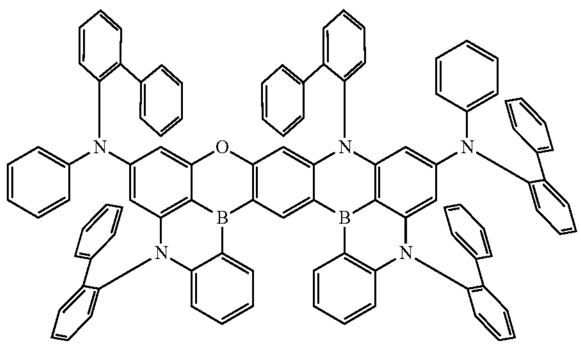
26
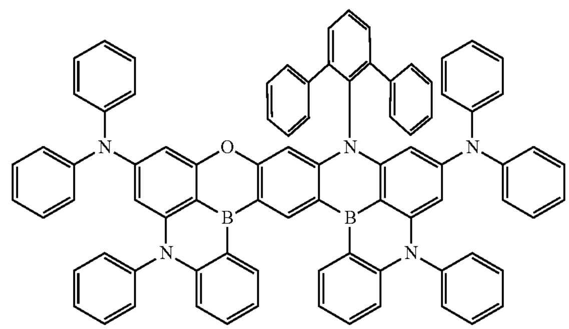
27
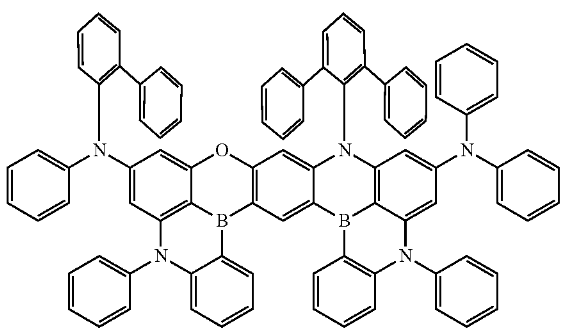
28
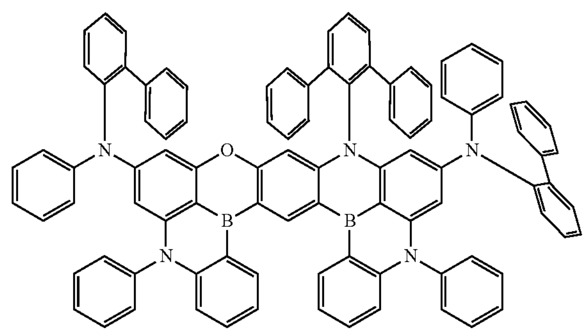
29
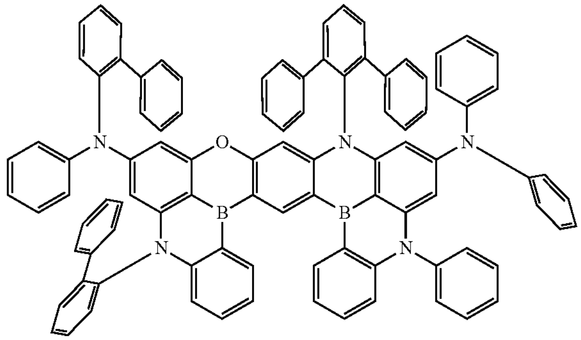
30
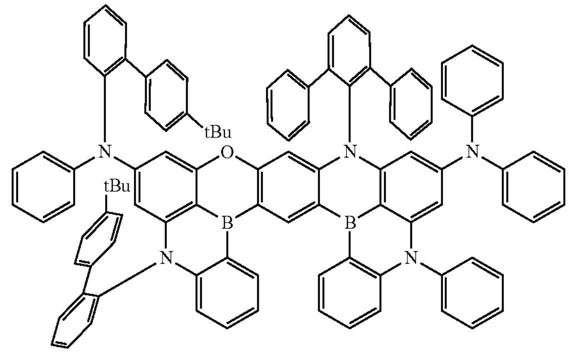

-continued
31
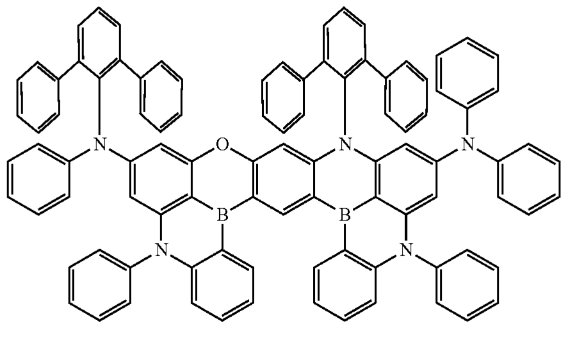
32
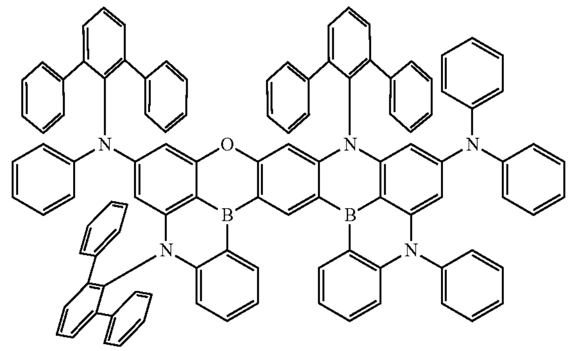
33
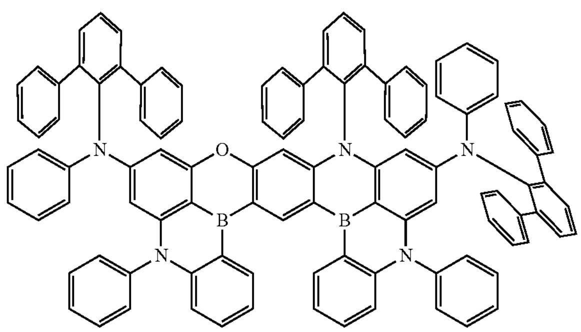
34
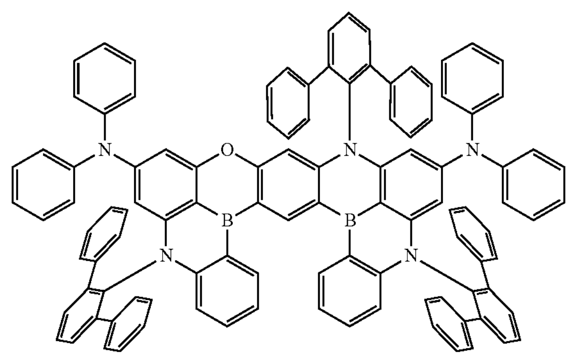
35
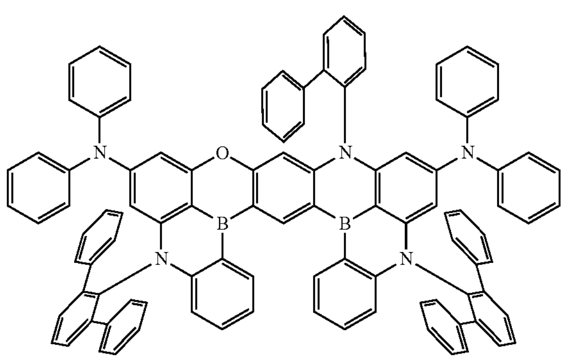
36
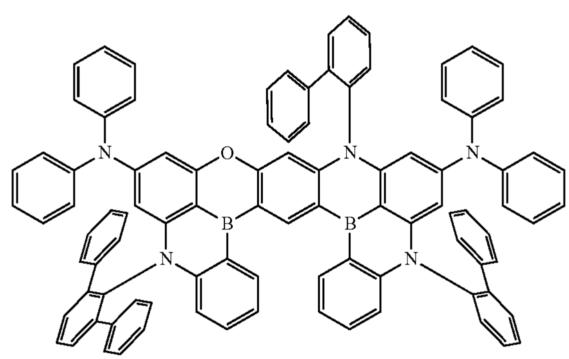
37
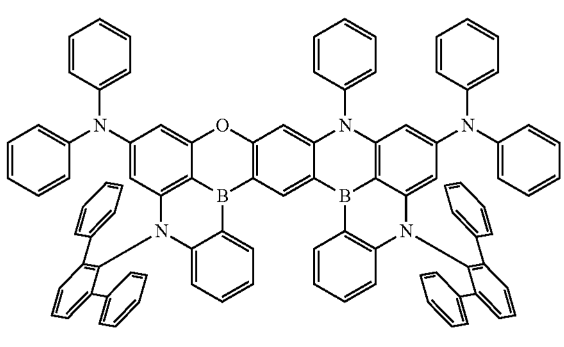
38
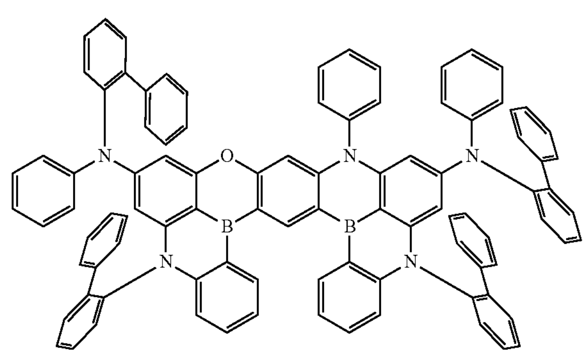

-continued
39
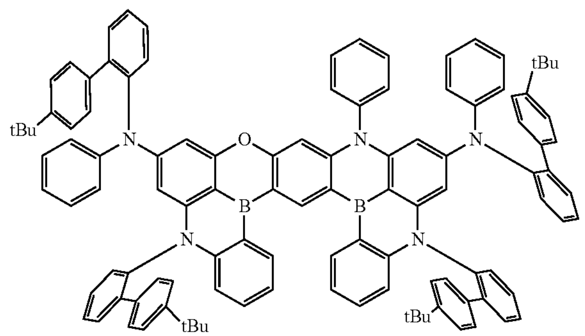
40
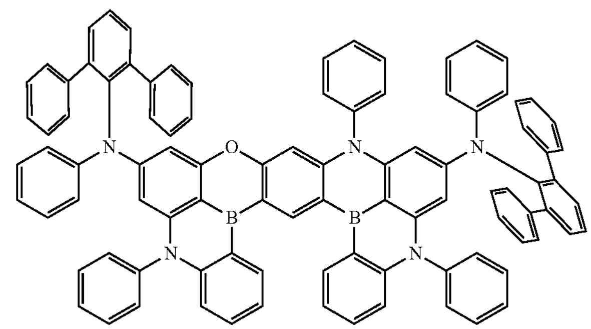
41
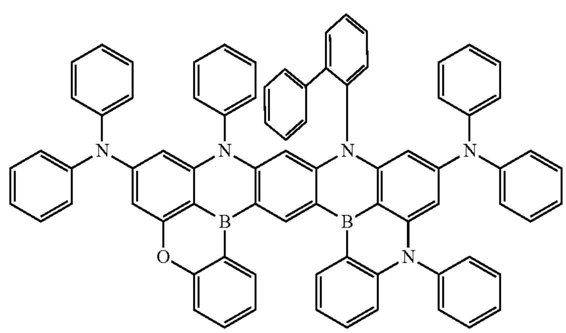
42
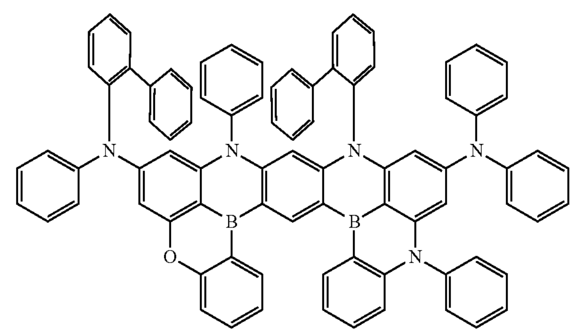
43
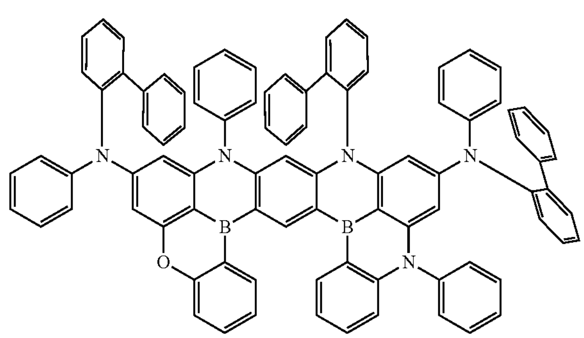
44
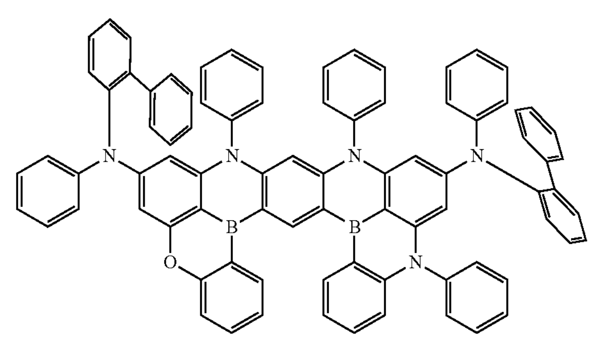
45
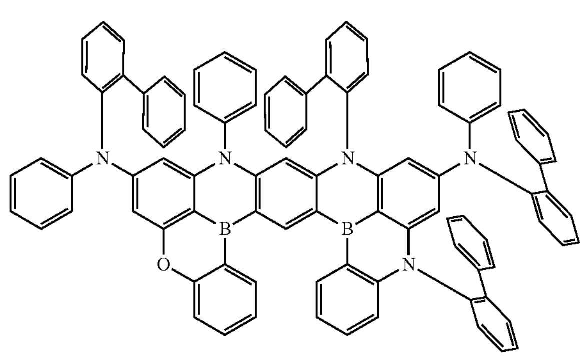
46
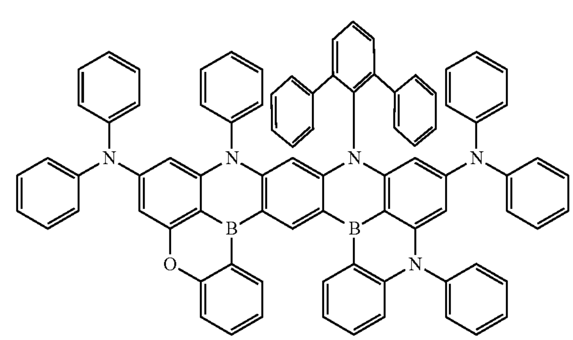

-continued
47
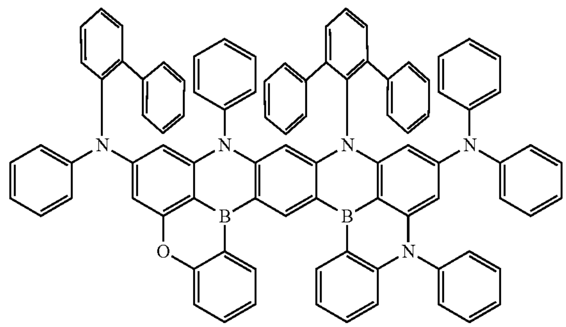
48
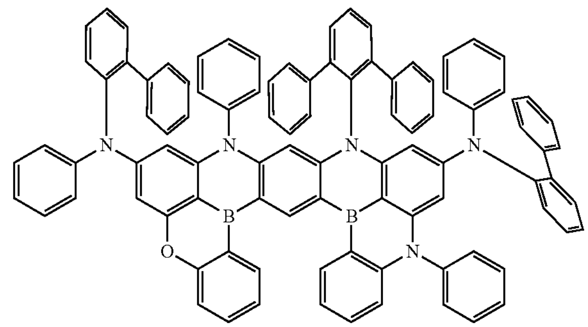
49
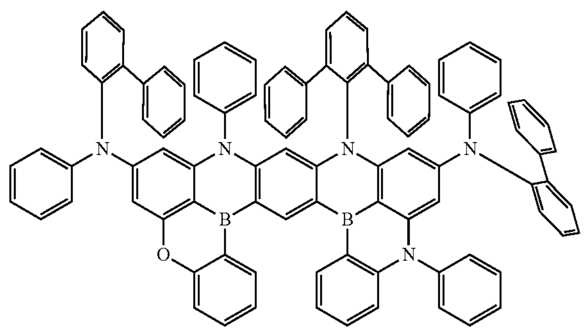
50
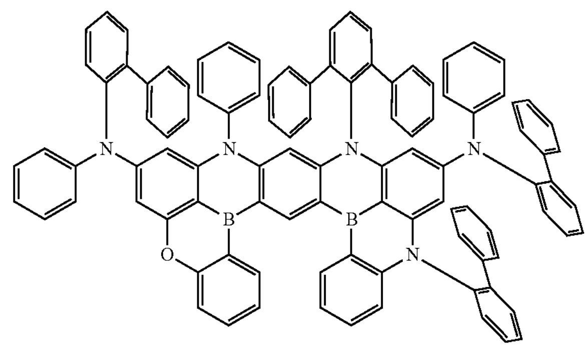
51
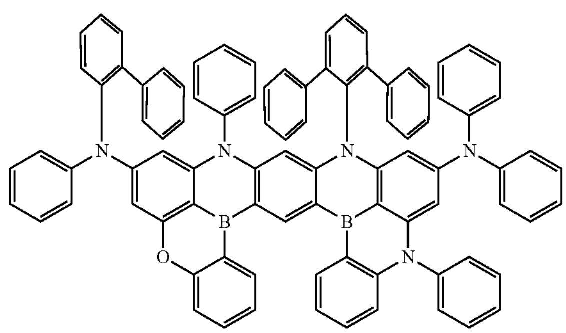
52
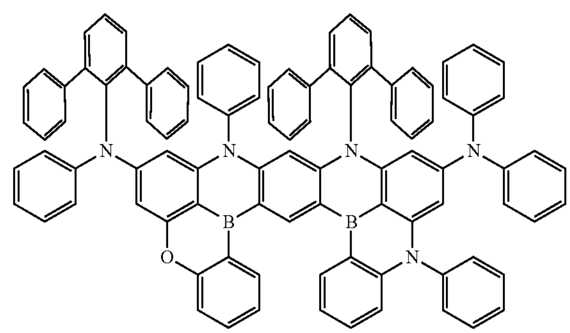
53
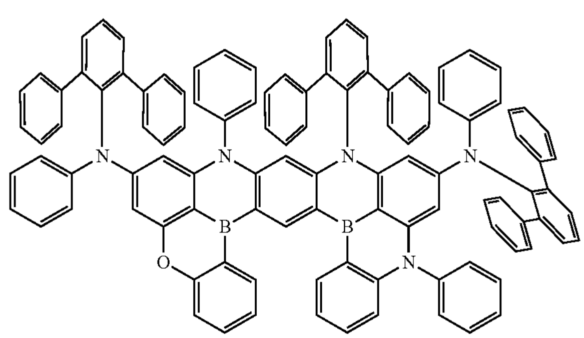
54
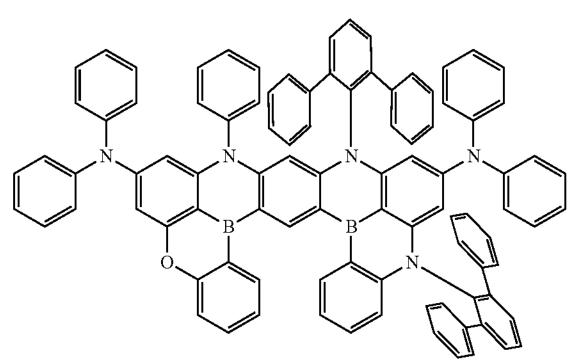

-continued
55
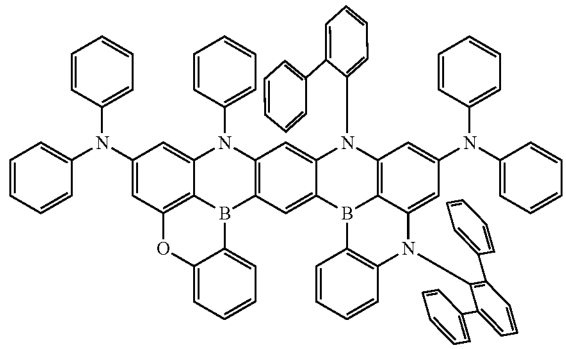
56
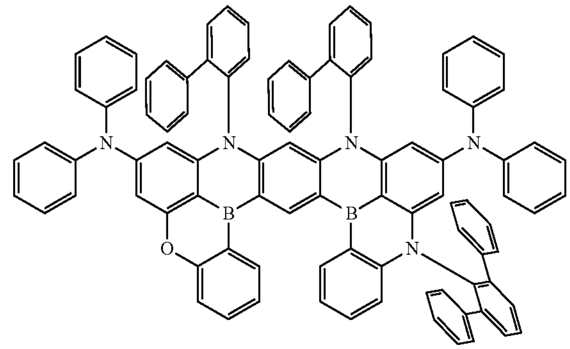
57
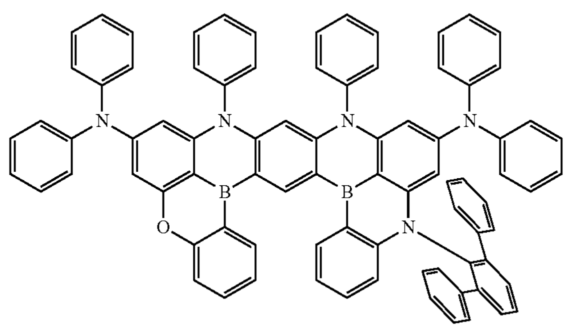
58
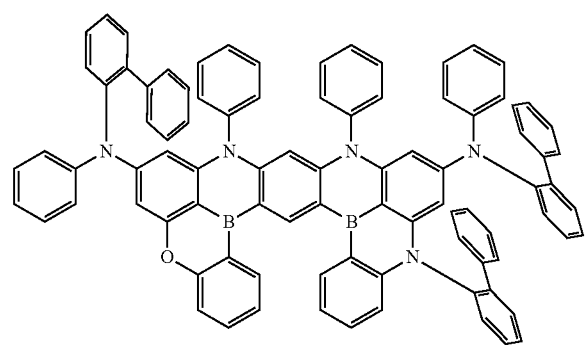
59
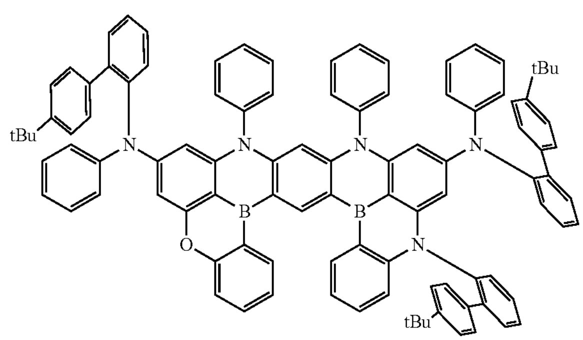
60
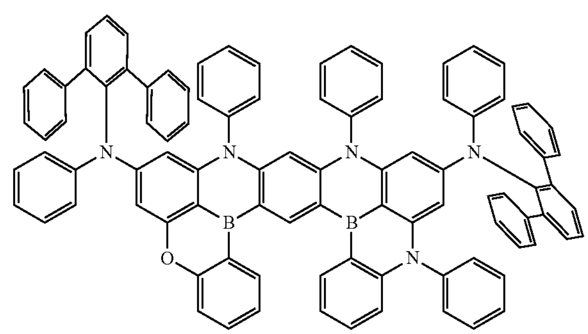
61
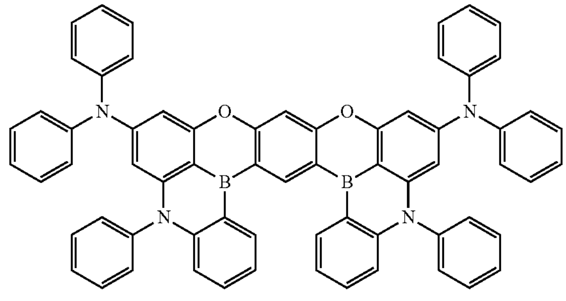
62
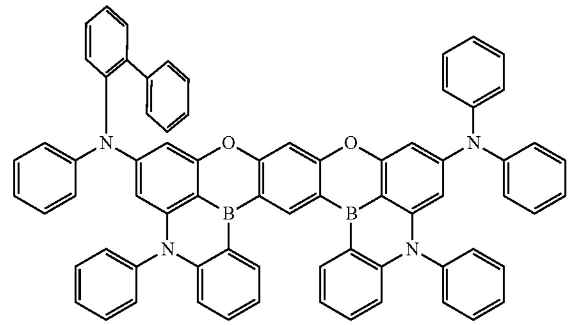

-continued
63
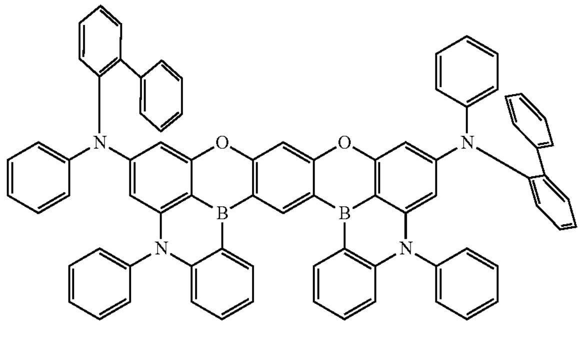
64
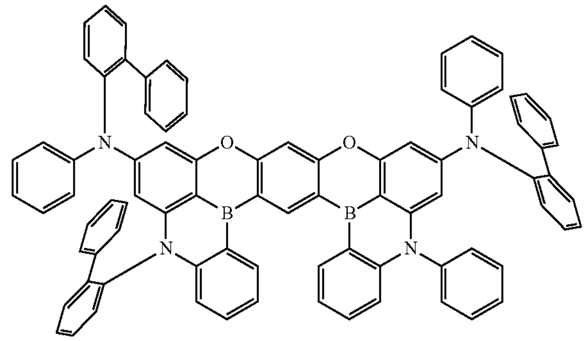
65
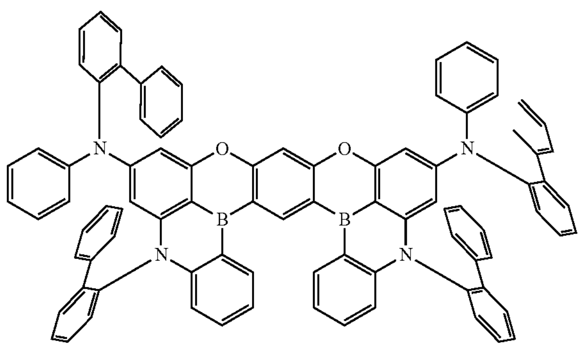
66
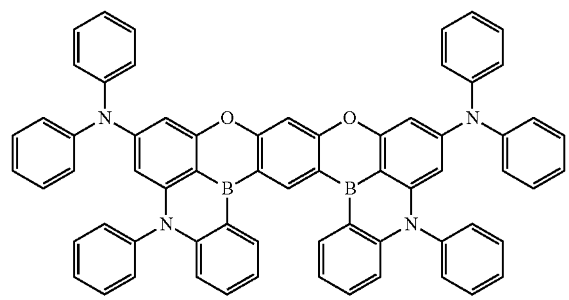
67
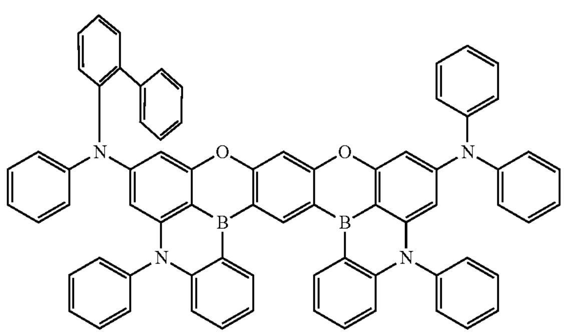
68
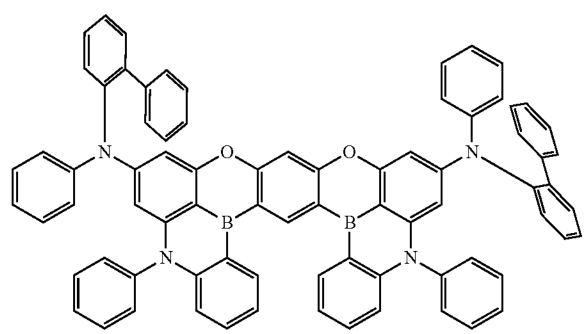
69
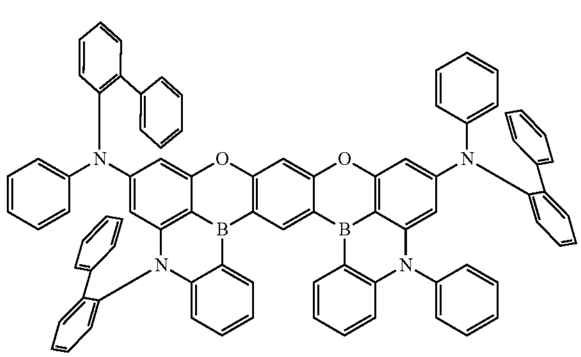
70
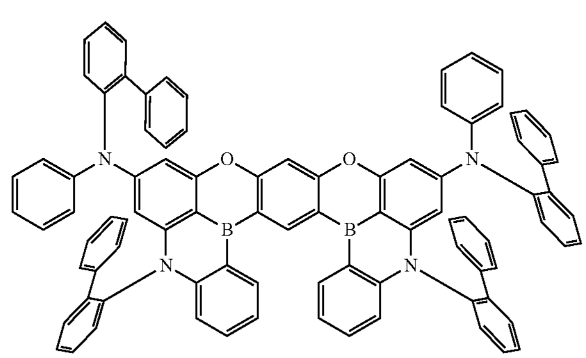

-continued
71
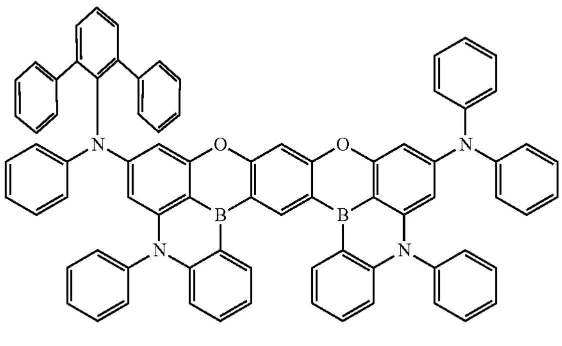
72
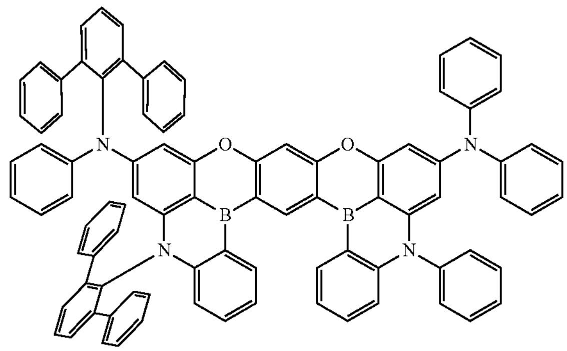
73
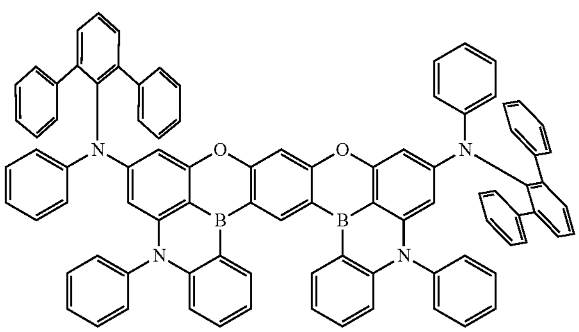
74
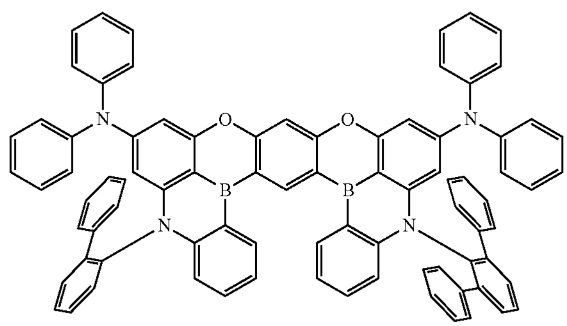
75
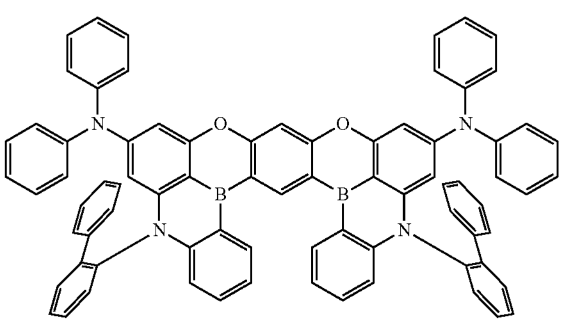
76
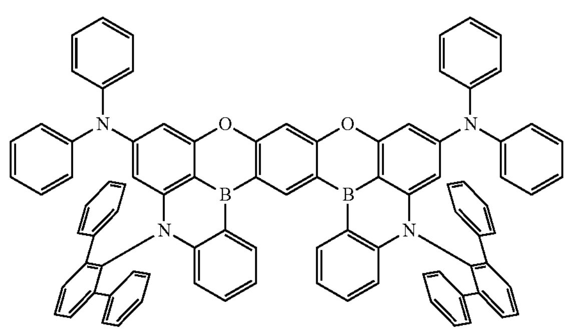
77
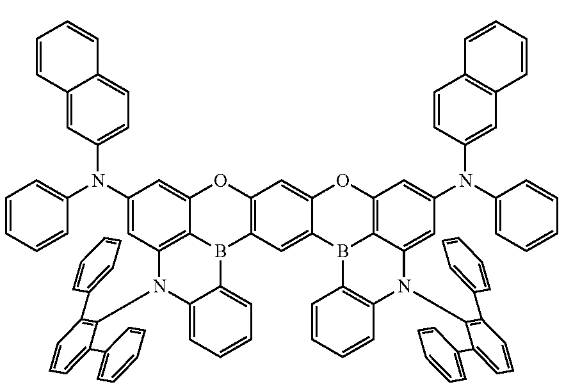
78
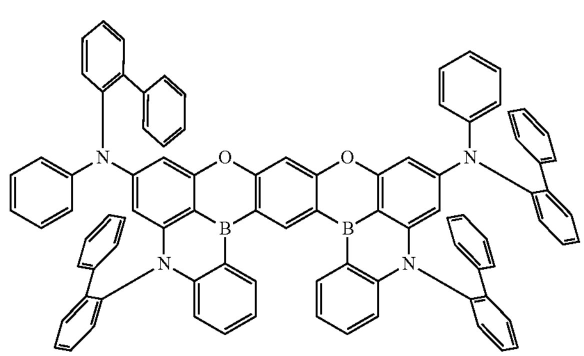

-continued
79
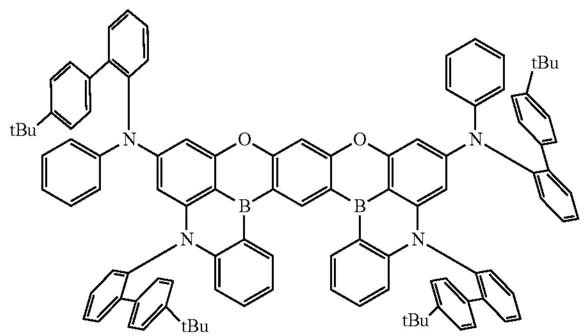
80
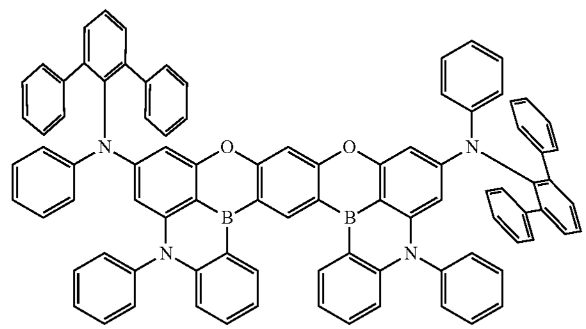
81
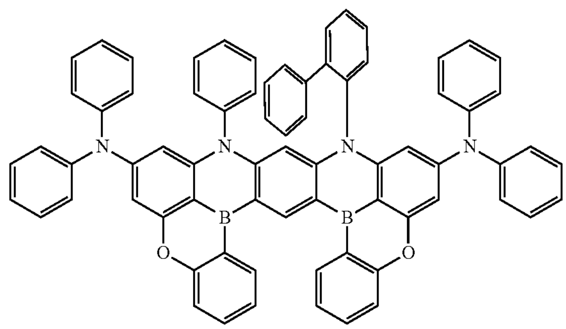
82
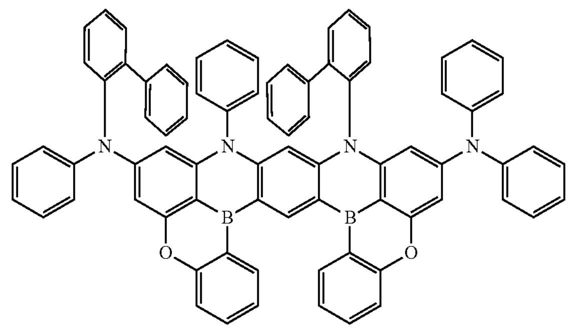
83
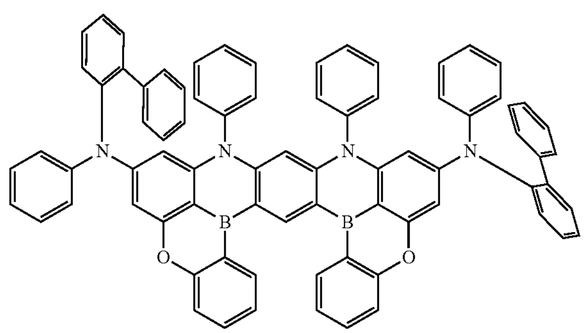
84
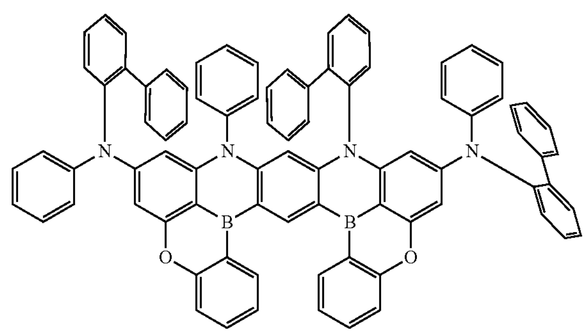
85
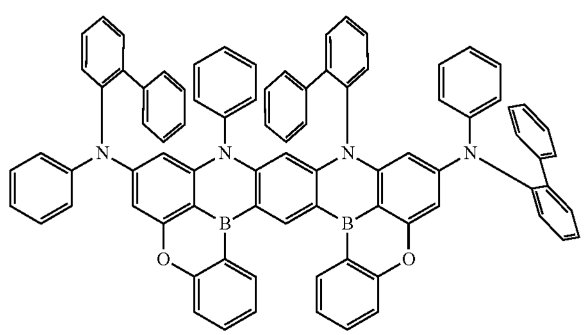
86
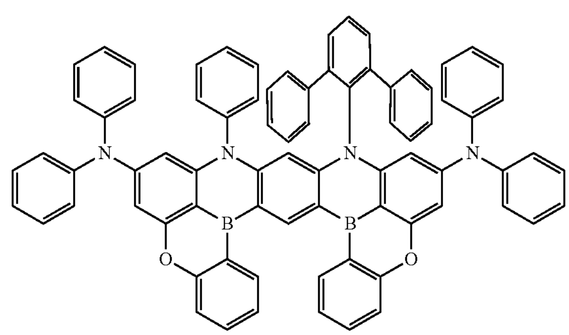

-continued
87
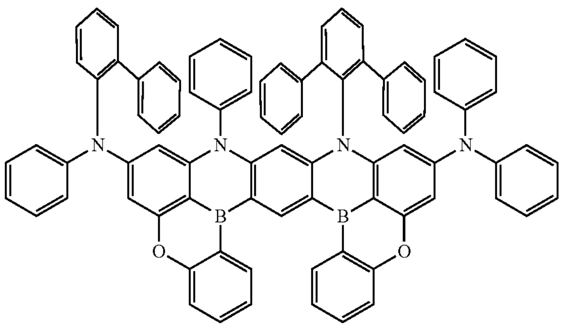
88
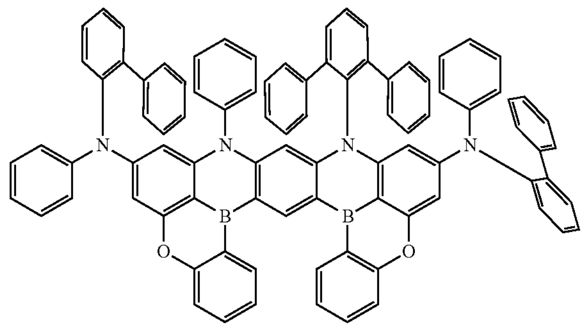
89
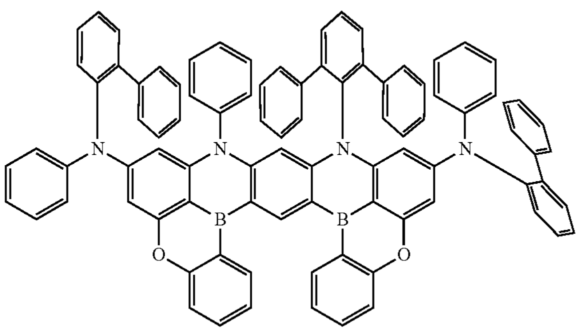
90
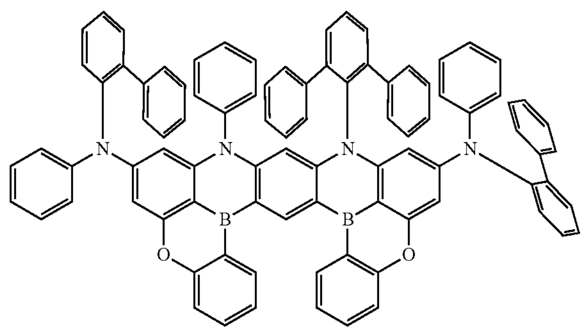
91
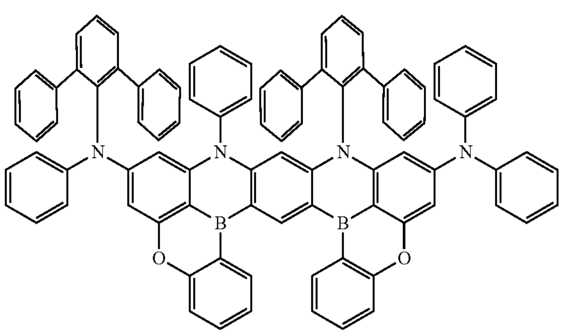
92
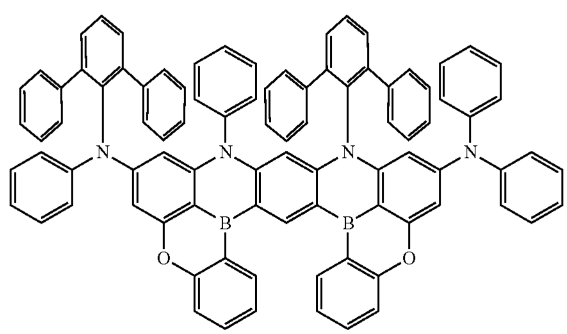
93
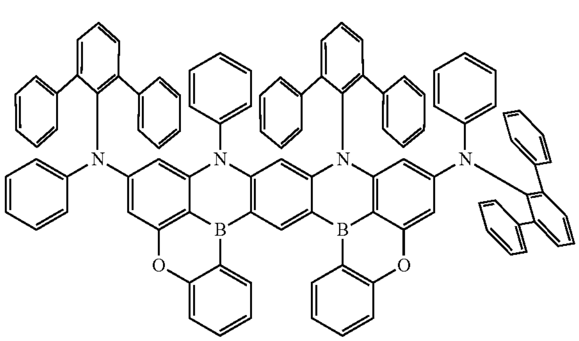
94
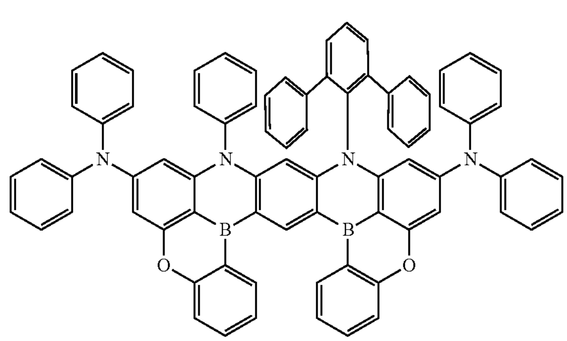

-continued
95
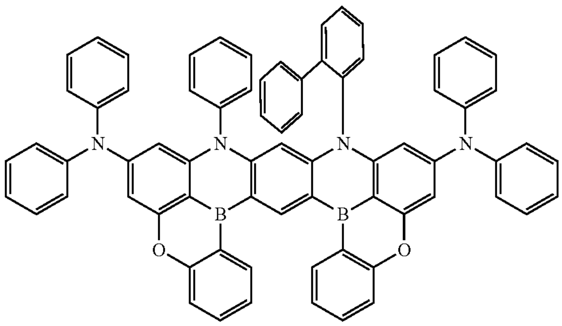
96
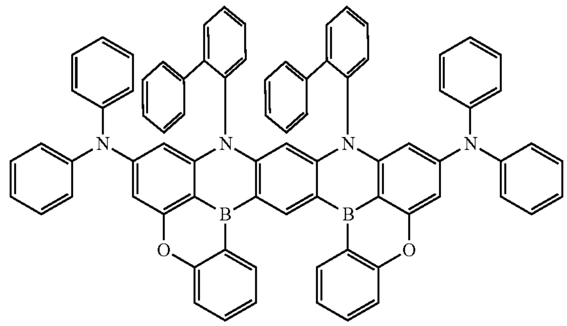
97
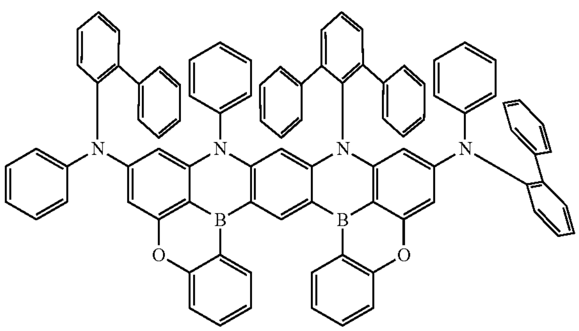
98
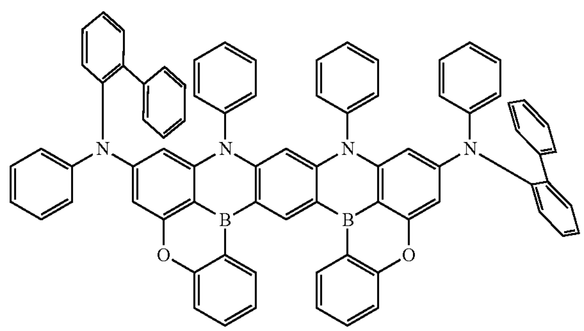
99
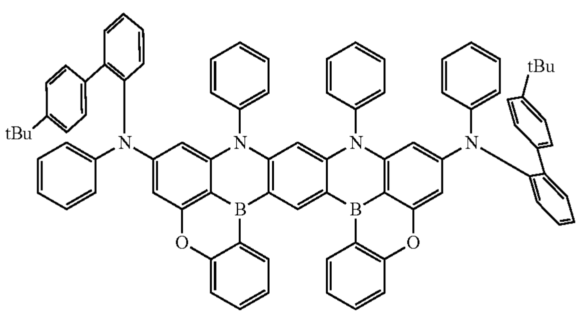
100
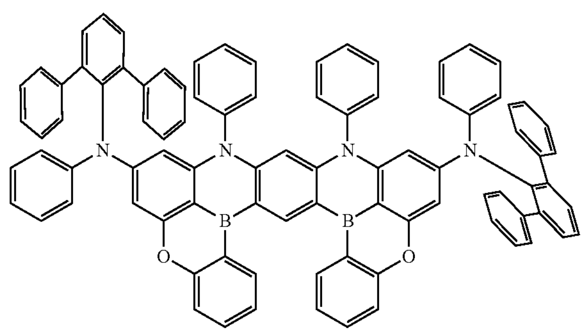
101
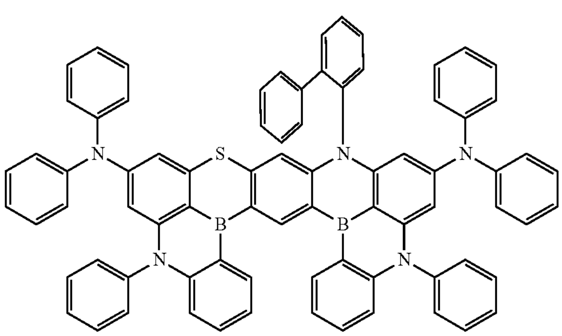
102
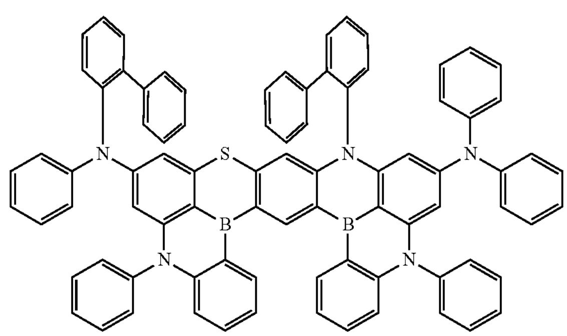

-continued
103
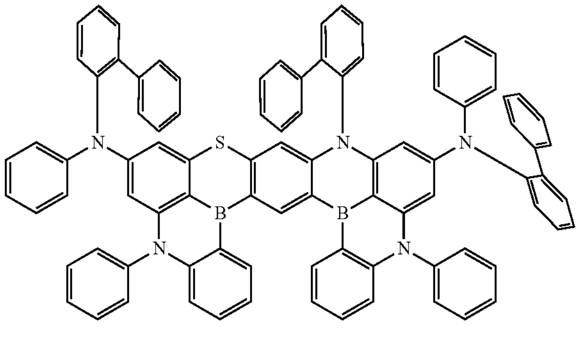
104
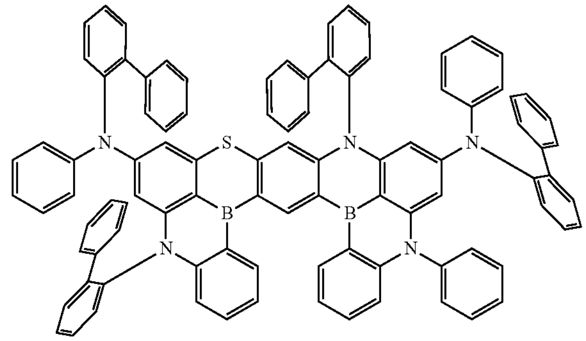
105
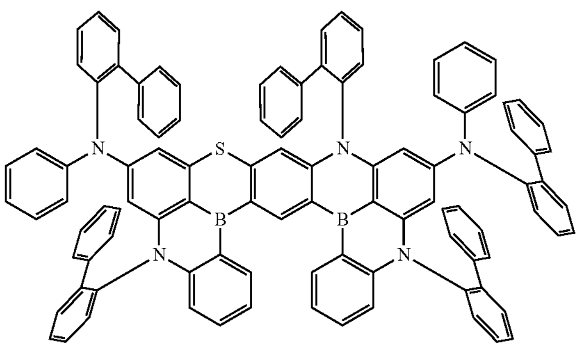
106
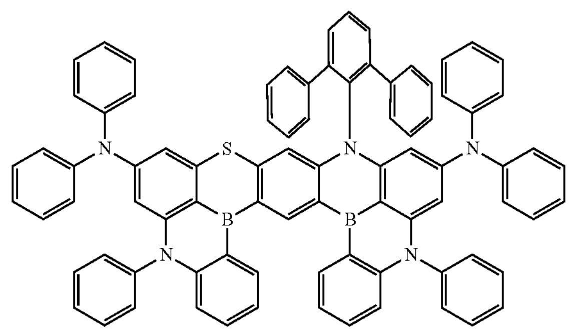
107
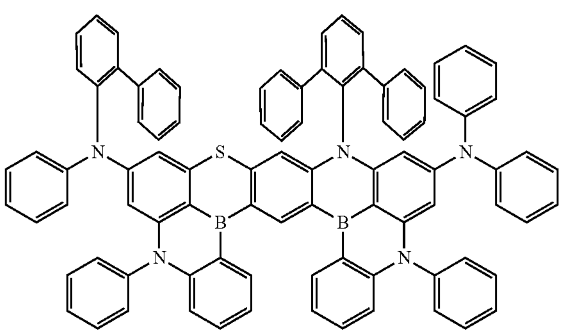
108
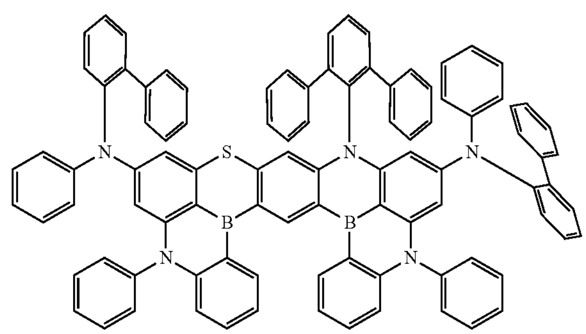
109
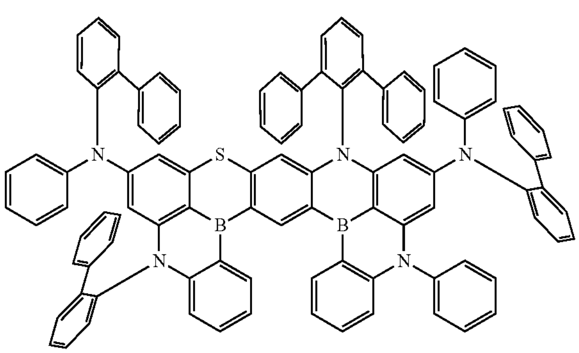
110
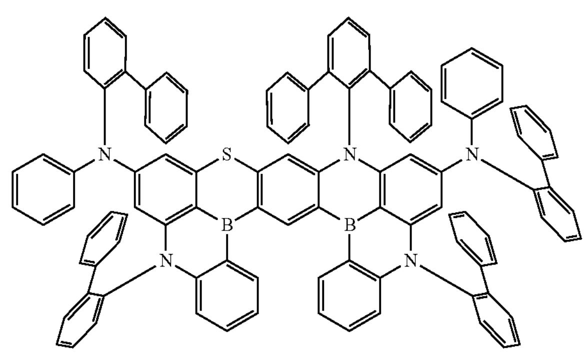

-continued
111
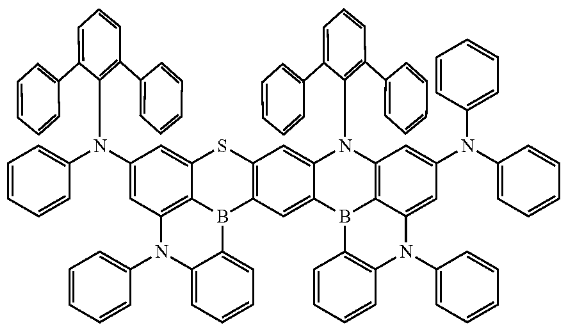
112
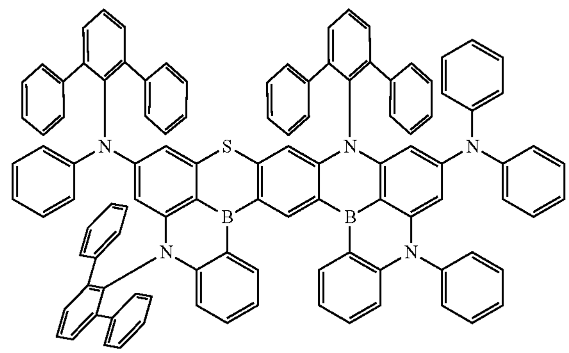
113
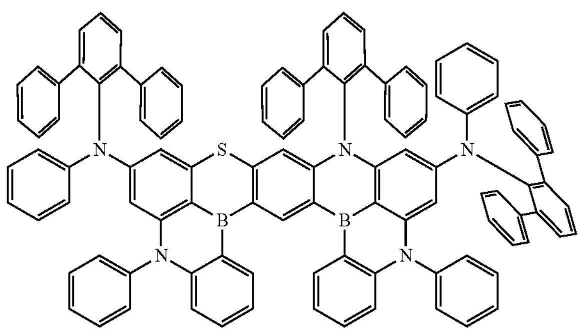
114
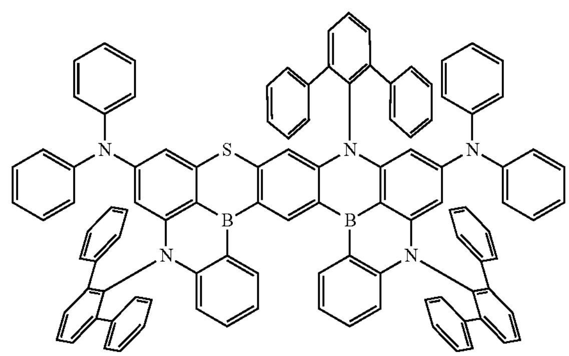
115
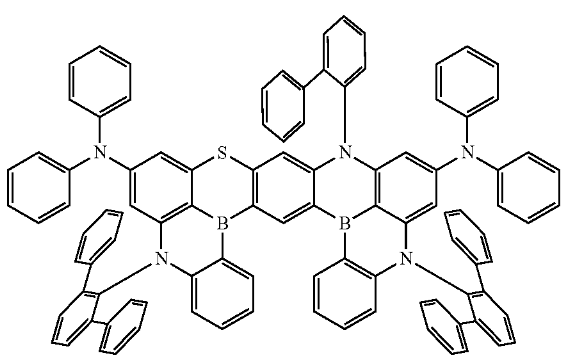
116
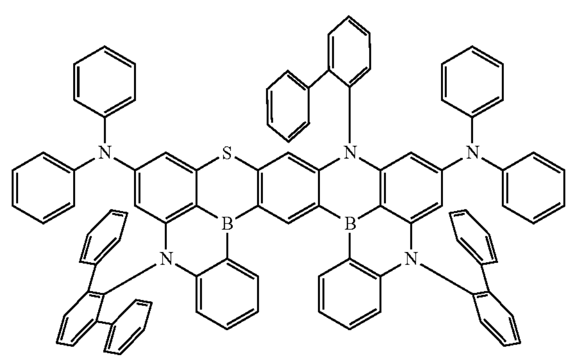
117
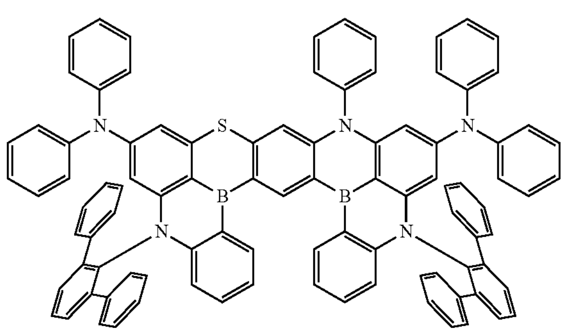
118
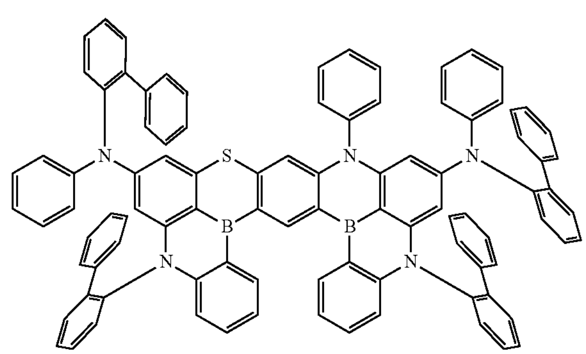

-continued
119
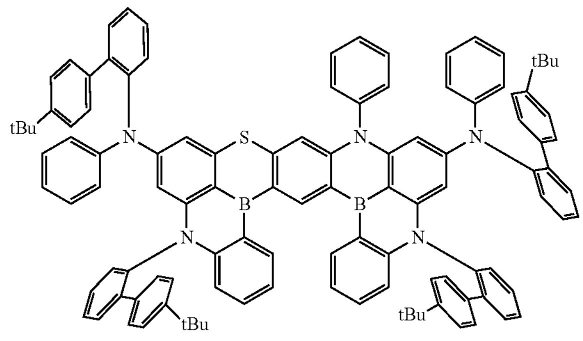
120
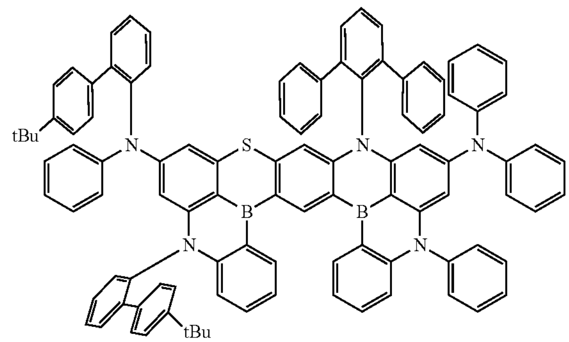
121
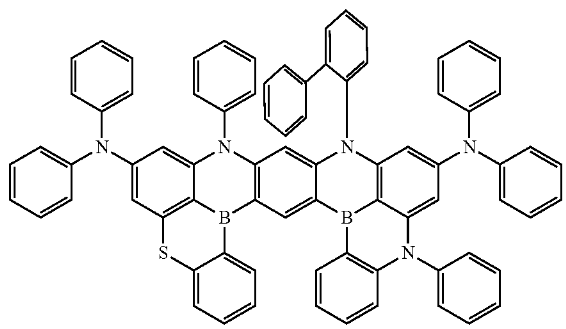
122
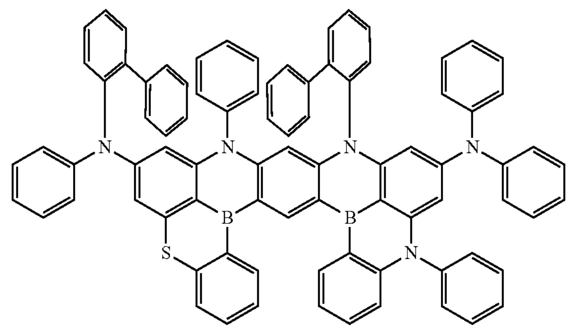
123
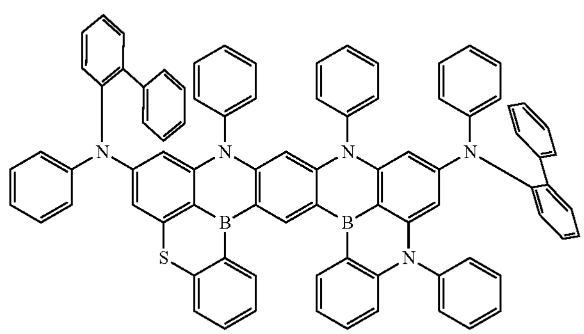
124
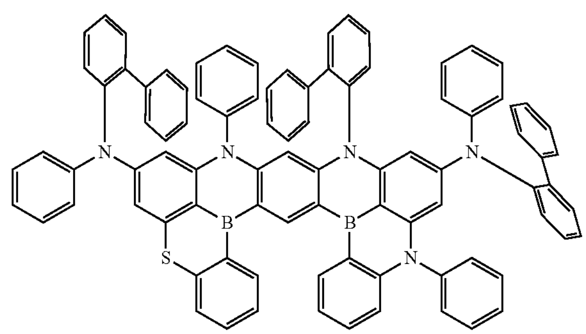
125
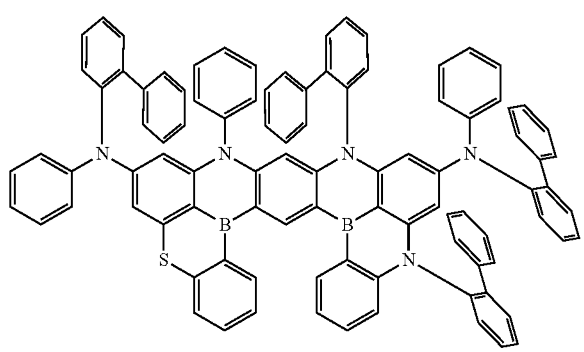
126
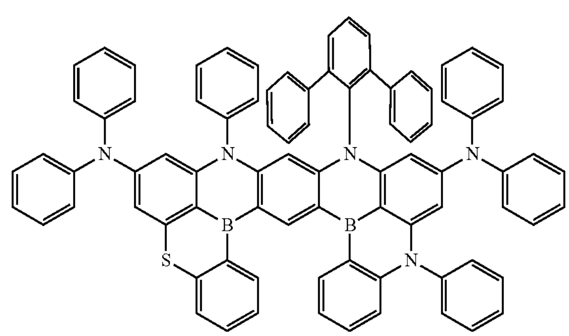

-continued
127
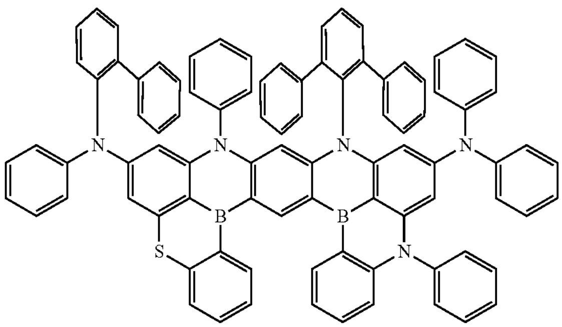
128
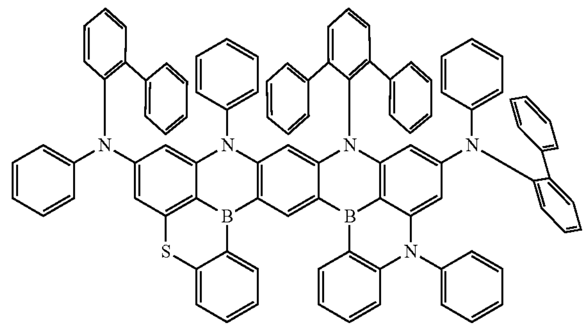
129
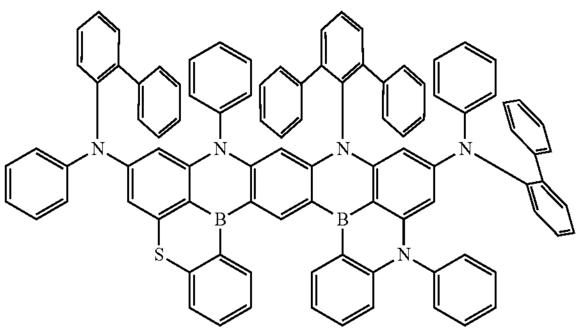
130
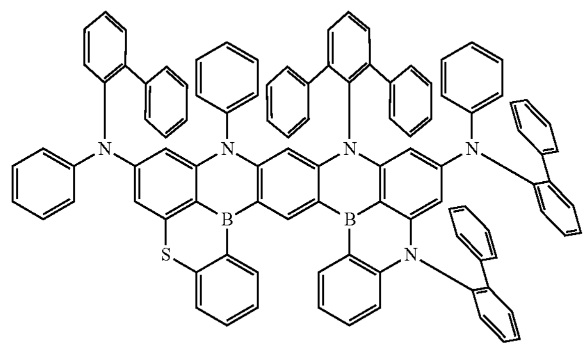
131
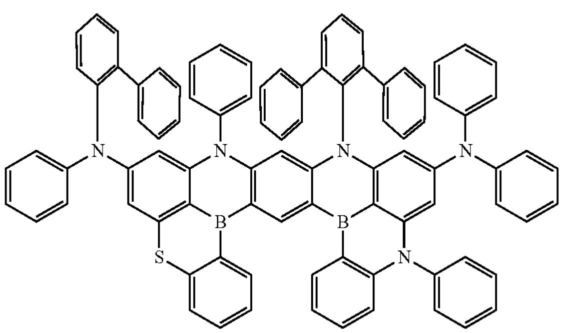
132
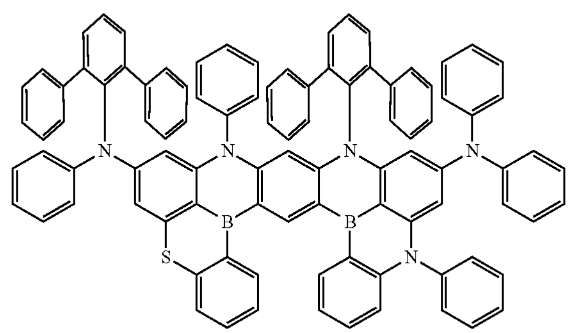
133
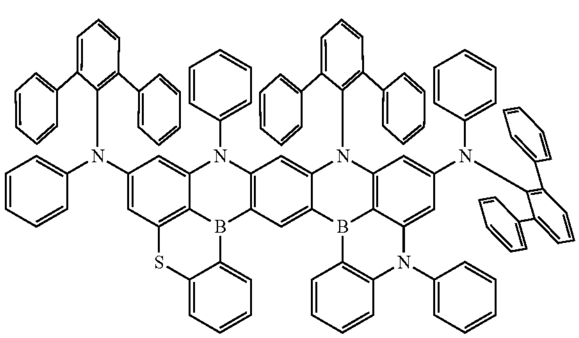
134
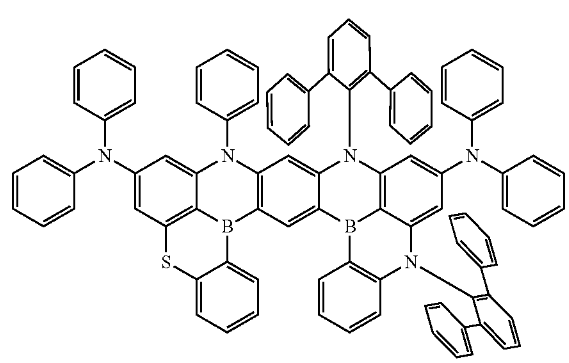

-continued
135
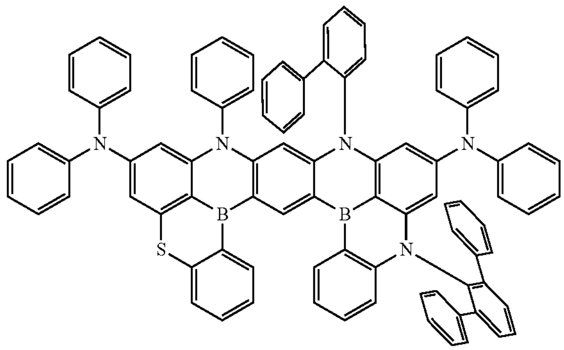
136
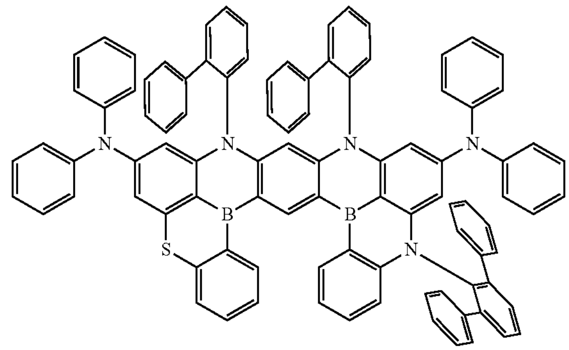
137
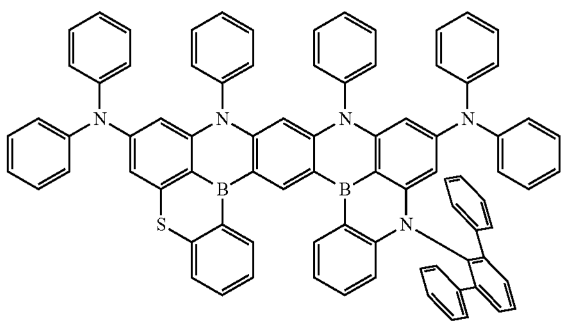
138
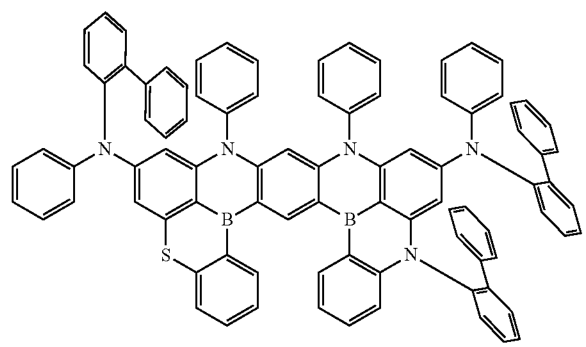
139
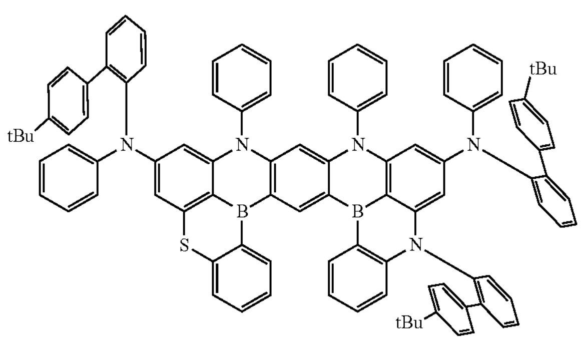
140
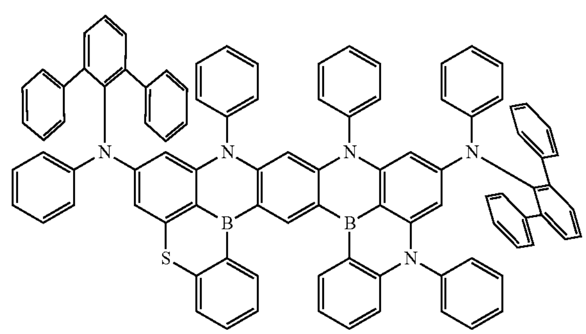
141
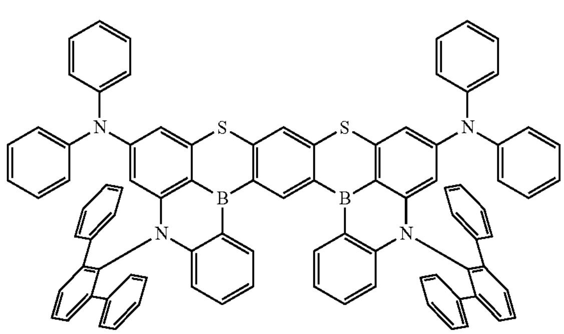
142
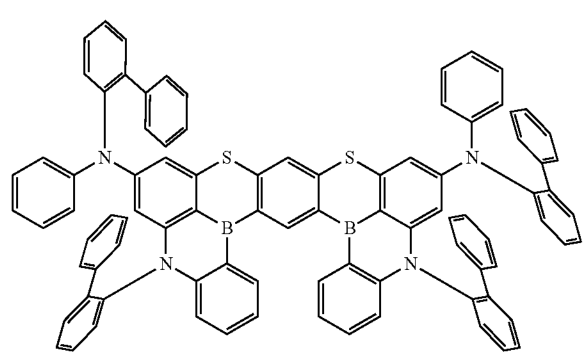

-continued
143
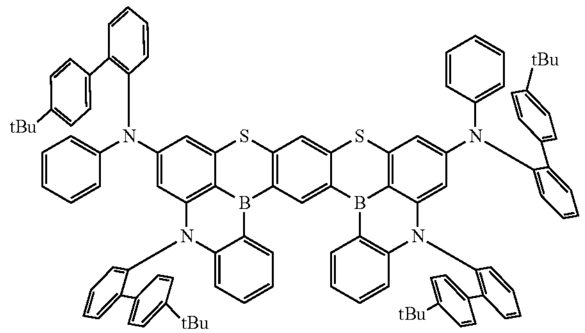
144
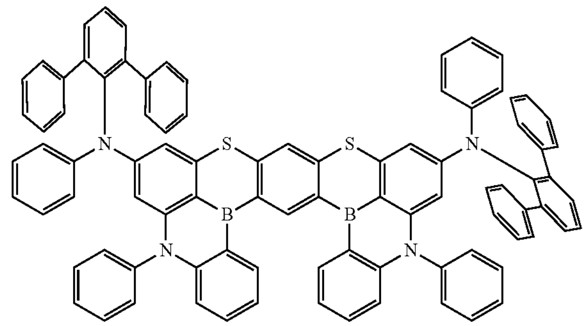
145
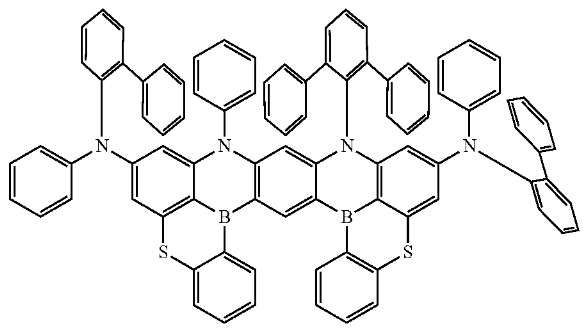
146
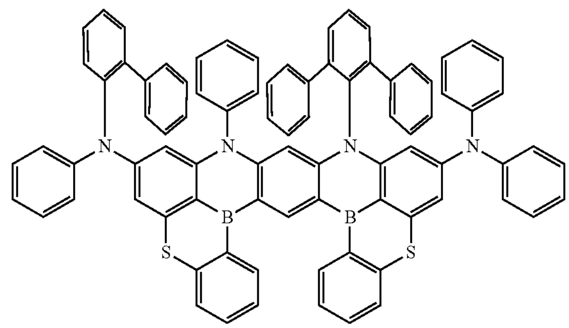
147
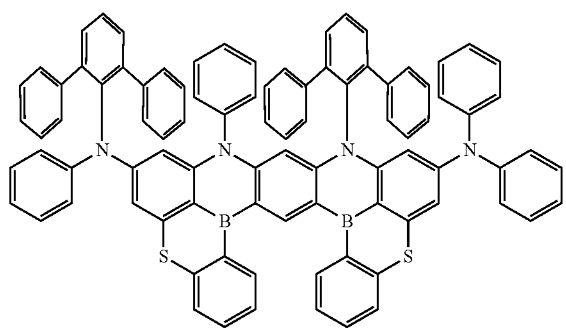
148
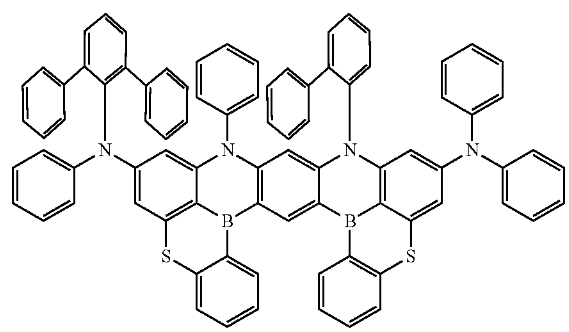
149
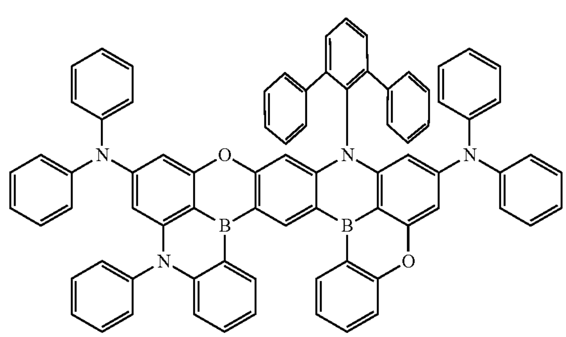
150
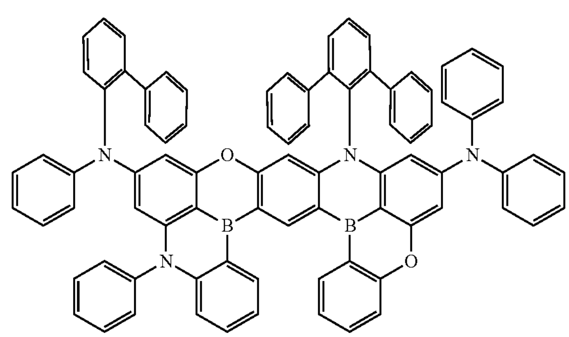

-continued
151
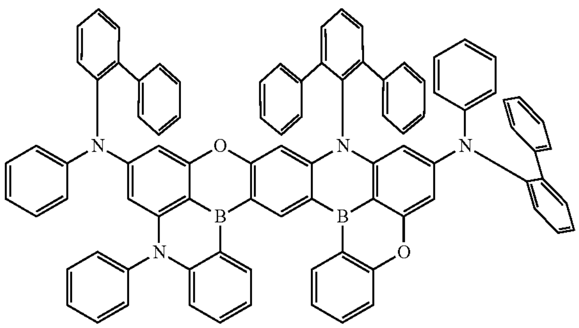
152
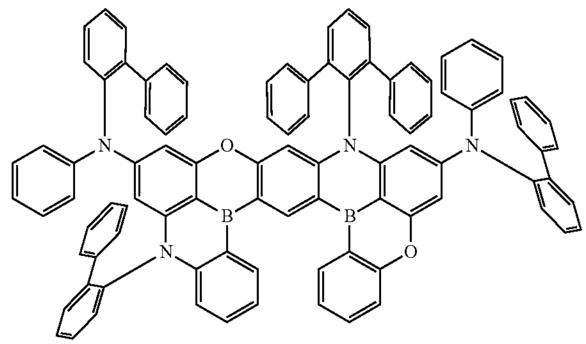
153
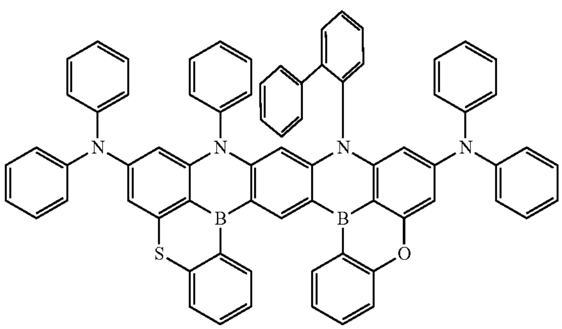
154
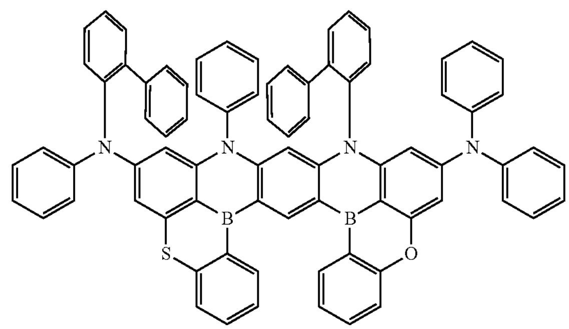
155
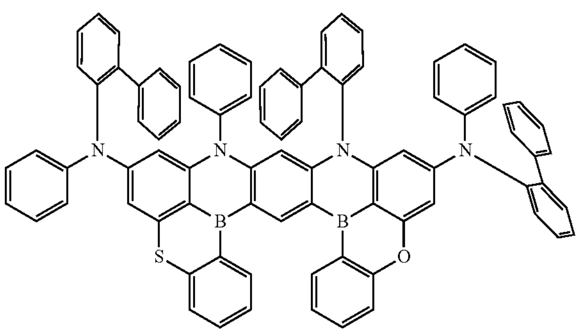
156
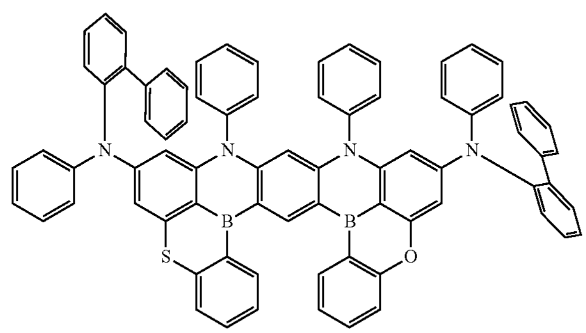
157
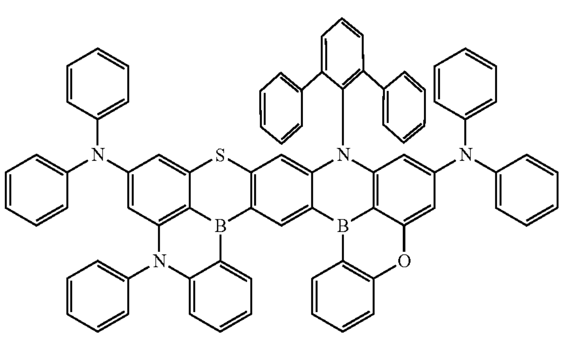
158
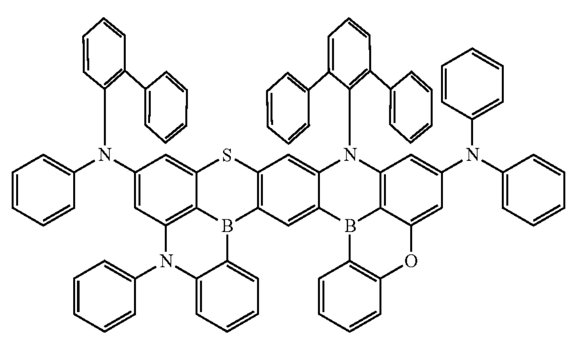

-continued
159
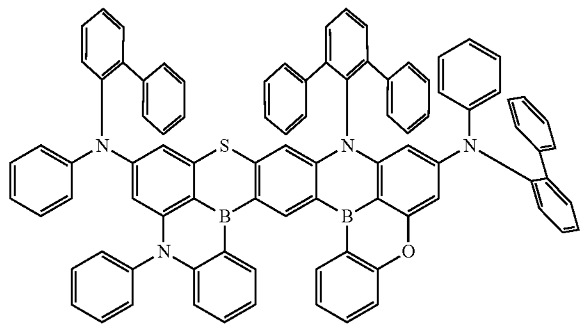
160
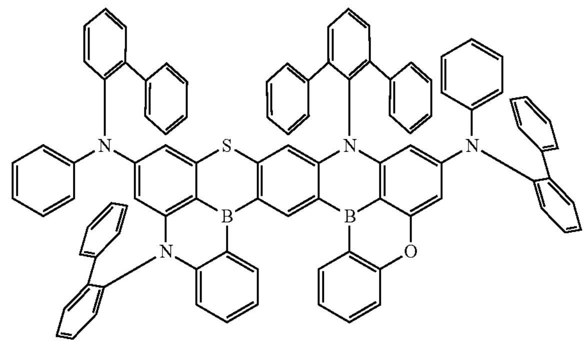
161
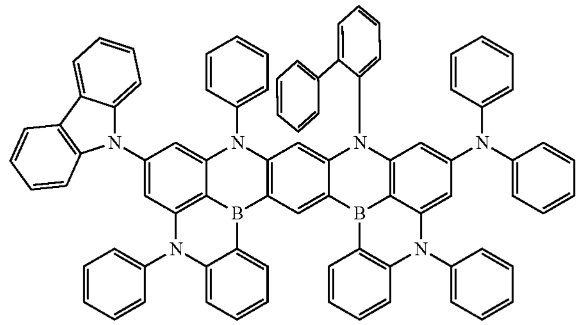
162
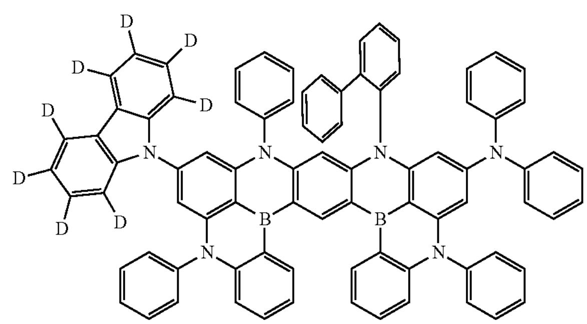
163
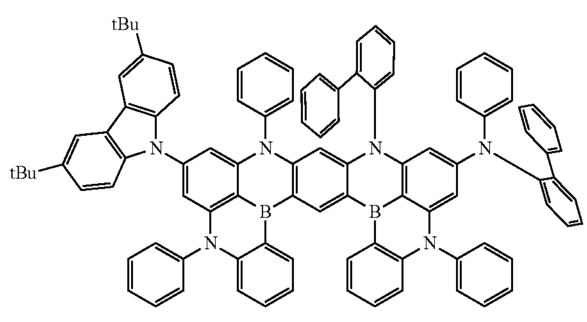
164
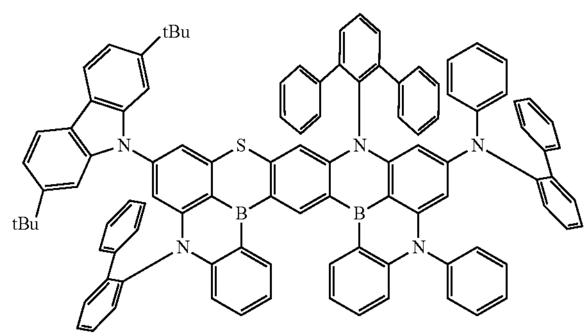
165
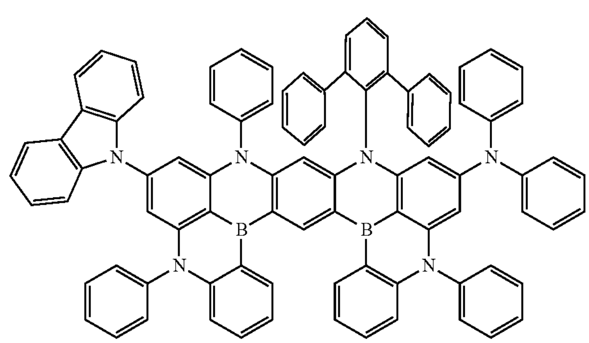
166
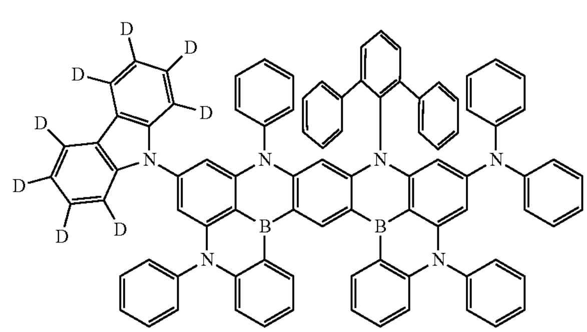

-continued
167
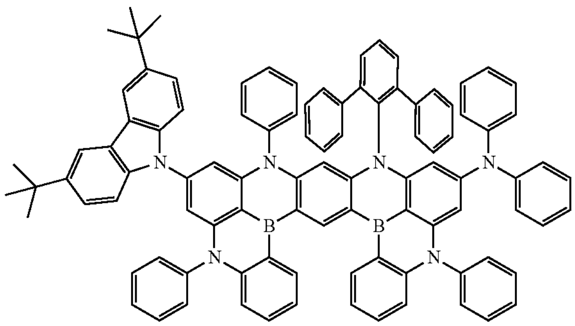
168
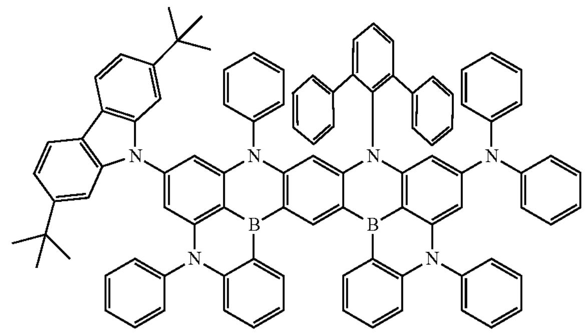
169
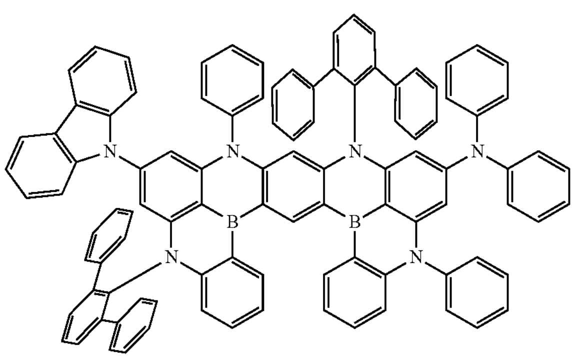
170
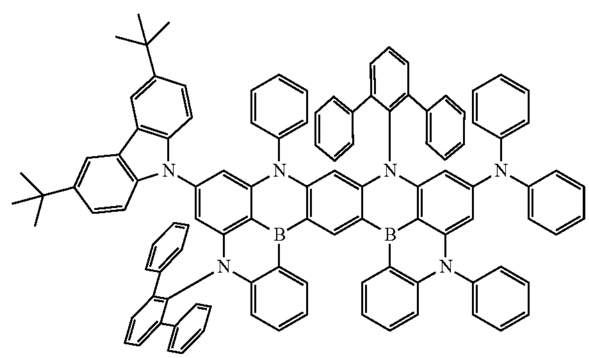
171
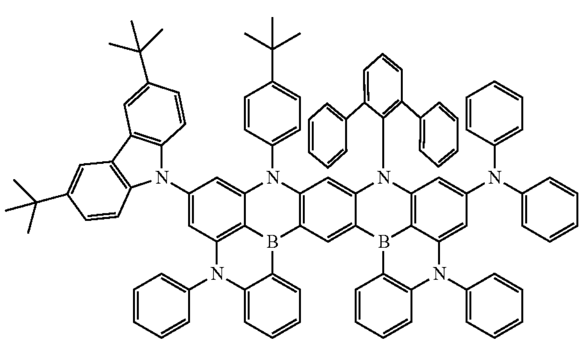
172
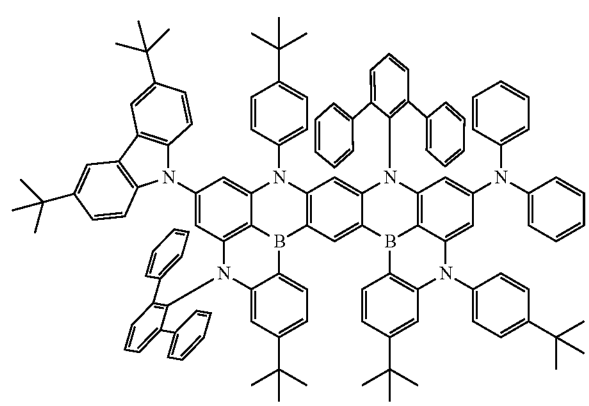

-continued
173
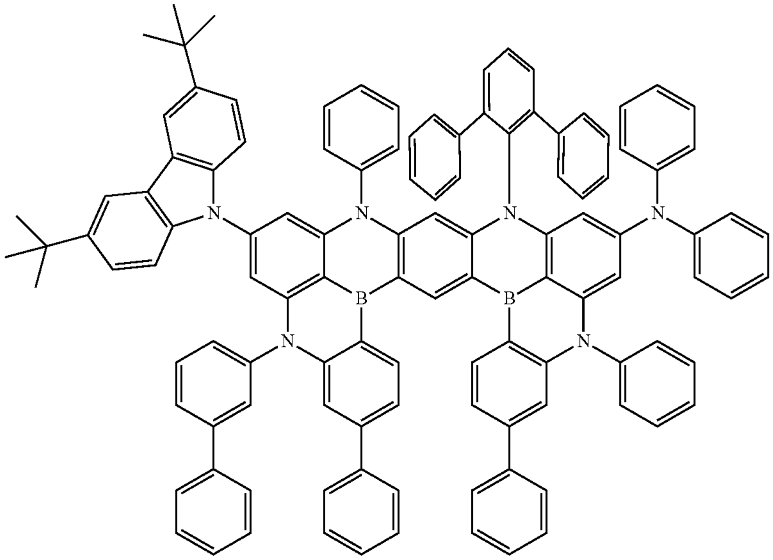
174
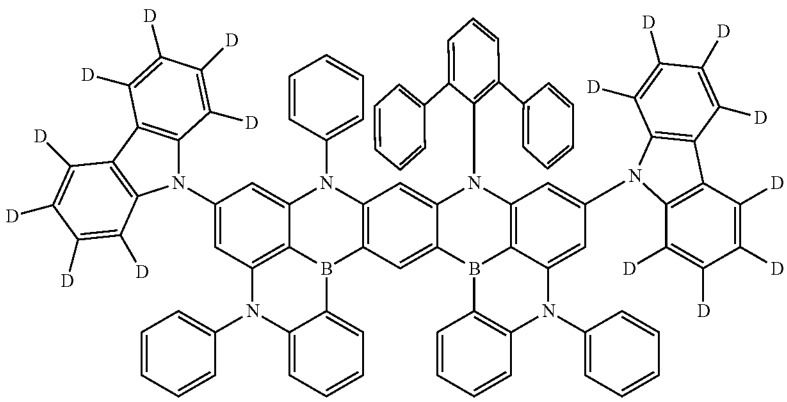
175
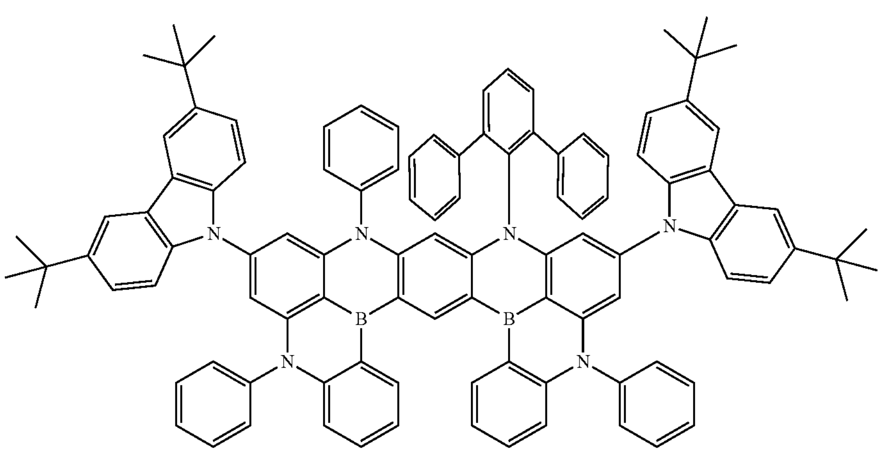

-continued
176
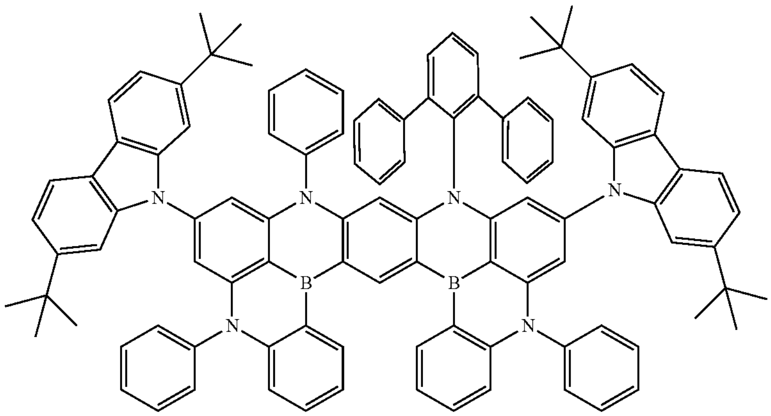
177
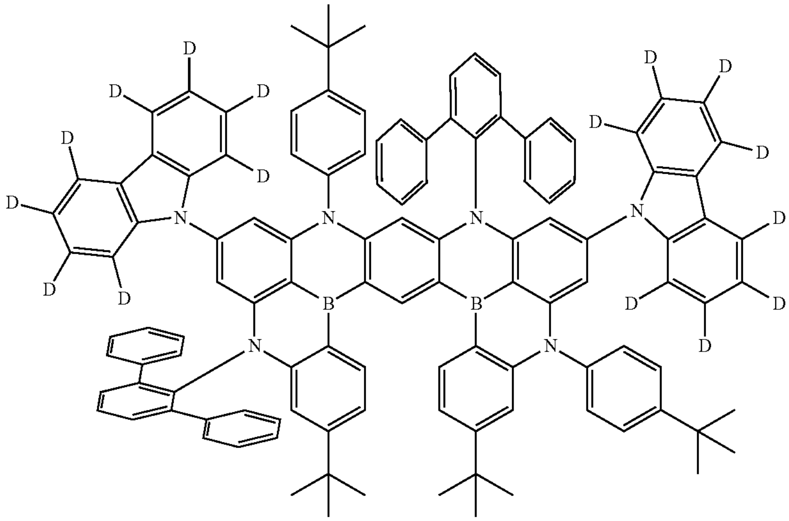
178
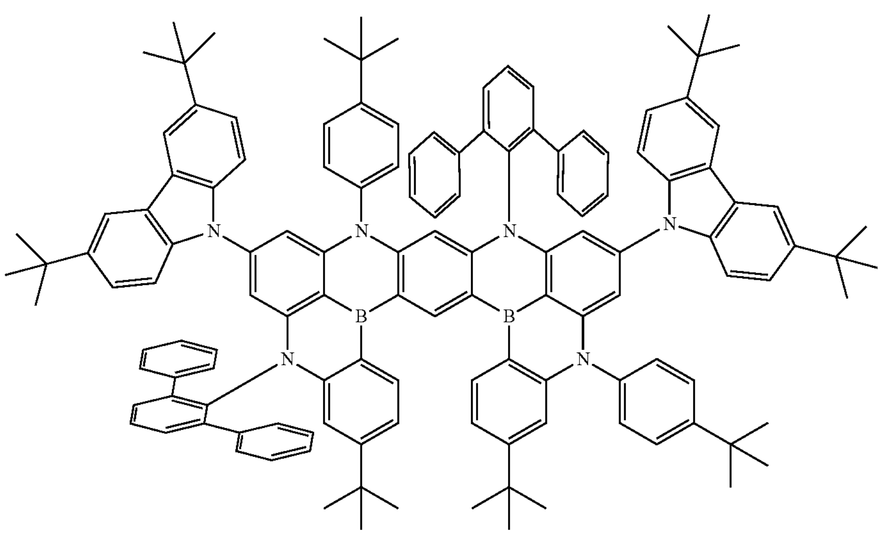

-continued
179
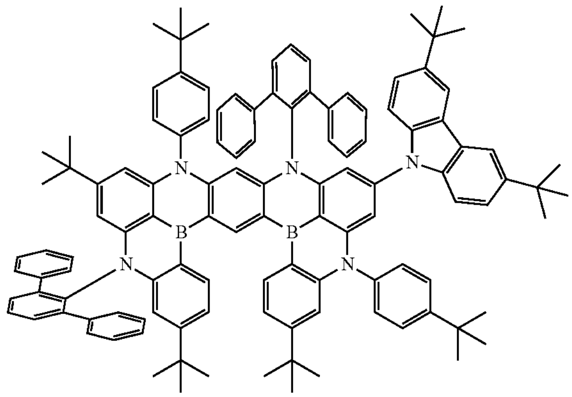
180
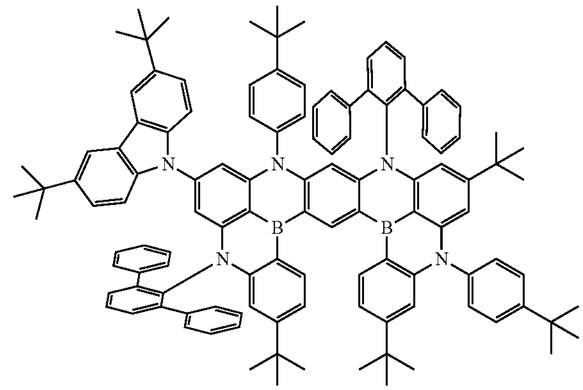
181
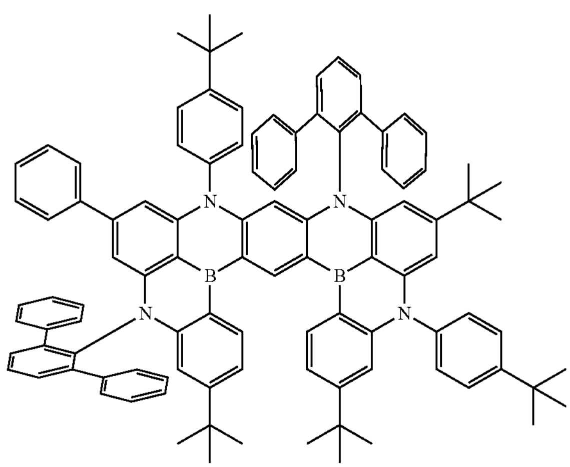
182
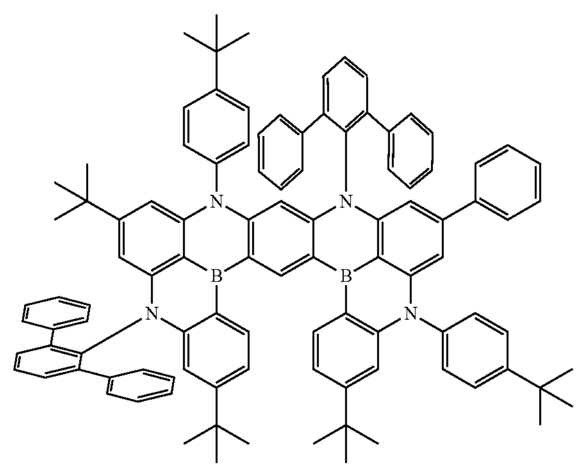
183
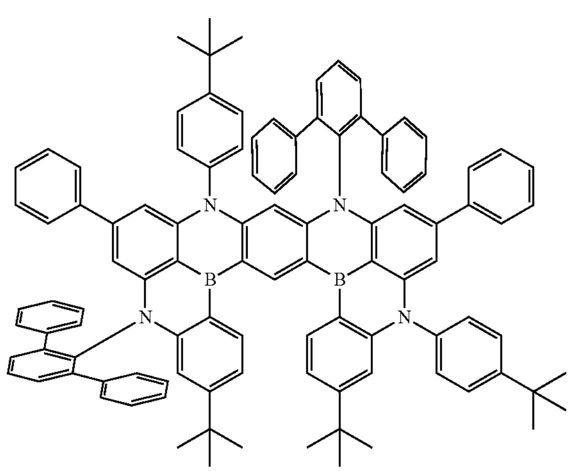
184
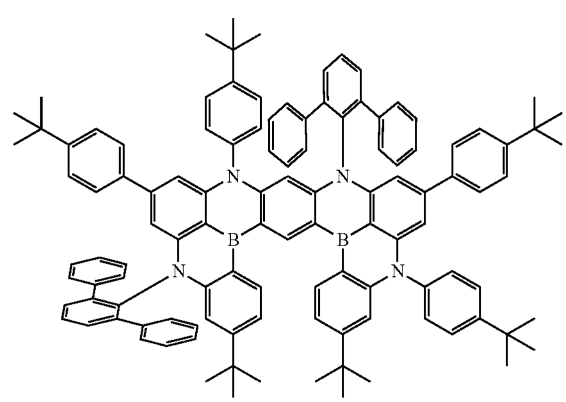

-continued
185
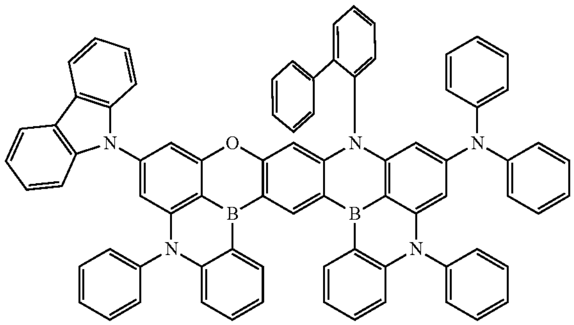
186
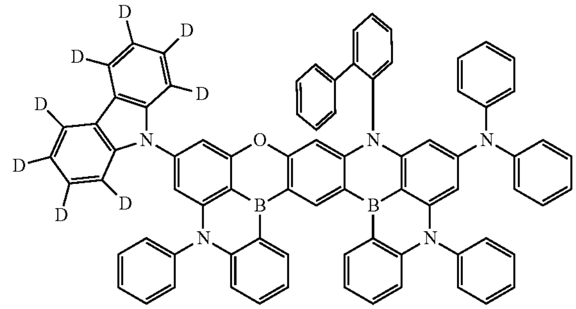
187
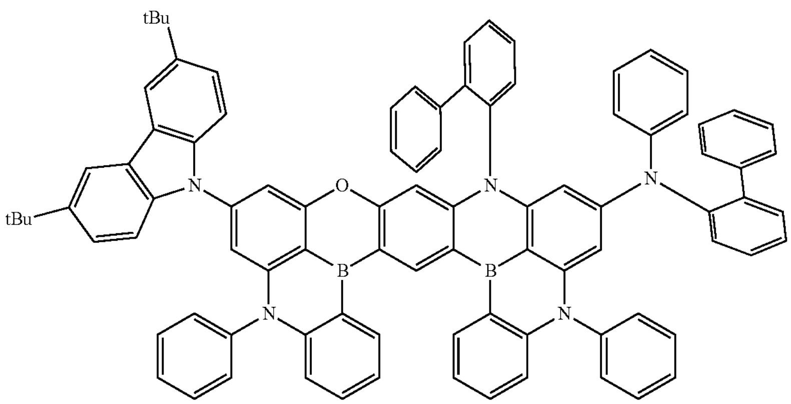
188
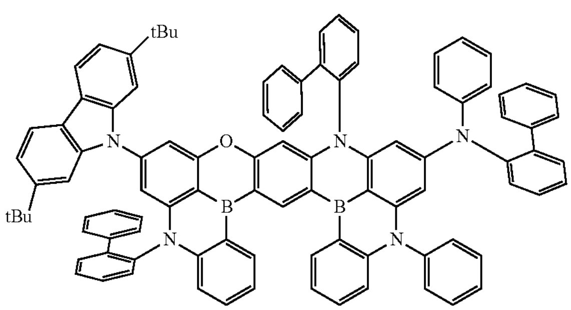
189
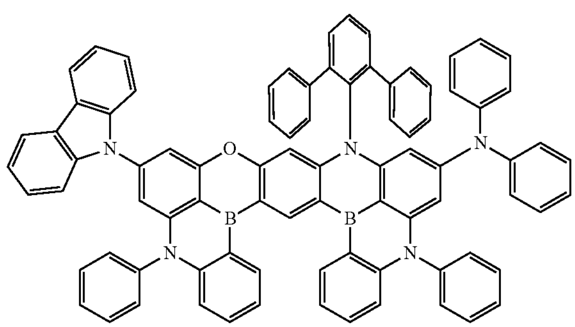
190
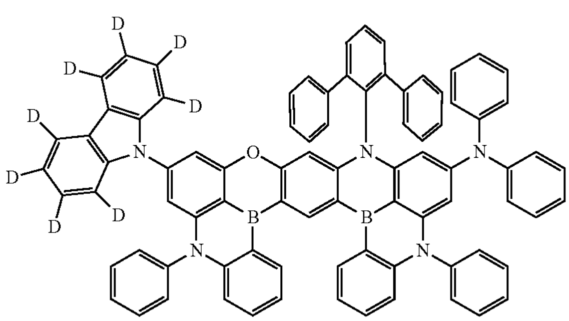
191
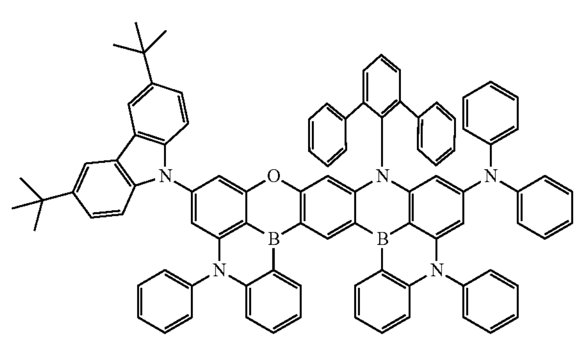

-continued
192
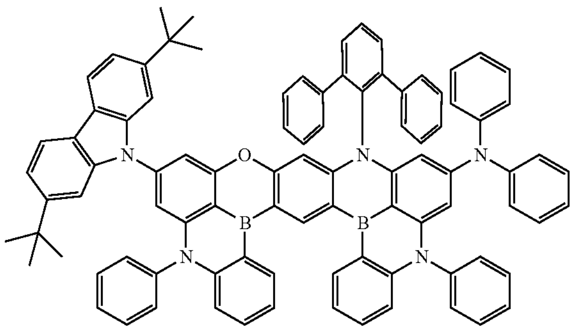
193
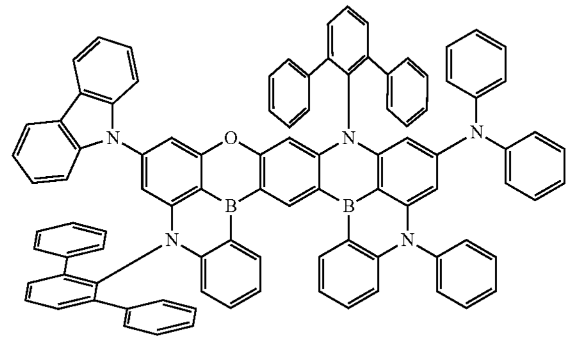
194
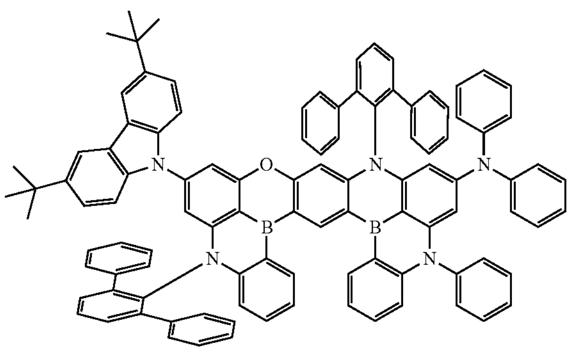
195
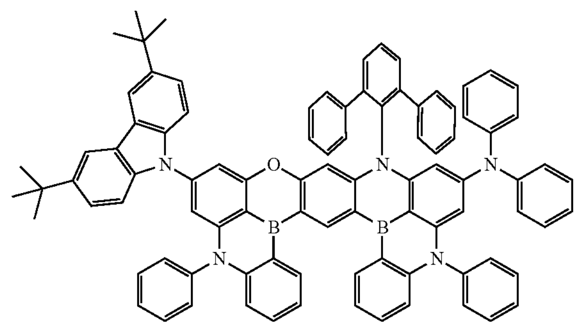
196
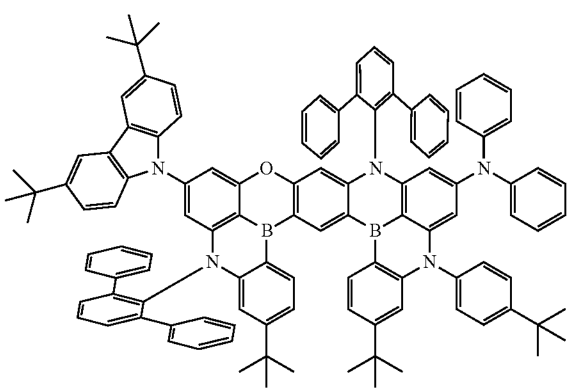
197
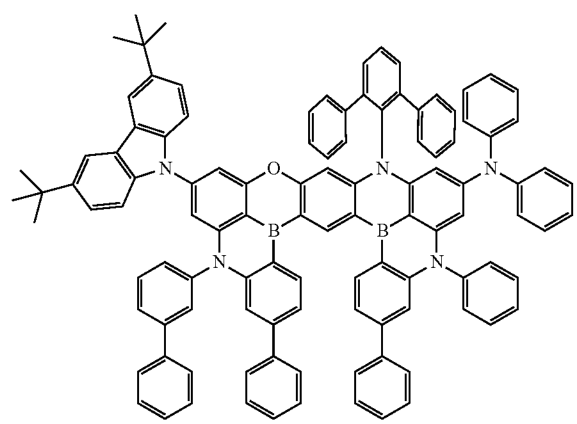
198
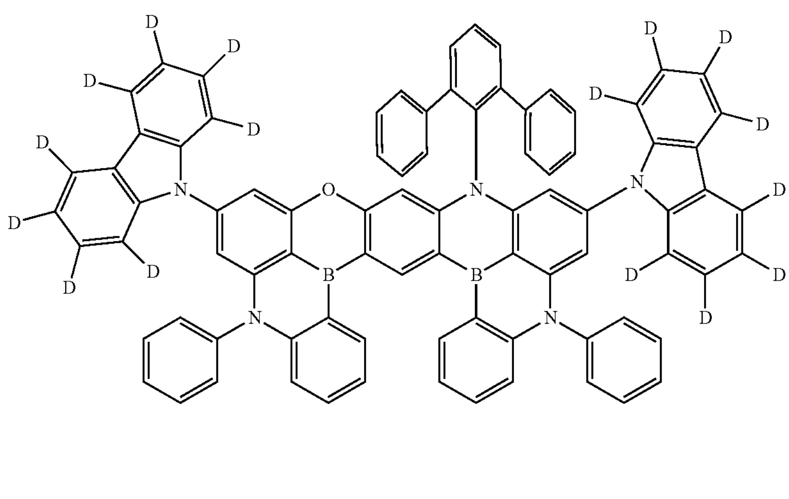

-continued
199
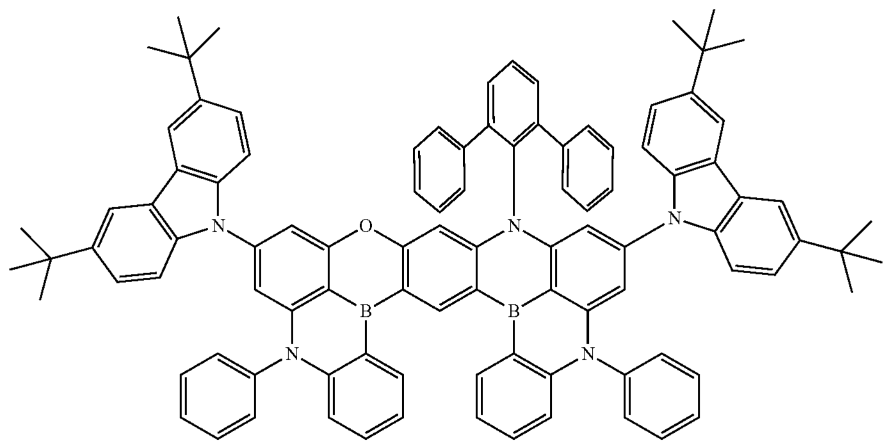
200
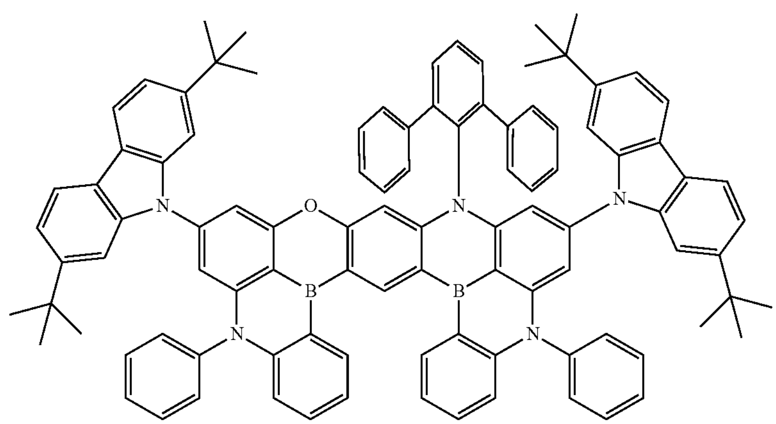
201
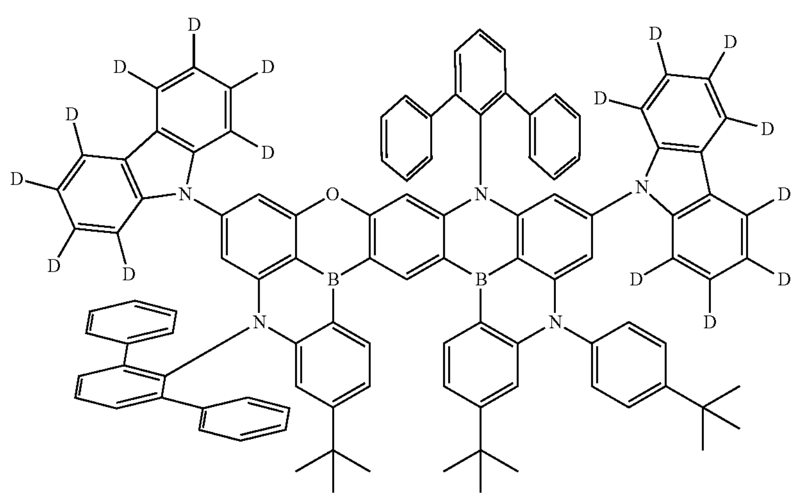

-continued
202
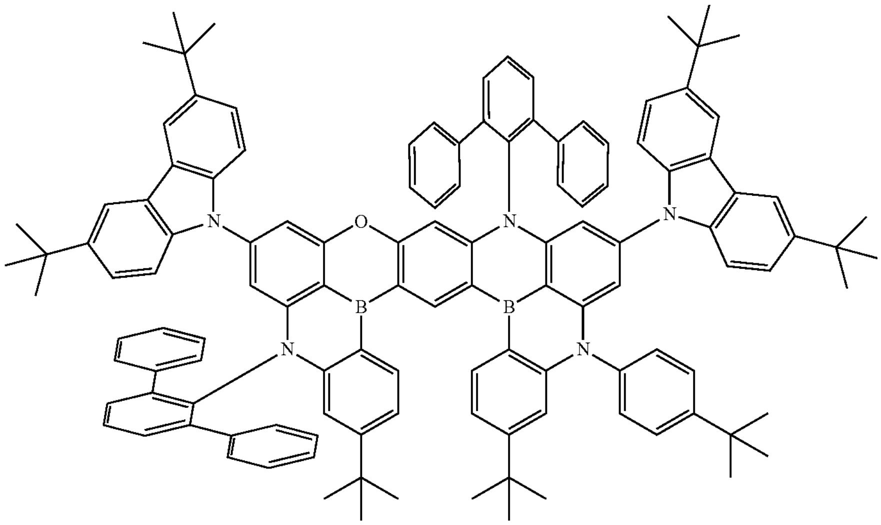
203
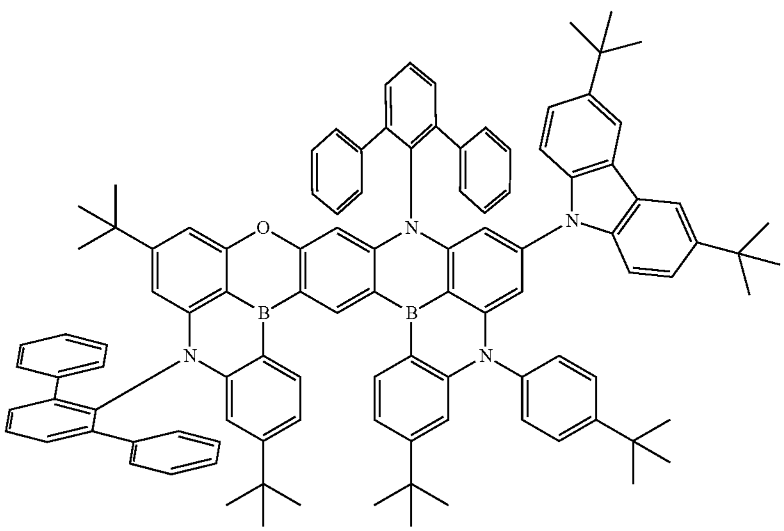
204
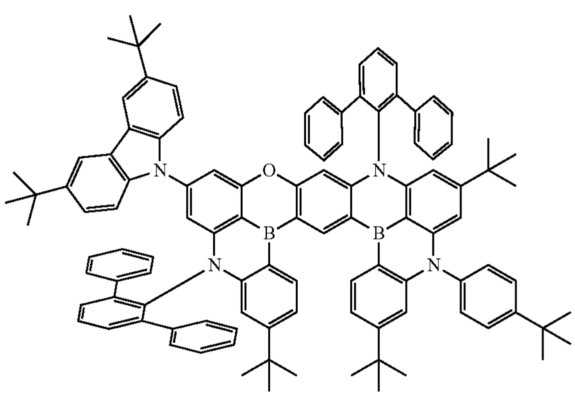
205
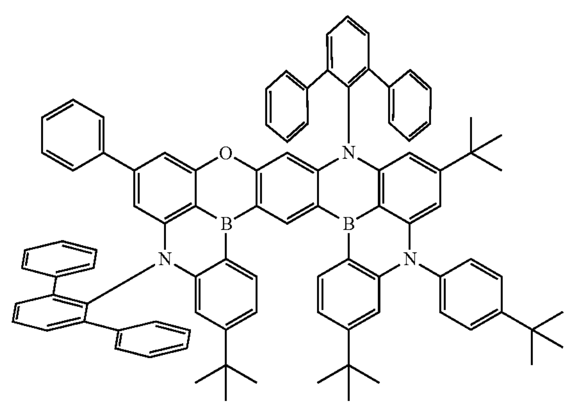

-continued
206
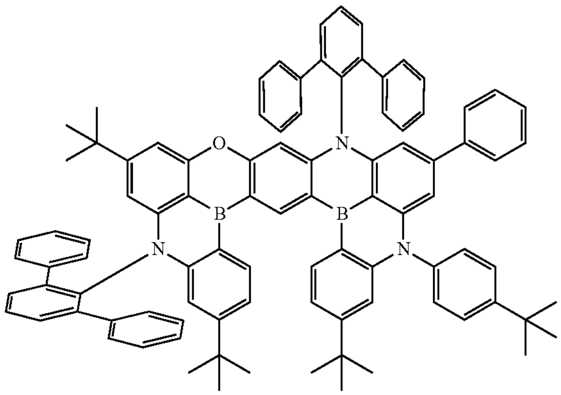
207
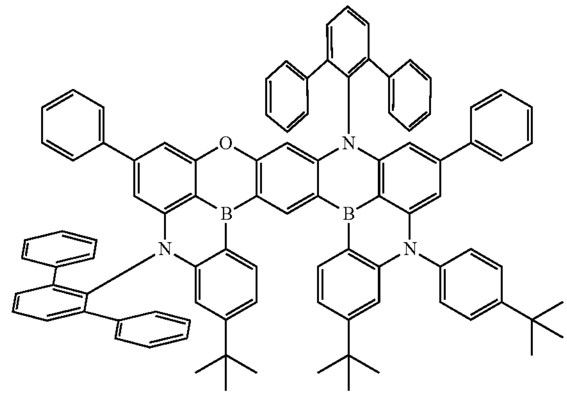
208
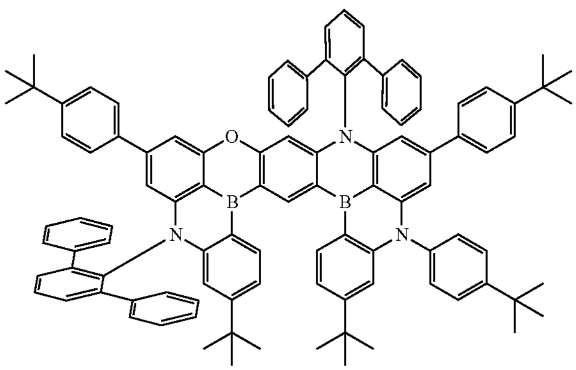
209
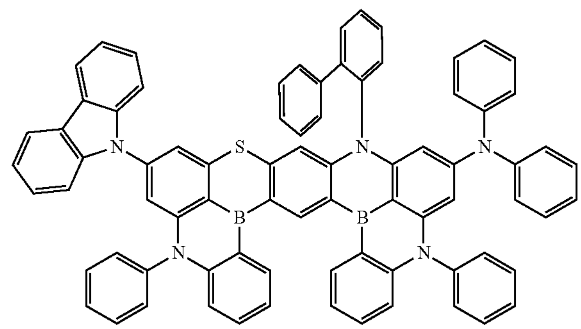
210
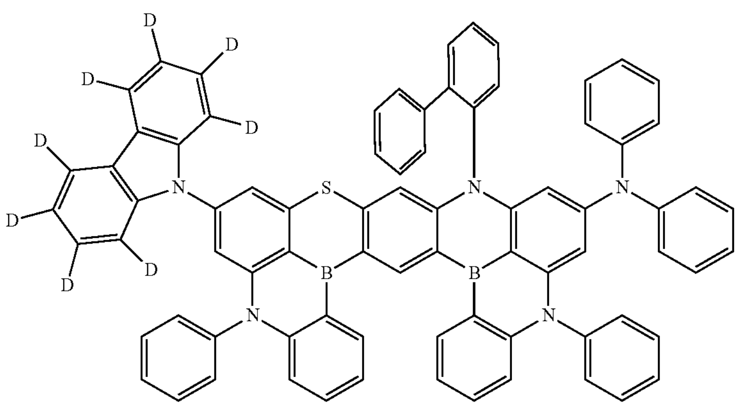
211
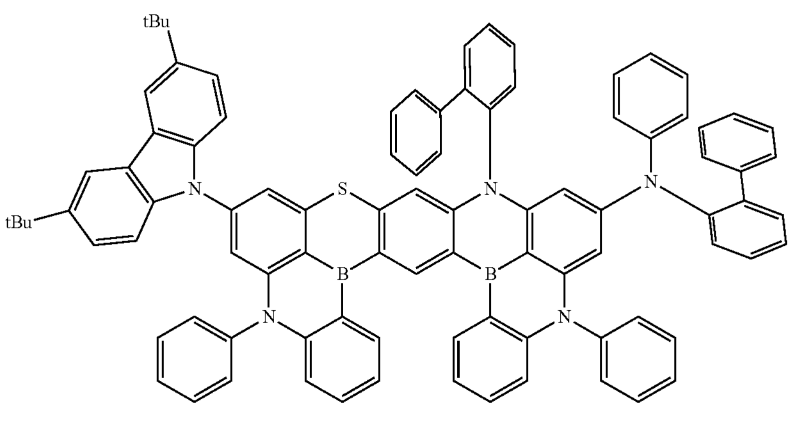

-continued
212
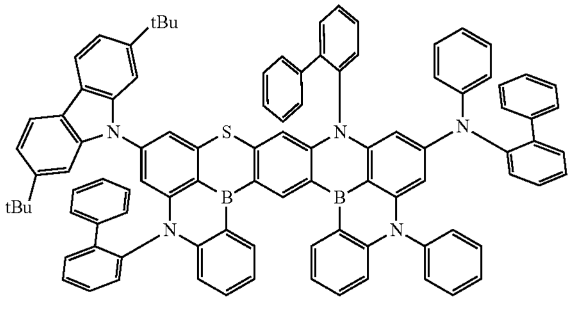
213
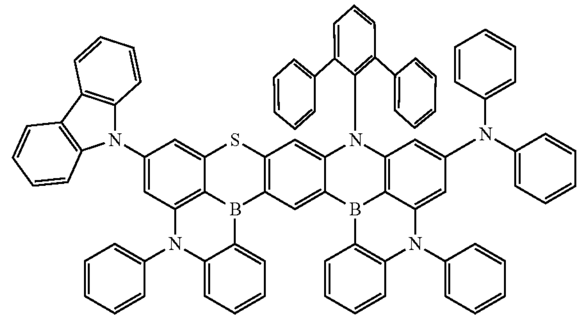
214
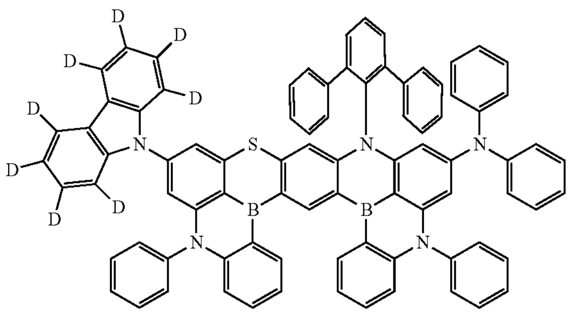
215
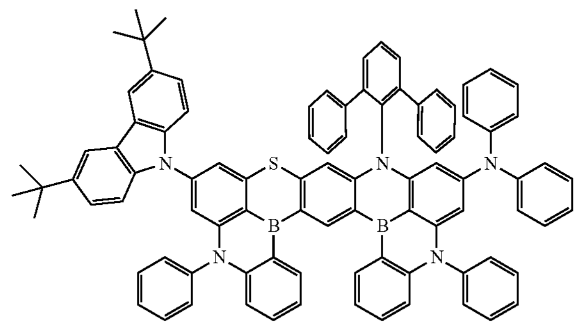
216
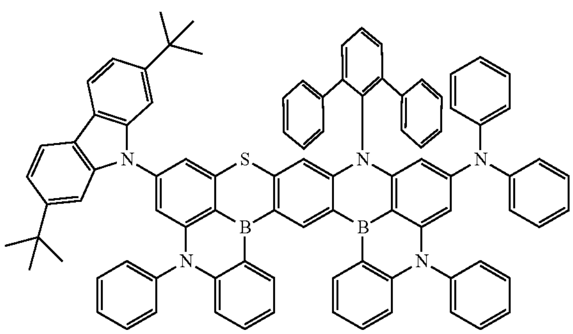
217
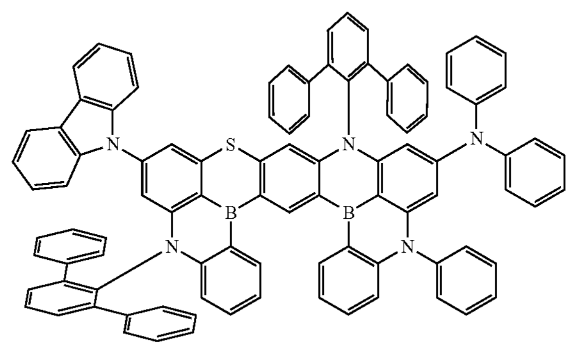
218
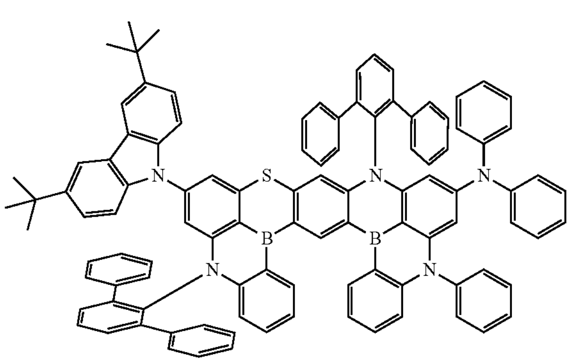
219
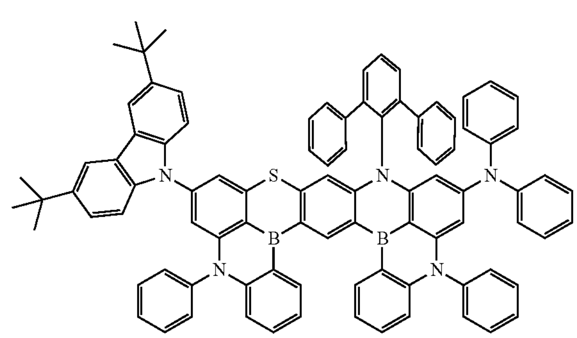

-continued
220
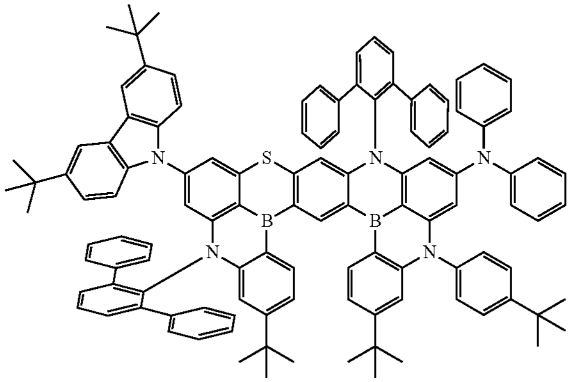
221
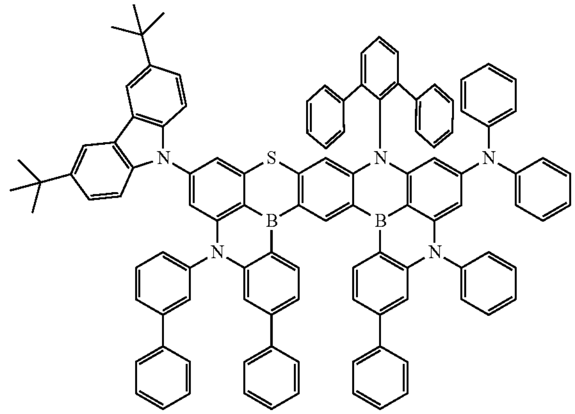
222
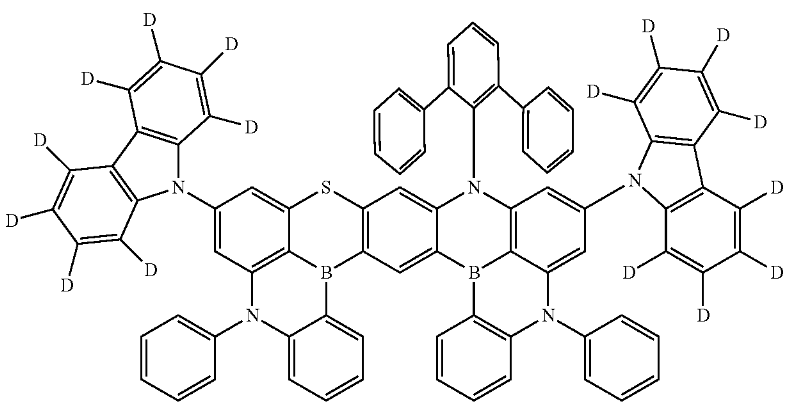
223
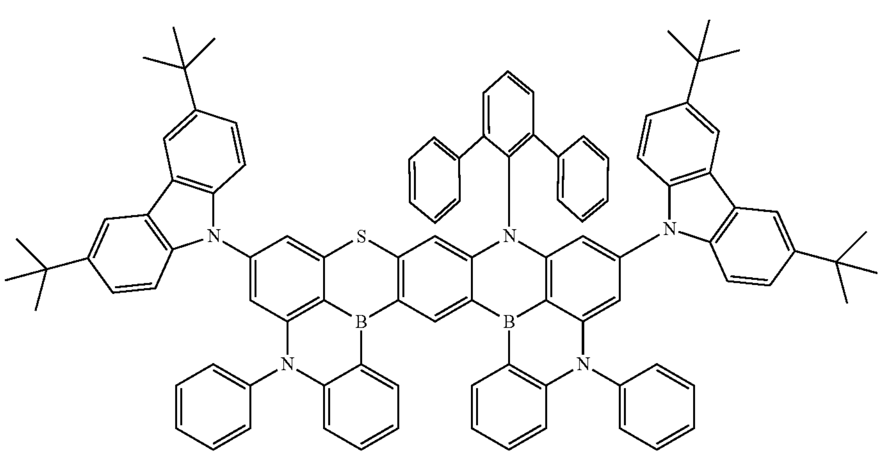

-continued
224
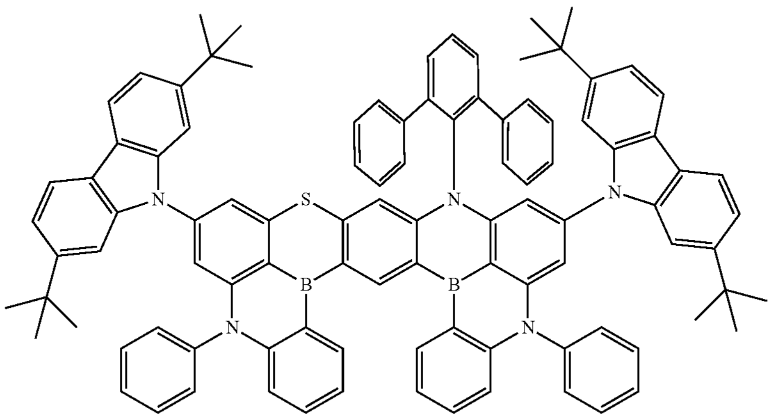
225
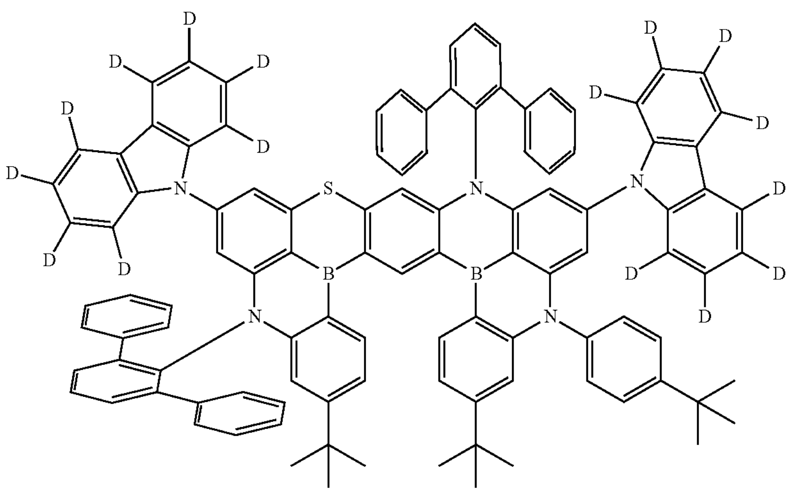
226
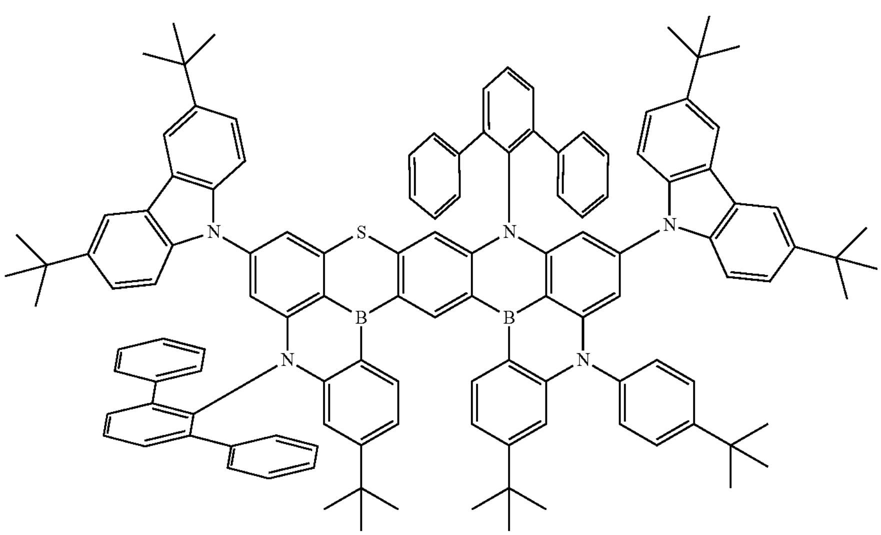

-continued
227
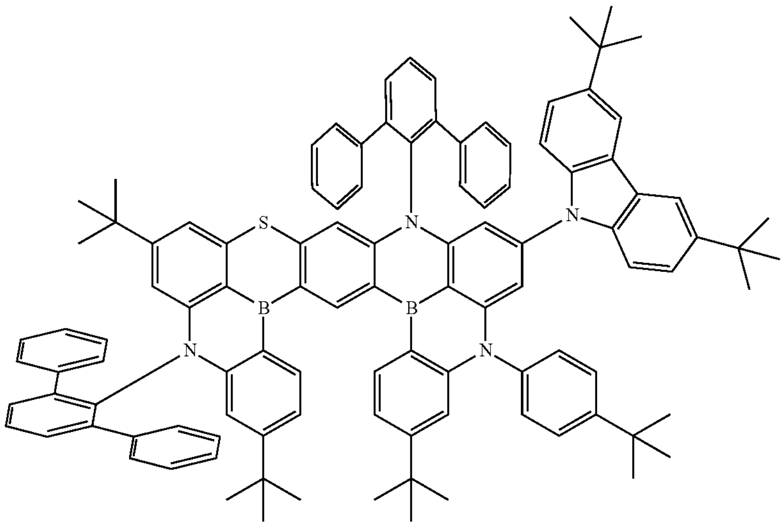
228
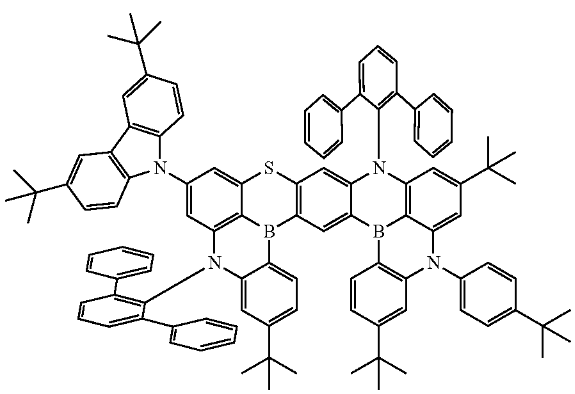
229
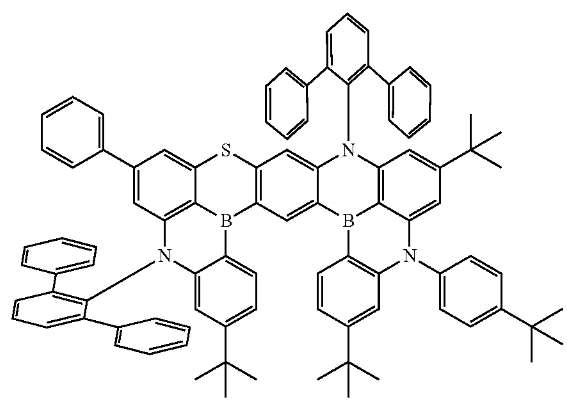
230
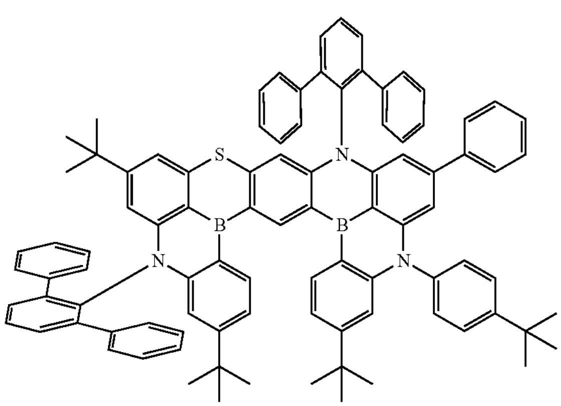
231
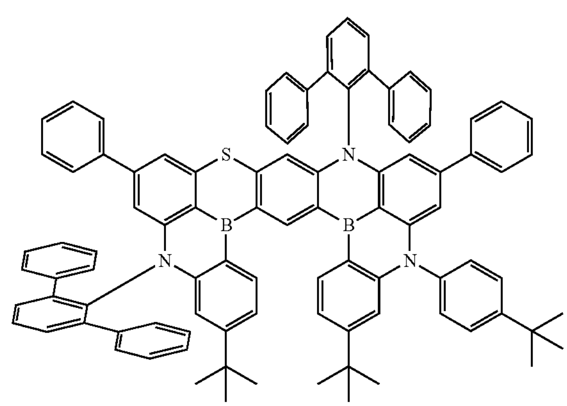

-continued
232
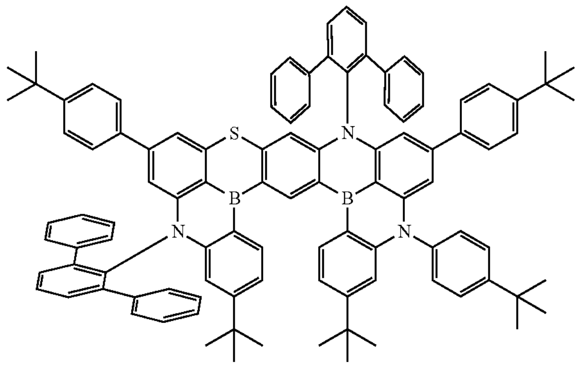
233
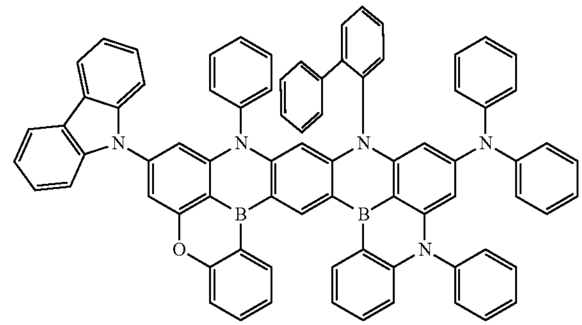
234
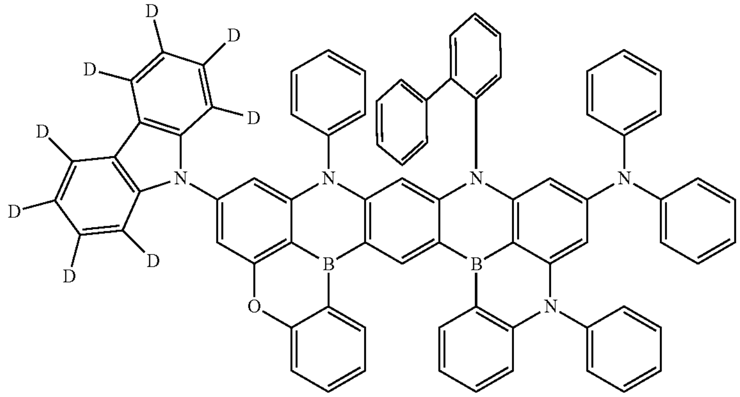
235
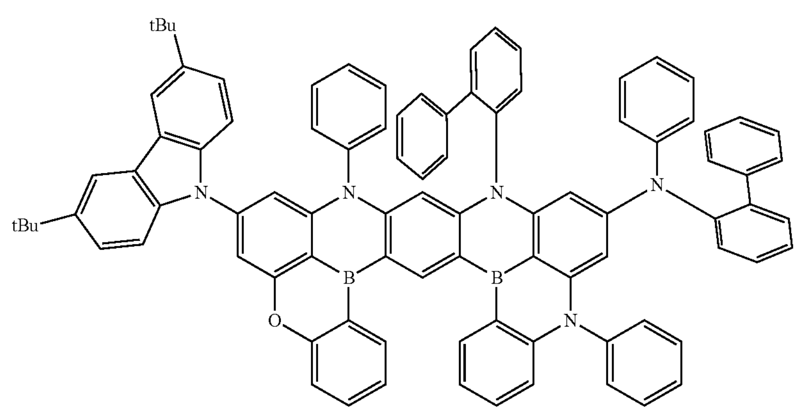
236
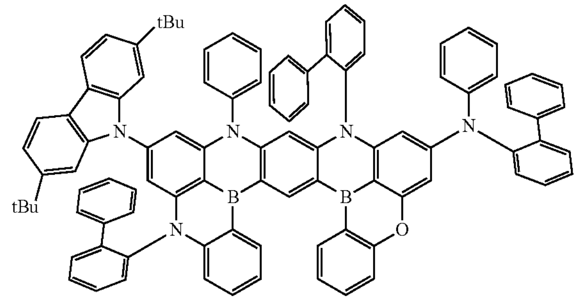
237
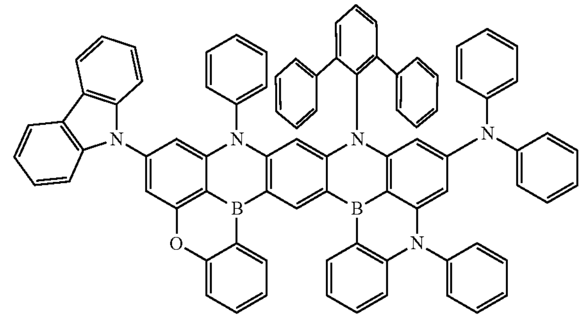

-continued
238
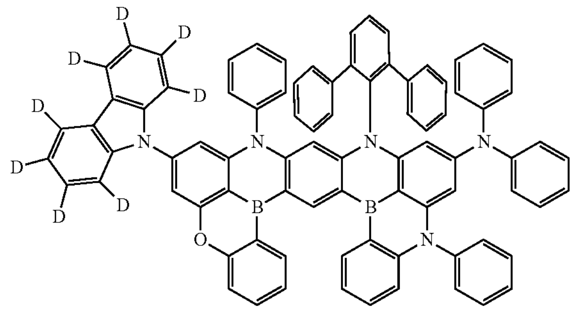
239
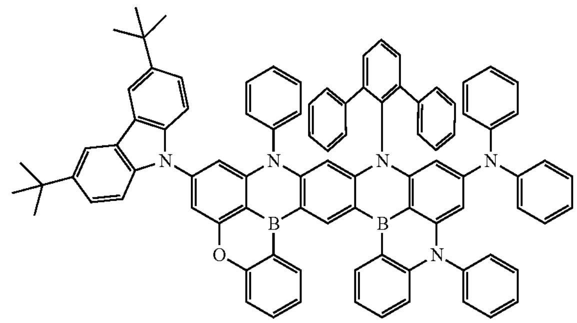
240
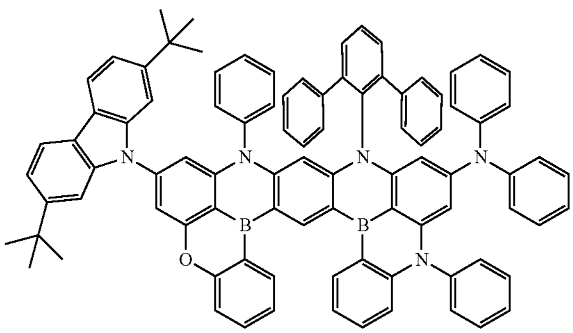
241
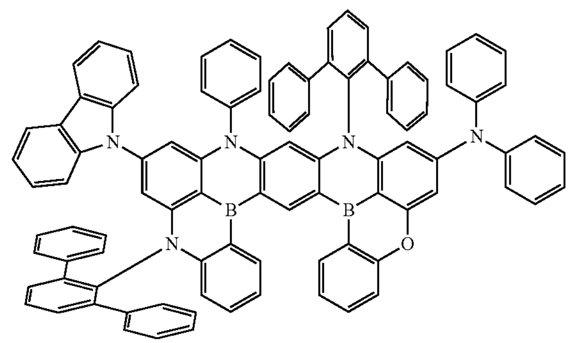
242
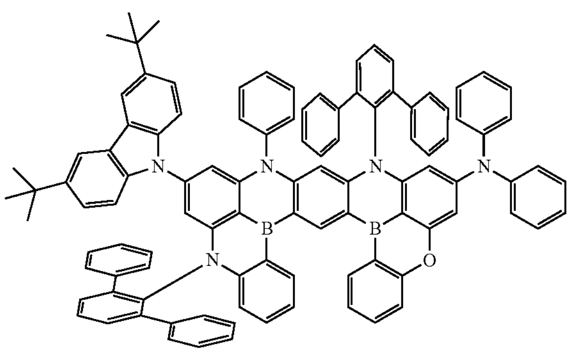
243
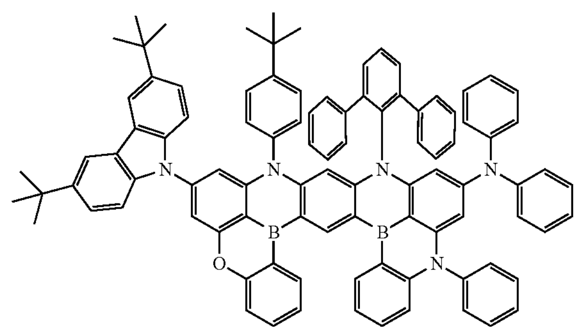
244
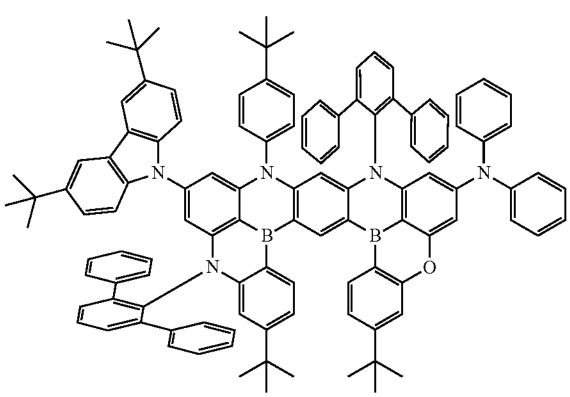
245
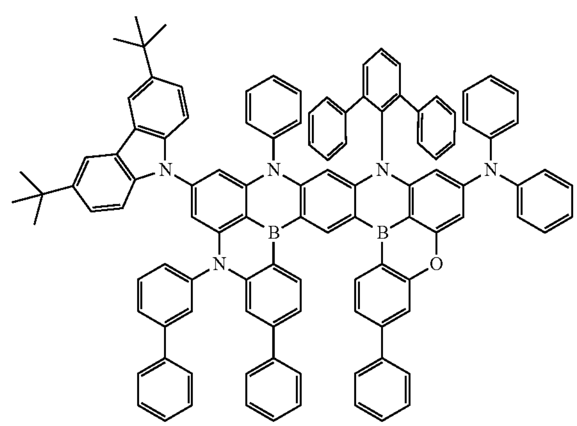

-continued
246
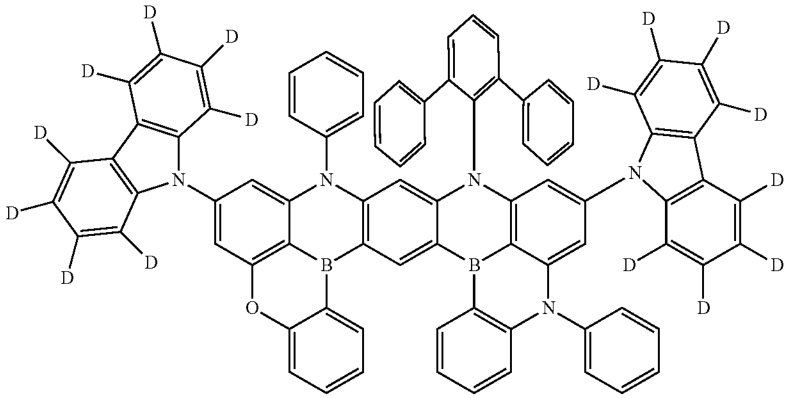
247
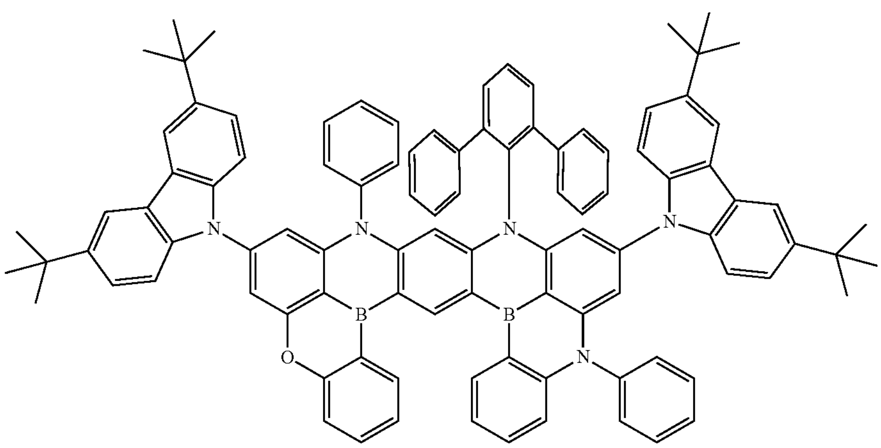
248
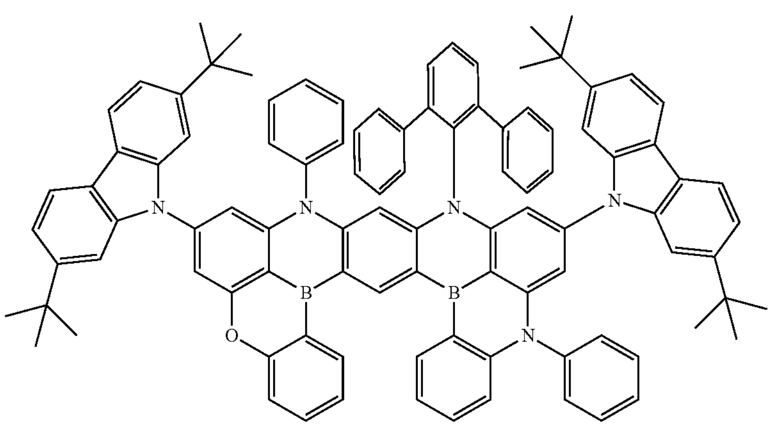

-continued
249
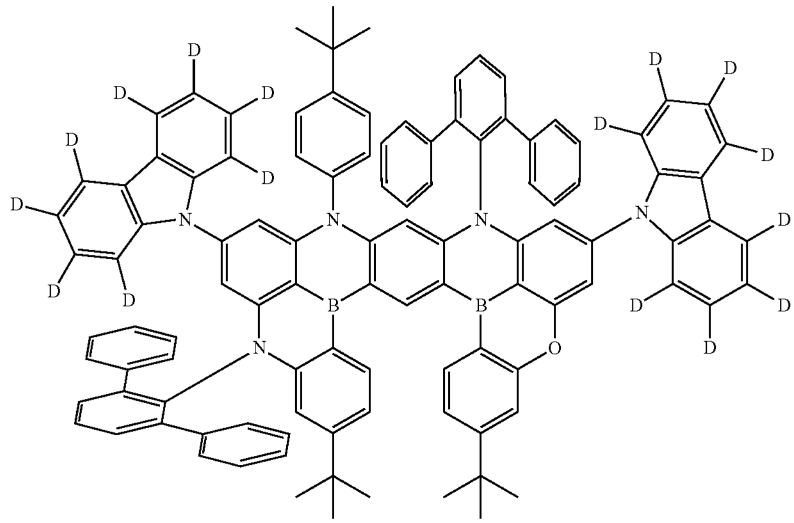
250
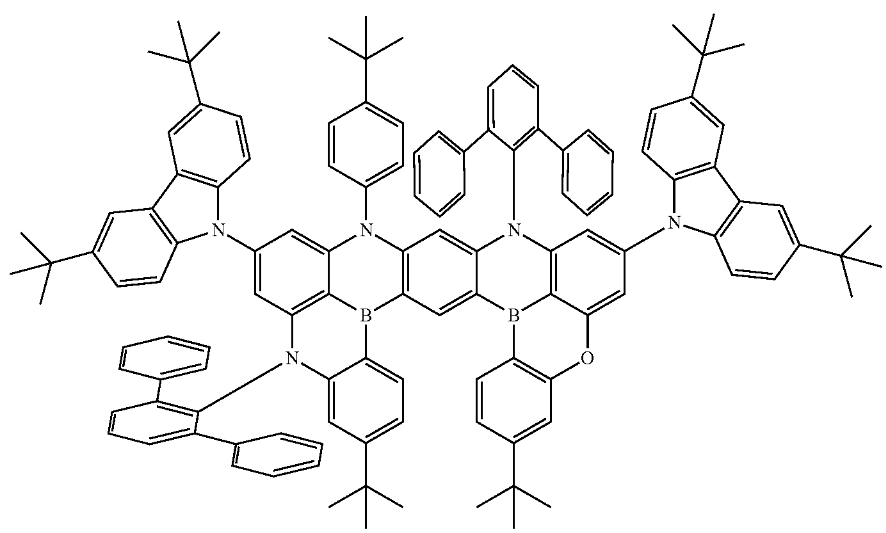
251
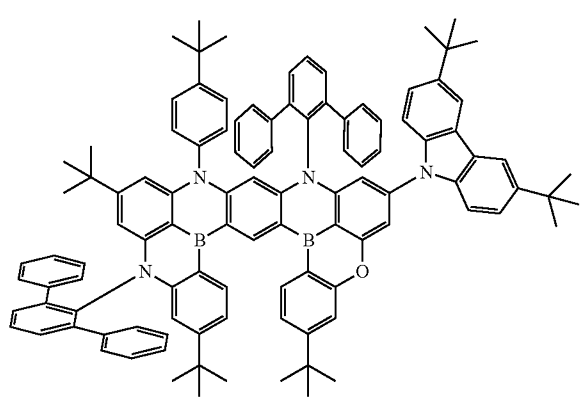
252
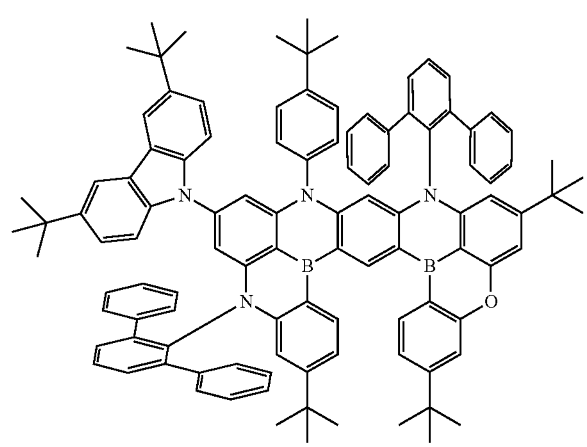

-continued
253
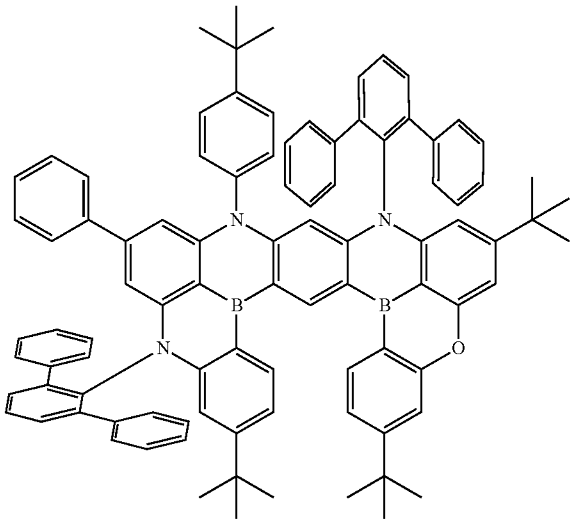
254
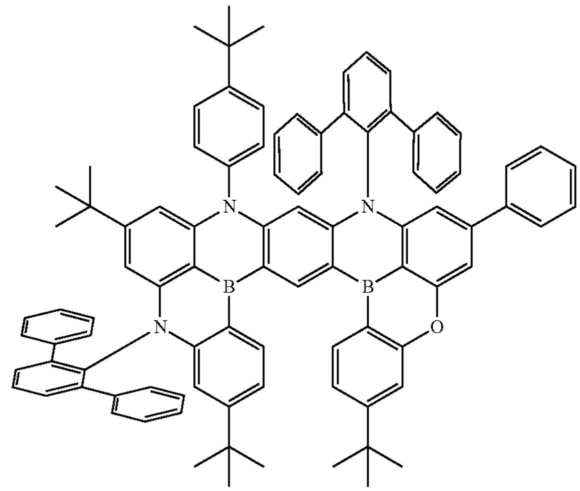
255
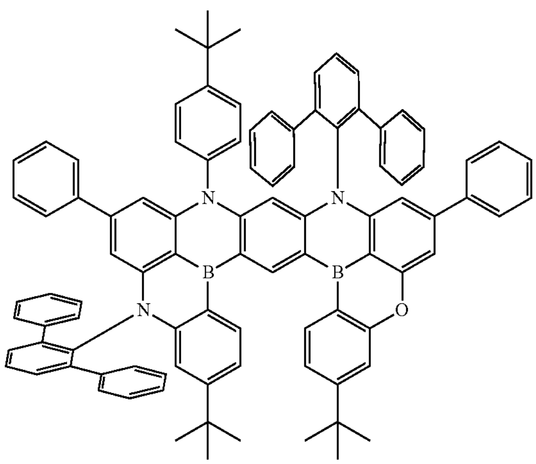
256
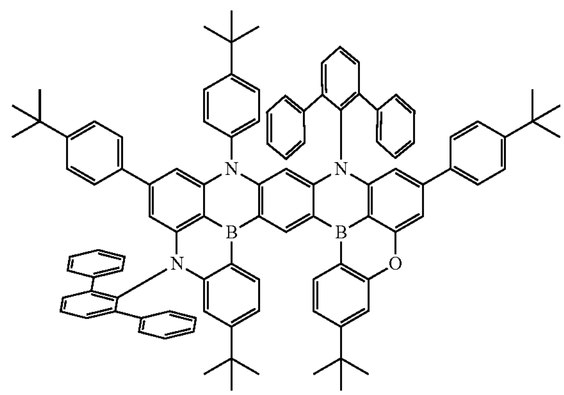
257
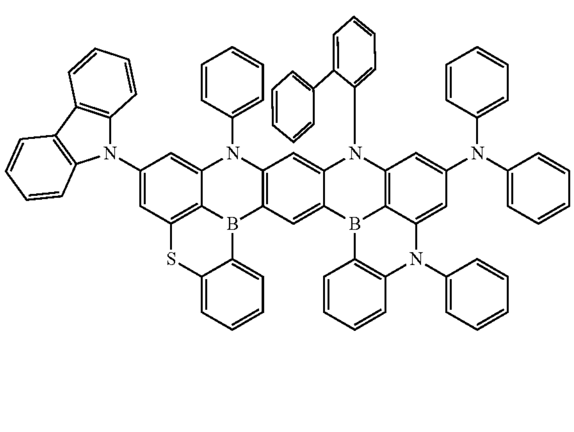
258
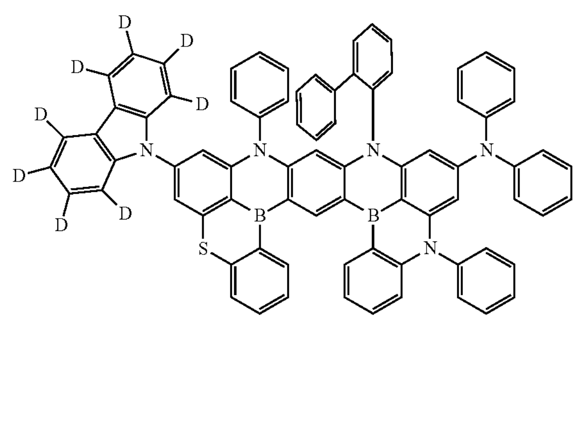

-continued
259
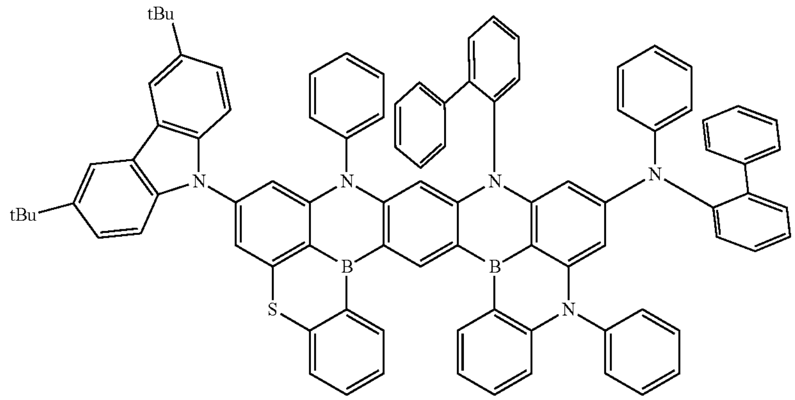
260
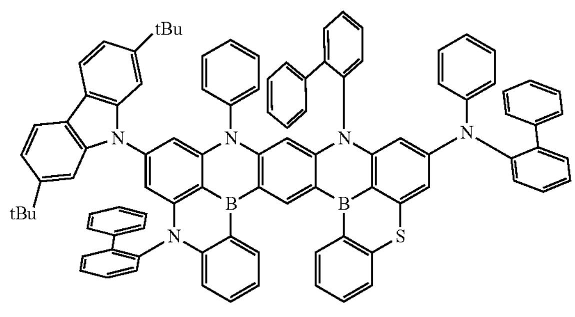
261
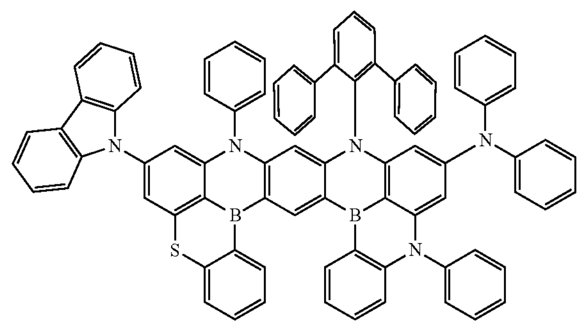
262
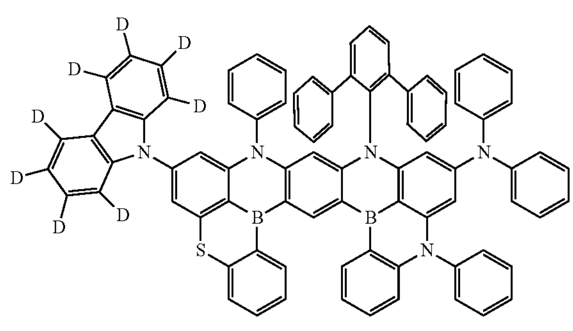
263
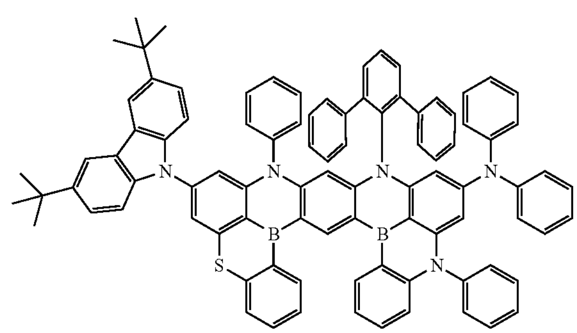
264
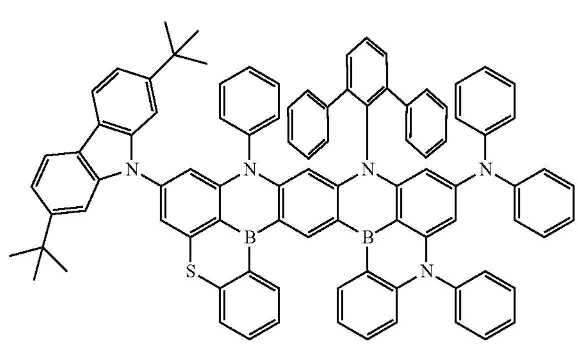
265
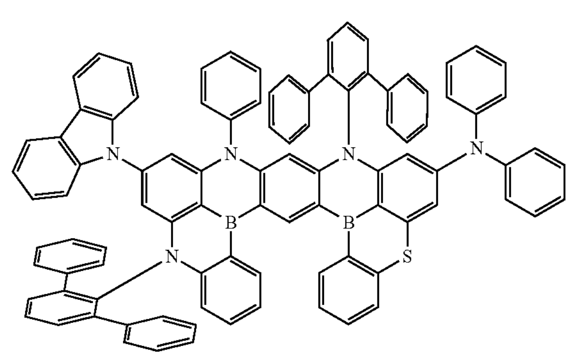

-continued
266
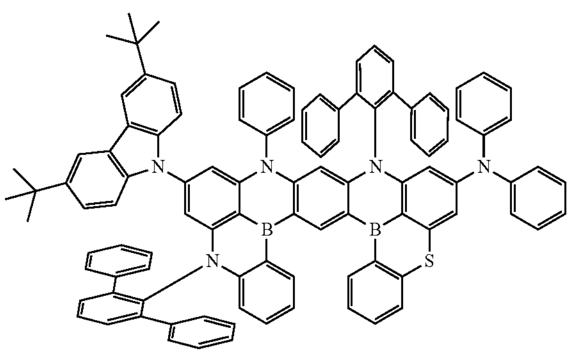
267
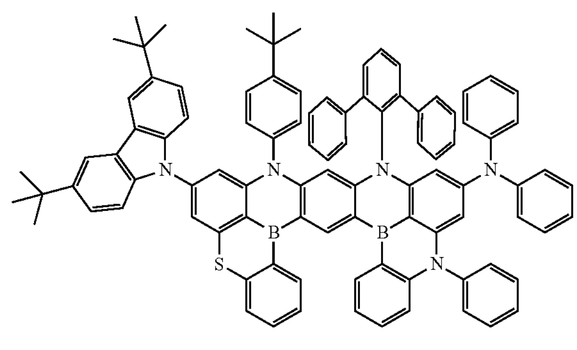
268
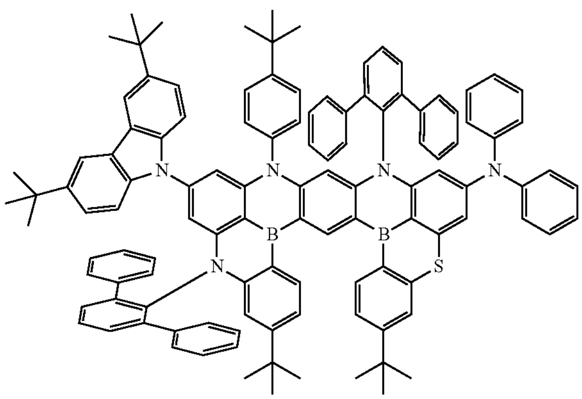
269
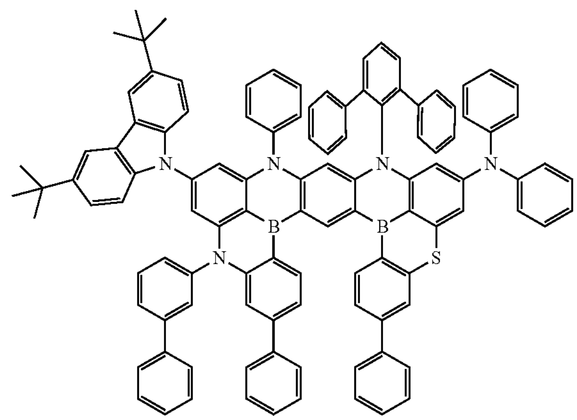
270
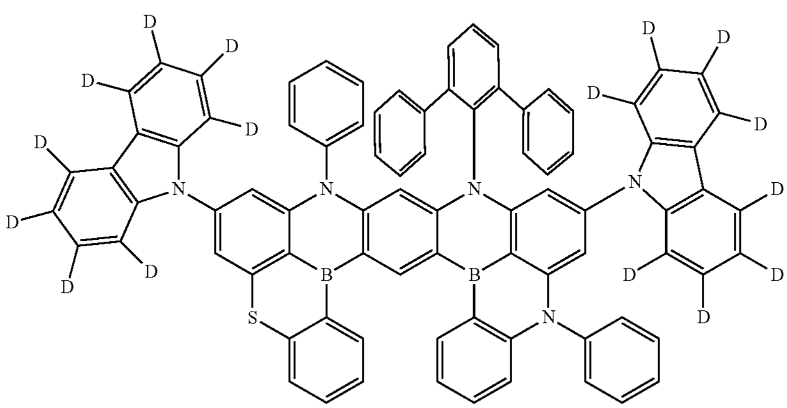
271
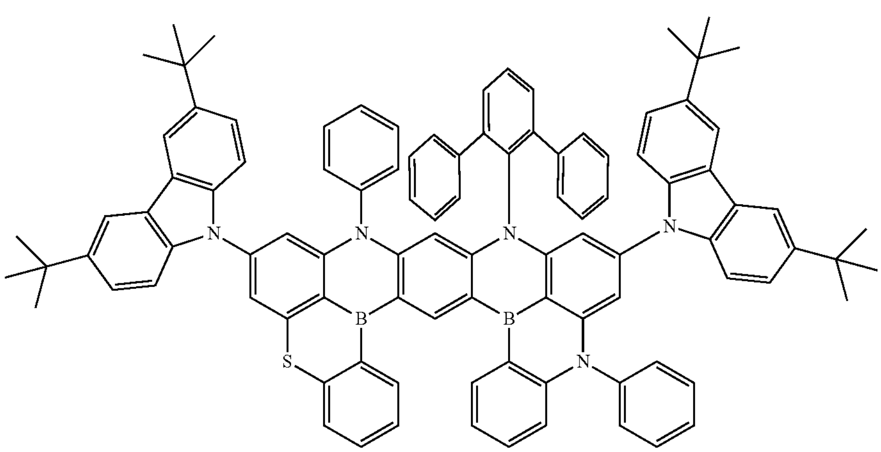

-continued
272
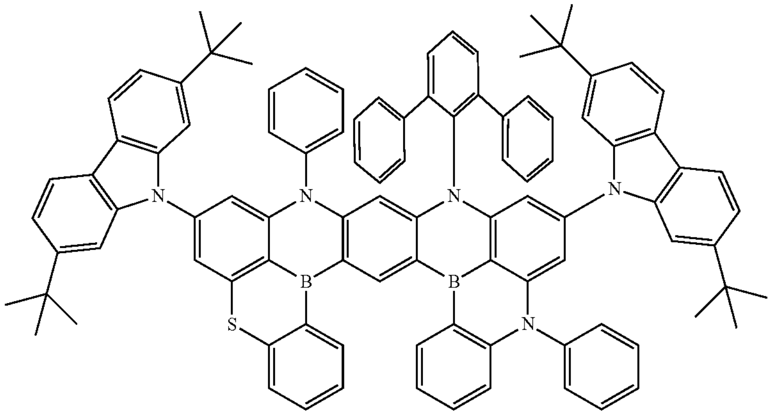
273
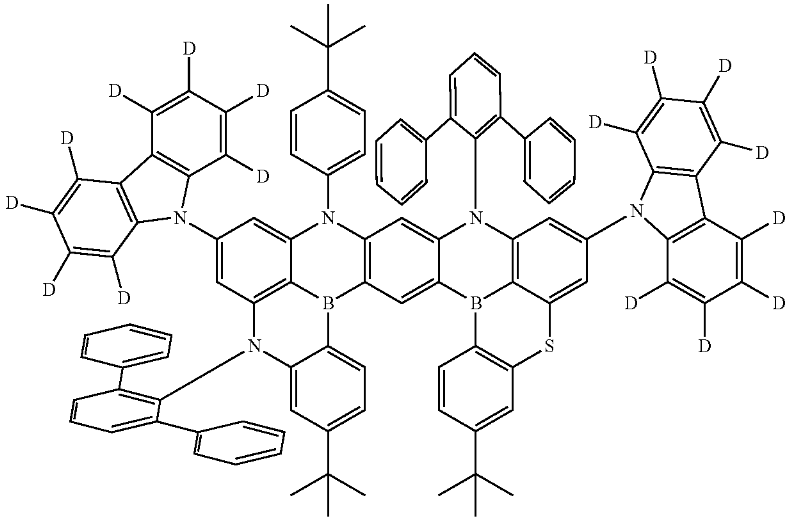
274
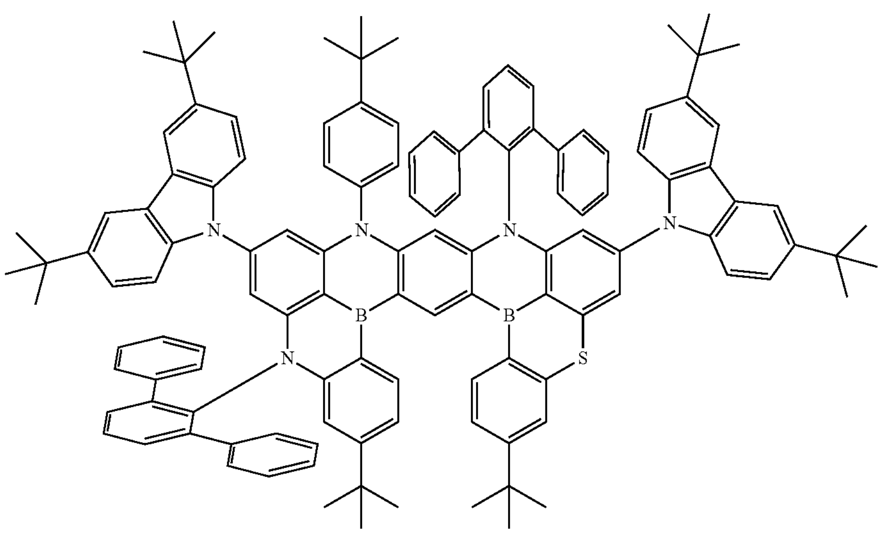

-continued
275
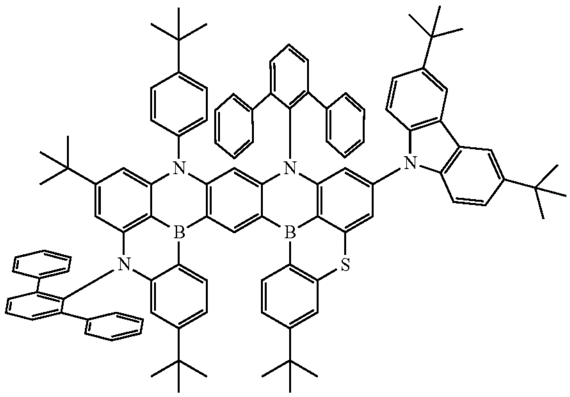
276
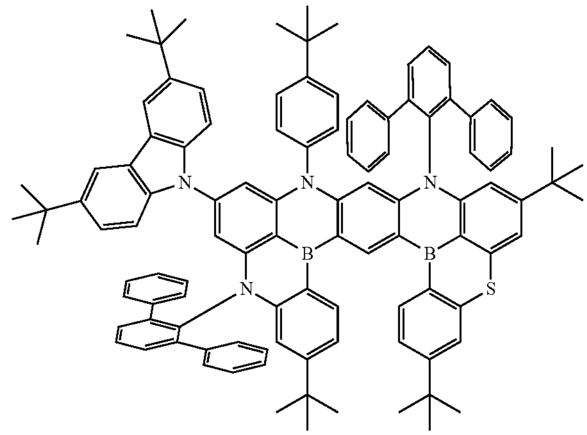
277
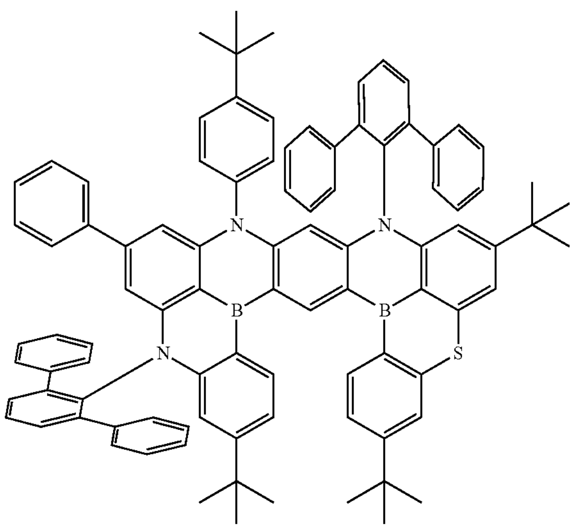
278
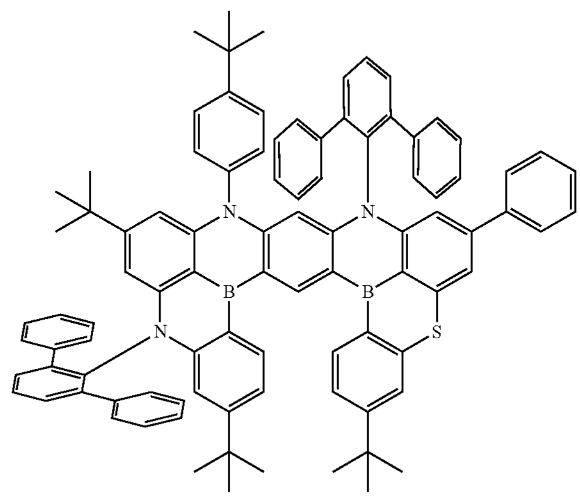
279
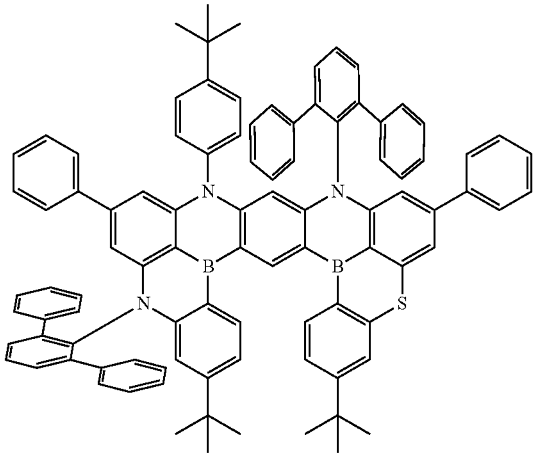
280
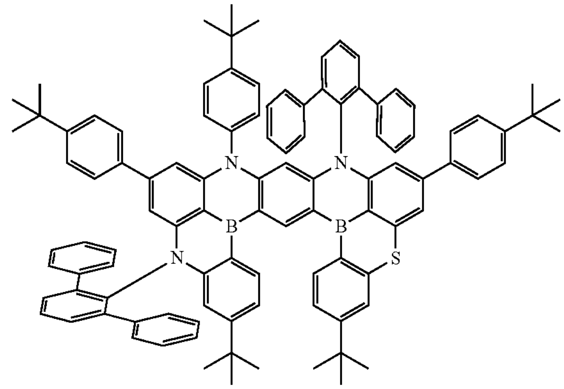

283
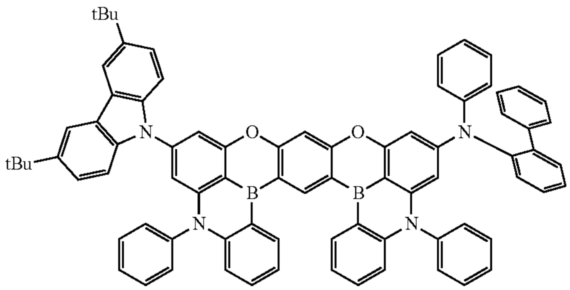
284
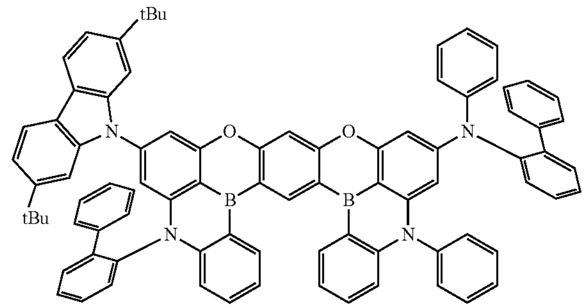
289
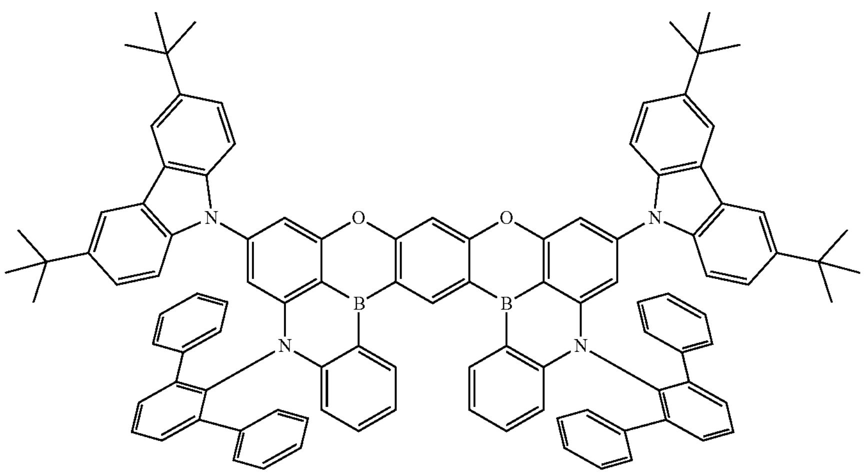
290
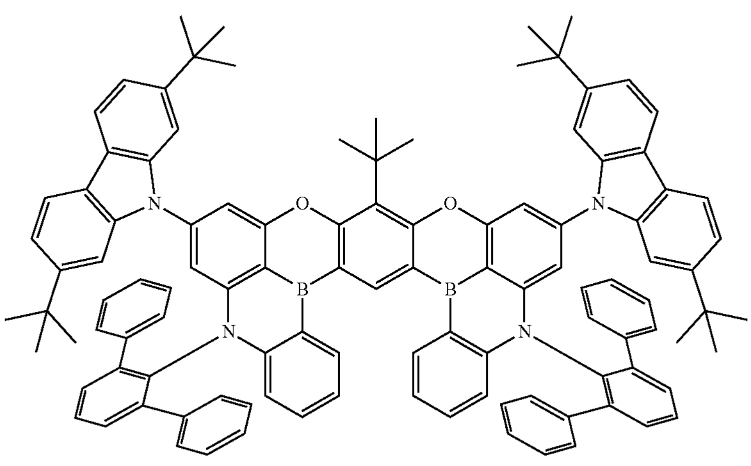

-continued
291
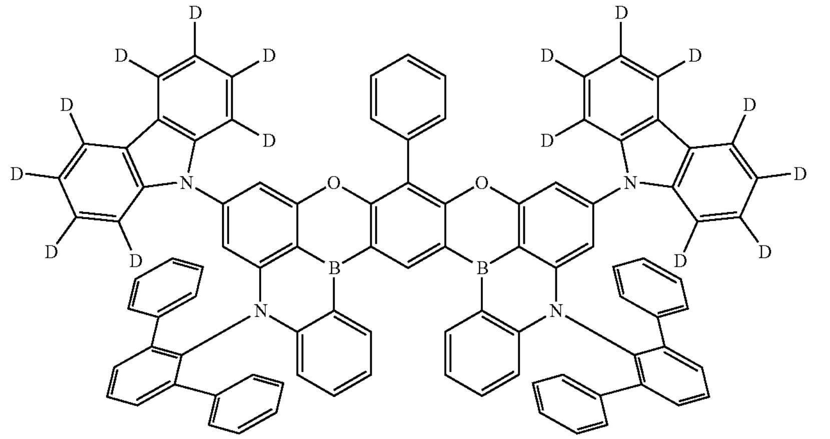
292
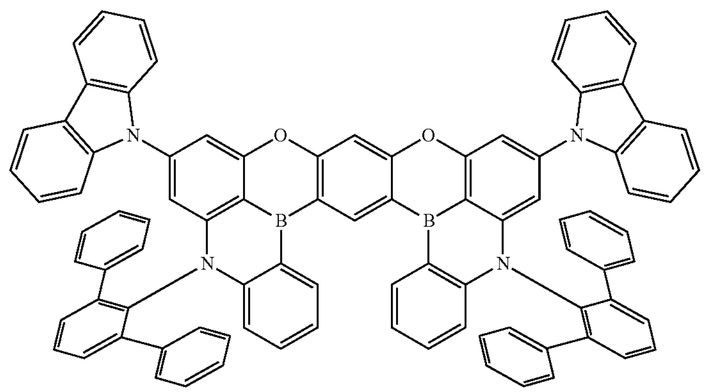
293
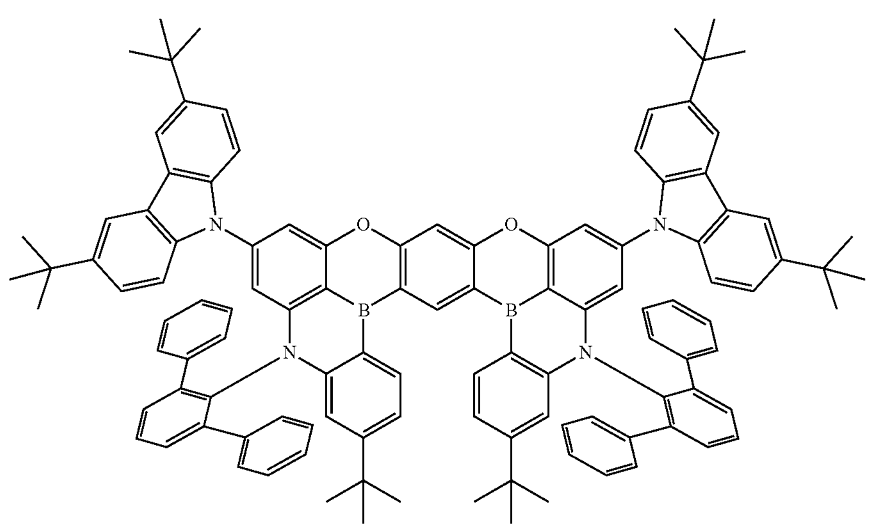

-continued
294
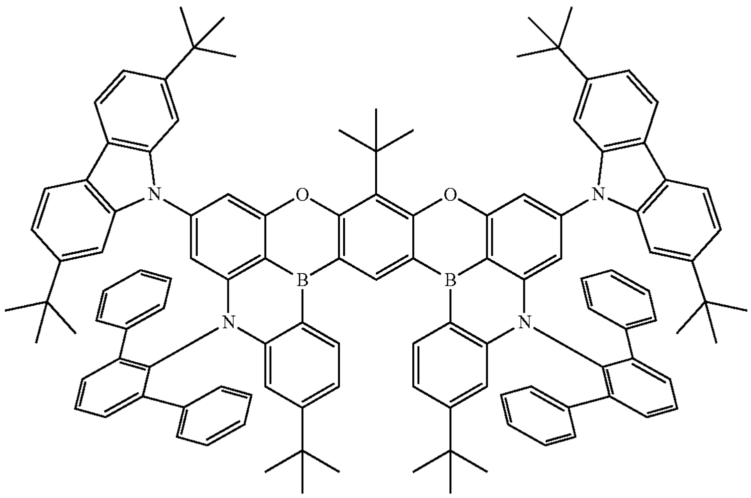
295
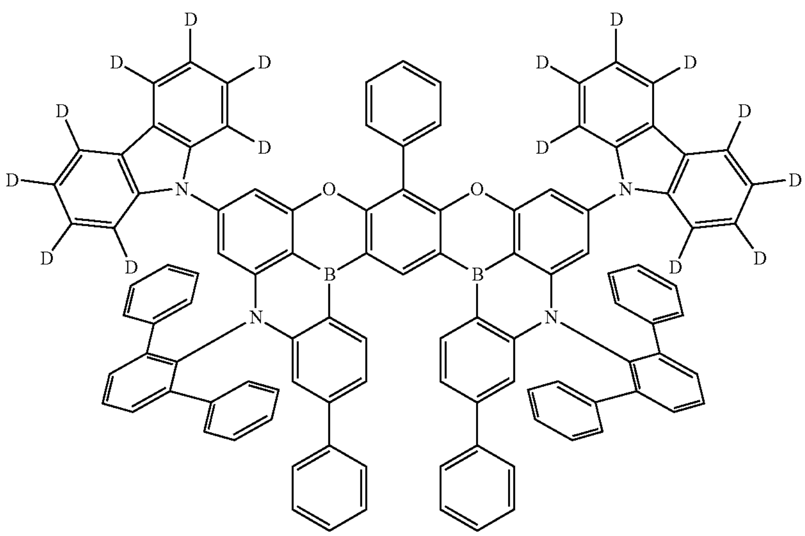
296
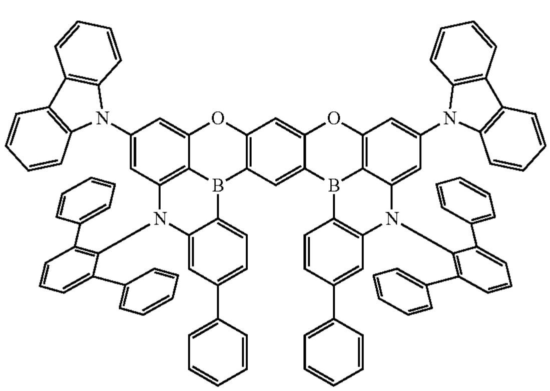
297
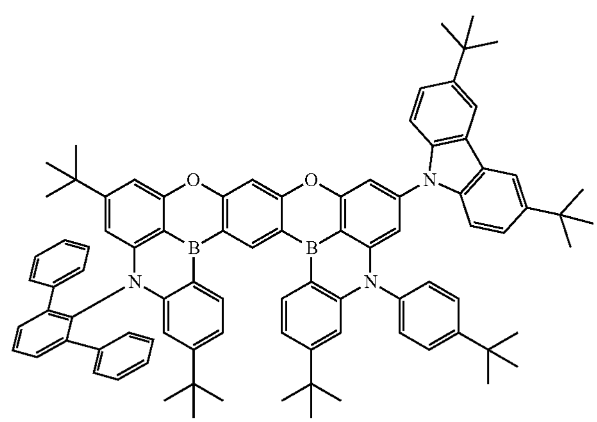

-continued
298
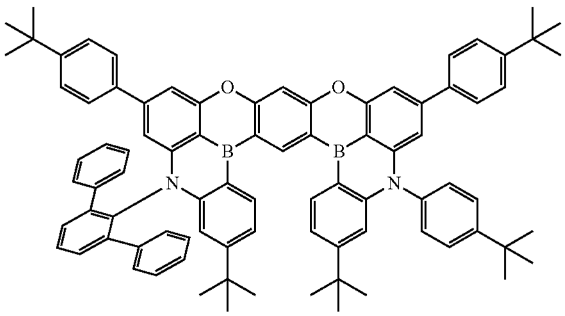
299
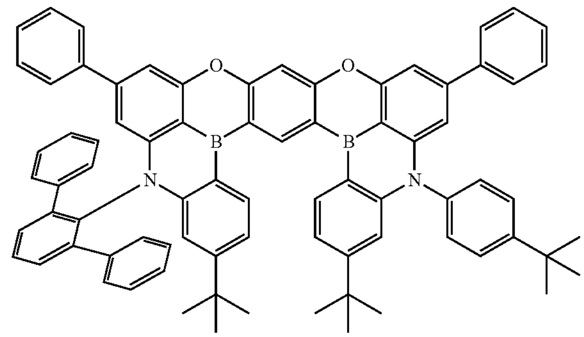
300
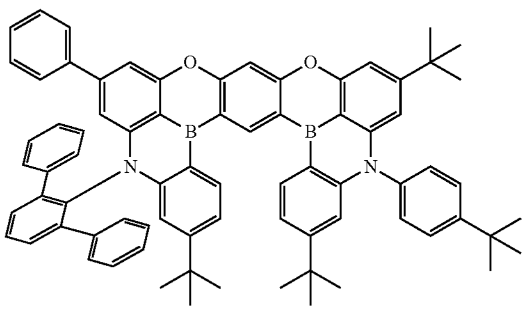
301
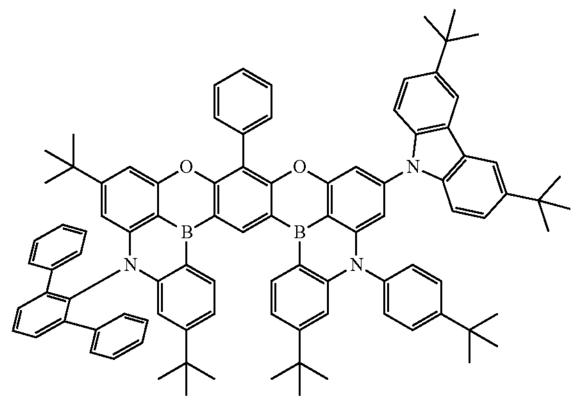
302
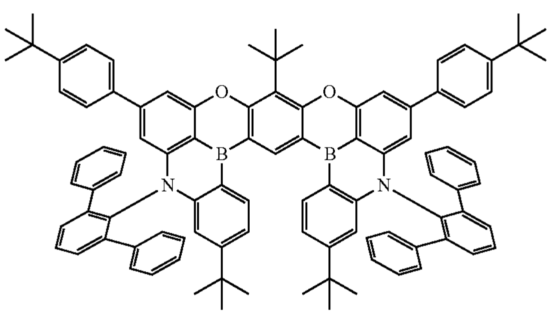
303
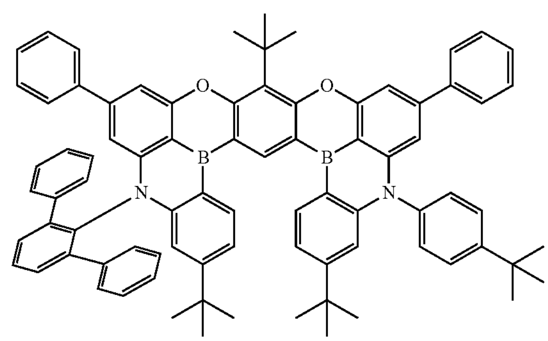
304
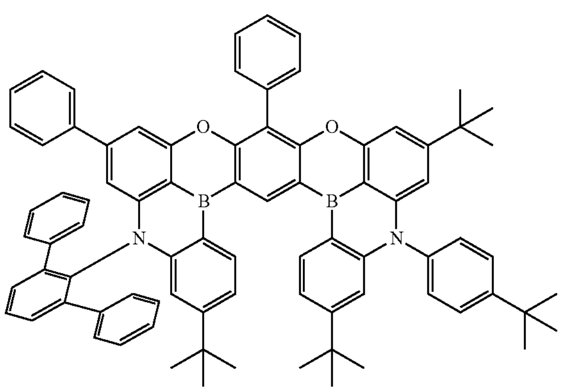

-continued
307
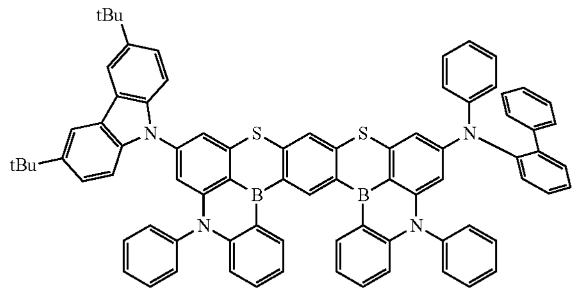
308
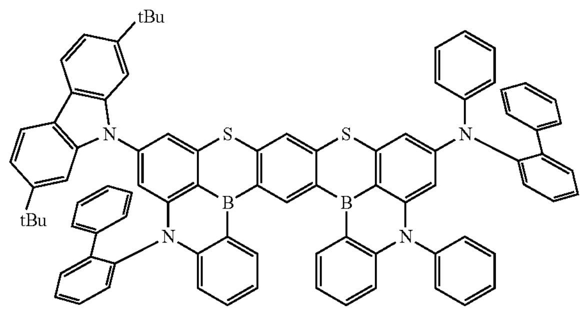
313
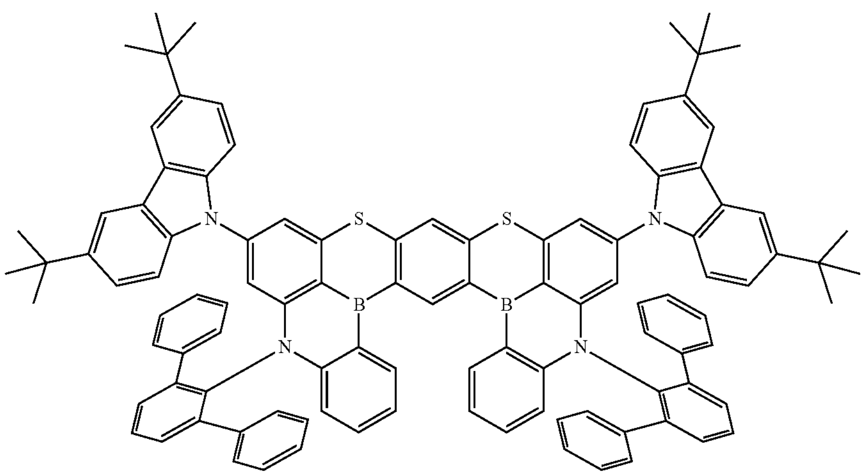
314
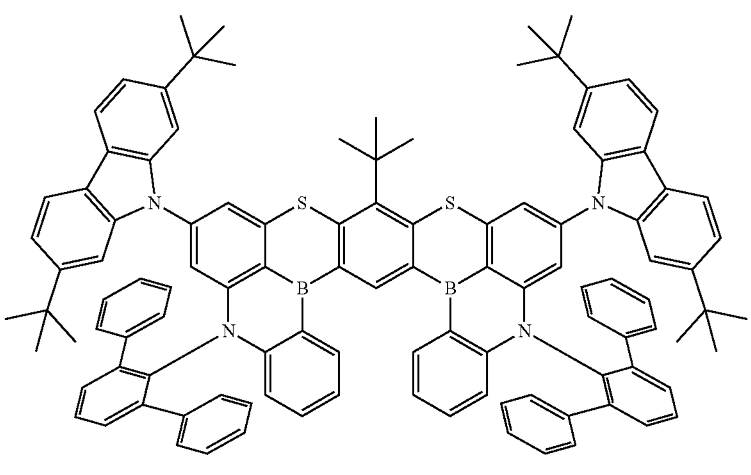

-continued
315
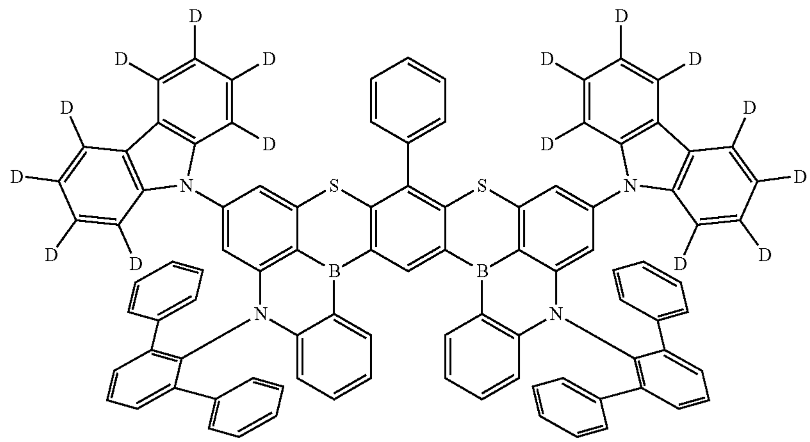
316
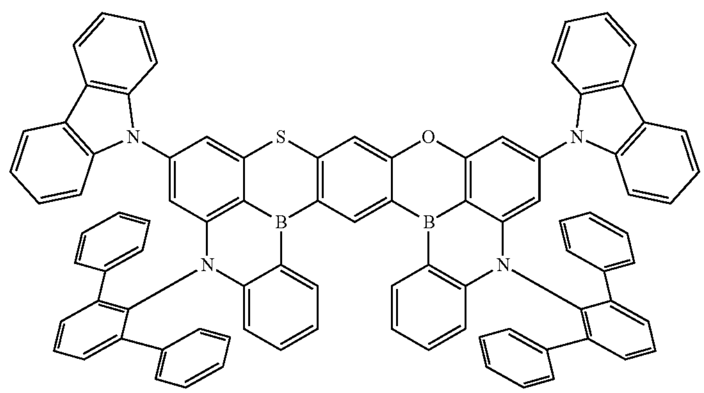
317
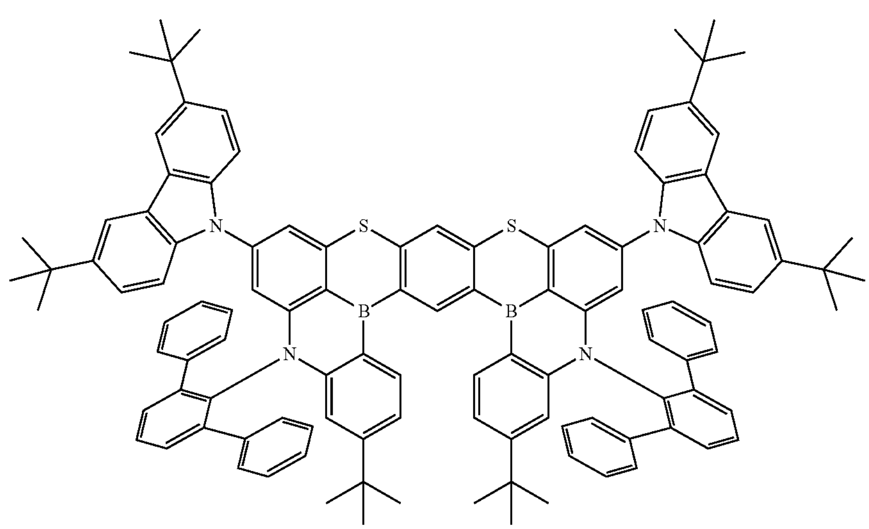

-continued
318
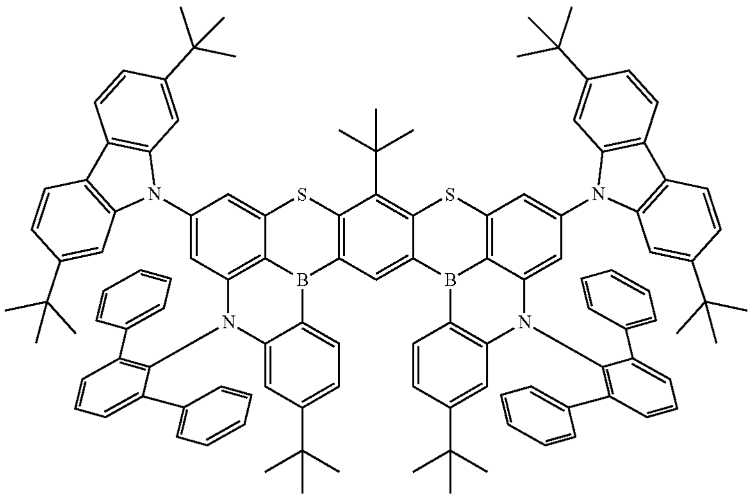
319
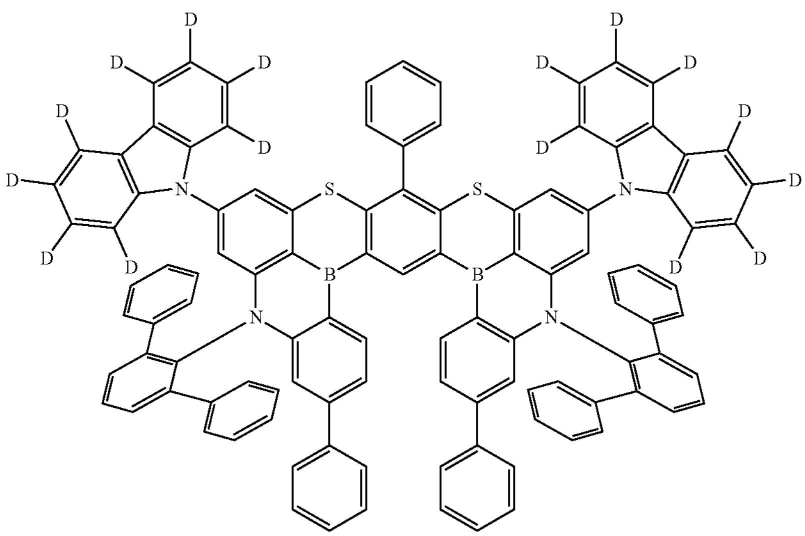
320
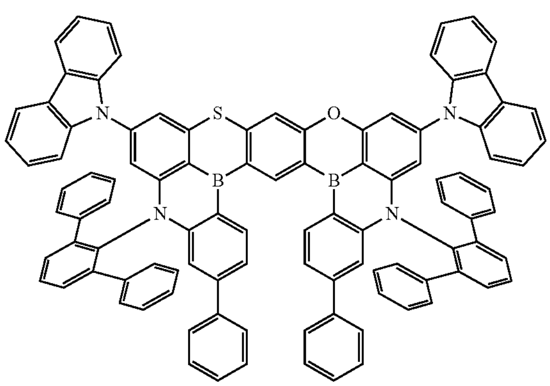
321
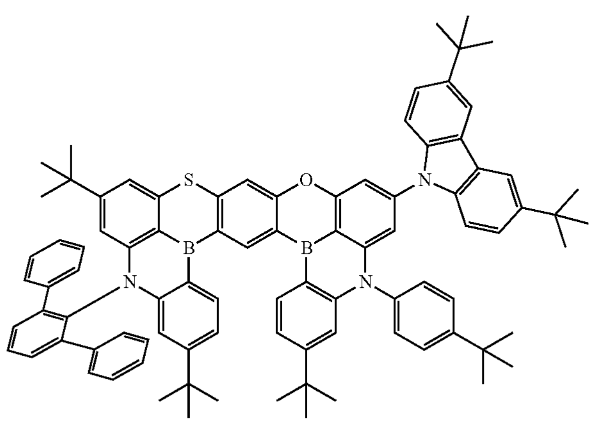

-continued
322
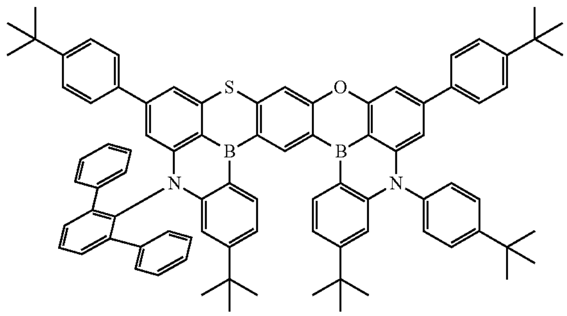
323
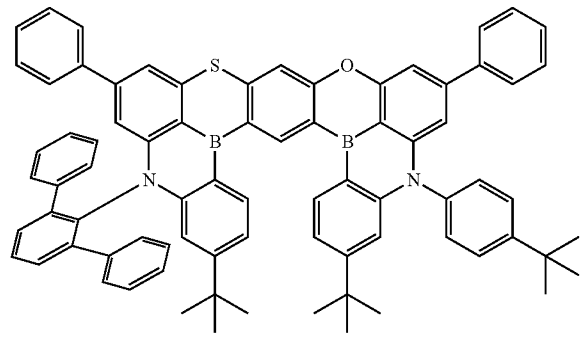
324
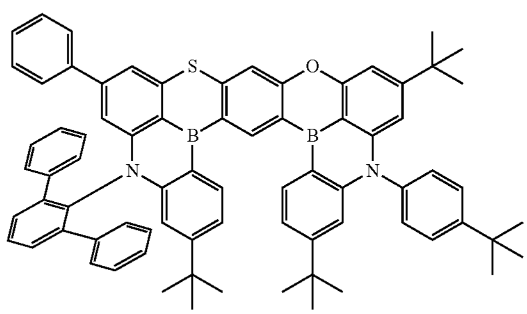
325
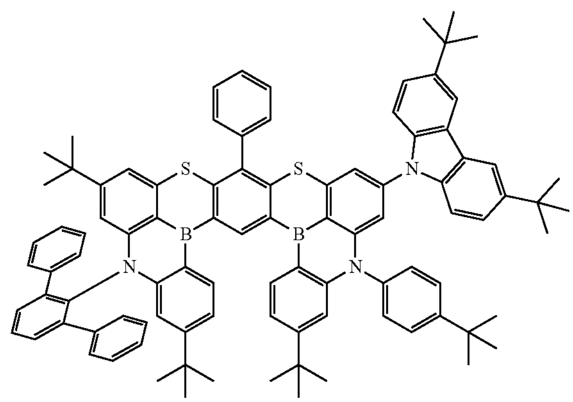
326
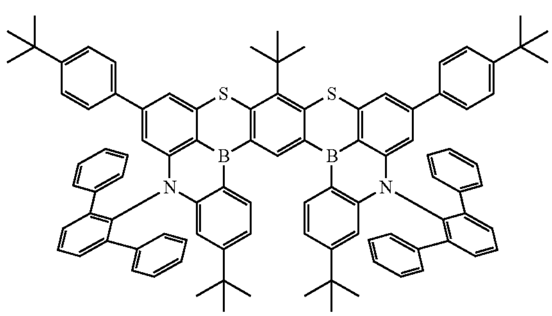
327
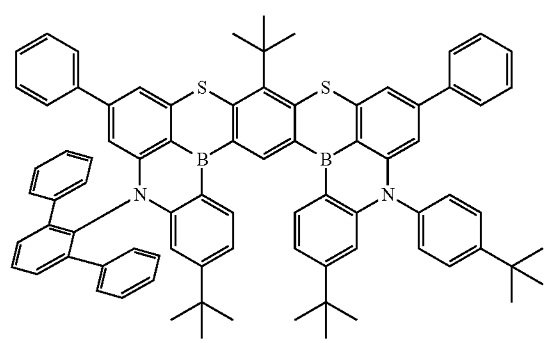
328
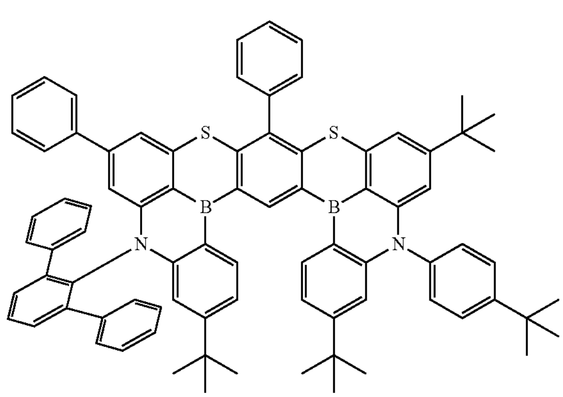
329
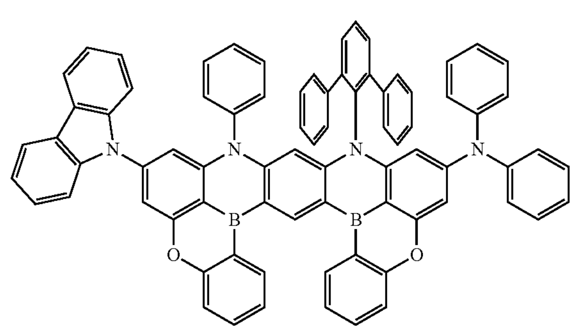

-continued
330
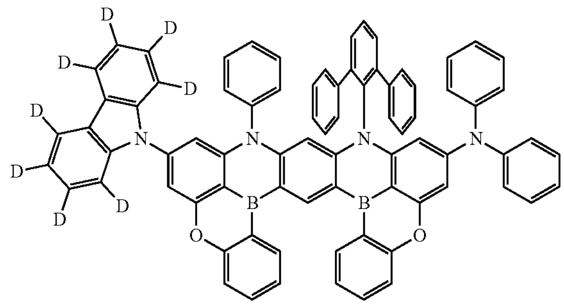
331
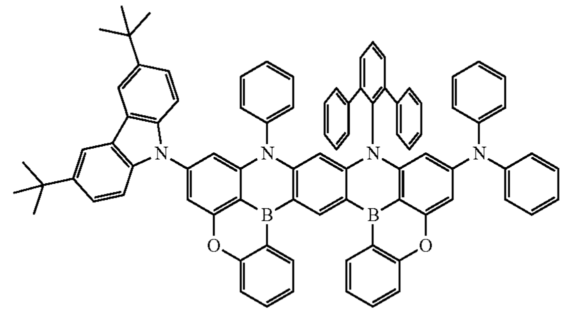
332
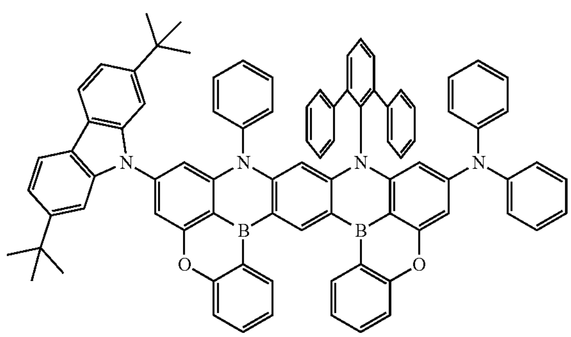
333
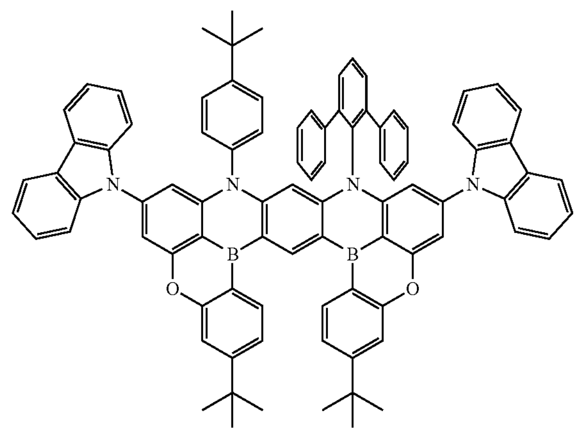
334
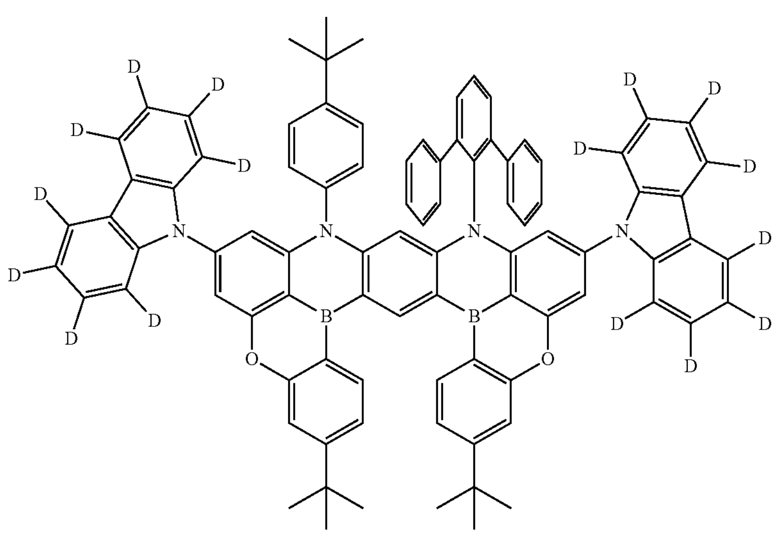

-continued
335
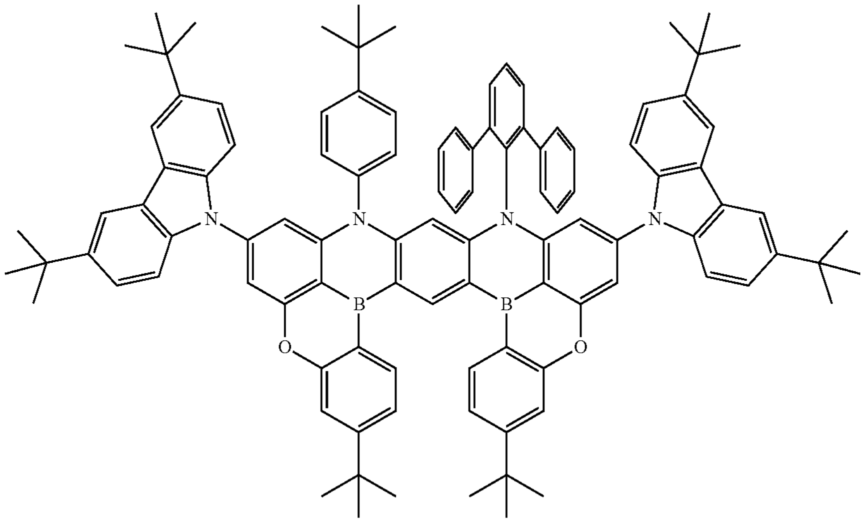
336
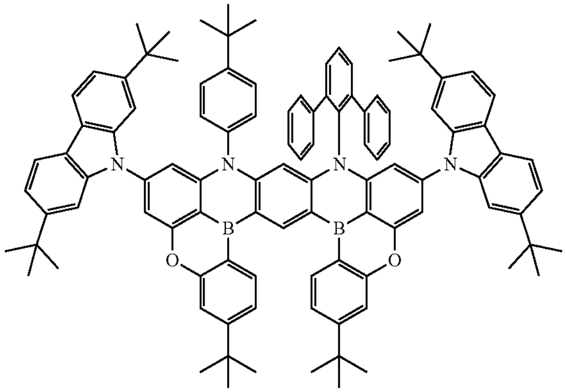
337
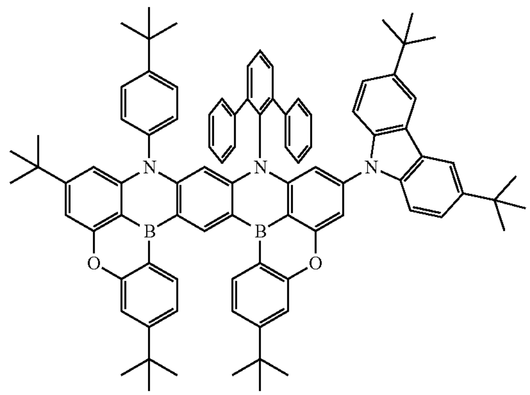
338
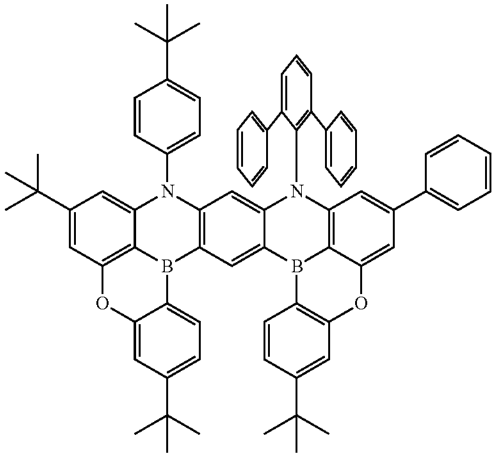
339
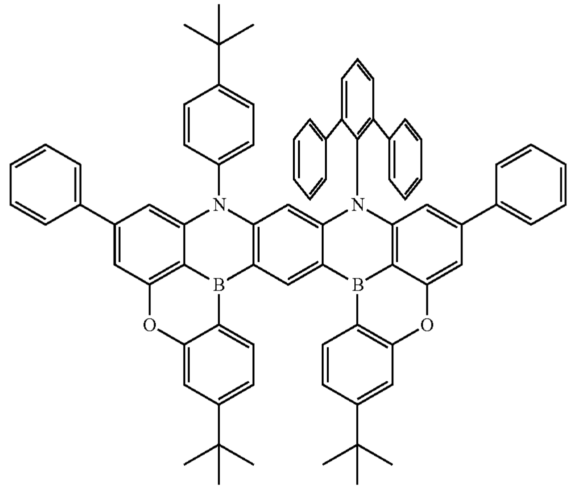

-continued
340
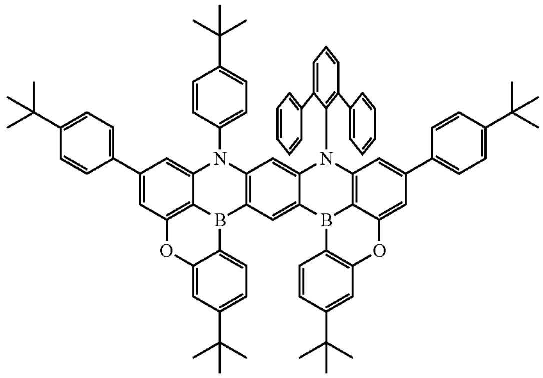
341
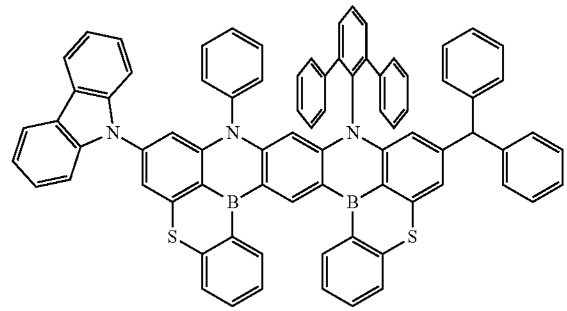
342
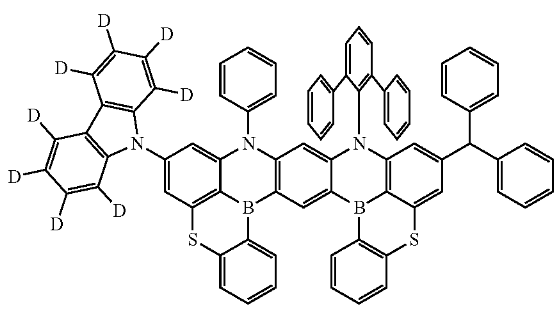
343
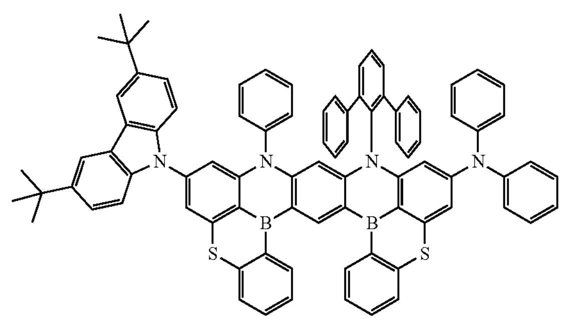
344
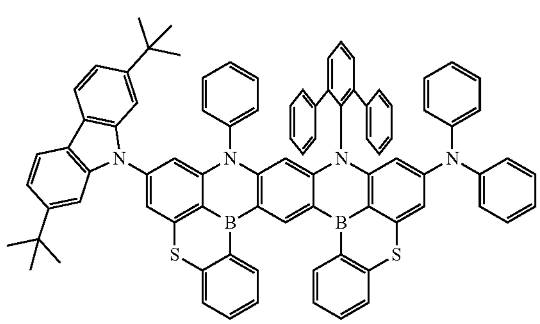
345
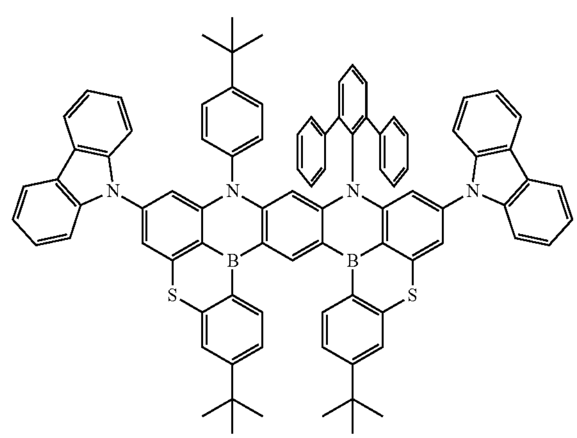

-continued
346
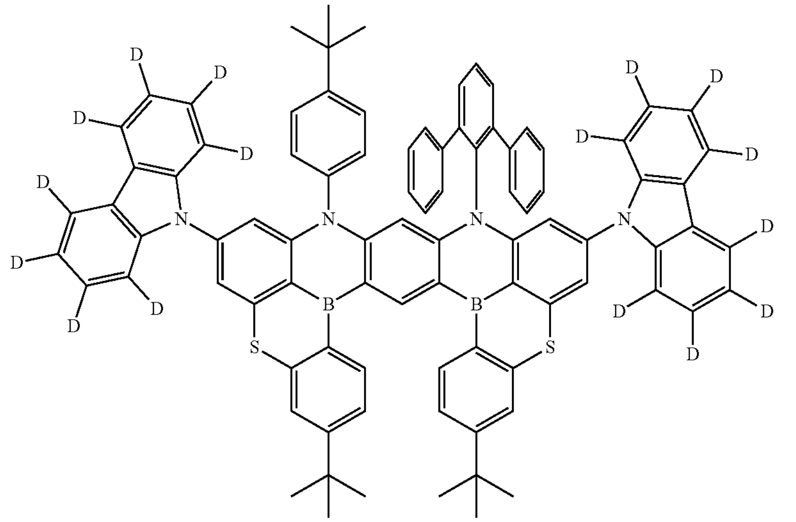
347
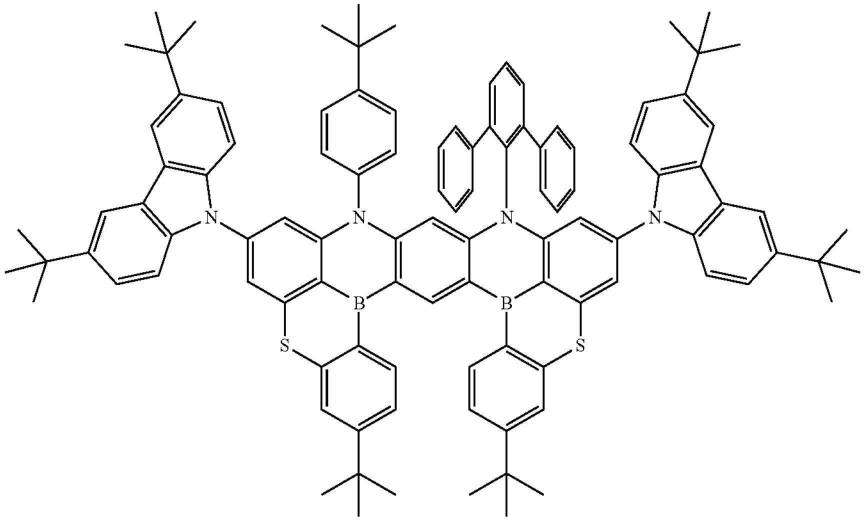
348
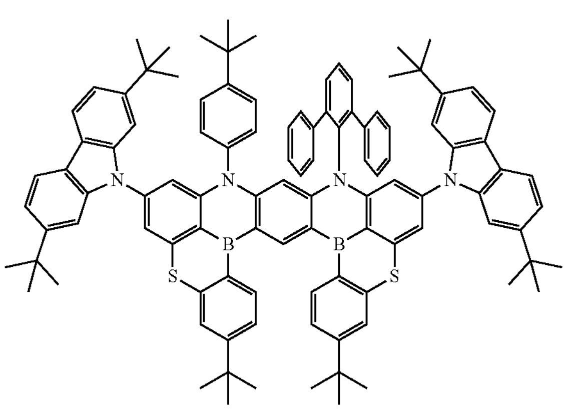
349
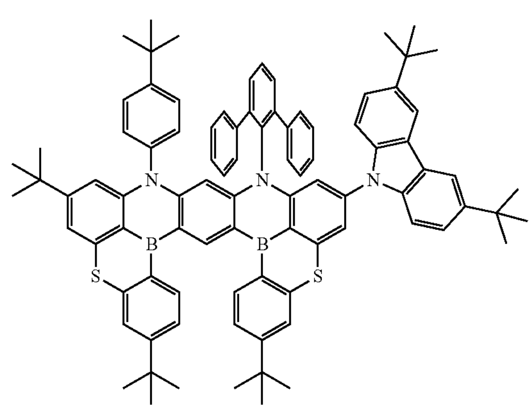

-continued

350

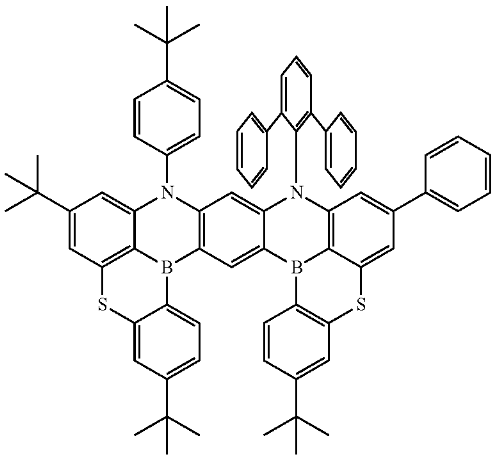

351

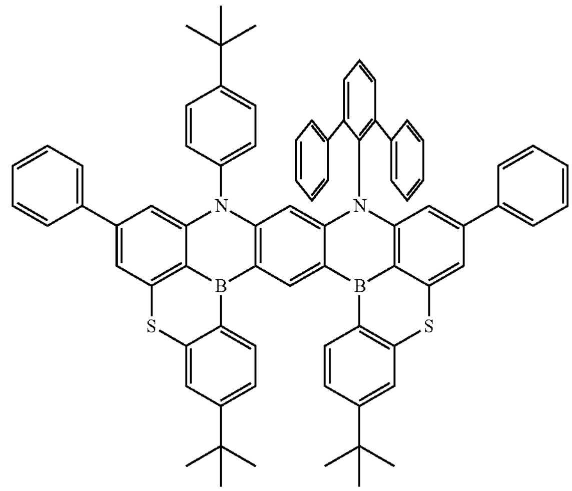

352

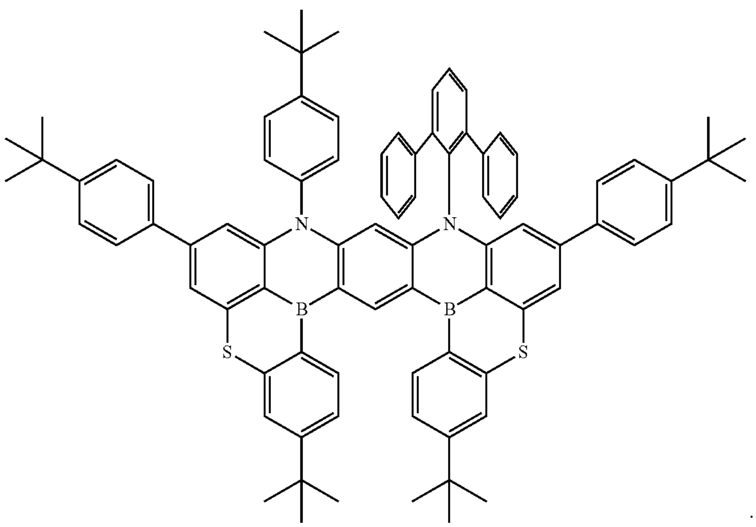

14. A light emitting device comprising:

a first electrode;

a second electrode on the first electrode;

an emission layer which is between the first electrode and the second electrode and comprises a condensed cyclic compound represented by Formula A below; and a capping layer which is on the second electrode and has a refractive index of about 1.6 or more:

Formula A

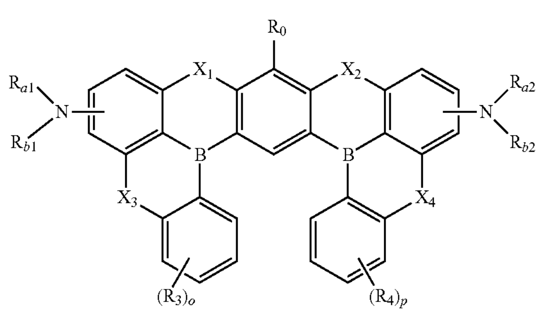

wherein, in Formula A above, $X_1$ to $X_4$ are each independently O, S, $CR_5R_6$, or $NR_7$, and p are each independently an integer of 0 to 4, $R_{a1}$, $R_{b1}$, $R_{a2}$, and $R_{b2}$ are each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 10 carbon atoms, a substituted or unsubstituted aryl group having 6 to 30 ring-forming carbon atoms, or a substituted or unsubstituted heterocycle having 2 to 30 ring-forming carbon atoms, or Rai and Rb1 are bonded to each other to form a ring, or $R_{a2}$ and $R_{b2}$ combine with each other to form a ring, $R_0$, and $R_3$ to $R_7$ are each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 10 carbon atoms, a substituted or unsubstituted aryl group having 6 to 30 ring-forming carbon atoms, or a substituted or unsubstituted heterocycle having 2 to 30 ring-forming carbon atoms, and at least one selected from among $R_{a1}$, $R_{b1}$, $R_{a2}$, $R_{b2}$, and $R_7$ comprises a substituent represented by Formula 2 or Formula 3 below:

Formula 2

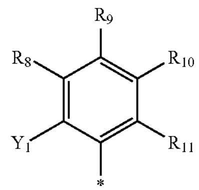

Formula 3

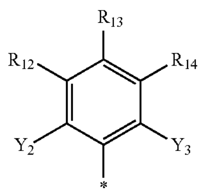

wherein, in Formula 2 and Formula 3, $Y_1$ to $Y_3$ are each independently a substituted or unsubstituted aryl group having 6 to 30 ring-forming carbon atoms, a substituted or unsubstituted amine group, or a substituted or unsubstituted heterocycle having 2 to 30 ring-forming carbon atoms, and $R_8$ to $R_{14}$ are independently a hydrogen atom, a deuterium atom, a halogen atom, a cyano group, a nitro group, a substituted or a unsubstituted silyl group, or a substituted or unsubstituted alkyl group having 1 to 10 carbons atoms "*"indicates a bonding point to another atom in the $R_{a1}$, $R_{b1}$, $R_{a1}$, $R_{b2}$ or $R_7$ group or the condensed cyclic compound represented by Formula A.

15. The light emitting device of claim 14, wherein Formula A is represented by any one selected from among Formula A-1 to Formula A-6 below:

Formula A-1

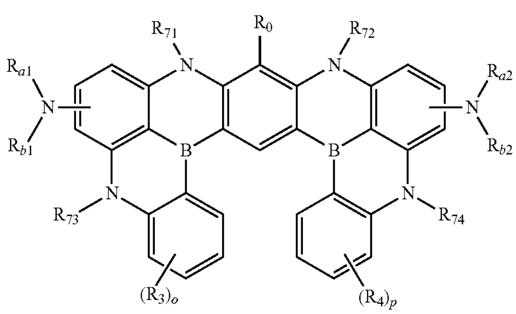

Formula A-2

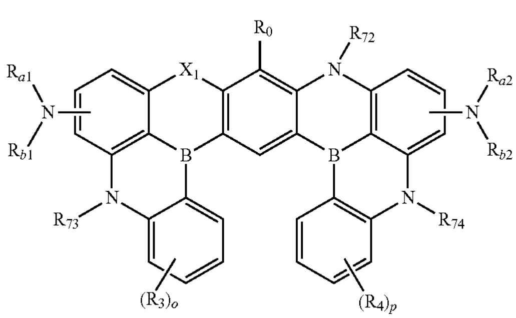

-continued

Formula A-3

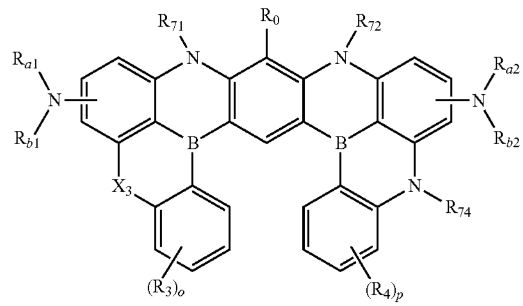

Formula A-4

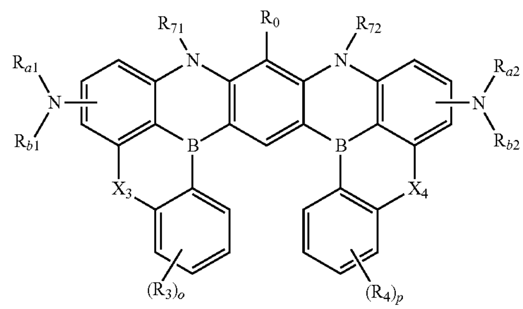

Formula A-5

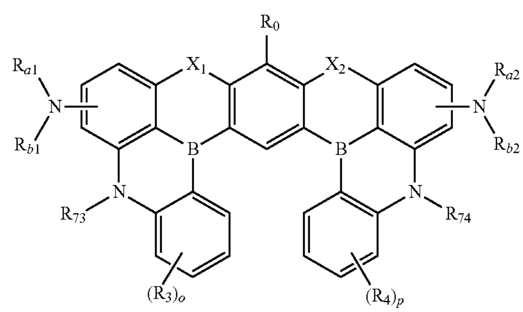

Formula A-6

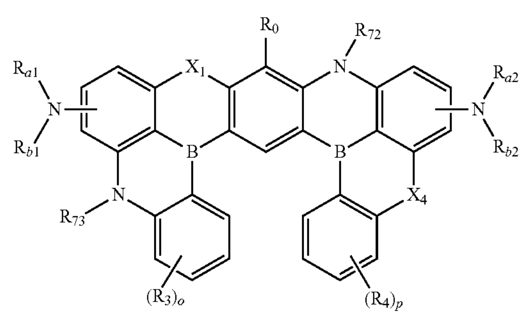

wherein, in Formula A-1 to Formula A-6, $R_{71}$ to $R_{74}$ each independently correspond to R7 defined in Formula A, $X_1$ to $X_4$, $R_0$, $R_{a1}$, $R_{b1}$, $R_{a2}$, $R_{b2}$, $R_3$, $R_4$, o, and p are the same as defined with respect to Formula A.

16. The light emitting device of claim 14, wherein at least two selected from among $X_1$ to $X_4$ are $NR_7$, and the rest are each independently O, S, or $CR_5R_6$, and $R_5$ to $R_7$ are the same as defined with respect to Formula A.

17. The light emitting device of claim 14, wherein Formula 2 is represented by Formula 2-1 below:

Formula 2-1

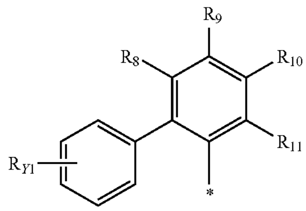

wherein, in Formula 2-1, $R_{Y1}$ is a hydrogen atom, a deuterium atom, a halogen atom, a cyano group, a nitro group, a substituted or unsubstituted silyl group, or a substituted or unsubstituted alkyl group having 1 to 10 carbon atoms, and $R_8$ to $R_{11}$ are the same as defined with respect to Formula 2.

18. The light emitting device of claim 14, wherein Formula 3 is represented by Formula 3-1 below:

Formula 3-1

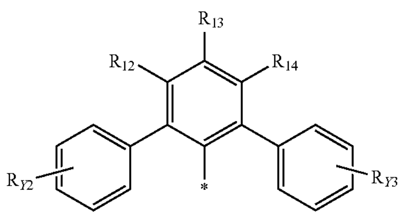

wherein, in Formula 3-1, $R_{Y2}$ and $R_{Y3}$ are each independently a hydrogen atom, a deuterium atom, a halogen atom, a cyano group, a nitro group, a substituted or unsubstituted silyl group, or a substituted or unsubstituted alkyl group having 1 to 10 carbon atoms, and $R_{12}$ to $R_{14}$ are the same as defined with respect to Formula 3.

19. The light emitting device of claim 14, wherein $Y_1$ to $Y_3$ are each independently an unsubstituted phenyl group, or a phenyl group substituted with an alkyl group having 1 to 10 carbon atoms.

20. The light emitting device of claim 14, wherein the emission layer comprises at least one selected from among the condensed cyclic compounds of Compound Group 1 below:

Compound Group 1

1

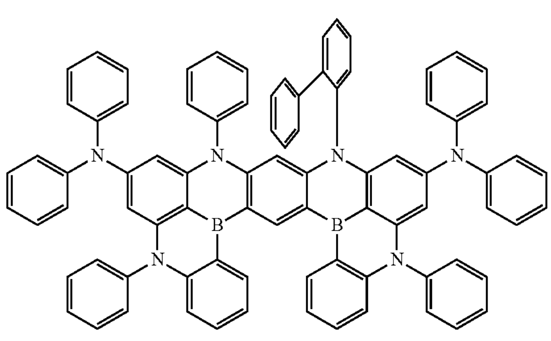

-continued

2

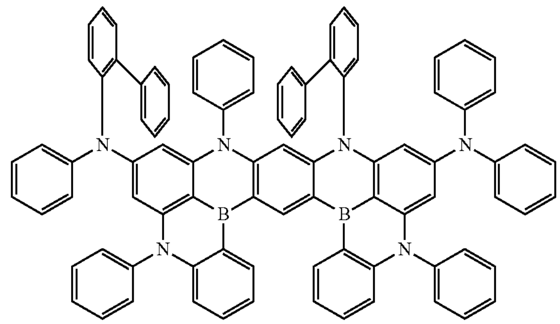

3

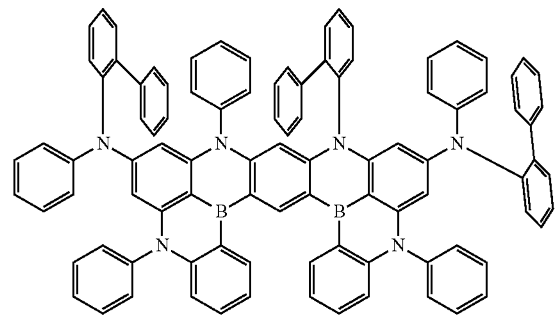

4

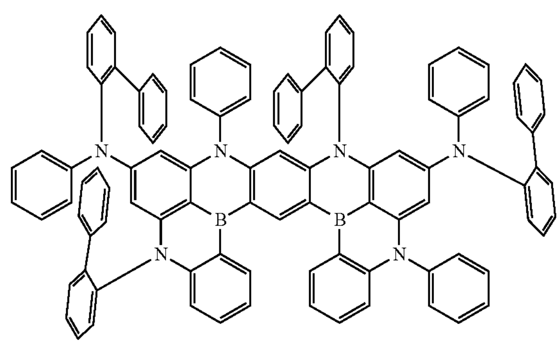

5

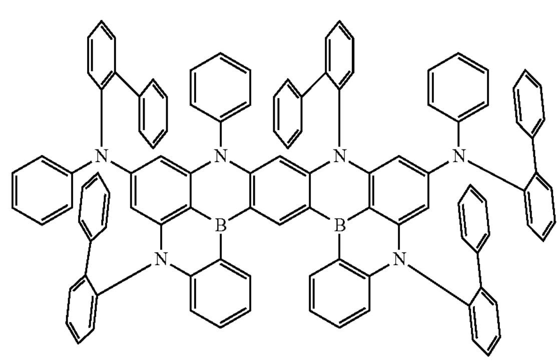

-continued
6
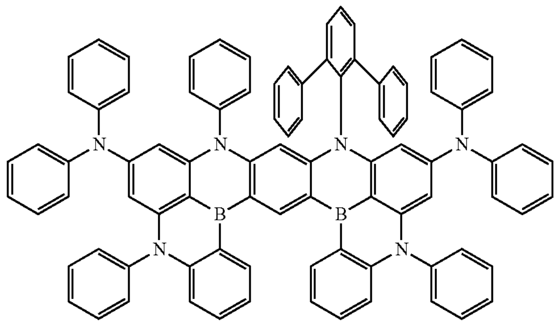
7
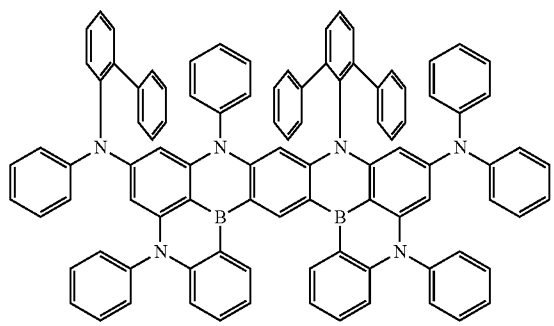
8
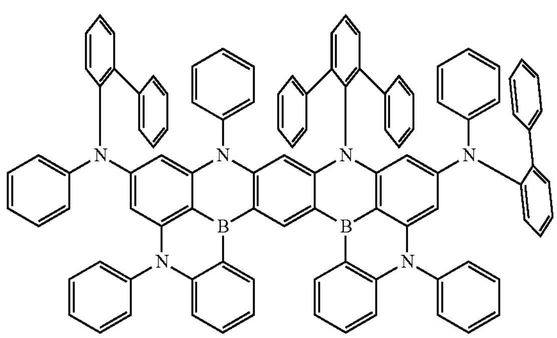
9
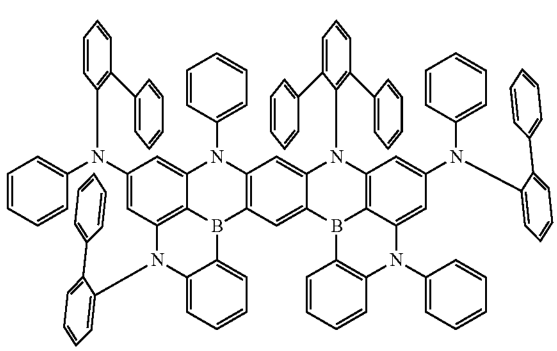
-continued
10
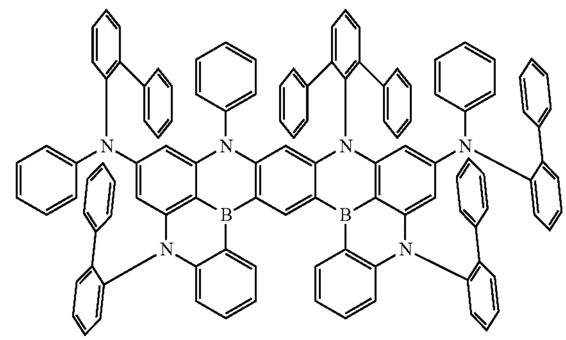
11
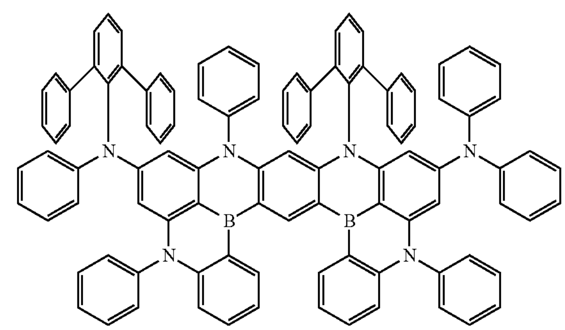
12
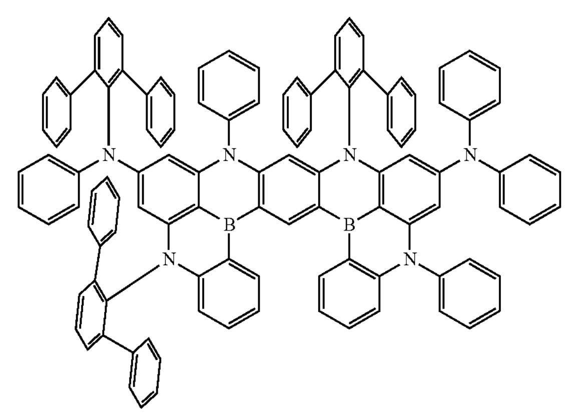
13
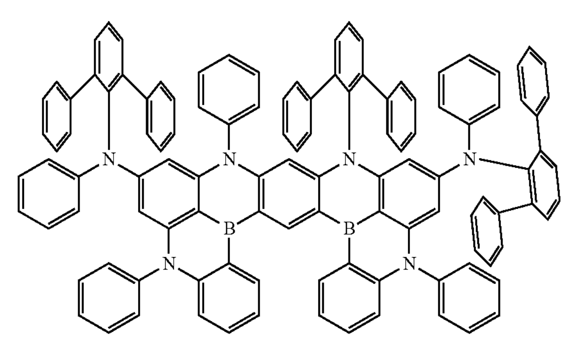

-continued
14
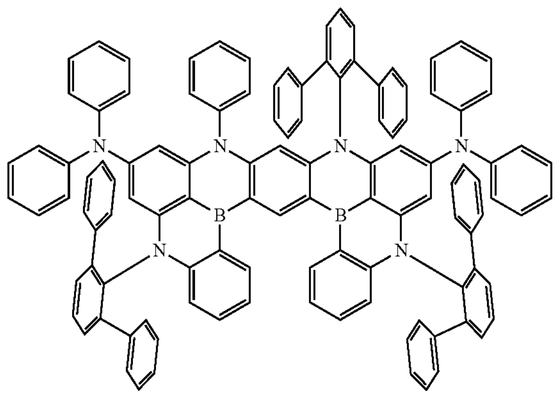
15
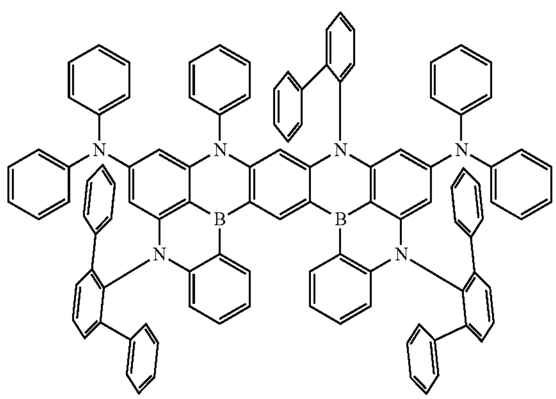
16
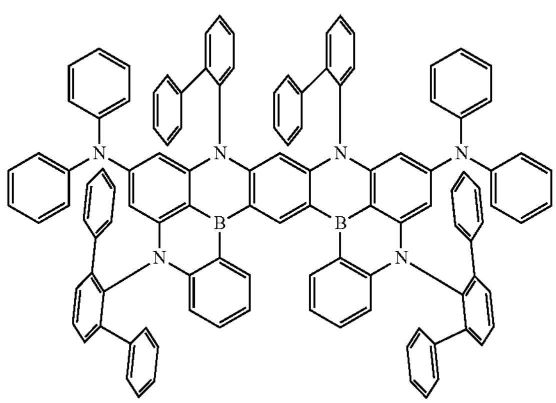
17
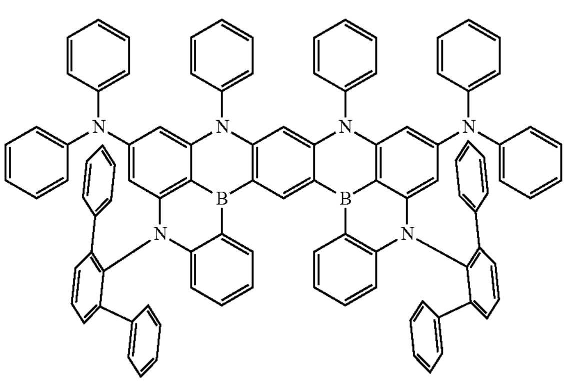
-continued
18
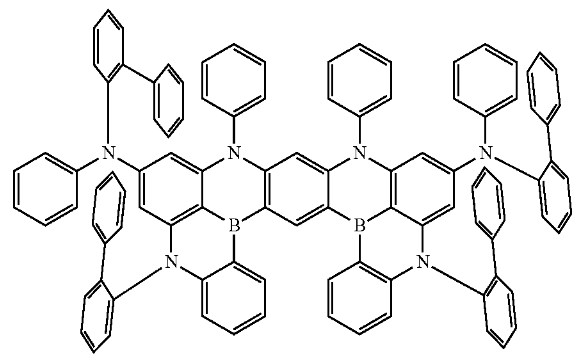
19
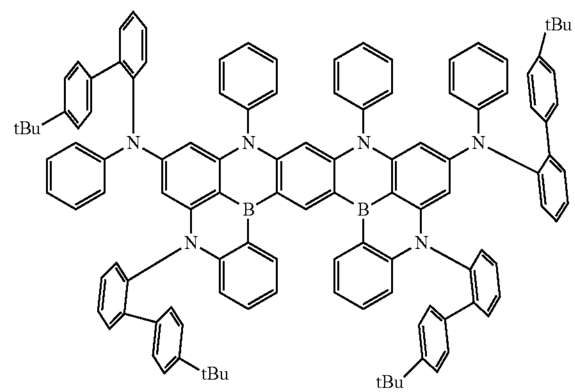
20
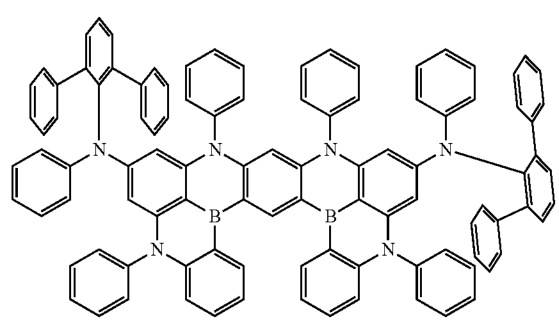
21
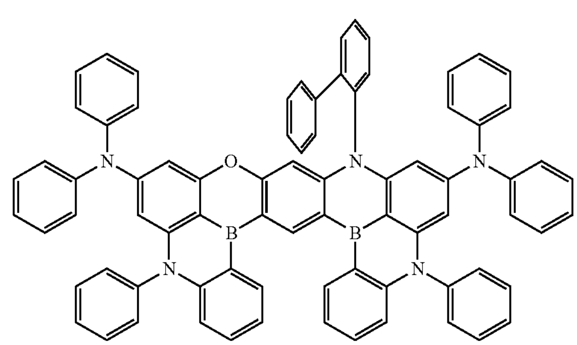

-continued
22
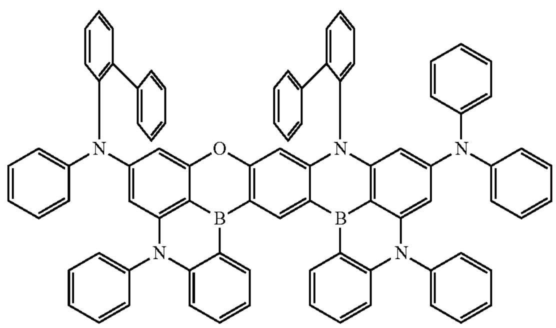
23
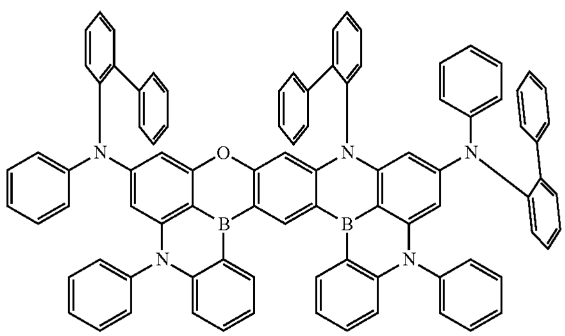
24
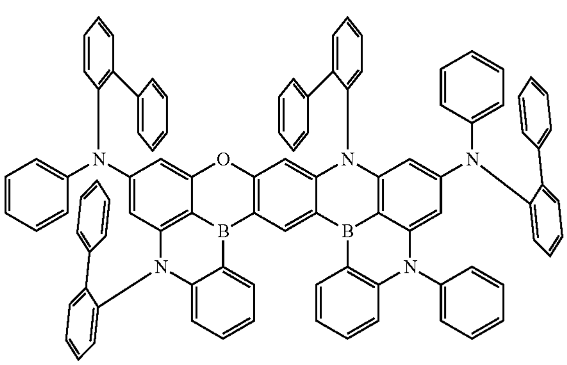
25
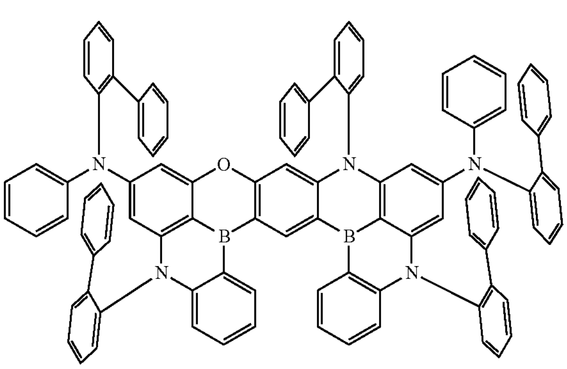
-continued
26
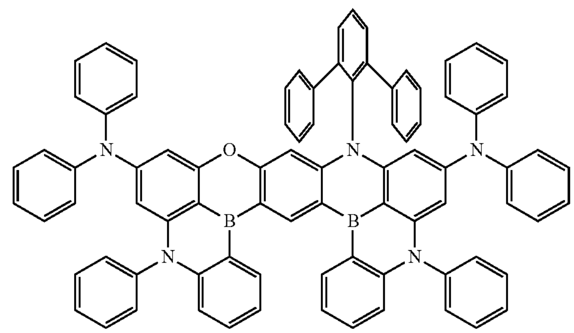
27
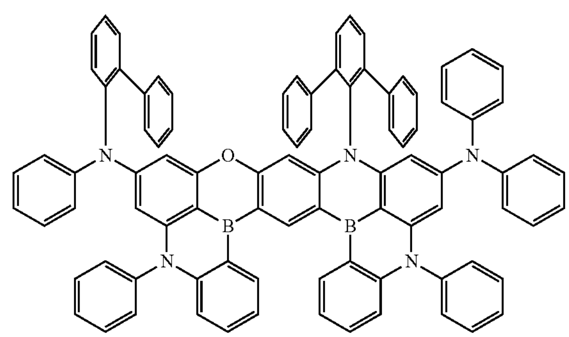
28
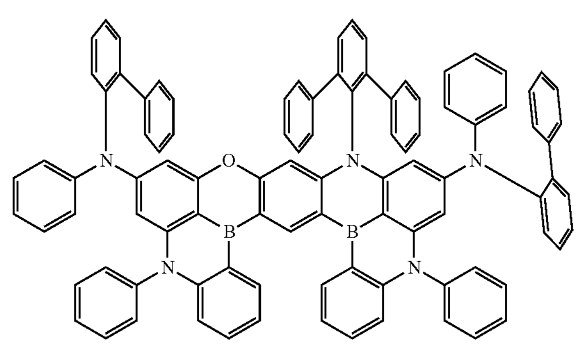
29
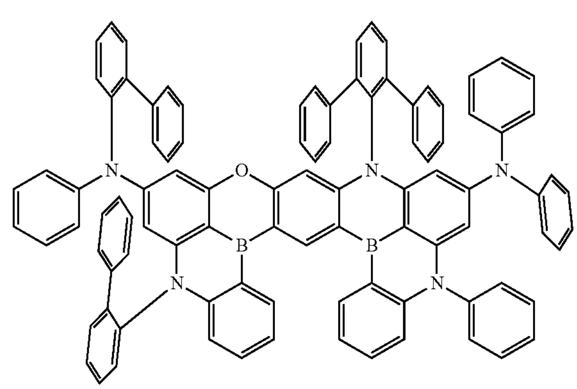

30
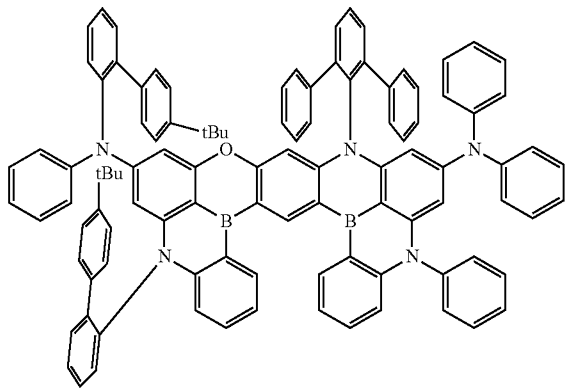
31
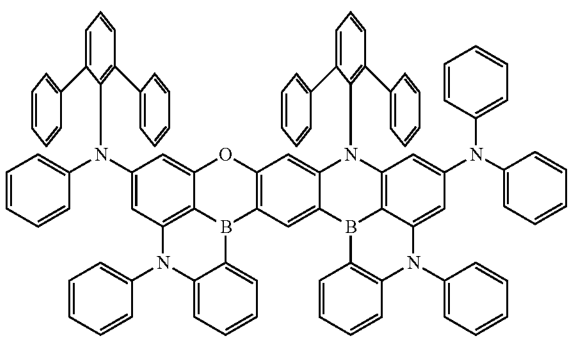
32
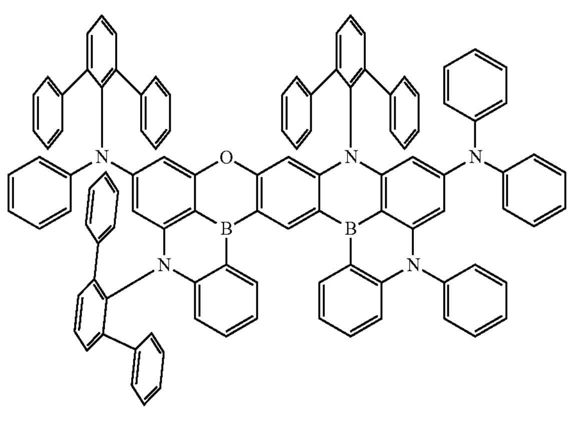
33
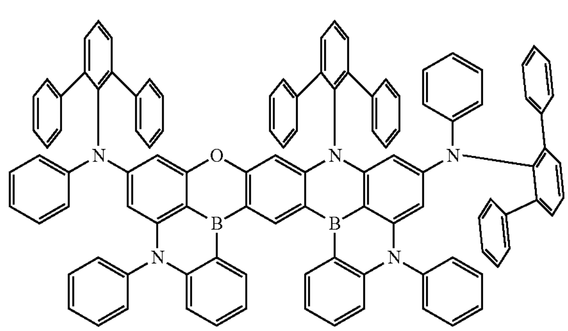
34
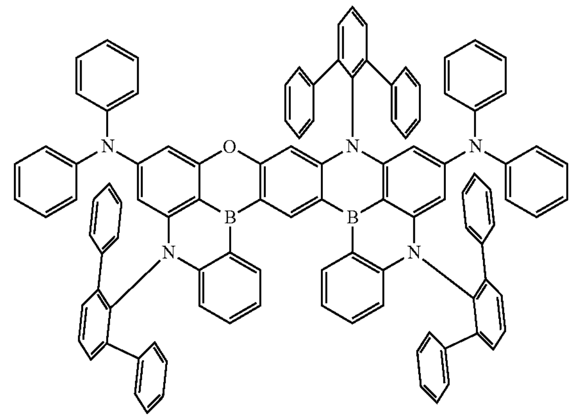
35
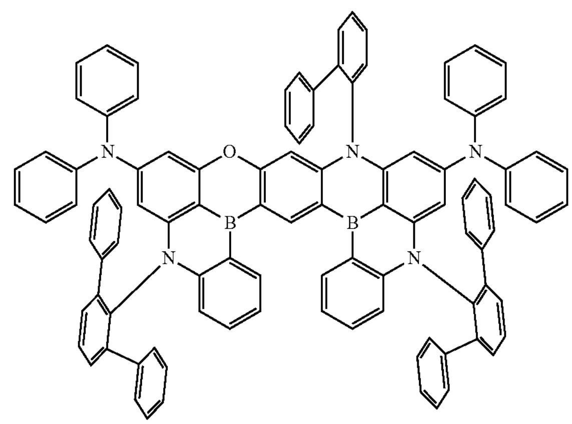
36
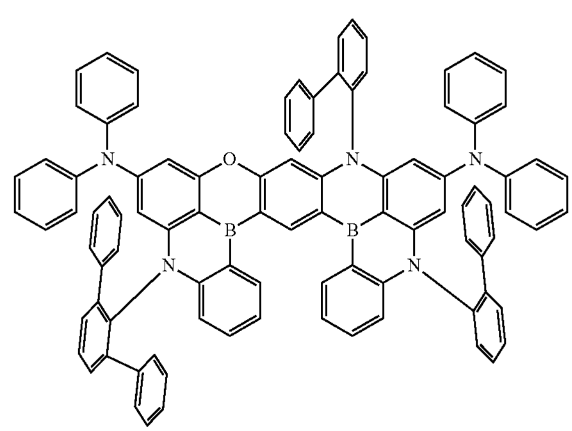

-continued
37
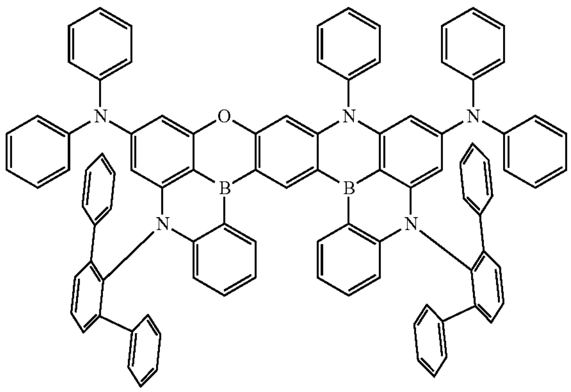
38
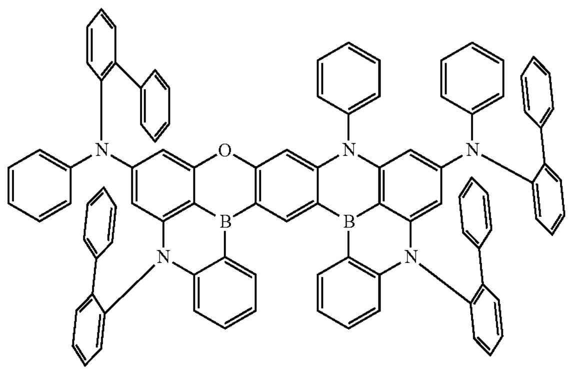
39
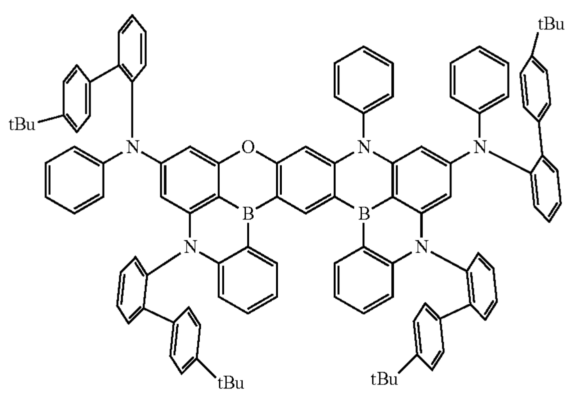
40
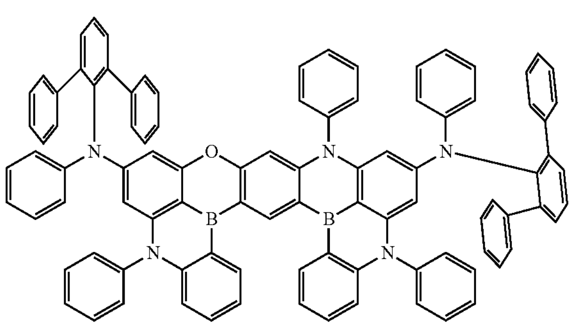
-continued
41
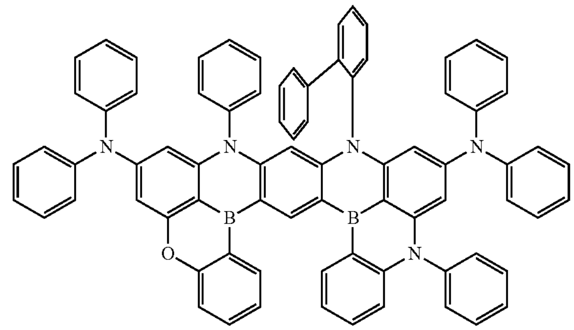
42
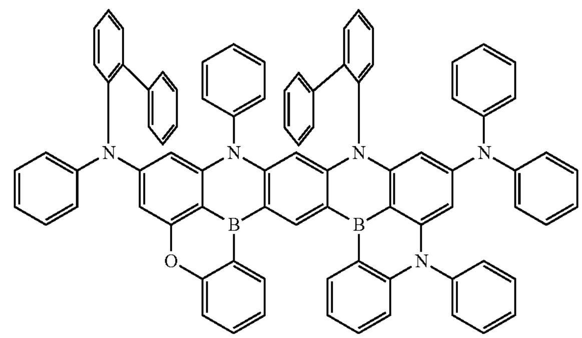
43
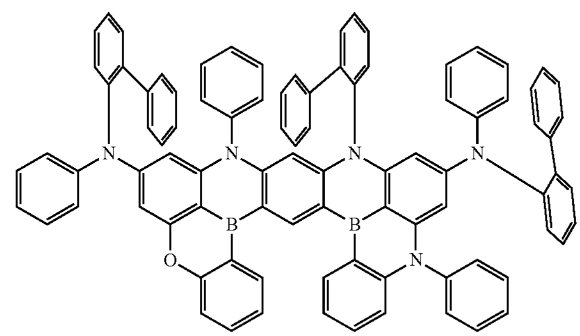
44
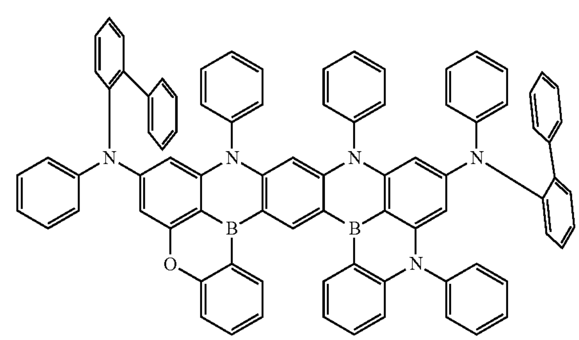

-continued
45
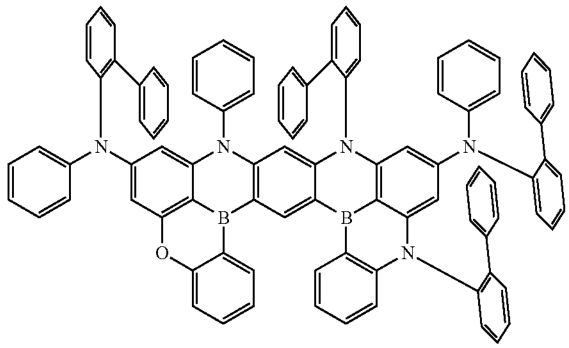
46
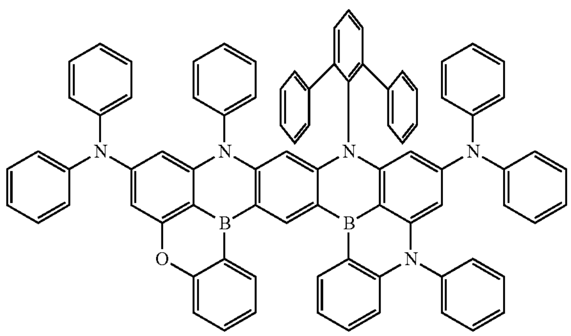
47
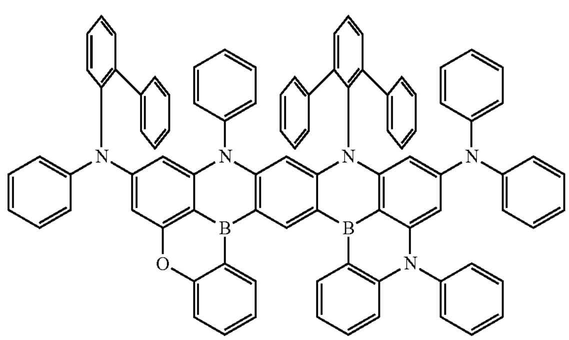
48
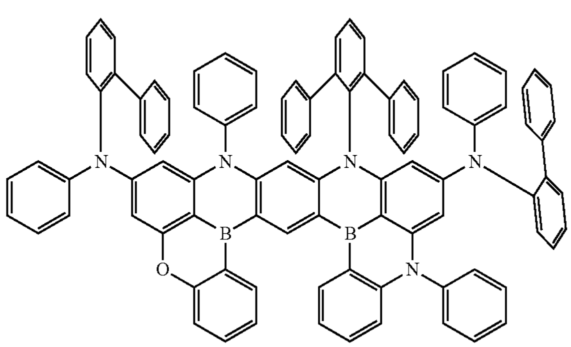
-continued
49
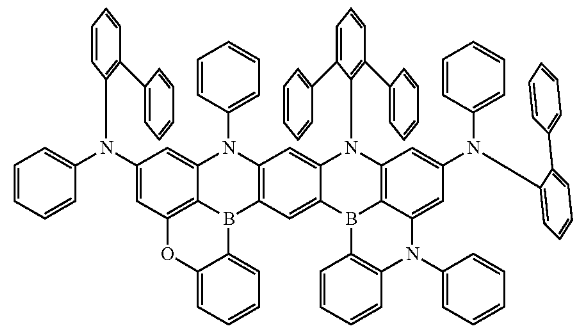
50
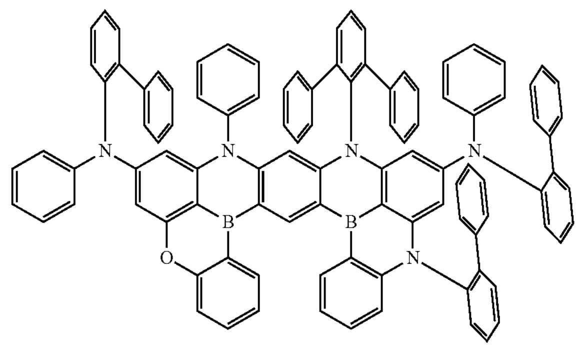
51
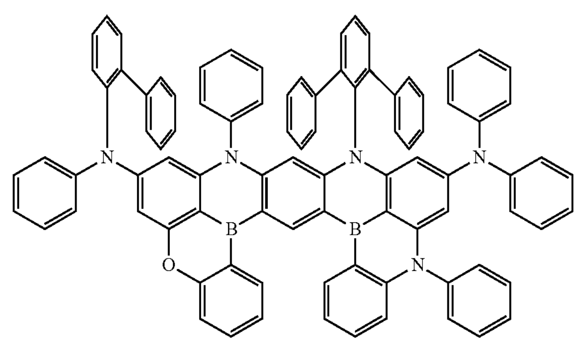
52
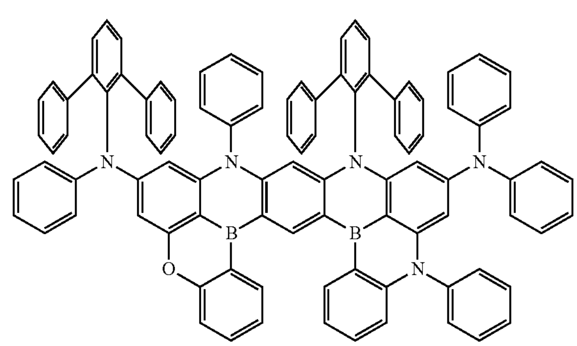

-continued
53
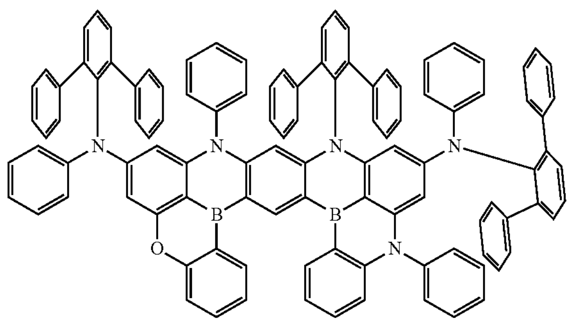
54
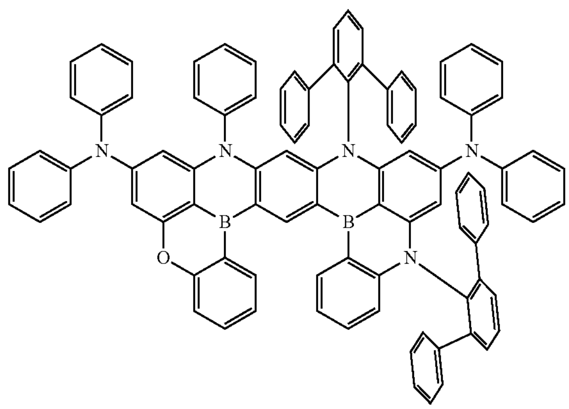
55
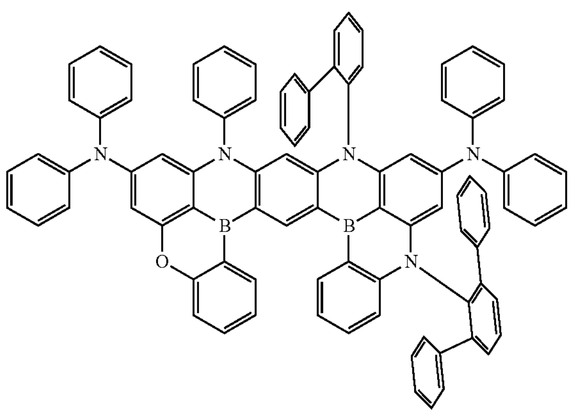
56
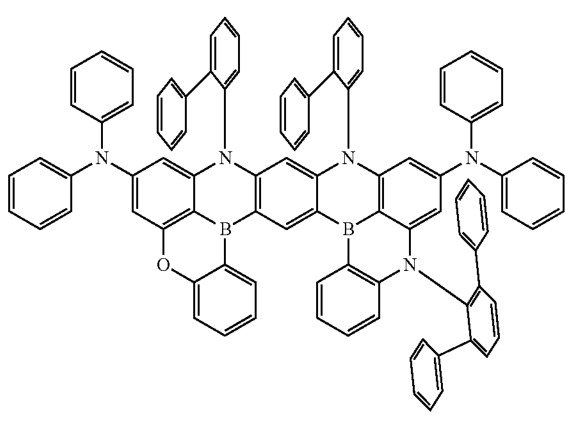
-continued
57
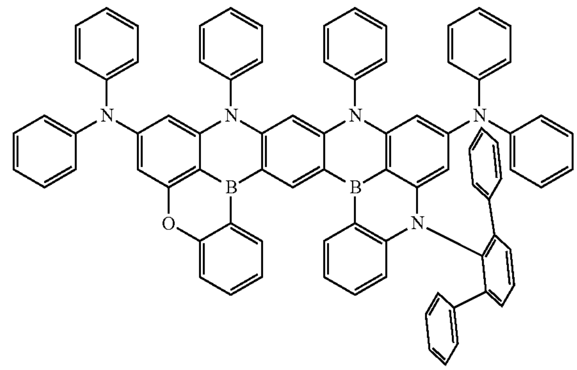
58
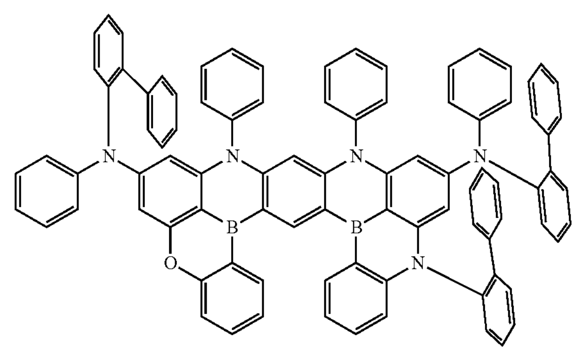
59
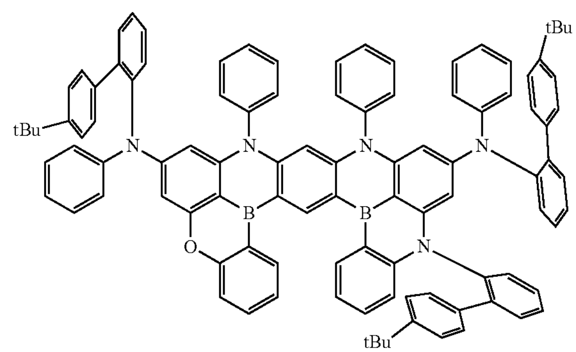
60
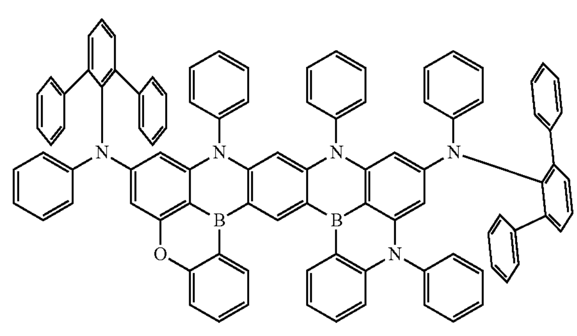

-continued
62
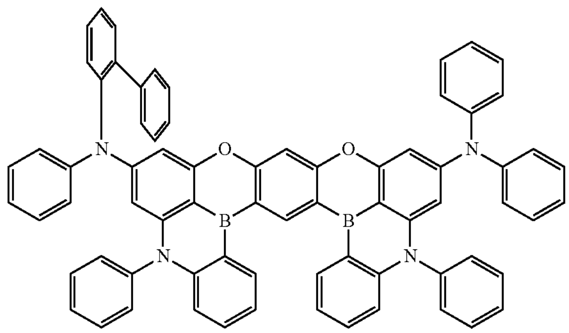
63
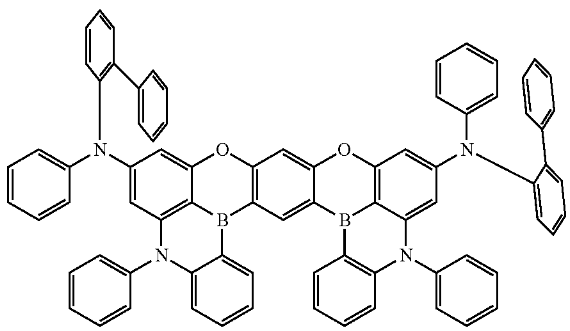
64
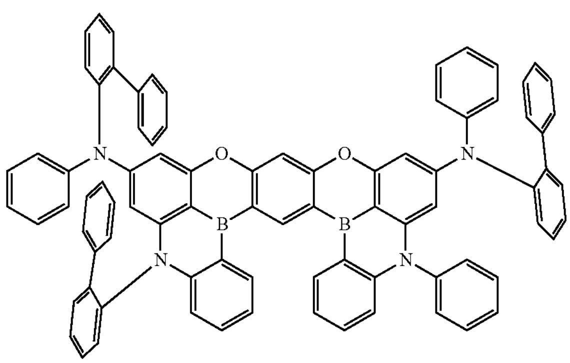
65
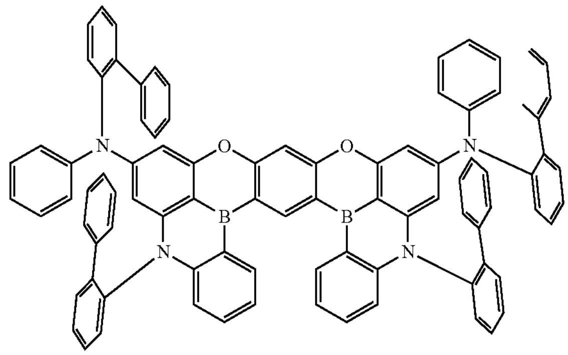
-continued
67
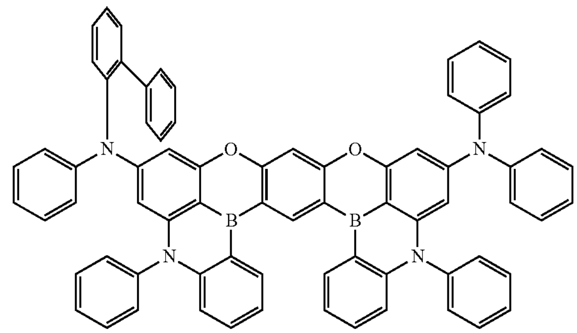
68
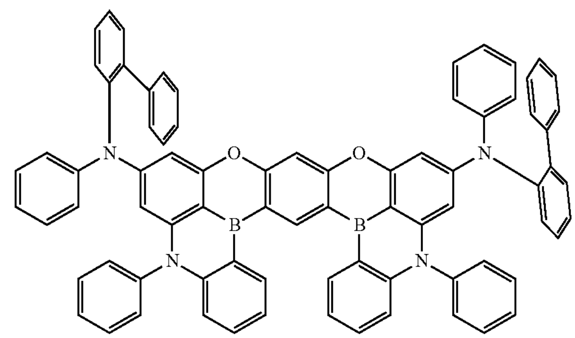
69
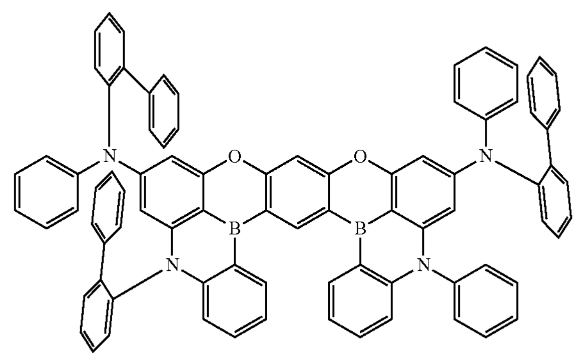
70
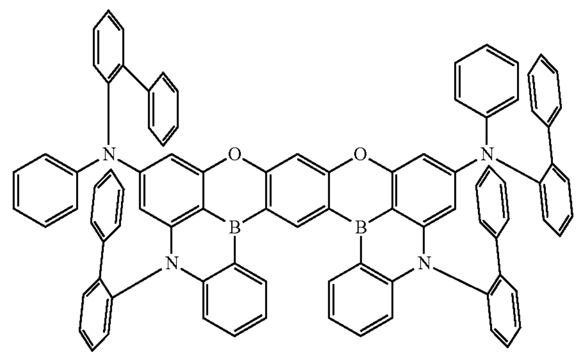

71
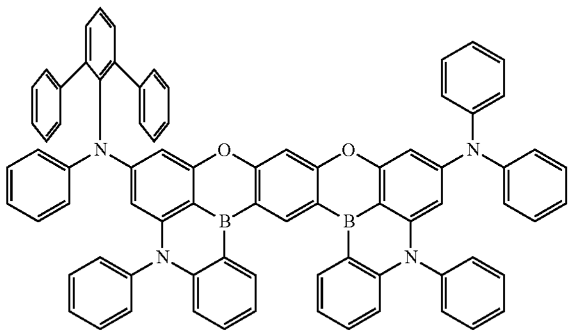
72
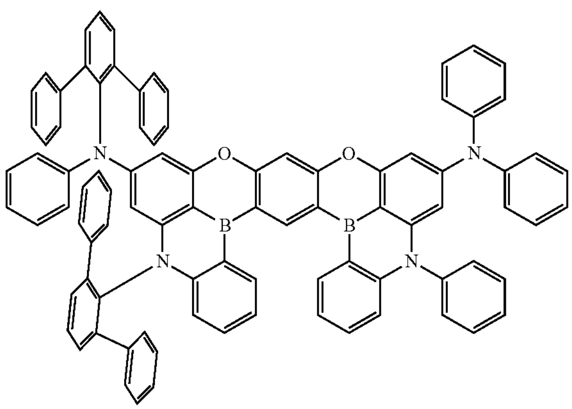
73
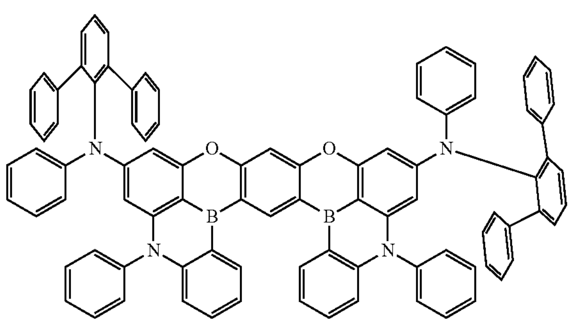
74
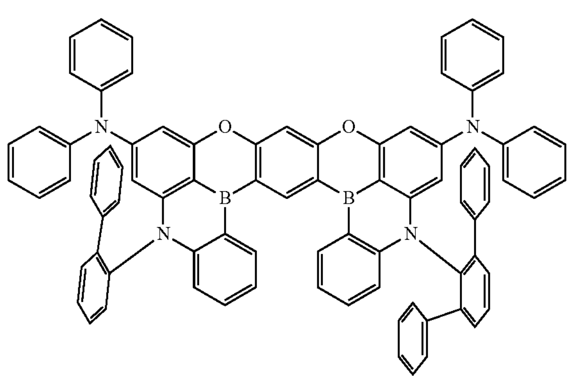
75
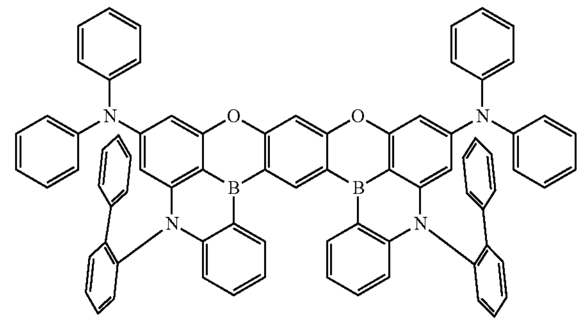
76
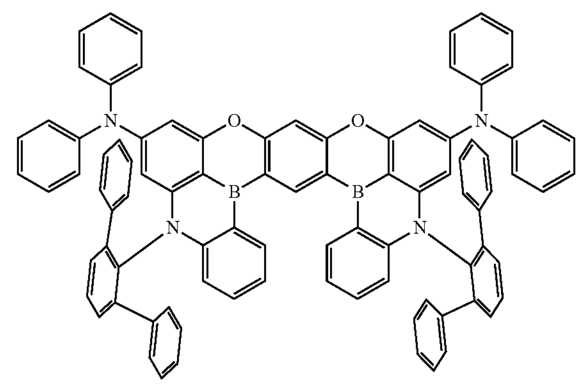
77
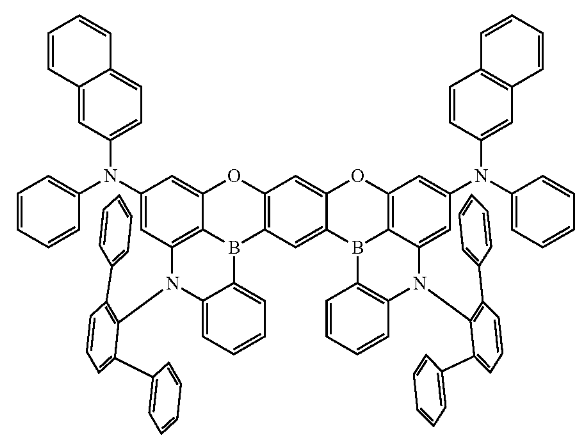
78
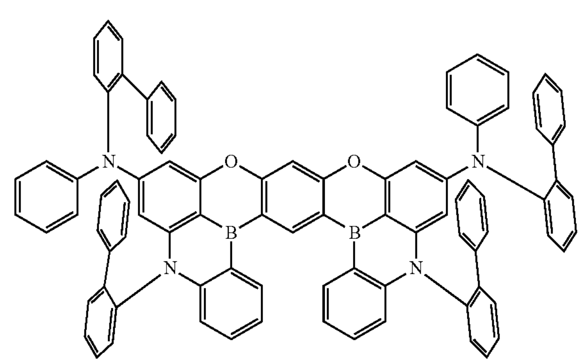

79
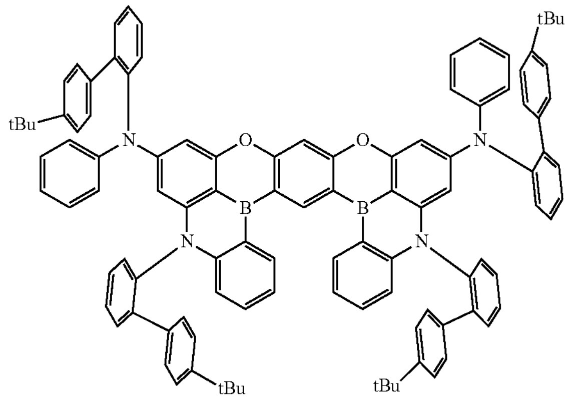
80
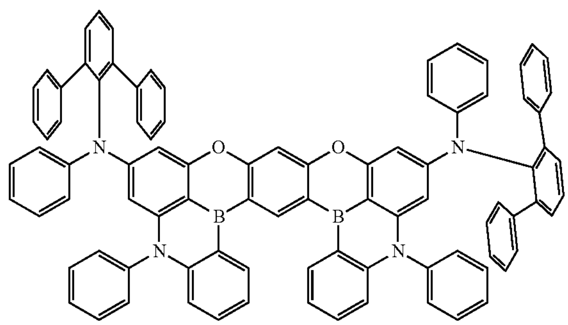
81
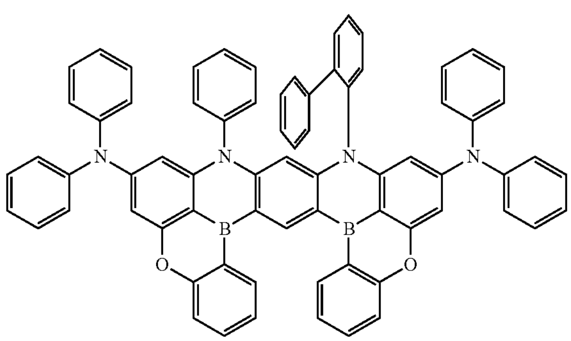
82
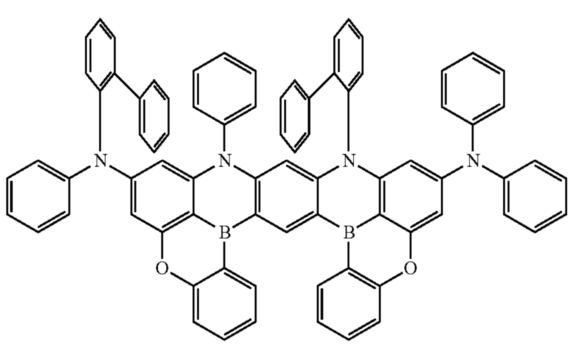
83
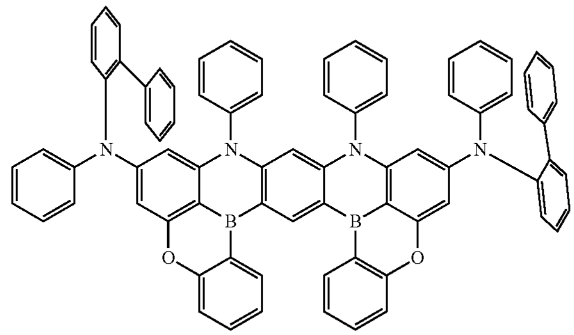
84
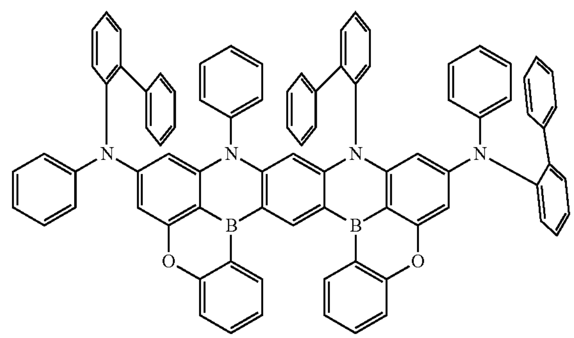
85
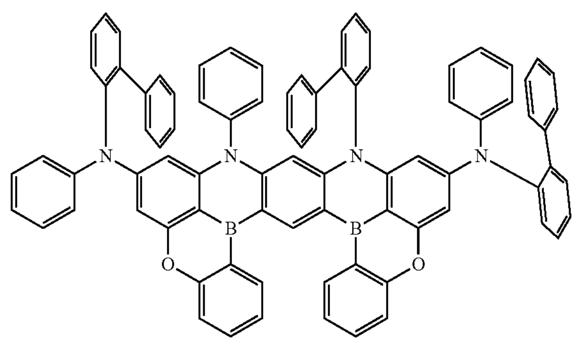
86
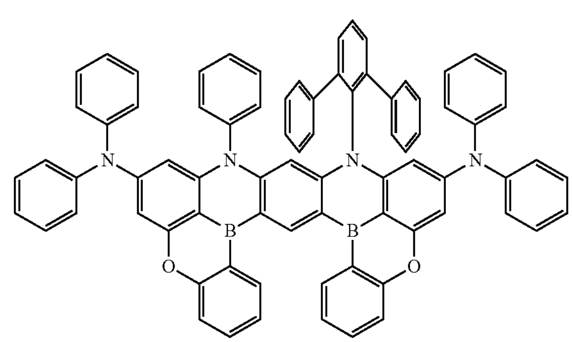

-continued
87
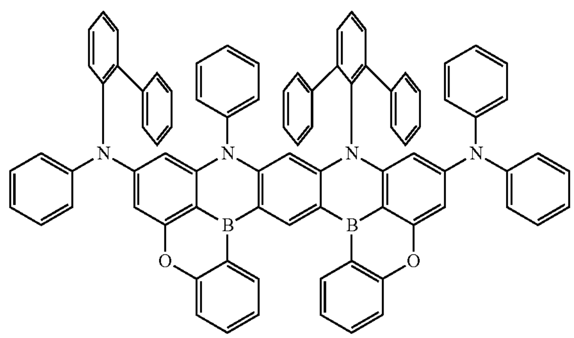
88
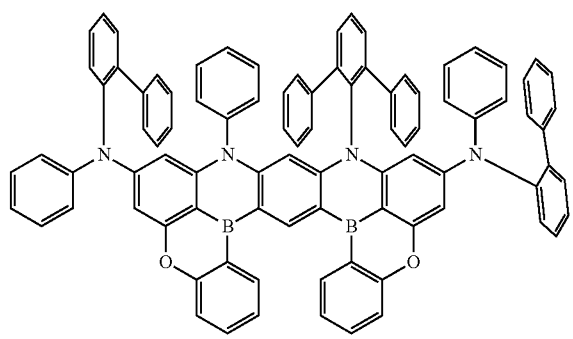
89
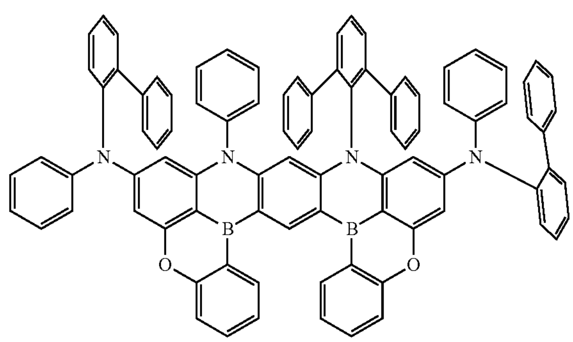
90
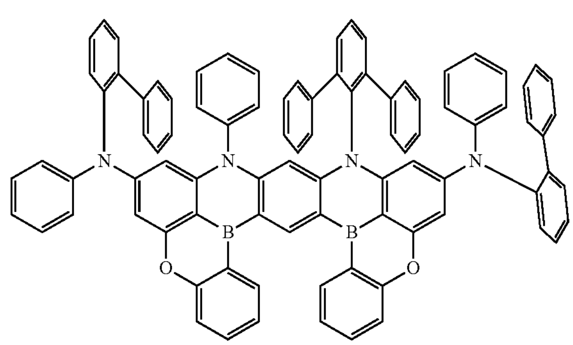
-continued
91
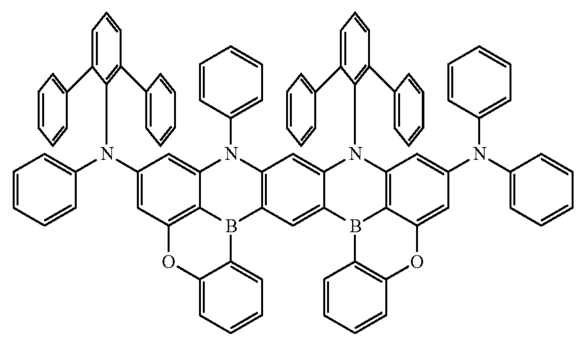
92
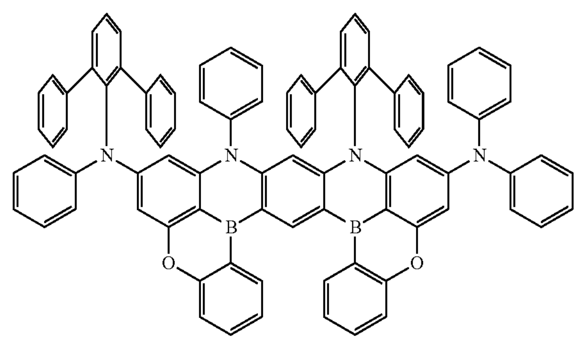
93
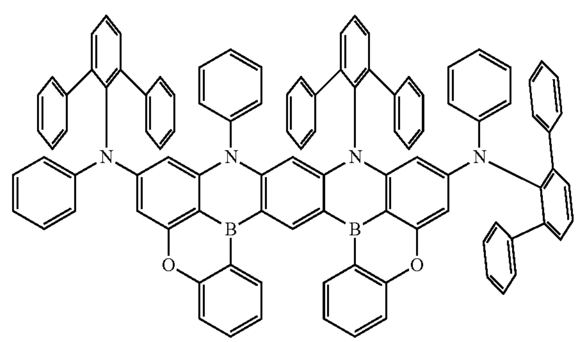
94
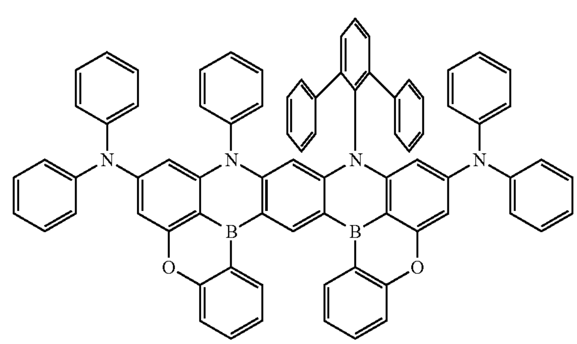

-continued
95
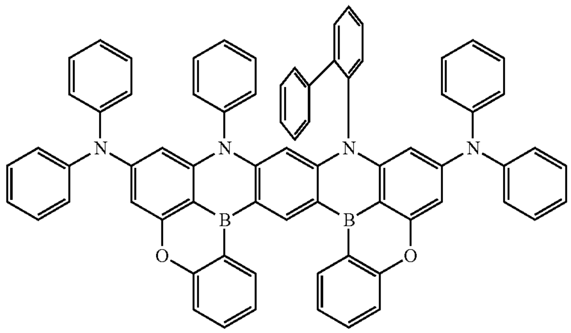
96
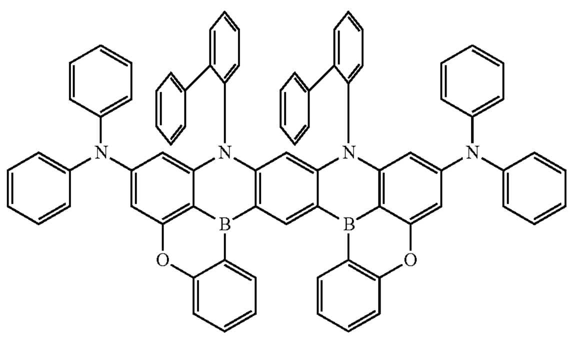
97
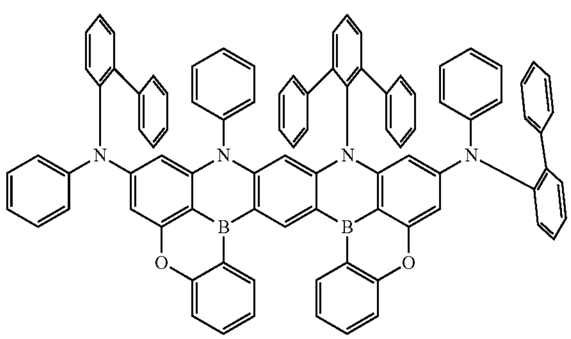
98
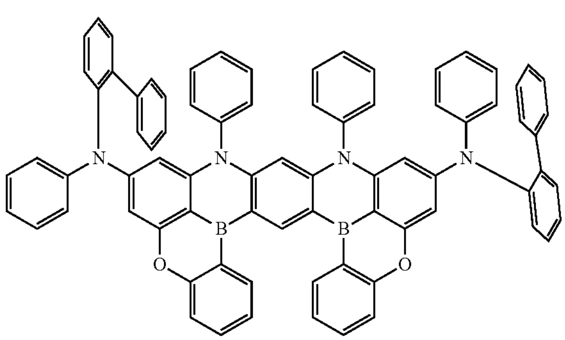
-continued
99
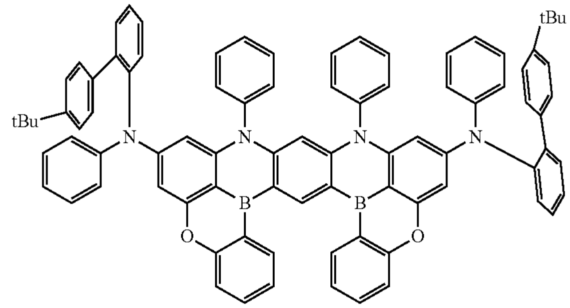
100
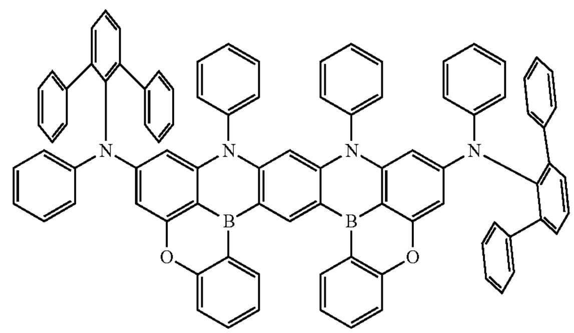
101
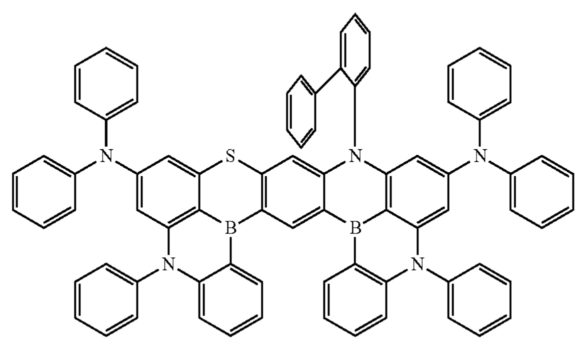
102
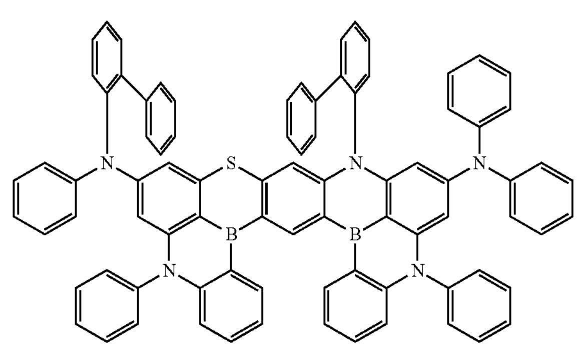

-continued
103
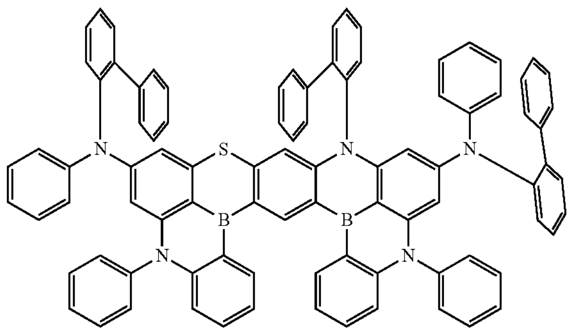
104
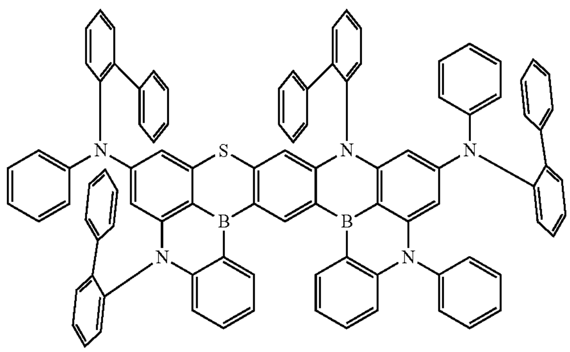
105
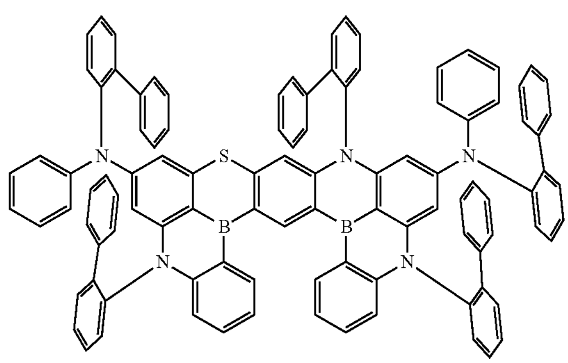
106
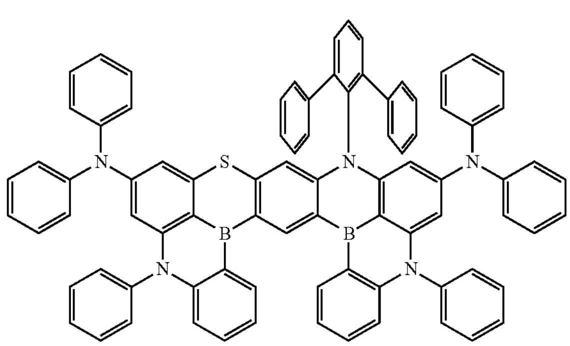
-continued
107
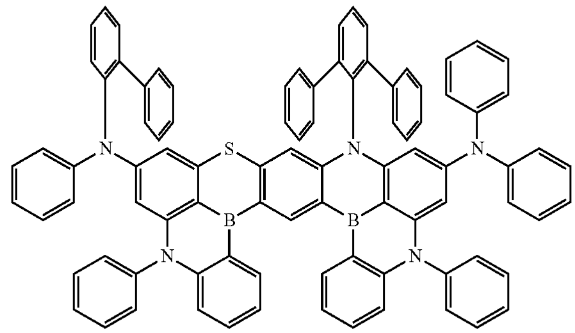
108
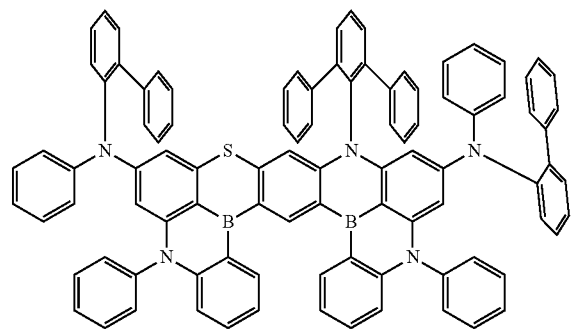
109
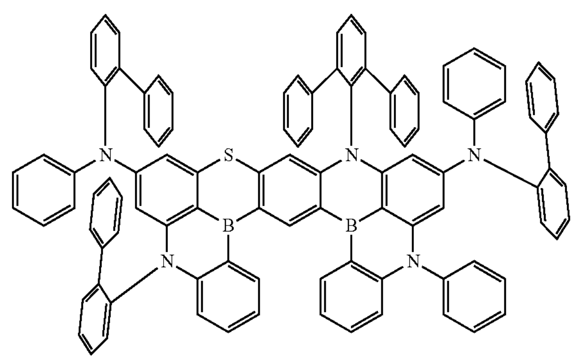
110
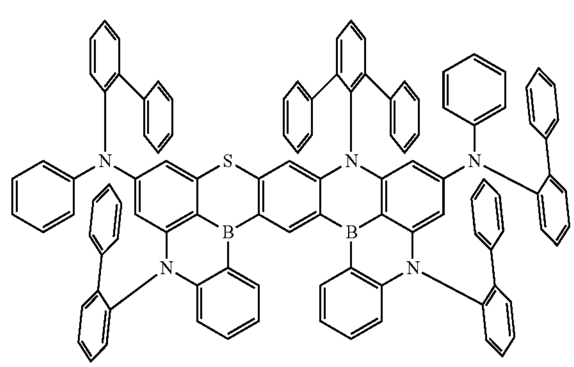

-continued
111
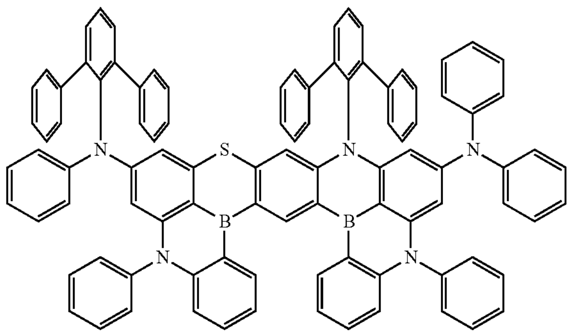
112
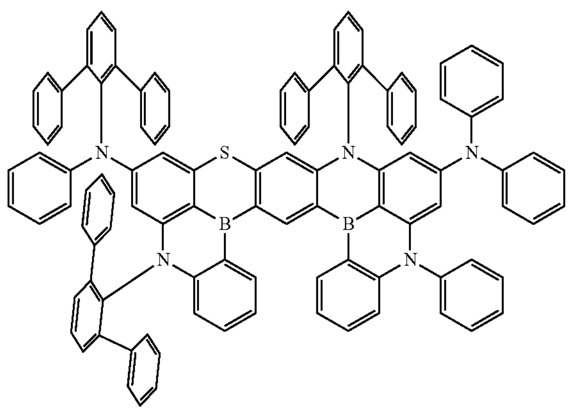
113
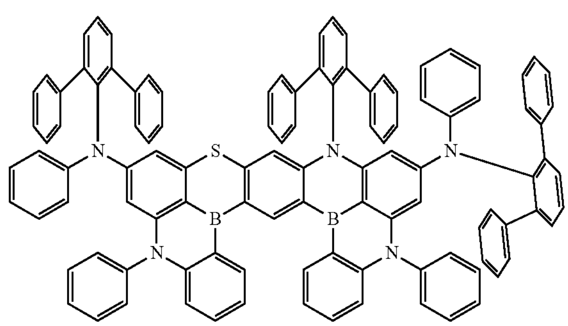
114
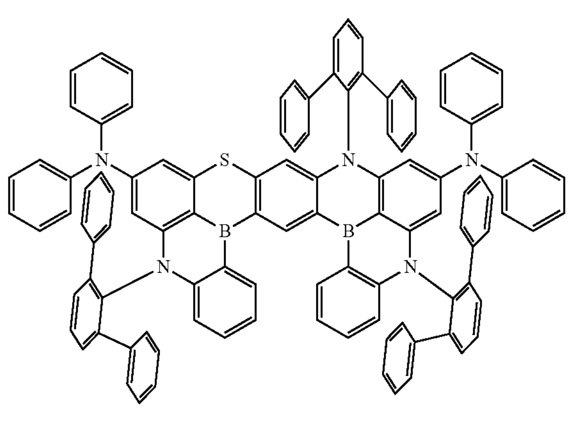
-continued
115
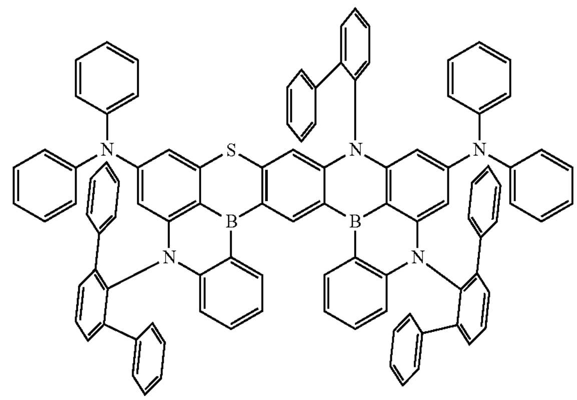
116
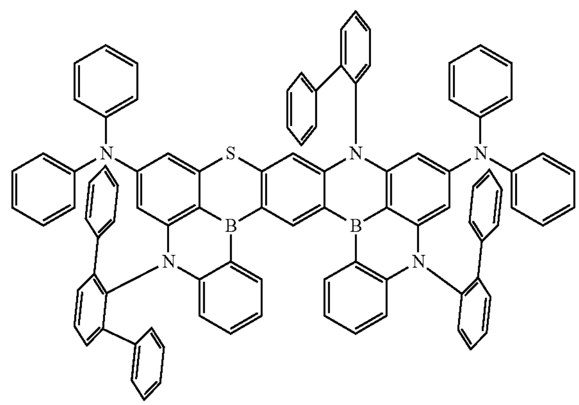
117
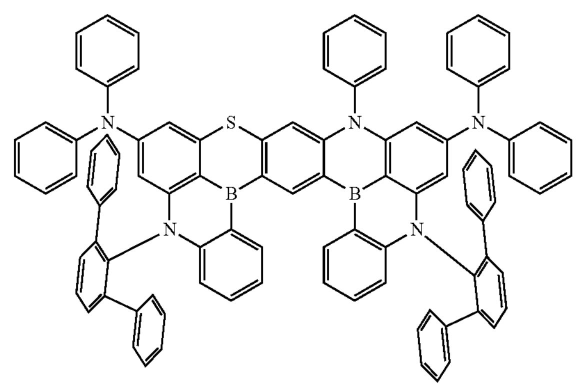
118
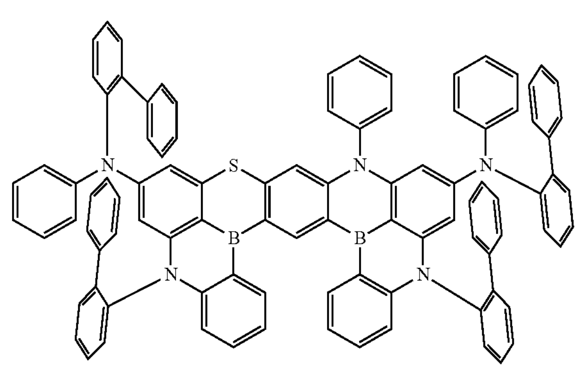

-continued
119
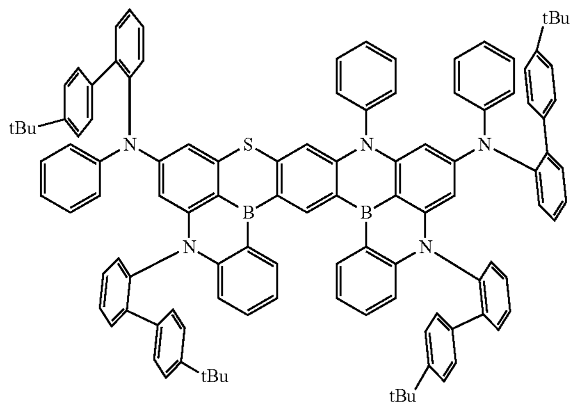
120
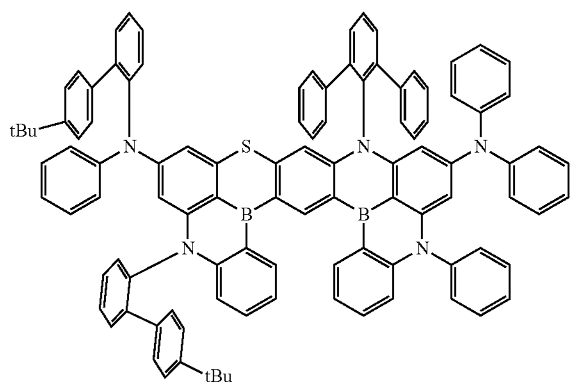
121
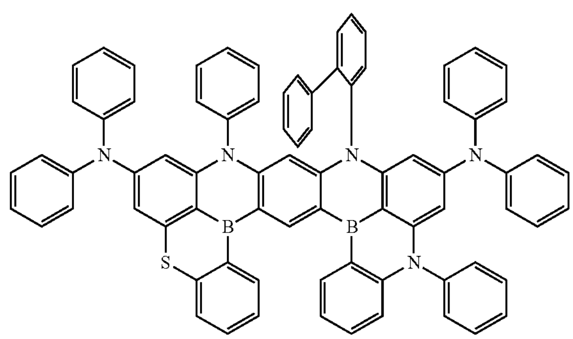
122
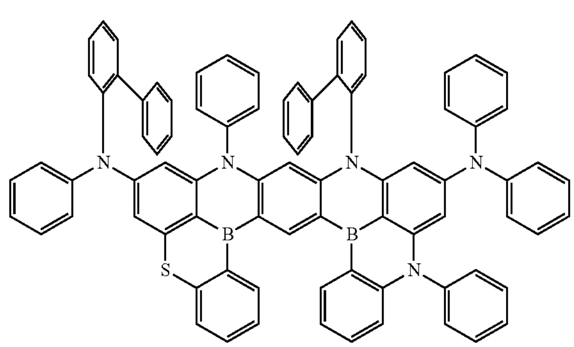
-continued
123
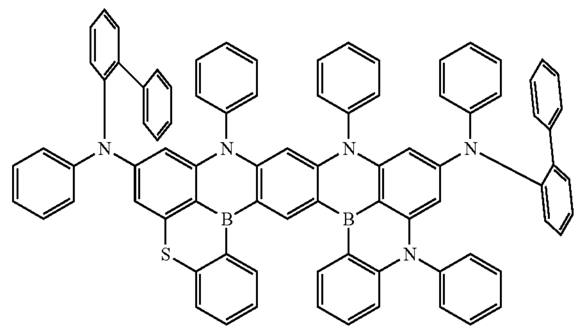
124
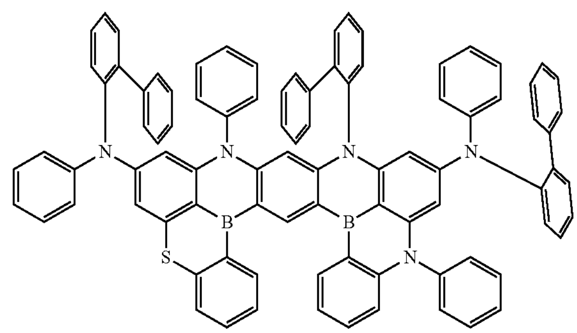
125
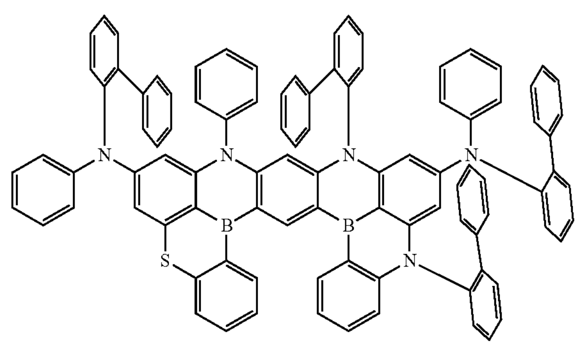
126
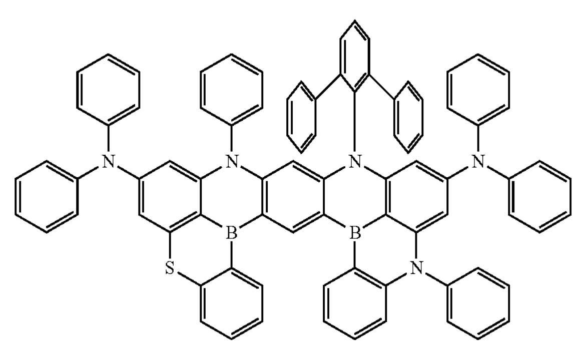

127
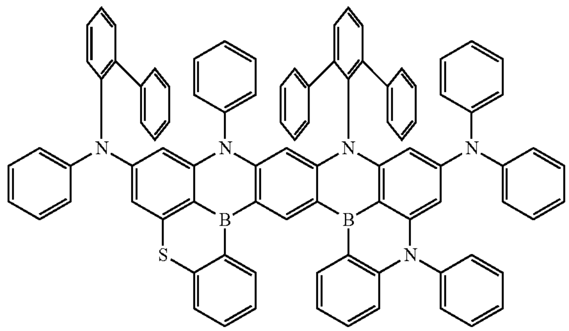
128
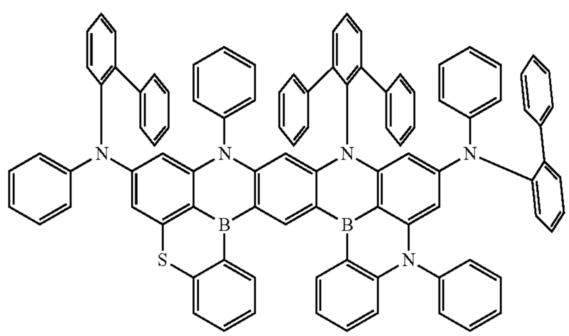
129
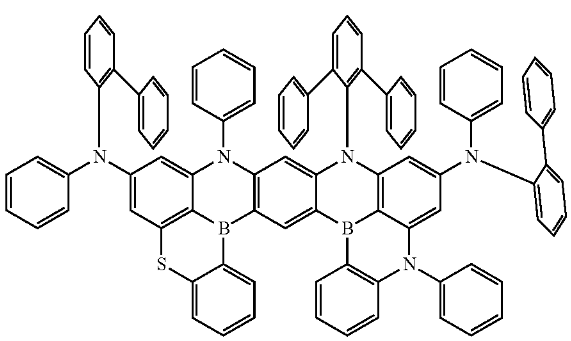
130
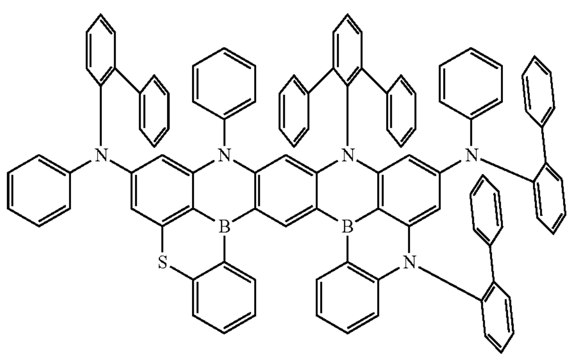
131
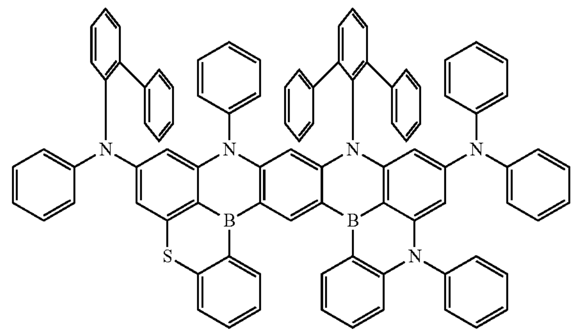
132
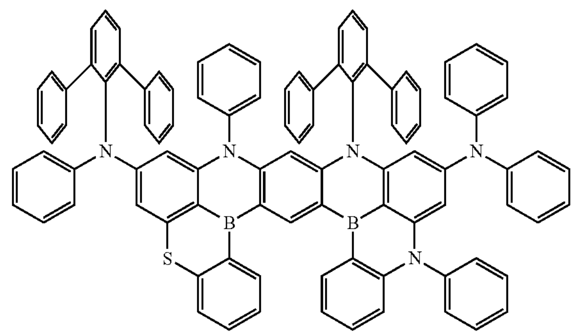
133
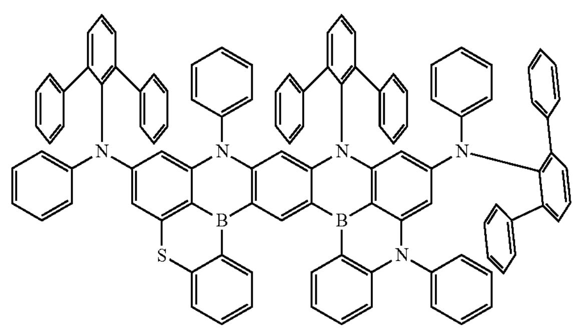
134
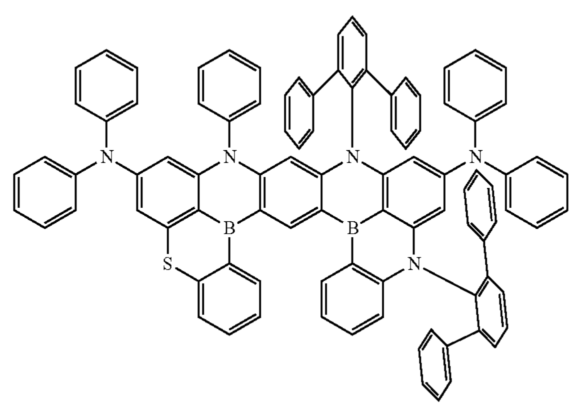

-continued
135
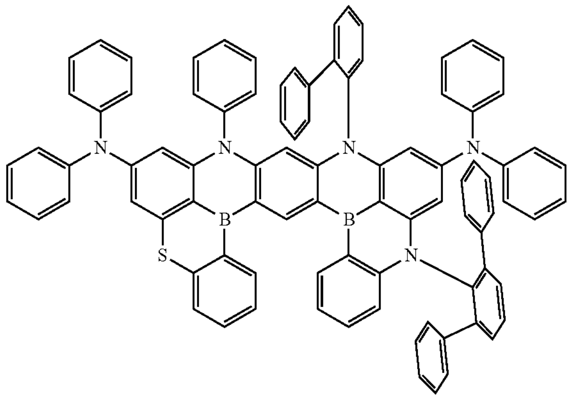
136
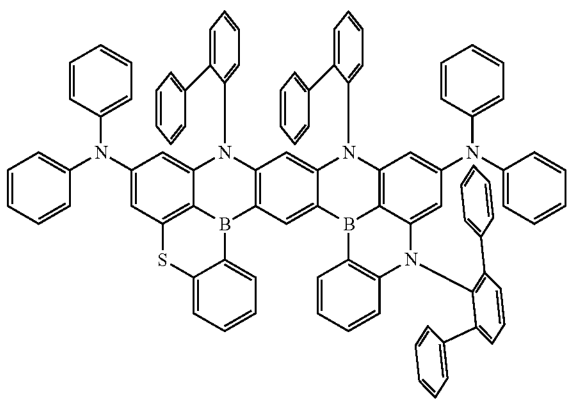
137
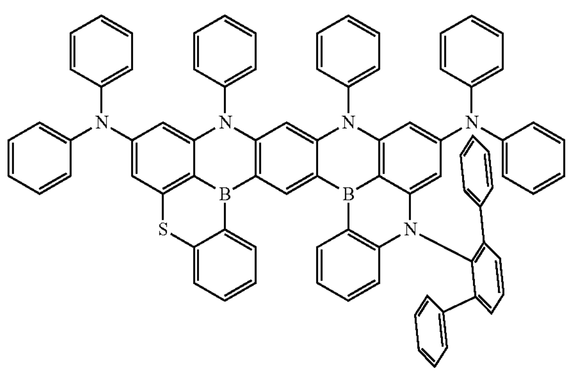
138
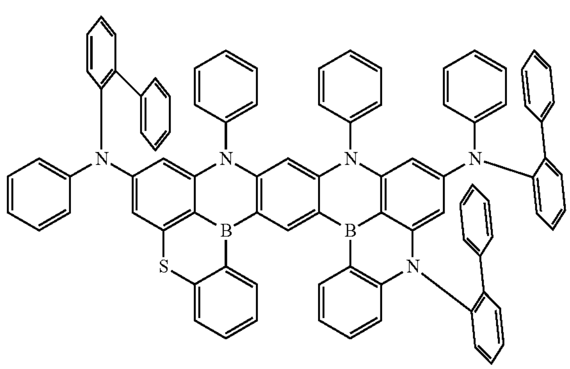
-continued
139
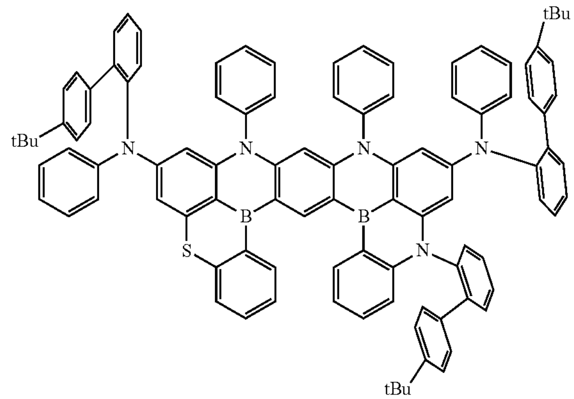
140
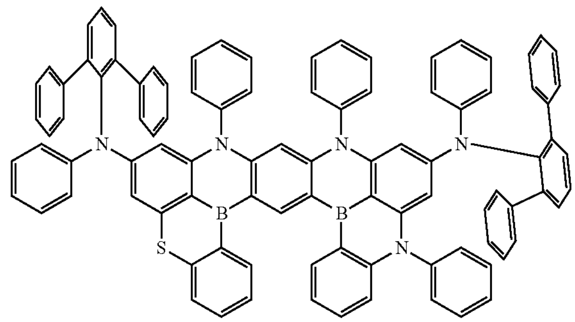
141
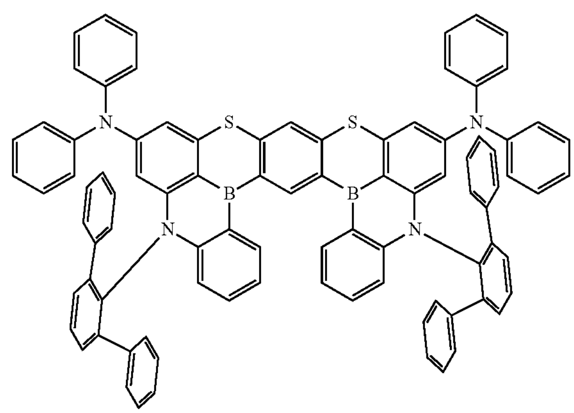
142
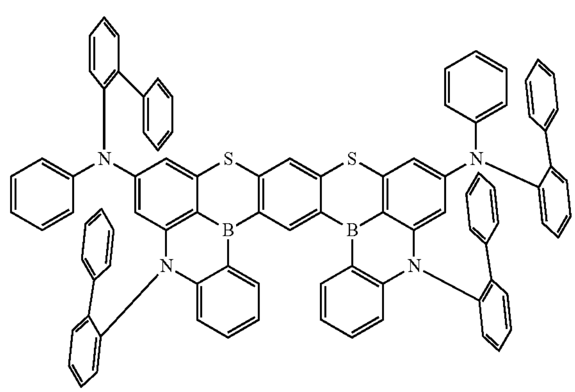

-continued
143
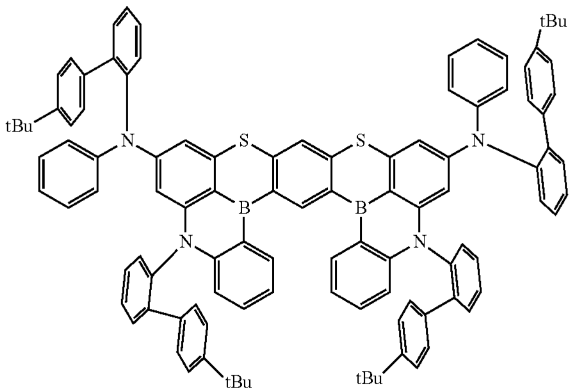
144
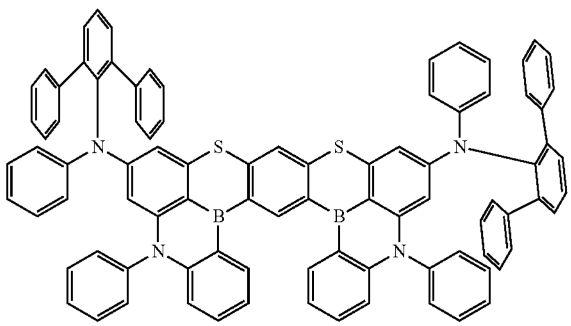
145
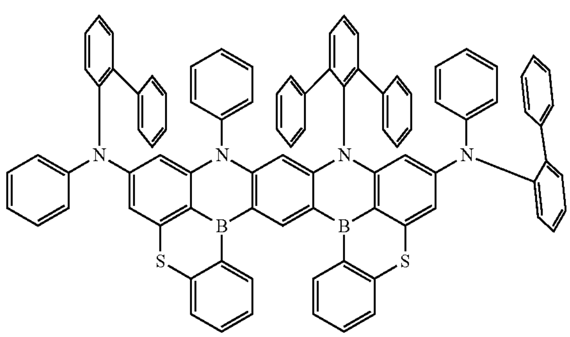
146
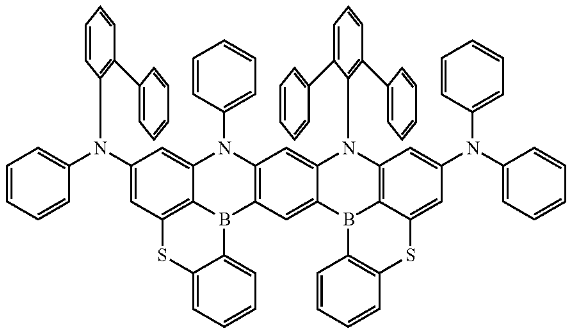
-continued
147
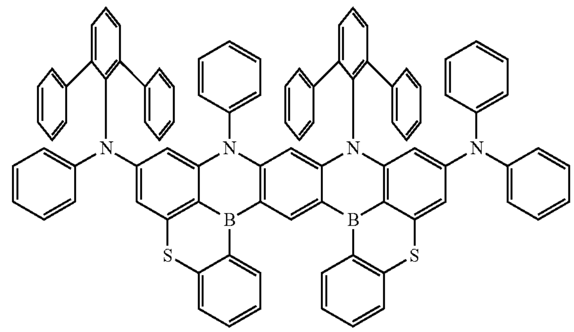
148
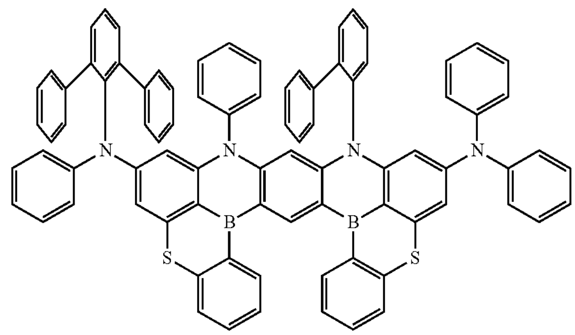
149
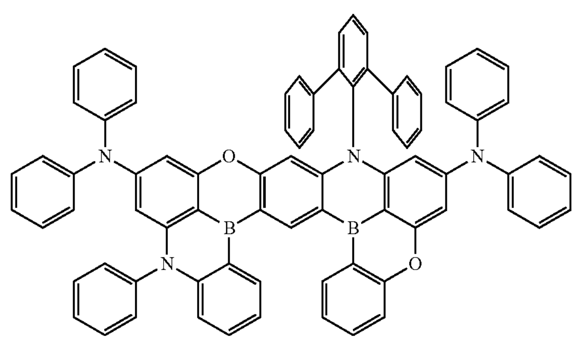
150
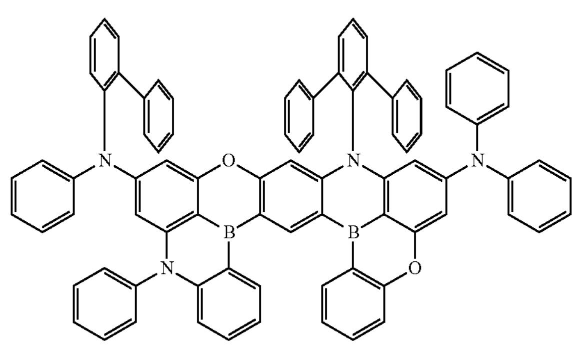

-continued
151
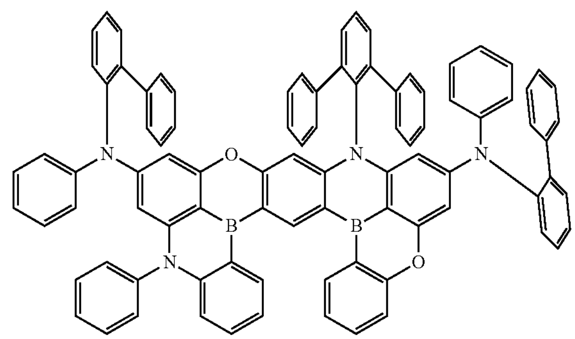
152
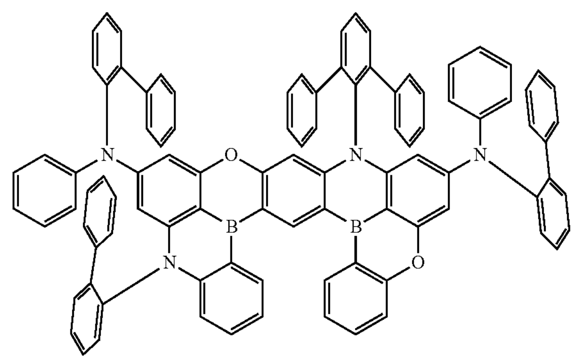
153
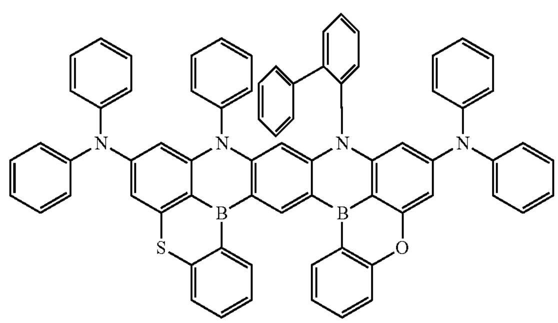
154
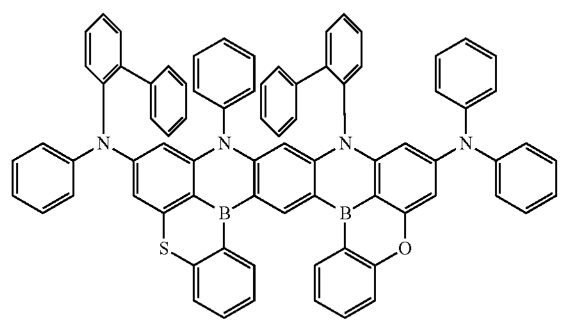
155
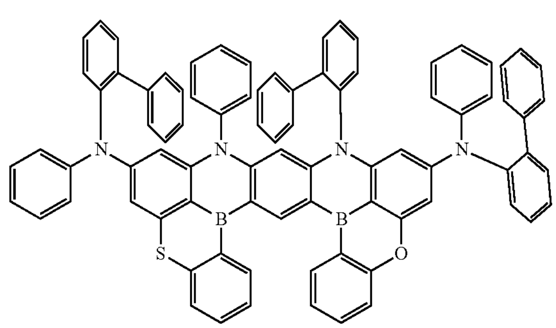
156
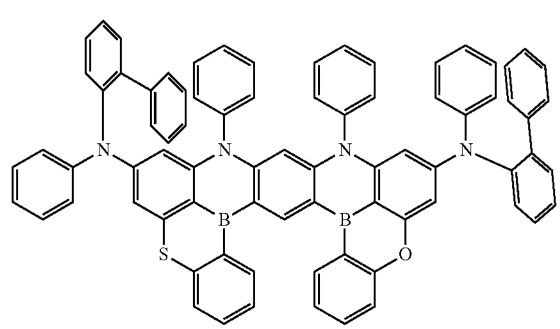

-continued
157
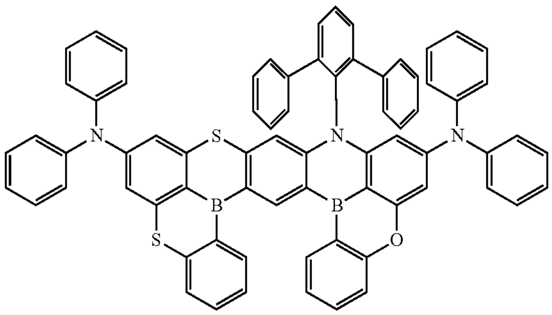
158
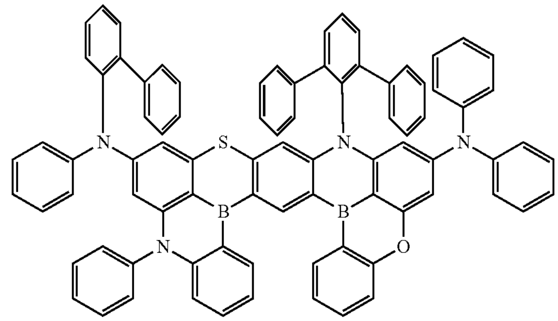
159
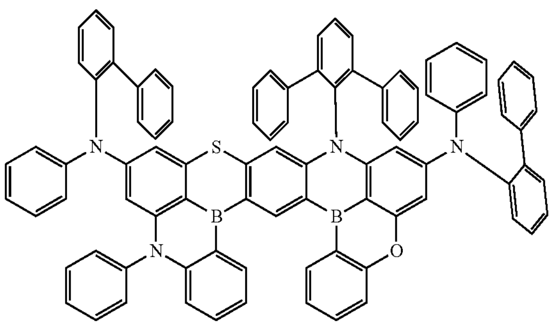
160
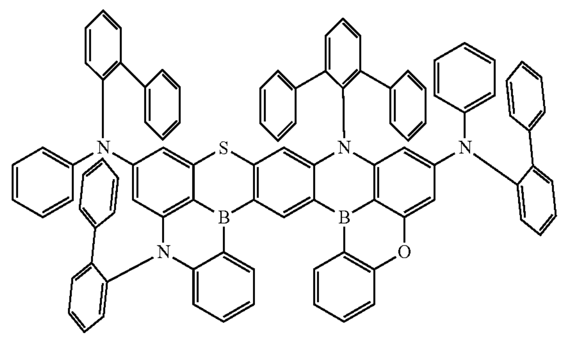
161
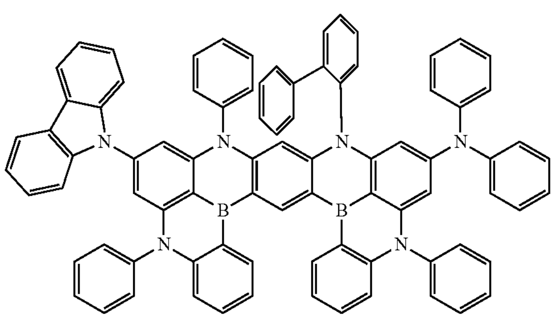
162
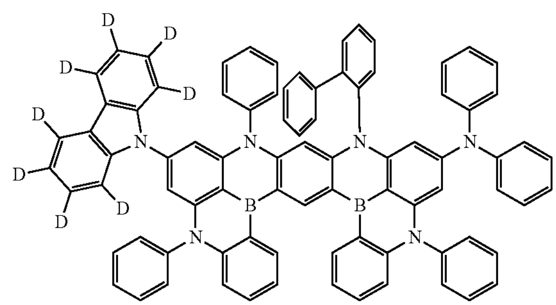
163
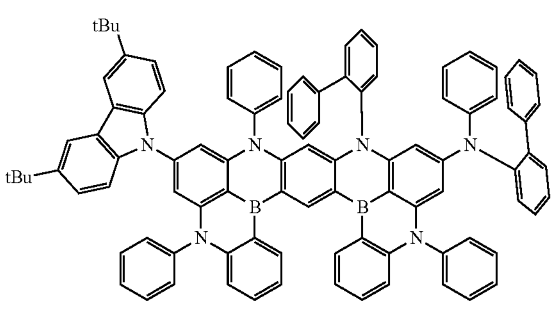
164
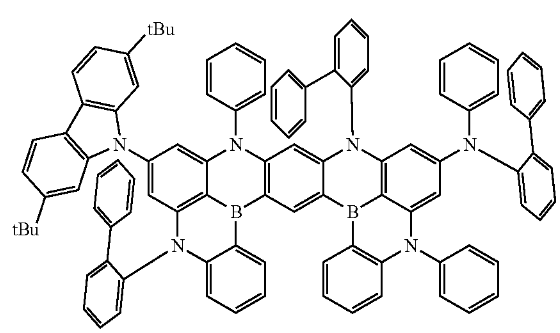

-continued
165
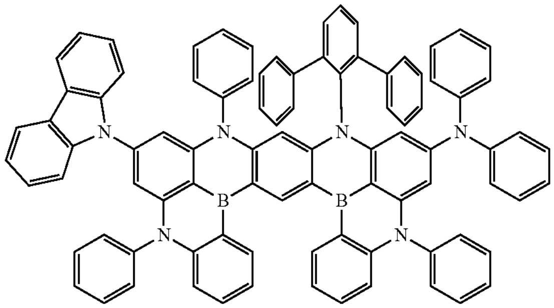
166
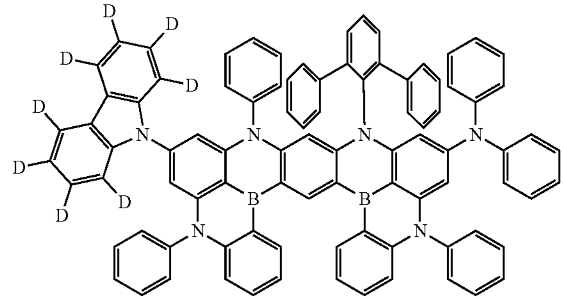
167
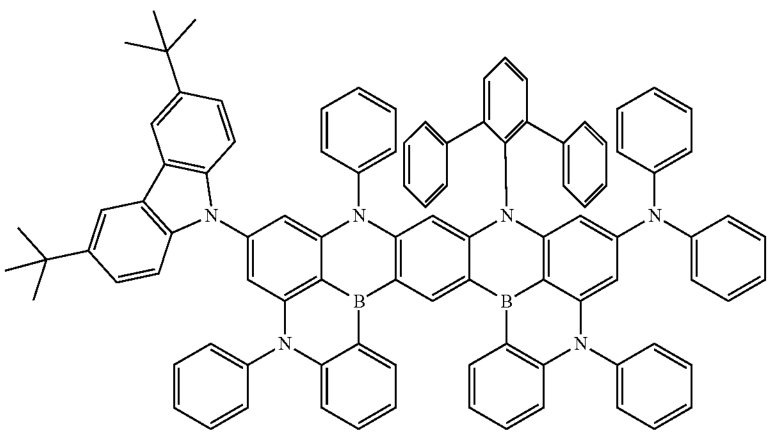
168
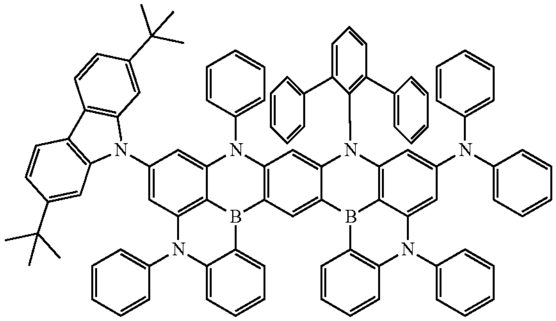
169
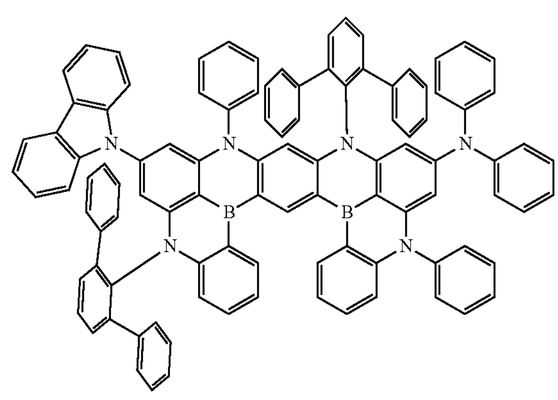

-continued
170
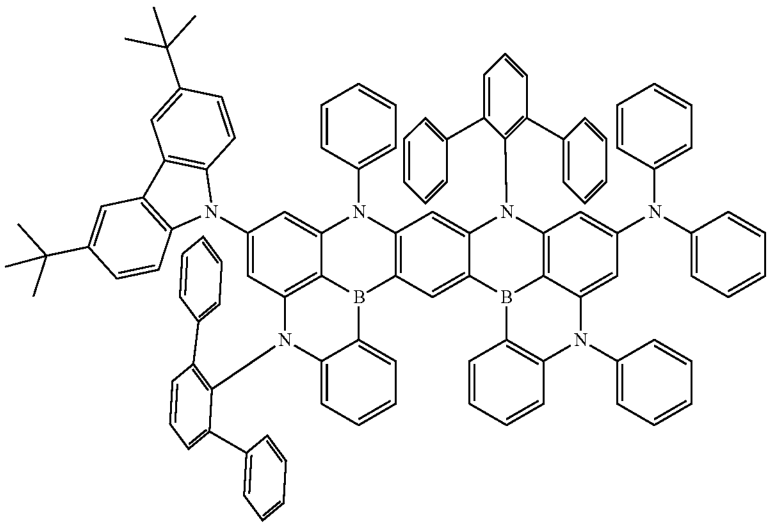
171
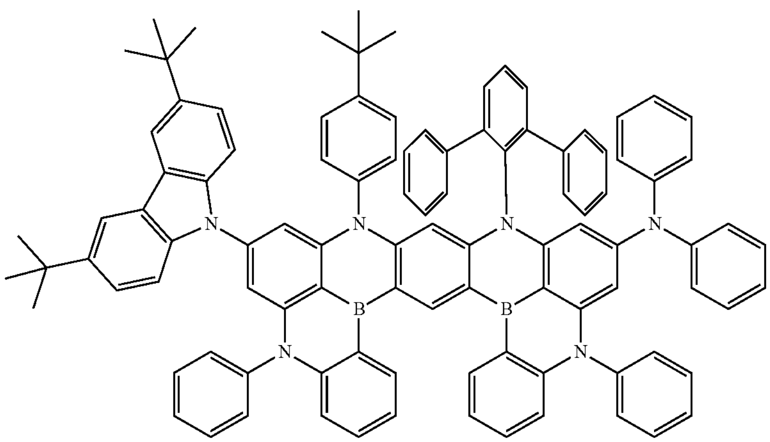
172
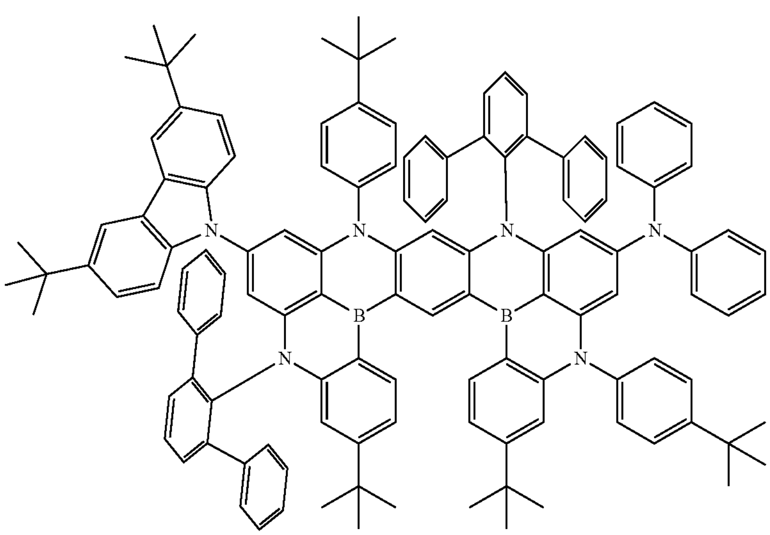

-continued
173
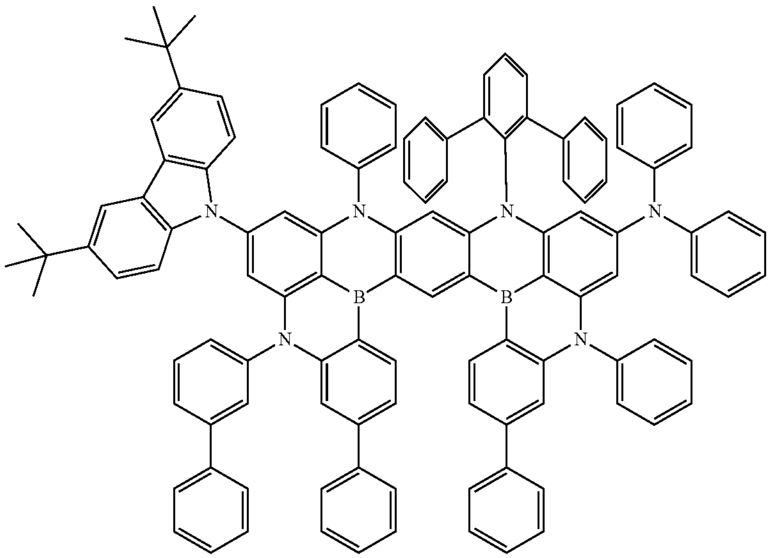
174
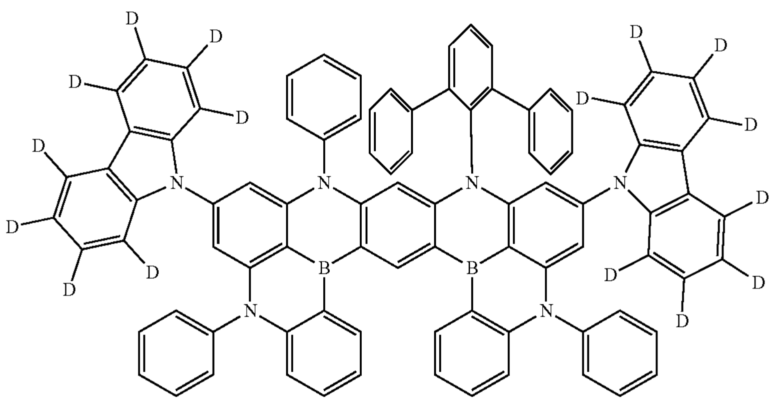
175
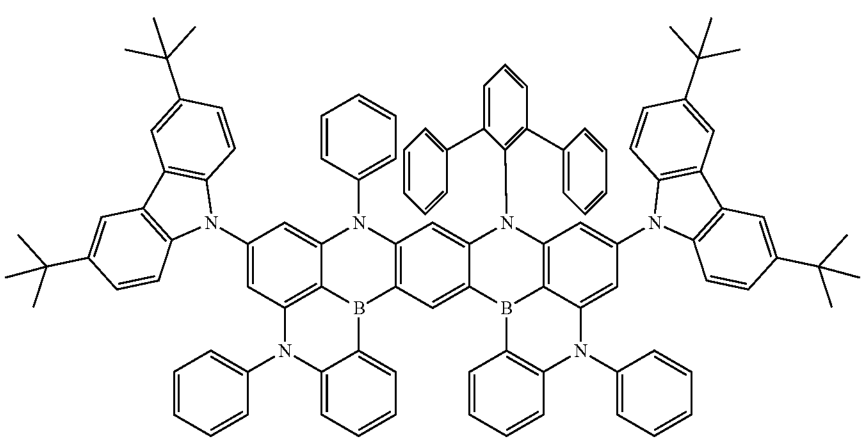

-continued
176
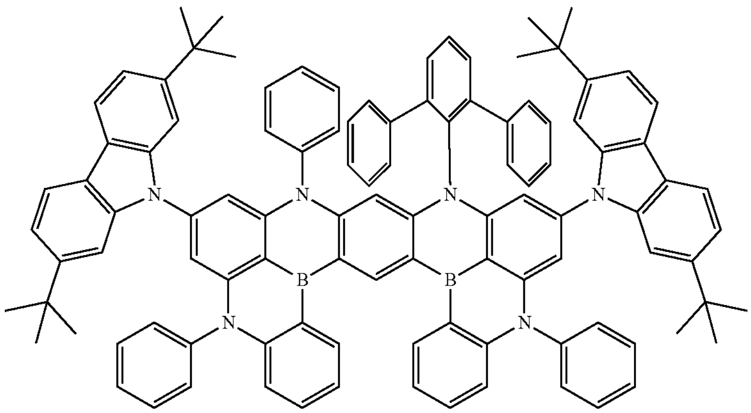
177
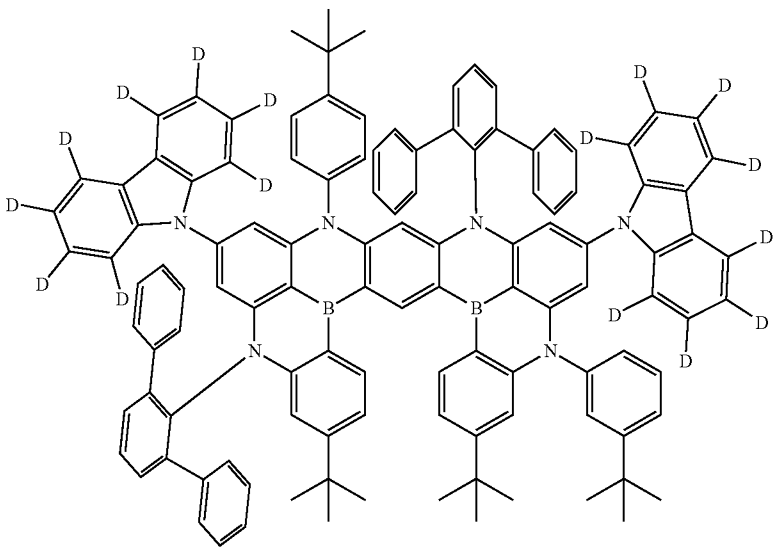
178
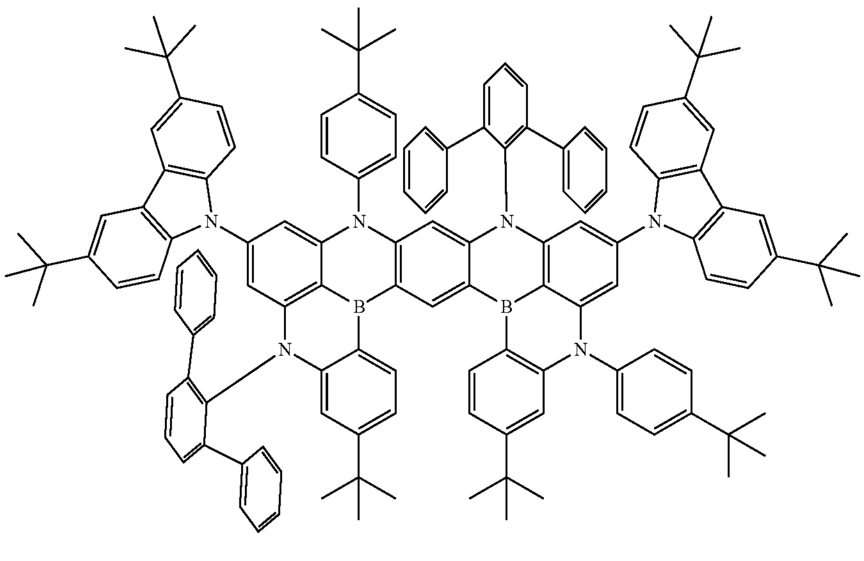

-continued
179
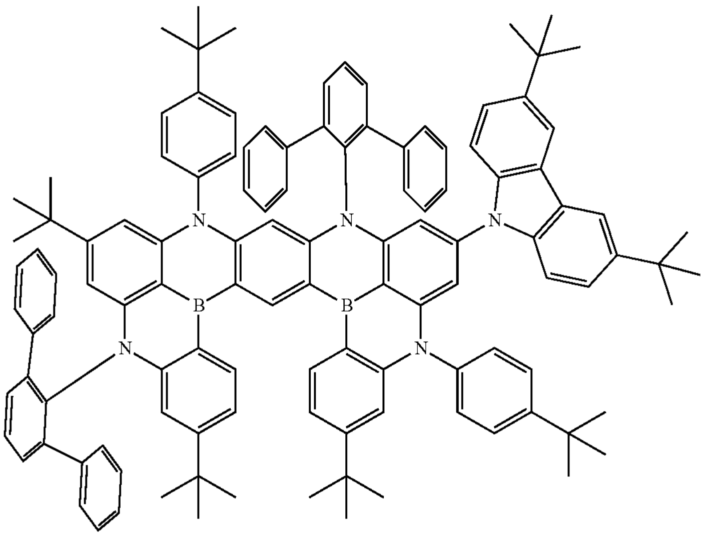
180
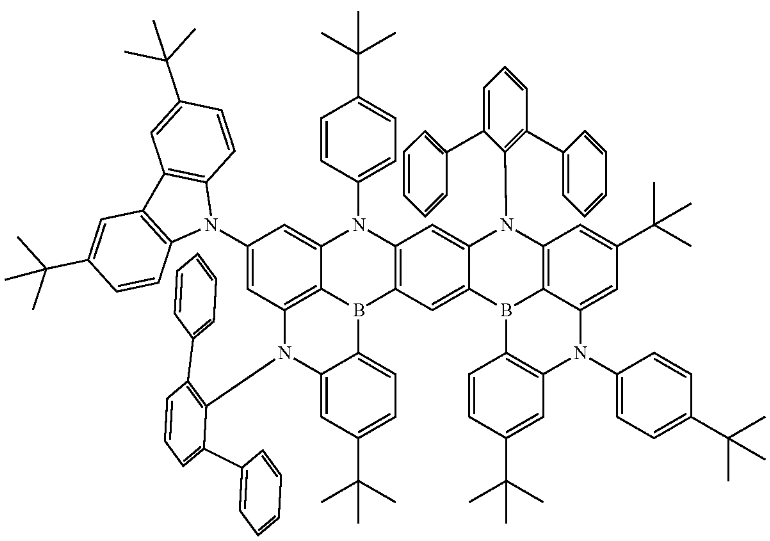
181
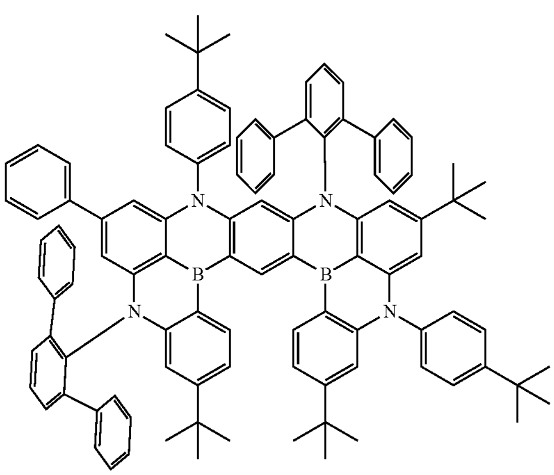
182
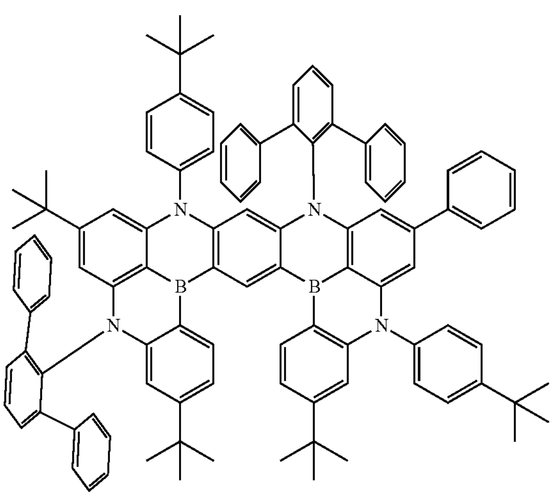

-continued
183
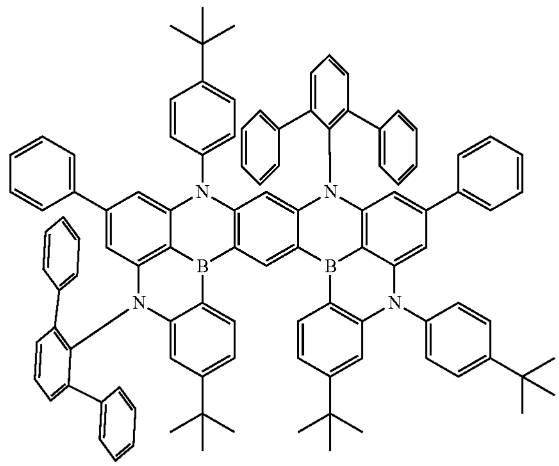
184
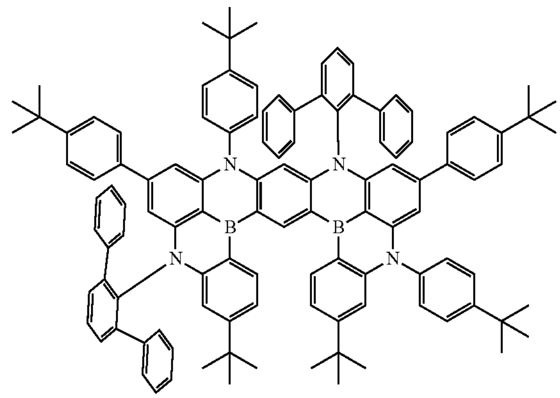
185
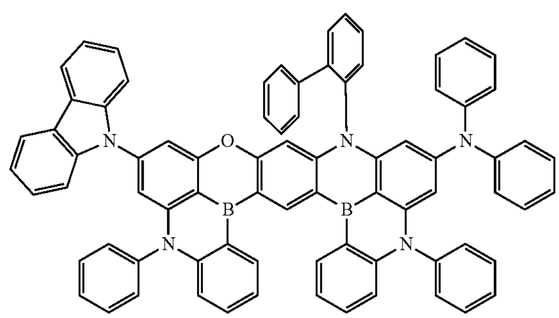
186
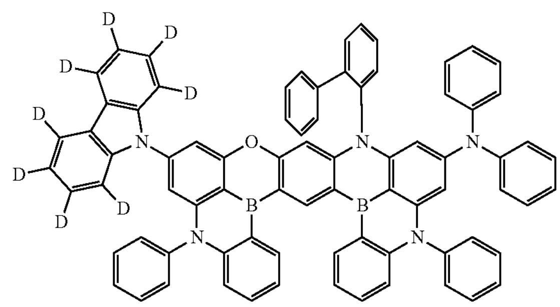
187
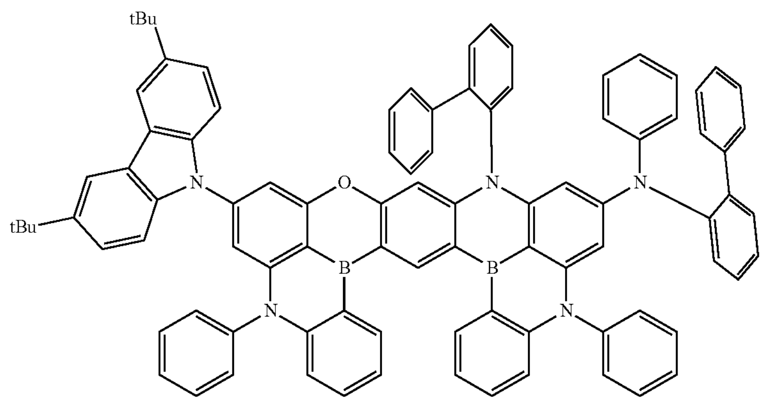
188
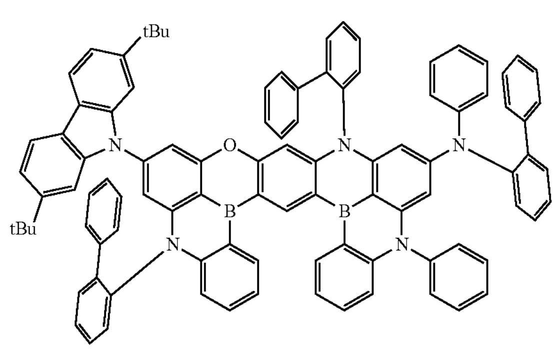
189
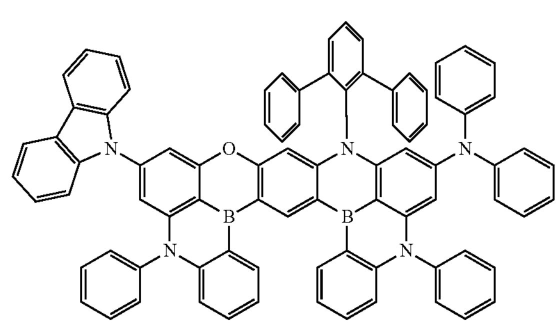

-continued
190
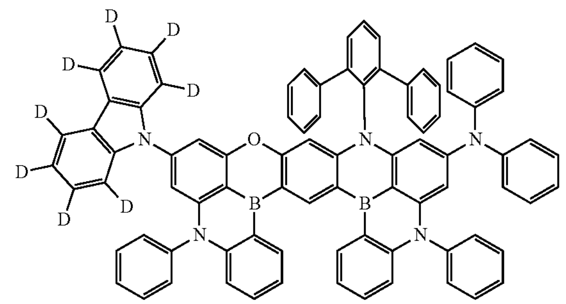
191
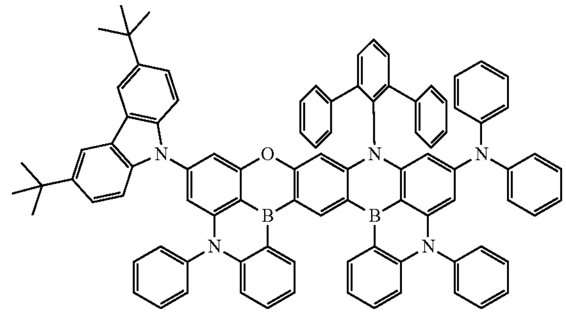
192
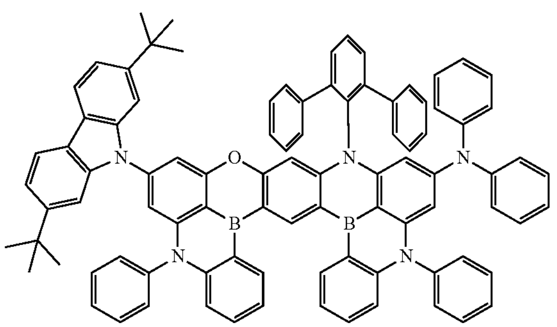
193
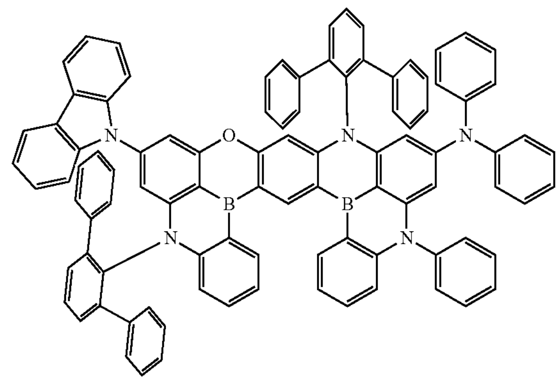
194
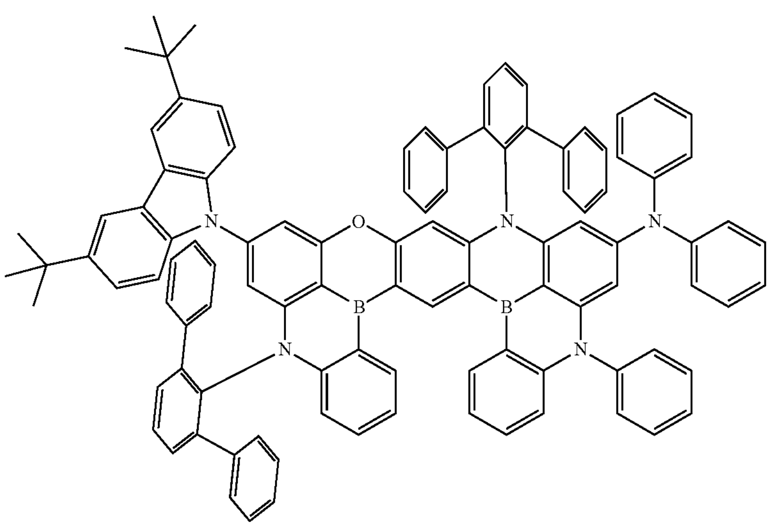

-continued
195
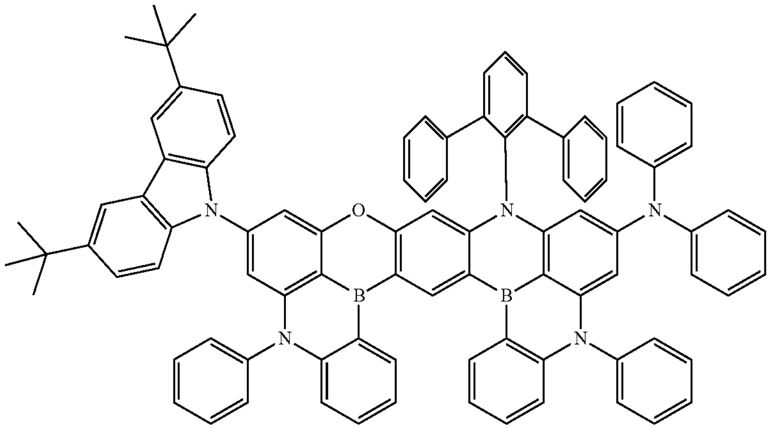
196
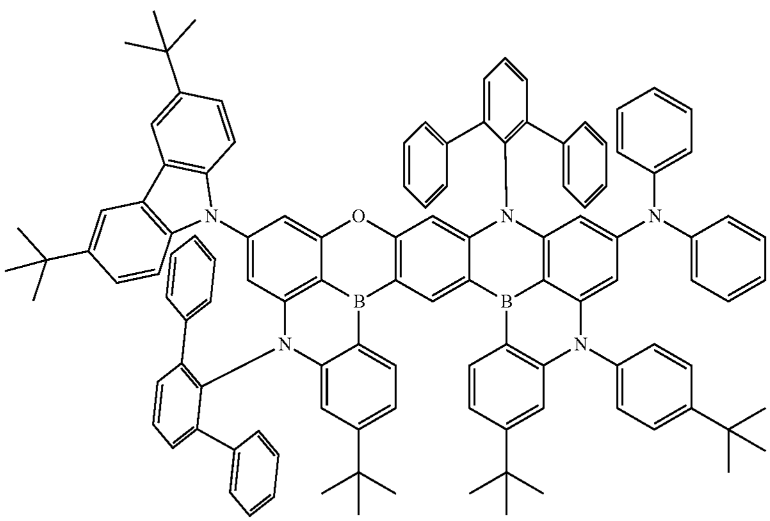
197
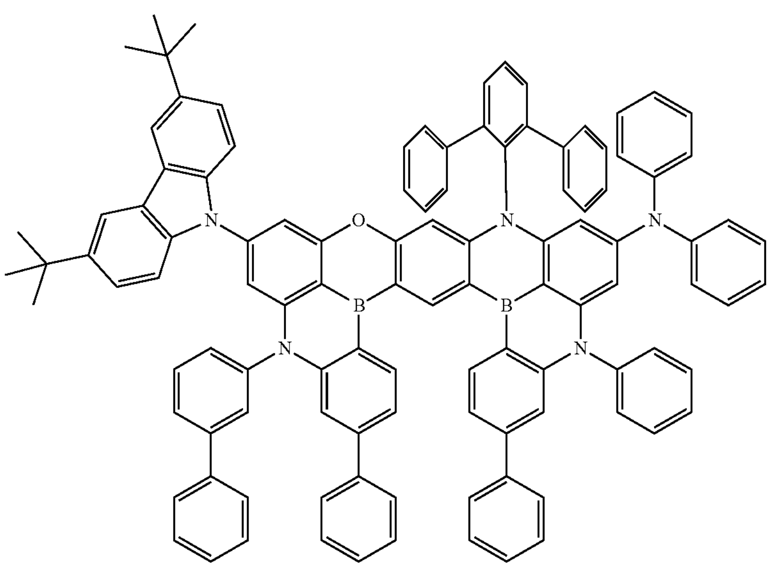

-continued
198
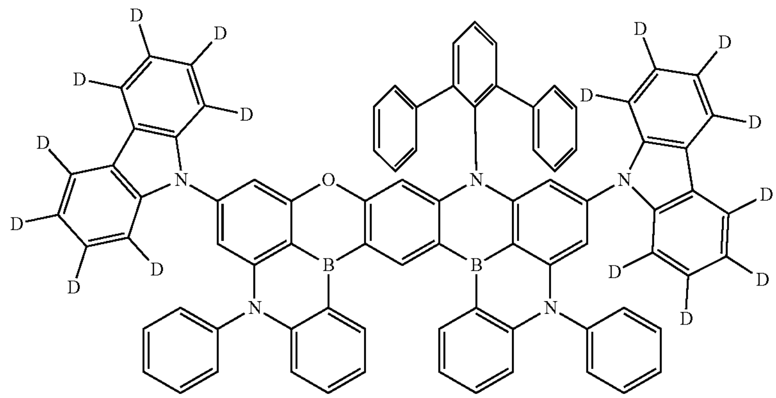
199
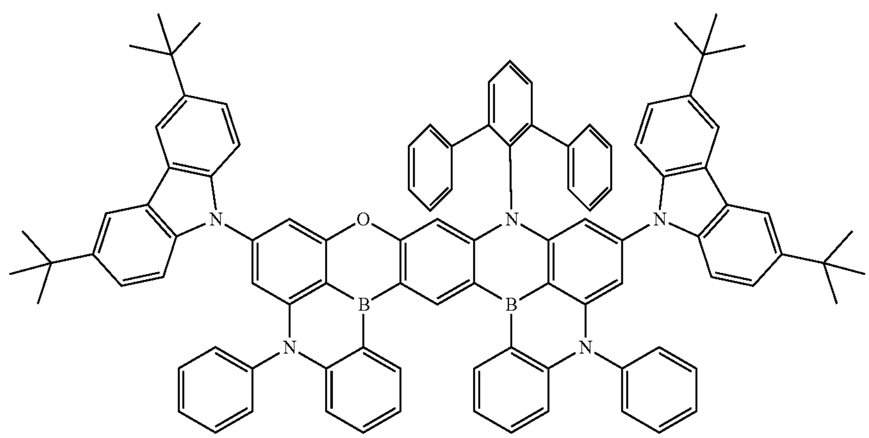
200
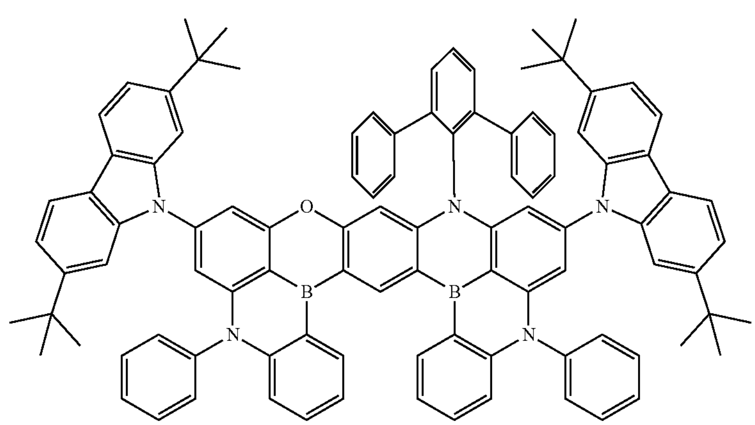

-continued
201
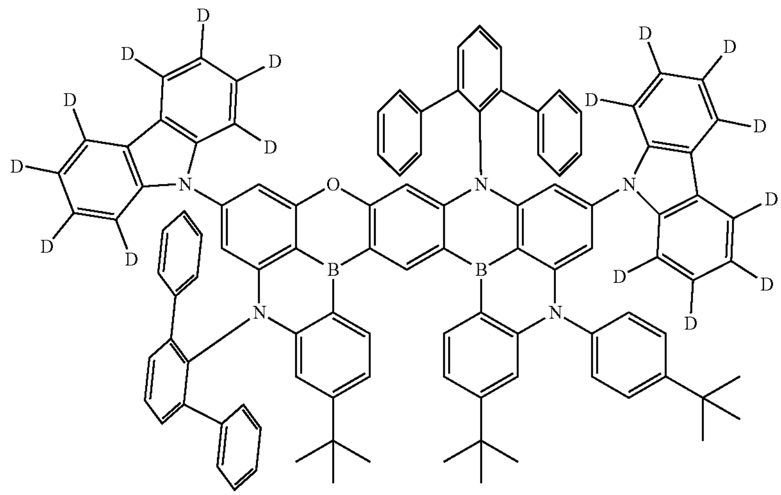
202
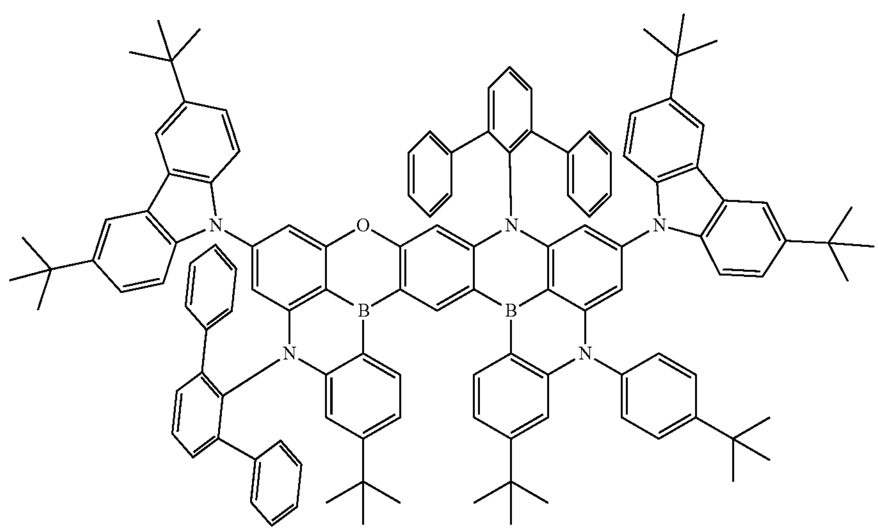
203
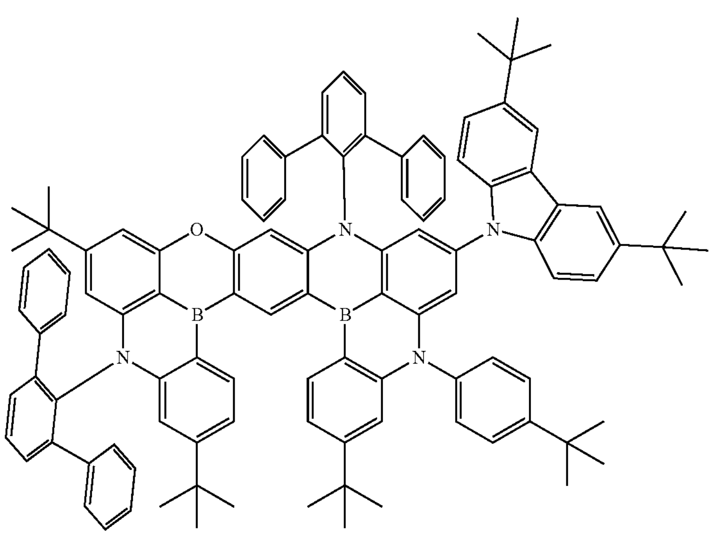

-continued
204
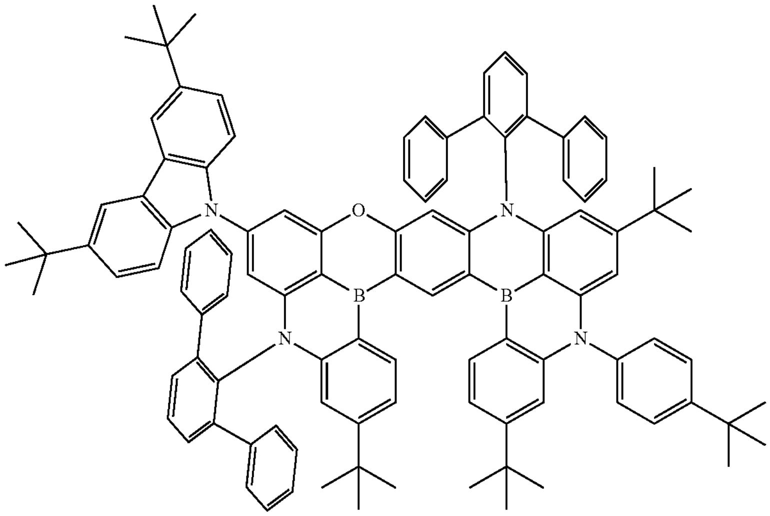
205
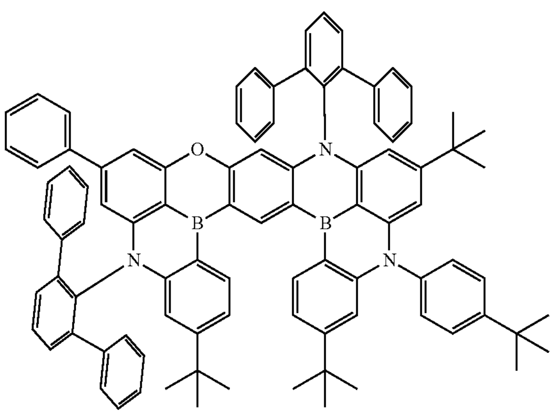
206
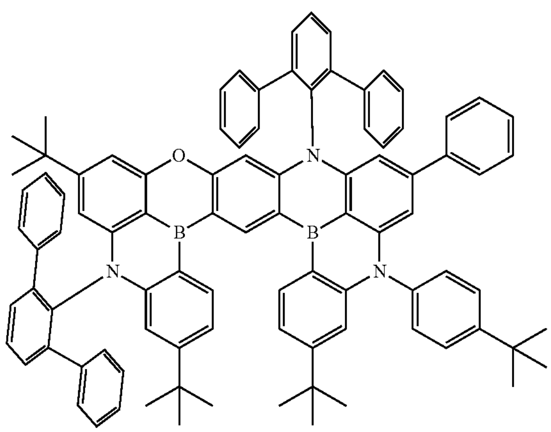
207
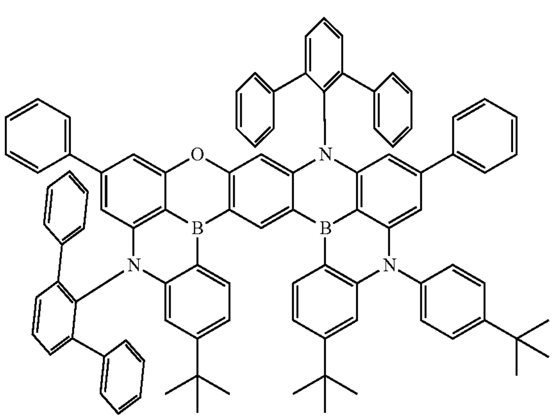
208
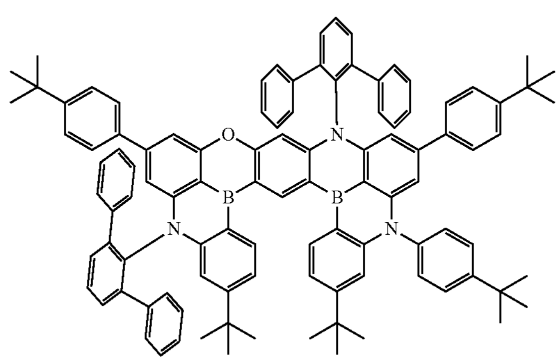

-continued
209
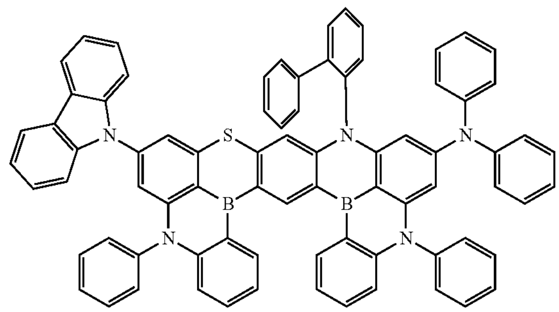
210
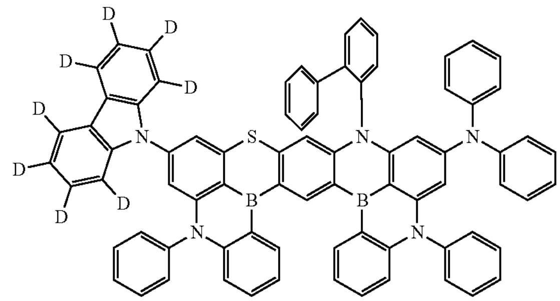
211
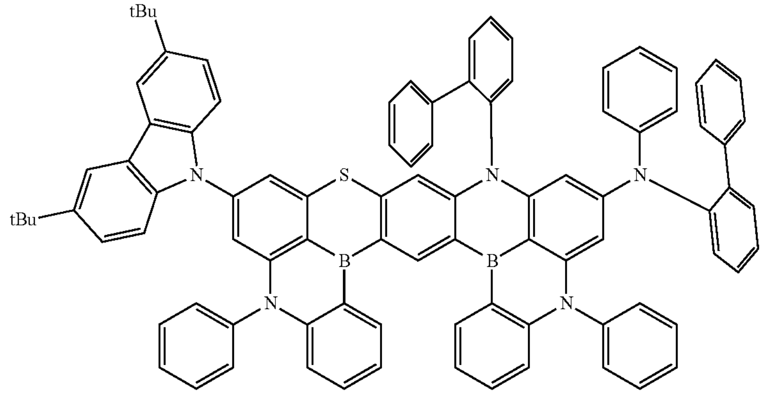
212
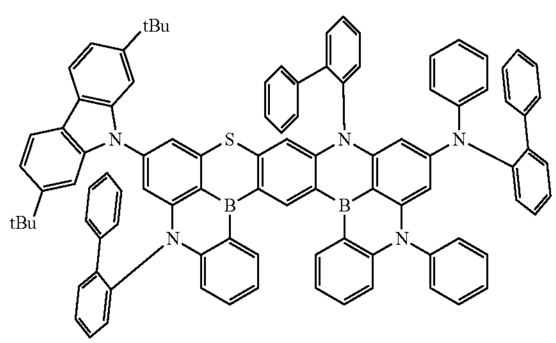
213
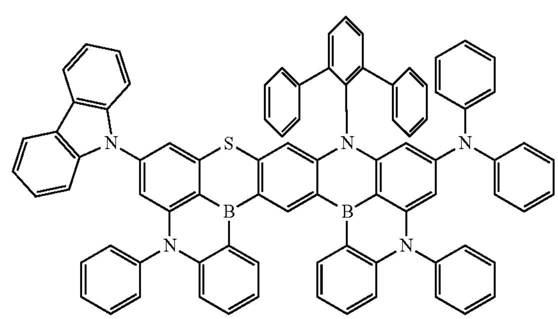
214
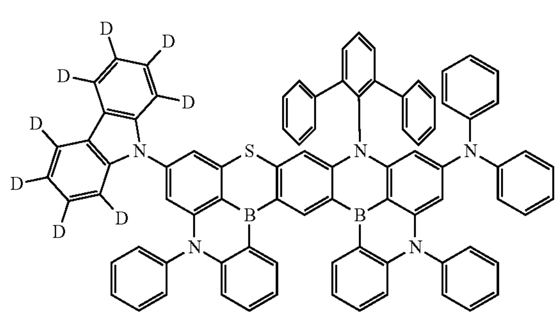
215
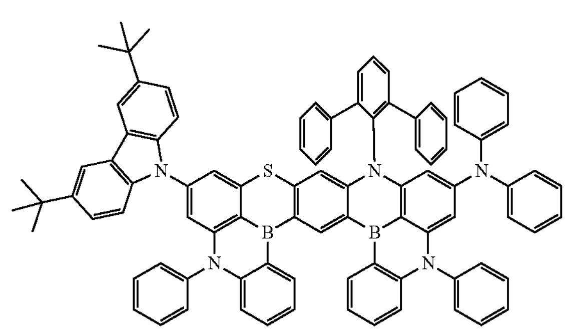

-continued
216
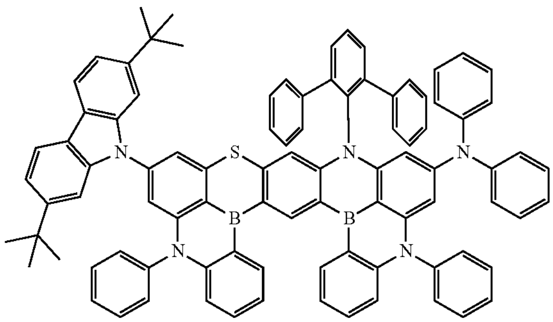
217
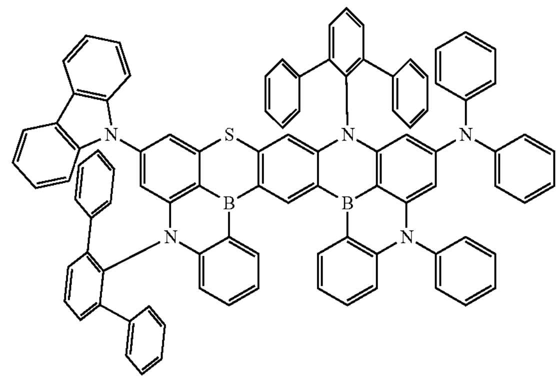
218
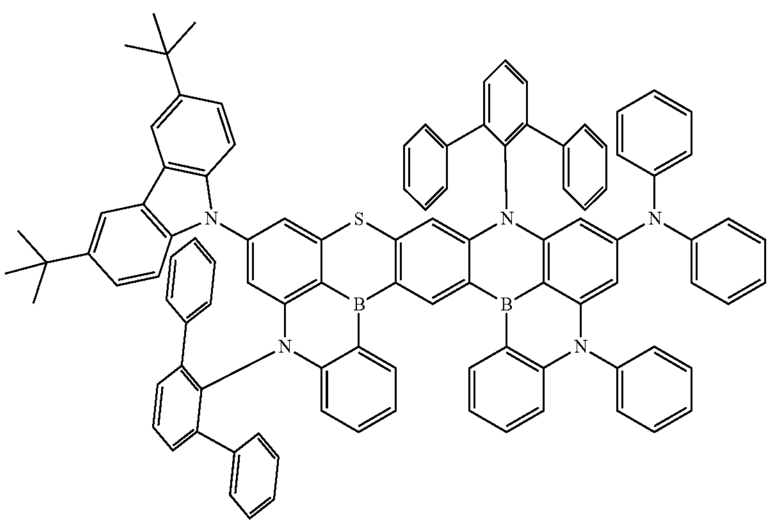
219
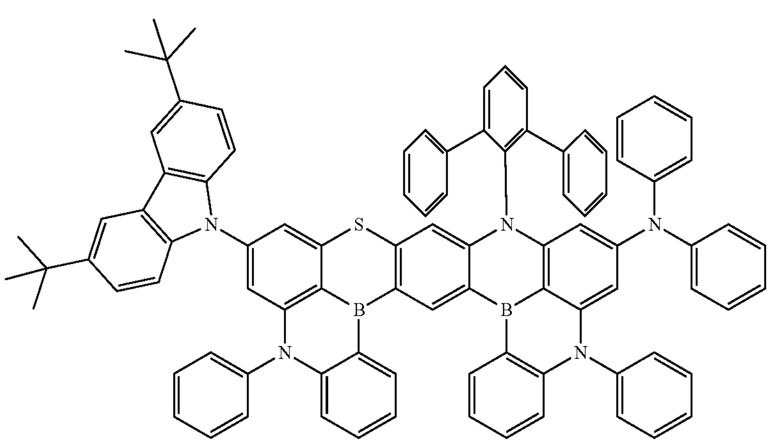

-continued
220
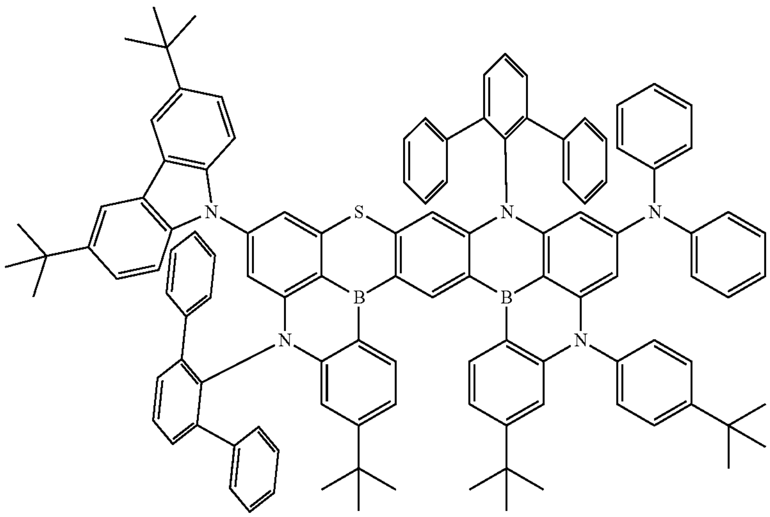
221
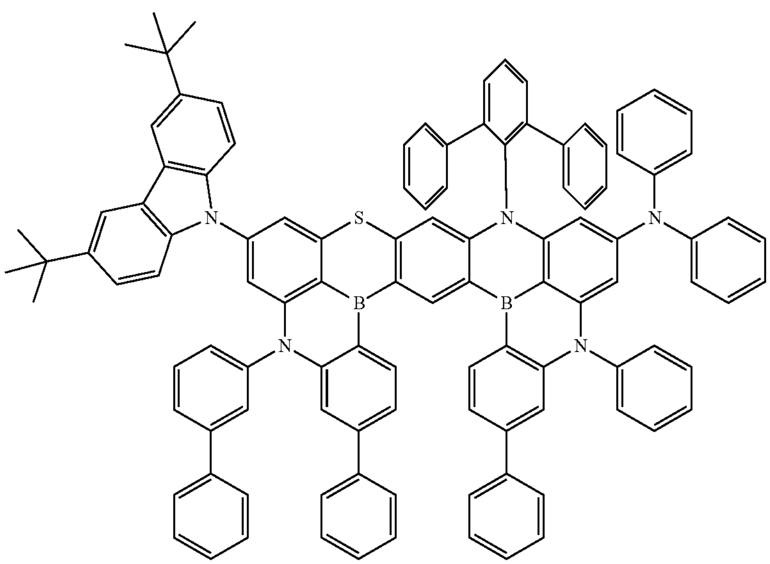
222
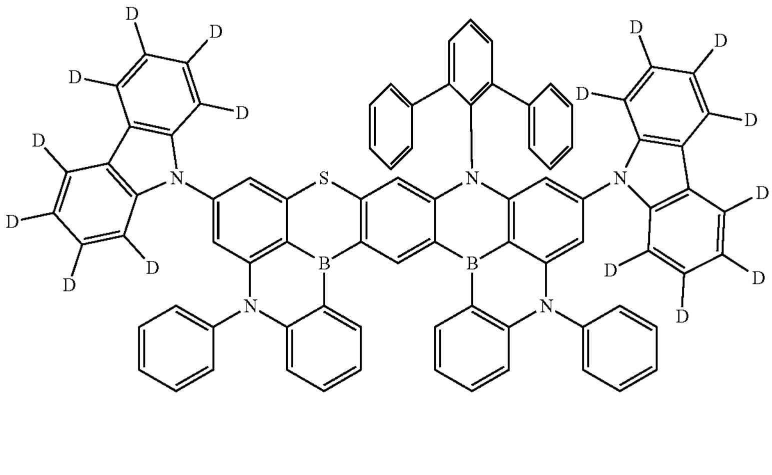

-continued
223
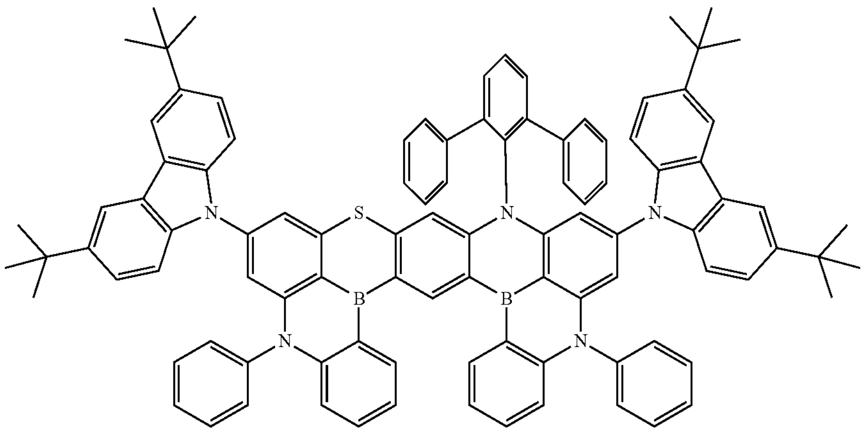
224
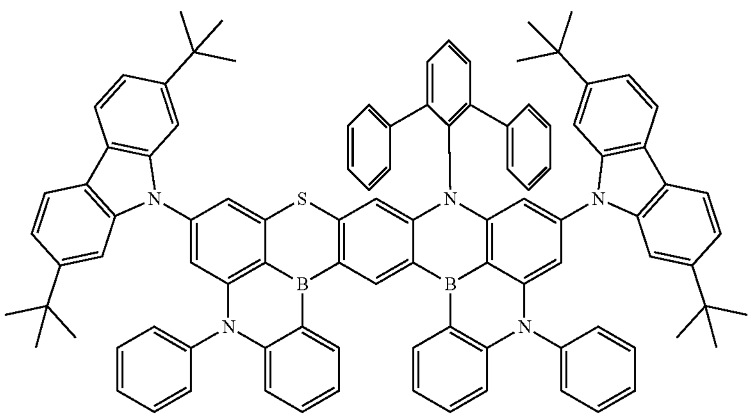
225
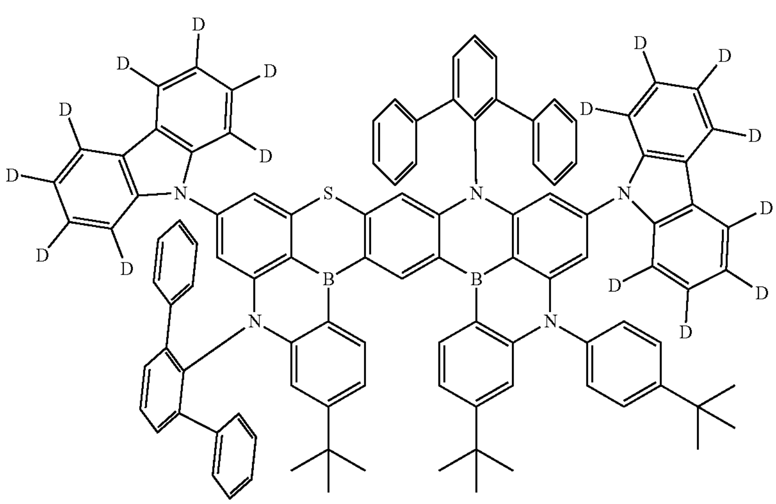

-continued
226
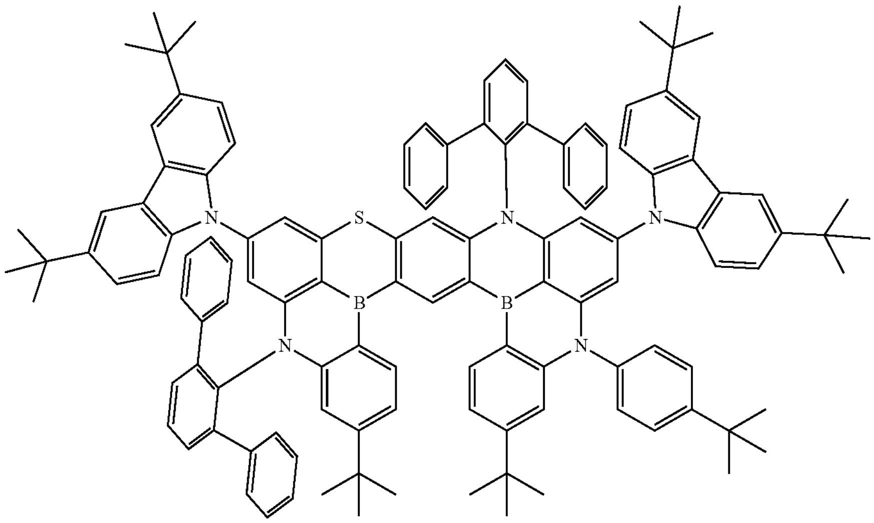
227
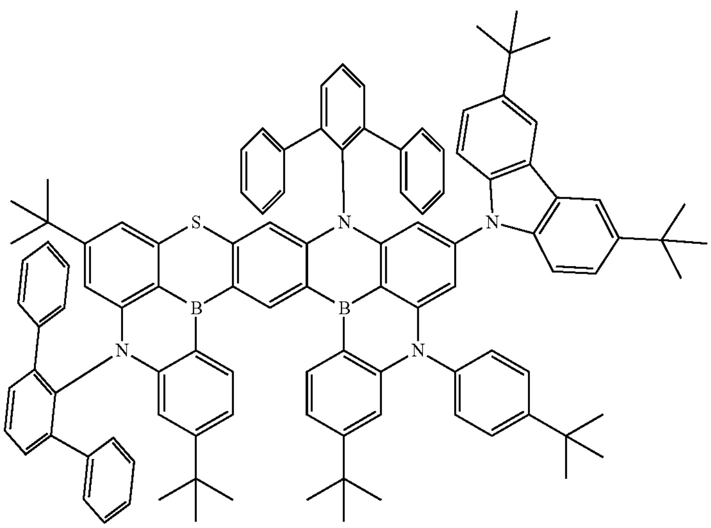
228
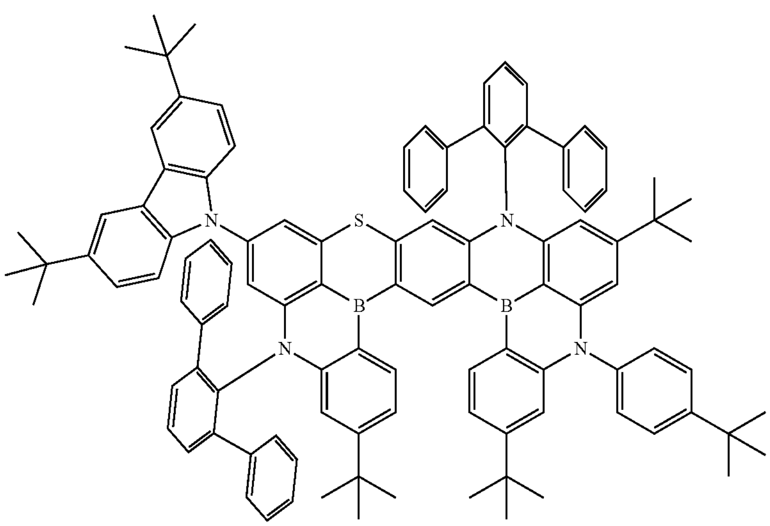

-continued
229
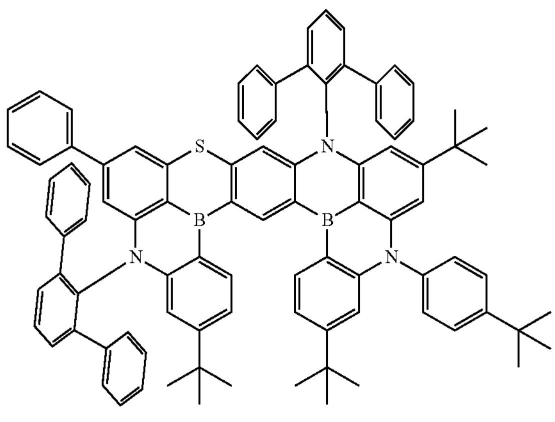
230
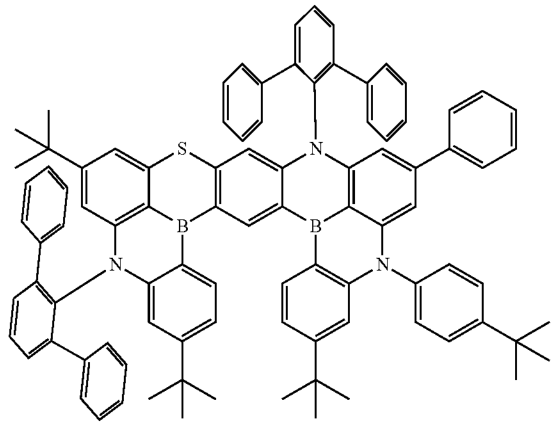
231
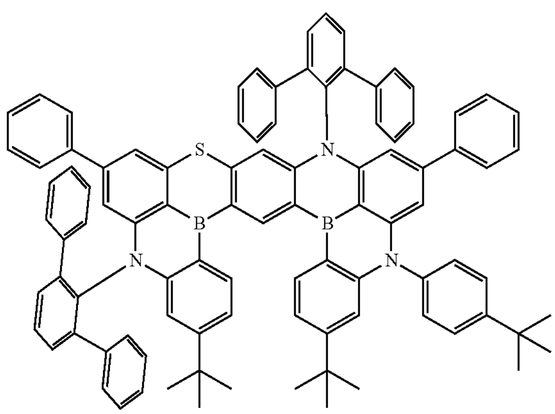
232
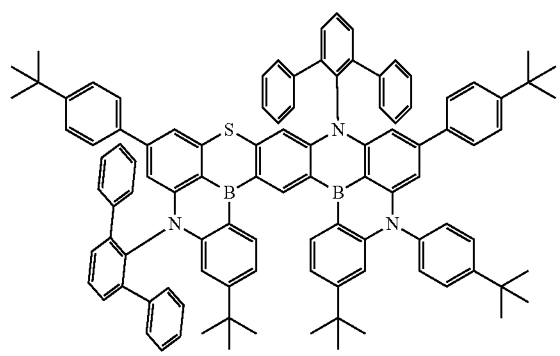
233
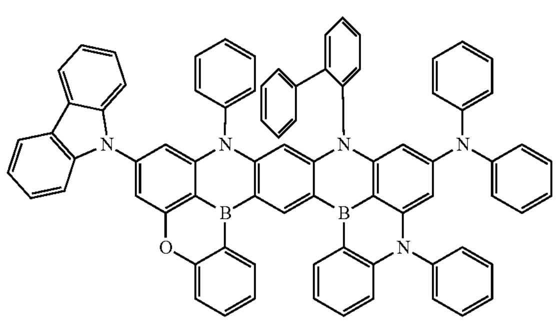
234
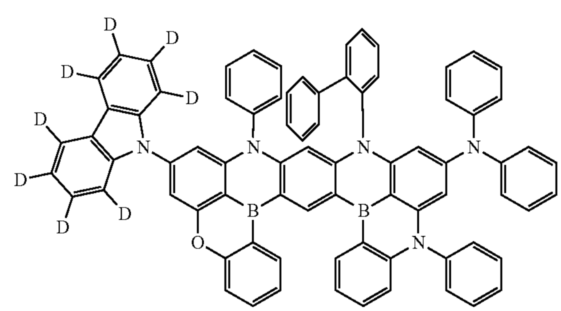
235
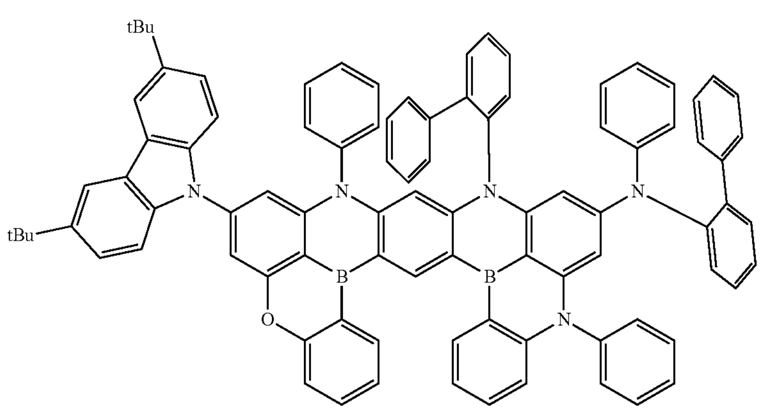

-continued
236
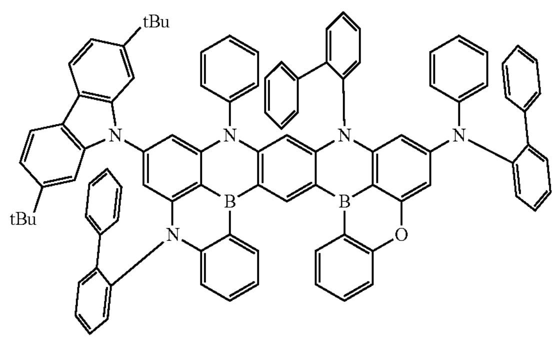
237
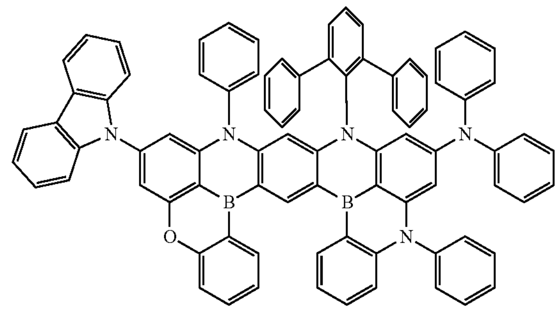
238
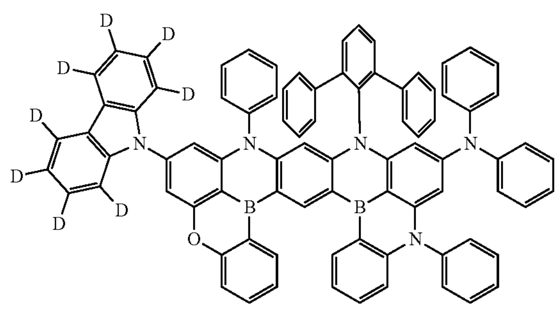
239
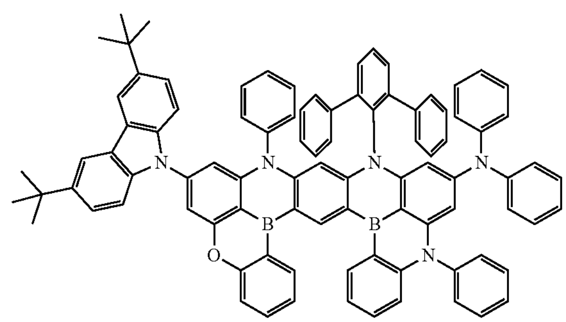
240
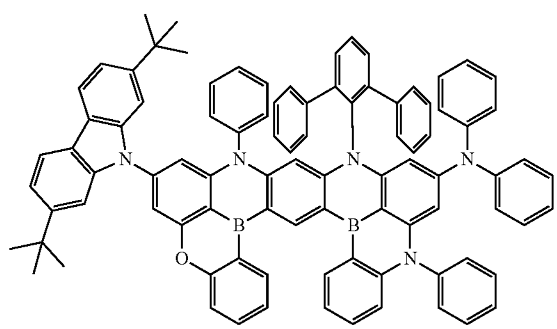
241
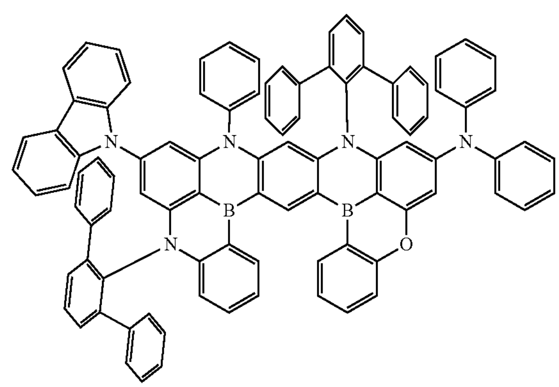
242
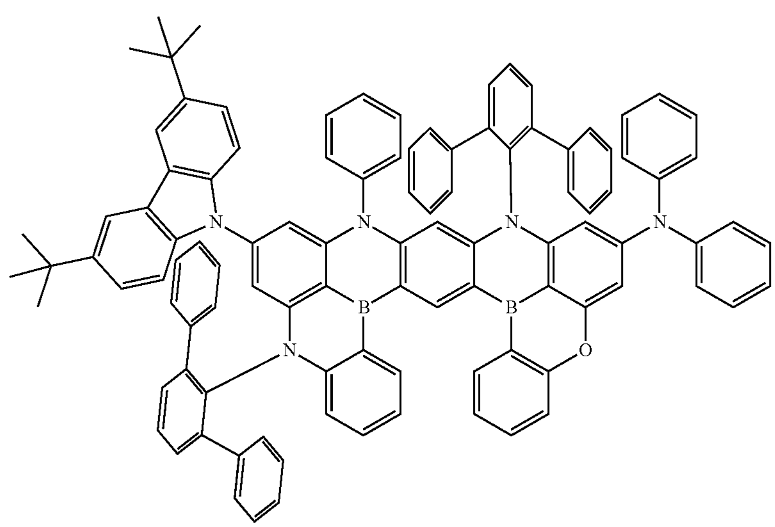

-continued
243
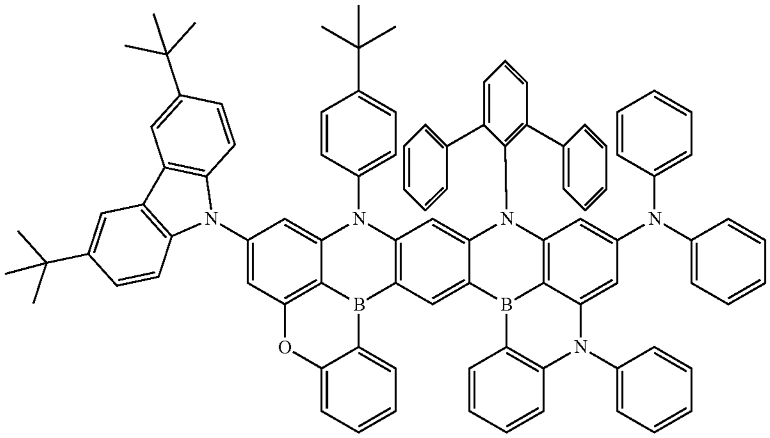
244
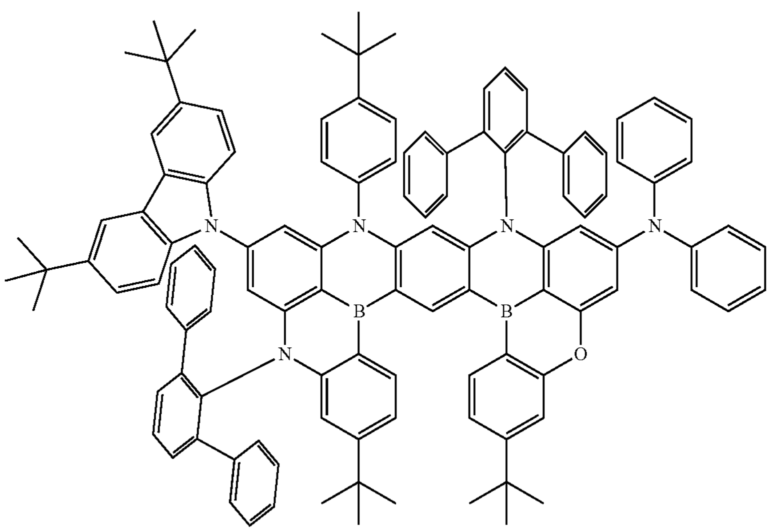
245
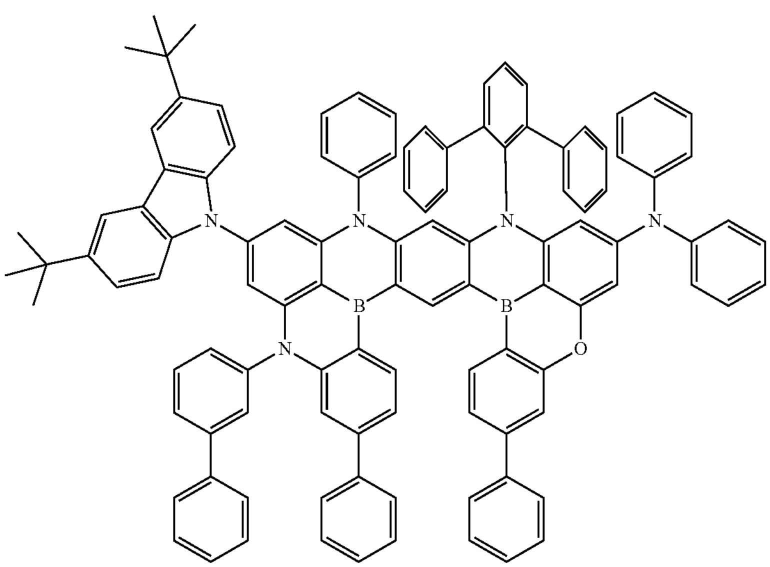

-continued
246
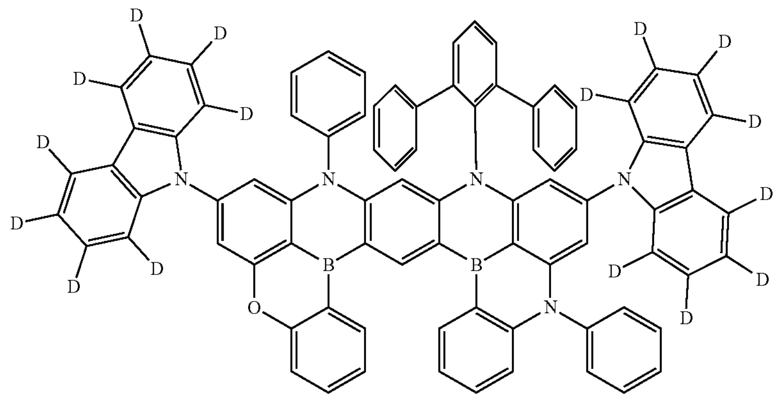
247
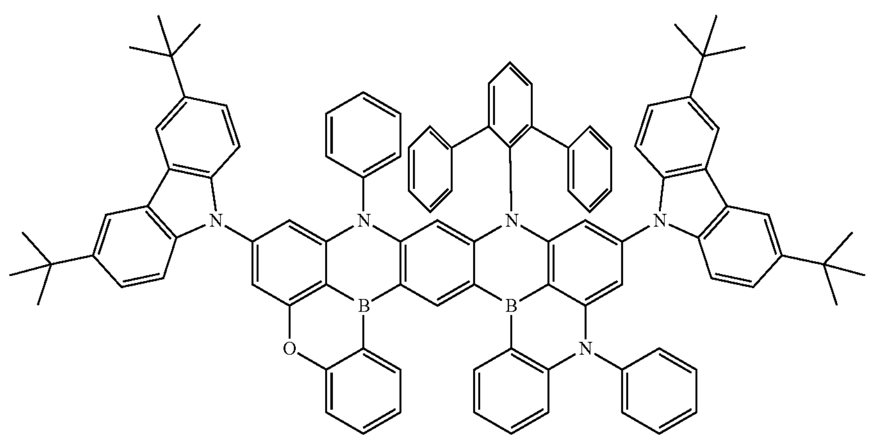
248
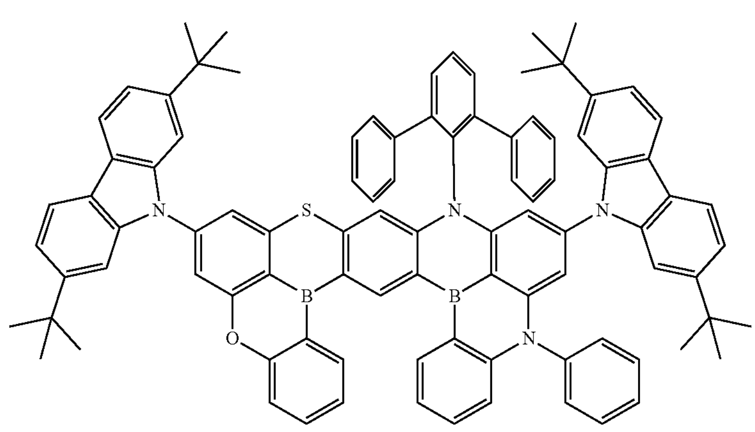

-continued
249
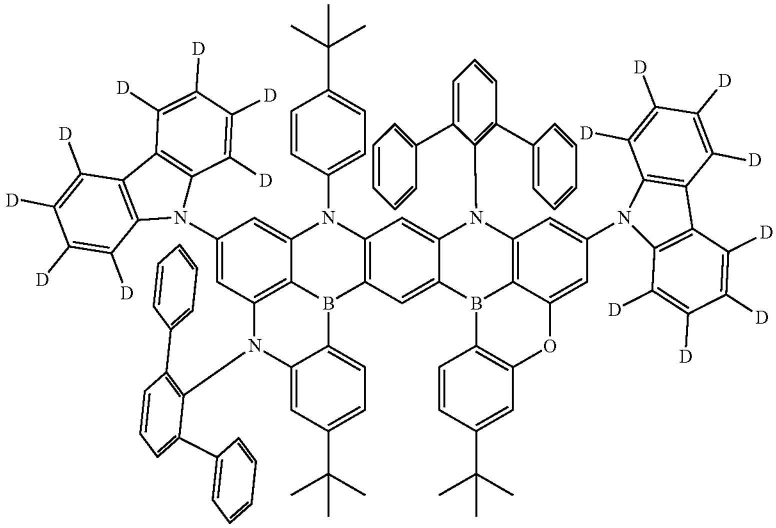
250
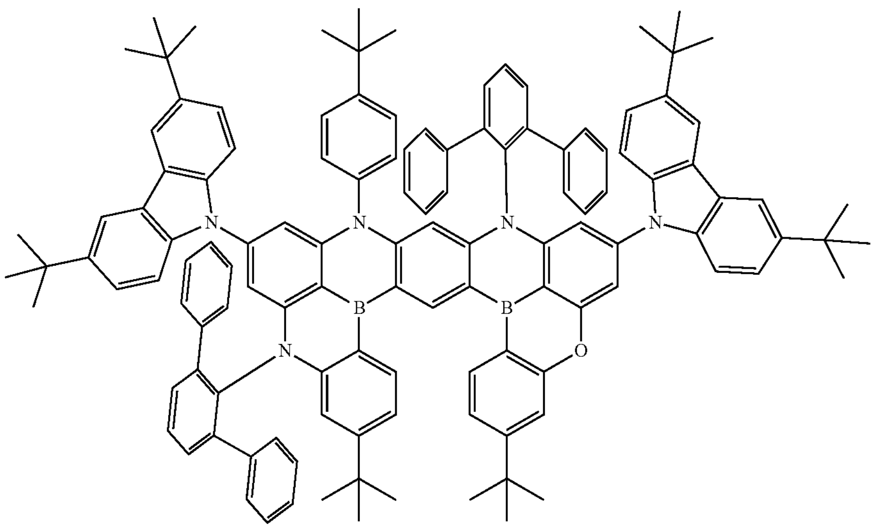
251
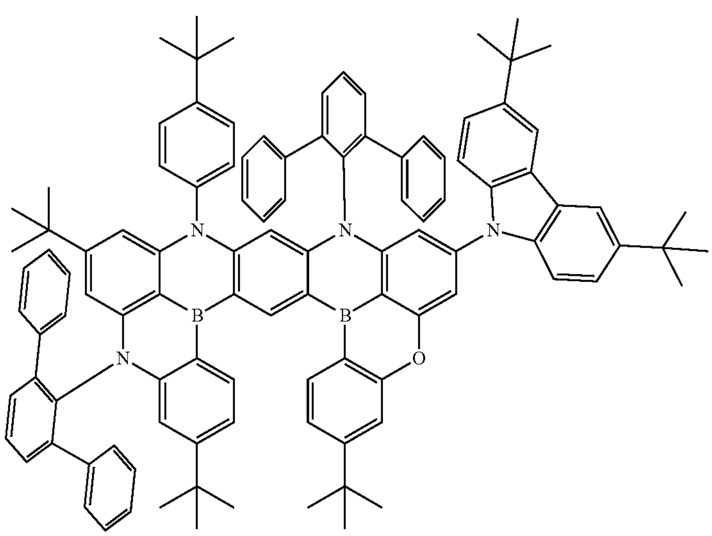

-continued
252
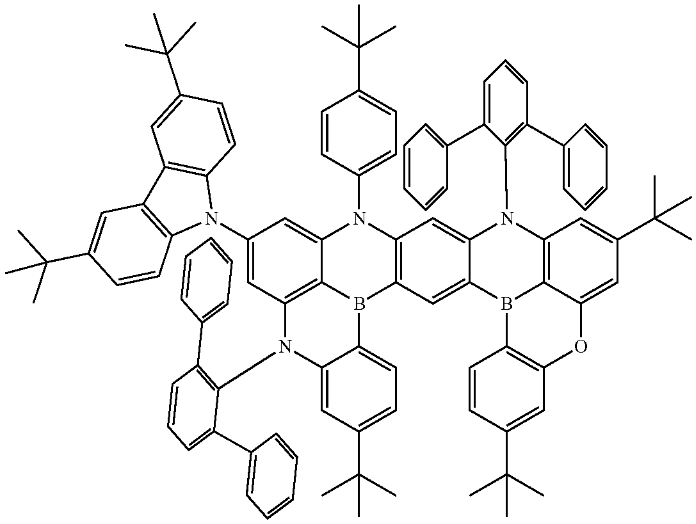
253
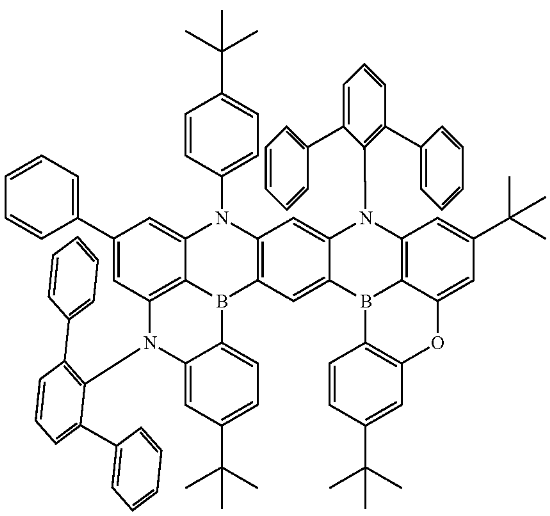
254
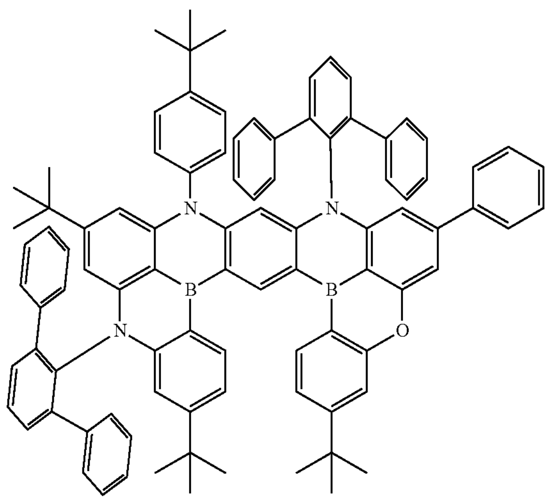
255
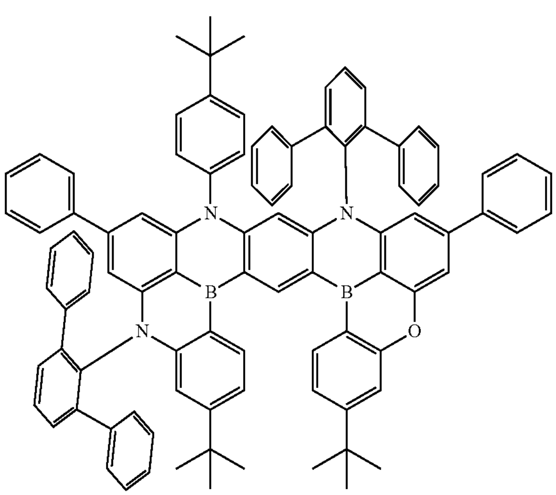
256
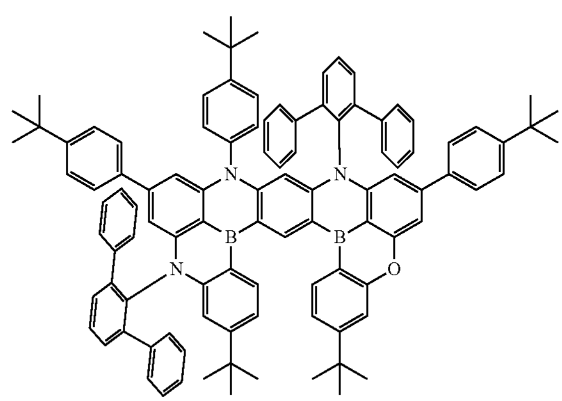

-continued
257
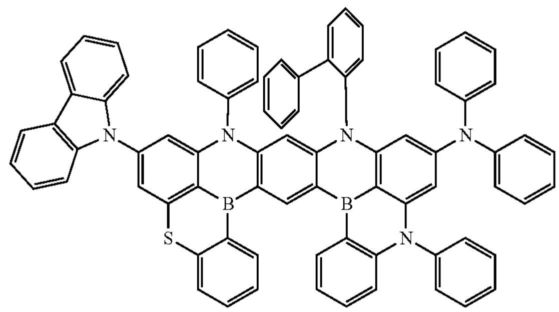
258
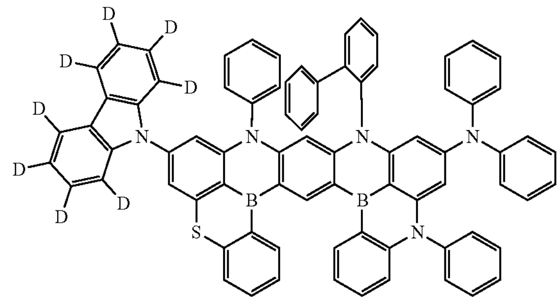
259
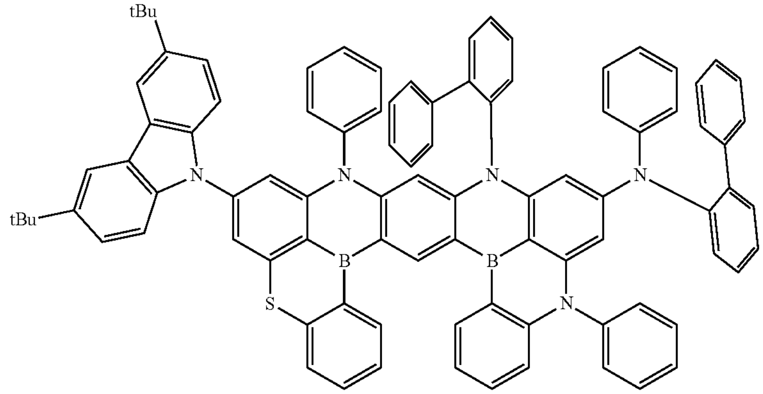
260
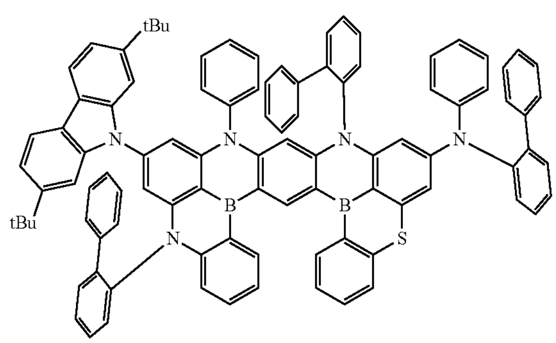
261
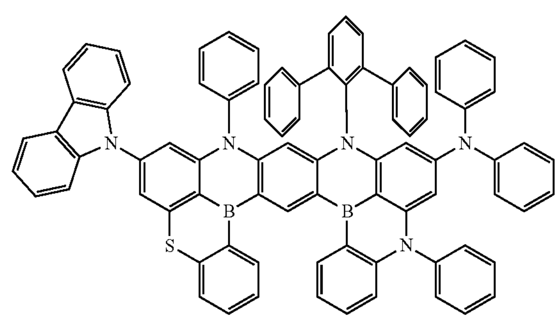
262
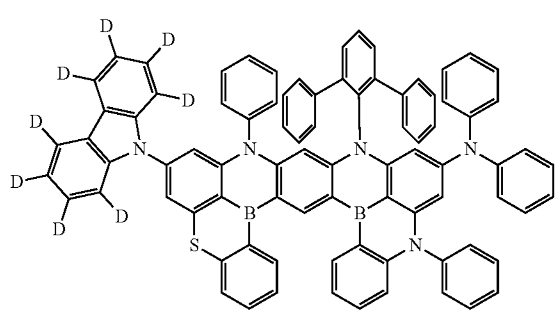
263
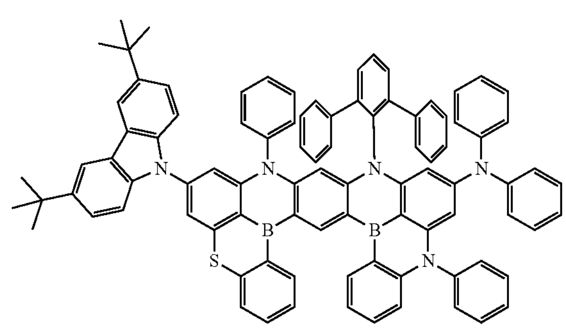

-continued
264
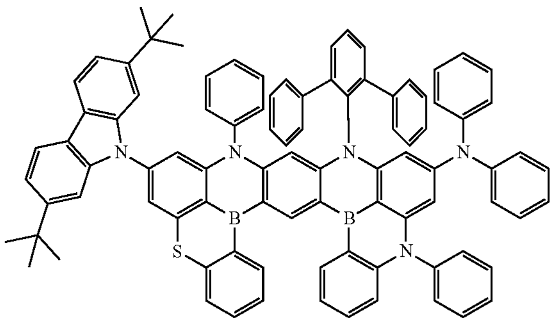
365
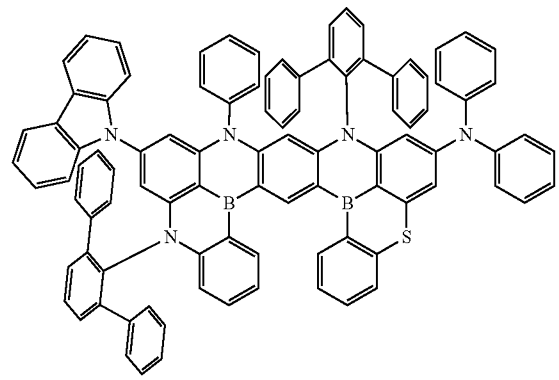
266
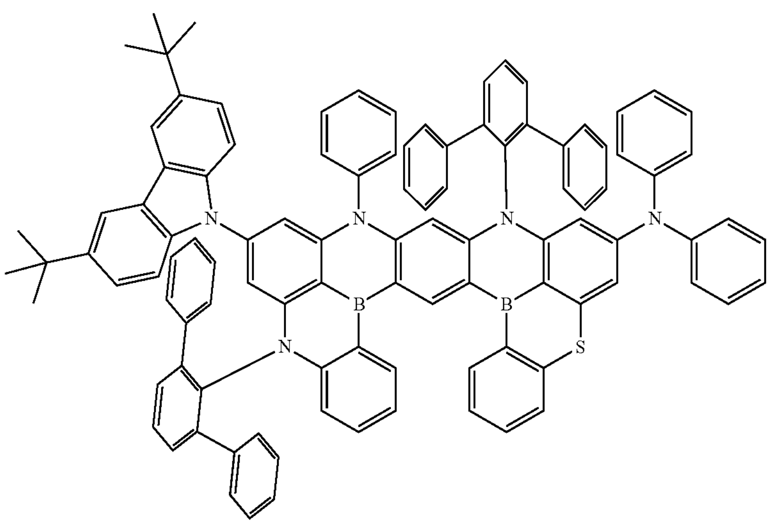
267
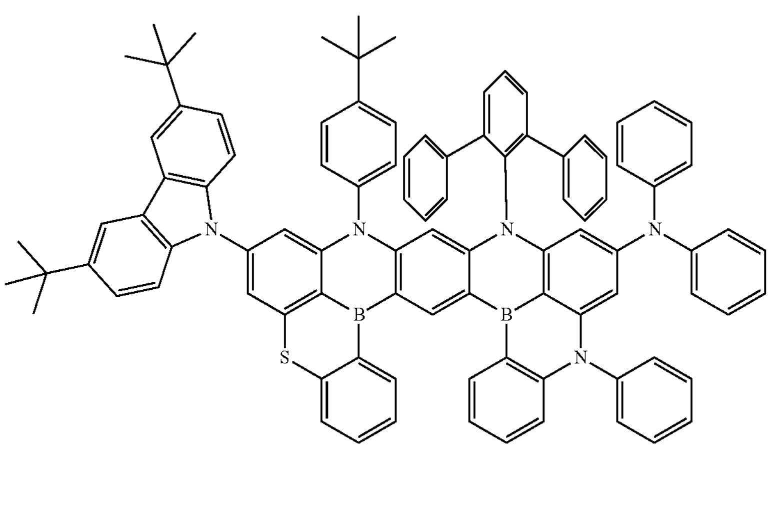

-continued
268
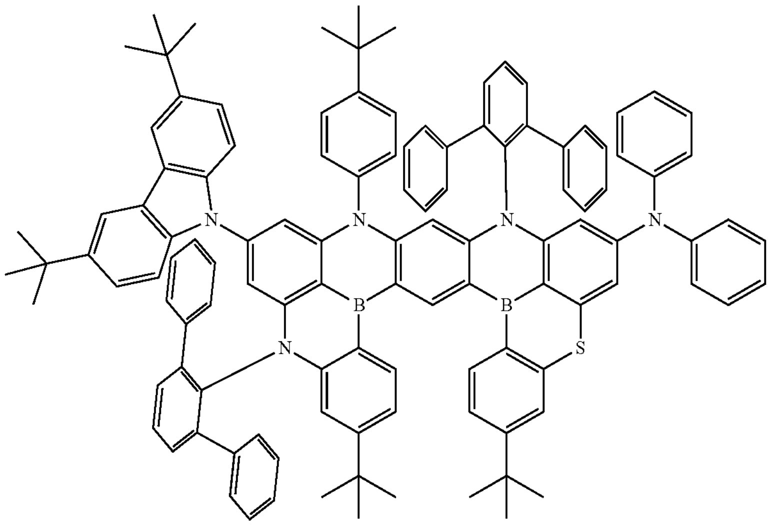
269
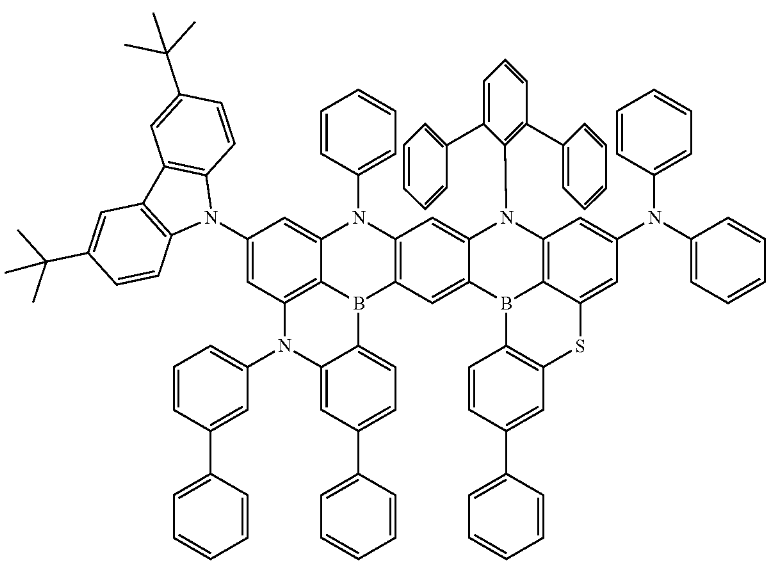
270
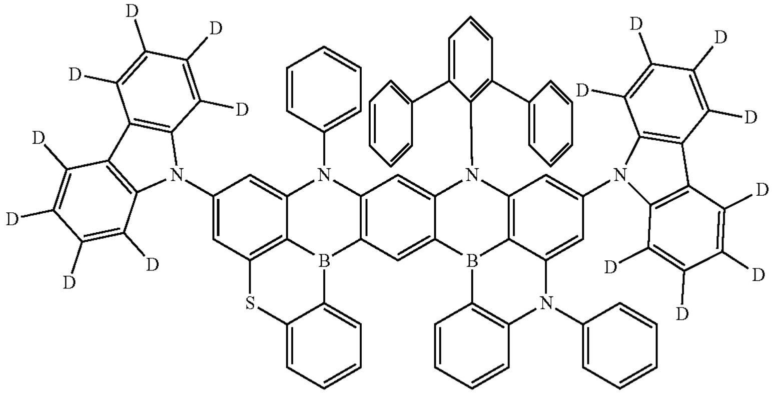

-continued
271
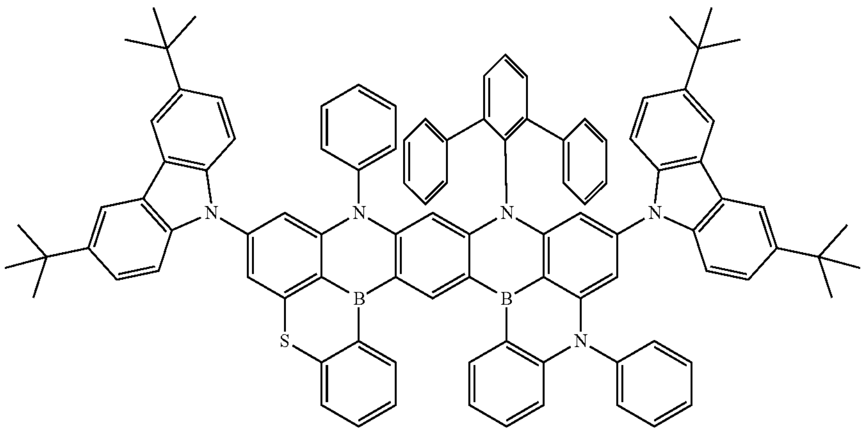
272
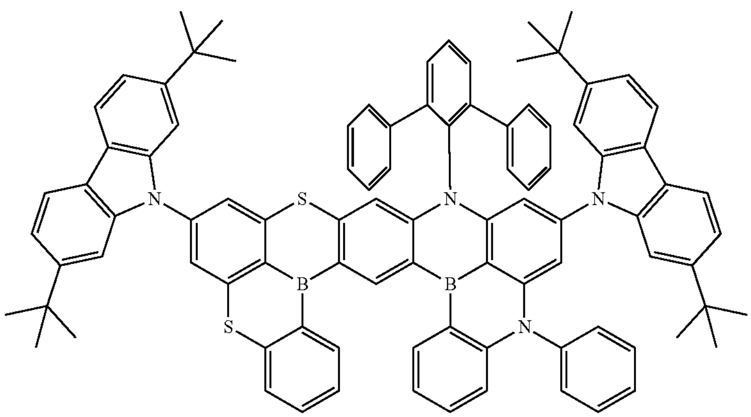
273
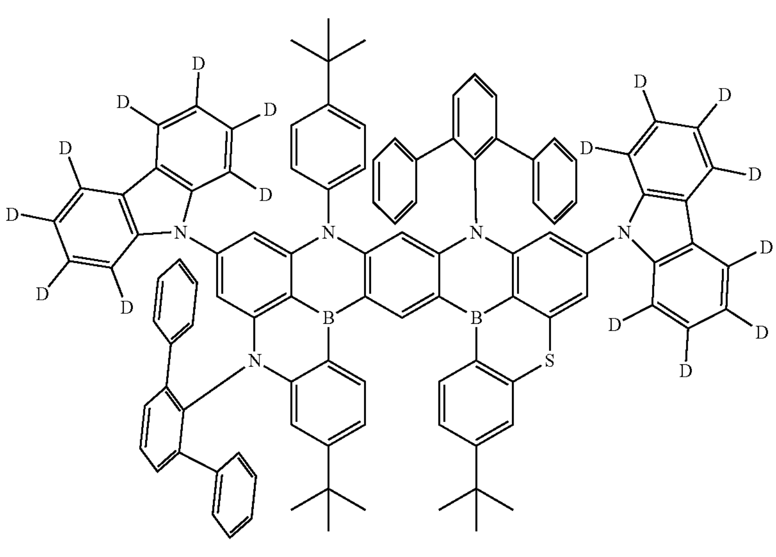

-continued
274
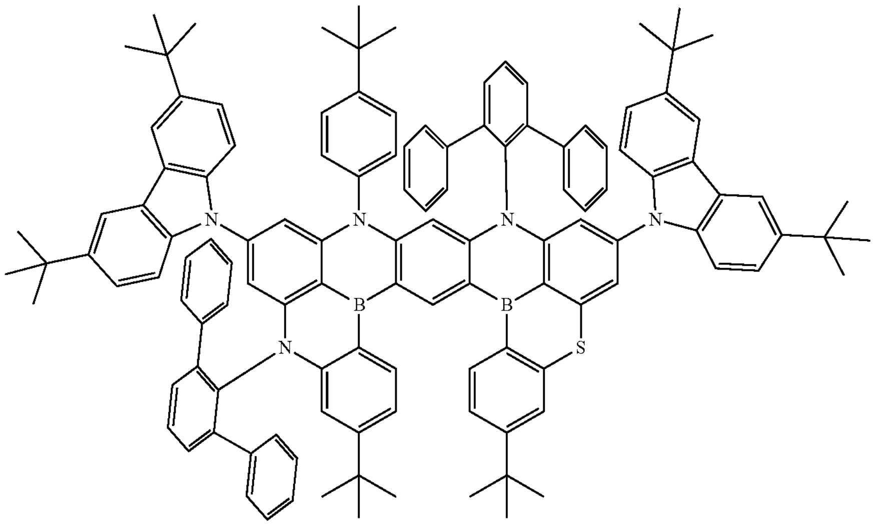
275
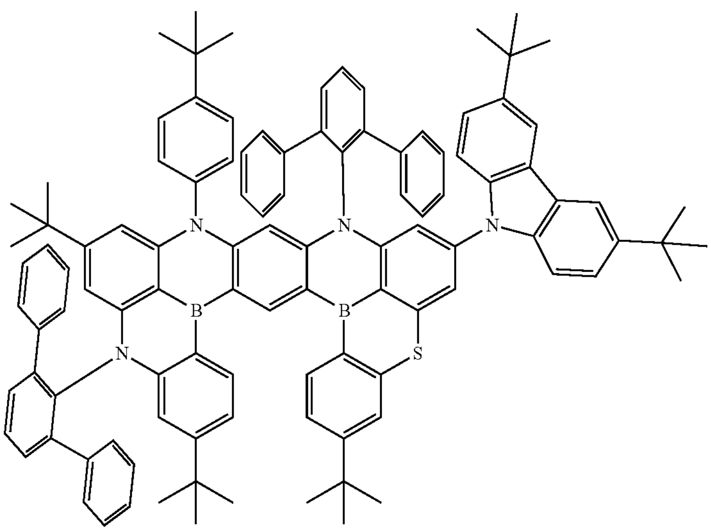
276
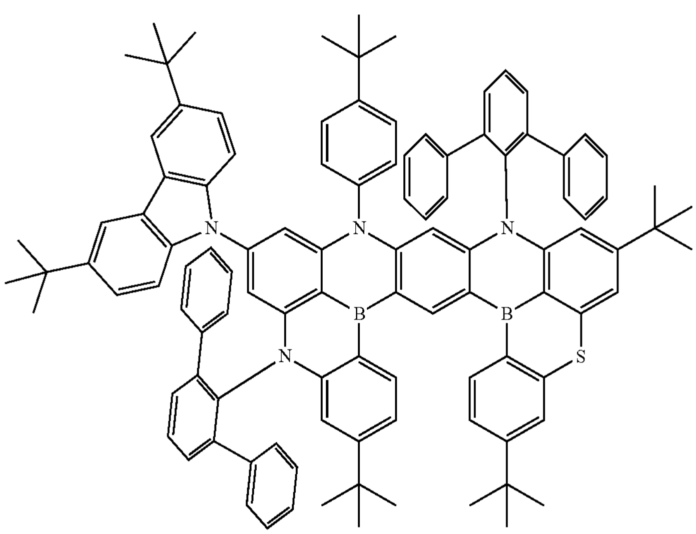

-continued
277
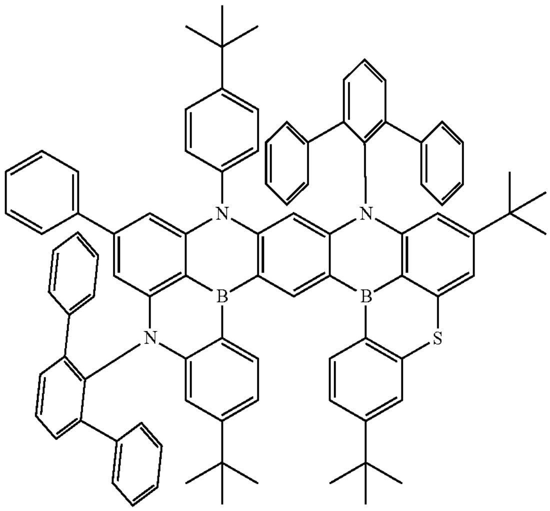
278
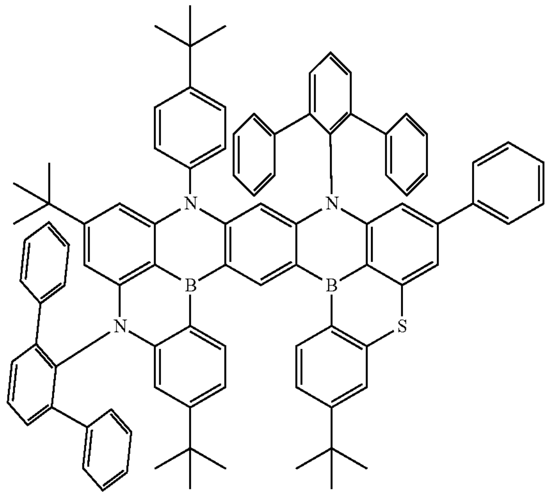
279
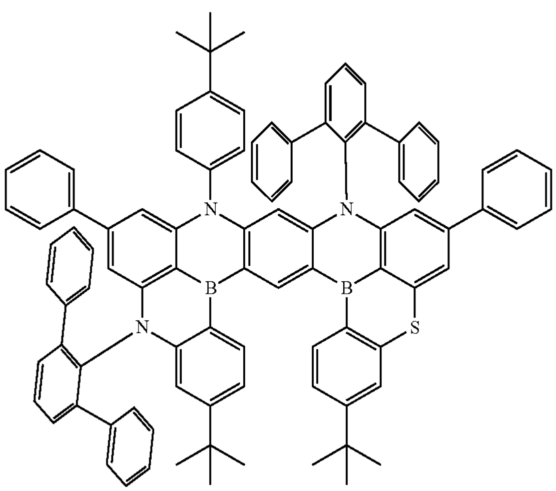
280
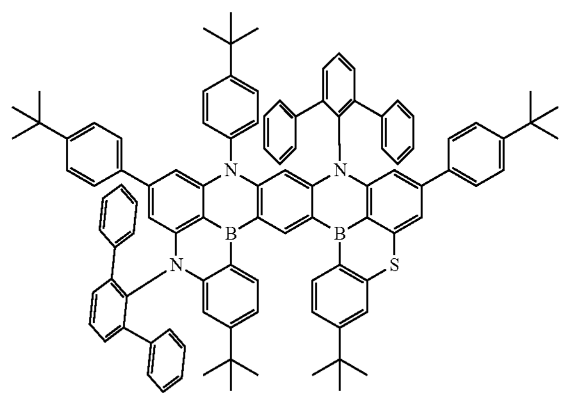
283
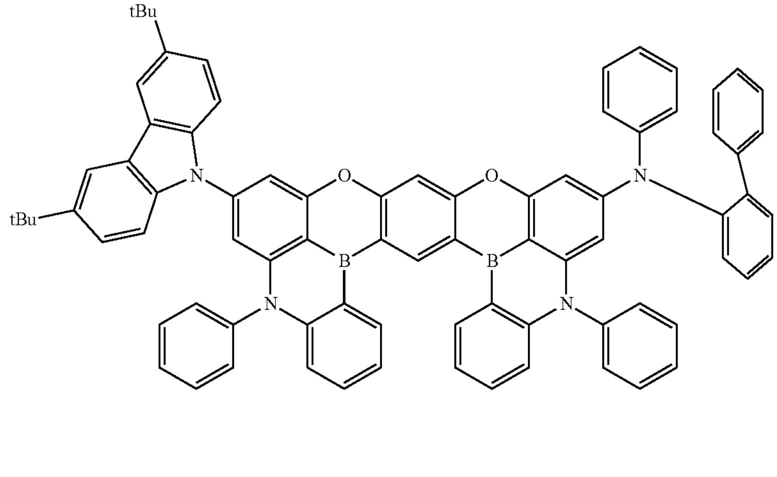

-continued
284
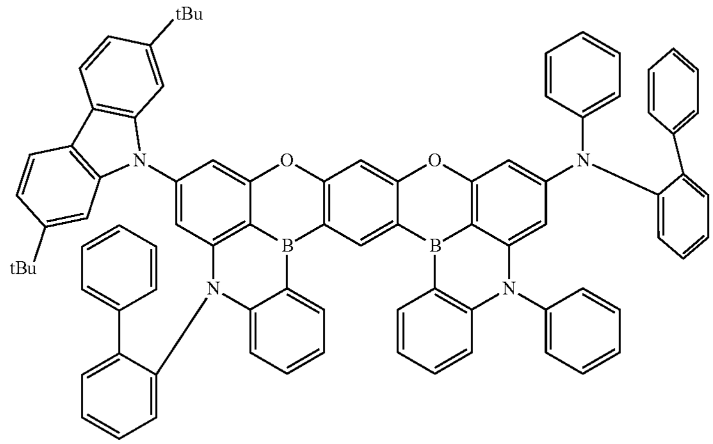
289
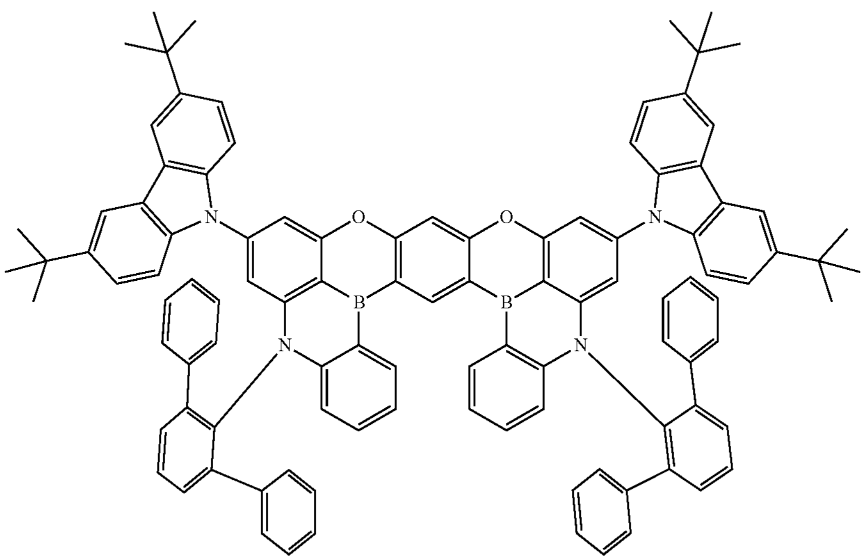
290
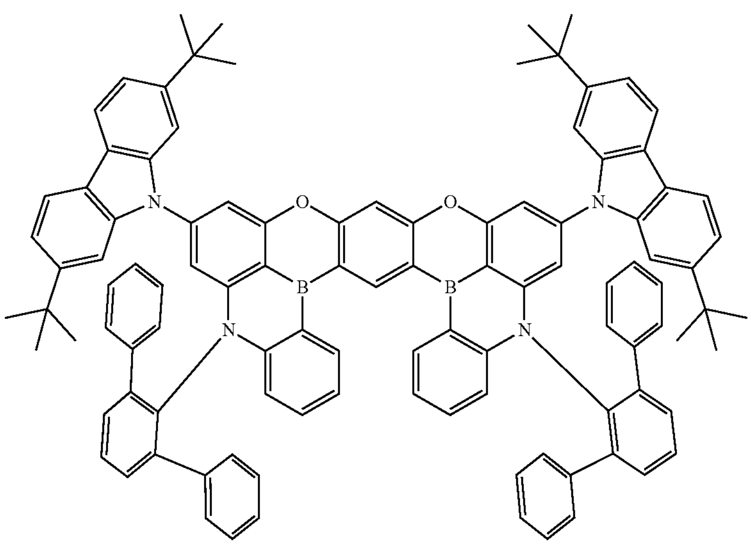

-continued
291
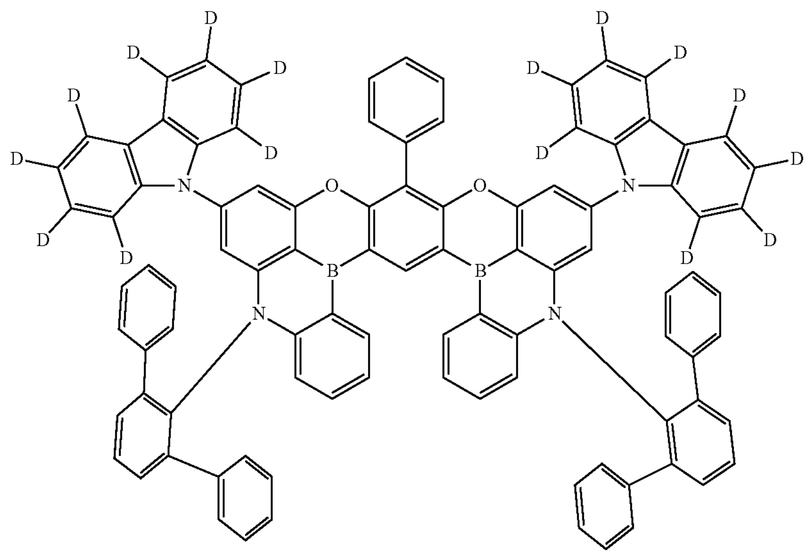
292
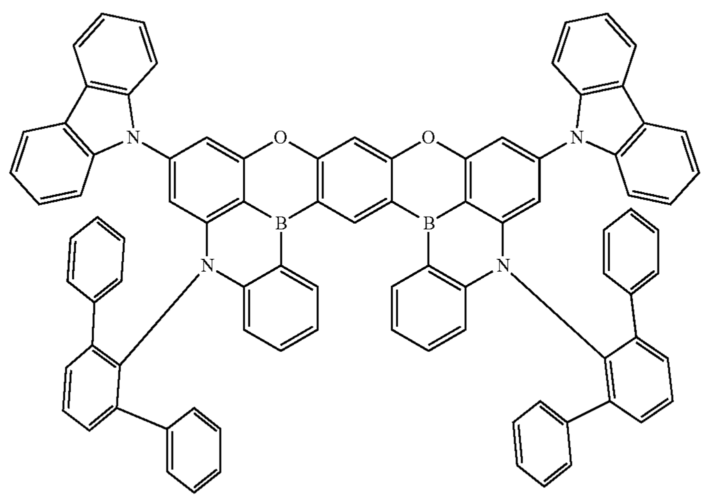
293
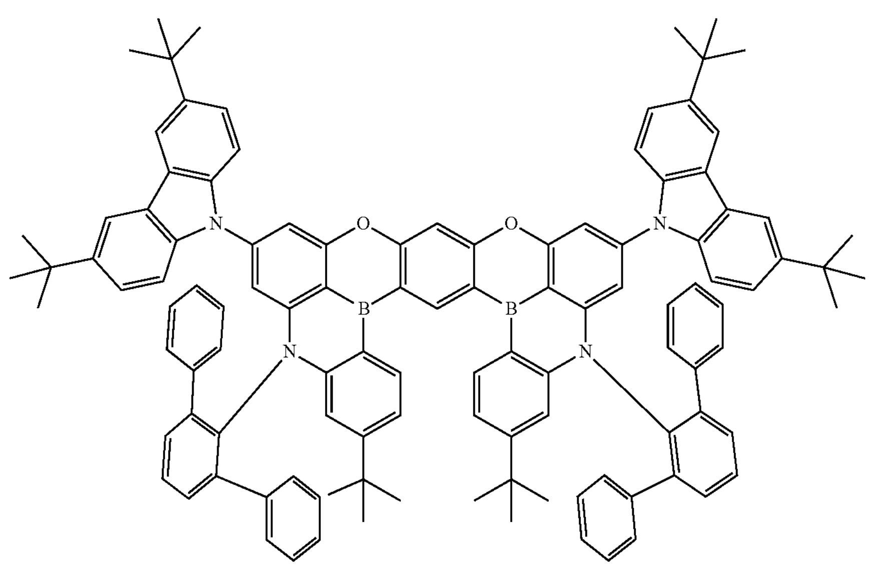

-continued
294
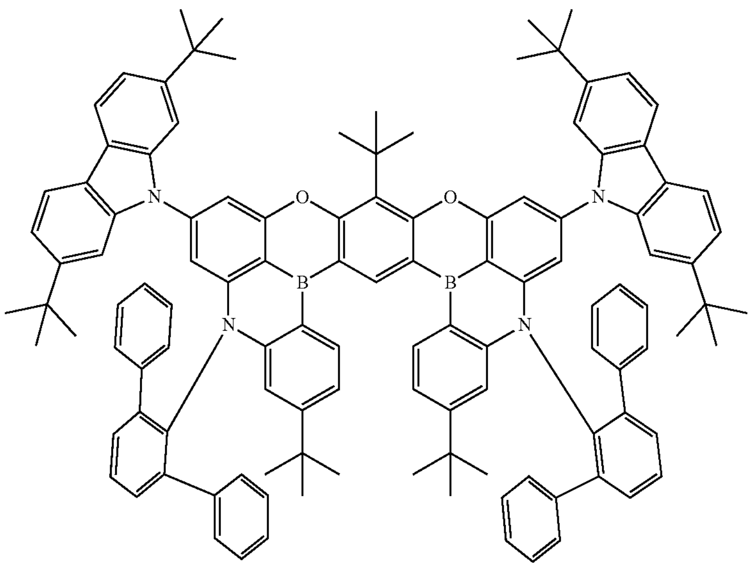
295
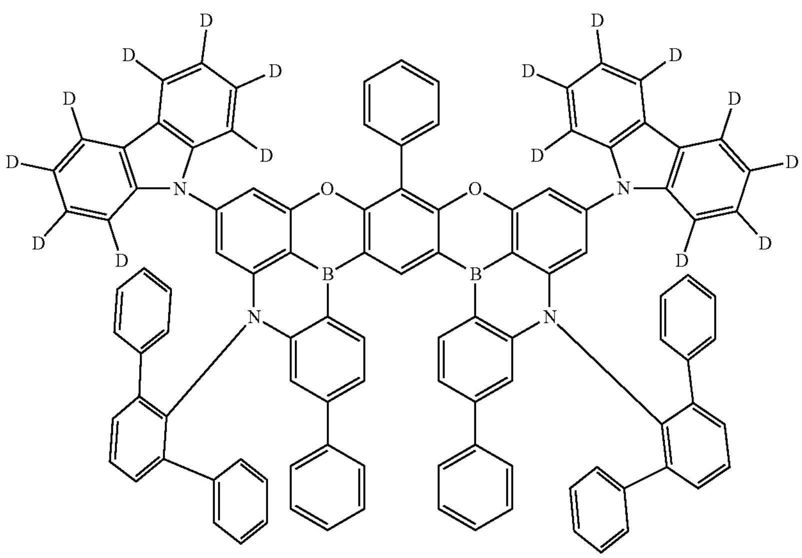
296
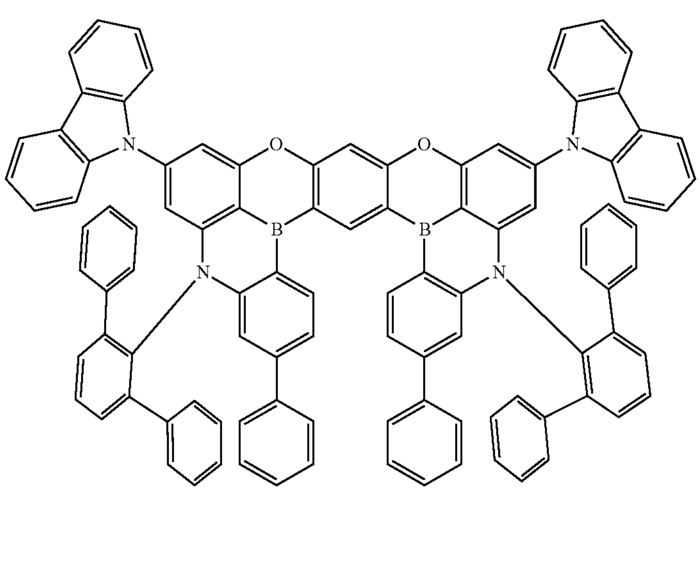

-continued
297
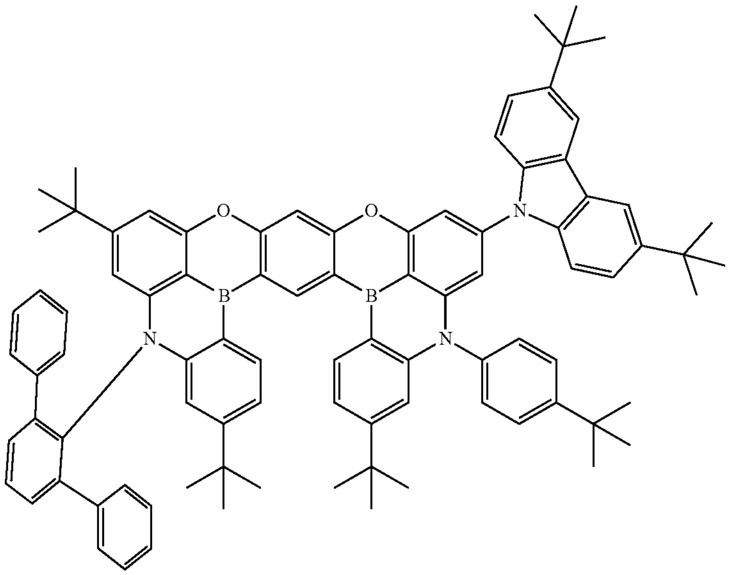
298
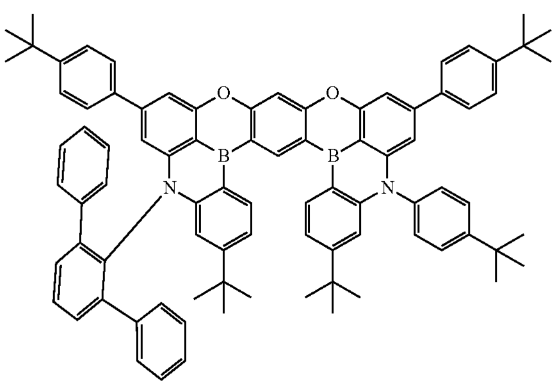
299
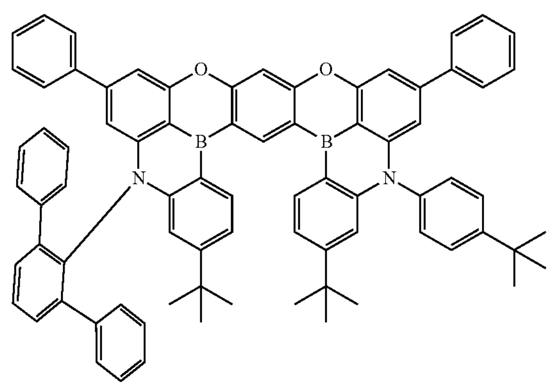
300
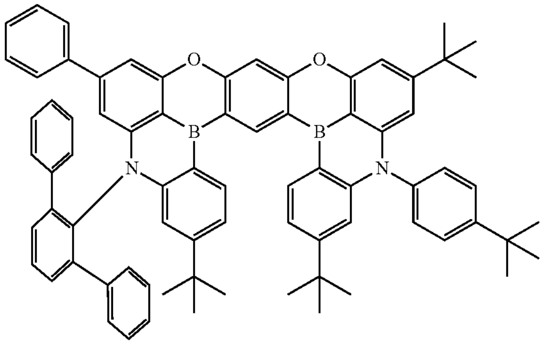
301
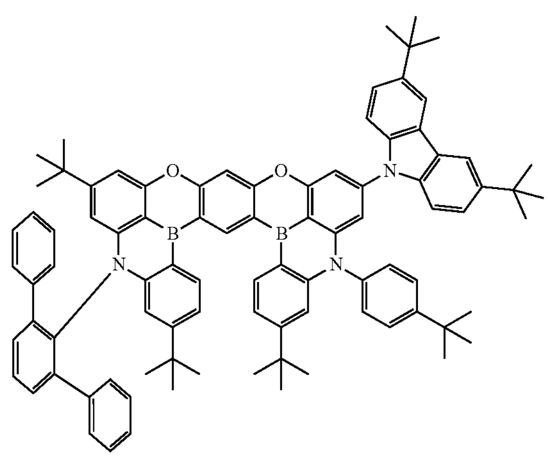

-continued
302
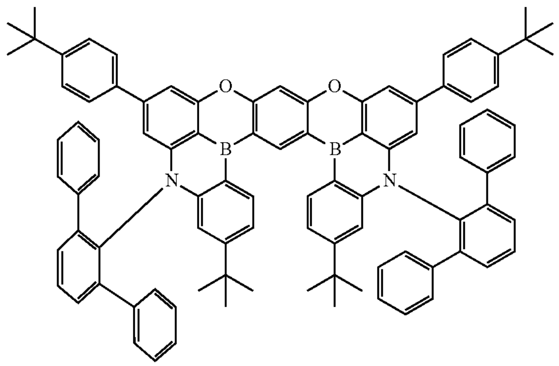
303
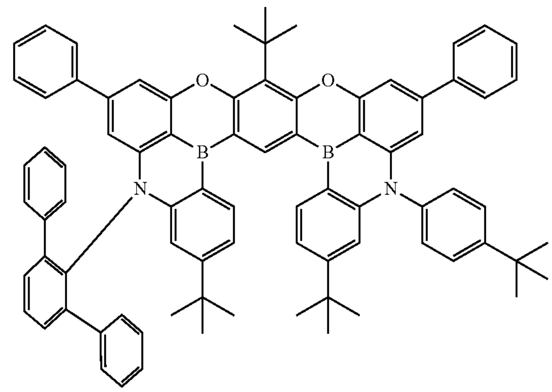
304
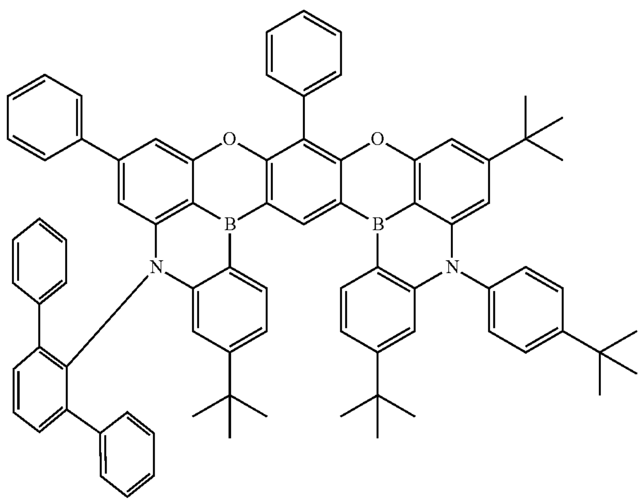
307
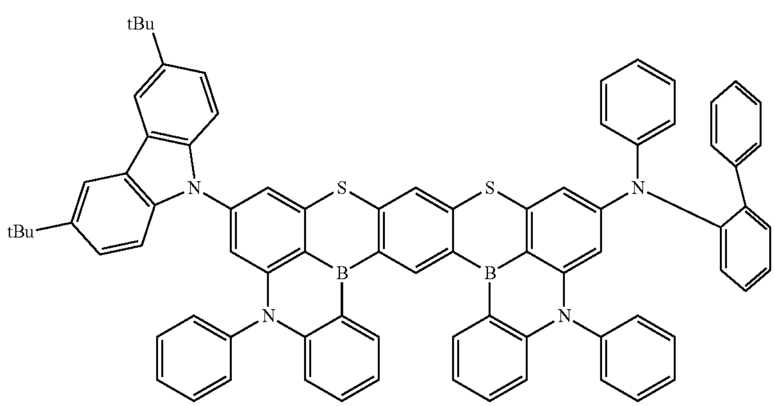

-continued
308
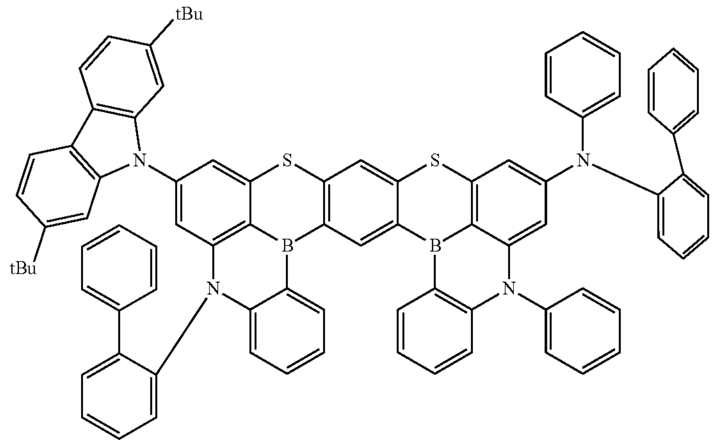
313
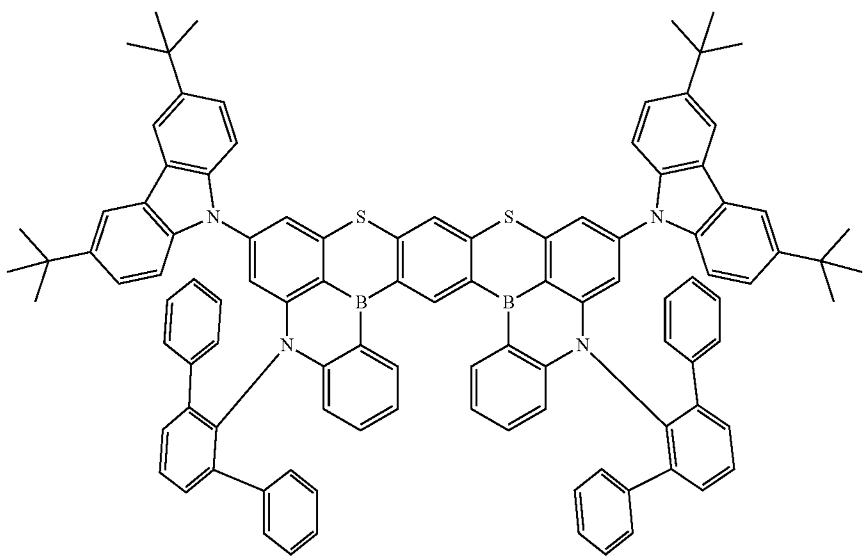
314
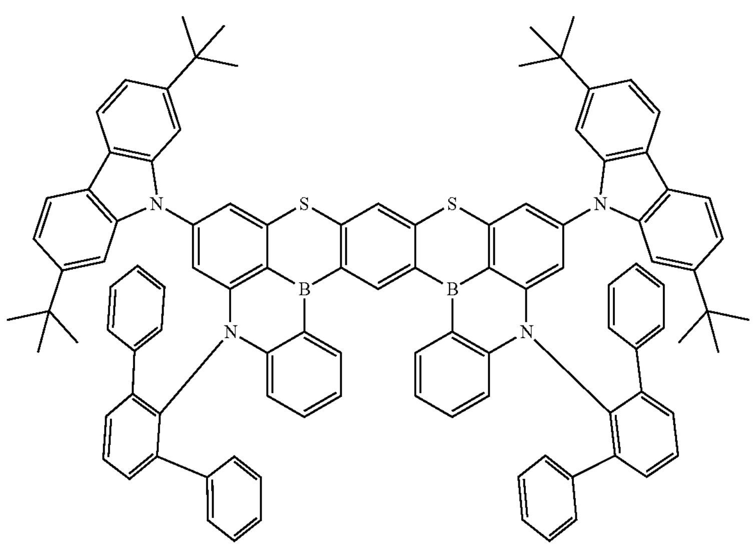

-continued
315
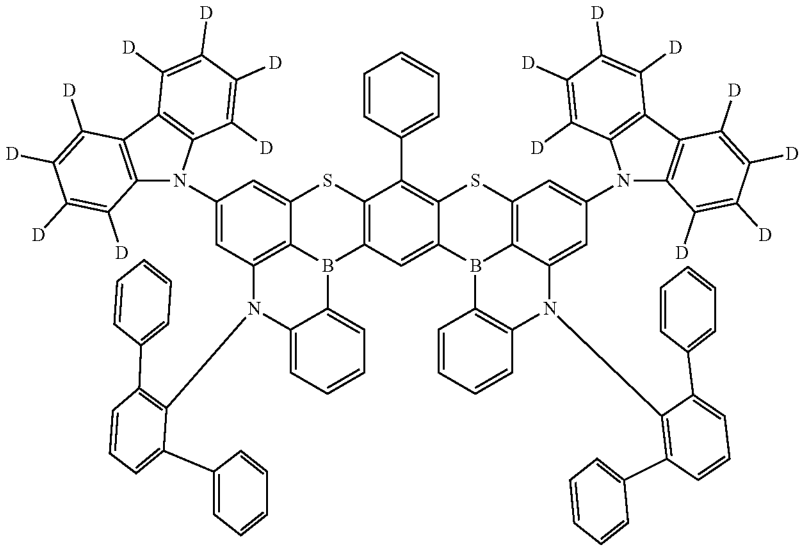
316
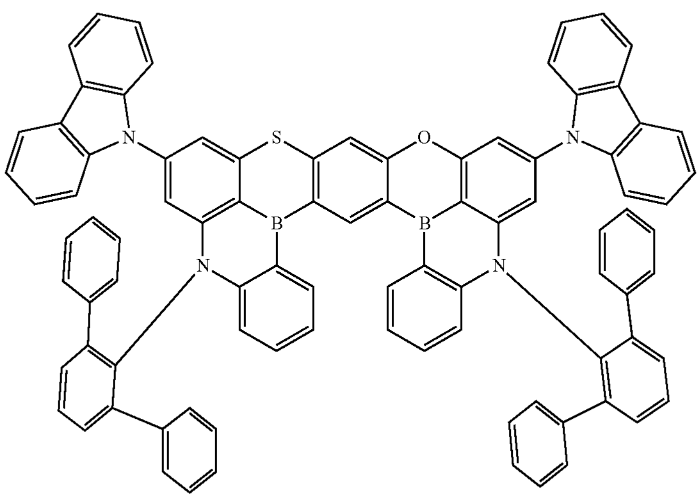
317
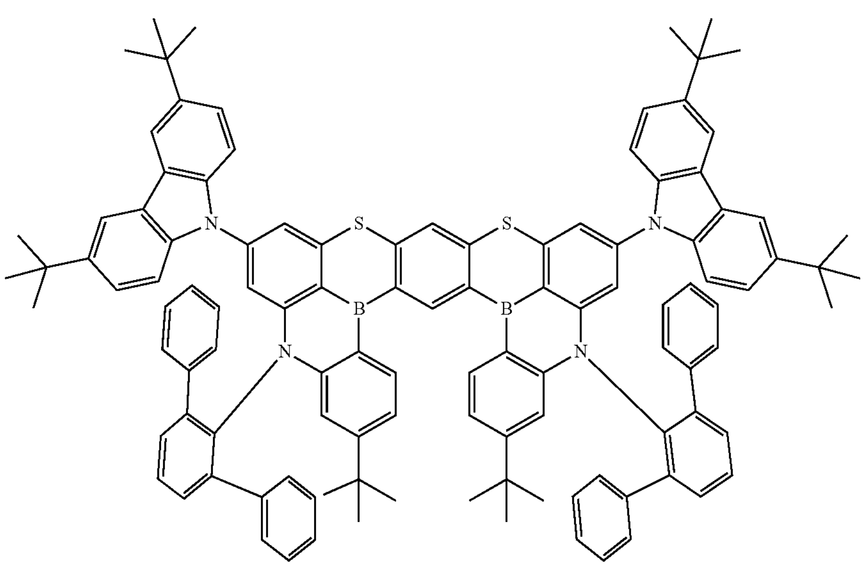

-continued
318
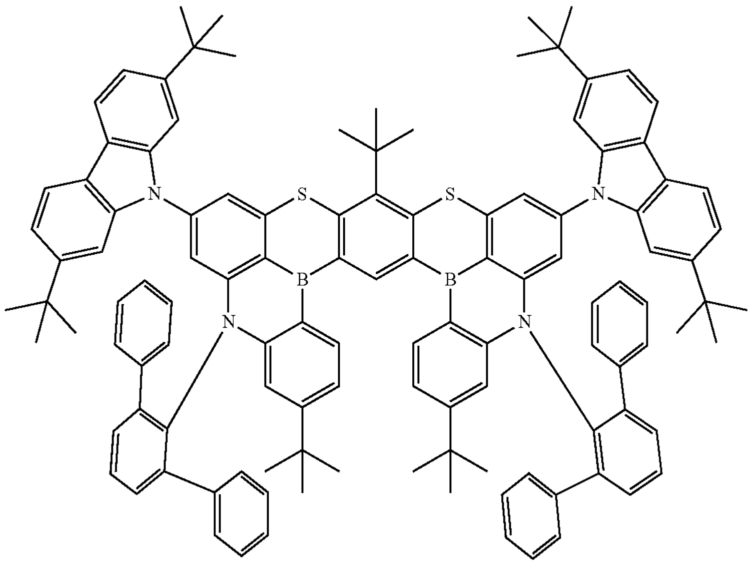
319
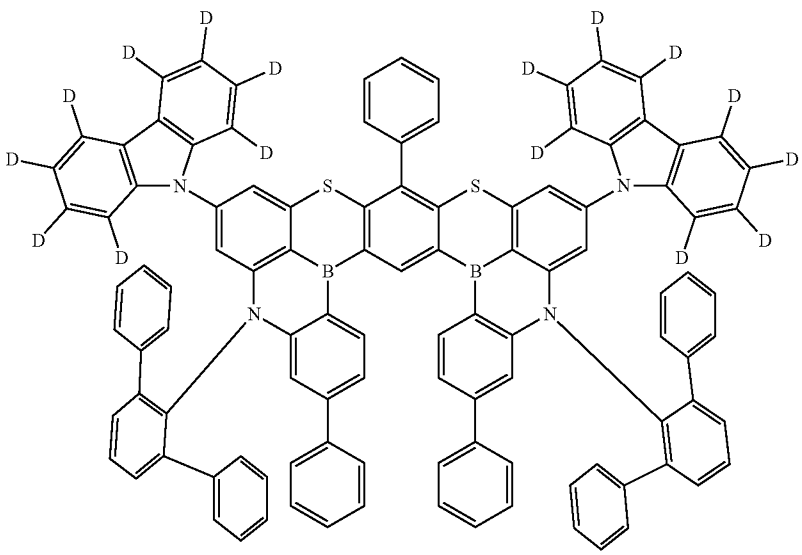
320
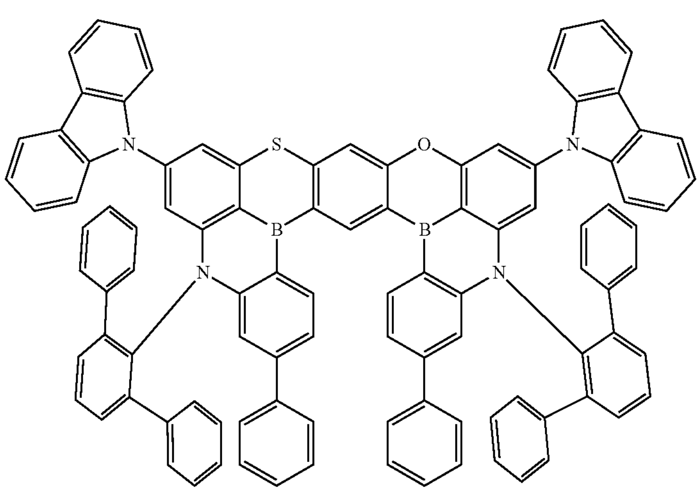

-continued
321
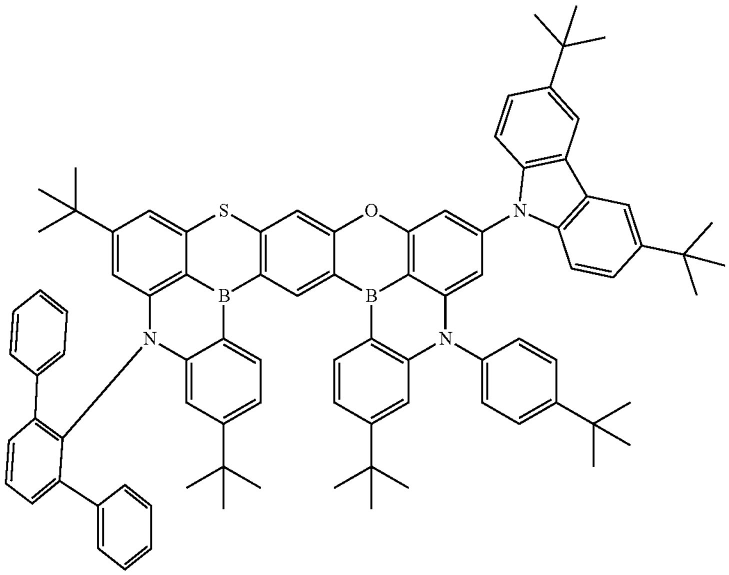
322
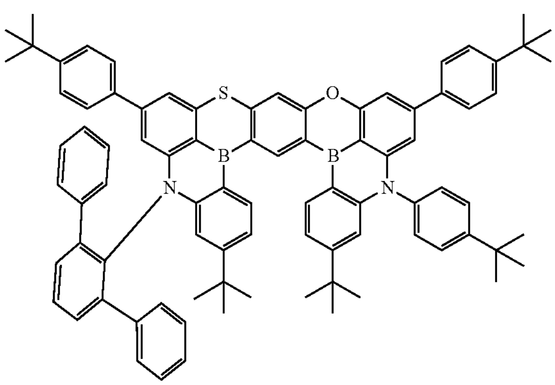
323
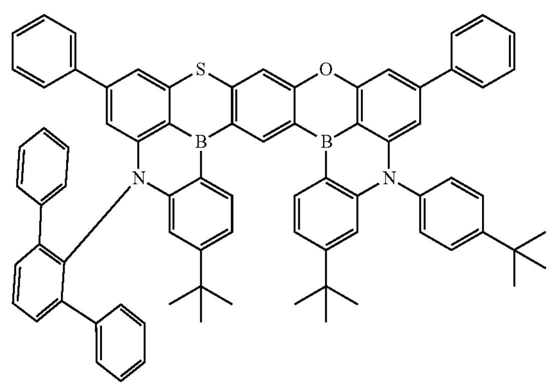
324
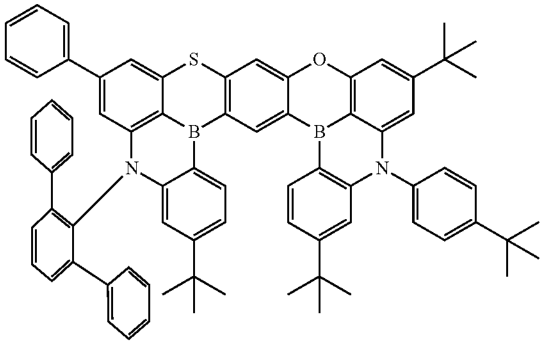
325
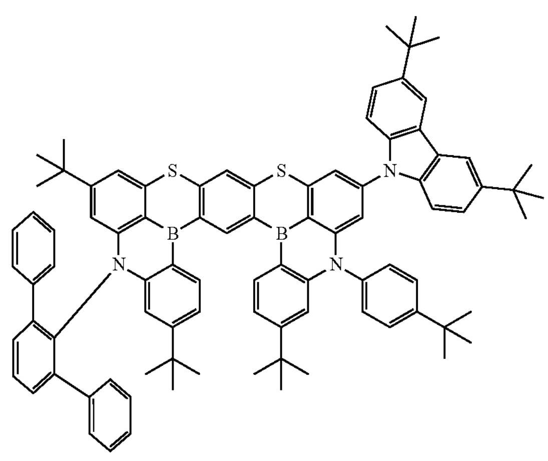

-continued
326
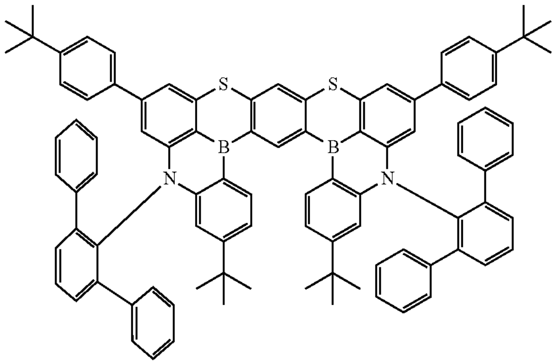
327
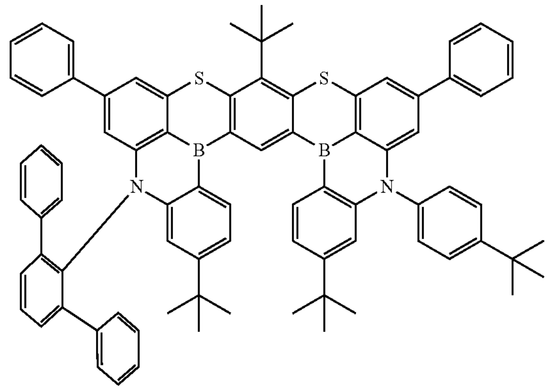
328
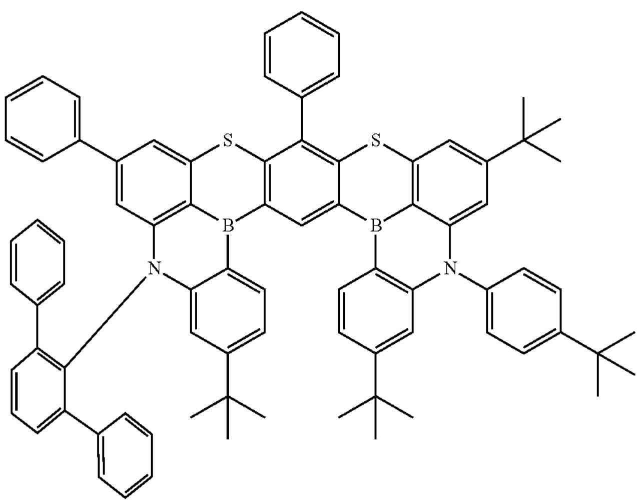
329
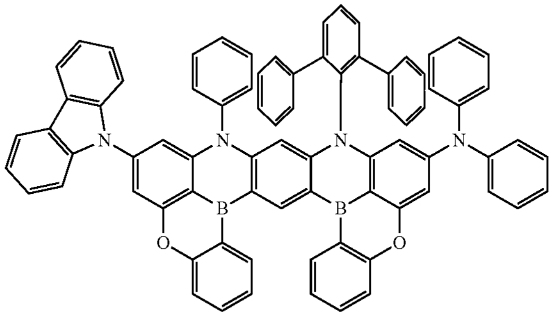
330
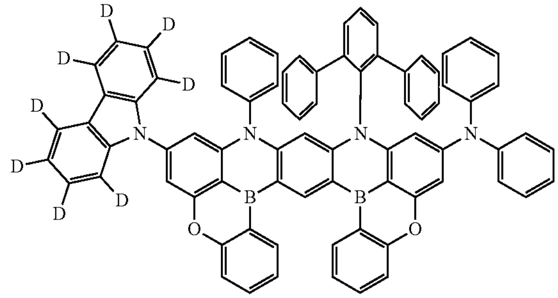

-continued
331
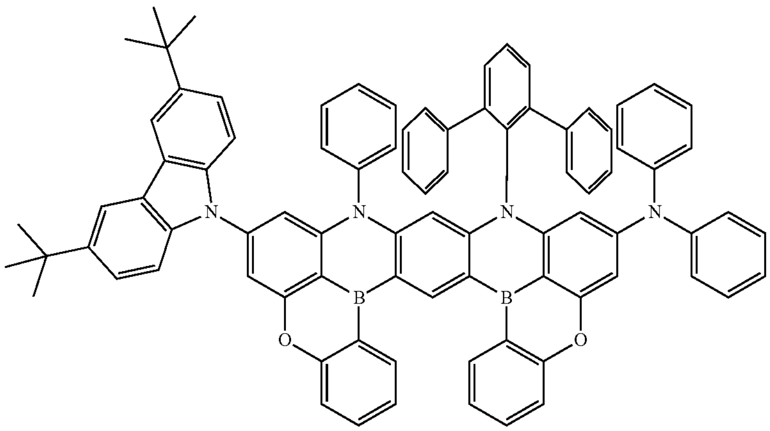
332
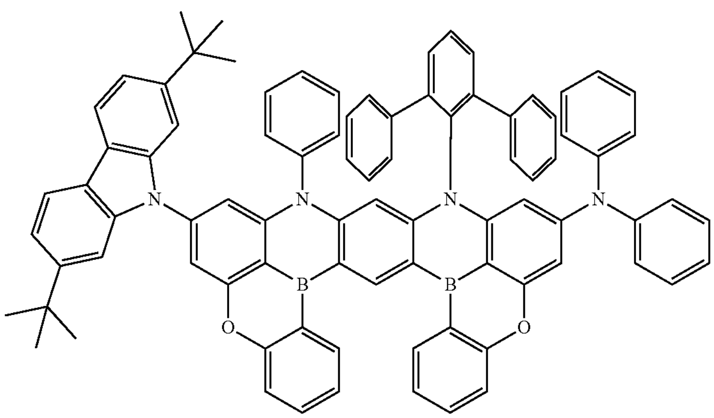
333
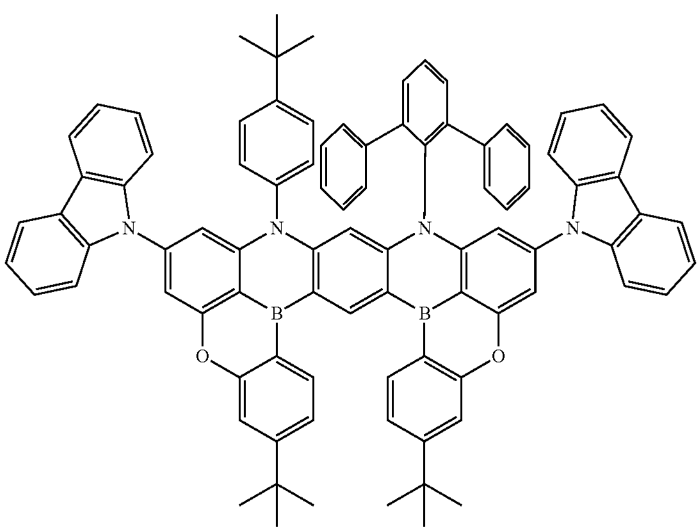

-continued
334
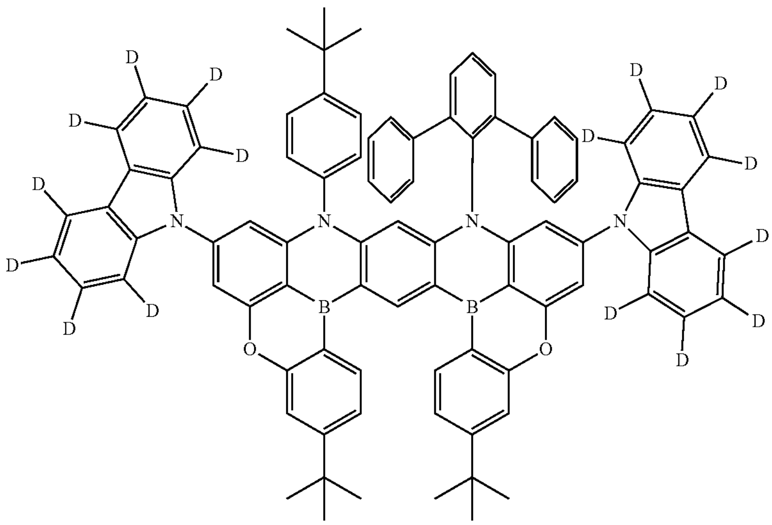
335
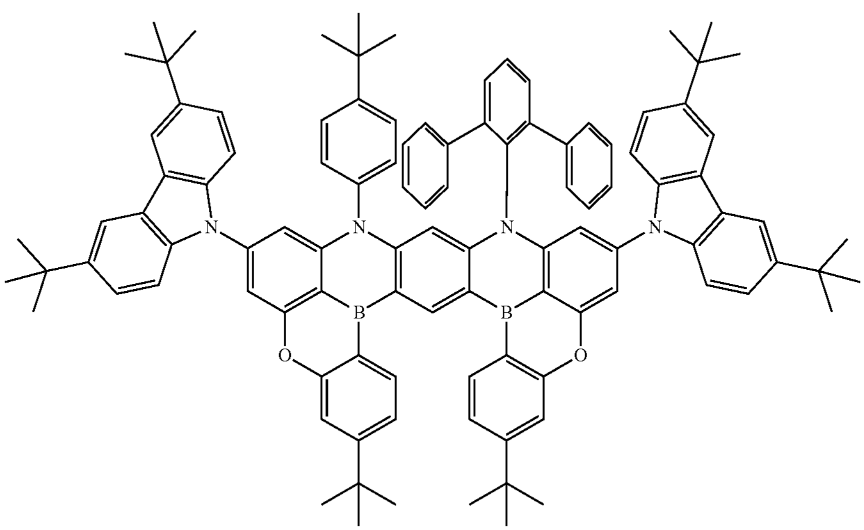
336
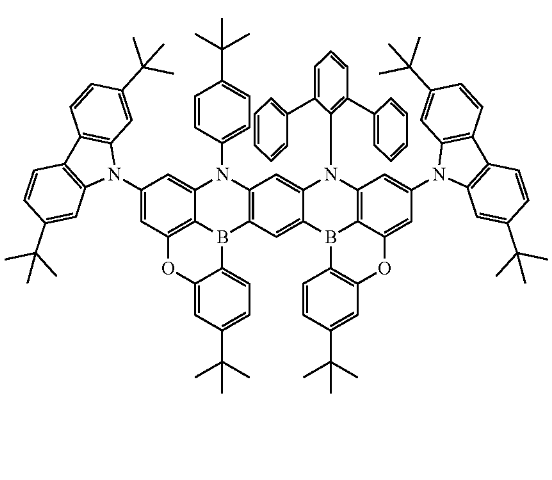
337
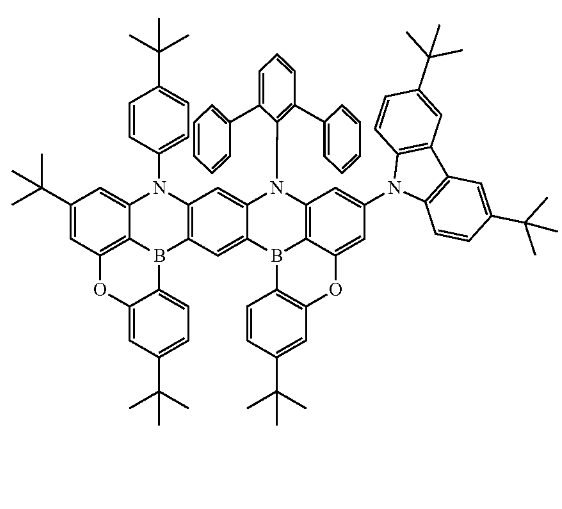

-continued
338
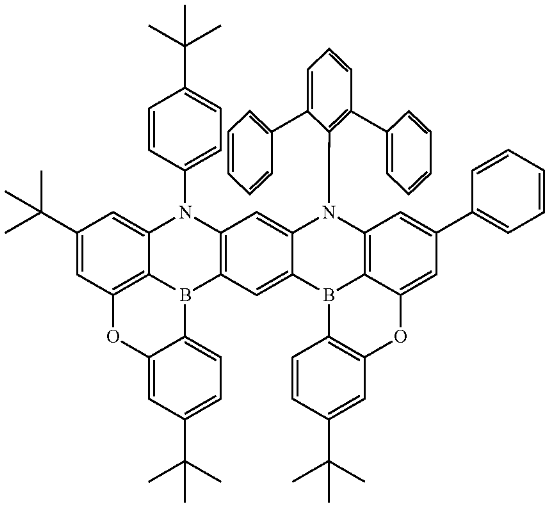
339
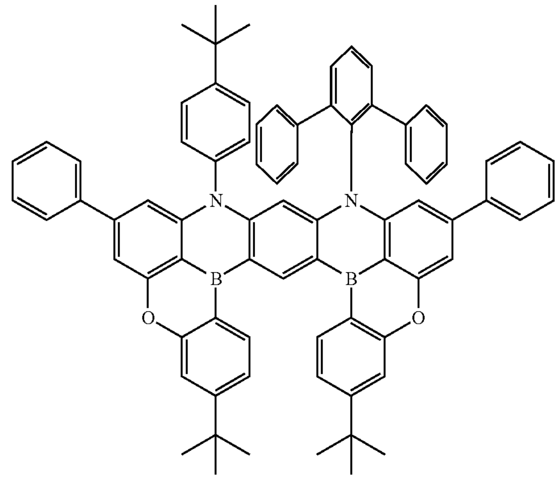
340
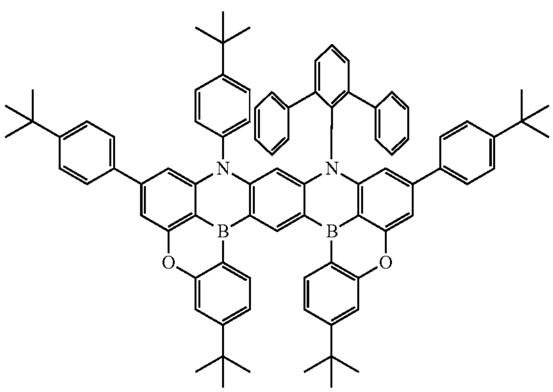
341
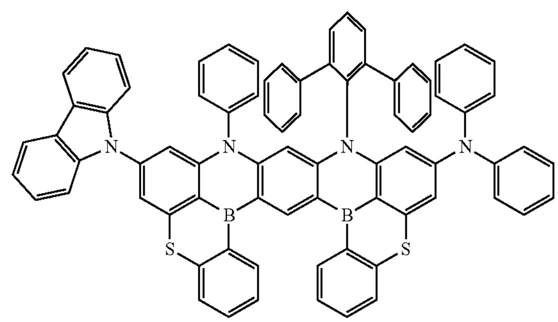
342
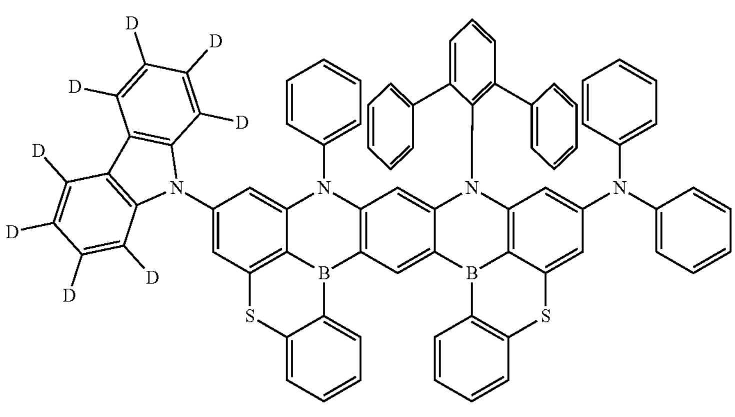

-continued
343
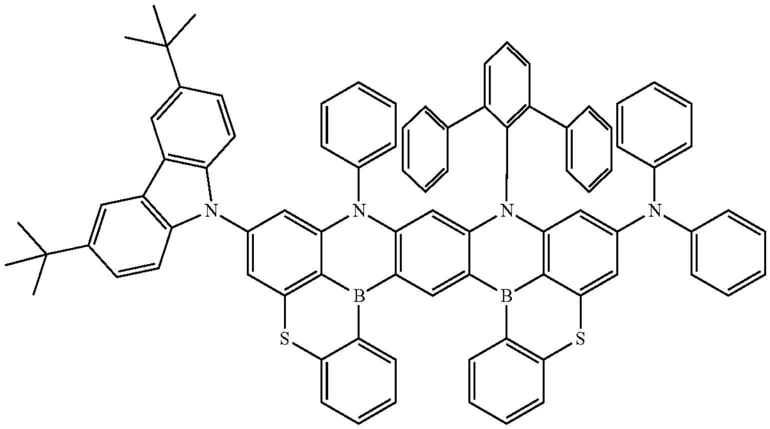
344
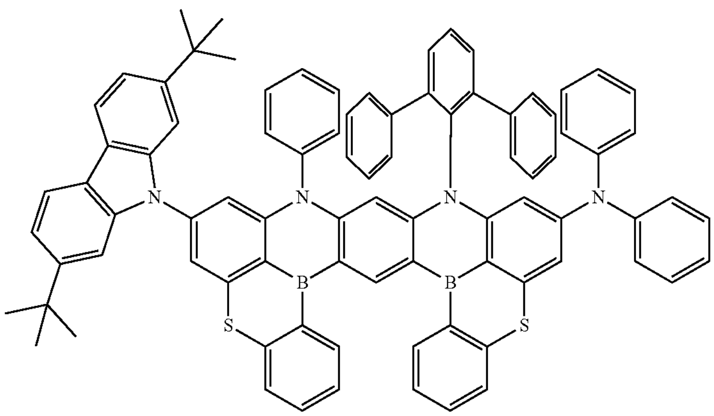
345
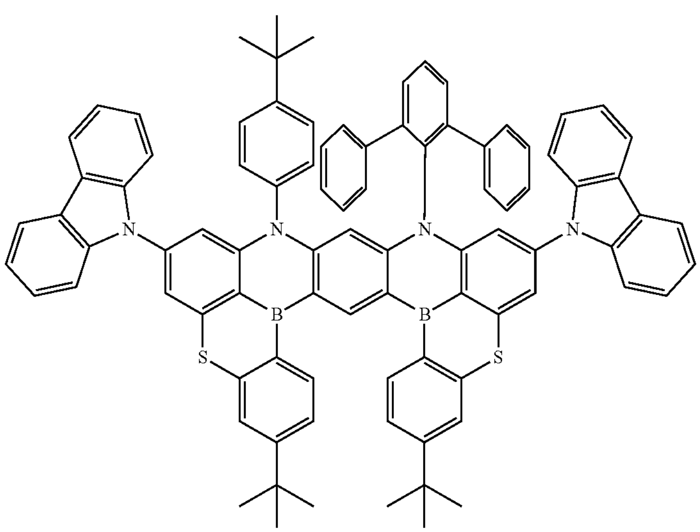

-continued
346
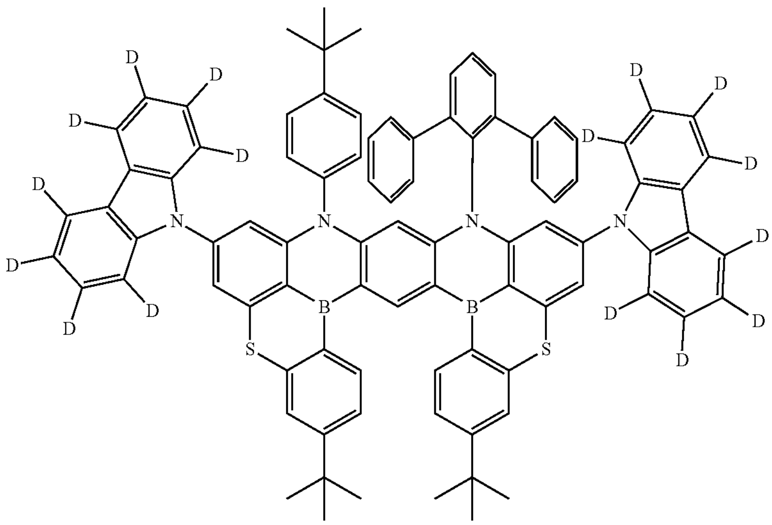
347
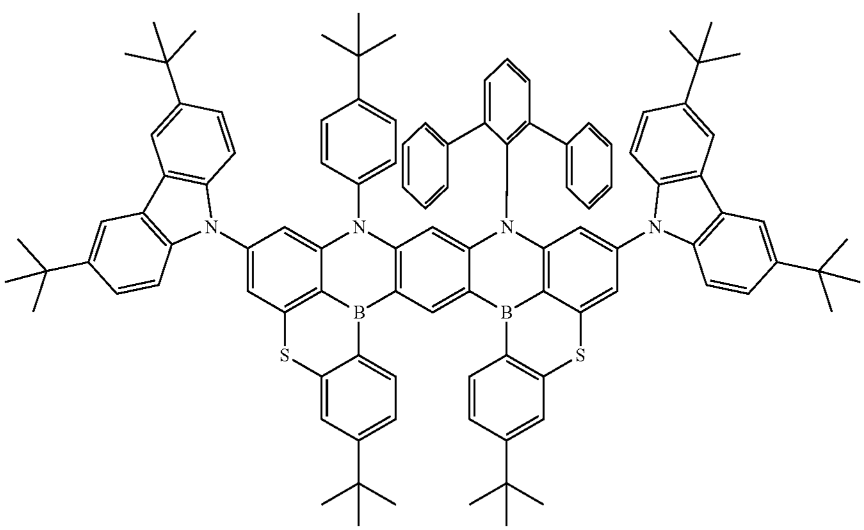
348
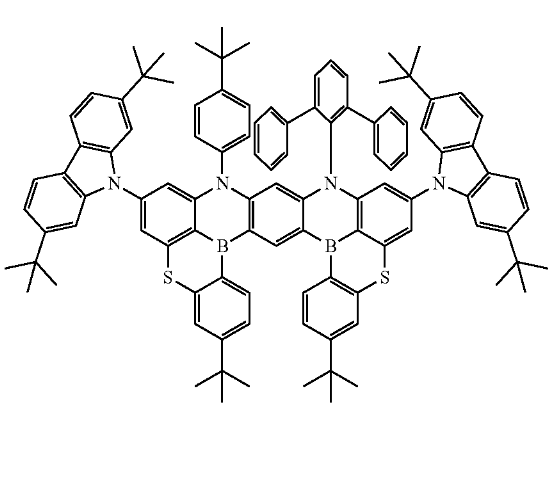
349
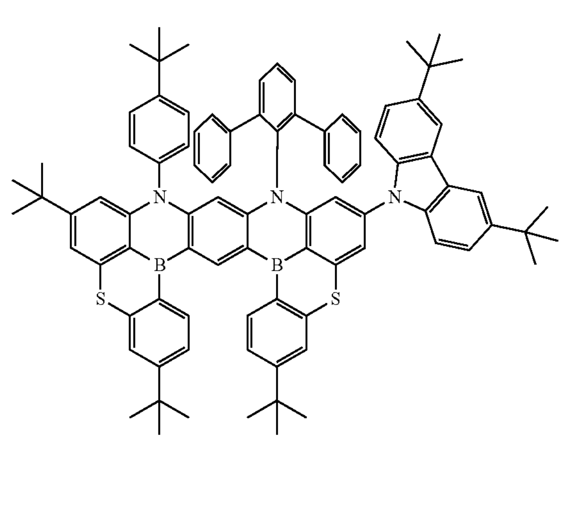

-continued
350
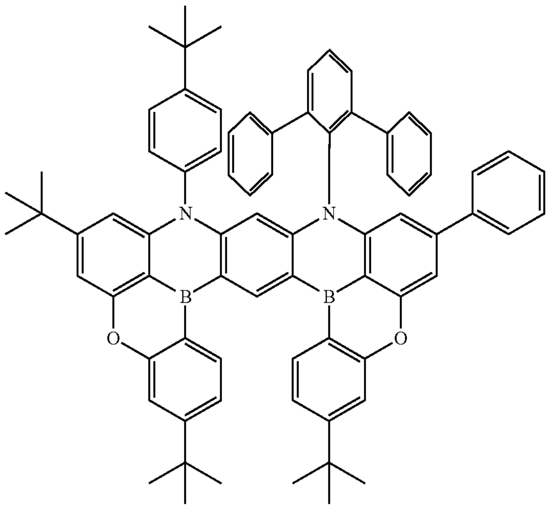
351
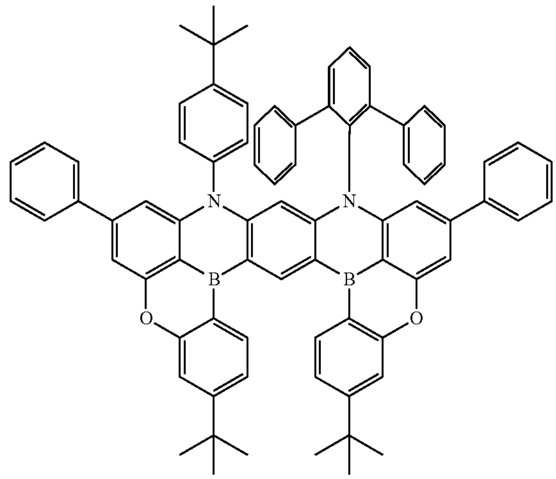
352
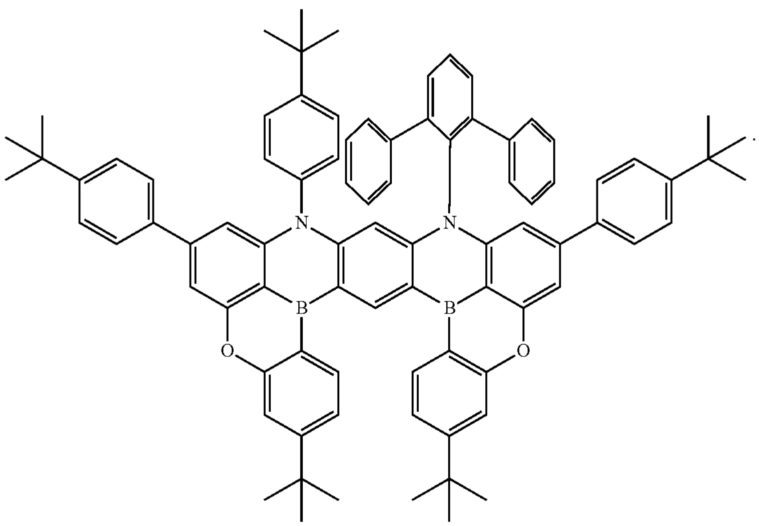
* * * * *